(12) United States Patent
Hatakeyama et al.

(10) Patent No.: US 12,707,891 B2
(45) Date of Patent: Aug. 11, 2026

(54) POLYCYCLIC AROMATIC COMPOUND

(71) Applicants: KWANSEI GAKUIN EDUCATIONAL FOUNDATION, Nishinomiya (JP); SK Materials JNC Co., Ltd., Hwaseong-si (KR)

(72) Inventors: Takuji Hatakeyama, Kyoto (JP); Yuki Yamasaki, Fukuoka (JP); Kouhei Isayama, Chiba (JP); Ryosuke Kawasumi, Chiba (JP); Yasuhiro Kondo, Chiba (JP)

(73) Assignees: KWANSEI GAKUIN EDUCATIONAL FOUNDATION, Nishinomiya (JP); SK Materials JNC Co., Ltd., Hwaseong-si (KR)

(*) Notice: Subject to any disclaimer, the term of this patent is extended or adjusted under 35 U.S.C. 154(b) by 772 days.

(21) Appl. No.: 18/041,101

(22) PCT Filed: Aug. 12, 2021

(86) PCT No.: PCT/JP2021/029758

§ 371 (c)(1),
(2) Date: Feb. 9, 2023

(87) PCT Pub. No.: WO2022/034916

PCT Pub. Date: Feb. 17, 2022

(65) Prior Publication Data

US 2023/0276708 A1 Aug. 31, 2023

(30) Foreign Application Priority Data

Aug. 12, 2020 (JP) ................................ 2020-136218
Mar. 3, 2021 (JP) ................................ 2021-033074

(51) Int. Cl.
*H10K 85/60* (2023.01)
*H10K 50/11* (2023.01)

(52) U.S. Cl.
CPC .......... *H10K 85/658* (2023.02); *H10K 50/11* (2023.02); *H10K 85/636* (2023.02)

(58) Field of Classification Search
CPC ..... H10K 50/11; H01K 85/636; H01K 85/658
See application file for complete search history.

(56) References Cited

U.S. PATENT DOCUMENTS 10,763,441 B2 * 9/2020 Nakano ................ H10K 85/615
11,430,960 B2 * 8/2022 Kuwabara ............ H10K 85/636

(Continued)

FOREIGN PATENT DOCUMENTS

CA 3017010 A1 3/2019
CN 110903311 A 3/2020

(Continued)

OTHER PUBLICATIONS

International Search Report dated Oct. 26, 2021, for corresponding International Application No. PCT/JP2021/029758.
International Preliminary Report on Patentability dated Feb. 23, 2023, from corresponding International Application No. PCT/JP2021/029758.

*Primary Examiner* — Golam Mowla
(74) *Attorney, Agent, or Firm* — FisherBroyles, LLP; Roger L. Browdy

(57) ABSTRACT

A polycyclic aromatic compound consisting of a substructure represented by Formula (1A) and at least two substructures represented by Formula (1B):

(1A)

(Continued)

-continued

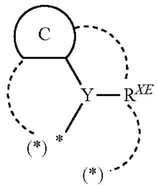

(1B)

(A to C ring is an aryl ring which may be substituted, $R^{XD}$ is an aryl which may be substituted and bonded to A ring via a dashed-line which is —X—, the substructure represented by Formula (1B) is bonded to a ring constituting atom of the aryl or heteroaryl ring in one selected from the group consisting of A ring, B ring and $R^{XD}$, and C ring and $R^{XE}$ in another substructure represented by Formula (1B) at position *, C ring is bonded to the above-selected ring, $R^{XE}$ is an aryl which may be substituted and bonded to the above-selected ring or X, Y is B, X is >N—R (R is an aryl which may be substituted)) is useful as a material for an organic device.

40 Claims, 2 Drawing Sheets

(56) References Cited

U.S. PATENT DOCUMENTS

| | | | | |
|---|---|---|---|---|
| 11,581,493 | B2 * | 2/2023 | Kuwabara | C07F 5/027 |
| 11,631,821 | B2 * | 4/2023 | Suh | H10K 85/658 257/40 |
| 2015/0097162 | A1 * | 4/2015 | Ono | H10K 85/6572 556/407 |
| 2015/0236274 | A1 * | 8/2015 | Hatakeyama | C07F 9/65685 548/405 |
| 2018/0040821 | A1 * | 2/2018 | Hatakeyama | C07F 5/02 |
| 2019/0181350 | A1 * | 6/2019 | Hatakeyama | C07F 5/02 |
| 2019/0207112 | A1 * | 7/2019 | Hatakeyama | C07D 209/80 |
| 2020/0044159 | A1 | 2/2020 | Yamatani | |

FOREIGN PATENT DOCUMENTS

| | | | |
|---|---|---|---|
| CN | 111269250 | A | 6/2020 |
| JP | 2016219487 | A | 12/2016 |
| JP | 2017-120842 | A | 7/2017 |
| JP | 2018043984 | A | 3/2018 |
| JP | 2021091644 | A | 6/2021 |
| WO | 2015102118 | A1 | 7/2015 |
| WO | 2020/085829 | A1 | 4/2020 |
| WO | 2020162600 | A1 | 8/2020 |

* cited by examiner

[FIG. 1]
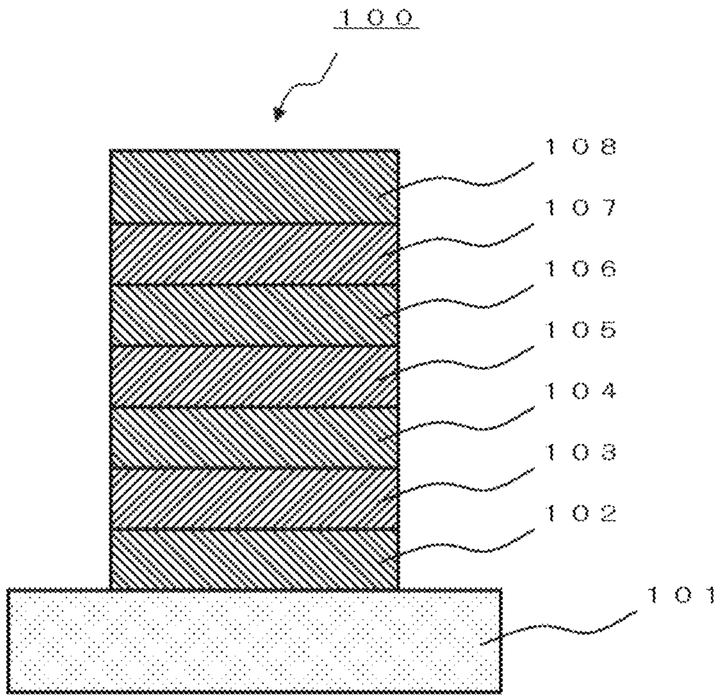

[FIG. 2]
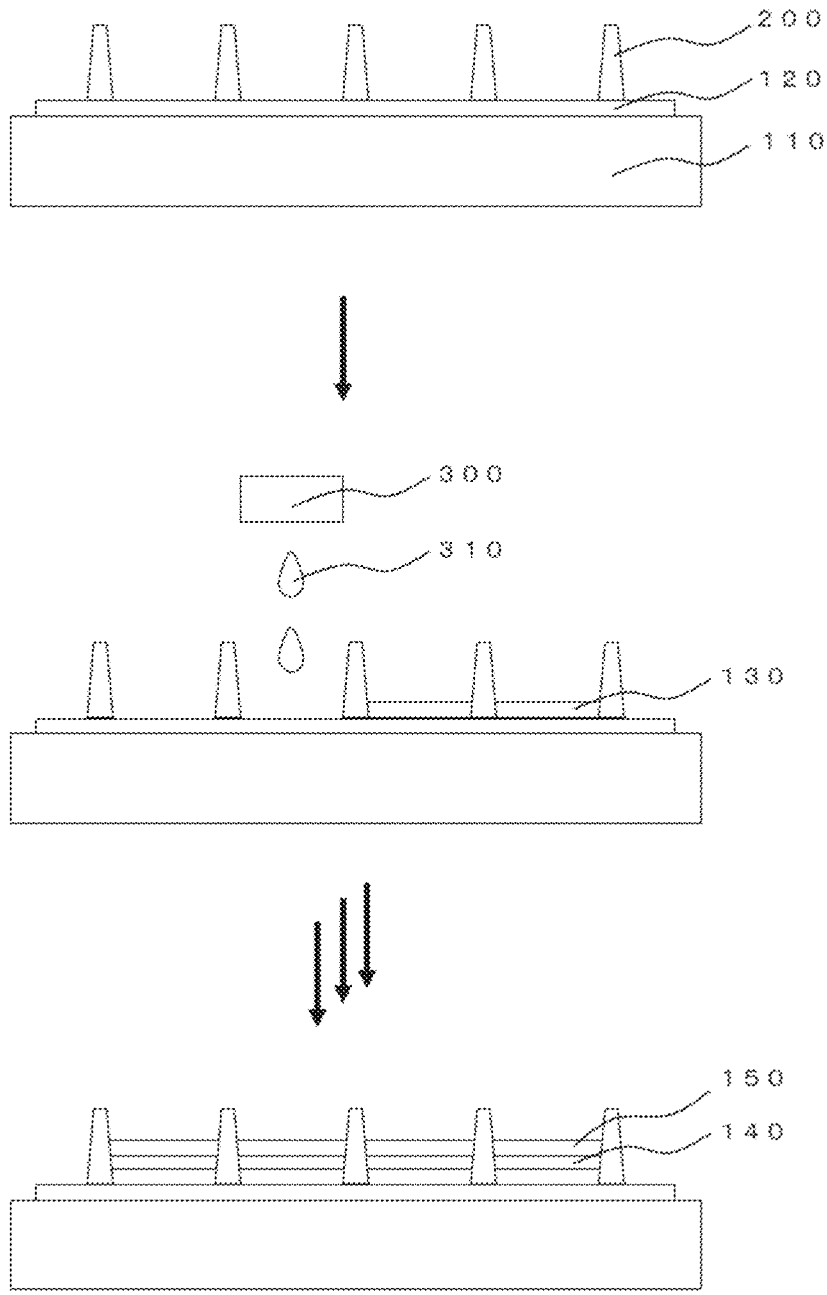

POLYCYCLIC AROMATIC COMPOUND

TECHNICAL FIELD

The present invention relates to a polycyclic aromatic compound. The present invention also relates to a material for an organic device, an organic electroluminescent element, a display device, and a lighting device in which the polycyclic aromatic compound is used.

BACKGROUND ART

Heretofore, a display device using an electroluminescent light-emitting device enables power-saving and thinning, and is variously studied, and further, an organic electroluminescent element (which hereinafter may be referred to as "organic EL element" or simply as "element") using an organic material can be readily lightened and large-sized and is therefore actively investigated. In particular, for development of an organic material having a light-emitting characteristic of emitting a blue color, one of light's three primary colors, as well as development of an organic material having a charge transport performance for holes and electrons (which leads to development of semiconductors and superconductors), various studies have heretofore been actively made irrespective of high-molecular compounds and low-molecular compounds.

An organic EL element has a structure that contains a pair of electrodes of an anode and a cathode, and one or multiple layers containing an organic compound arranged between the pair of electrodes. The organic compound-containing layer (which hereinafter may be referred to as "organic layer") includes a light-emitting layer, and a charge transport/injection layer that transport or inject charges such as holes or electrons, and various types of organic materials suitable for these layers have been developed.

Among them, Patent Document 1 discloses that a polycyclic aromatic compound in which aromatic rings are linked by hetero elements such as boron, phosphorus, oxygen, nitrogen, and sulfur is useful as a material for an organic electroluminescent element or the like. Patent Document 1 reports that the polycyclic aromatic compound is especially useful as a fluorescent material for organic electroluminescent element because it has a large HOMO-LUMO gap and high lowest excited triplet energy level ($E_T$) as well as thermally activated delayed fluorescence.

CITATION LIST

Patent Literature

Patent literature No. 1: WO2015/102118 A

SUMMARY OF INVENTION

Technical Problem

As described above, various materials have been developed as materials used in an organic EL element, but to increase the choice of a material for an organic EL element, development of a material made of a compound different from a conventional one is desired.

It is an object of the present invention to provide a novel material useful as a material for an organic device such as an organic EL element.

Solution to Problem

The present inventors have intensively studied to solve the above problems and have succeeded in producing a new compound as a polycyclic aromatic compound in which aromatic rings are linked by hetero atoms such as boron, phosphorus, oxygen, nitrogen, or sulfur. Further, it has been found that an excellent organic EL element can be obtained by arranging a layer containing this polycyclic aromatic compound between a pair of electrodes to constitute an organic EL element, thereby completing the present invention. In other words, the present invention provides a polycyclic aromatic compound as described below and further a material for an organic device or the like containing a polycyclic aromatic compound as described below.

<1> A polycyclic aromatic compound consisting of a substructure represented by Formula (1A) and at least two substructures represented by Formula (1B):

(1A)

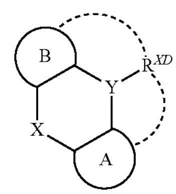

(1B)

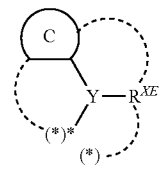

in Formula (1A) and Formula (1B),

A ring and B ring are each independently an aryl ring which may be substituted or a heteroaryl ring which may be substituted, $R^{XD}$ is an aryl which may be substituted, a heteroaryl which may be substituted, an alkyl which may be substituted, or a cycloalkyl which may be substituted, and may be bonded to A ring via a dashed-line which is —X— or single bond, $R^{XD}$ may be bonded to B ring via a dashed-line which is —X—, —X'—, or single bond, each of C rings is independently an aryl ring which may be substituted or a heteroaryl ring which may be substituted, and may be bonded to a ring to which the substructure represented by Formula (1B) is bonded or X at a position of (*) via a dashed line which is —X— or single bond, $R^{XE}$ is an aryl which may be substituted, a heteroaryl which may be substituted, an alkyl which may be substituted, or a cycloalkyl which may be substituted, and may be bonded to a ring to which the substructure represented by Formula (1B) is bonded or X at a position of (*) via a dashed line which is —X— or single bond, $R^{XE}$ may be bonded to C ring via a dashed-line which is —X—, —X'—, or single bond, the substructure represented by Formula (1B) is bonded to a ring constituting atom of the aryl or heteroaryl ring in one selected from the group consisting of A ring, B ring and $R^{XD}$, and C ring and $R^{XE}$ in another substructure represented by Formula (1B) at position *, each of Y is independently B, P, P═O, or P═S, each of X is independently >C(—R)$_2$, >N—R, >O, >Si(—R)$_2$, >S, or >Se, X' is an arylene, a heteroarylene, or a binary linking group consisting of a combination of an arylene or a heteroarylene and one or more selected from the group consisting of >C(—R)$_2$, >N—R, >O, >Si(—R)$_2$, and >S, R in >N—R in X and X' is hydrogen, an aryl which may be substituted, a heteroaryl which may be substituted, an alkyl which may be substituted, a cycloalkyl which may be substituted or a bonding hand to (*), R in >C(—R)$_2$ and >Si(—R)$_2$ in X and X' are hydrogen, an aryl which may be substituted, an alkyl which may be substituted, or a cycloalkyl which may be substituted, two R's in each >C(—R)$_2$ and >Si(—R)$_2$ may be bonded to each other to form a ring, and at least one of R in >N—R, >C(—R)$_2$ and >Si(—R)$_2$ may be bonded to at least one of A ring, B ring, C ring, $R^{XD}$, or $R^{XE}$, via a linking group or single bond, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

<2> The polycyclic aromatic compound according to <1>, wherein $R^{XD}$ is an aryl which may be substituted or a heteroaryl which may be substituted, and bonded to A ring via the dashed line which is —X—, and $R^{XE}$ is an aryl which may be substituted or a heteroaryl which may be substituted.

<3> The polycyclic aromatic compound according to <2>, comprising at least one nitrogen-containing heteroaryl ring which may be substituted as A ring, B ring, C ring, $R^{XD}$, or $R^{XE}$.

<4> The polycyclic aromatic compound according to <2> or <3>, comprising two substructures represented by Formula (1B), wherein one of the substructures represented by Formula (1B) is bonded to a ring constituting atom of the aryl or heteroaryl ring in B ring at the position of*, bonded to a ring constituting atom of the aryl or the heteroaryl ring in B ring such that B ring and C ring are bonded to each other via —X— at the position of (*), and bonded to a ring constituting atom of the aryl or heteroaryl ring in B ring such that B ring and $R^{XE}$ are bonded to each other via —X— at the position of (*), the other of the substructures represented by Formula (1B) is bonded to a ring constituting atom of the aryl or heteroaryl ring in $R^{XD}$ at the position of*, bonded to a ring constituting atom of the aryl or heteroaryl ring in $R^{XD}$ such that $R^{XD}$ and C ring are bonded to each other via —X— at the position of (*), and bonded to a ring constituting atom of the aryl or heteroaryl ring in $R^{XD}$ such that $R^{XD}$ and $R^{XE}$ are bonded to each other via —X— at the position of (*).

<5> A polycyclic aromatic compound according to <4>, which is represented by the following formula:

(III-10)

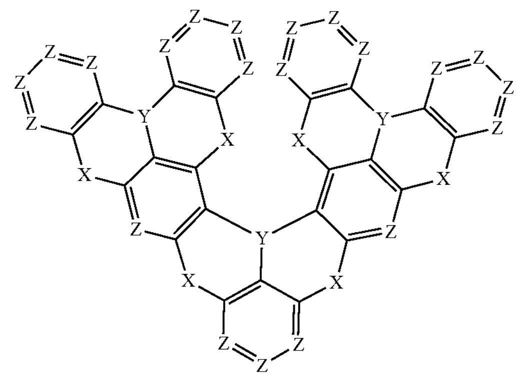

wherein each of Y is independently B, P, P═O, or P═S, each of X is independently >C(—R)$_2$, >N—R, >O, >Si(—R)$_2$, >S or >Se, R in >N—R is an aryl which may be substituted, a heteroaryl which may be substituted, an alkyl which may be substituted, or a cycloalkyl which may be substituted, R in >C(—R)$_2$ and >Si(—R)$_2$ is hydrogen, an aryl which may be substituted, an alkyl which may be substituted, or a cycloalkyl which may be substituted, and may be bonded to each other via a linking group, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—$R^Z$)═ or —N═ and any two adjacent Z's may be replaced with —C(—$R^Z$)$_2$—, —Si(—$R^Z$)$_2$—, —N(—$R^Z$)—, —O—, —S—, or —Se—, each of $R^Z$ is independently hydrogen or a substituent, and any adjacent groups among $R^Z$ may be bonded to each other to form an aryl ring or a heteroaryl ring together with the ring to which the adjacent groups $R^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

<6> The polycyclic aromatic compound according to <5>, which is represented by any one of the following formulas:

(v-19-1)
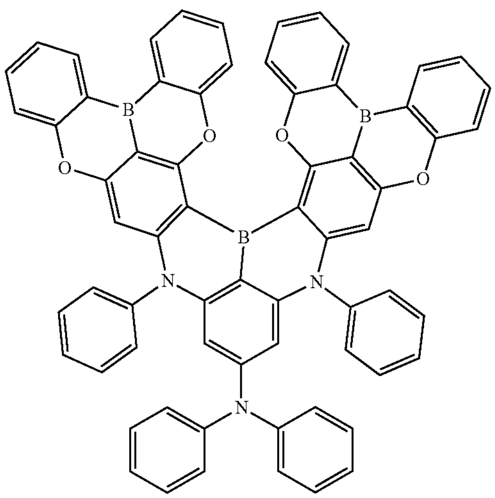
(v-18-1)
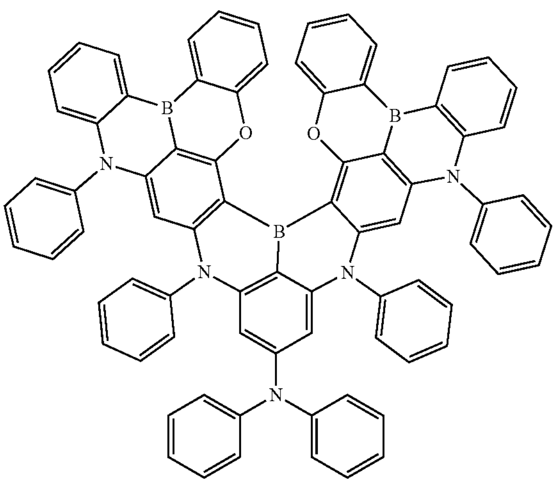
(v-19N1-1)
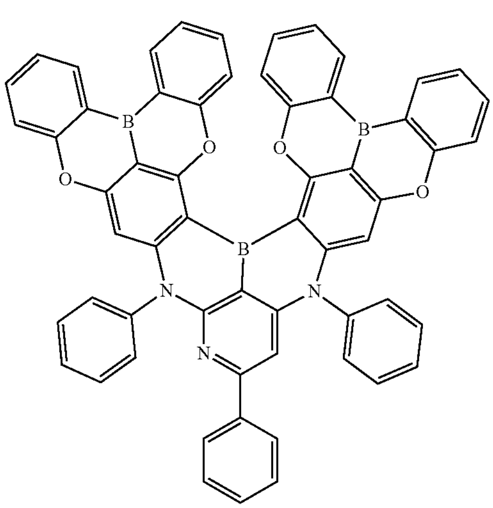
-continued
(v-19-27)
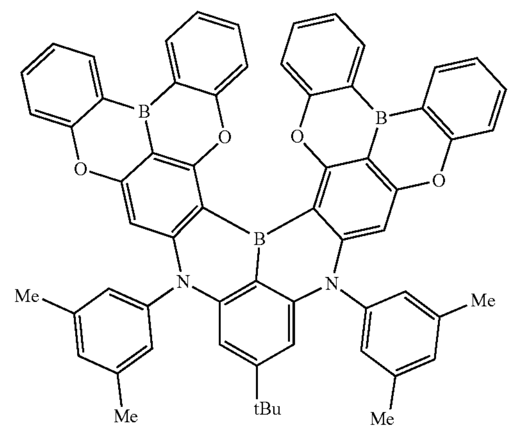
(v-19-28)
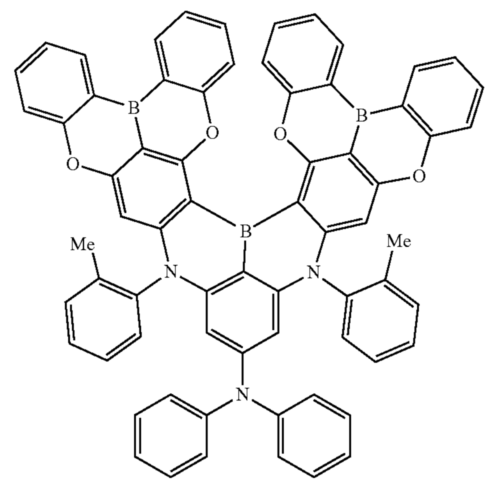
(v-138-2)
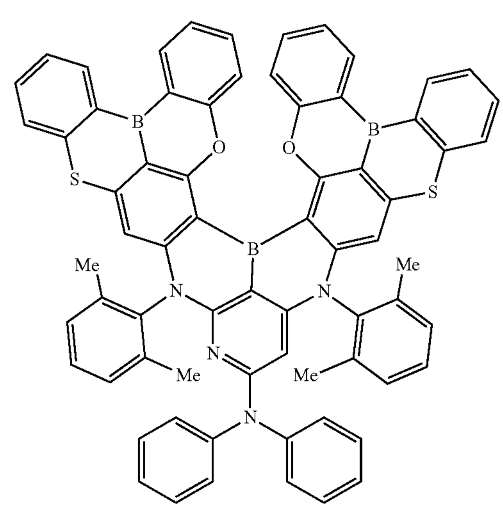

-continued (v-136-2)

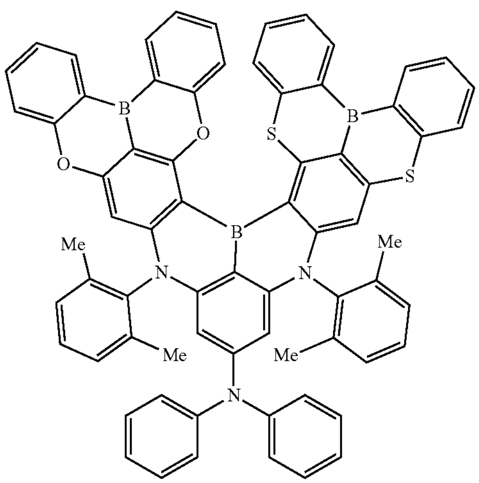

(v-171-2)

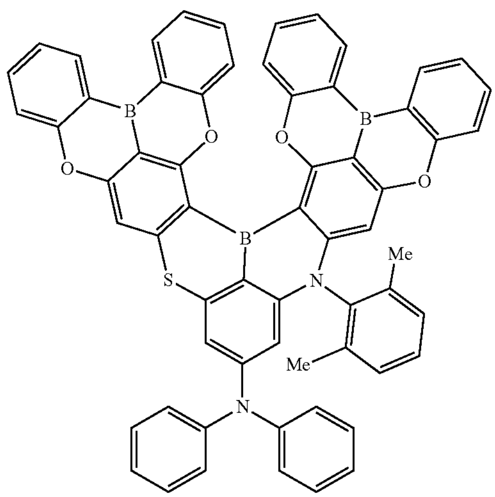

(v-131-3)

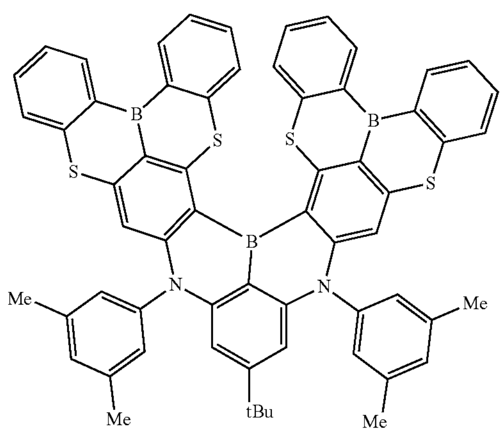

wherein Me is methyl and tBu is t-butyl.

<7> The polycyclic aromatic compound according to <2> or <3>, comprising two substructures represented by Formula (1B), wherein in either substructure represented by Formula (1B), $R^{XE}$ is bonded to C ring via the dashed-line which is —X— or single bond, one of the substructures represented by Formula (1B) is bonded to a ring constituting atom of the aryl or heteroaryl ring in B ring at the position of *, and bonded to a ring constituting atom of the aryl or heteroaryl ring in B ring such that B ring and C ring are bonded to each other via —X— at the position of (*), and the other of the substructures represented by Formula (1B) is bonded to a ring constituting atom of the aryl or heteroaryl ring in $R^{XD}$ at the position of *, and bonded to a ring constituting atom of the aryl or heteroaryl ring in $R^{XD}$ such that $R^{XD}$ and C ring are bonded to each other via —X— at the position of (*).

<8> A polycyclic aromatic compound according to <7>, which is represented by the following formula:

(III-11)

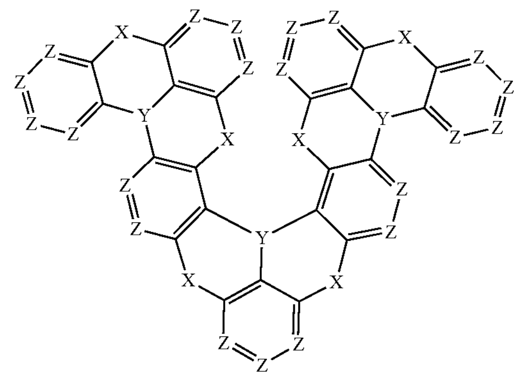

wherein each of Y is independently B, P, P═O, or P═S, each of X is independently >C(—R)$_2$, >N—R, >O, >Si(—R)$_2$, >S, or >Se, R in >N—R is an aryl which may be substituted, a heteroaryl which may be substituted, an alkyl which may be substituted, or a cycloalkyl which may be substituted, R in >C(—R)$_2$ and >Si(—R)$_2$ is hydrogen, an aryl which may be substituted, an alkyl which may be substituted, or a cycloalkyl which may be substituted, and may be bonded to each other via a linking group, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—$R^Z$)═ or —N═ and any two adjacent Z's may be replaced with —C(—$R^Z$)$_2$—, —Si(—$R^Z$)$_2$—, —N(—$R^Z$)—, —O—, —S, -or —Se—, each of $R^Z$ is independently hydrogen or a substituent, and any adjacent groups among $R^Z$ may be bonded to each other to form an aryl ring or a heteroaryl ring together with the ring to which the adjacent groups $R^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

<9> A polycyclic aromatic compound according to <8>, which is represented by the following formula:

(v-21-2)

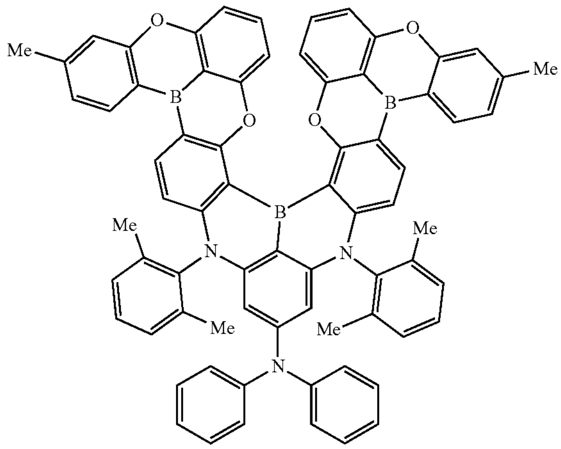

wherein Me is methyl.

<10> A polycyclic aromatic compound according to <7>, which is represented by the following formula:

(III-9)

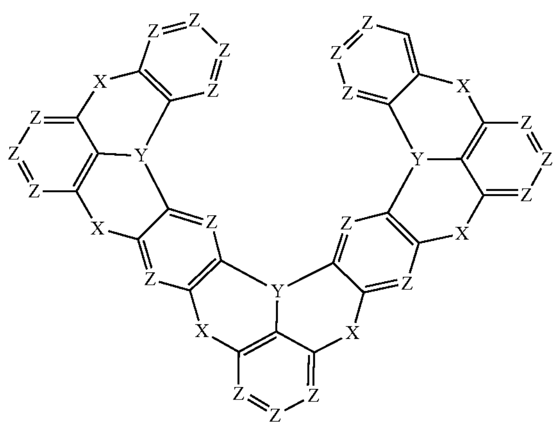

wherein each of Y is independently B, P, P═O, or P═S, each of X is independently >C(—R)$_2$, >N—R, >O, >Si(—R)$_2$, >S, or >Se, R in >N—R is an aryl which may be substituted, a heteroaryl which may be substituted, an alkyl which may be substituted, or a cycloalkyl which may be substituted, R in >C(—R)$_2$ and >Si(—R)$_2$ is hydrogen, an aryl which may be substituted, an alkyl which may be substituted, or a cycloalkyl which may be substituted, and may be bonded to each other via a linking group, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—R$^Z$)═ or —N═ and any two adjacent Z's may be replaced with —C(—R$^Z$)$_2$—, —Si(—R$^Z$)$_2$—, —N(—R$^Z$)—, —O—, —S— or —Se—, provided that at least one Z is —N═, each of R$^Z$ is independently hydrogen or a substituent, and any adjacent groups among R$^Z$ may be bonded to each other to form an aryl ring or a heteroaryl ring together with the ring to which the adjacent groups R$^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

<11> The polycyclic aromatic compound according to <2> or <3>, comprising two substructures represented by Formula (1B), wherein one of the substructures represented by one of Formula (1B), in which R$^{XE}$ is bonded to the C ring via the dashed line which is —X— or single bond, is bonded to a ring constituting atom of the aryl or heteroaryl ring in B ring at the position of *, and bonded to a ring constituting atom of the aryl or heteroaryl ring in B ring such that B ring and C ring are bonded to each other via —X— at the position of (*), and the other of the substructures represented by Formula (1B) is bonded to a ring constituting atom of the aryl or heteroaryl ring in R$^{XD}$ at the position of *, bonded to a ring constituting atom of the aryl or heteroaryl ring in R$^{XD}$ such that R$^{XD}$ and C ring are bonded to each other via —X— at the position of (*), and bonded to a ring constituting atom of the aryl or heteroaryl ring in R$^{XD}$ such that R$^{XD}$ and R$^{XE}$ are bonded to each other via —X— at the position of (*).

<12> A polycyclic aromatic compound according to <11>, which is represented by the following formula:

(III-12)

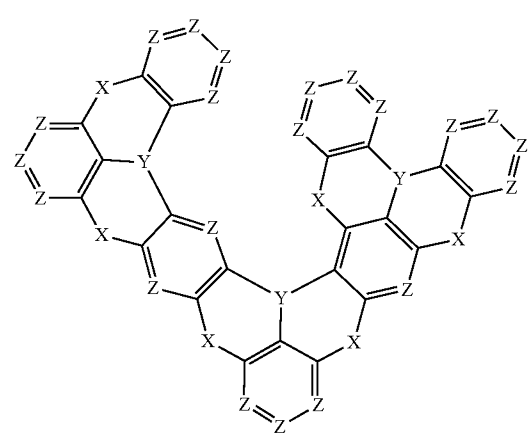

wherein each of Y is independently B, P, P═O, or P═S, each of X is independently >C(—R)$_2$, >N—R, >O, >Si(—R)$_2$, >S, or >Se, provided that at least one X is >O or >S, and R in >N—R is an aryl which may be substituted, a heteroaryl which may be substituted, an alkyl which may be substituted, or a cycloalkyl which may be substituted, and R in $>C(—R)_2$ and $>Si(—R)_2$ is hydrogen, an aryl which may be substituted, an alkyl which may be substituted, or a cycloalkyl which may be substituted, and two R's in each $>C(—R)_2$ and $>Si(—R)_2$ may be bonded to each other to form a ring, and at least one R of >N—R, $>C(—R)_2$, and $>Si(—R)_2$ may be bonded via a linking group or single bond to Z adjacent to any of carbon atoms to which X containing the R is directly bonded, each of Z is independently $—C(—R^Z)=$ or —N= and any two adjacent Z's may be replaced with $—C(—R^Z)_2—$, $—Si(—R^Z)_2—$, $—N(—R^Z)—$, —O—, —S—, or —Se—, each of $R^Z$ is independently hydrogen or a substituent, and any adjacent groups among $R^Z$ may be bonded to each other to form an aryl ring or a heteroaryl ring together with the ring to which the adjacent groups $R^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one $—CH_2—$ in the cycloalkane may be replaced with —O—, and at least one hydrogen in the polycyclic aromatic compound may be replaced with deuterium, cyano, or halogen.

<13> The polycyclic aromatic compound according to <12>, which is represented by any one of the following formulas:

(v-118-1)

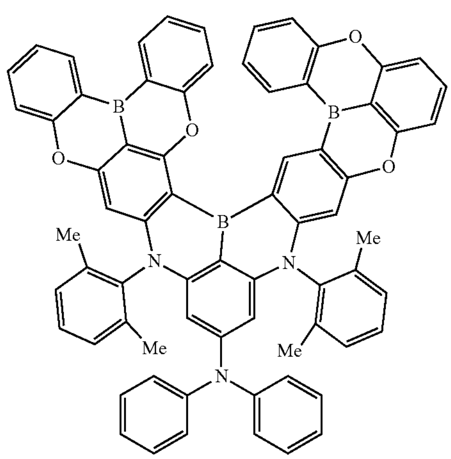

-continued (v-164-1)

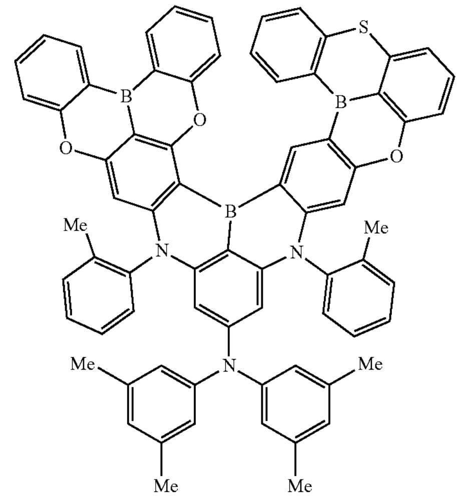

(v-118-2)

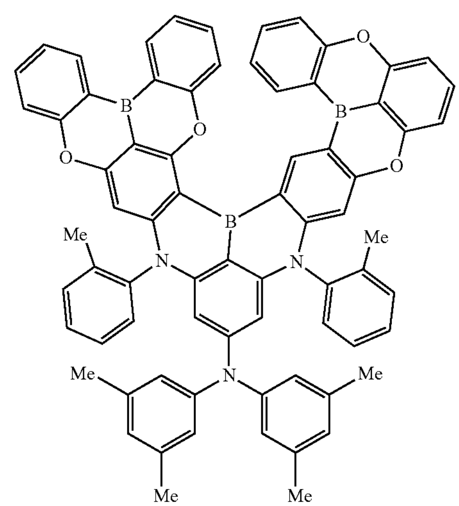

wherein Me is methyl.

<14> The polycyclic aromatic compound according to <1>, which is represented by any one of the following formulas.

(vi-14)

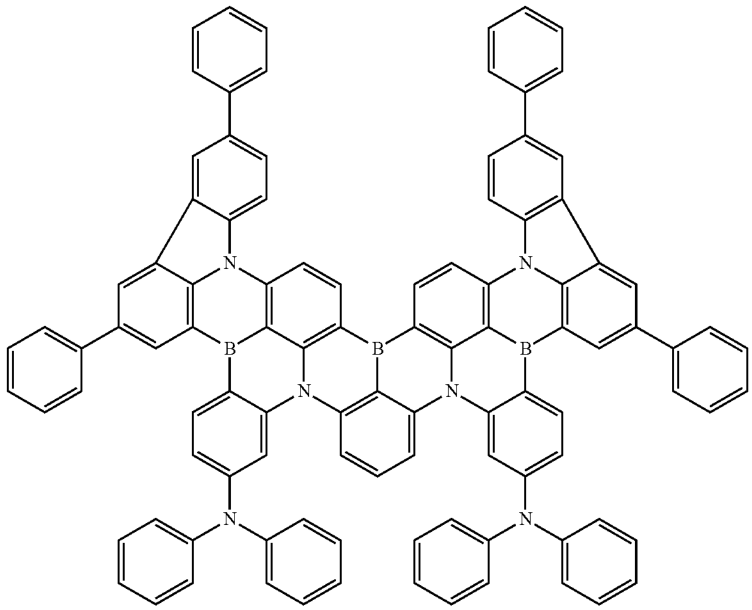

(vi-3)

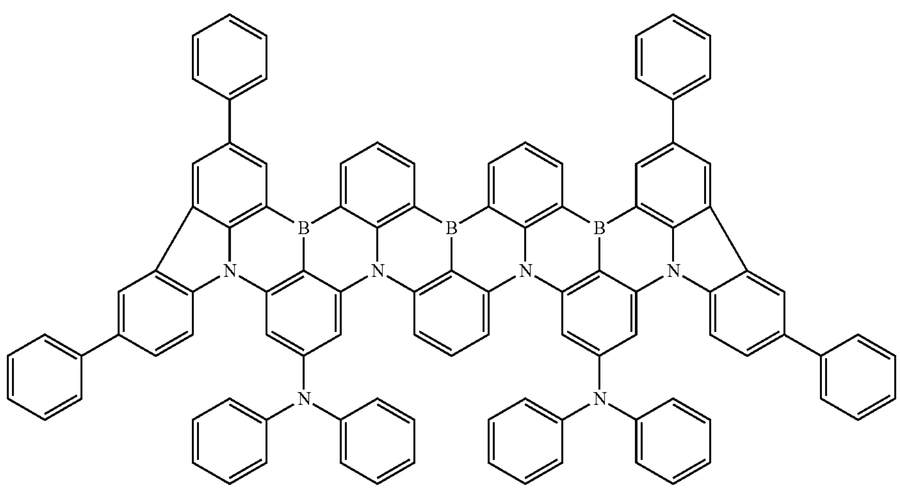

<15> The polycyclic aromatic compound according to claim 2 or 3, comprising two substructures represented by Formula (1B), wherein in either substructure represented by Formula (1B), $R^{XE}$ is bonded to C ring via the dashed line which is —X— or single bond, and either substructure represented by Formula (1B) is bonded to a ring constituting atom of the aryl or heteroaryl ring in A ring at the position of *, wherein both of X connecting A ring and B ring and X connecting A ring and $R^{XD}$ are nitrogen atoms bonded to C ring via single bond.

<16> A polycyclic aromatic compound according to <15>, which is represented by the following formula:

(III-3)

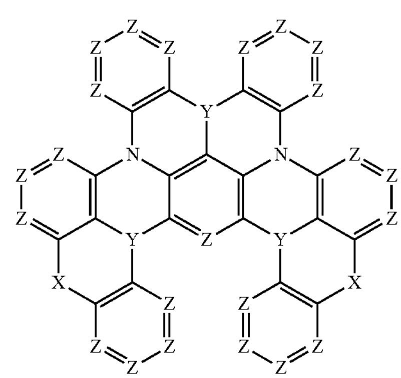

wherein each of Y is independently B, P, P═O, or P═S, each of X is independently >C(—R)$_2$, >N—R, >O, >Si(—R)$_2$, >S, or >Se, R in >N—R is an aryl which may be substituted, a heteroaryl which may be substituted, an alkyl which may be substituted, or a cycloalkyl which may be substituted; and R of >C(—R)$_2$ and >Si(—R)$_2$ is hydrogen, an aryl which may be substituted, an alkyl which may be substituted, or a cycloalkyl which may be substituted; and two R's in each >C(—R)$_2$ and >Si(—R)$_2$ may be bonded to each other to form a ring, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—R$^Z$)═ or —N═ and any two adjacent Z's may be replaced with —C(—R$^Z$)$_2$—, —Si(—R$^Z$)$_2$—, —N(—R$^Z$)—, —O—, —S—, or —Se—, each of R$^Z$ is independently hydrogen or a substituent, and any adjacent groups among R$^Z$ may be bonded to each other to form an aryl ring or a heteroaryl ring together with the ring to which the adjacent groups R$^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

<17> The polycyclic aromatic compound according to <16>, which is represented by any one of the following formulas:

(vi-25)

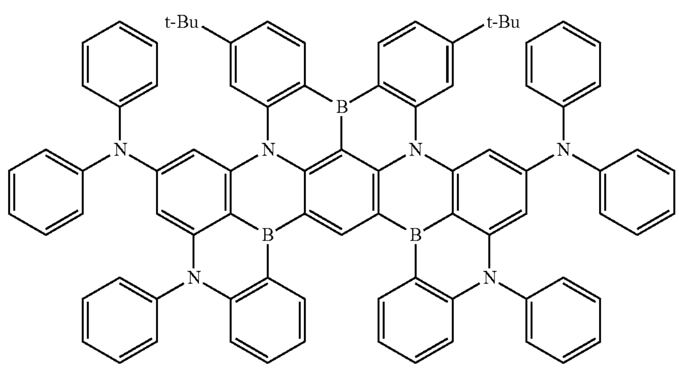

(vi-70)

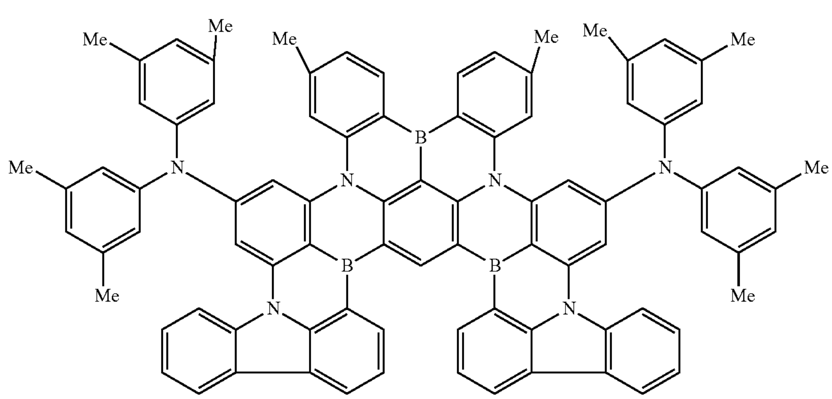

-continued (vi-82)

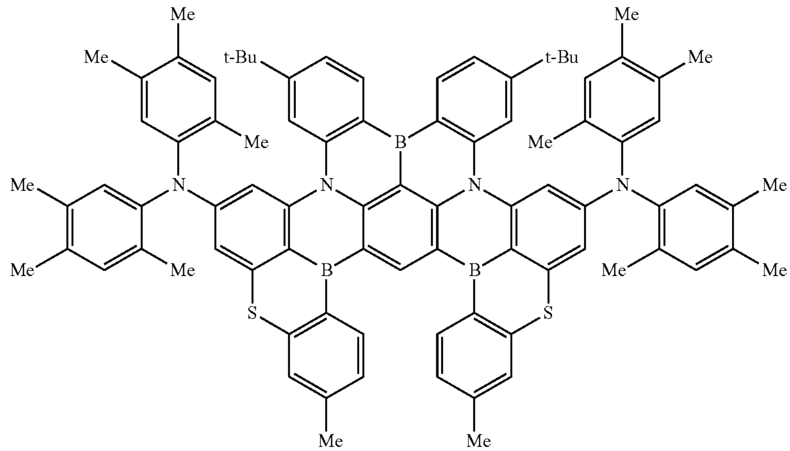

wherein tBu is t-butyl.

<18> A reactive compound in which a reactive substituent is substituted to the polycyclic aromatic compound according to any one of <1> to <17>.

<19> A polymer compound obtained by polymerizing the reactive compound described in <18> as a monomer, or a crosslinked polymer obtained by further crosslinking the polymer compound.

<20> A pendant-type polymer compound in which the reactive compound according to <18> is substituted to a main chain type polymer, or a pendant-type crosslinked polymer in which the pendant-type polymer compound is further crosslinked.

<21> A material for an organic device, which comprises the polycyclic aromatic compound according to any one of <1> to <17>.

<22> A material for an organic device, which comprises the reactive compound according to <18>.

<23> A material for an organic device, which comprises the polymer compound or the crosslinked polymer according to <19>.

<24> A material for an organic device, which comprises the pendant-type polymer compound or the pendant-type crosslinked polymer according to <20>.

<25> The material for an organic device according to any one of <21> to <24>, wherein the material for an organic device is a material for an organic electroluminescent element, a material for an organic field effect transistor, or a material for an organic thin film solar cell.

<26> The material for an organic device according to <25>, wherein the material for an organic electroluminescent element is a material for a light-emitting layer.

<27> A composition comprising the polycyclic aromatic compound according to any one of <1> to <17> and an organic solvent.

<28> A composition comprising the reactive compound according to <18> and an organic solvent.

<29> A composition comprising a main chain type polymer, the reactive compound according to <18>, and an organic solvent.

<30> A composition comprising the polymer compound or the crosslinked polymer according to <19> and an organic solvent.

<31> A composition comprising the pendant-type polymer compound or the pendant-type crosslinked polymer according to <20> and an organic solvent.

<32> An organic electroluminescent element, which comprises a pair of electrodes comprising an anode and a cathode, and an organic layer disposed between the pair of electrodes and comprising the polycyclic aromatic compound according to any one of <1> to <17>, the reactive compound according to <18>, the polymer compound or the crosslinked polymer according to <19>, or the pendant-type polymer compound or the pendant-type crosslinked polymer according to <20>.

<33> The organic electroluminescent element according to <32>, wherein the organic layer is a light-emitting layer.

<34> The organic electroluminescent element according to <33>, wherein the light-emitting layer comprises a host and, as a dopant, the polycyclic aromatic compound, the reactive compound, the polymer compound, the crosslinked polymer, the pendant-type polymer compound, or the pendant-type crosslinked polymer.

<35> The organic electroluminescent element according to <34>, wherein the host is an anthracene-based compound, a fluorene-based compound, or a dibenzochrysene-based compound.

<36> The organic electroluminescent element according to any one of <33> to <35>, further comprising at least one layer of an electron transport layer and an electron injection layer disposed between the cathode and the light emitting layer, wherein at least one of the electron transport layer and the electron injection layer comprises at least one selected from the group consisting of borane derivatives, pyridine derivatives, fluoranthene derivatives, BO-based derivatives, anthracene derivatives, benzofluorene derivatives, phosphine oxide derivatives, pyrimidine derivatives, aryl nitrile derivatives, triazine derivatives, benzimidazole derivatives, phenanthroline derivatives, and quinolinol-based metal complexes.

<37> The organic electroluminescent element according to <36>, wherein the at least one layer of the electron transport layer and the electron injection layer further comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

<38> The organic electroluminescent element according to any one of <33> to <37>, wherein at least one of a hole injection layer, a hole transport layer, a light emitting layer, an electron transport layer, and an electron injection layer comprises a polymer compound obtained by polymerizing a low molecular weight compound capable of forming each layer as a monomer, or a crosslinked polymer obtained by further crosslinking the polymer compound, or a pendant-type polymer compound obtained by reacting the low molecular weight compound capable of forming each layer with a main chain type polymer, or a pendant-type cross-linked polymer obtained by further crosslinking the pendant-type polymer compound.

<39> A display device or a lighting device provided with an organic electroluminescent element according to any one of <32> to <38>.

<40> A wavelength conversion material comprising the polycyclic aromatic compound according to any one of <1> to <17>, the reactive compound according to <18>, the polymer compound or the crosslinked polymer according to <19>, or the pendant-type polymer compound or the pendant-type crosslinked polymer according to <20>.

Effect of the Invention

The present invention provides a novel polycyclic aromatic compound. The polycyclic aromatic compound of the present invention is useful as a material for an organic device, particularly a material for a light-emitting layer for forming a light-emitting layer of an organic electroluminescent element.

BRIEF DESCRIPTION OF DRAWING

FIG. 1 This is a schematic cross-sectional view showing an organic EL element.

FIG. 2 This is a figure explaining the method of manufacturing the organic EL element by the inkjet method on the substrate that has a bank.

DESCRIPTION OF EMBODIMENTS

Hereinafter, the invention will be described in detail. Description of constituent features described below is made on the basis of typified embodiments or specific examples in several cases, but the invention is not limited to such embodiments. The numerical range represented by using "to" in the specification means a range including numerical values described before and after "to" as a lower limit and an upper limit. Moreover, "hydrogen" as used herein in description of a structural formula means a "hydrogen atom (H)."

When used herein, "adjacent groups" means two groups attached to two adjacent atoms (two atoms directly bonded by covalent bonds) in the structural formula, respectively.

A chemical structure or a substituent is represented herein by using the number of carbon atoms in several cases. However, the number of carbon atoms when an atom of the chemical structure is replaced with the substituent in, when an atom of the substituent is further replaced with a substituent, or the like means the number of carbon atoms of each chemical structure or each substituent and does not mean the total number of carbon atoms of each chemical structure and the substituent thereof or the total number of carbon atoms of each substituent and the substituent thereof. For example, an expression "substituent B having Y carbons which is subjected to substitution for substituent A having X carbons" means that hydrogen of "substituent B having Y carbons" is replaced with "substituent A having X carbons," and the Y carbons do not represent the number of carbon atoms of a total of the substituent A and the substituent B. For example, an expression "substituent B having Y carbons which is subjected to substitution for substituent A" means that hydrogen of "substituent B having Y carbons" is replaced with "substituent A (in which the number of carbon atoms is not specified), and the Y carbons do not mean the number of carbon atoms of a total of the substituent A and the substituent B.

1. Polycyclic Aromatic Compound

1-1. A Polycyclic Aromatic Compound Consisting of a Substructure Represented by Formula (1A) and at Least Two Substructures Represented by Formula (1B)

The present invention relates to a polycyclic aromatic compound including one substructure represented by Formula (1A) and at least two substructures each of which is represented by Formula (1B).

(1A)

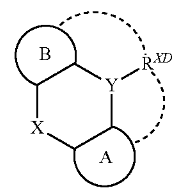

(1B)

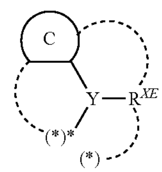

In Formula (1A) and Formula (1B), "A", "B", and "C" are symbols indicating a ring structure. In addition, in Formula (1A) and Formula (1B), a dashed line indicates that a ring or a group at both ends of the dashed line may or may not be bonded to each other. In Formula (1A) and Formula (1B), * indicates the position, but (*) at one end of a dashed line in Formula (1B) indicates that the position may or may not be present.

In Formula (1A) and Formula (1B), A ring, B ring and C ring are each independently an aryl ring which may be substituted or a heteroaryl ring which may be substituted. C ring may be bonded to a ring, to which a substructure represented by Formula (1B) is bonded, or X at a position of (*) via a dashed line as —X— or single bond. The plurality of C rings in the at least two substructures represented by formulas (1B) may be the same or different from each other.

The substructure represented by Formula (1B) is bonded at the position of * to a ring constituting atom of the aryl or heteroaryl ring in one selected from the group consisting of A ring, B ring and $R^{XD}$ in the substructure represented by Formula (1A) and C ring and $R^{XE}$ in another substructure represented by Formula (1B)

In Formula (1A), $R^{XD}$ is an aryl which may be substituted, a heteroaryl which may be substituted, an alkyl which may be substituted, or a cycloalkyl which may be substituted, and may be bonded to A ring via the dashed line which is —X— or single bond. In addition, $R^{XD}$ may be bonded to B ring via the dashed line which is —X—, —X'— or single bond. In Formula (1B), each $R^{XE}$ is independently an aryl which may be substituted, a heteroaryl which may be substituted, an alkyl which may be substituted, or a cycloalkyl which may be substituted, and may be bonded to a ring to which a substructure represented by Formula (1B) is bonded or X at a position of (*) via the dashed line which is —X— or single bond. In addition, the dashed line may be —X—, —X'— or single bond to be bonded to C ring.

When the substructure represented by Formula (1B) is bonded to an aryl ring or a heteroaryl ring in A ring or B ring or the like at a position of (*), a dashed line connecting the (*) and the aryl ring or the heteroaryl ring is preferably —X—, and when the substructure represented by Formula (1B) is bonded to X at a position of (*), a dashed line connecting the (*) and X is preferably single bond.

The plurality of $R^{XE}$ in the substructure represented by at least two formulas (1B) may be the same or different from each other.

In Formula (1A), $R^{XD}$ is preferably an aryl which may be substituted or a heteroaryl which may be substituted. In addition, it is preferable that $R^{XD}$ is bonded to A ring via —X—. In Formula (1B), $R^{XE}$ is preferably an aryl which may be substituted or a heteroaryl which may be substituted. That is, Formula (1A) is preferably the following Formula (2A), and Formula (1B) is preferably the following Formula (2B)

(2A)

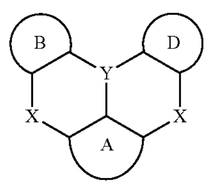

(2B)

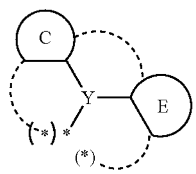

In Formula (2A), the same symbols as in Formula (1A) are synonymous with each in Formula (1A). “D” is a symbol indicating a ring structure, and D ring is one aspect of $R^{XD}$ of Formula (1A). In Formula (2B), the same symbols as in Formula (1B) are synonymous with each of Formula (1B) “E” is a symbol indicating a ring structure, and E ring is one aspect of $R^{XE}$ in Formula (1B). That is, the substructure represented by Formula (2B) is bonded at the position of * to a ring constituting atom of the aryl or heteroaryl ring in one selected from the group consisting of A ring, B ring and D ring in the substructure represented by formula (2A) and C ring and E ring in the substructure represented by another formula (2B).

It is preferred that any of A ring, B ring, C ring, $R^{XD}$ and $R^{XE}$ in Formulas (1A) and (1B) (A ring, B ring, C ring, D ring, and E ring in Formulas (2A) and (2B)) is bonded to Y at its 5- or 6-member ring. A ring bonded to any of X may be bonded to the X at the same 5- or 6-member ring. Here, “bonded to Y (and any X) at a 5-membered ring or a 6-membered ring” means being bonded to Y (and any X) at a ring constituting atom of the 5-membered ring or the 6-membered ring, including when the ring is formed only by the 5-membered ring or the 6-membered ring, and when another ring or the like is fused so as to include the 5-membered ring or the 6-membered ring to form an aryl ring or a heteroaryl ring in A ring, B ring, C ring, $R^{XD}$ or $R^{XE}$.

In Formula (1A) and Formula (1B), X and Y bonded to the same ring may be bonded to ring constituting atoms adjacent to each other, respectively.

The polycyclic aromatic compound of the present invention can be described as a polycyclic aromatic compound having a structure consisting of 3 or more of structural units in which 3 aromatic rings are linked by hetero atoms such as boron, phosphorus, oxygen, nitrogen, or sulfur, and is a multimer in a form in which an arbitrary ring contained in the above structural unit is bonded to each other so as to be shared by a plurality of structural units. Emission wavelengths can be tuned by adjusting the number of this structural unit, with 3-5-mers preferred for blue to green emission and 4-6-mers preferred for green to red emission. In other words, for blue to green light emission, the polycyclic aromatic compound of the present invention preferably contains 2 to 4 substructures represented by Formula (1B), and for green to red light emission, the polycyclic aromatic compound of the present invention preferably contains 3 to 5 substructures represented by Formula (1B).

As for the binding form of linking of the substructure represented by Formula (1A) and the substructure represented by Formula (1B), as shown below, there is, for example, a binding form represented by any one of Formula (II-1) and Formula (II-2) in which the substructure represented by Formula (1B) is bonded to A ring at the position of * and the position of one (*) Formula (II-1) shows a binding form in which the substructure represented by Formula (1B) is further bonded to X at the other (*) position. Formula (II-2) shows a binding form in which the substructure represented by Formula (1B) is further bonded to A-ring at the other (*) position.

Any of Formula (II-3) to Formula (II-8) is a binding form in which the substructure represented by Formula (1B) is bonded to B ring at the position of * and the position of one (*). Formula (II-3) is a binding form in which the substructure represented by Formula (1B) is further bonded to B ring at another (*) position, and each of Formula (II-4) and Formula (II-6) is a form in which the substructure represented by Formula (1B) is further bonded to X at another (*) position. Note that, although not shown below, the same binding forms as in the case where the substructure represented by Formula (1B) is bonded to B ring can be exemplified for the case where it is bonded to $R^{XD}$ (D ring). In the following Formulas, X when the substructure represented by Formula (1B) is linked to X at the position of (*) is shown as $X^T$.

(II-1)

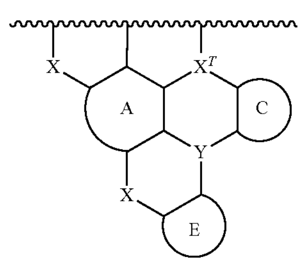

-continued (II-2)

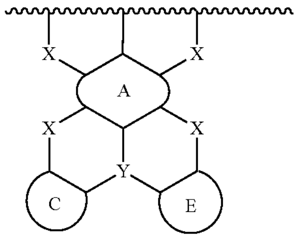

(II-3)

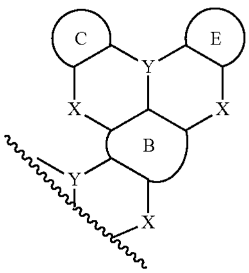

(II-4)

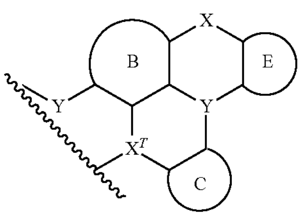

(II-5)

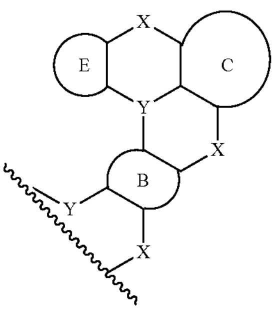

(II-6)

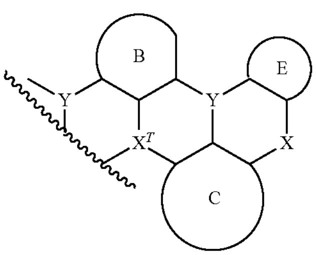

(II-7)

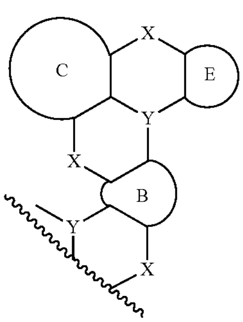

-continued (II-8)

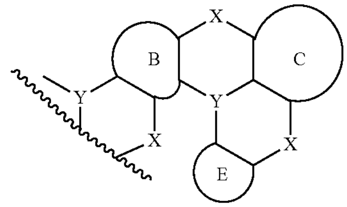

A polycyclic aromatic compound consisting of a substructure represented by Formula (1A) and at least two substructures represented by Formula (1B) corresponds to a structure obtained by combining two or more of the forms selected from the group consisting of the forms represented by any of the structures of formula (II-1) to formula (II-8), for example. In the compound of the present invention, the substructure represented by Formula (1B) may be 2, and may be 3 or more (e.g., 3 to 5). The structure may be the one formed by combining the same binding forms or the one formed by combining different binding forms. In addition, when combined, a substructure represented by (1B) in which all of the positions of (*) are bonded to X (a dashed line is preferably single bond) may be included.

Specific examples of the binding form represented by the structure of Formula (II-1) to Formula (II-8) include substructures represented by the following formulas, respectively.

(II-1-1)

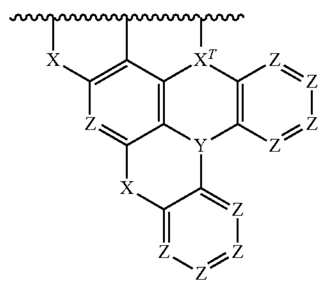

(II-2-1)

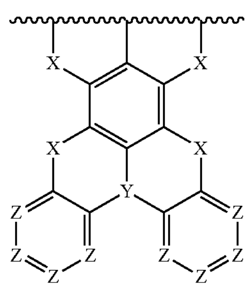

(II-3-1)

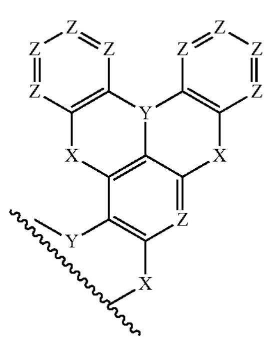

-continued
(II-3-2)
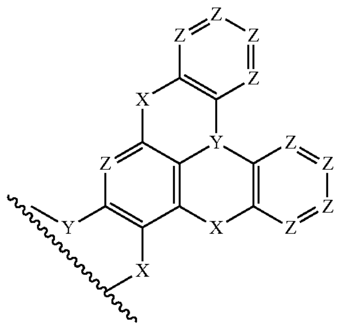
(II-4-1)
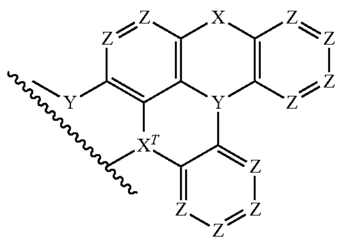
(II-5-1)
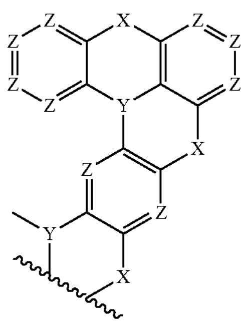
(II-5-2)
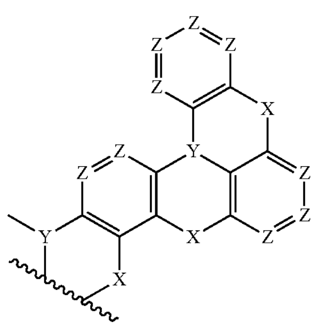
(II-6-1)
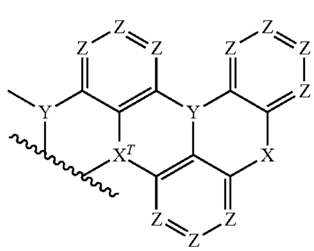
-continued
(II-7-1)
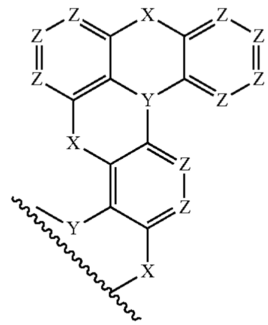
(II-7-2)
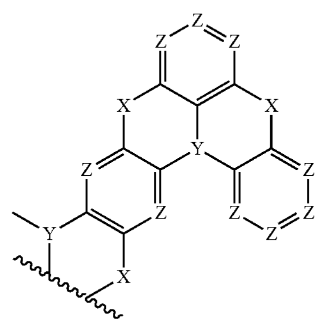
(II-8-1)
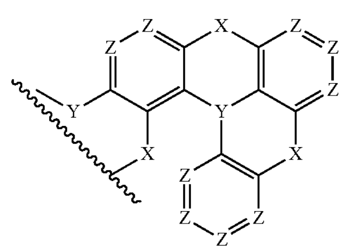
Examples in which the ring to which the substructure represented by Formula (2B) is bonded at the position of * is a 5-membered ring or a fused ring are shown below.
(II-3-3)
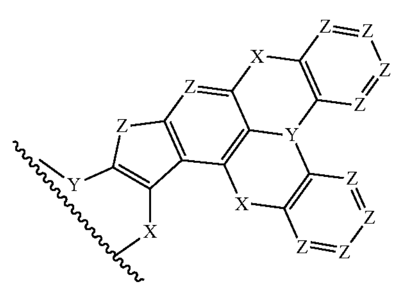

-continued
(II-5-3)
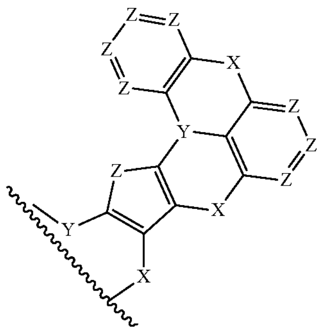
(II-5-4)
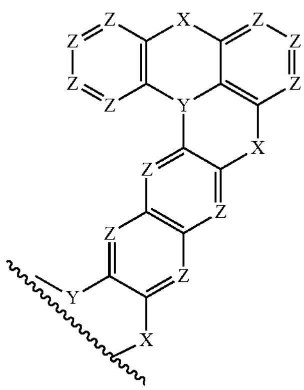
(II-3-4)
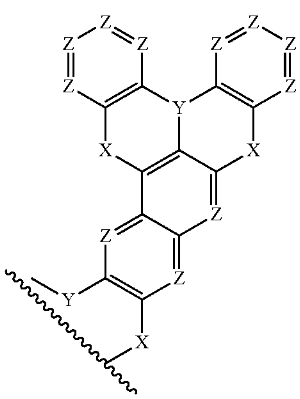
(II-3-5)
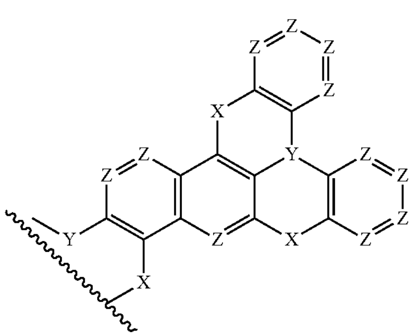
-continued
(II-3-6)
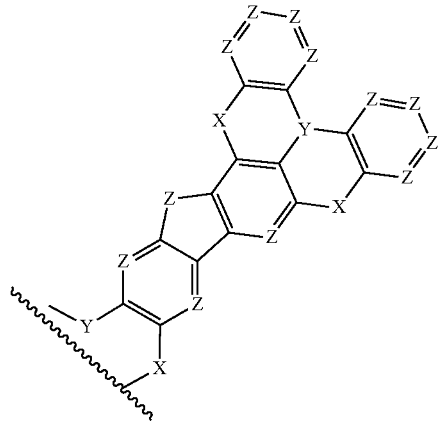
For example, specific examples of the polycyclic aromatic compound composed of a substructure represented by Formula (1A) and two substructures represented by Formula (1B) include a compound represented by any one of the following formulas (III-1) to (III-14)
(III-1)
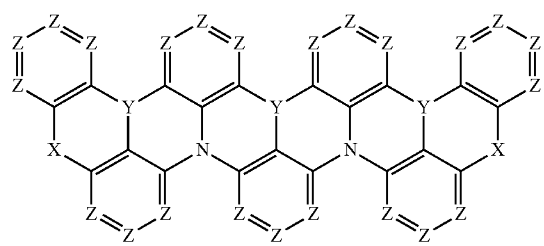
(III-2)
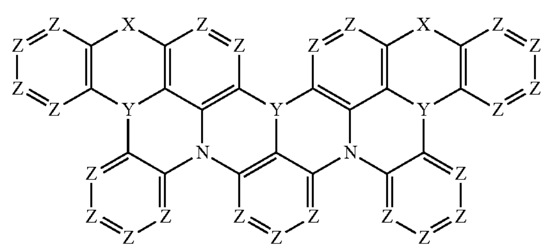
(III-3)
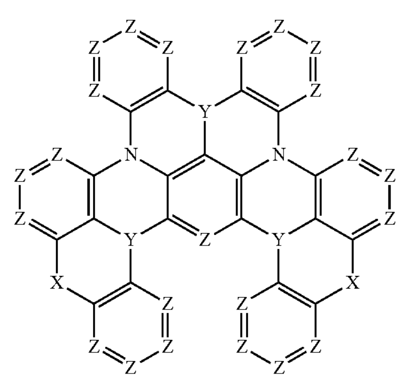

-continued
(III-4)
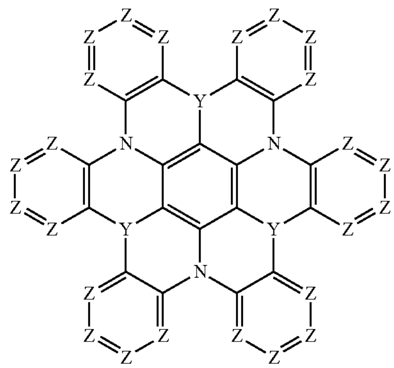
(III-5)
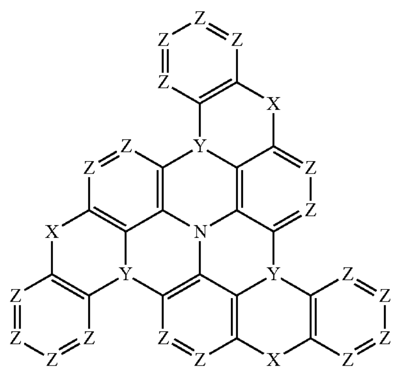
(III-6)
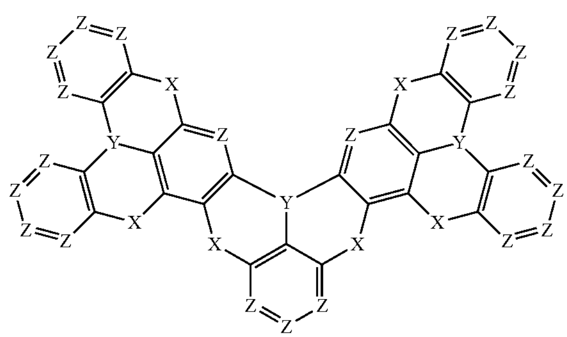
(III-7)
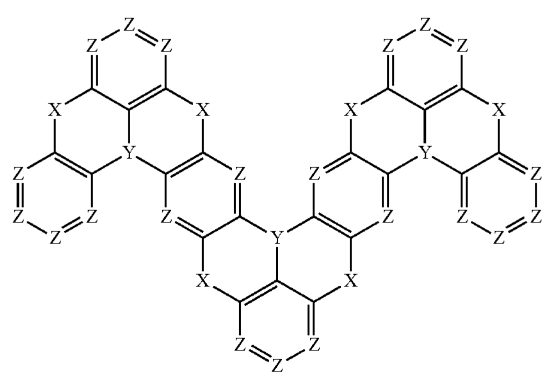
-continued
(III-8)
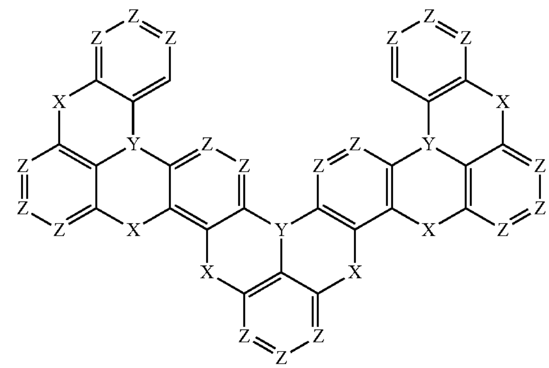
(III-9)
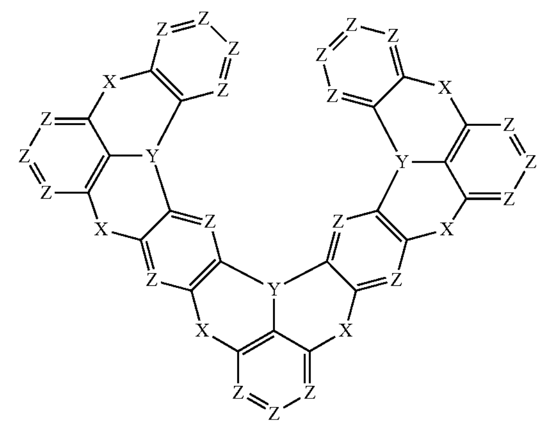
(III-10)
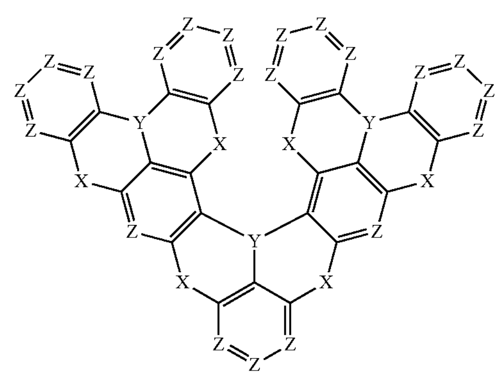
(III-11)
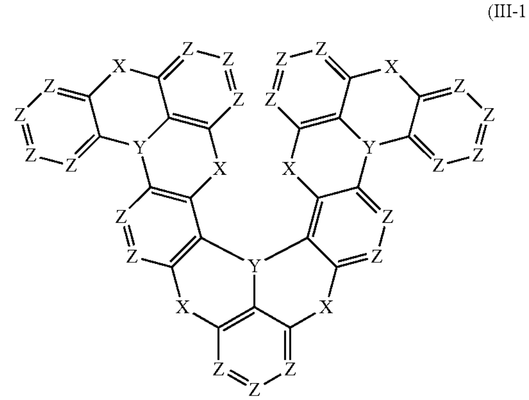

-continued (III-12)

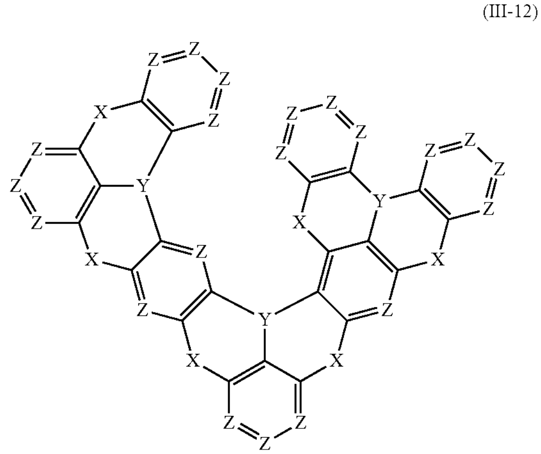

(III-13)

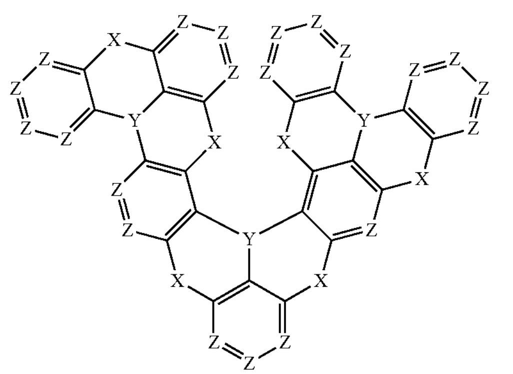

(III-14)

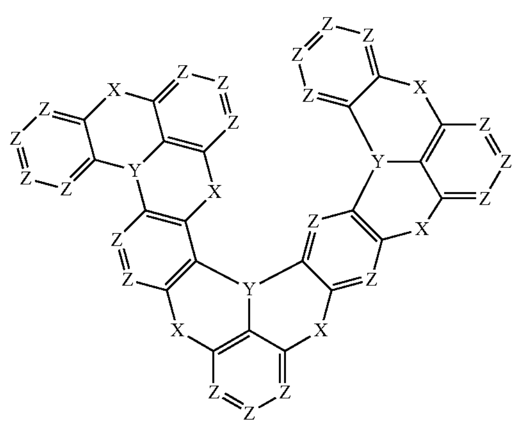

For good TADF, it is required that (1) the differences between the lowest excited singlet energy level and the lowest excited triplet energy level are small and (2) the spin-orbit interaction is large. For (1), separation and localization of HOMO and LUMO are required, and (1) can be achieved by optimizing X, Y and Z in the compounds of the present invention. More specifically, they include optimization to enhance multiple resonance effects, or optimization to utilize the separation of orbitals by donor and acceptor structures. (2) can be achieved in the compound of the present invention by adopting a steric structure that can increase the spin angle momentum, by introducing a heavy atom into a molecule, or by combining them.

For good TADF, it is preferred that Y is bonded at the m-position of another Y and X is bonded at the m-position of another X. In addition, it is also preferable that larger numbers of Y and X are bonded to the same ring for good TADF For emission at a shorter wavelength, a structure in which Y is bonded at the m-position of another Y and X is bonded at the m-position of another X is preferred. Also, similarly, for light emission at a shorter wavelength, a structure in which smaller number of Y and X are bonded to the same ring is preferred. Also, similarly, for light emission at a shorter wavelength, a structure in which a linear connection of rings formed by C, X, Y and Z is shorter is preferred. In addition, similarly, for light emission at a shorter wavelength, a structure in which a linear connection of rings formed by C, X, Y and Z is shorter and a maximum number of connection is smaller is preferred. For example, a compound represented by Formula (III-1) has one hexacene ring formed by C, X and Y, and a compound represented by Formula (III-2) has one tetracene ring formed by C, X and Y. For emission at a shorter wavelength, a compound represented by Formula (III-1) is preferred. Similarly, a compound represented by Formula (III-3) has one pentacene ring, and a compound represented by Formula (III-4) has 3 pentacene rings. For emission at a shorter wavelength, a compound represented by Formula (III-4) is preferred, and those with the smaller maximum number of connection of the rings formed by C, X, Y and Z are preferred. For example, a structure represented by Formula (II-5-1) has one pentacene ring formed by C, X and Y, a structure represented by Formula (II-6-1) has one tetracene ring formed by C, X and Y, and a structure represented by Formula (II-5-2) has one anthracene ring formed by C, X and Y. For light emission at a shorter wavelength, a structure represented by Formula (II-5-2) is preferred. For high efficiency, structures with fewer Y and X attached to the same ring are preferred. For emission at a longer wavelength, it is preferred that X and Y are bonded to the o or p position to each other. In addition, similarly, for emission at a longer wavelength, a structure in which a larger number of Y and X are bonded to the same ring is preferred. From the viewpoint of synthesis, a structure having less steric hindrance is preferred to easily synthesize the compound, and a structure having a larger number of X and Y bonded to a ring is preferred because it has high stability.

In summary, more specifically, in order to have high TADF in blue, a compound represented by any one of Formula (III-1) to Formula (III-5), Formula (III-9) to Formula (III-14) is preferred, a compound represented by Formula (III-3) to Formula (III-5), Formula (III-9) to Formula (III-14) is more preferred, and a compound represented by Formula (III-9) to Formula (III-14) is further preferred. When a synthetic viewpoint is added, a compound represented by Formula (III-9) and Formula (III-10) is particularly preferred, and a compound represented by Formula (III-10) is most preferred.

From another point of view, it is also preferred that the compound of the present invention is a compound having an asymmetric structure. This is because higher order orbitals corresponding to the structure are formed in the asymmetric structure, and a faster delayed fluorescence rate is obtained because interstitial crossing between the lowest excited singlet and the higher order triplet or between the higher order singlet and the higher order triplet is enabled, and thus, an element having a faster delayed fluorescence rate and a higher efficiency or a longer lifetime than a compound having a symmetric structure can be formed. For example, a compound having a structure in which a substructure represented by one Formula (1B) is bonded to each of B ring and $R^{XD}$ of the substructure represented by Formula (1A), wherein the substructures represented by Formula (1B) are different to each other in its structure itself or in its binding form, is preferred. From this viewpoint, for example, a compound represented by Formula (III-12) is preferred.

In each of the above Formula (II-1) to Formula (II-8) and their specific examples, Formula (III-1) to formula (III-14), the same symbols as in Formula (1A) and Formula (1B) are synonymous with each in Formula (1A) and Formula (1B), and preferred ranges thereof are also the same. However, a structure in which R of >N—R, >C(—R)$_2$, or >Si(—R)$_2$ is bonded to at least one of A ring, B ring, C ring, $R^{XD}$, or $R^{XE}$ by a linking group or single bond in Formula (1A) and Formula (1B) corresponds to a structure in which R is bonded to Z adjacent to any of the C atoms to which X is directly bonded via a linking group or a single bond in each of the above formulas. Note that, in the present specification, when "bonded to Z", Z is —C(—$R^Z$)═, and the bonding may be to this carbon atom or to a $R^Z$, but is preferably bonded to the carbon atom. In other words, R is preferably directly bonded to the carbon atom which is a ring constituting atom.

In addition, in the compound represented by Formula (III-12), at least one X is preferably >O or >S.

In each of the above formulas, each of Z is independently —C(—$R^Z$)═ or —N═ and the two adjacent Zs may be replaced with —C(—$R^Z$)$_2$—, —Si(—$R^Z$)$_2$—, —N(—$R^Z$)—, —O—, —S— or —Se—.

Each of $R^Z$ is independently hydrogen or a substituent. More specifically, each of $R^Z$ is independently hydrogen, an aryl, a heteroaryl, a diarylamino, a diheteroarylamino, an arylheteroarylamino, a diarylboryl (2 aryl may be attached via a single bond or a linking group), an alkyl, a cycloalkyl, an alkoxy, an aryloxy, a substituted silyl or a-L-Ak as described below, and at least one hydrogen in each of the above groups other than-L-Ak may be replaced with an aryl, a heteroaryl, an alkyl or a cycloalkyl. In addition, any adjacent groups among $R^Z$ may be bonded to each other to form an aryl ring or a heteroaryl ring together with a ring to which the adjacent groups are bonded, and at least one hydrogen in the ring formed may be substituted, and specifically examples of the substituent include a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted diarylboryl (2 aryl may be bonded via single bond or a linking group), a substituted or unsubstituted alkyl, a substituted or unsubstituted cycloalkyl, a substituted or unsubstituted alkoxy, a substituted or unsubstituted aryloxy, a substituted silyl or a-L-Ak described later. Substituents referred to as "substituted or unsubstituted" or "substituted" include an aryl, a heteroaryl, an alkyl and a cycloalkyl.

For details and preferred ranges of $R^Z$, the description of the first substituent and the second substituent described later can be referred to.

Examples of the structures in which the two adjacent Z's are replaced with —C(—$R^Z$)$_2$—, —Si(—$R^Z$)$_2$—, —N(—$R^Z$)—, —O—, or —S— include cyclopentadiene ring, pyrrole ring, furan ring, thiophene ring, thiazole ring, and oxazole ring. However, two adjacent Z's are preferably not replaced with —C(—$R^Z$)$_2$—, —Si(—$R^Z$)$_2$—, —N(—$R^Z$)—, —O—, or —S—. At this time, Z at the o- (ortho) or p- (para) position relative to Y is preferably —C(—$R^Z$)═. In addition, in the ring (monocyclic ring) containing Z as —N═, it is preferable that one or two of the plurality of Z are —N═ and when two are —N═, it is preferable that the two —N═ are not adjacent to each other. When the six-member ring is a ring containing Z as —N═, pyridine ring, pyrazine ring, pyrimidine ring, pyridazine ring, or 1,2,3-triadine ring is preferred, and pyridine ring, pyrazine ring, or pyrimidine ring is more preferred. The ring (monocycle) containing Z as —N═ is 0 to 4, more preferably 0 to 3, still more preferably 0 to 2, and particularly preferably 0 to 1. It is preferred that —C(—$R^Z$)═ that is at the ortho- or para-position to the carbon to which X or >N— is attached is —N═.

As an aspect, it is also preferred that every Z is —C(—$R^Z$)═, that is, every ring is a benzene ring which may have a substituent.

In Formulae (III-1) to (III-14), each of $R^Z$ when Z is —C(—$R^Z$)═ is preferably hydrogen, an aryl having 6 to 30 carbons, a heteroaryl having 2 to 30 carbons, a diarylamino (provided that the aryl is an aryl having 6 to 12 carbons), a diarylboryl (provided that the aryl is an aryl having 6 to 12 carbons, and the 2 aryl may be bonded via single bond or a linking group), an alkyl having 1 to 24 carbons, a cycloalkyl having 3 to 24 carbons, a triarylsilyl (provided that the aryl is an aryl having 6 to 12 carbons), or a trialkylsilyl (provided that the alkyl is an alkyl having 1 to 6 carbons), and any adjacent $R^Z$ may be bonded to each other to form, together with a ring, b ring or c ring, an aryl ring having 9 to 16 carbons or a heteroaryl ring having 6 to 15 carbons, wherein at least one hydrogen in the ring formed may be replaced with an aryl having 6 to 10 carbons, an alkyl having 1 to 12 carbons, a cycloalkyl having 3 to 16 carbons, triarylsilyl (provided that aryl is an aryl having 6 to 12 carbons), or trialkylsilyl (provided that alkyl is an alkyl having 1 to 5 carbons).

Each of $R^Z$ when Z is —C(—$R^Z$)═ is more preferably each independently hydrogen, an aryl having 6 to 16 carbons, a heteroaryl having 2 to 20 carbons, a diarylamino (provided that aryl is aryl having 6 to 10 carbons), an alkyl having 1 to 12 carbons or a cycloalkyl having 3 to 16 carbons, and further preferably each independently hydrogen, an aryl having 6 to 16 carbons, a diarylamino (provided that aryl is aryl having 6 to 10 carbons), an alkyl having 1 to 12 carbons or a cycloalkyl having 3 to 16 carbons.

It is preferable that 0 to 1 $R^Z$ in each ring in each of Formulas (III-1) to (III-14) is a substituent other than hydrogen in each of the substructures represented by Formula (1A) and the structural Formula (1B), and the others are hydrogen.

In each of Formulas (III-1) to (III-14), $R^Z$'s bonded to adjacent C's (carbon atoms) may be bonded to each other to form an aryl ring or a heteroaryl ring together with the ring containing the C's (carbon atoms).

Examples of structures of the ring containing Z in each formula of Formula (III-1) to Formula (III-14) are shown below as examples of structures containing 4 of Z and bonded to X and Y. In the formulae below, R is synonymous with $R^Z$, but is not meant to be further bonded to R. In addition, n is an integer of 0 to 4, and $R^N$ and $R^c$ are hydrogen, an aryl optionally substituted with an alkyl or a cycloalkyl, a heteroaryl optionally substituted with an alkyl or a cycloalkyl, an alkyl optionally substituted with a cycloalkyl, or a cycloalkyl optionally substituted with an alkyl, and any two $R^c$ may be bonded to each other to form a ring. For the ring to be formed, see the discussion below about two R's bonded to each other to form a ring in each of >C(—R)$_2$ and >Si(—R)$_2$ as X.

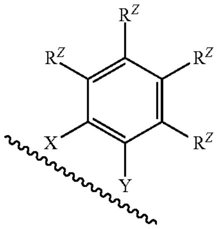
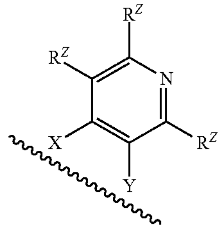
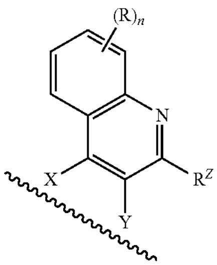
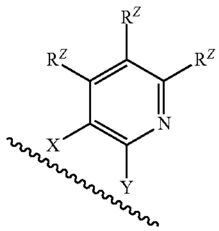
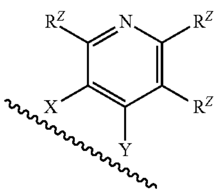
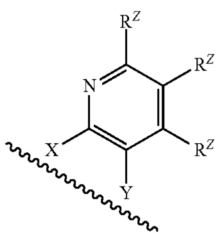
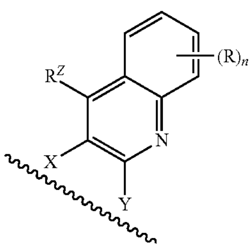
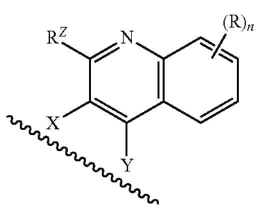
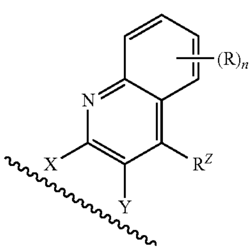
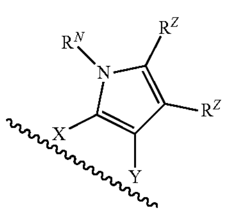
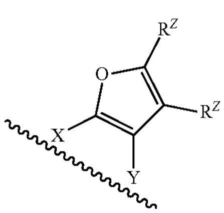
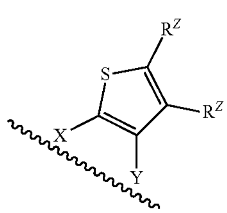
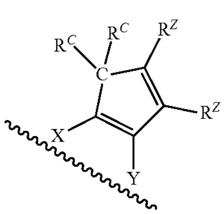
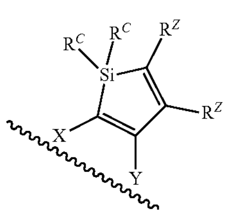
-continued
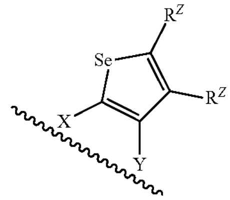
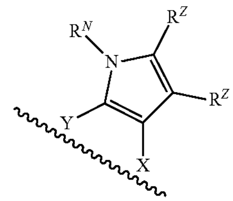
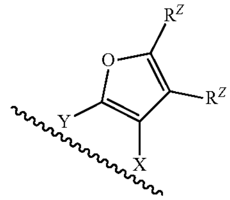
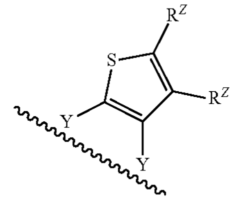
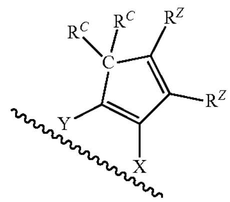
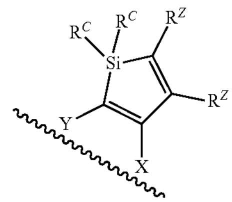
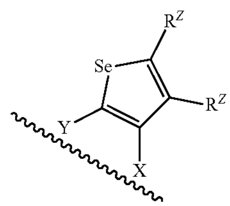
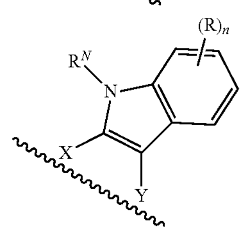
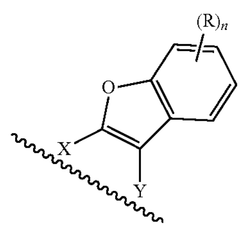
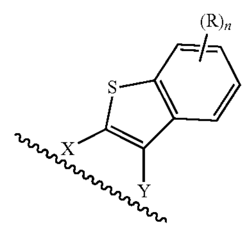
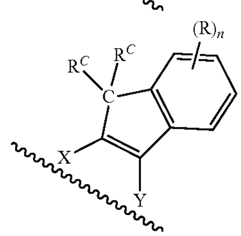
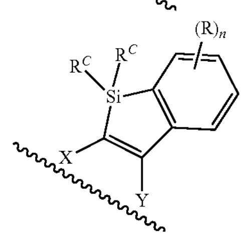
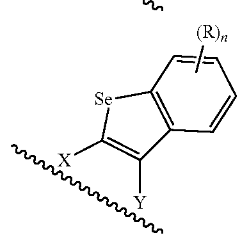
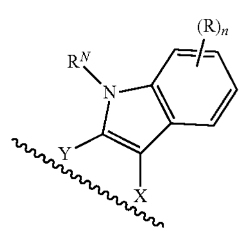
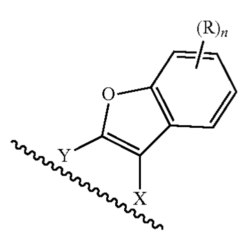
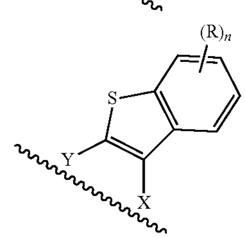

-continued
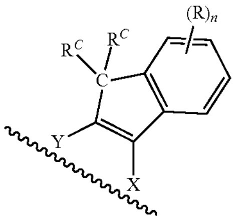
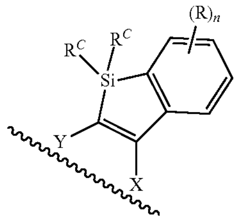
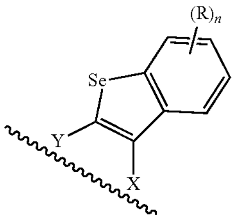
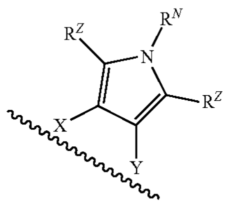
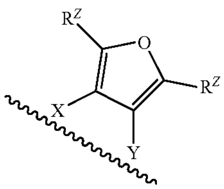
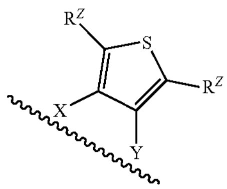
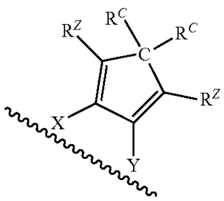
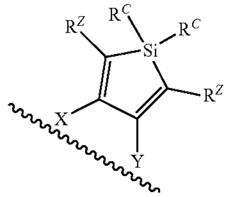
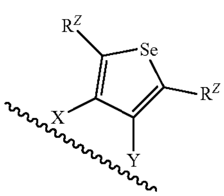
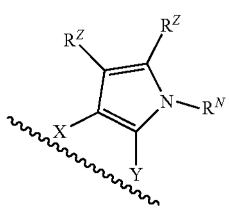
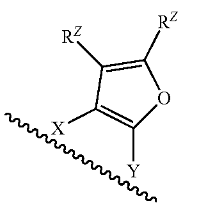
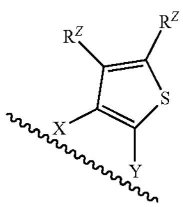
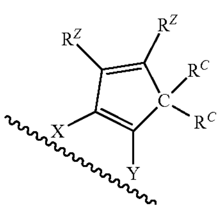
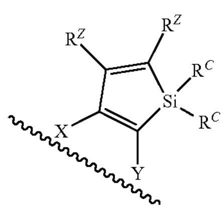
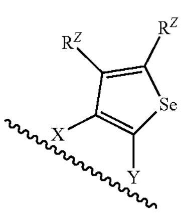
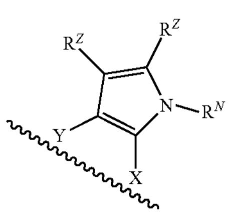
-continued
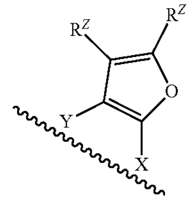
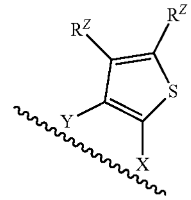
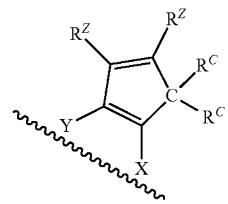
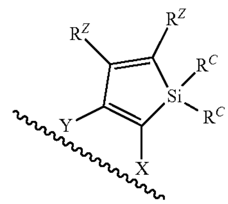
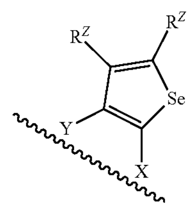
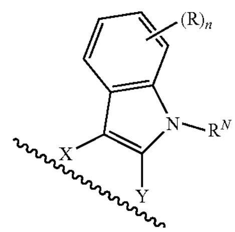
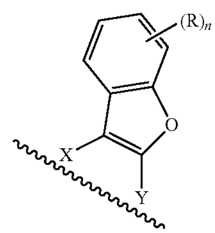
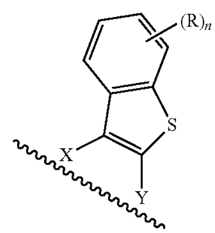
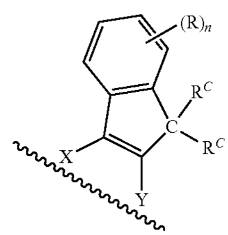
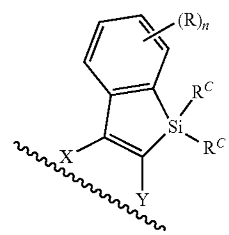
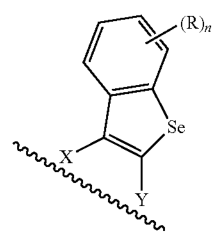
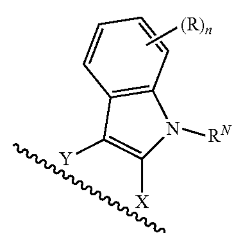
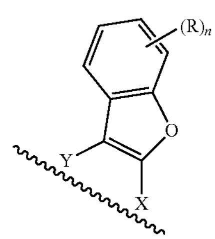
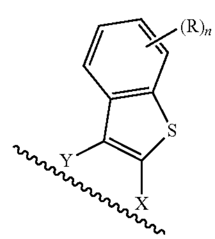

-continued

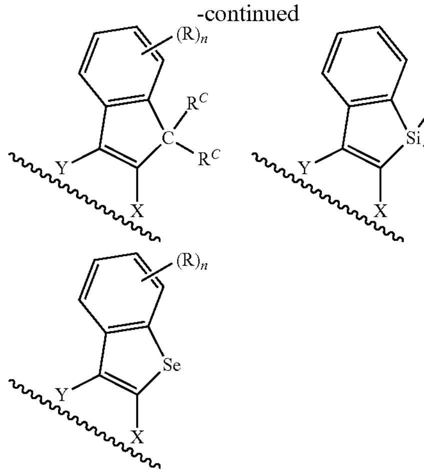

A ring, B ring, and C ring in Formula (1A) and Formula (1B) and A ring, B ring, C ring, D ring and E ring in formula (2A) and formula (2B) are each independently an aryl ring which may be substituted or a heteroaryl ring which may be substituted.

As the 'aryl ring' in A ring, B ring, and C ring, $R^{XD}$ and $R^{XE}$ in Formula (1A) and Formula (1B) and A ring, B ring, C ring, D ring and E ring in Formula (2A) and Formula (2B), an aryl ring having 6-30 carbons can be exemplified, an aryl ring having 6-16 carbons is preferred, an aryl ring having 6-12 carbons is more preferred, and an aryl ring having 6-10 carbons is particularly preferred.

Specific examples of the "aryl ring" include benzene ring as a monocyclic ring, biphenyl ring as a bicyclic ring, naphthalene ring and indene ring as a fused bicyclic ring, terphenyl ring (m-terphenyl, o-terphenyl, p-terphenyl) as a tricyclic ring, acenaphthylene ring, fluorene ring, phenalene ring, phenanthrene ring and anthracene ring as a fused tricyclic ring, triphenylene ring, pyrene ring, naphthacene ring and chrysene ring as a fused tetracyclic ring, perylene ring and pentacene ring as a fused pentacyclic ring. Further, the fluorene ring, the benzofluorene ring, and the indene ring also include a structure in which another fluorene ring, benzofluorene ring, and cyclopentane ring, and the like are spiro-bonded, respectively. The fluorene ring, benzofluorene ring and indene ring also include a dimethylfluorene ring, a dimethylbenzofluorene ring and a dimethylindene ring, in which two of the two hydrogens of methylene in the fluorene ring, benzofluorene ring and indene ring are each replaced with methyl (it may be another alkyl) as the first substituent described below.

As the "heteroarylic ring" in A ring, B ring, and C ring, $R^{XD}$ and $R^{XE}$ in Formulas (1A) and (1B) and in A ring, B ring, and C ring, D ring and E ring in Formulas (2A) and Formulas (2B), a heteroaryl ring having 2 to 30 carbons is exemplified, a heteroaryl ring having 2 to 25 carbons is preferable, a heteroaryl ring having 2 to 20 carbons is more preferable, a heteroaryl ring having 2 to 15 carbons is further preferable, and a heteroaryl ring having 2 to 10 carbons is particularly preferable. Moreover, specific examples of the "heteroaryl ring" include a heterocyclic ring containing, in addition to carbons, 1 to 5 hetero atoms selected from oxygen, sulfur and nitrogen as a ring-forming atom.

Specific examples of the "heteroaryl ring" include a pyrrole ring, an oxazole ring, an isoxazol ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzooxazole ring, a benzothiazole ring, a 1H-benzotriazol ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, a phenazasiline ring, an indolizine ring, a furan ring, a benzofuran ring, an isobenzofuran ring, a dibenzofuran ring, a thiophene ring, a benzothiophene ring, a dibenzothiophene ring, a furazan ring, a thianthrene ring, indolocarbazole ring, benzoindrocarbazole ring, dibenzoindrocarbazole ring, naphthobenzofuran ring, dioxine ring, dihydroacridine ring, xanthene ring, thioxanthene ring, dibenzodioxin ring, dibenzazepine ring, tribenzazepine ring, Iminodibenzyl ring. Further, bipyridine ring, phenylpyridine ring, and pyridylphenyl ring which are bicyclic, terpyridyl ring, bispyridylphenyl ring, and pyridylbiphenyl ring which are a tricyclic can be also exemplified as a "heteroaryl ring." Further, the "heteroaryl ring" shall also include pyran ring.

Examples of the substituents, with which at least one hydrogen in the formed ring may be replaced, are a substituted or unsubstituted aryl, a substituted or unsubstituted heteroaryl, a substituted or unsubstituted diarylamino, a substituted or unsubstituted diheteroarylamino, a substituted or unsubstituted aryl heteroarylamino (amino having aryl and heteroaryl), a substituted or unsubstituted diarylboryl (the two aryls may be linked via a single bond or a linking group), a substituted or unsubstituted alkyl, a substituted or unsubstituted cycloalkyl, a substituted or unsubstituted alkoxy, a substituted or unsubstituted aryloxy, a substituted silyl, or L-Ak. Examples of the substituent when these groups have one or more substituent include an aryl, a heteroaryl, an alkyl, a cycloalkyl, and a diarylamino.

At least one of the hydrogens in the "aryl ring" or "heteroaryl ring" above may be replaced with a first substituent, which is a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "diarylboryl (the two aryls may be bonded via a single bond or a linking group)", a substituted or unsubstituted "alkyl", a substituted or unsubstituted "cycloalkyl", a substituted or unsubstituted "alkoxy", a substituted or unsubstituted "aryloxy", a substituted "silyl", or -L-Ak, and examples of "aryl" or "heteroaryl", as the first substituent, aryl in "diarylamino", heteroaryl in "diheteroarylamino", aryl and heteroaryl in "arylheteroarylamino", aryl in "diarylboryl", and aryl in "aryloxy" include the above-mentioned monovalent groups of "aryl ring" or "heteroaryl ring".

Specific examples of the "aryl" include an aryl having 6 to 30 carbons, and an aryl having 6 to 20 carbons is preferred, an aryl having 6 to 16 carbons is further preferred, an aryl having 6 to 12 carbons is particularly preferred, and an aryl having 6 to 10 carbons is most preferred.

Specific examples of aryl include phenyl as monocyclic aryl, (2-,3-,4-)biphenylyl as bicyclic aryl, (1-,2-)naphthyl and (2-,3-,4-,5-,6-,7-)indenyl as fused bicyclic aryl, terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) as tricyclic aryl, acenaphthylen-(1-,3-,4-,5-)yl, fluoren-(1-,2-,3-,4-,9-)

yl, phenalen-(1-,2-)yl, (1-,2-,3-,4-,9-)phenanthryl as fused tricyclic aryl, quaterphenylyl (5'-phenyl-m-terphenyl-2-yl, 5'-phenyl-m-terphenyl-3-yl, 5'-phenyl-m-terphenyl-4-yl, m-quaterphenylyl) as tetracyclic aryl, triphenylen-(1-,2-)yl, pyren-(1-,2-,4-)yl, naphthacen-(1-,2-,5-)yl as fused tetracyclic aryl, perylen-(1-,2-,3-)yl, pentacen-(1-,2-,5-,6-)yl as fused pentacyclic aryl.

Specific examples of the "heteroaryl" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of heteroaryl include a heterocyclic ring containing, in addition to carbon, 1 to 5 hetero atoms selected from oxygen, sulfur and nitrogen as a ring-forming atom.

Specific examples of the heteroaryl include furyl, thienyl, pyrrolyl, oxazolyl, isoxazolyl, thiazolyl, isothiazolyl, imidazolyl, pyrazolyl, oxadiazolyl, furazanyl, thiadiazolyl, triazoryl, tetrazolyl, pyridyl, pyrimidinyl, pyridazinyl, pyrazinyl, triazinyl, benzofuranyl, isobenzofuranyl, dibenzofuranyl, benzo[b]thienyl, dibenzothienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

"Alkyl" as a first substituent may be either a straight chain or a branched chain, and specific examples thereof include a straight-chain alkyl having 1 to 24 carbons or a branched-chain alkyl having 3 to 24 carbons. An alkyl having 1 to 18 carbons (a branched-chain alkyl having 3 to 18 carbons) is preferred, and an alkyl having 1 to 12 carbons (a branched-chain alkyl having 3 to 12 carbons) is further preferred, and an alkyl having 1 to 6 carbons (a branched-chain alkyl having 3 to 6 carbons) is still further preferred, and an alkyl having 1 to 5 carbons (a branched-chain alkyl having 3 to 5 carbons) is particularly preferred.

Specific examples of the "alkyl" include methyl, ethyl, n-propyl, isopropyl, n-butyl, isobutyl, s-butyl, t-butyl, n-pentyl, isopentyl, neopentyl, t-pentyl (t-amyl), n-hexyl, 1-methylpentyl, 4-methyl-2-pentyl, 3,3-dimethylbutyl, 2-ethylbutyl, n-heptyl, 1-methylhexyl, n-octyl, t-octyl (1,1,3,3-tetramethylbutyl), 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

The examples further include 1-ethyl-1-methylpropyl, 1,1-diethylpropyl, 1,1-dimethylbutyl, 1-ethyl-1-methylbutyl, 1,1,4-trimethylpentyl, 1,1,2-trimethylpropyl, 1,1-dimethyloctyl, 1,1-dimethylpentyl, 1,1-dimethylheptyl, 1,1,5-trimethylhexyl, 1-ethyl-1-methylhexyl, 1-ethyl-1,3-dimethylbutyl, 1,1,2,2-tetramethylpropyl, 1-butyl-1-methylpentyl, 1,1-diethylbutyl, 1-ethyl-1-methylpentyl, 1,1,3-trimethylbutyl, 1-propyl-1-methylpentyl, 1,1,2-trimethylpropyl, 1-ethyl-1,2,2-trimethylpropyl, 1-propyl-1-methylbutyl, and 1,1-dimethylhexyl.

As a substituent containing "alkyl" described above, a tertiary-alkyl represented by the following formula (tR) is one of particularly preferred as a substituent to the above-described aryl ring or heteroaryl ring. This is because the emission quantum yield (PLQY) is improved as the intermolecular distance is increased by such a bulky substituent. Also preferred is a substituent in which a tertiary-alkyl represented by formula (tR) is substituted to another substituent as a second substituent. Specific examples thereof include a diarylamino substituted with a tertiary-alkyl represented by (tR), a carbazolyl substituted with a tertiary-alkyl represented by (tR) (preferably, N-carbazolyl) or a benzocarbazolyl substituted with a tertiary-alkyl represented by (tR) (preferably, N-benzocarbazolyl). For "diarylamino", there may be mentioned the group which is described as "first substituent" below. Substituted forms of groups of formula (tR) to diarylamino, carbazolyl and benzocarbazolyl include examples in which some or all hydrogens of the aryl ring or the benzene ring in these groups are replaced with groups of Formula (tR).

(tR)

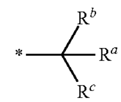

In Formula (tR), $R^a$, $R^b$ and $R^c$ are each independently an alkyl having 1 to 24 carbons, any-$CH_2$-in the alkyl may be replaced with —O—, and the group represented by Formula (tR) replaces at least one hydrogen in the compound including a partial structure represented by Formula (1A) and two partial structures each represented by Formula (1B) at *.

"Alkyl having 1 to 24 carbons" as $R^a$, $R^b$, and $R^C$ may be either a straight chain or a branched chain, for example, a straight chain alkyl having 1-24 carbons or a branch chain alkyl having 3 to 24 carbons. Examples include an alkyl having 1 to 18 carbons (a branch chain alkyl having of 3-18 carbons), an alkyl having 1 to 12 carbons (a branch chain alkyl having 3-12 carbons), an alkyl having 1 to 6 carbons (a branch chain alkyl having 3 to 6 carbons), or an alkyl having 1 to 4 carbons (a branch chain alkyl having 3 to 4 carbons).

The sum of the number of carbons in $R^a$, $R^b$, and $R^c$ in Formula (tR) is preferably from 3 to 20, and particularly preferably from 3 to 10.

Specific alkyls of $R^a$, $R^b$ and $R^c$ include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

Examples of a group represented by Formula (tR) include t-butyl, t-amyl, 1-ethyl-1-methylpropyl, 1,1-diethylpropyl, 1,1-diethylbutyl, 1-ethyl-1-methylbutyl, 1,1,3,3-tetramethylbutyl, 1,1,4-trimethylpentyl, 1,1,2-trimethylpropyl, 1,1-dimethyloctyl, 1,1-dimethylpentyl, 1,1-dimethylheptyl, 1,1,5-trimethylhexyl, 1-ethyl-1-methylhexyl, 1-ethyl-1,3-dimethylbutyl, 1,1,2,2-tetramethylpropyl, 1-butyl-1-methylpentyl, 1,1-diethylbutyl, 1-ethyl-1-methylpentyl, 1,1,3-trimethylbutyl, 1-propyl-1-methylpentyl, 1,1,2-trimethylpropyl, 1-ethyl-1,2,2-trimethylpropyl, 1-propyl-1-methylbutyl, 1,1-dimethylhexyl, and the like. Of these, t-butyl and t-amyl are preferred.

Specific examples of "cycloalkyl" as a first substituent include a cycloalkyl having 3 to 24 carbons, a cycloalkyl having 3 to 20 carbons, a cycloalkyl having 3 to 16 carbons, a cycloalkyl having 3 to 14 carbons, a cycloalkyl having 5 to 10 carbons, a cycloalkyl having 5 to 8 carbons, a cycloalkyl having 5 to 6 carbons, a cycloalkyl having 5 carbons, and the like.

Specific examples of the cycloalkyl include cyclopropyl, cyclobutyl, cyclopentyl, cyclohexyl, cycloheptyl, cyclooctyl, cyclononyl, cyclodecyl, and an alkyl (especially methyl) substituents thereof having 1 to 5 carbons, norbornyl(bicyclo[2.2.1]heptyl), bicyclo[1.1.0]butyl, bicyclo[1.1.1]pentyl, bicyclo[2.1.0]pentyl, bicyclo[2.1.1]hexyl, bicyclo[3.1.0]hexyl, bicyclo[2.2.2]octyl, adamanthyl, diamantyl, decahydronaphthalenyl, and decahydroazulenyl.

Moreover, specific examples of "alkoxy" as a first substituent include a straight-chain alkoxy having 1 to 24 carbons or a branched-chain alkoxy having 3 to 24 carbons. An alkoxy having 1 to 18 carbons (a branched-chain alkoxy having 3 to 18 carbons) is preferred, and an alkoxy having 1 to 12 carbons (a branched-chain alkoxy having 3 to 12 carbons) is more preferred, and an alkoxy having 1 to 6 carbons (a branched-chain alkoxy having 3 to 6 carbons) is further preferred, and an alkoxy having 1 to 5 carbons (a branched-chain alkoxy having 3 to 5 carbons) is particularly preferred.

Specific examples of the alkoxy include methoxy, ethoxy, propoxy, isopropoxy, butoxy, isobutoxy, s-butoxy, t-butoxy, t-amyloxy, pentyloxy, hexyloxy, heptyloxy and octyloxy.

Examples of the "substituted silyl" as the first substituent include silyl substituted with 3 substituents selected from the group consisting of alkyl, cycloalkyl, and aryl. Examples thereof include trialkylsilyl, tricycloalkylsilyl, dialkylcycloalkylsilyl, alkyldicycloalkylsilyl, triarylsilyl, dialkylarylsilyl, and alkyldiarylsilyl.

Examples of "trialkylsilyl" include a group in which 3 hydrogens in silyl are each independently replaced with an alkyl. As this alkyl, the groups described as "alkyl" in the first substituent described above can be referred to. An alkyl by which hydrogen is preferably replaced is an alkyl having 1 to 5 carbons, and specific examples thereof include methyl, ethyl, propyl, isopropyl, butyl, sec-butyl, t-butyl and t-amyl.

Specific examples of the trialkylsilyl include trimethylsilyl, triethylsilyl, tripropylsilyl, triisopropylsilyl, tributylsilyl, trisec-butylsilyl, trit-butylsilyl, trit-amylsilyl, ethyldimethylsilyl, propyldimethylsilyl, i-propyldimethylsilyl, butyldimethylsilyl, sec-butyldimethylsilyl, t-butyldimethylsilyl, t-amyldimethylsilyl, ethyldiethylsilyl, propyldiethylsilyl, i-propyldiethylsilyl, butyldiethylsilyl, sec-butyldiethylsilyl, t-butyldiethylsilyl, t-amyldiethylsilyl, methyldipropylsilyl, ethyldipropylsilyl, butyldipropylsilyl, sec-butyldipropylsilyl, t-butyldipropylsilyl, t-amyldipropylsilyl, methyldiisopropylsilyl, ethyldiisopropylsilyl, butyldiisopropylsilyl, sec-butyldiisopropylsilyl t-butyldiisopropylsilyl and t-amyldiisopropylsilyl.

Examples of "tricycloalkylsilyl" include a group in which 3 hydrogens in silyl are each independently replaced with cycloalkyl. As this cycloalkyl, the groups described as "cycloalkyl" in the first substituent described above can be referred to. A preferred example of a cycloalkyl for substitution includes a cycloalkyl having 5 to 10 carbons. Specific examples include cyclopentyl, cyclohexyl, cycloheptyl, cyclooctyl, cyclononyl, cyclodecyl, bicyclo[1.1.1]pentyl, bicyclo[2.1.0]pentyl, bicyclo[2.1.1]hexyl, bicyclo[3.1.0]hexyl, bicyclo[2.2.1]heptyl], bicyclo[2.2.2]octyl, adamantyl, decahydronaphthalenenyl, decahydroazurenyl, and the like.

Specific examples of tricycloalkylsilyl include tricyclopentylsilyl, tricyclohexylsilyl, and the like.

Specific examples of dialkylcycloalkylsilyl in which two alkyls and one cycloalkyl are substituted and alkyldicycloalkylsilyl in which one alkyl and two cycloalkyls are substituted include silyl in which groups selected from the specific alkyl and cycloalkyl described above are substituted.

Specific examples of dialkylarylsilyl substituted with two alkyls and one aryl, alkyldiarylsilyl substituted with one alkyl and two aryls, and triarylsilyl substituted with three aryls include silyl substituted with groups selected from the specific alkyl and aryl described above. A specific example of the triarylsilyl includes triphenylsilyl.

Also, as "aryl" in "diarylboryl" of the first substituent, the description of aryl described above can be quoted. The two aryls may also be bonded via a single bond or a linking group (e.g., $>C(—R)_2$, >O, >S, or >N—R). Here, R in $>C(—R)_2$ and >N—R is an aryl, a heteroaryl, a diarylamino, an alkyl, a cycloalkyl, an alkoxy or an aryloxy (the first substituent), and further an aryl, a heteroaryl, an alkyl, or a cycloalkyl (the second substituent) may be substituted to the first substituent. For specific examples of these groups, the description of the aryl, heteroaryl, diarylamino, alkyl, cycloalkyl, alkoxy, or aryloxy as the first substituent described above can be quoted.

In -L-Ak of the first substituent, L is >N—R, >O or >S, and R in >N—R is an aryl which may be substituted, a heteroaryl which may be substituted, an alkyl which may be substituted, or a cycloalkyl which may be substituted. In addition, R in >N—R may be bonded to Ak via a linking group or single bond.

Ak is hydrogen, optionally substituted alkyl or optionally substituted cycloalkyl, wherein at least one hydrogen in the alkyl and cycloalkyl is optionally substituted, and at least one $—CH_2—$ in the alkyl and cycloalkyl is optionally replaced with —O— or —S—.

L is preferably >N—R.

When L is >N—R, R is preferably an aryl optionally substituted with an alkyl or a cycloalkyl, a heteroaryl optionally substituted with an alkyl or a cycloalkyl, an alkyl or a cycloalkyl, more preferably an aryl optionally substituted with an alkyl, a heteroaryl optionally substituted with an alkyl, an alkyl or a cycloalkyl, still more preferably an aryl optionally substituted with an alkyl, and particularly preferably phenyl optionally substituted with methyl.

Ak is preferably an alkyl having 1 to 6 carbons or a cycloalkyl having 3 to 14 carbons, preferably an alkyl having 1 to 4 carbons or a cycloalkyl having 3 to 8 carbons, more preferably an alkyl having 1 to 4 carbons, and still more preferably methyl.

When L is >N—R, R may be bonded to Ak by a linking group or single bond. Examples of the linking group include >O, >S, and $>Si(—R)_2$. R in $>Si(—R)_2$ is hydrogen, an aryl having 6 to 12 carbons, an alkyl having 1 to 6 carbons, or a cycloalkyl having 3 to 14 carbons. Examples of the structure in which R in >N—R is bonded to Ak via a linking group or single bond include the following.

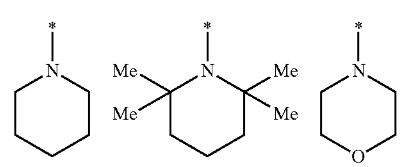

-continued

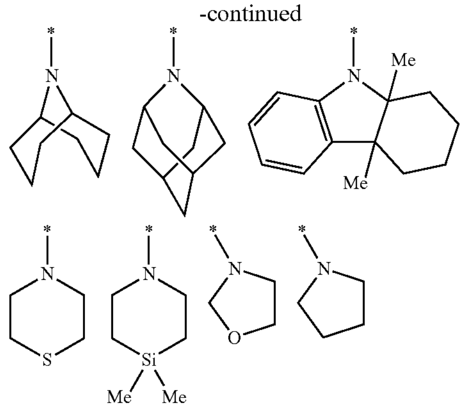

In the above formulae, Me is methyl and * represents a position at which the group is bonded to a ring constituting atom of the aryl or heteroaryl ring in A ring, B ring, C ring, $R^{XD}$ or $R^{XE}$.

In substituted or unsubstituted "aryl," substituted or unsubstituted "heteroaryl," substituted or unsubstituted "diarylamino," substituted or unsubstituted "diheteroarylamino," substituted or unsubstituted "arylheteroarylamino," substituted or unsubstituted "diarylboryl, (the two aryls may be bonded via a single bond or a linking group)" a substituted or unsubstituted "alkyl," substituted or unsubstituted "cycloalkyl," substituted or unsubstituted "alkoxy," substituted or unsubstituted "aryloxy" or substituted "silyl" as the first substituent, at least one hydrogen therein may be replaced with the second substituent as described as "substituted or unsubstituted." Examples of the second substituent include aryl, heteroaryl, alkyl or cycloalkyl, and specific examples thereof can be referred to the above-described description for the monovalent group of the "aryl ring" and the "heteroaryl ring," and the "alkyl" or the "cycloalkyl" as the first substituent. Moreover, aryl or heteroaryl as the second substituent also includes a group in which, at least one hydrogen therein is replaced with an aryl such as phenyl (specific examples include the above-described groups), or an alkyl such as methyl or t-butyl (specific examples include the above-described groups), or a cycloalkyl such as cyclohexyl (specific examples include the above-described groups). As one example, when the second substituent is a carbazolyl, a carbazolyl group in which, at least one hydrogen in the 9-position is replaced with an aryl such as phenyl, an alkyl such as methyl, or a cycloalkyl such as cyclohexyl is also included in heteroaryl as the second substituent.

The emission wavelength can be tuned by the steric hindrance, electron-donating and electron-withdrawing nature of the structure of the first substituent. Preferable examples are the groups represented by the following structural formulas. Among them, methyl, t-butyl, t-amyl, t-octyl, neopentyl, adamantyl, phenyl, o-tolyl, p-tolyl, 2,4-xylyl, 2,5-xylyl, 2,6-xylyl, 2,4,6-mesityl, diphenylamino, di-p-tolylamino, bis(p-(t-butyl)phenyl)amino, carbazolyl (particularly, N-carbazolyl), 3,6-dimethylcarbazolyl, 3,6-di-t-butylcarbazolyl and phenoxy are more preferred, and methyl, t-butyl, t-amyl, t-octyl, neopentyl, adamantyl, phenyl, o-tolyl, 2,6-xylyl, 2,4,6-mesityl, diphenylamino, di-p-tolylamino, bis(p-(t-butyl)phenyl)amino, carbazolyl, 3,6-dimethylcarbazolyl and 3,6-di-t-butylcarbazolyl are further preferred. From the viewpoint of ease of synthesis, a larger steric hindrance is preferred for selective synthesis, and specifically, t-butyl, t-amyl, t-octyl, adamanthyl, o-tolyl, p-tolyl, 2,4-xylyl, 2,5-xylyl, 2,6-xylyl, 2,4,6-mesityl, di-p-tolylamino, bis(p-(t-butyl)phenyl)amino, 3,6-dimethylcarbazolyl and 3,6-di-t-butylcarbazolyl are preferred.

In the following structural formulas, "Me" represents methyl, "tBu" represents t-butyl, "tAm" represents t-amyl, "tOct" represents t-octyl, and * represents a bonding position.

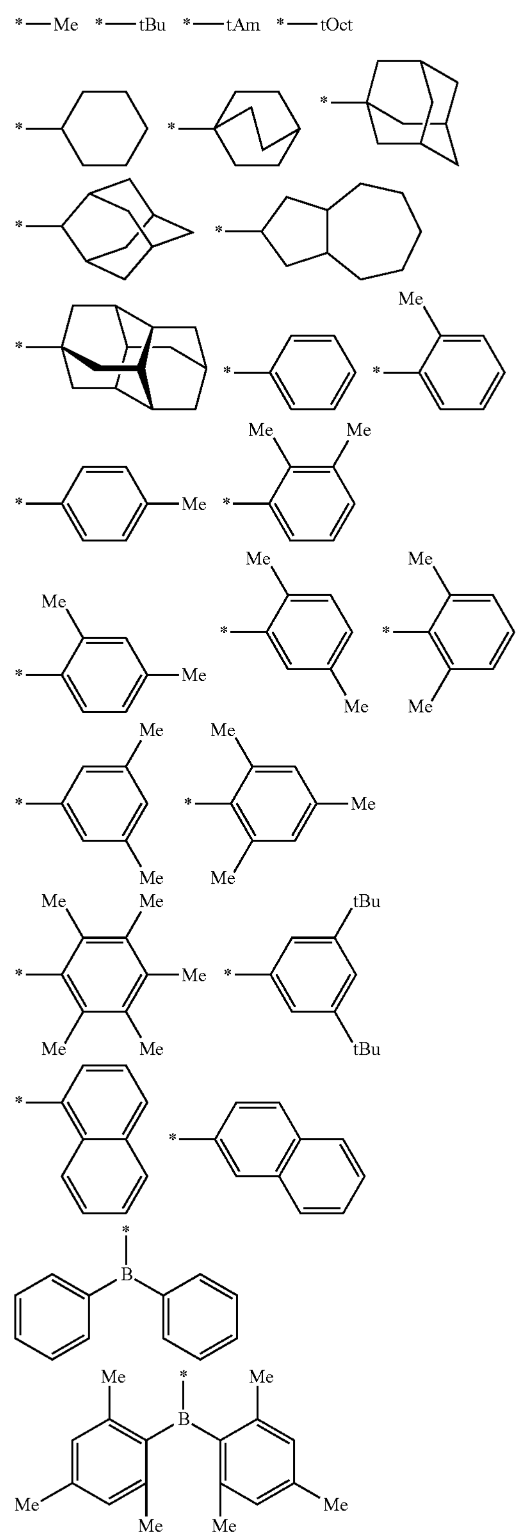

-continued
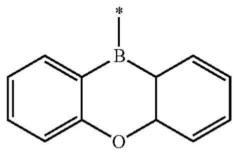
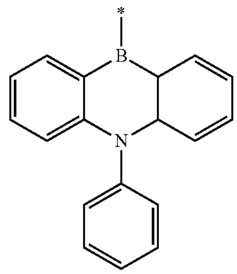
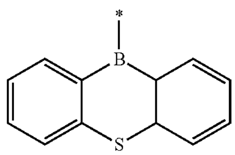
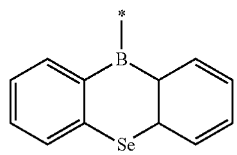
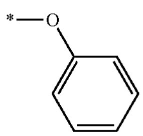
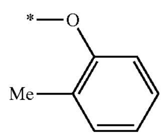
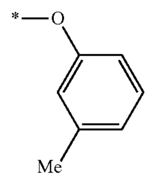
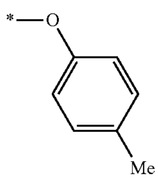
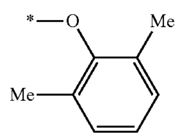
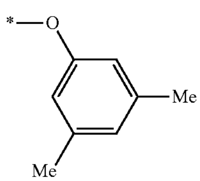
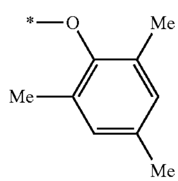
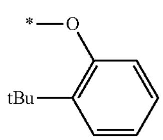
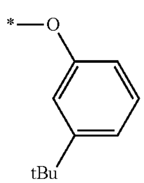
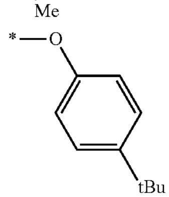
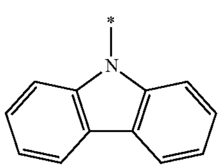
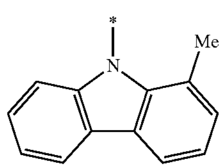
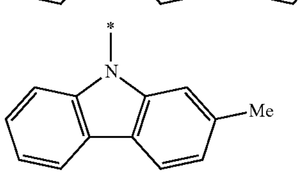
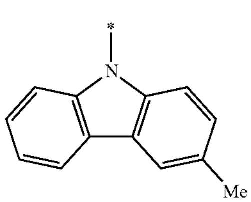
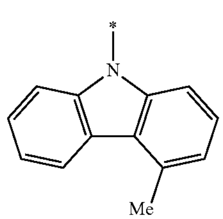
-continued
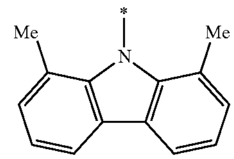
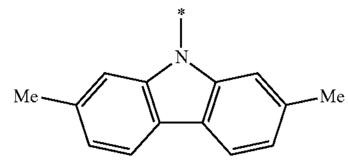
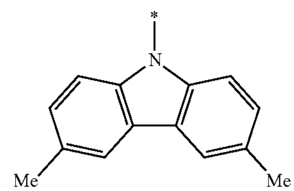
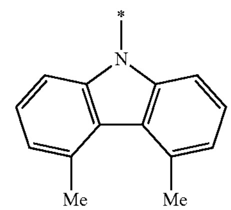
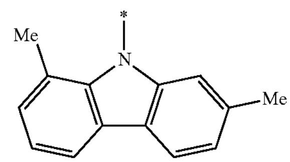
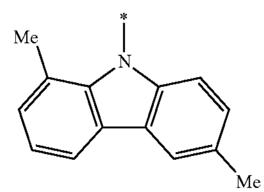
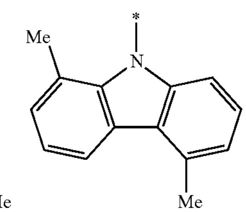
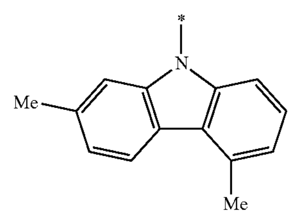
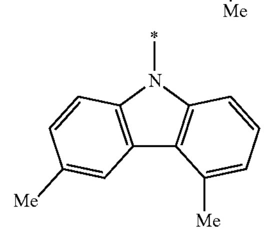
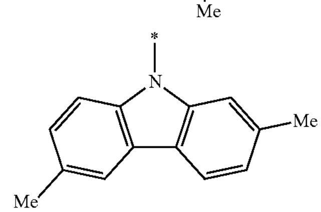
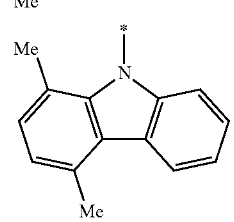
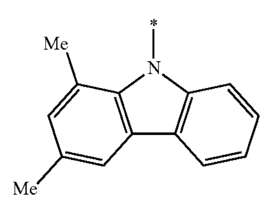

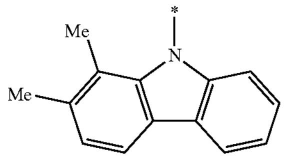
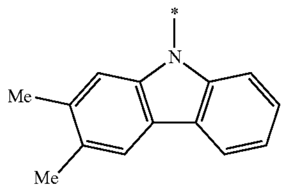
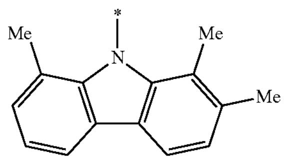
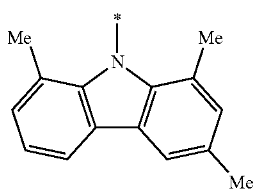
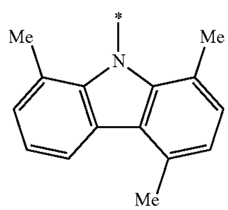
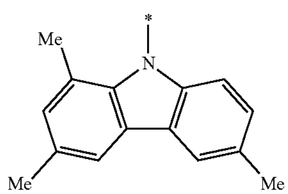
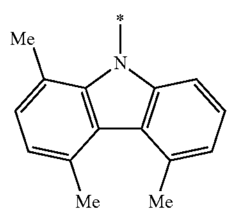
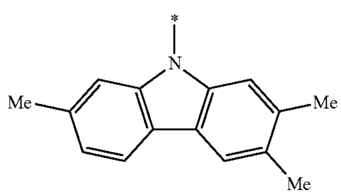
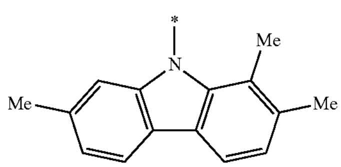
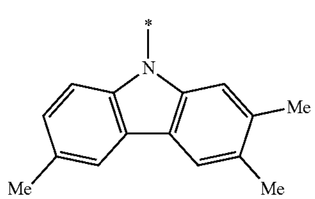
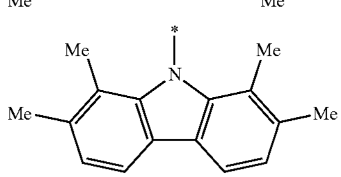
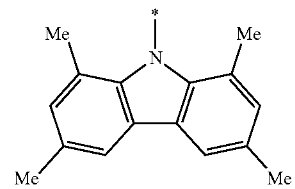
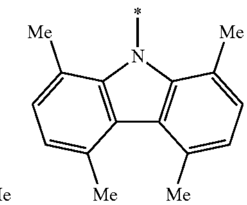
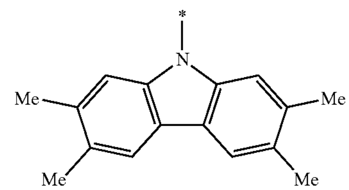
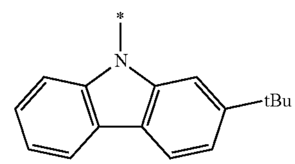
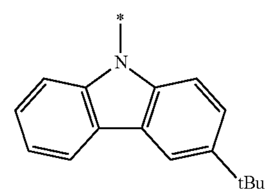
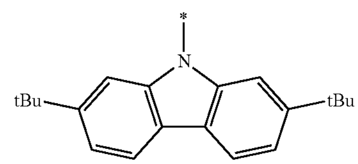
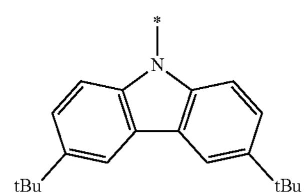
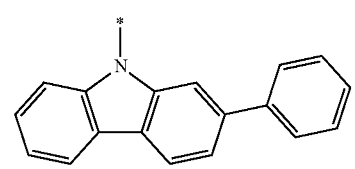
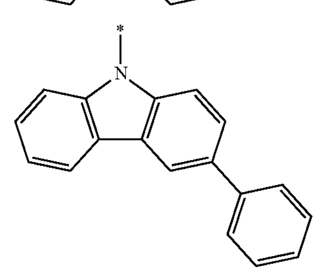
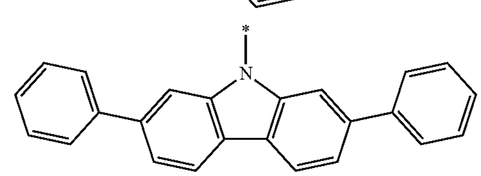

-continued
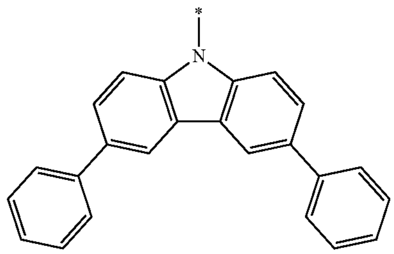
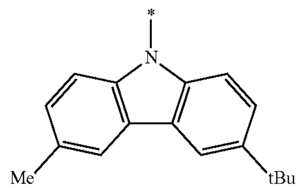
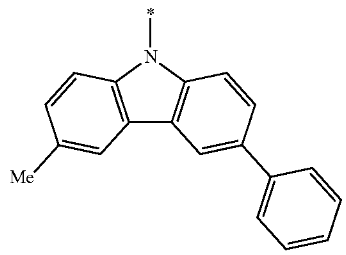
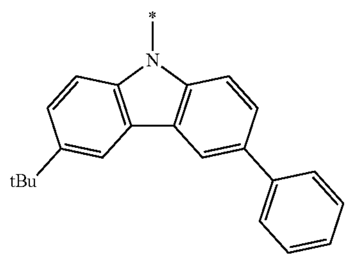
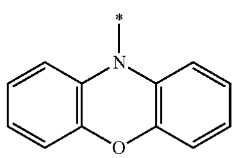
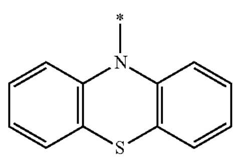
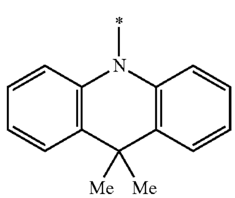
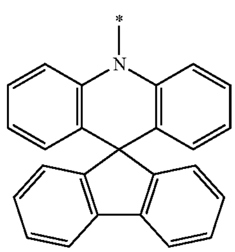
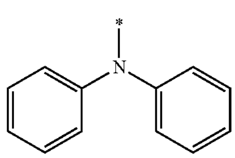
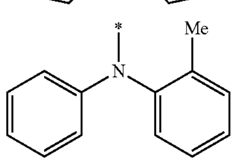
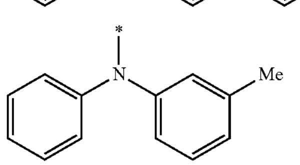
-continued
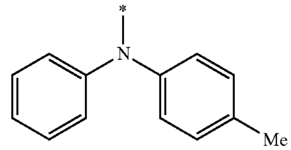
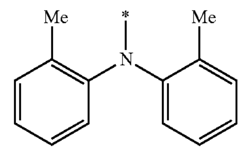
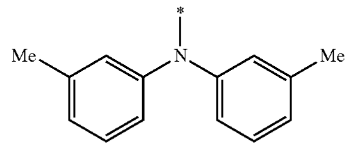
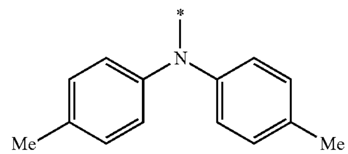
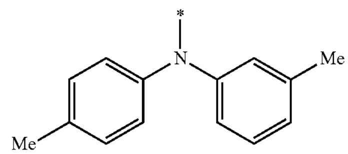
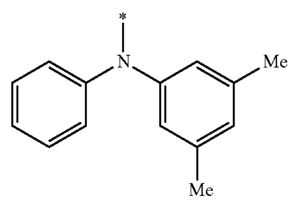
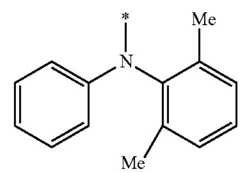
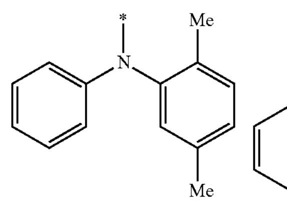
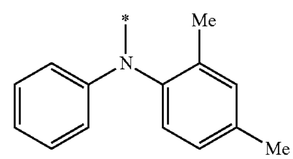
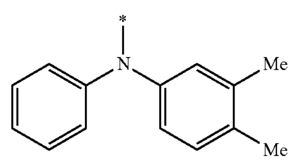
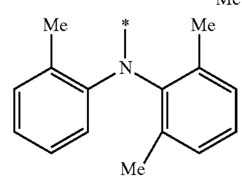
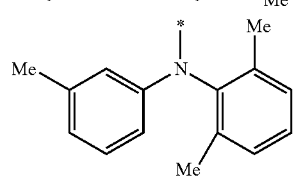
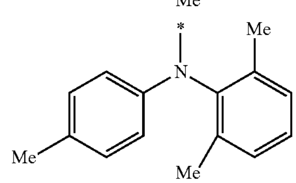
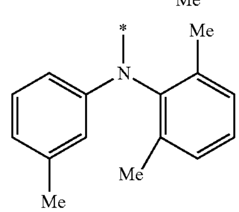
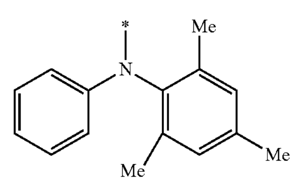

-continued
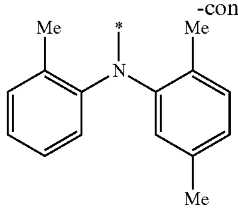
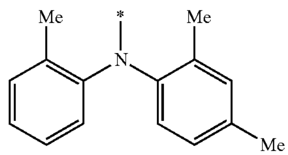
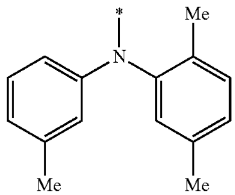
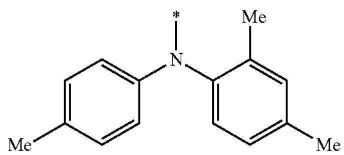
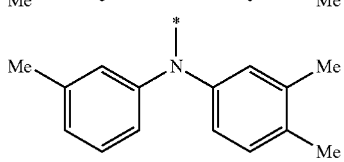
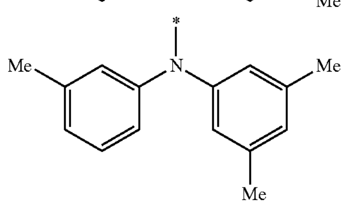
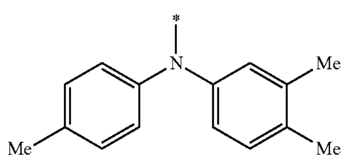
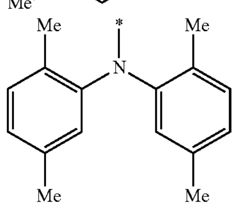
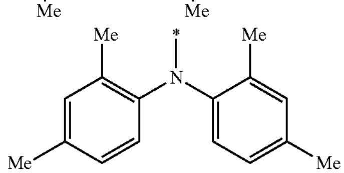
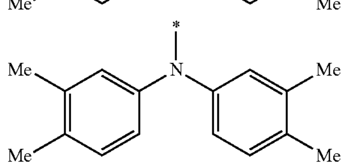
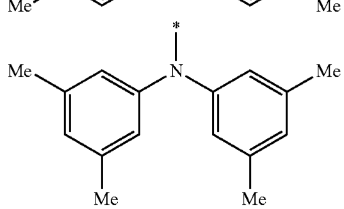
-continued
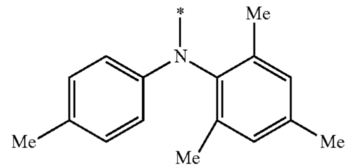
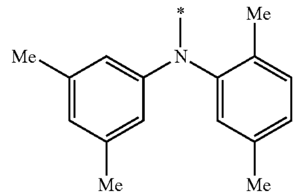
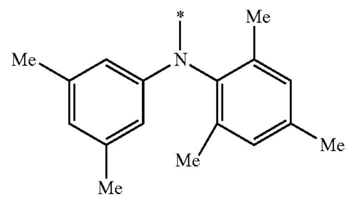
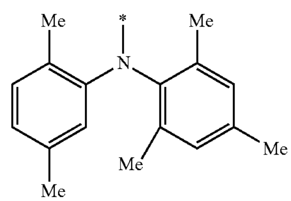
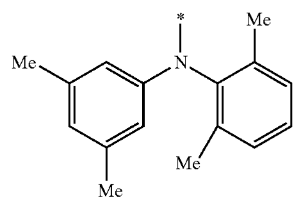
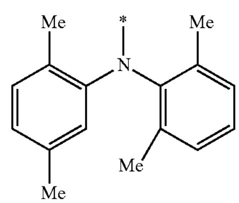
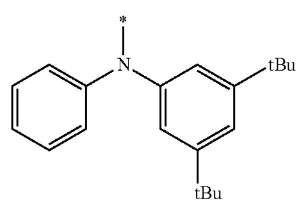
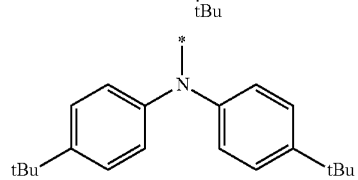
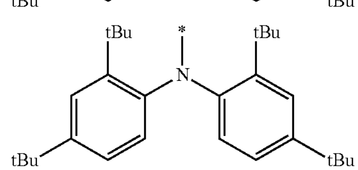

-continued
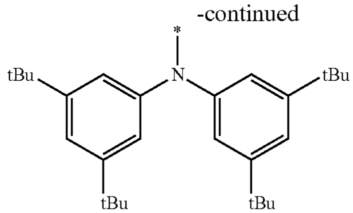
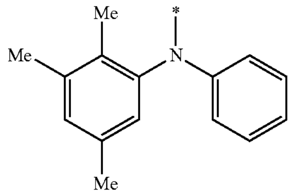
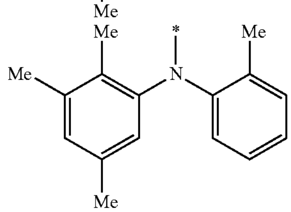
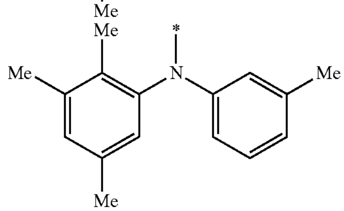
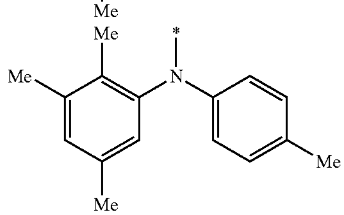
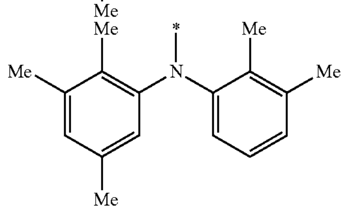
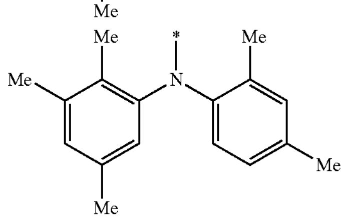
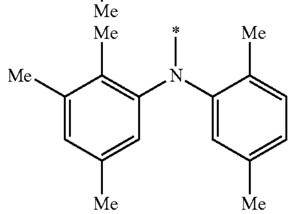
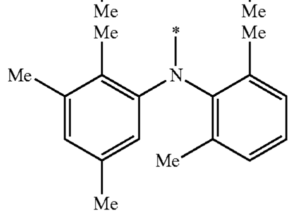
-continued
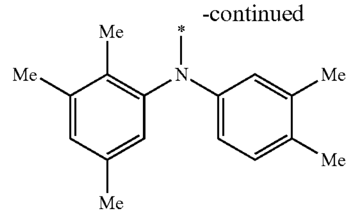
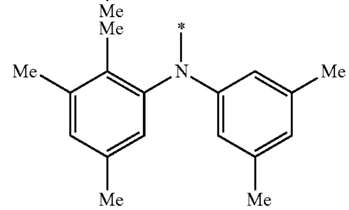
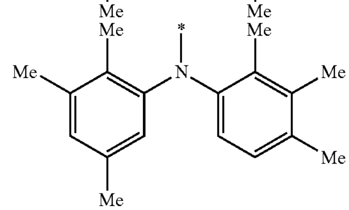
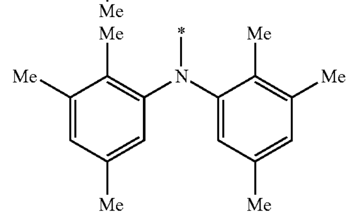
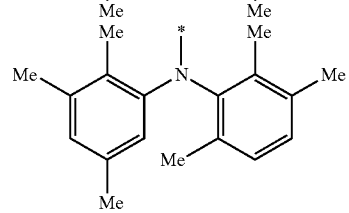
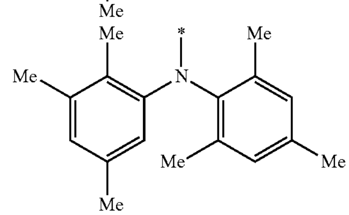
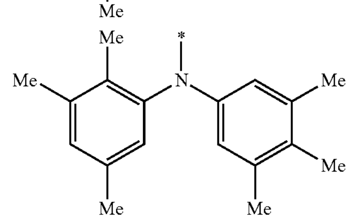
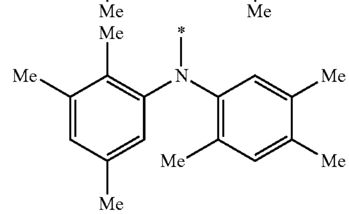
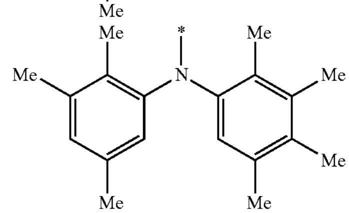

-continued
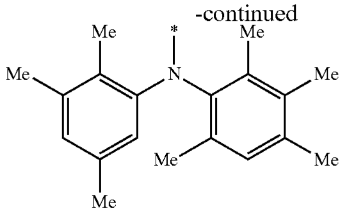
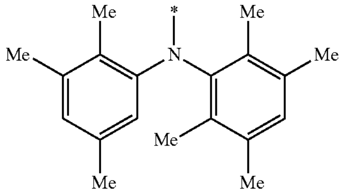
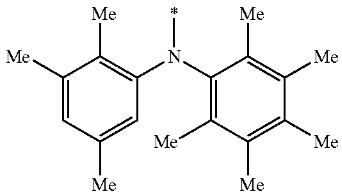
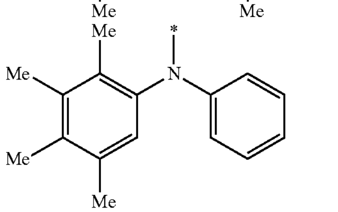
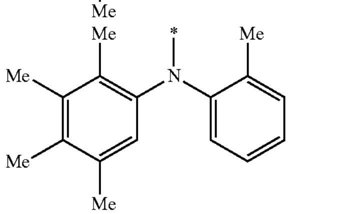
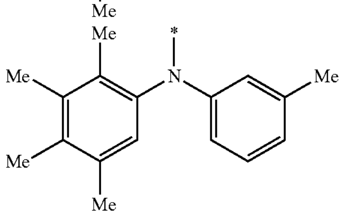
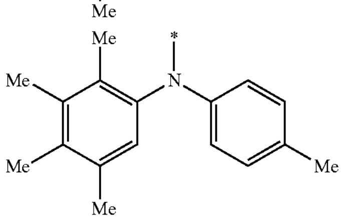
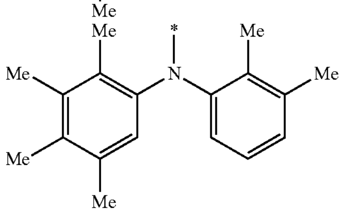
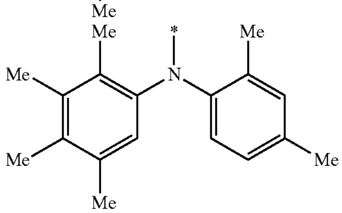
-continued
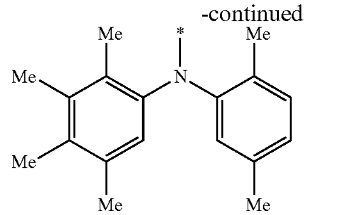
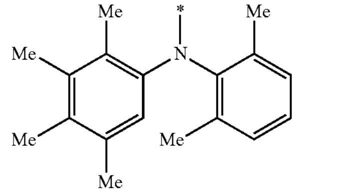
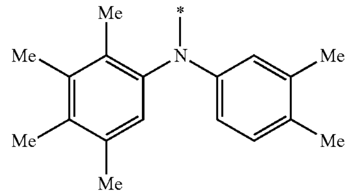
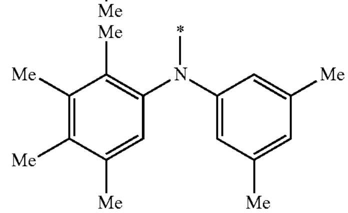
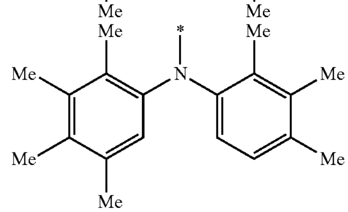
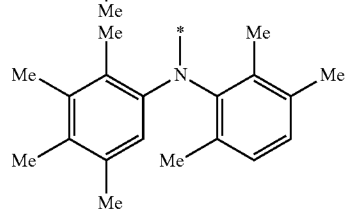
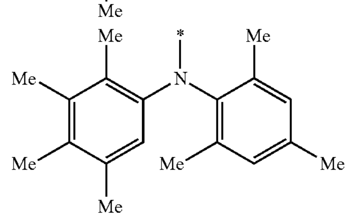
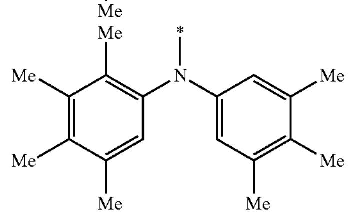
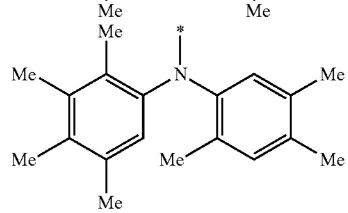

-continued
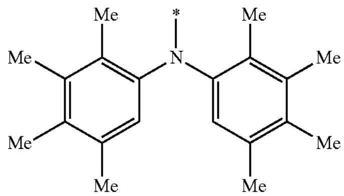
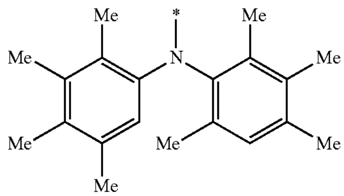
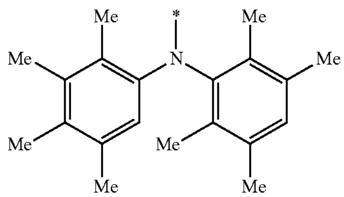
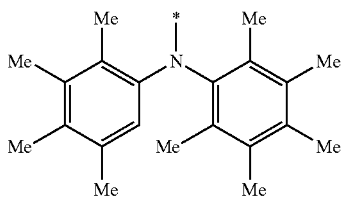
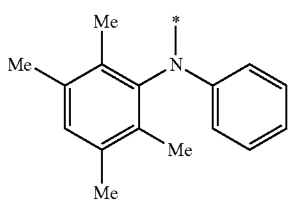
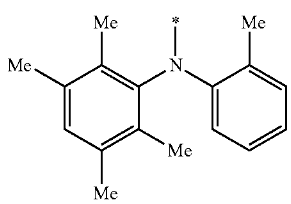
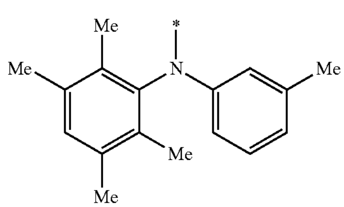
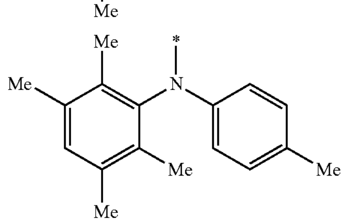
-continued
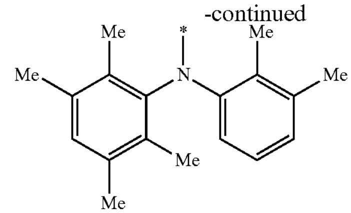
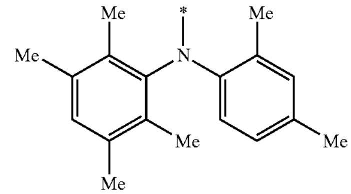
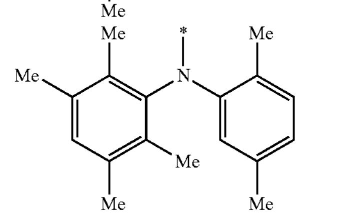
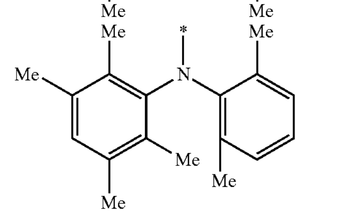
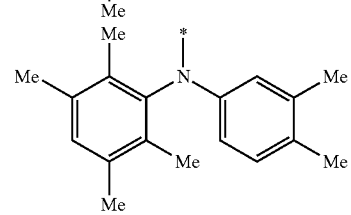
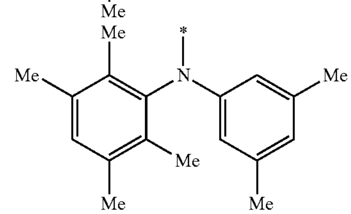
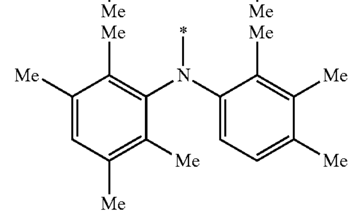
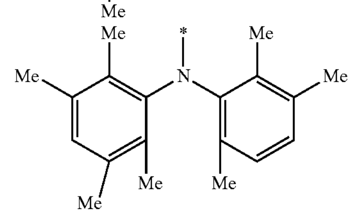
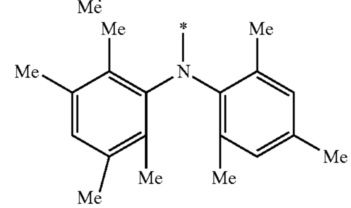

-continued
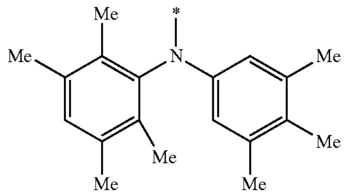
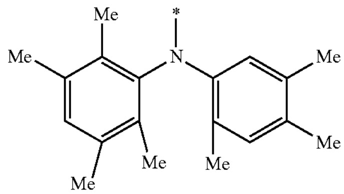
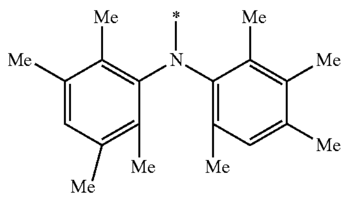
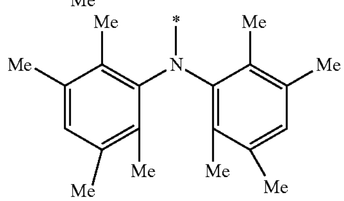
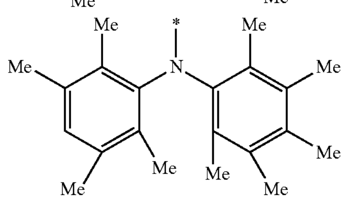
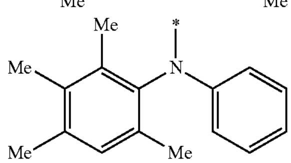
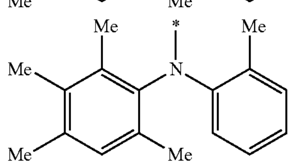
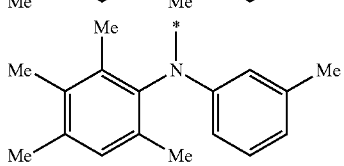
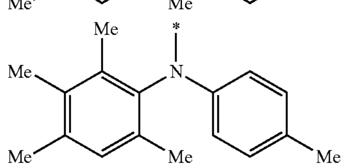
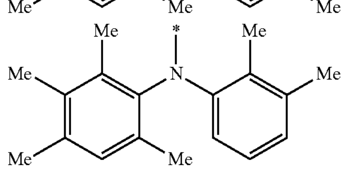
-continued
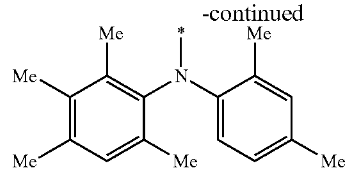
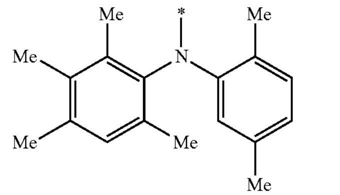
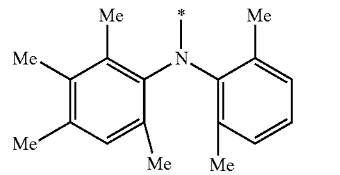
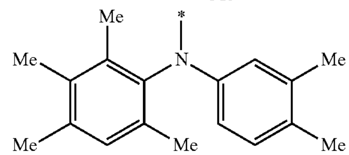
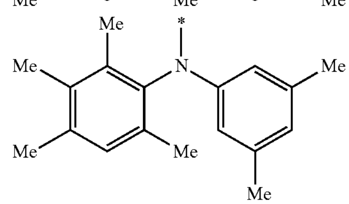
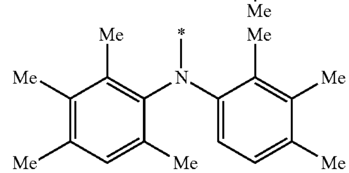
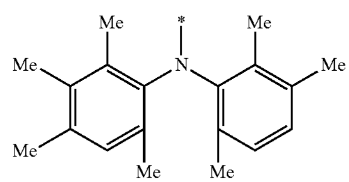
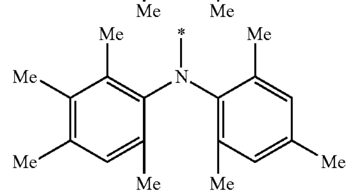
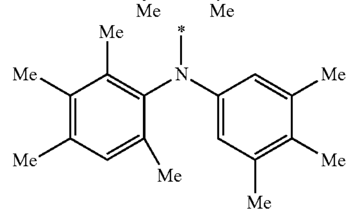
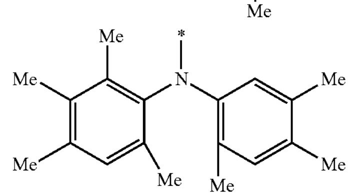

-continued
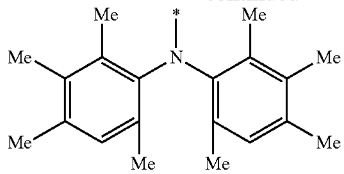
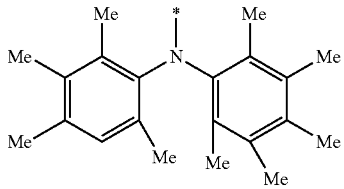
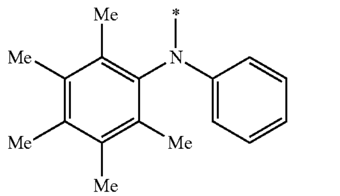
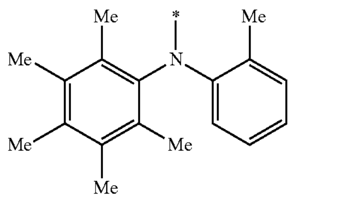
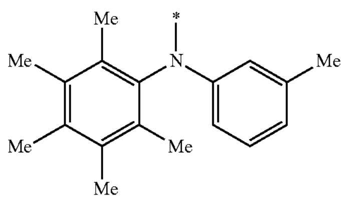
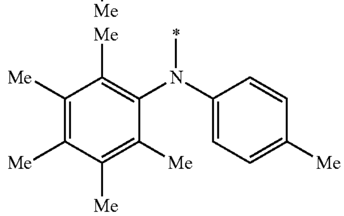
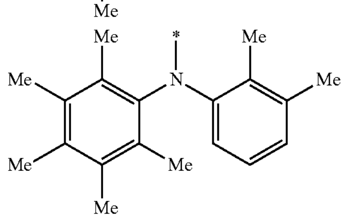
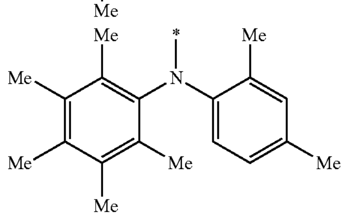
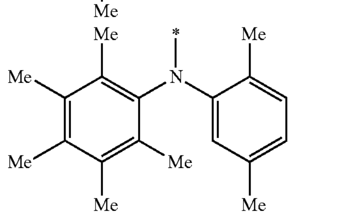
-continued
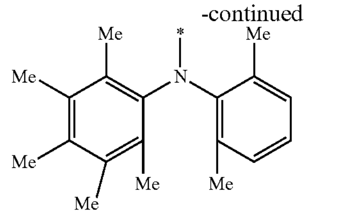
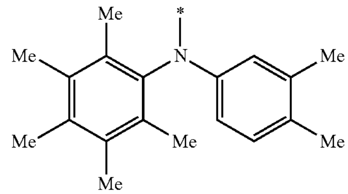
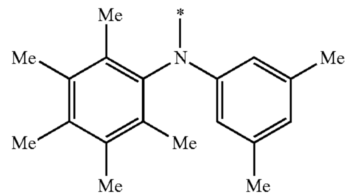
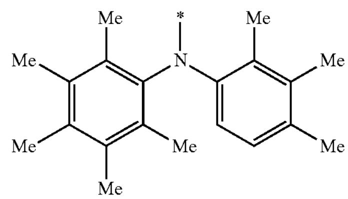
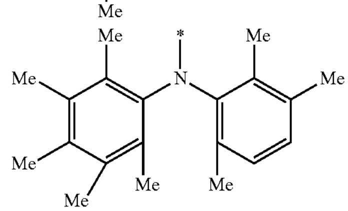
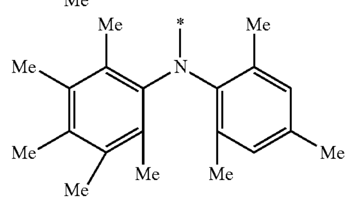
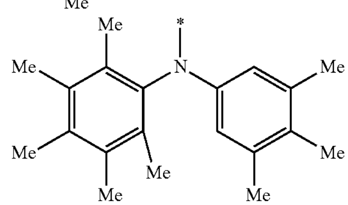
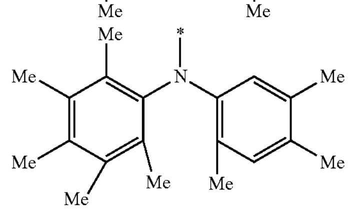
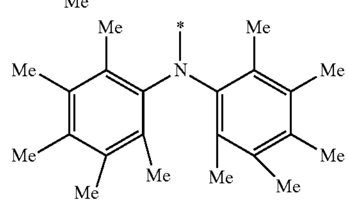

-continued
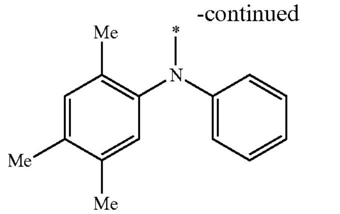
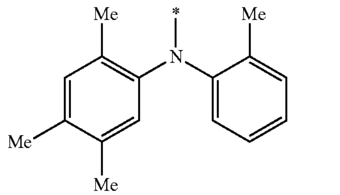
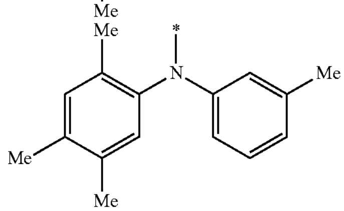
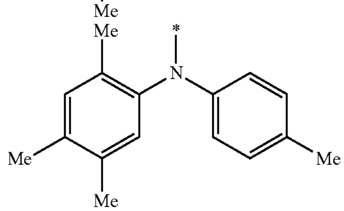
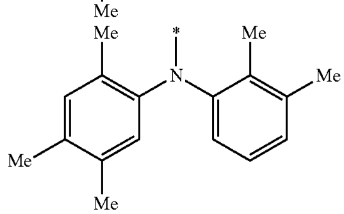
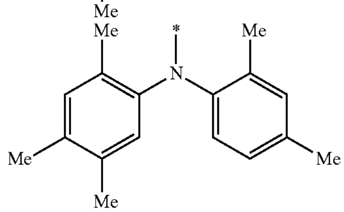
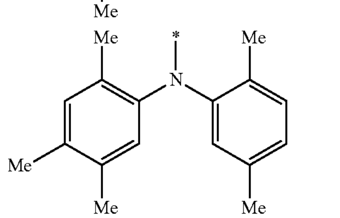
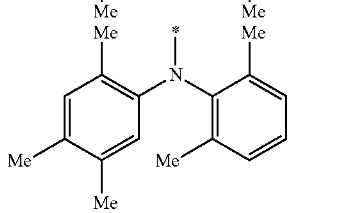
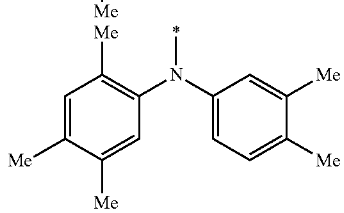
-continued
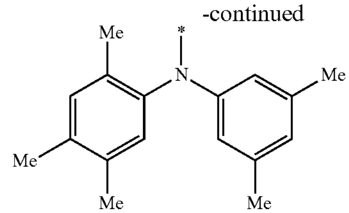
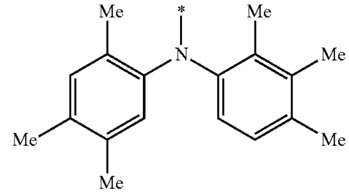
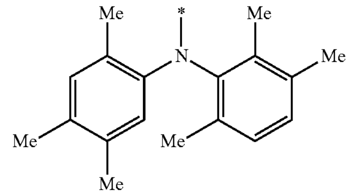
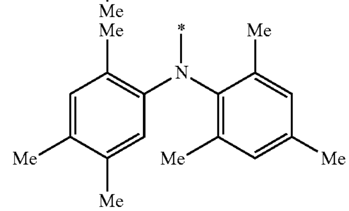
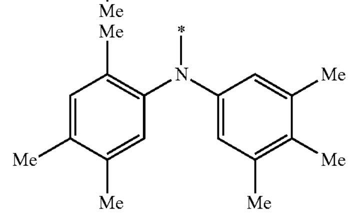
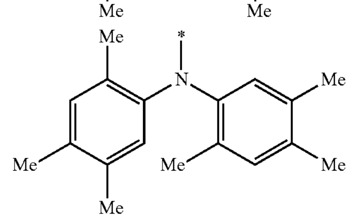
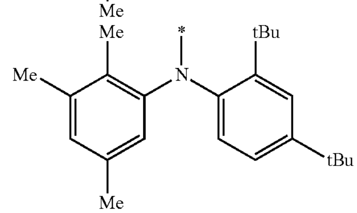
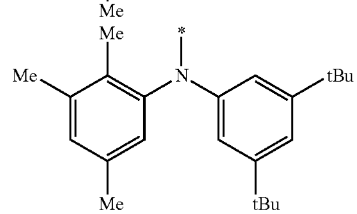
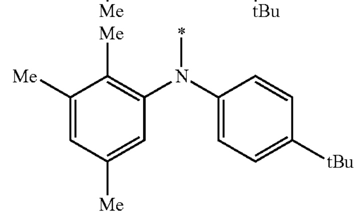

-continued
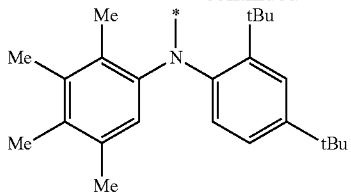
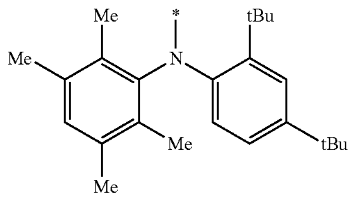
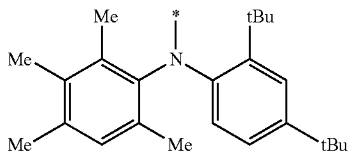
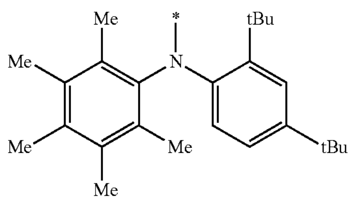
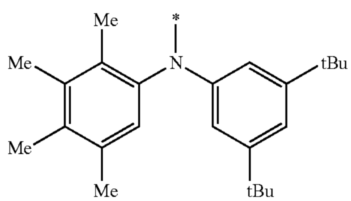
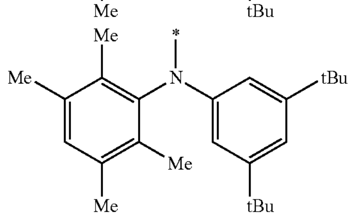
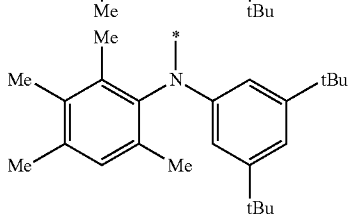
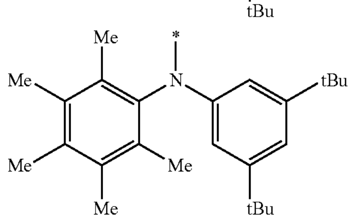
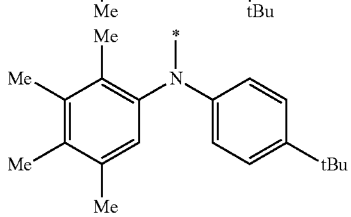
-continued
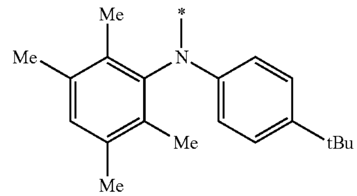
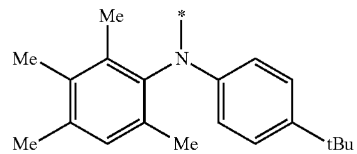
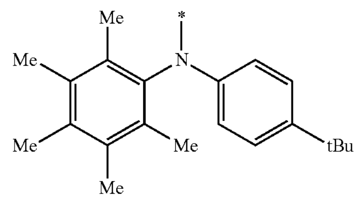
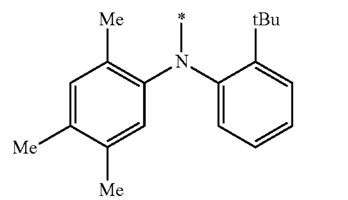
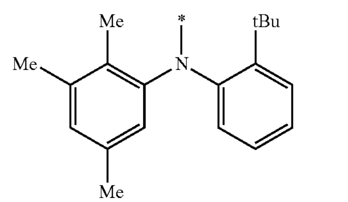
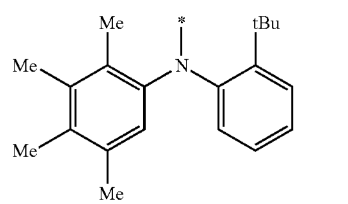
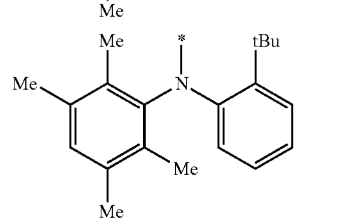
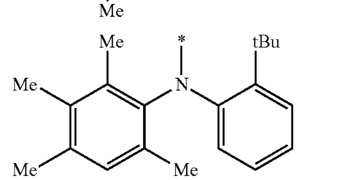
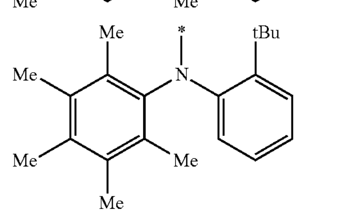

-continued
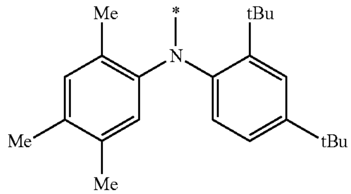
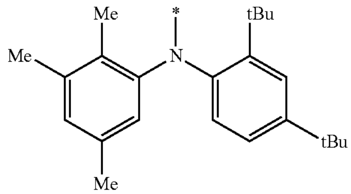
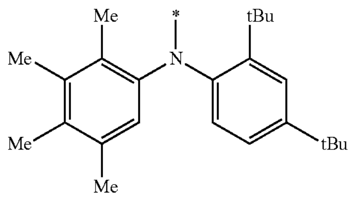
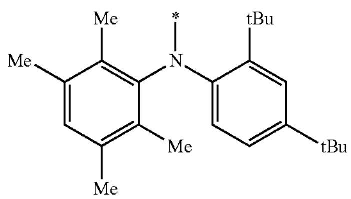
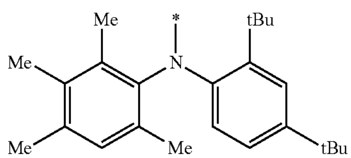
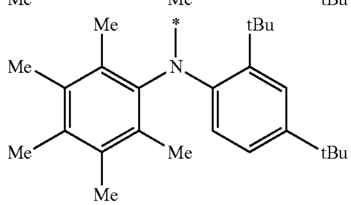
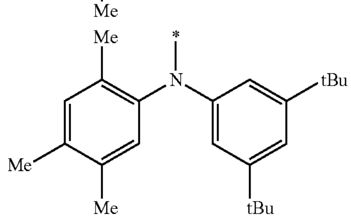
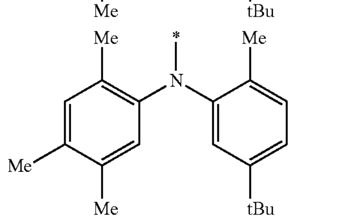
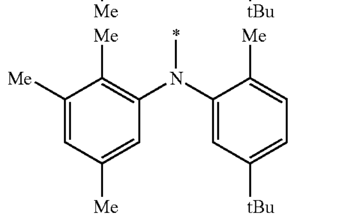
-continued
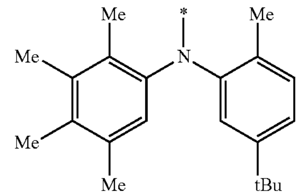
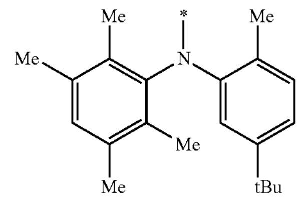
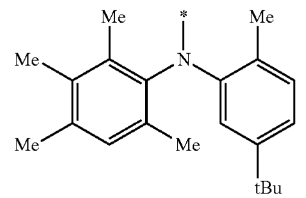
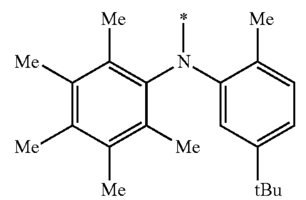
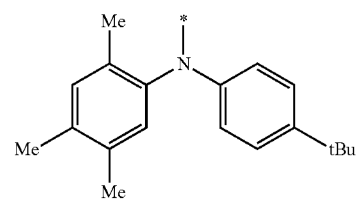
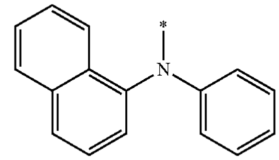
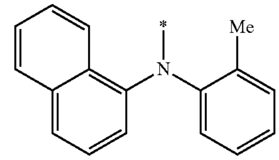
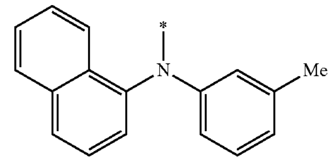
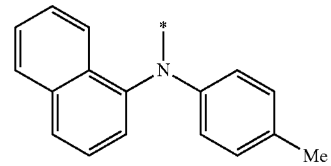

-continued
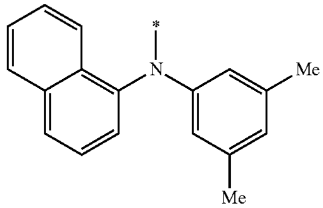
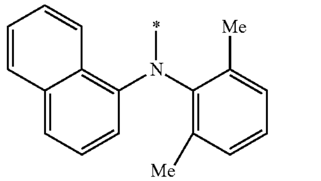
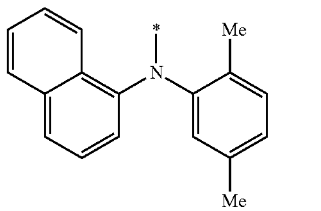
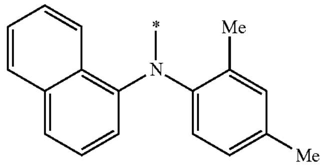
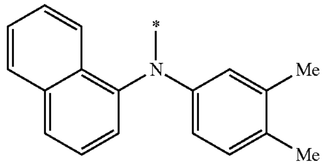
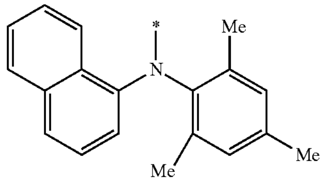
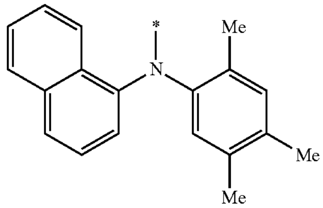
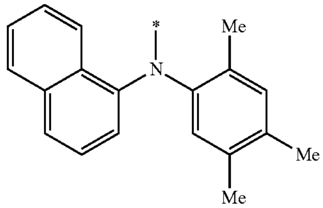
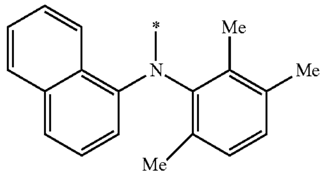
-continued
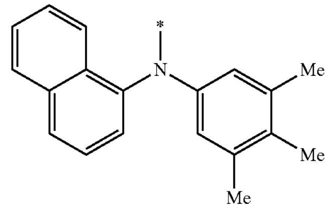
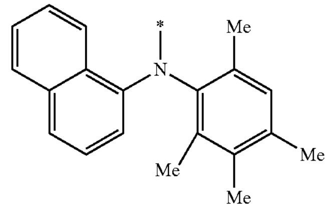
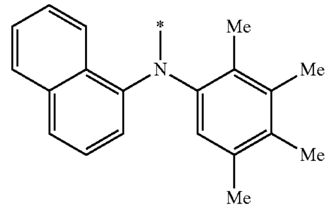
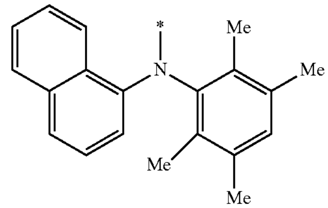
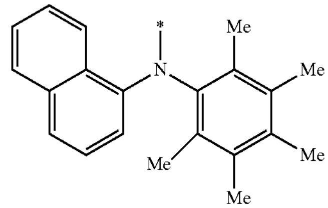
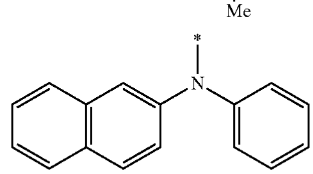
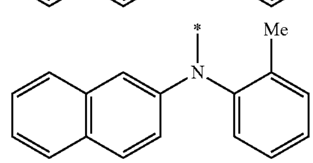
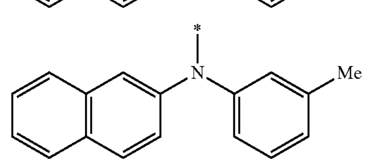
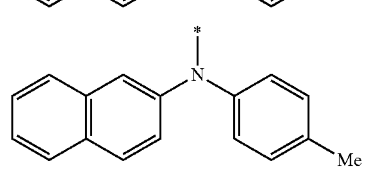

-continued
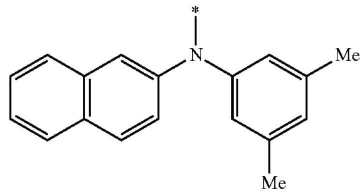
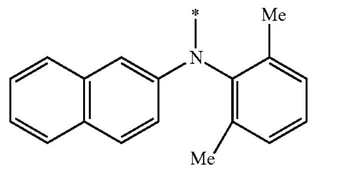
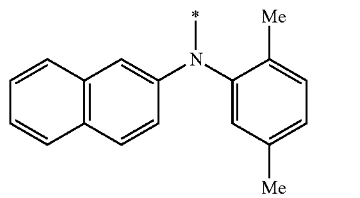
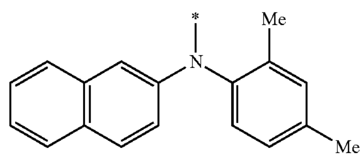
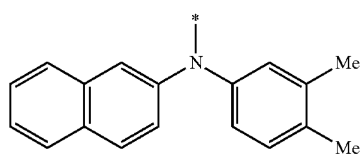
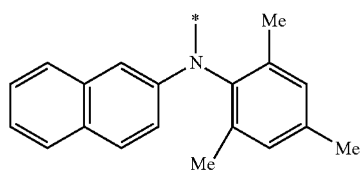
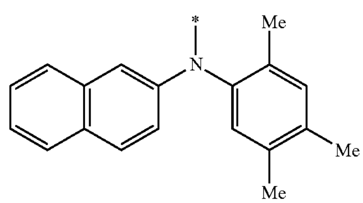
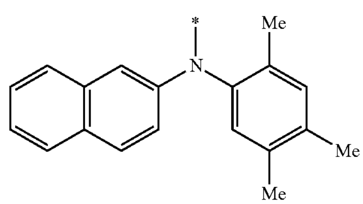
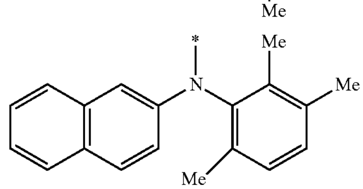
-continued
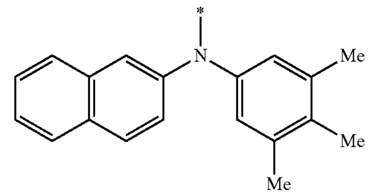
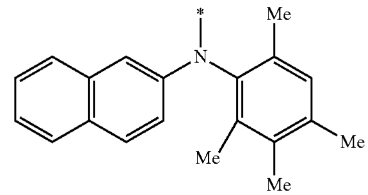
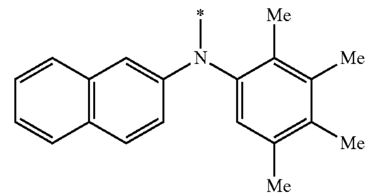
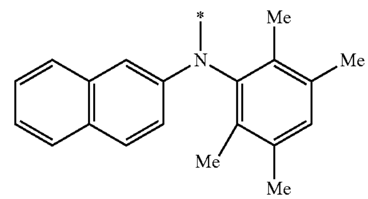
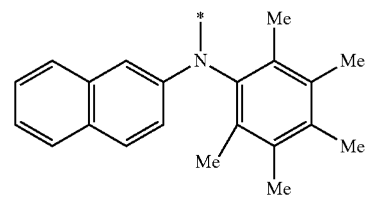
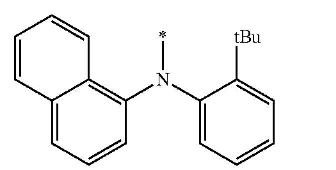
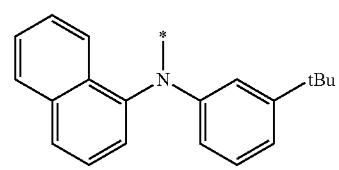
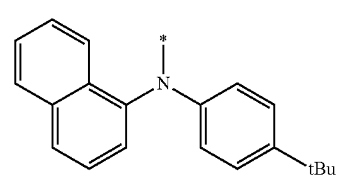
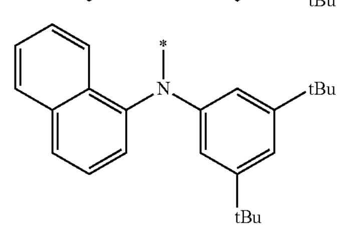

-continued
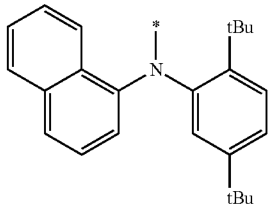
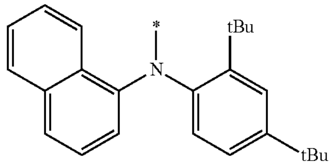
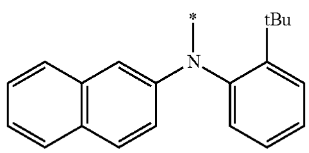
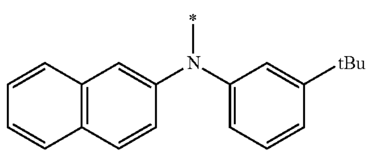
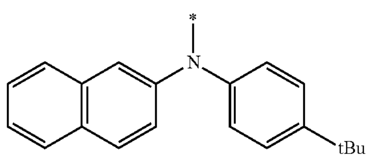
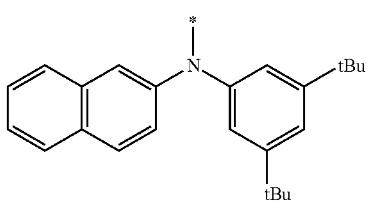
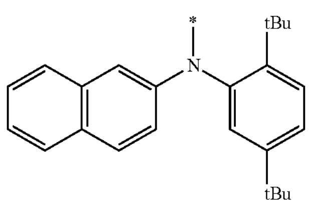
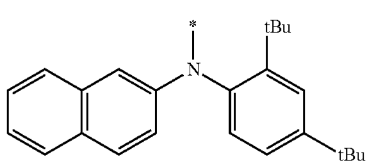
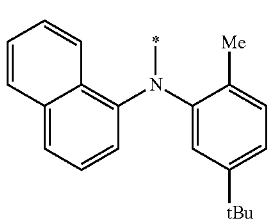
-continued
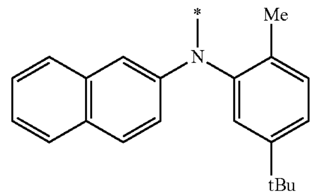
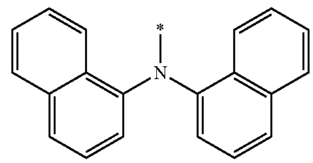
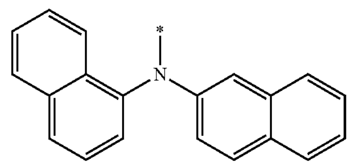
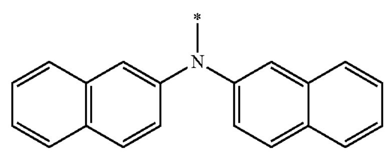
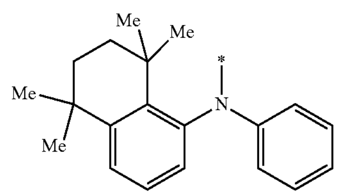
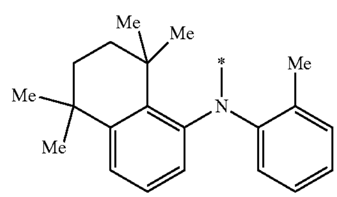
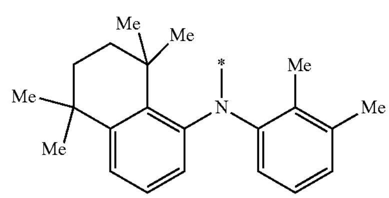
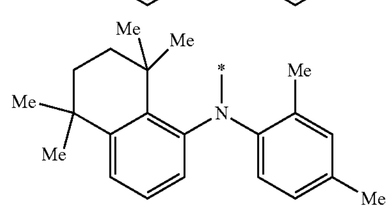
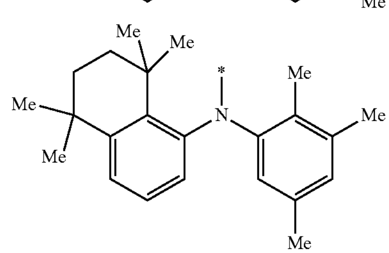

-continued
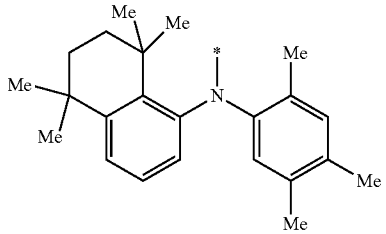
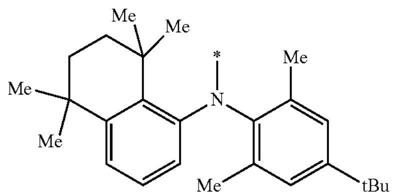
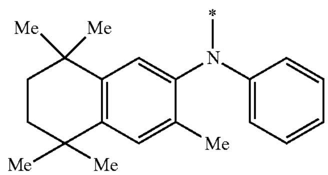
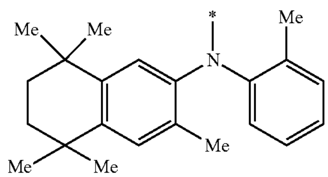
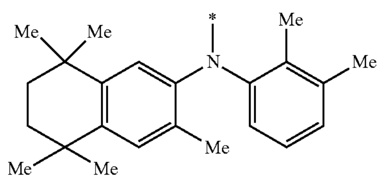
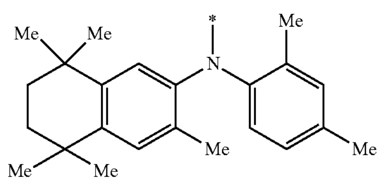
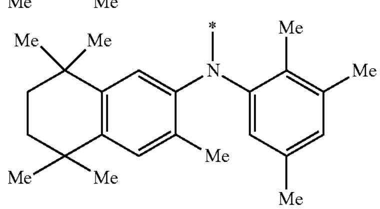
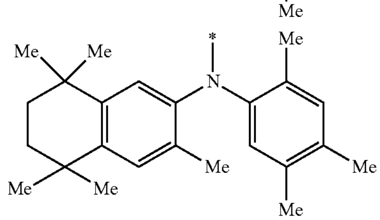
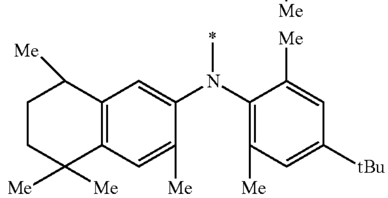
-continued
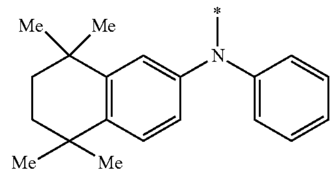
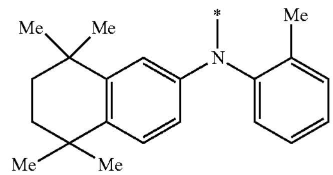
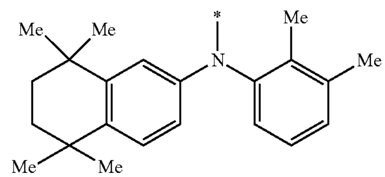
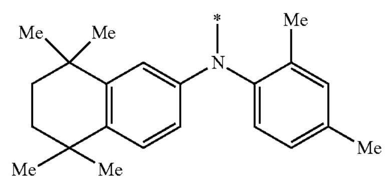
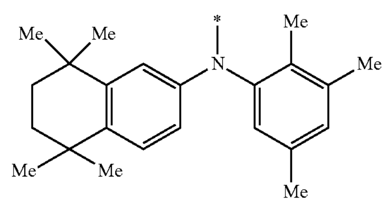
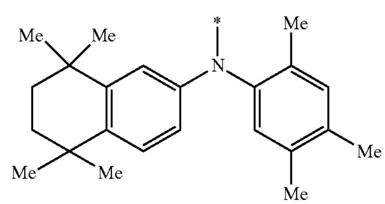
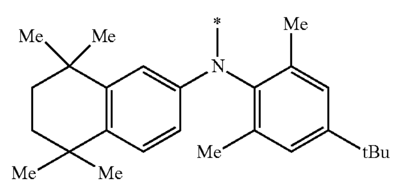
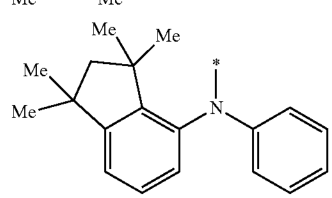
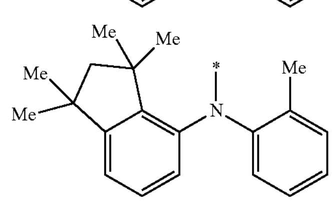

-continued

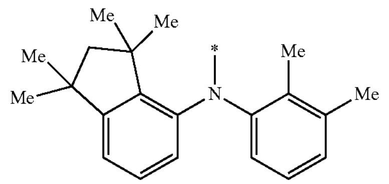

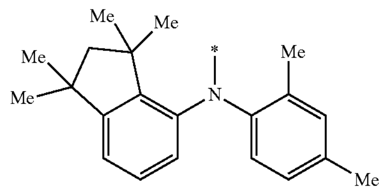

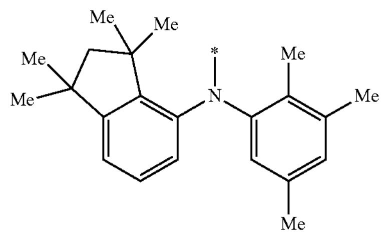

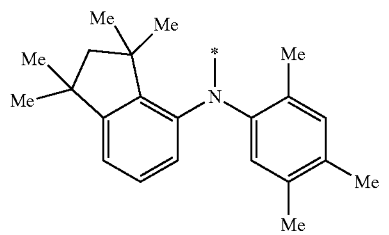

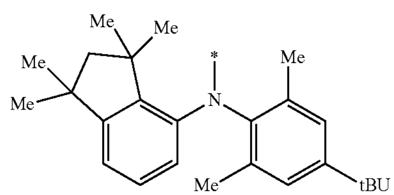

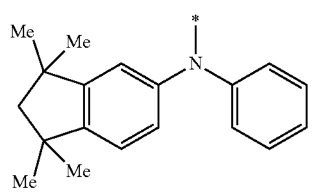

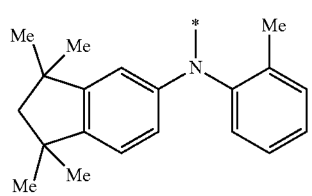

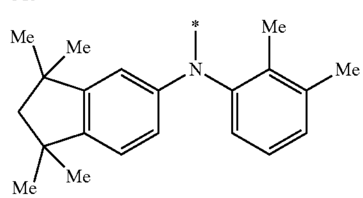

-continued

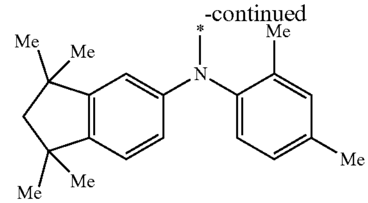

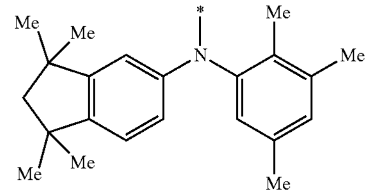

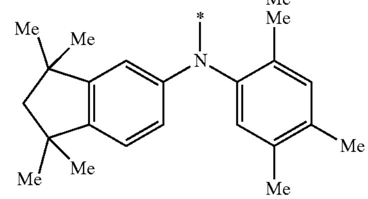

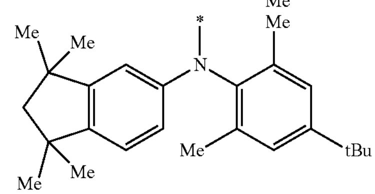

A substituent that replaces 2 or 3 hydrogens bonded to consecutive (adjacent) carbons may be a group represented by Formula (A20).

(A20)

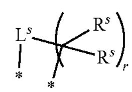

In formula (A20), $L^S$ is >N—R, >O, >Si(—R)$_2$ or >S, and R in >N—R is an aryl which may be substituted, a heteroaryl which may be substituted, an alkyl which may be substituted, or a cycloalkyl which may be substituted and R in >Si(—R)$_2$ is hydrogen, an aryl which may be substituted, an alkyl which may be substituted, or a cycloalkyl which may be substituted, and may also be bonded to each other to form a ring, and at least one R of >N—R and >Si(—R)$_2$ may be bonded to at least one selected from the group consisting of A ring, B ring, C ring, $R^{XD}$, $R^{XE}$ and $R^S$ by a linking group or single bond, r is an integer of 1 to 4, each of $R^S$ is independently hydrogen, an alkyl which may be substituted, or a cycloalkyl which may be substituted, and any $R^S$ may be bonded to any other $R^S$ via a linking group or single bond, and a group represented by Formula (A20) is bonded to two atoms adjacent to each other on a ring of an aryl ring, a heteroaryl ring, or a cycloalkane ring at the two positions indicated by *.

When a group represented by Formula (A20) is present in the compound of the present invention, the number thereof is preferably 1 or 2. The group represented by Formula (A20) may be a substituent in any ring in A ring, B ring, C ring, $R^{XD}$, or $R^{XE}$.

The group represented by Formula (A20) is bonded to two atoms adjacent to each other on a ring of an aryl ring, a heteroaryl ring, or a cycloalkane ring at the two positions indicated by *. It is preferred that the group represented by Formula (A20) is bonded to two atoms adjacent to each other on a ring of an aryl ring or a heteroaryl ring at the two positions indicated by *. At this time, both two atoms adjacent on the ring are preferably carbon atoms. By bonding a group represented by Formula (A20) to an aryl ring or a heteroaryl ring, a fused ring structure is formed. The compound represented by Formula (1) having this fused ring structure becomes to have a more rigid structure. When it becomes rigid, it is expected that the vibrations of molecules are suppressed to improve EQE, and the stabilities of molecules are increased to prolong lifetime of an organic EL element.

In Formula (A20), $L^S$ is >N—R, >O, >Si(—R)$_2$, or >S. By selecting the type of $L^S$ in the group represented by Formula (A20), HOMO and LUMO of the present invention compound can be controlled. When $L^S$ is N—R, >O, or >S, HOMO and LUMO become shallower, and when $L^S$ is Si, HOMO and LUMO become deeper. When HOMO and LUMO becomes shallower, TTF element using this is expected to have a longer lifetime, higher-efficiency, and lower driving-voltage. On the other hand, when HOMO and LUMO becomes deeper, the hole-trapping property of the dopant is disappeared, and it is expected that the driving-voltage becomes much lower.

R in N—R> as a $L^S$ in Formula (A20) is an aryl which may be substituted, a heteroaryl which may be substituted, an alkyl which may be substituted, or a cycloalkyl which may be substituted. R in >Si(—R)$_2$ which is a $L^S$ in formula (A20) is hydrogen, an aryl which may be substituted, an alkyl which may be substituted, or a cycloalkyl which may be substituted, and the two Rs may be bonded to each other to form a ring. Also, at least one of the R in >N—R and the >Si(—R)$_2$ may be bonded to at least one selected from the group consisting of A ring, B ring, and C ring, $R^{XD}$, $R^{XE}$ and $R^S$ via a linking group or single bond. L is preferably >N—R, >O or >S, more preferably >N—R or >O, further preferably >N—R.

When $L^S$ is >N—R, R is preferably an aryl optionally substituted with an alkyl or a cycloalkyl, a heteroaryl optionally substituted with an alkyl or a cycloalkyl, an alkyl or a cycloalkyl, more preferably an aryl optionally substituted with an alkyl or a cycloalkyl, or a heteroaryl optionally substituted with an alkyl or a cycloalkyl, still more preferably an aryl optionally substituted with an alkyl or a cycloalkyl, and particularly preferably phenyl optionally substituted with an alkyl or a cycloalkyl.

In Formula (A20), r is an integer of 1 to 4, preferably 2 or 3, and more preferably 2.

In Formula (A20), each of $R^S$ is independently hydrogen, an alkyl which may be substituted, or a cycloalkyl which may be substituted, and any $R^S$ may be linked to any other $R^S$ via a linking group or single bond.

It is preferable that any two of $R^S$ are bonded to each other via a linking group or single bond. Examples of the linking groups include >O, >S, and the like. Examples of the divalent group formed by bonding to each other include an alkylene. At least one hydrogen in the alkylene may be replaced with an alkyl or a cycloalkyl, and at least one (preferably one) —CH$_2$— in the alkylene may be replaced with —O— or —S—. The divalent group formed by bonding to each other is preferably a straight-chain alkylene having 2 to 5 carbons, more preferably a straight-chain alkylene having 3 or 4 carbons, further preferably a straight-chain alkylene having 4 carbons (—(CH$_2$)$_4$—). It is particularly preferred that the straight chain alkylene (—(CH$_2$)$_4$—) having 4 carbons is unsubstituted.

When two $R^S$ bonded to adjacent carbon atoms are bonded to each other by a linking group or single bond, it is preferred that the remaining $R^S$ not involved in this bond are each independently hydrogen or an alkyl which may be substituted or bonded to R in >N—R or >Si(—R)$_2$ as $L^S$.

When two $R^S$ bonded to adjacent carbon atoms are bonded to each other by a linking group or a single bond, the alkyl which may be substituted, as the remaining $R^S$ not involved in this bond, is more preferably an alkyl having 1 to 6 carbons which may be substituted, and still more preferably an unsubstituted alkyl having 1 to 6 carbons, and most preferably methyl.

In other words, preferred examples of the group represented by Formula (A20) include a group represented by Formula (A20-a).

(A20-a)

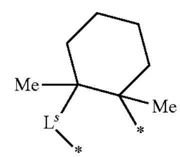

In the formula, Me is methyl.

At least one of R in >N—R and >Si(—R)$_2$ as $L^S$ may be bound to at least one selected from the group consisting of A ring, B ring, C ring, $R^{XD}$, $R^{XE}$ and $R^S$ via a linking group or single bond. As an example of Formula (A20-a) when $L^S$ is >N—R, a group represented by any of the following formulas is exemplified, and a group represented by Formula (A20-b-1) is preferred.

(A20-b-1)

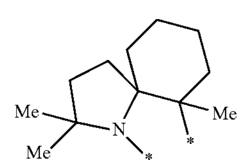

(A20-b-2)

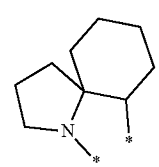

(A20-b-3)

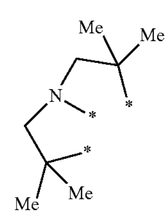

-continued (A20-b-4)

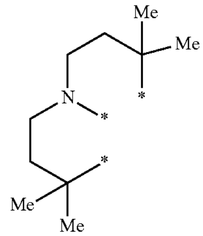

In the above formulas, Me is methyl. In each of the formulas, * represents the position at which the group is bonded to 2 or 3 atoms consecutive (adjacent) on the aryl ring, heteroaryl ring or cycloalkane ring in any of A ring, B ring, C ring, $R^{XD}$, and $R^{XE}$, respectively.

In Formula (1A) and Formula (1B), each Y is independently B, P, P═O or P═S, preferably B or P═O, and more preferably B. A plurality of Y in the at least two substructures represented by formula (1B) in the polycyclic aromatic compound of the present invention may be the same or different from each other. The explanations for Y above apply similarly to Y in formula (2A) and formula (2B).

In Formula (1A) and Formula (1B), each X is independently >C(—R)$_2$, >N—R, >O, >Si(—R)$_2$, >S or >Se, and R in >N—R is hydrogen, an aryl which may be substituted, a heteroaryl which may be substituted, an alkyl which may be substituted, or a cycloalkyl which may be substituted, and R in >C(—R)$_2$ and >Si(—R)$_2$ is each independently hydrogen, an aryl which may be substituted, an alkyl which may be substituted, or a cycloalkyl which may be substituted, and two Rs in >C(—R)$_2$ and >Si(—R)$_2$ may be bonded to each other to form a ring, and at least one R of >N—R, >C(—R)$_2$, and >Si(—R)$_2$ may be bonded to at least one of A ring, B ring, C ring, $R^{XD}$, or $R^{XE}$. The plurality of X (including X at the corresponding position) in the at least two substructures represented by formulas (1B) in the polycyclic aromatic compound of the present invention may be the same or different from each other. The description of X in Formula (1A) and Formula (1B) and the description of the preferred range and the like below apply similarly to X in Formula (2A) and Formula (2B) It should be noted that "at least one of A ring, B ring, C ring, $R^{XD}$, or $R^{XE}$" is replaced with "at least one selected from the group consisting of A ring, B ring, C ring, D ring, or E ring" in Formula (2A) and Formula (2B).

R in >Si(—R)$_2$ as X in Formula (1A) and Formula (1B) is an aryl which may be substituted, a heteroaryl which may be substituted, an alkyl which may be substituted, or a cycloalkyl which may be substituted, and the substituent may be the second substituent described above. Examples of the aryl, heteroaryl, alkyl, or cycloalkyl include the groups described above. Particularly preferred are an aryl having 6 to 10 carbons (e.g., phenyl, naphthyl, etc.), a heteroaryl having 2 to 15 carbons (e.g., carbazolyl, etc.), an alkyl having 1 to 5 carbons (e.g., methyl, ethyl, etc.), or a cycloalkyl having 5 to 10 carbons (preferably cyclohexyl or adamantyl). This explanation also applies to R in >Si(—R)$_2$ as X in Formula (2A) and Formula (2B).

R in >C(—R)$_2$ as X in Formula (1A) and Formula (1B) is a hydrogen, an aryl which may be substituted, a heteroaryl which may be substituted, an alkyl which may be substituted, or a cycloalkyl which may be substituted, and the substituent may be the second substituent described above. Examples of the aryl, heteroaryl, alkyl, or cycloalkyl include the groups described above. Particularly preferred are an aryl having 6 to 10 carbons (e.g., phenyl, naphthyl, etc.), a heteroaryl having 2 to 15 carbons (e.g., carbazolyl, etc.), an alkyl having 1 to 5 carbons (e.g., methyl, ethyl, etc.), or a cycloalkyl having 5 to 10 carbons (preferably cyclohexyl or adamantyl). This explanation also applies to R in >C(—R)$_2$ as X in Formula (2A) and Formula (2B).

As described above, the two Rs in each of >C(—R)$_2$ and >Si(—R)$_2$ as X may be bonded to each other to form a ring. The two Rs may be bonded via single bond or a linking group (these may be collectively referred to as a binding group) Examples of the linking groups include —CH$_2$—CH$_2$—, —CHR—CHR—, —CR$_2$—CR$_2$—, —CH═CH—, —CR═CR—, —C≡C—, —N(—R)—, —O—, —S—, —C(—R)$_2$—, —Si(—R)$_2$—, or —Se—, and examples of >C(—R)$_2$ or >Si(—R)$_2$ in which the ring is formed include structures as follows. Note that R of —CHR—CHR—, R of —CR$_2$—CR$_2$—, R of —CR═CR—, R of —N(—R)—, R of —C(—R)—$_2$, and R of —Si(—R—$_2$ are each independently hydrogen, an aryl, a heteroaryl, an alkyl, an alkenyl, an alkynyl, or a cycloalkyl, and at least one hydrogen in the R may be replaced with an alkyl or a cycloalkyl. Further, two R's adjacent to each other may form a ring to form a cycloalkylene, arylene, and heteroarylene. Note that as each of the substituents listed here, those described above can be referred to.

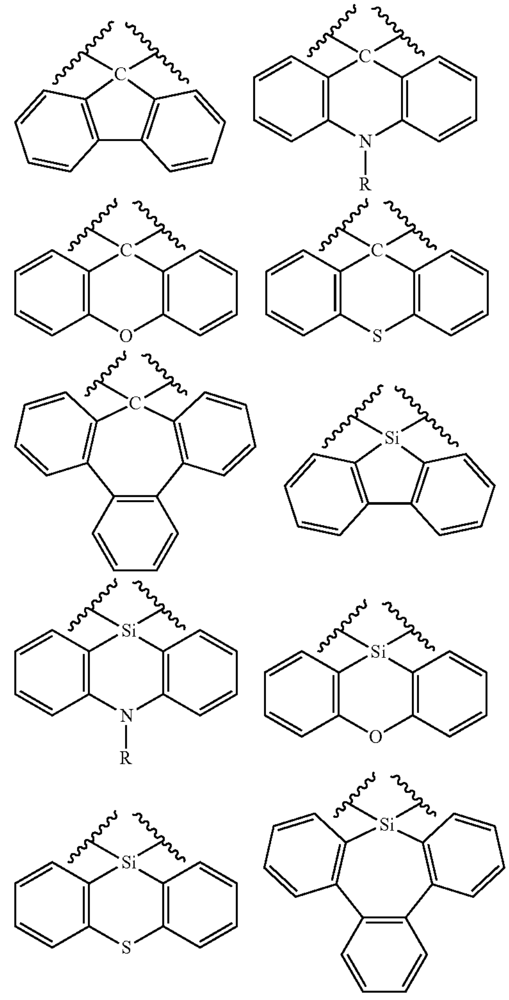

As the binding group, single bond and —CR═CR—, —N(—R)—. —O—, —S—, —C(—R)$_2$, —Si(—R)$_2$— and —Se— as the linking groups are preferred, single bond and —CR═CR—, —N(—R)—, —O—, —S—, and —C(—R)$_2$— as the linking groups are more preferred, single bond and —CR═CR—, —N(—R)—, —O— and —S— as the linking groups are further preferred, and single bond is most preferred.

The positions at which the two R's are bonded by the binding group are not particularly limited as long as they are positions capable of being bonded, but are preferably the most close positions, and for example, when the two R's are phenyl, it is preferable to bond at the positions of the ortho (position 2) with respect to the bonding positions (position 1) of the "C" or "Si" at the phenyl (see the structural formula described above).

It is preferable in Formula (1A) and Formula (1B) that at least one of X is the above-mentioned >N—R, and each of the other X is independently >O, >N—R, or >S, is more preferable that any one or more of X is >N—R and any one or more of X is >O, and is further preferable that one or more of X is >N—R, one or more of X is >O and one or more of X is >S. Highly efficient or long-life organic EL element can be produced with the compounds of the present invention containing >S as X.

For the aryl, heteroaryl, alkyl, and cycloalkyl in R of >N—R in X, reference may be made to their descriptions as the first substituent above. R in >N—R as X is preferably an aryl which may be substituted, a heteroaryl which may be substituted or a cycloalkyl which may be substituted, and more preferably an aryl which may be substituted. Here, as the aryl, phenyl, biphenylyl (particularly, 2-biphenylyl), and terphenylyl (particularly, terphenyl-2'-yl) are preferred, and phenyl and biphenylyl are more preferred. As the substituent when the aryl is substituted, methyl or a tertiary-alkyl represented by the above Formula (tR) is preferred. The number of substituents in the aryl is preferably from 0 to 3, more preferably from 1 to 2.

As R in >N—R as X, an unsubstituted phenyl, a phenyl having methyl bonded to an ortho position or a para position, and a phenyl having methyl bonded to one or two ortho positions are particularly preferred.

R in at least one of >N—R, >Si(—R)$_2$ and >C(—R)$_2$ as X may be bonded to at least one ring in A ring, B ring, C ring, $R^{XD}$, or $R^{XE}$ via a linking group or single bond. As the linking group, —O—, —S—, or —C(—R)$_2$ is preferred. R in the aforementioned "—C(—R)$_2$—" is hydrogen, an alkyl or a cycloalkyl. Examples of the alkyl or cycloalkyl include the groups described above. In particular, an alkyl having 1 to 5 carbons (e.g., methyl, ethyl, etc.) or a cycloalkyl having 5 to 10 carbons (preferably cyclohexyl or adamantyl) is preferred. Other examples of the linking group include an alkylene having 2-3 carbons, —CH═CH—, and a phenylene (particularly 1,2-phenylene). This explanation applies similarly to the linking group "—C(—R)$_2$—" when X in formula (2A) and formula (2B) is bonded to at least one ring in A ring, B ring, C ring, D ring, or E ring.

Examples of a structure in which R in at least one of >N—R, >Si(—R)$_2$ and >C(—R)$_2$ as X is bonded to at least one ring in A ring, B ring, C ring, $R^{XD}$, or $R^{XE}$ by a linking group or a single bond include a compound having a ring structure in which X is incorporated into the fused ring B', represented by the following formula (1-3-1), and a compound having a ring structure in which X is incorporated into the fused ring A', represented by the following formula (1-3-2).

(1-3-1)

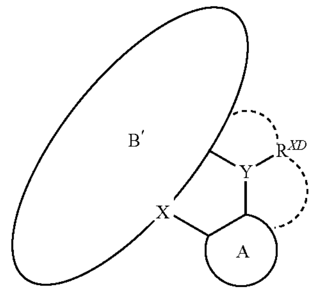

(1-3-2)

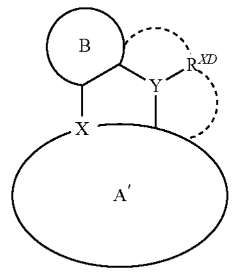

Examples of the fused ring formed (such as a fused ring B' in formula (1-3-1) or a fused ring A' in formula (1-3-2)) by forming include a carbazole ring and the like, and specific examples of the fused ring in which X is >N—R include the following rings. Note that, each of the groups represented by the following formulas binds to Y at the position of *, and one ring (A ring or B ring of the above formula) at the position of #, and another bonding hand may be present at the position of **. Note that the group represented by each of the following formulas may further have a substituent.

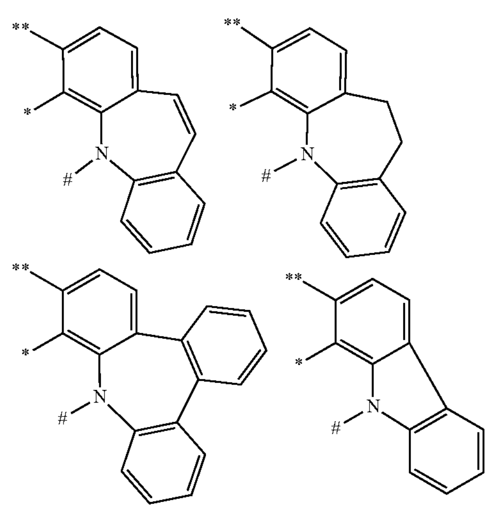

The above structure can also be described as a structure in which a $R^{XD}$ or $R^{XE}$ binds to a ring via single bond, as described below.

The polycyclic aromatic compound of the present invention preferably has a structure in which at least one of X connecting the ring structure and the ring structure is >N—R, and that the R is an alkyl which may be substituted or a cycloalkyl which may be substituted, and bonded to an aryl ring or a heteroaryl ring in at least one of A ring, B ring, C ring, $R^{XD}$, or $R^{XE}$ via a linking group or single bond.

For example, the following substructure (A10) may be formed by the linkage as described above.

(A10)

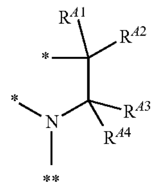

In formula (A10), each $R^{A1}$ to $R^{A4}$ is independently hydrogen, an alkyl which may be substituted or a cycloalkyl which may be substituted, and any 2 to 4 of $R^{A1}$ to $R^{A4}$ may be bonded to each other by a linking group or single bond and is bonded to one ring of the two rings to which X is bonded at the positions of two * and to the other ring at the positions of **. That is, N in Formula (A10) is N in >N—R when X is >N—R. The atoms on the ring to which the group represented by Formula (A10) are bonded at the positions of two * may be atoms adjacent to each other (carbon atoms are preferred). Although containing a N—C bond with weak bond dissociation energies (BDE), the substructure represented by Formula (A10) is relatively stable structure because the reverse reaction (recombination reaction) is promoted at the cleavage of the N—C bond due to another bond forming a ring. Therefore, by manufacturing an organic EL element using the polycyclic aromatic compound of the present invention which has such a structure, a prolonged lifetime can be expected. When the polycyclic aromatic compound of the present invention contains a structure represented by Formula (A10), the number thereof is 1 to "the number of X" and is preferably 1 or 2.

In Formula (A10), each $R^{A1}$ to $R^{A4}$ is hydrogen, an alkyl which may be substituted or a cycloalkyl which may be substituted, and any 2 to 4 of $R^{A1}$ to $R^{A4}$ may be linked to each other via a linking group.

In $R^{A1}$ to $R^{A4}$, any two ($R^{A1}$ and $R^{A4}$, $R^{A1}$ and $R^{A4}$ and $R^{A2}$ and $R^{A3}$, $R^{A1}$ and $R^{A2}$, $R^{A3}$ and $R^{A4}$, $R^{A1}$ and $R^{A4}$ and $R^{A2}$ and $R^{A3}$) are preferably bonded to each other by a linking group or a single bond, more preferably $R^{A1}$ and $R^{A4}$ are bonded to each other by a linking group or single bond. Examples of the divalent group formed by bonding to each other include an alkylene. At least one hydrogen in the alkylene may be replaced with an alkyl or a cycloalkyl, and at least one (preferably one) —$CH_2$— in the alkylene may be replaced with —O— or —S—. As the divalent group formed by bonding to each other, a straight-chain alkylene having 2 to 5 carbons is preferred, a straight-chain alkylene having 3 or 4 carbons is more preferred, and a straight-chain alkylene having 4 carbons (—$(CH_2)_4$—) is further preferred. It is particularly preferred that the straight chain alkylene having 4 carbons (—$(CH_2)_4$—) is unsubstituted.

The remaining $R^{A1}$ to $R^{A4}$ not involved in the linking by the linking group are each independently preferably hydrogen or an alkyl which may be substituted, more preferably an alkyl having 1 to 6 carbons which may be substituted, still more preferably an unsubstituted alkyl having 1 to 6 carbons, and most preferably methyl.

That is, as the substructure represented by Formula (A10), a structure represented by the following Formula (A11) is preferred.

(A11)

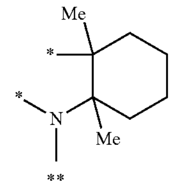

In Formula (A11), Me is methyl and the group represented by Formula (A11) is bonded to one ring of the two rings to which X is bonded at the positions of two * and to the other ring at the positions of **.

In Formula (1A), $R^{XD}$ may be bonded to a B ring via the dashed line which is —X—, —X'— or single bond. In addition, in Formula (1B), $R^{XE}$ may be bonded to a C ring via the dashed line which is —X—, —X'— or single bond. Similarly, in Formula (2B), E ring may be further bonded to a C ring via the dashed line which is —X—, —X'— or single bond. X herein is synonymous with X in Formula (1A) and Formula (1B).

X' is an arylene, a heteroarylene, or a binary linking group consisting of a combination of an arylene or a heteroarylene and one or more selected from the group consisting of >C(—R)$_2$, >N—R, >O, >Si(—R)$_2$ and >S. R in >C(—R)$_2$, >N—R, >O, and >Si(—R)$_2$ as X' are synonymous with R in >C(—R)$_2$, >N—R, >O, and >Si(—R)$_2$, as X and the preferred range are also the same. X is preferably an arylene or a divalent linking group consisting of an arylene and >O. As the arylene, 1,2-phenylene is preferred.

In a compound consisting of a substructure represented by Formula (1A) and at least two substructures represented by Formula (1B), $R^{XD}$ or $R^{XE}$, when bonded to another ring by a single bond, is preferably any of the following structures. In the following formulas, when $R^{XD}$ or $R^{XE}$ is a divalent group, it is bonded to Y at the position of * and to the other ring described above at the position of #. When $R^{XD}$ or $R^{XE}$ is a trivalent group, it is further bonded to X or the like at the positions of **. Note that each ring may have a substituent.

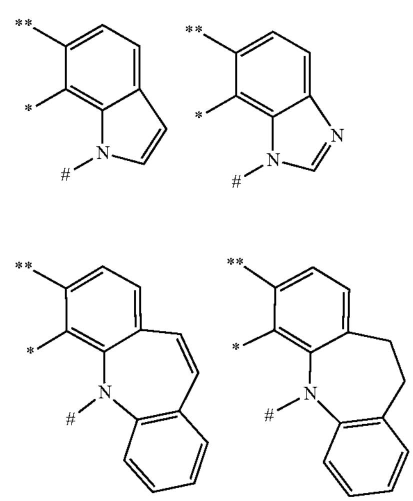

-continued

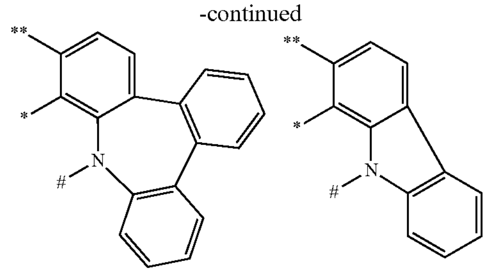

Examples of such structures include compounds represented by Formula (v-18-3), Formula (vi-14), Formula (vi-29), Formula (vi-49), or Formula (vi-56).

At least one selected from the group consisting of aryl rings and heteroaryl rings in a compound consisting of a substructure represented by Formula (1A) and at least two substructures represented by Formula (1B) may be fused with at least one cycloalkane, and at least one hydrogen in the cycloalkane may be substituted, and at least one —$CH_2$— in the cycloalkane may be replaced with —O—. This explanation applies equally to compounds where Formula (1A) and Formula (1B) are Formula (2A) and Formula (2B), respectively.

"Cycloalkanes" include cycloalkanes having 3 to 24 carbons, cycloalkanes having 3 to 20 carbons, cycloalkanes having 3 to 16 carbons, cycloalkanes having 3 to 14 carbons, cycloalkanes having 5 to 10 carbons, cycloalkanes having 5 to 8 carbons, cycloalkanes having 5 to 6 carbons, and cycloalkanes having 5 carbons.

Specific examples of cycloalkanes include cyclopropane, cyclobutane, cyclopentane, cyclohexane, cycloheptane, cyclooctane, cyclononane, cyclodecane, norbornane (bicyclo[2.2.1]heptane), bicyclo[1.1.0]butane, bicyclo[1.1.1]pentane, bicyclo[2.1.0]pentane, bicyclo[2.1.1]hexane, bicyclo[3.1.0]hexane, bicyclo[2.2.2]octane, adamantane, diamantine, decahydronaphthalene and decahydroazulene, and a C1-5 alkyl (particularly methyl) substituent thereof, a halogen (especially fluorine) substituent thereof, and a deuterium substituent thereof.

Among these, a structure in which at least one hydrogen is substituted at a carbon at the α-position of a cycloalkane (in a cycloalkyl which is fused to an aryl ring or a heteroaryl ring, a carbon at the position adjacent to a carbon at the fused site) is preferred, and a structure in which two hydrogens at a carbon at an α-position are substituted is more preferred, and a structure in which a total of 4 hydrogens at a carbon at two α-positions are substituted is further preferred. Examples of the substituent include an alkyl (particularly methyl) having 1 to 5 carbons, a halogen (particularly fluorine), and deuterium. In particular, it is preferable to have a structure in which a partial structure represented by the following formula (B10) is bonded to carbon atoms adjacent to each other on an aryl ring or a heteroaryl ring.

(B10)

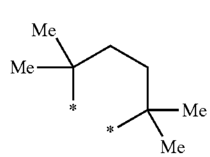

In Formula (B10), Me represents methyl and * represents a bonding position.

Hydrogen in the chemical structure of a polycyclic aromatic compound consisting of a substructure represented by Formula (1A) and at least two substructures represented by Formula (1B) may be replaced in all or a part thereof with deuterium, cyano, or halogen. For example, in a polycyclic air compound consisting of a substructure represented by Formula (1A) and at least two substructures represented by Formula (1B), any hydrogen in the aryl ring or a heteroaryl ring in A ring, B ring, C ring, $R^{XD}$, or $R^{XE}$, and a substituent to these rings, and any hydrogen in R (=an alkyl, a cycloalkyl, or an aryl) when X is >N—R, >C(—R)$_2$, or >Si(—R)$_2$ can be replaced with deuterium, cyano, or halogen. Among these, all or part of hydrogen in the aryl or heteroaryl can be replaced with deuterium, cyano, or halogen. Halogen is fluorine, chlorine, bromine, or iodine, preferably fluorine, chlorine, or bromine, more preferably fluorine or chlorine, and further preferably fluorine. In addition, from the viewpoint of durability, it is also preferable that all or a part of hydrogen in the chemical structure of the polycyclic aromatic compound consisting of a substructure represented by Formula (1A) and at least two substructures represented by Formula (1B) is deuterated. This explanation applies equally to compounds where Formula (1A) and Formula (1B) are formula (2A) and formula (2B), respectively.

Examples of the polycyclic aromatic compound consisting of a substructure represented by Formula (1A) and at least two substructures represented by Formula (1B) include the compounds represented by any of the following formulas.

The 0 to 2 hydrogens in each benzene ring in each of the following formulae may be replaced with the substituents (first substituents) listed above.

(iv-1)

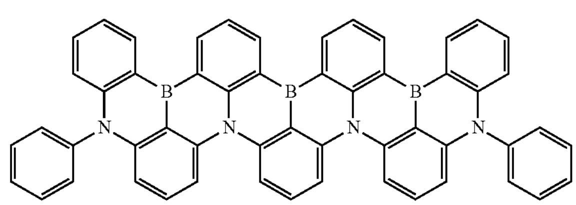

(iv-2)

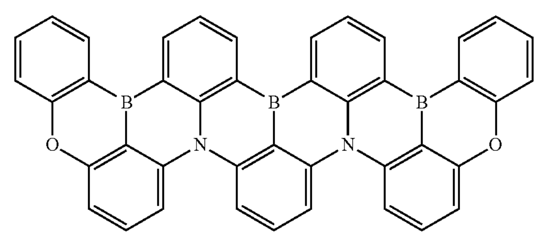

(iv-3)

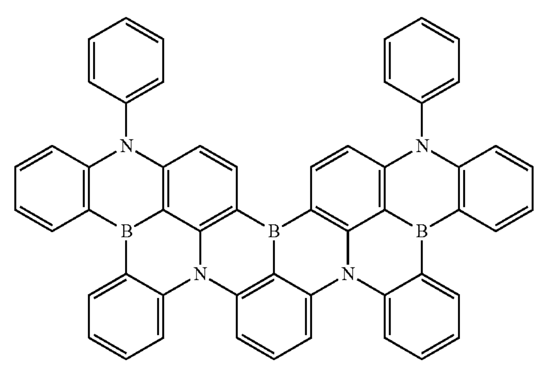

-continued
(iv-4)
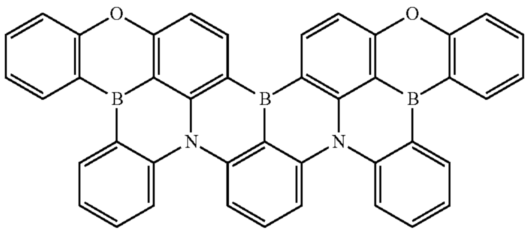
(iv-5)
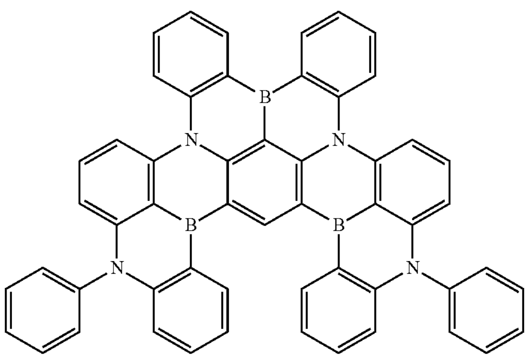
(iv-6)
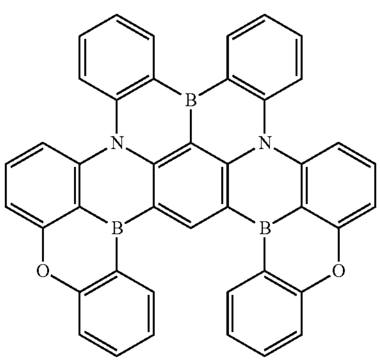
(iv-7)
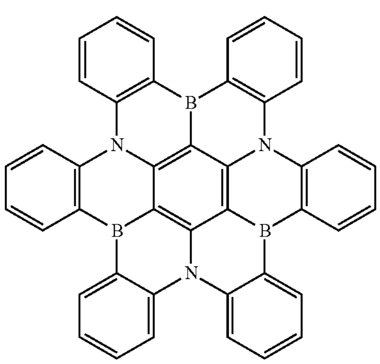
-continued
(iv-8)
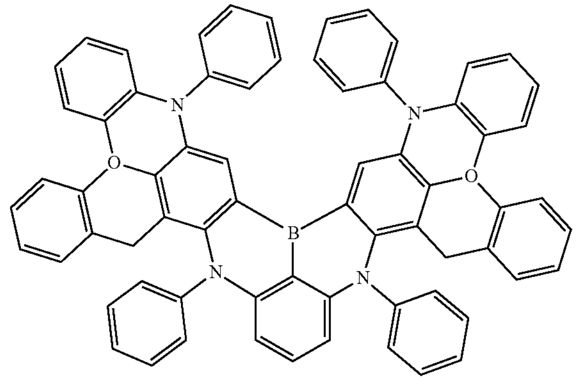
(iv-9)
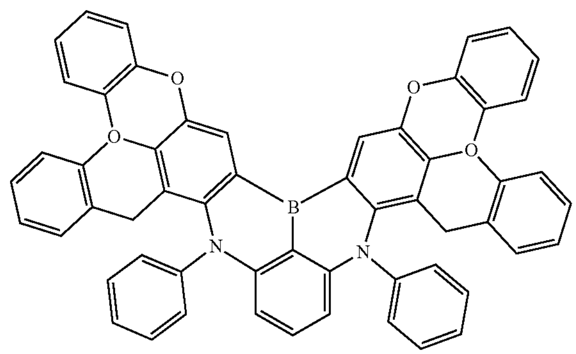
(iv-10)
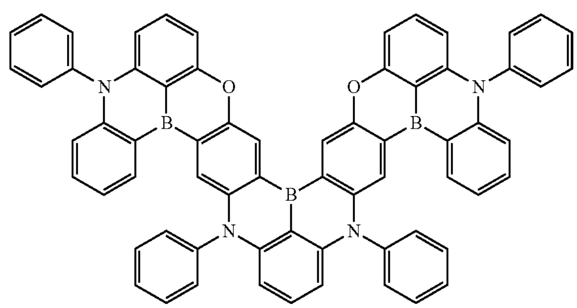
(iv-11)
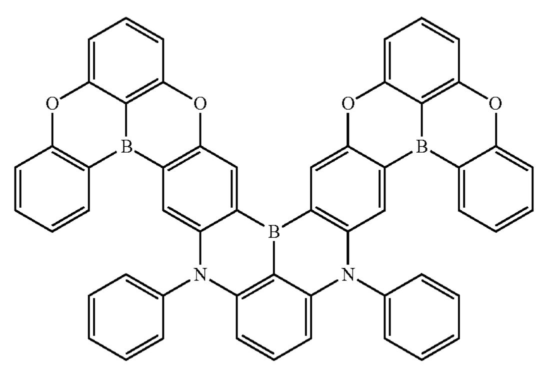

-continued
(iv-12)
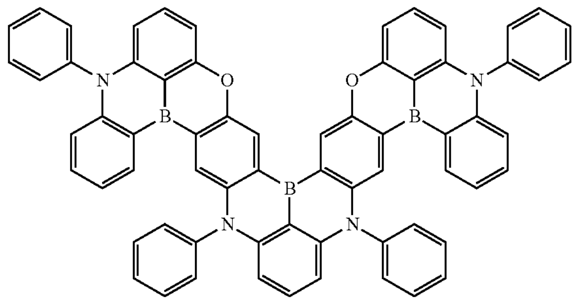
(iv-13)
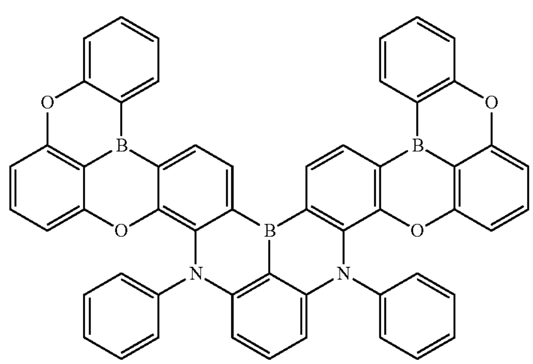
(iv-14)
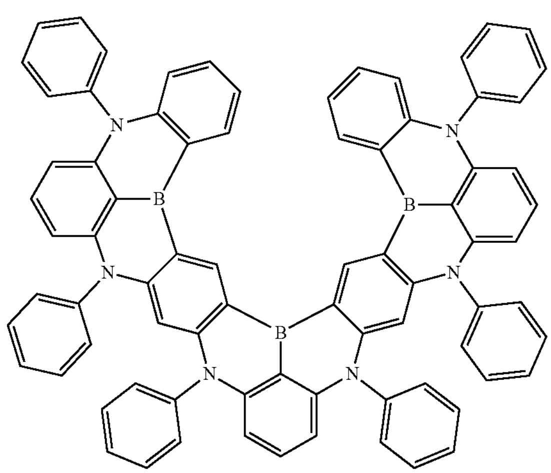
-continued
(iv-15)
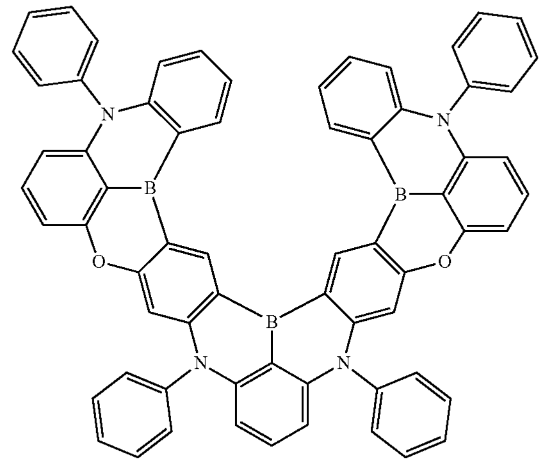
(iv-16)
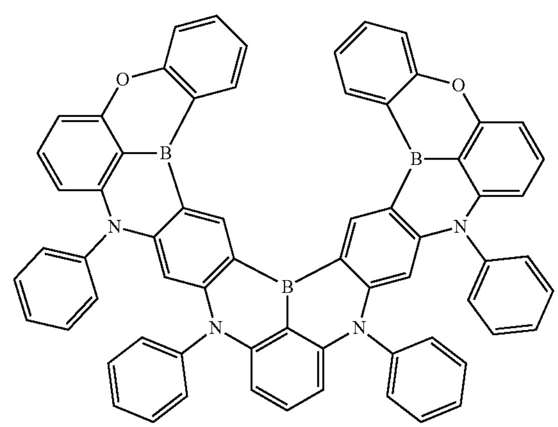
(iv-17)
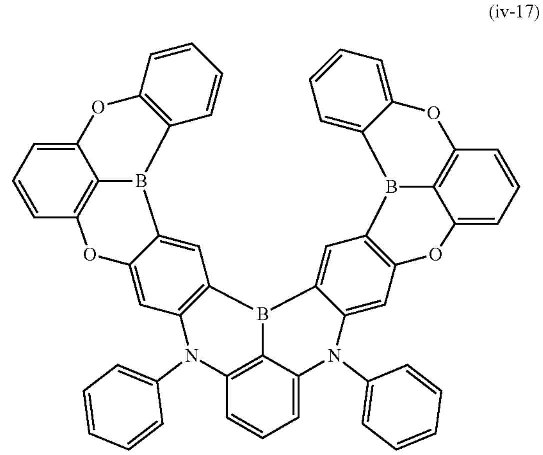

-continued
(iv-18)
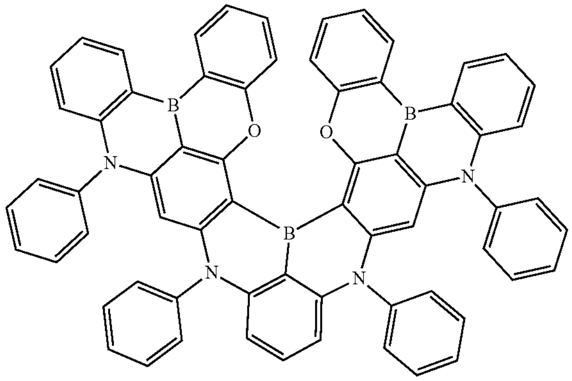
(iv-19)
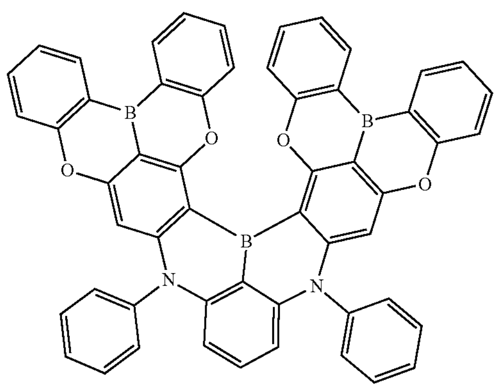
(iv-20)
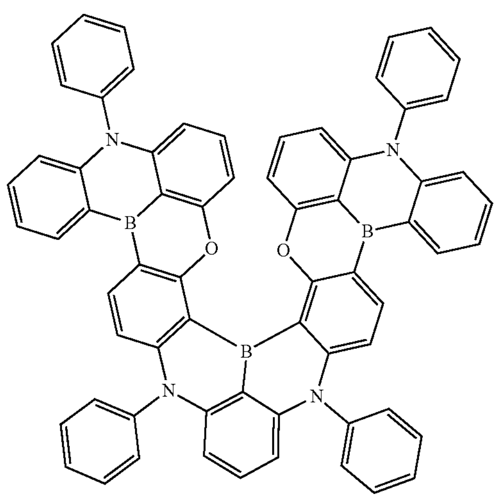
-continued
(iv-21)
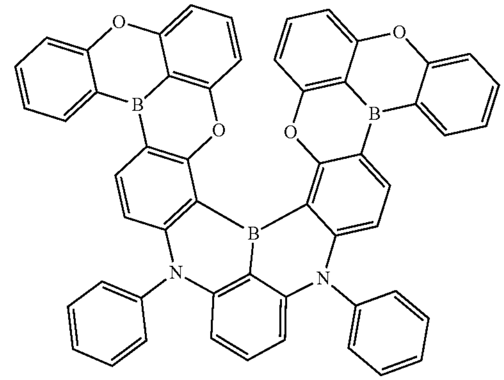
(iv-22)
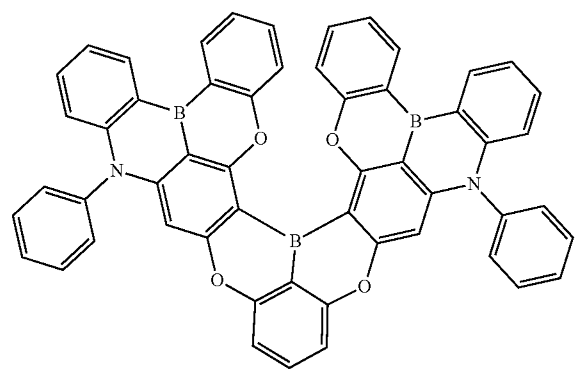
(iv-23)
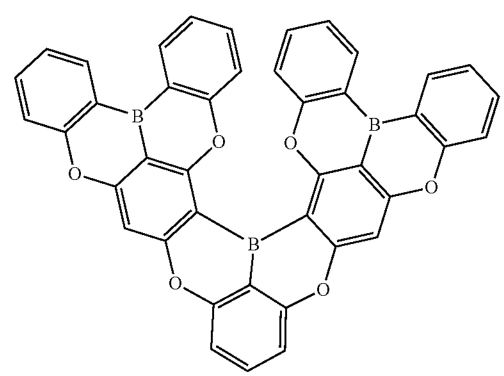

-continued
(iv-24)
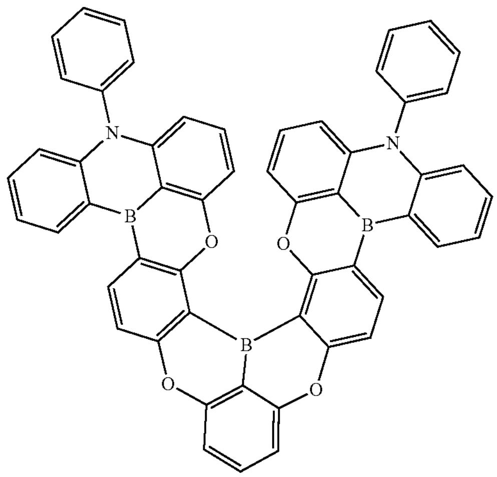
(iv-25)
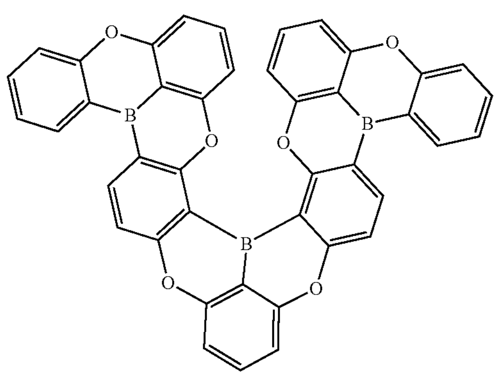
(iv-26)
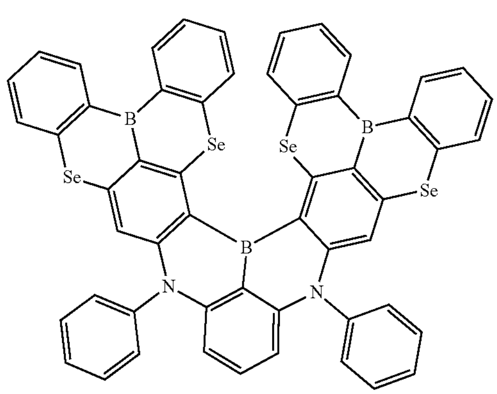
-continued
(iv-27)
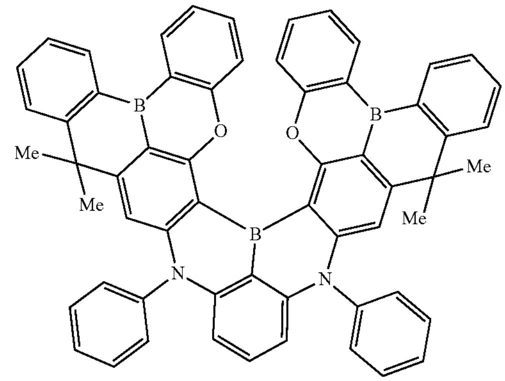
(iv-28)
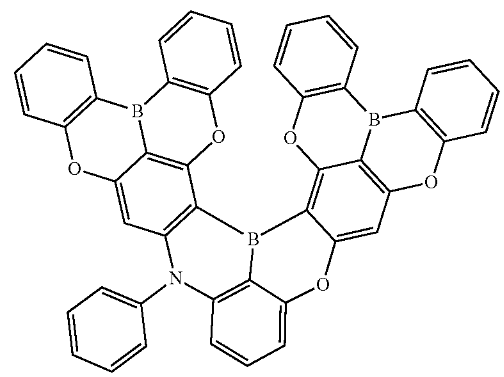
(iv-29)
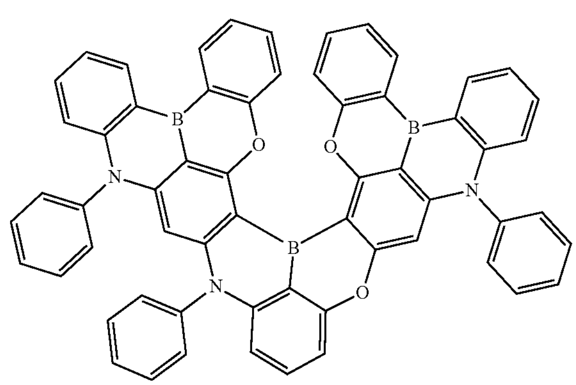

-continued
(iv-30)
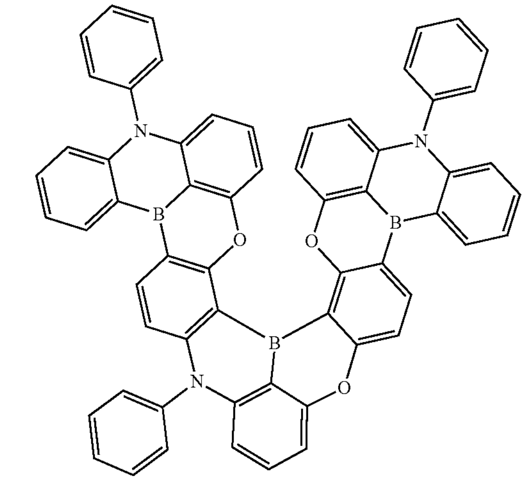
(iv-31)
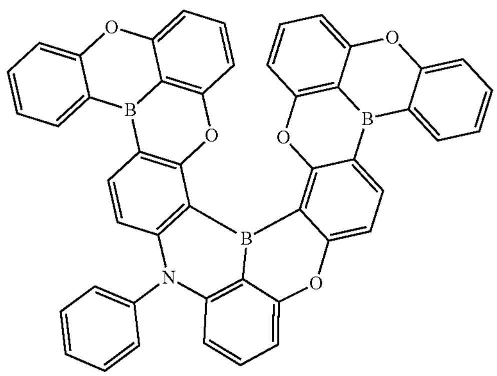
(iv-32)
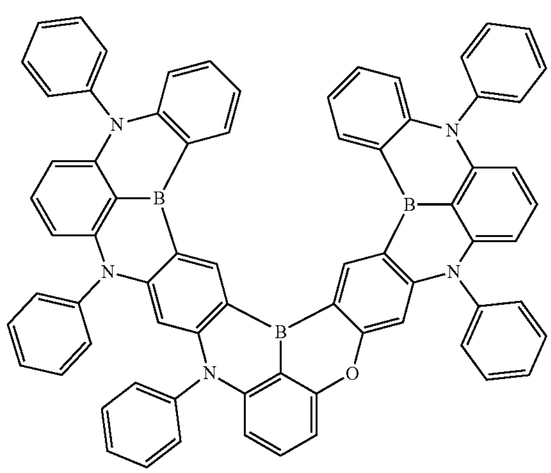
-continued
(iv-33)
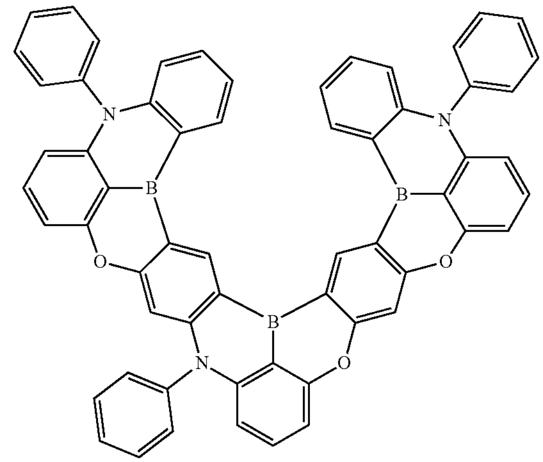
(iv-34)
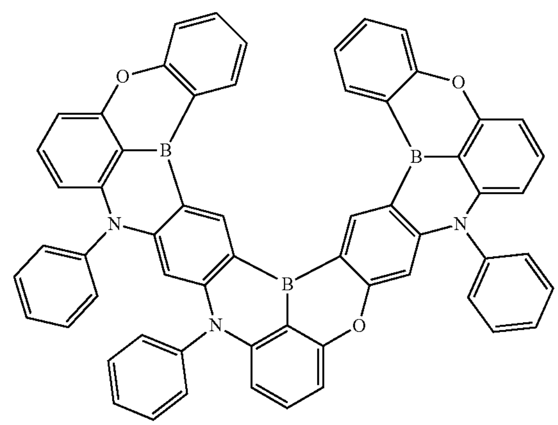
(iv-35)
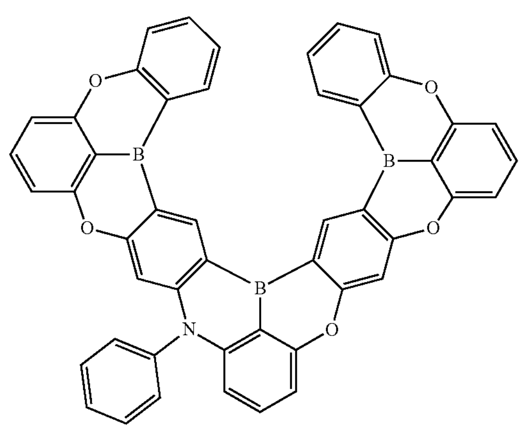

-continued
(iv-36)
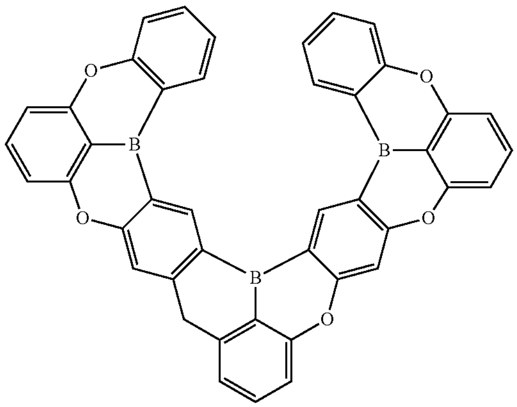
(iv-37)
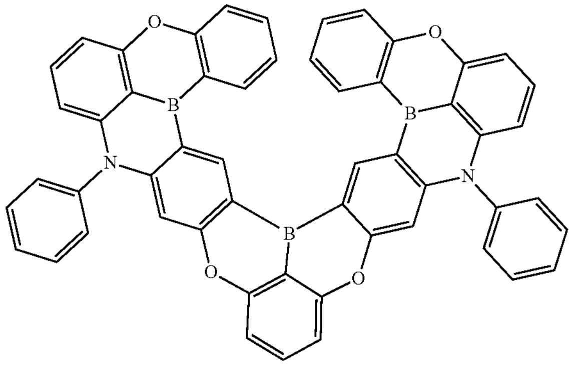
(iv-38)
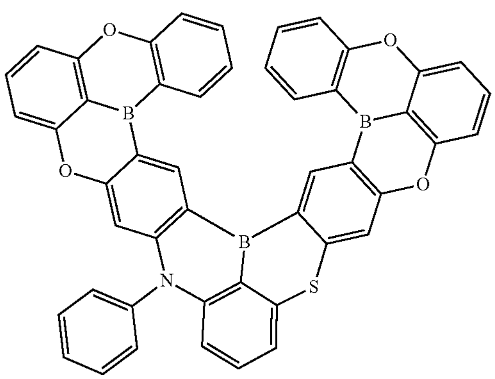
(iv-39)
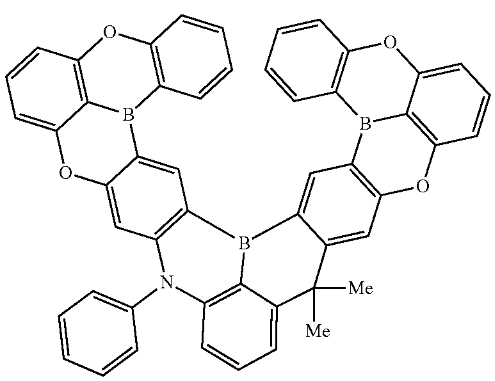
-continued
(iv-40)
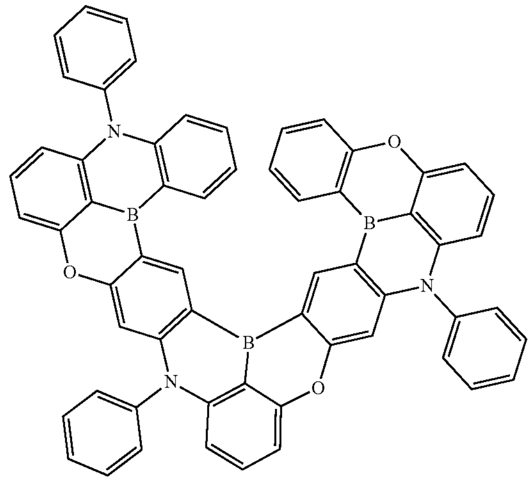
(iv-50)
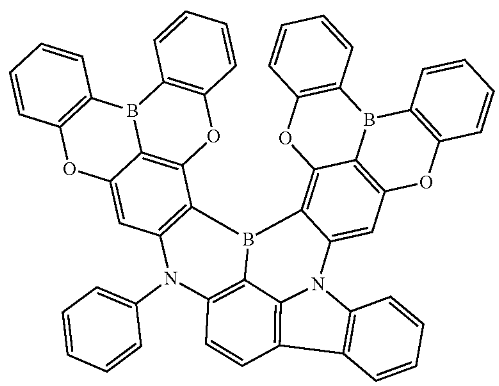
(iv-51)
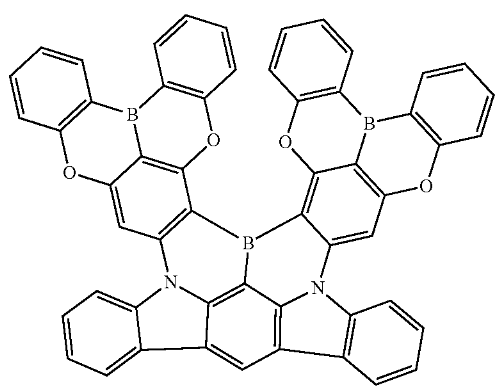

-continued
(iv-52)
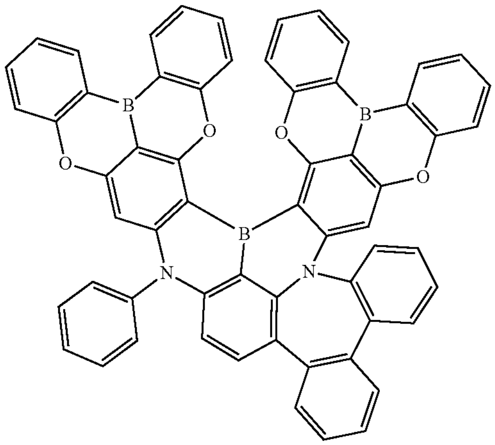
(iv-53)
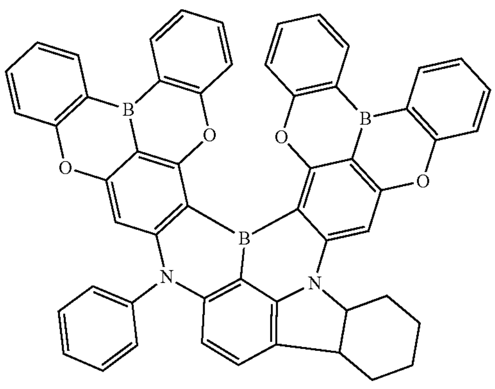
(iv-54)
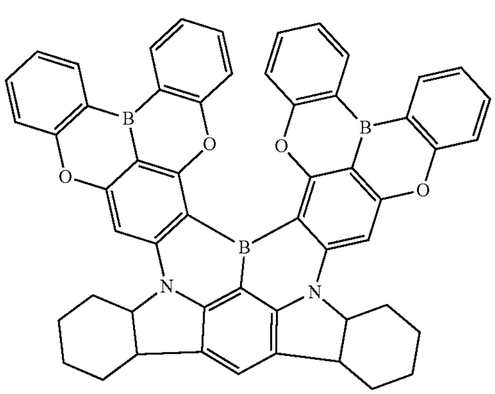
-continued
(iv-101)
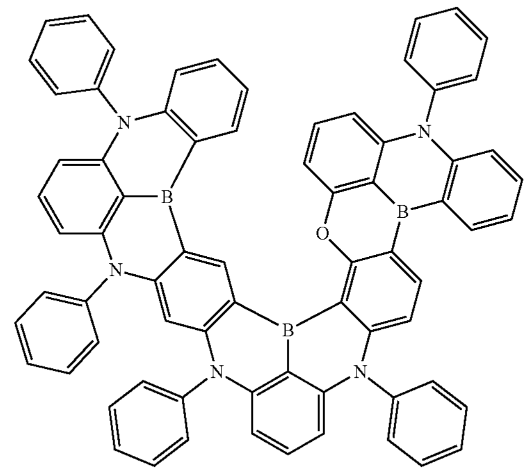
(iv-102)
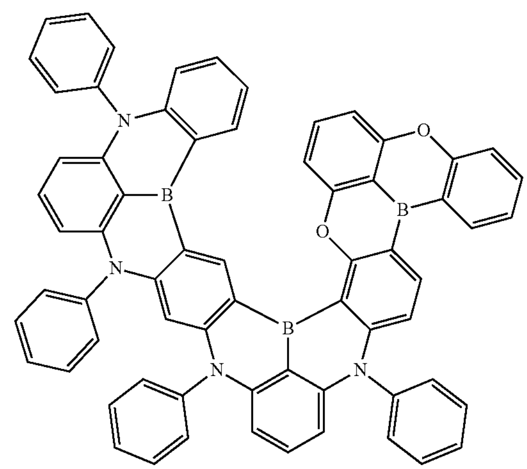
(iv-103)
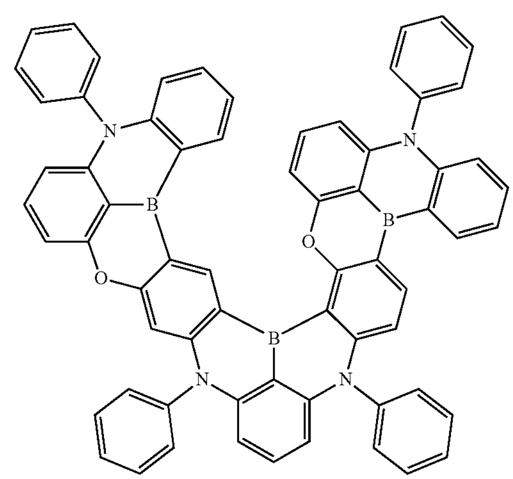

-continued
(iv-104)
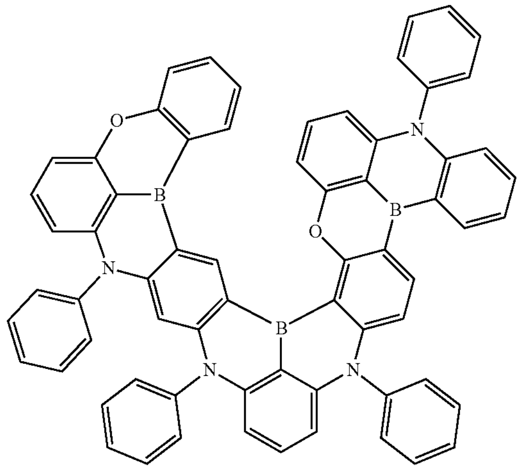
(iv-105)
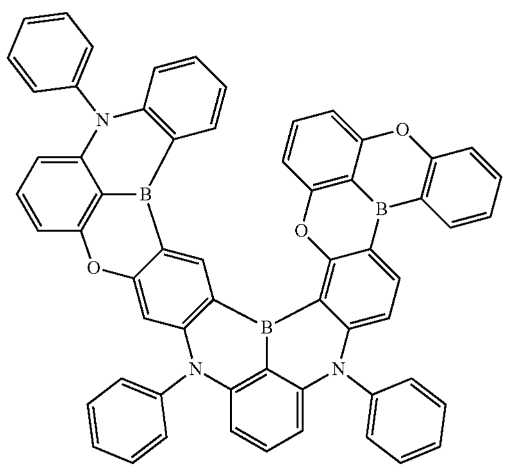
(iv-106)
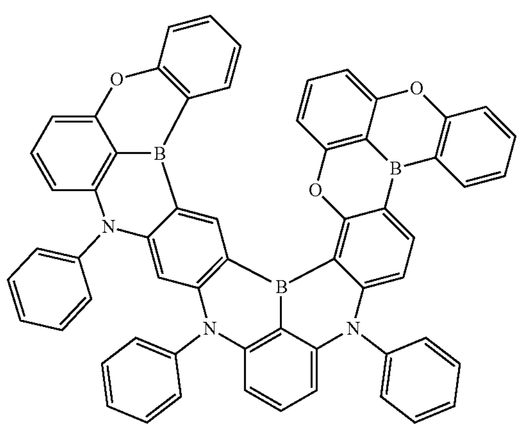
-continued
(iv-107)
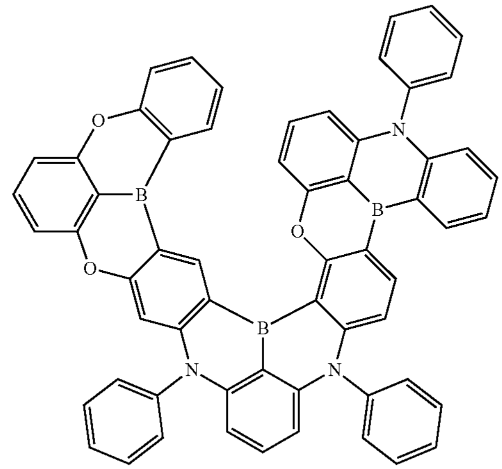
(iv-108)
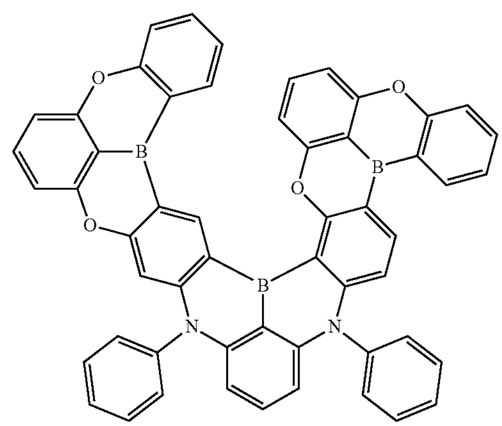
(iv-111)
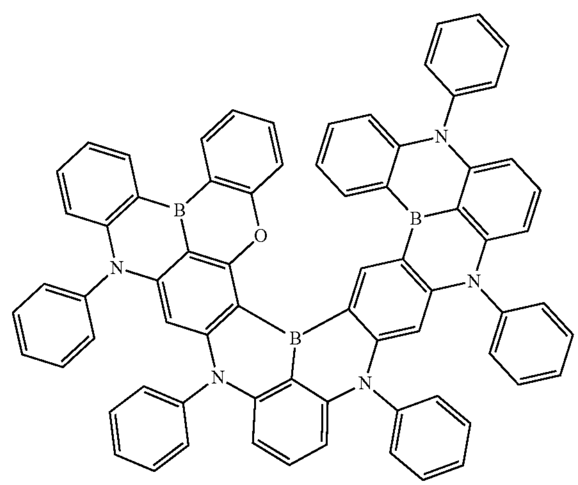

-continued
(iv-112)
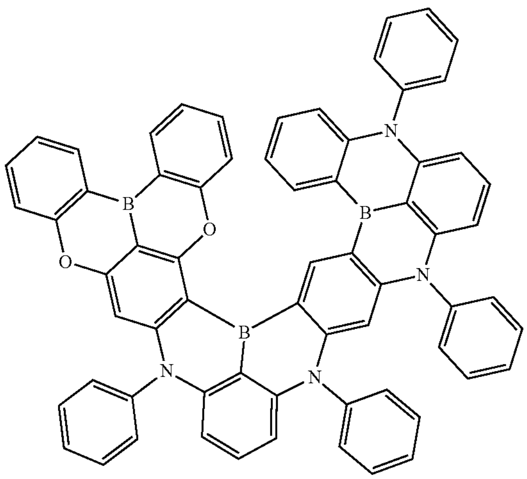
(iv-113)
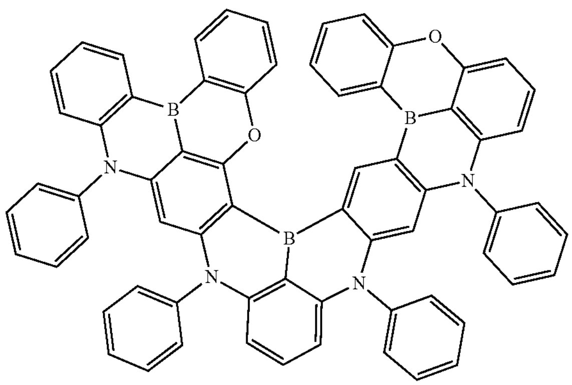
(iv-114)
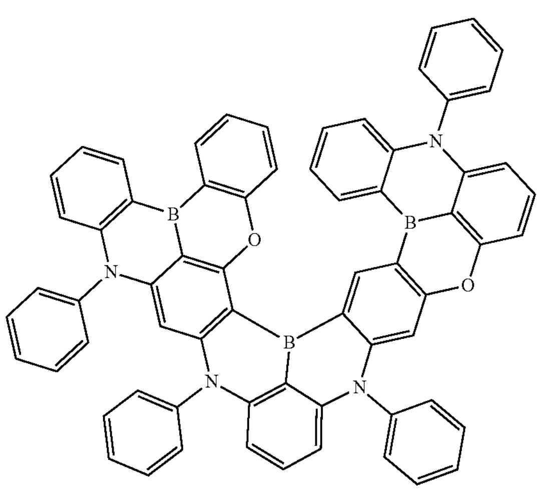
-continued
(iv-115)
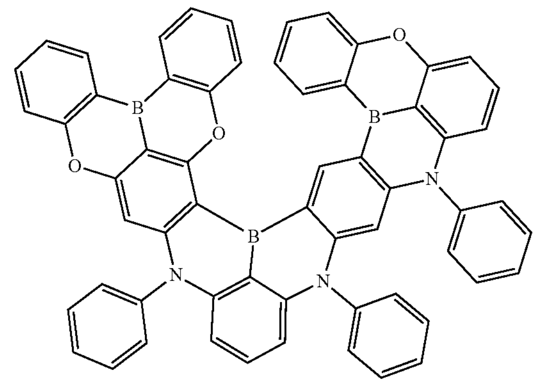
(iv-116)
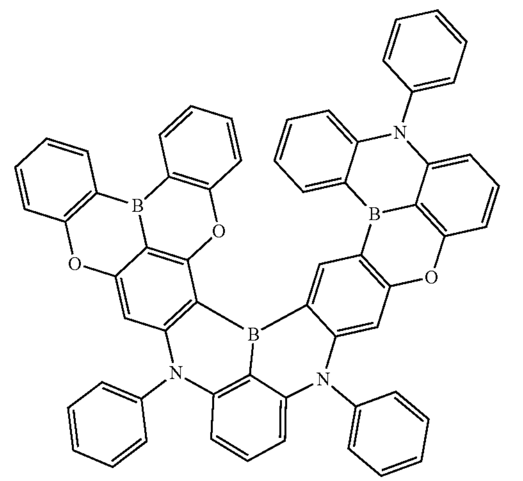
(iv-117)
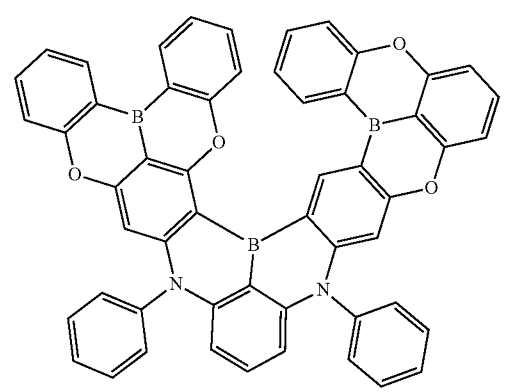

(iv-118)
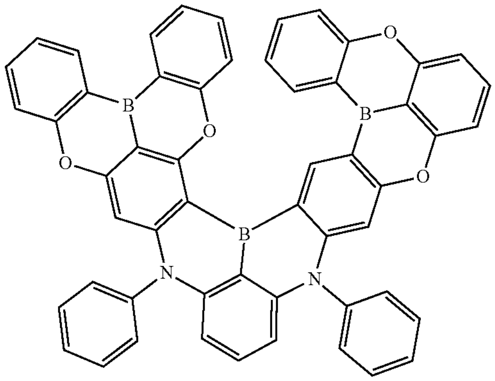
(iv-131)
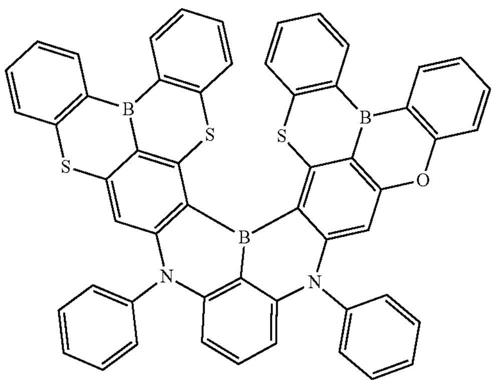
(iv-132)
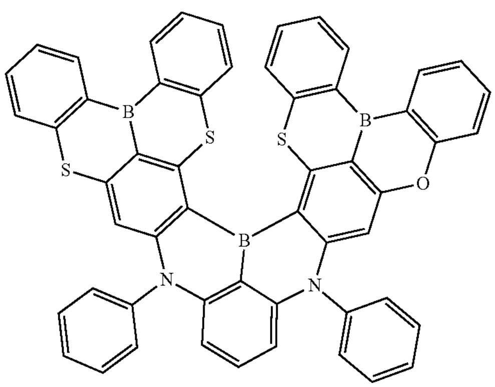
(iv-133)
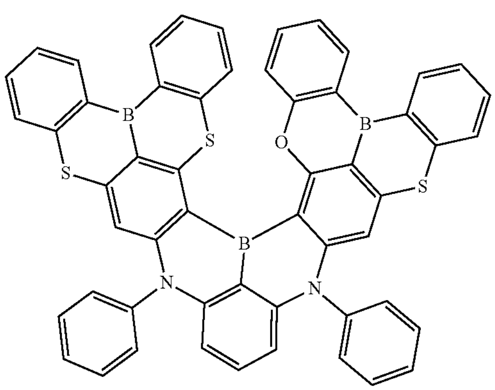
(iv-134)
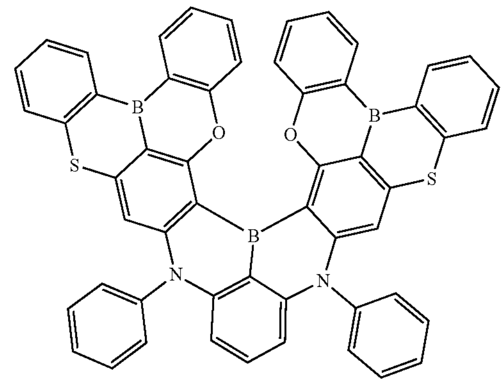
(iv-135)
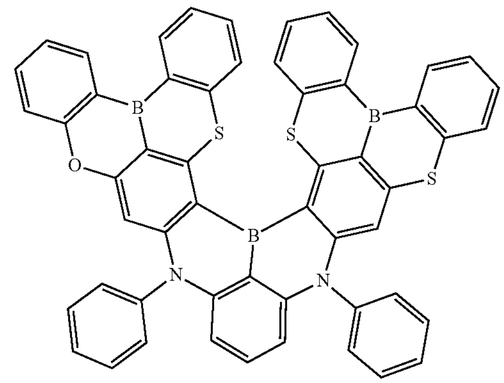
(iv-136)
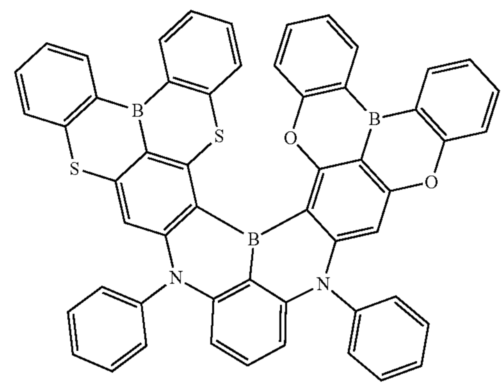
(iv-137)
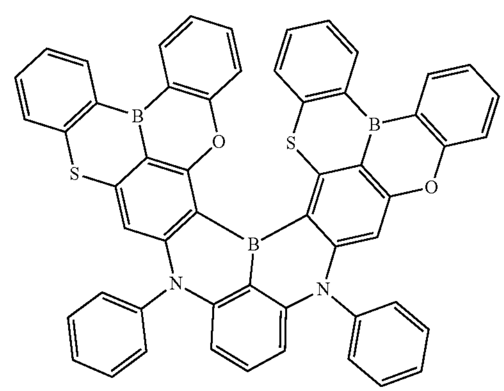

-continued
(iv-138)
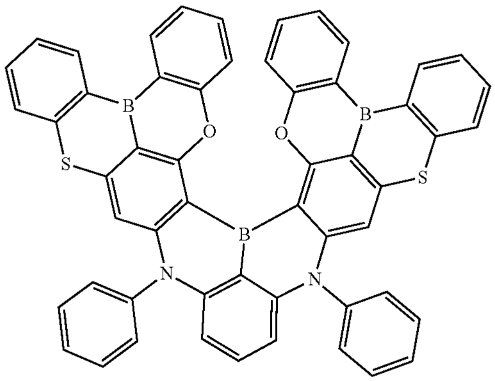
(iv-139)
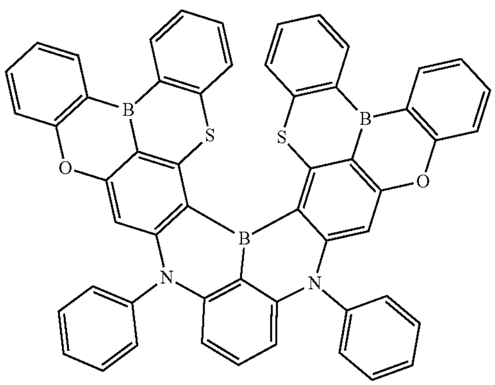
(iv-140)
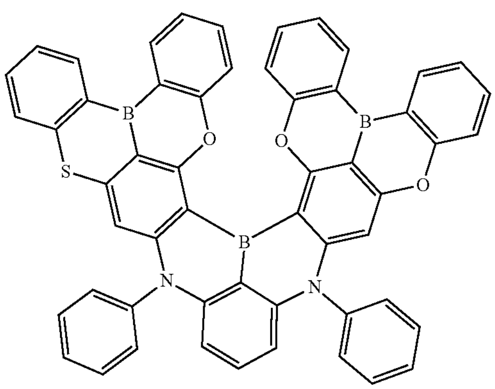
(iv-141)
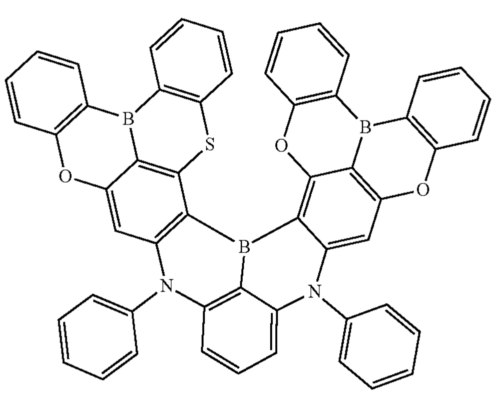
-continued
(iv-151)
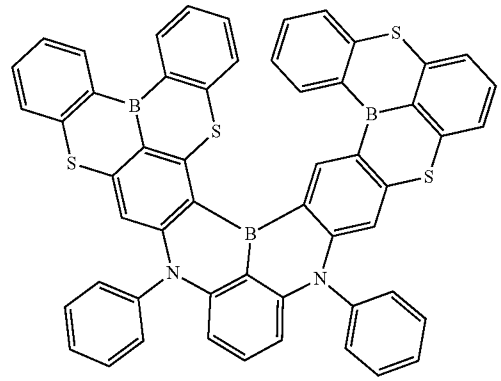
(iv-152)
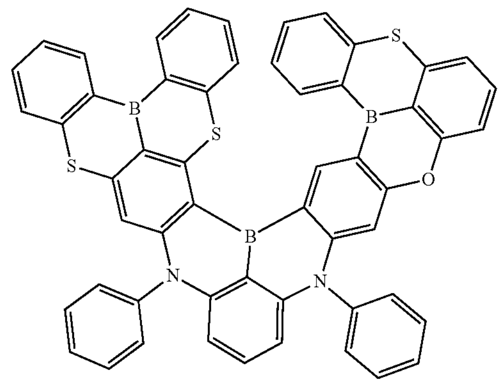
(iv-153)
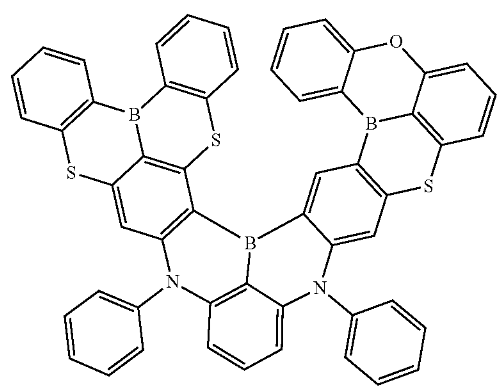
(iv-154)
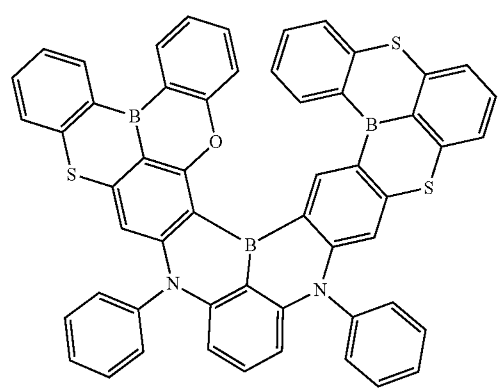

-continued
(iv-155)
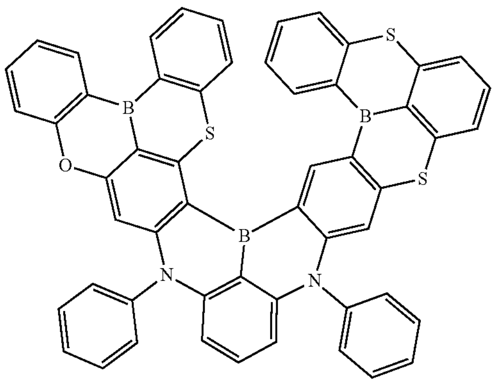
(iv-156)
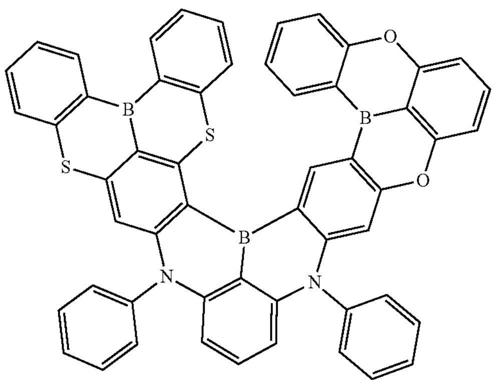
(iv-157)
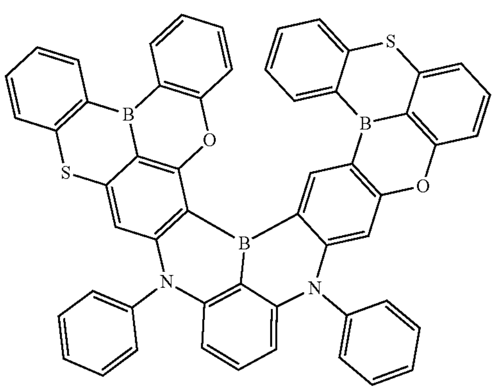
(iv-158)
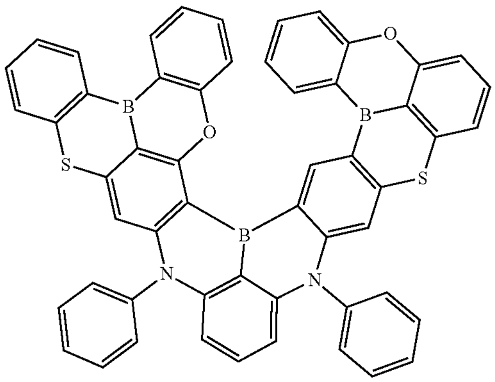
-continued
(iv-159)
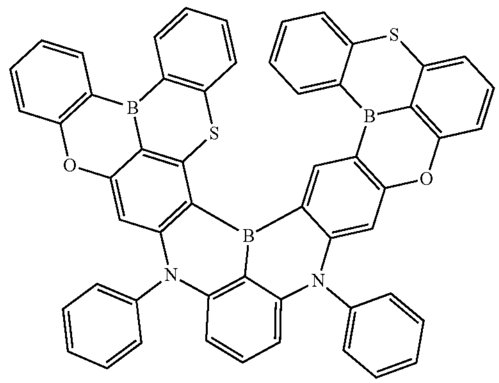
(iv-160)
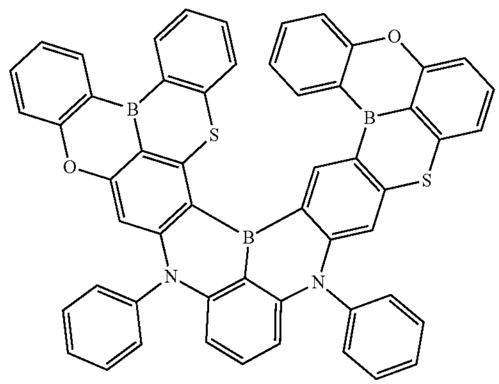
(iv-161)
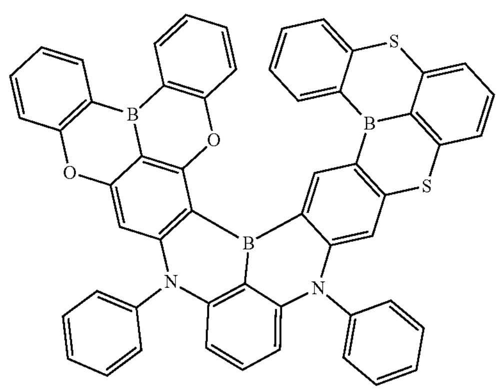
(iv-162)
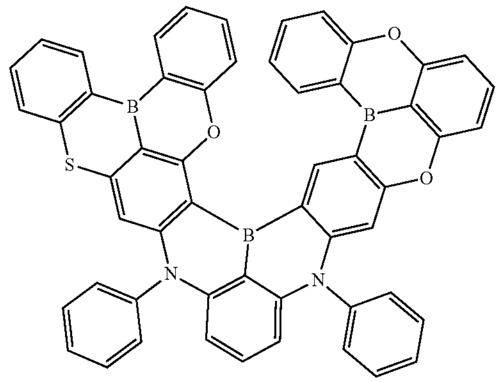

-continued
(iv-163)
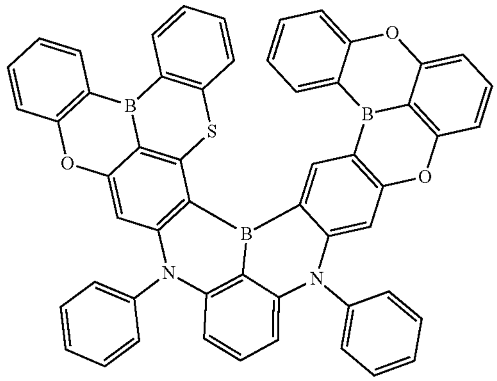
(iv-164)
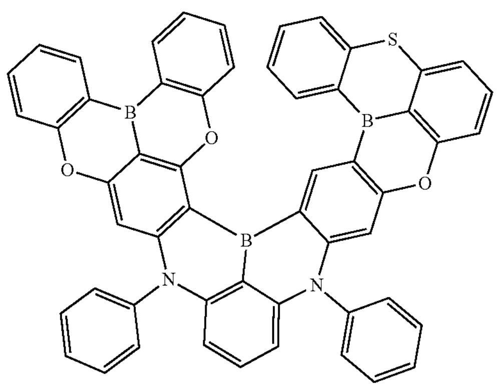
(iv-165)
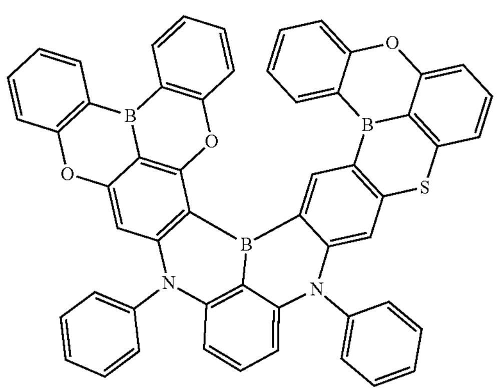
(iv-171)
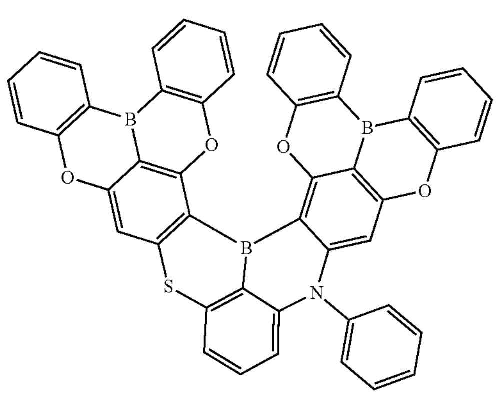
-continued
(iv-172)
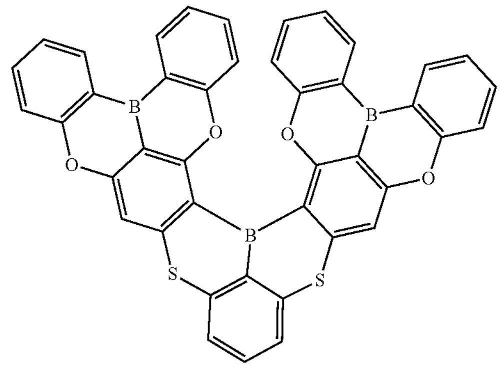
(iv-181)
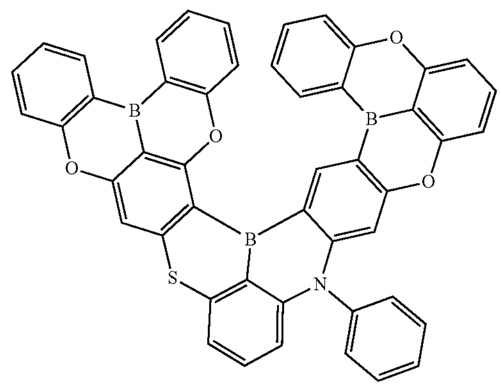
(iv-182)
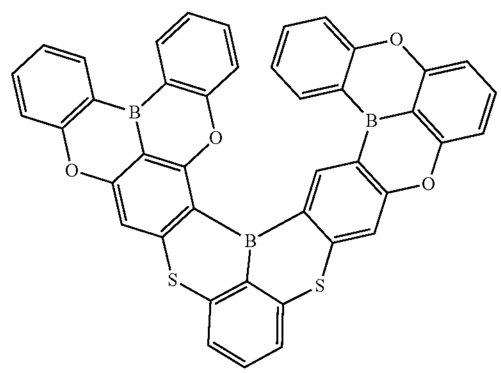
(iv-201)
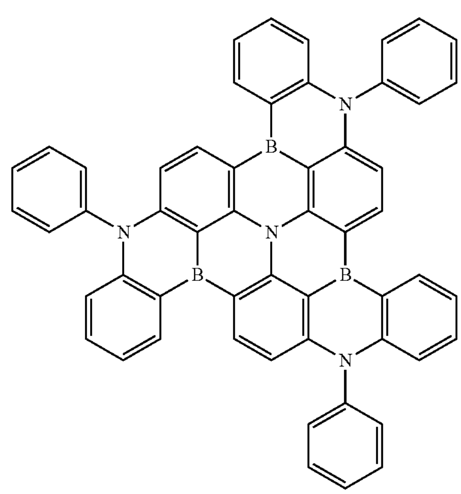

-continued
(iv-202)
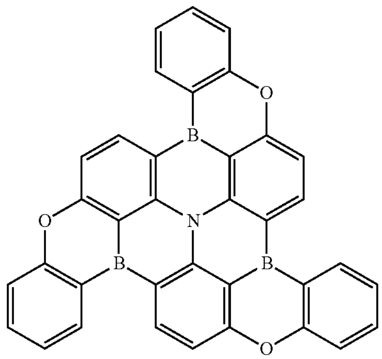
(iv-501)
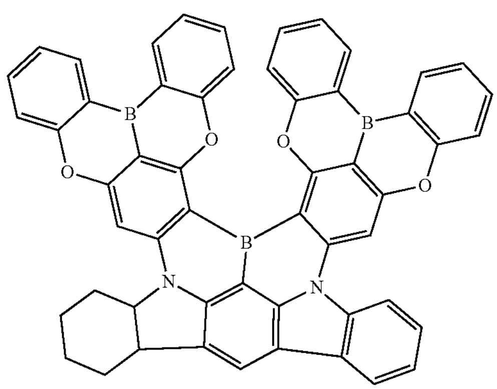
(iv-502)
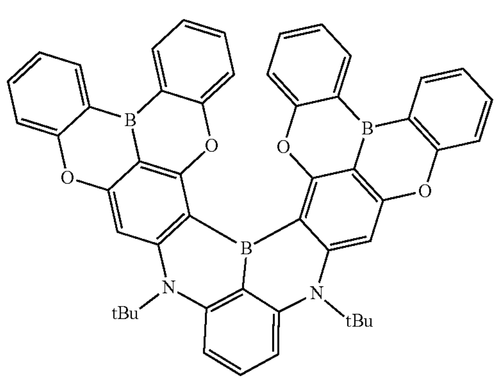
-continued
(iv-503)
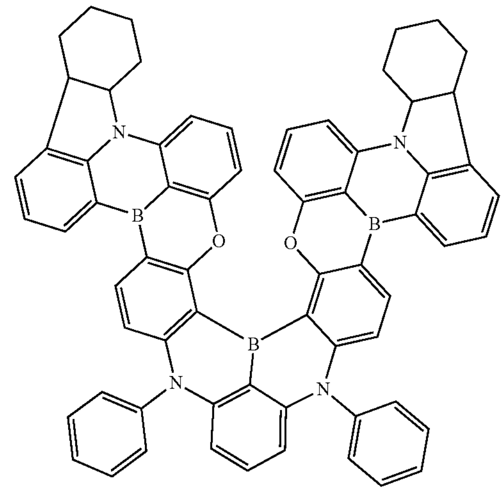
(iv-504)
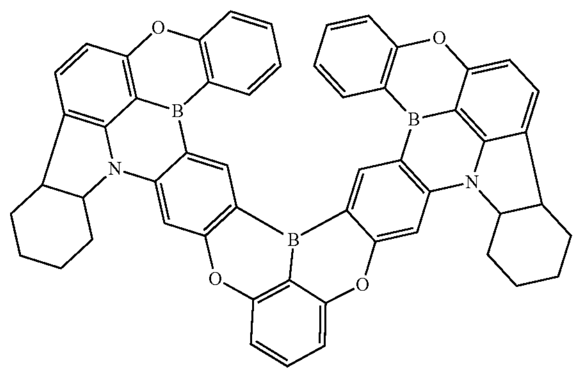
(iv-505)
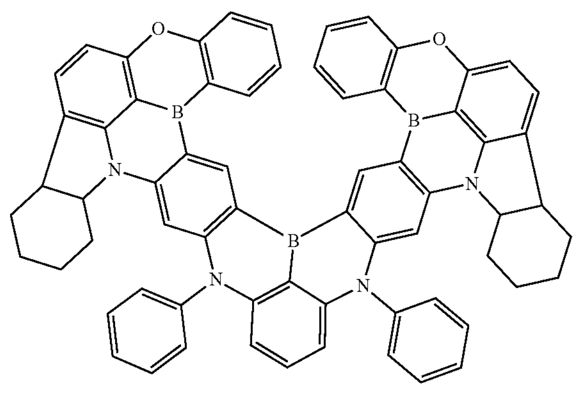

-continued
(iv-506)
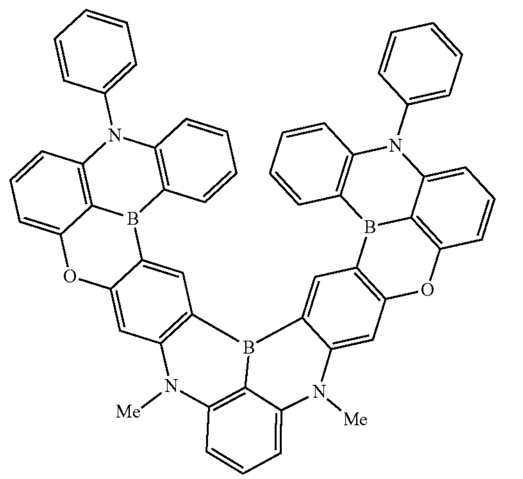
(iv-507)
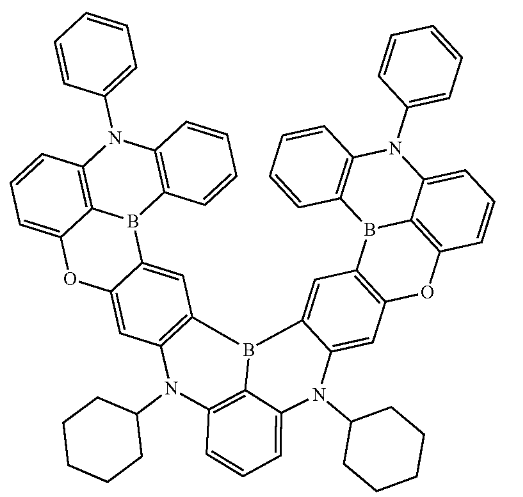
(iv-508)
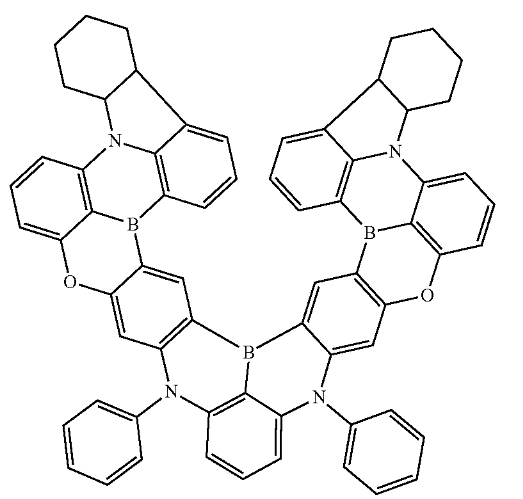
-continued
(iv-509)
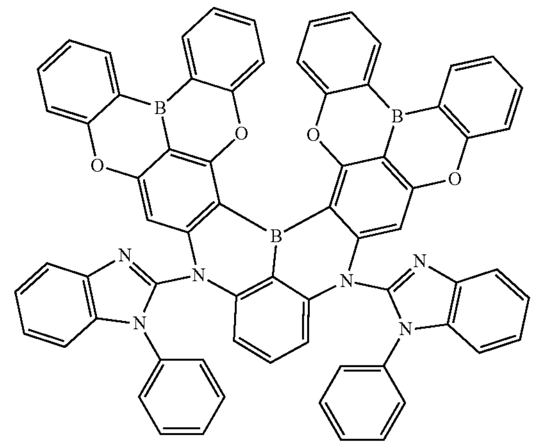
(iv-511)
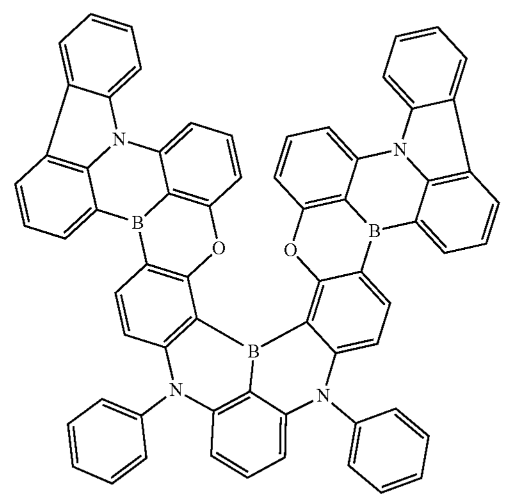
(iv-512)
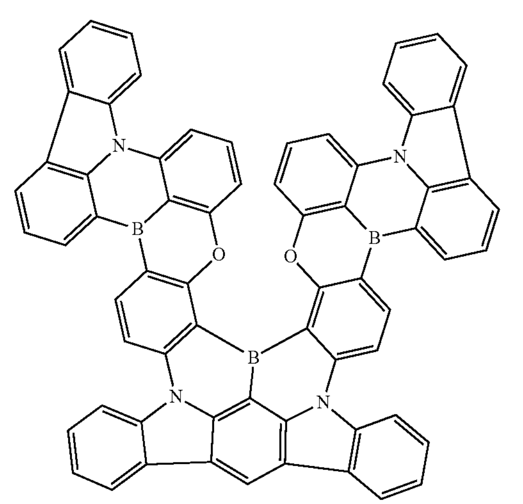

-continued
(iv-513)
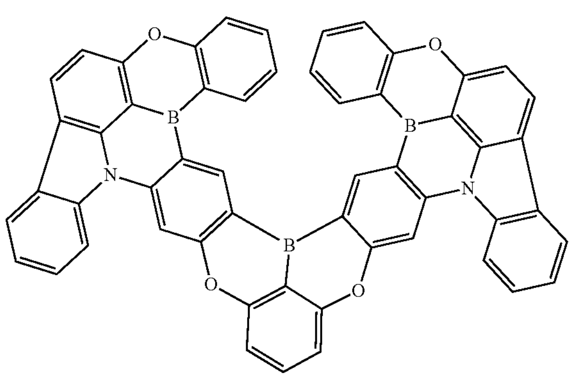
(iv-514)
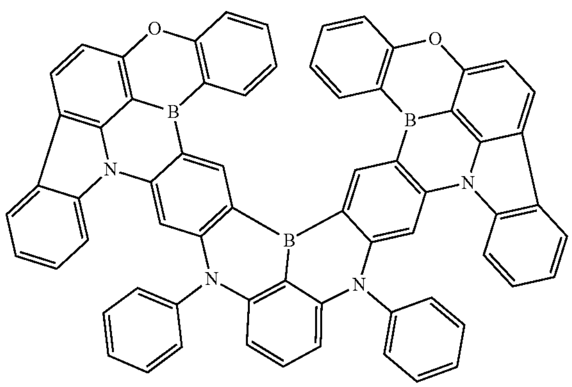
(iv-701)
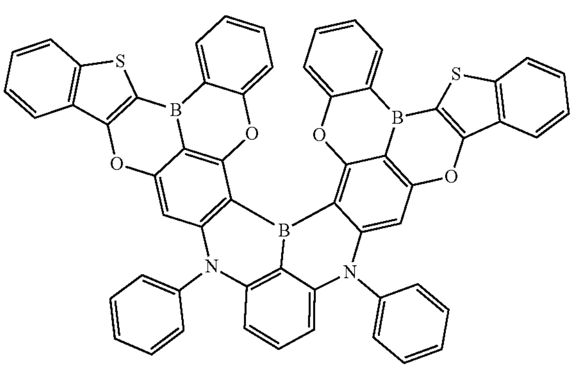
(iv-702)
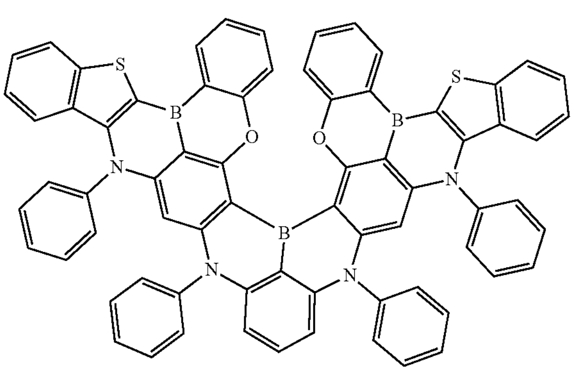
-continued
(iv-703)
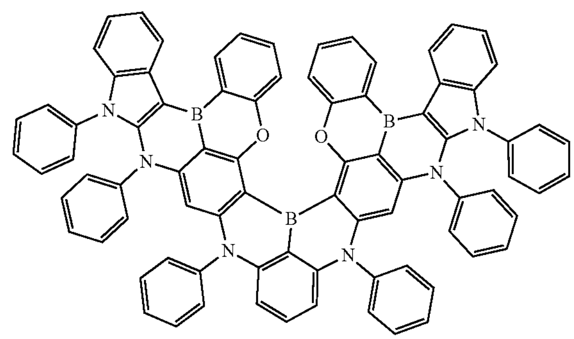
(iv-14N1)
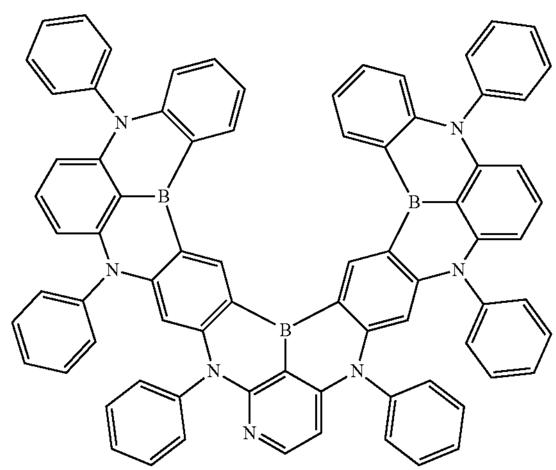
(iv-15N1)
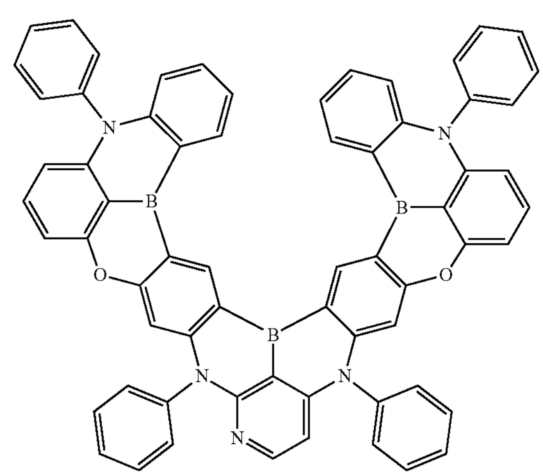

-continued
(iv-16N1)
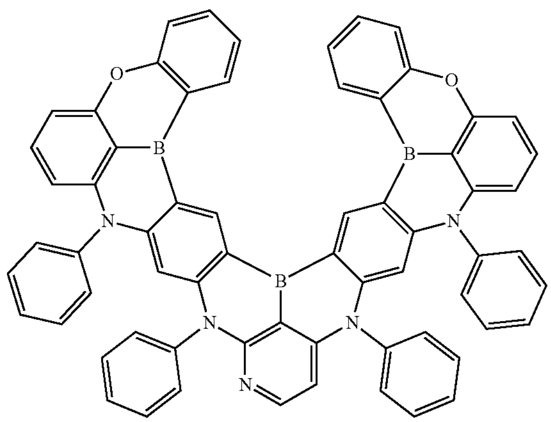
(iv-17N1)
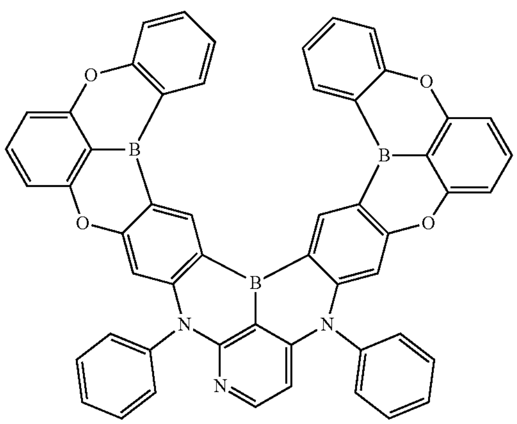
(iv-15N2)
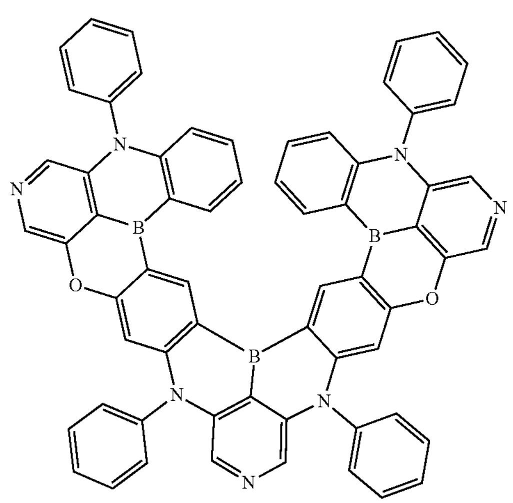
-continued
(iv-18N1)
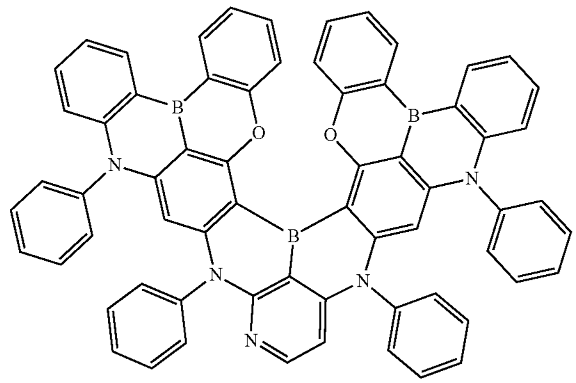
(iv-19N1)
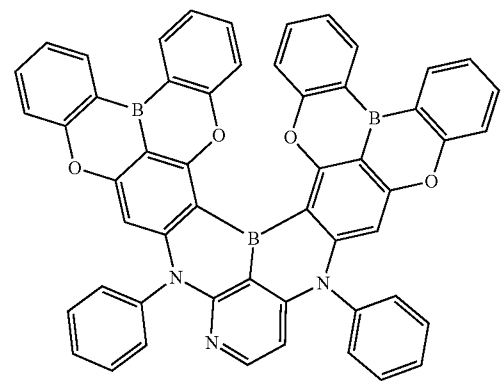
(iv-14N2)
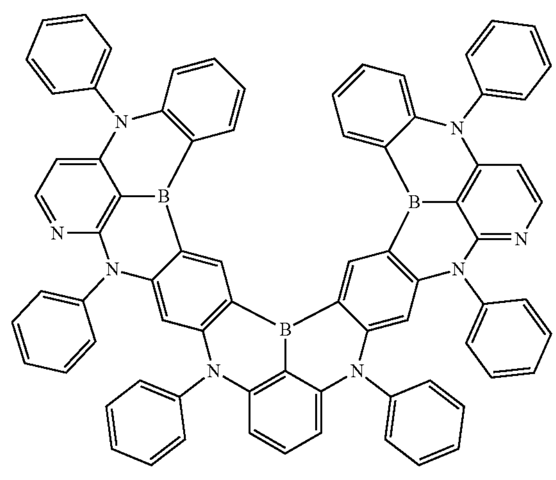

-continued
(iv-14N3)
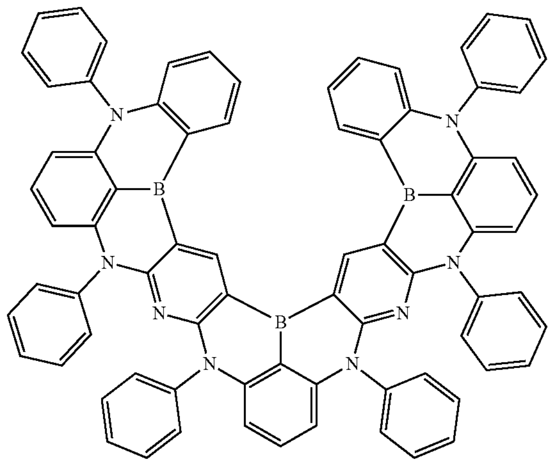
(iv-14N4)
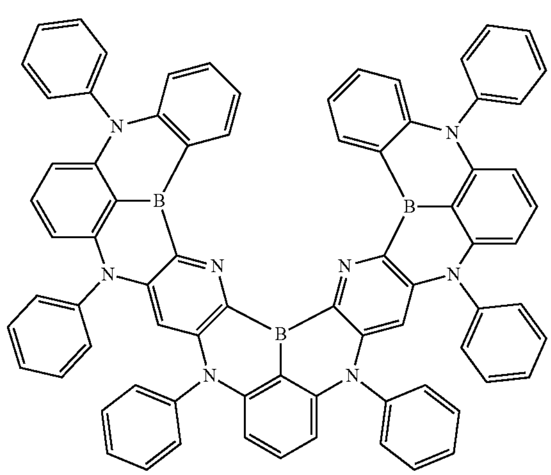
-continued
(iv-19N2)
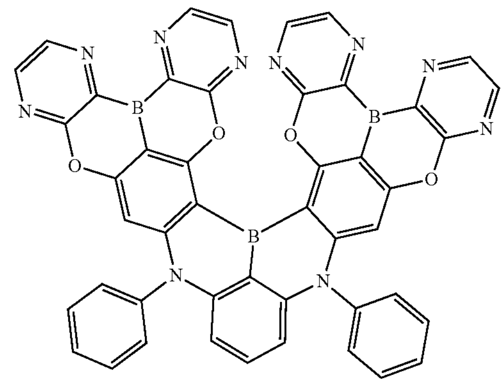
(iv-34N1)
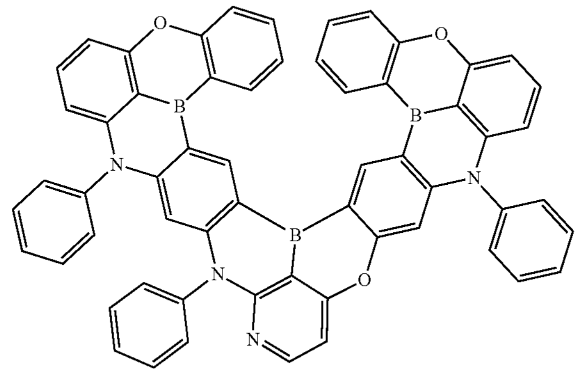
(iv-19Px)
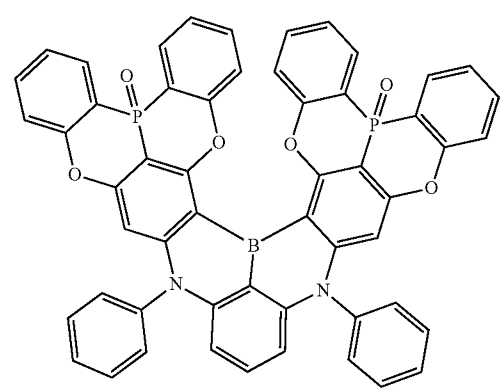
More specific examples of the polycyclic aromatic compound of the present invention include compounds represented by any one of the following structural formulas. In the following structural formulas, “Me” is methyl, “tBu” is t-butyl, and “D” is deuterium.

(v-17-1)
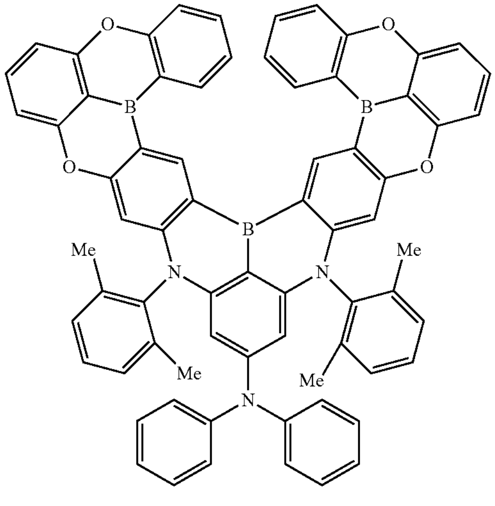
(v-17-2)
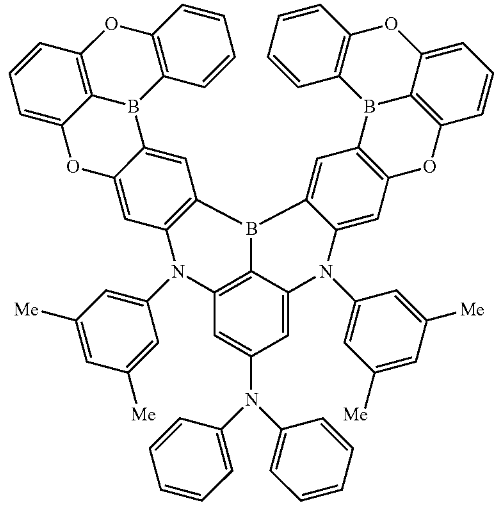
(v-17-3)
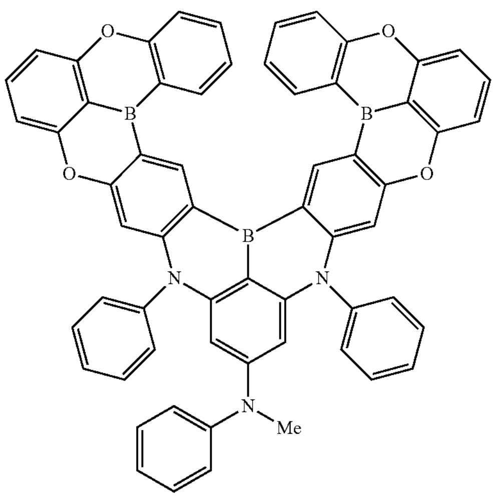
(v-17-4)
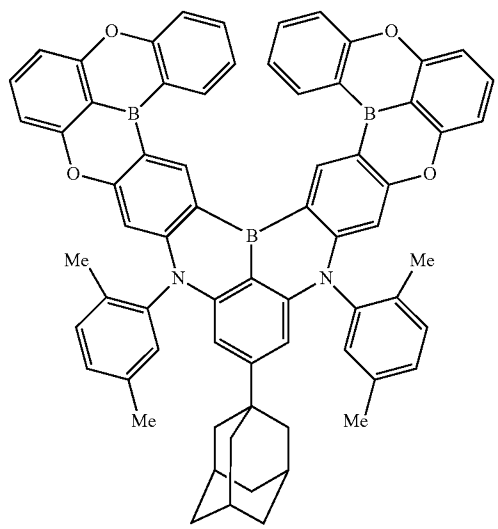
(v-17-5)
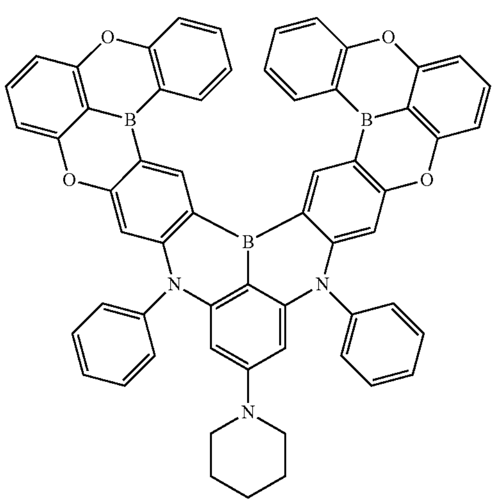
(v-17-6)
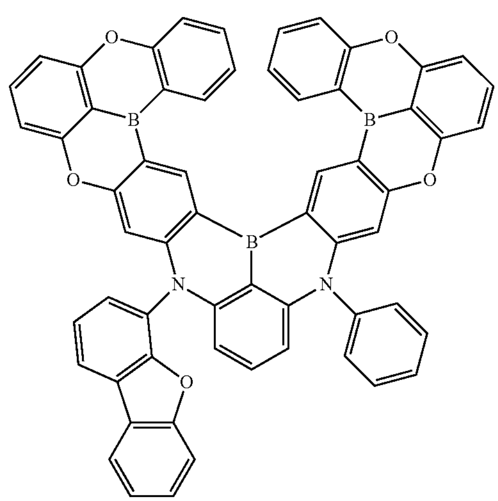

-continued
(v-17-7)
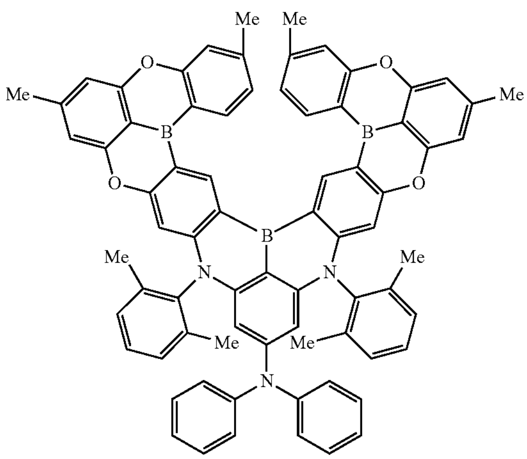
(v-16-1)
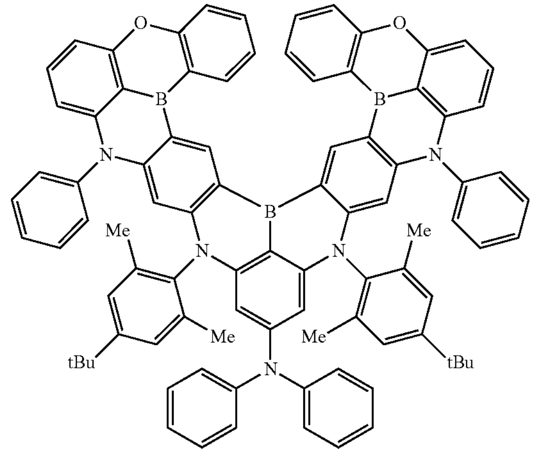
(v-16-2)
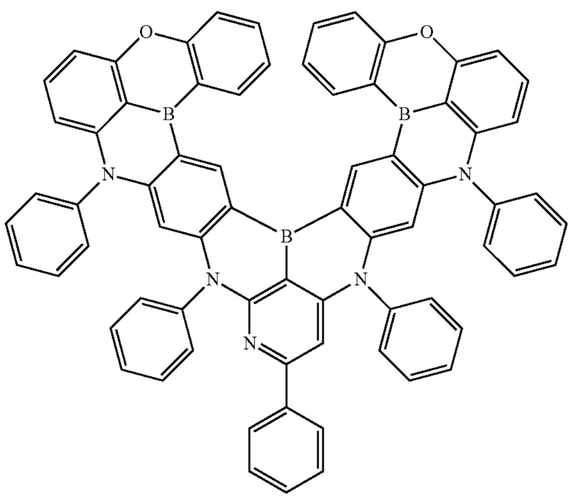
(v-16-3)
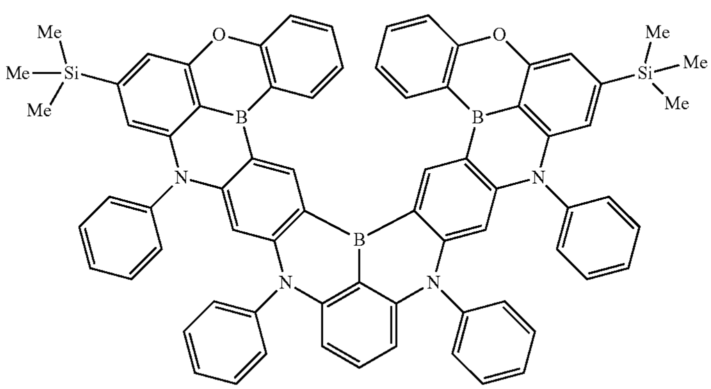

-continued
(v-15-1)
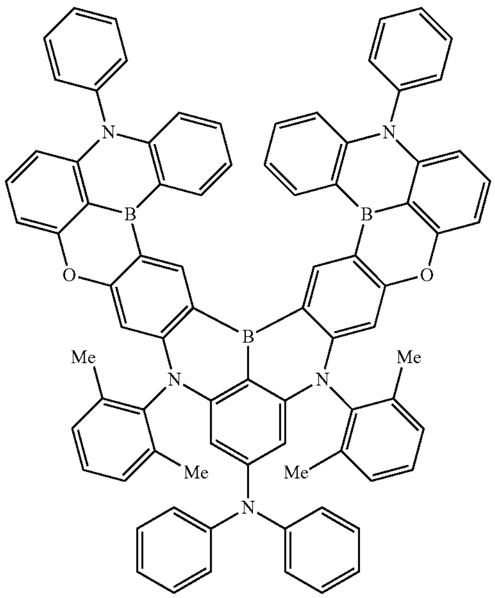
(v-15N1-1)
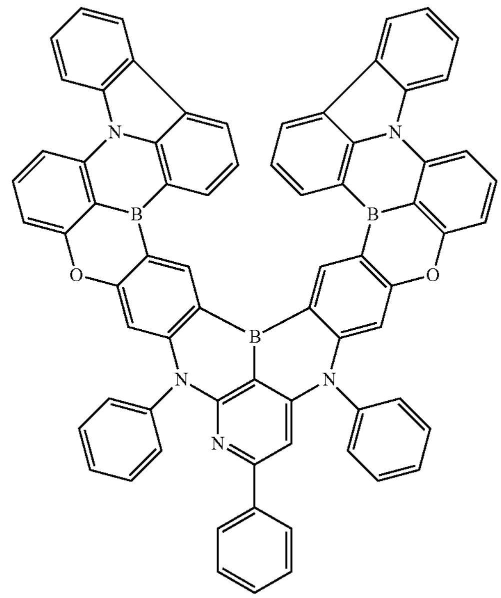
(v-19-1)
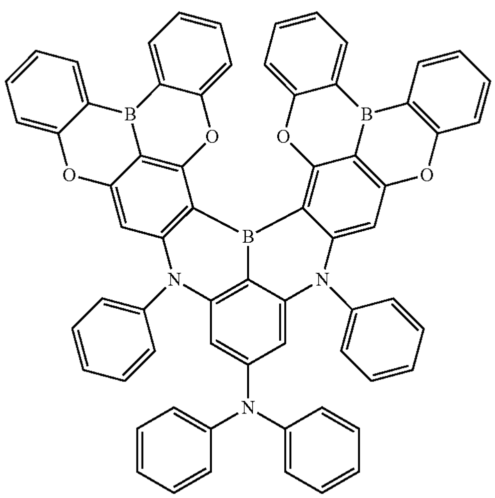
(v-19-2)
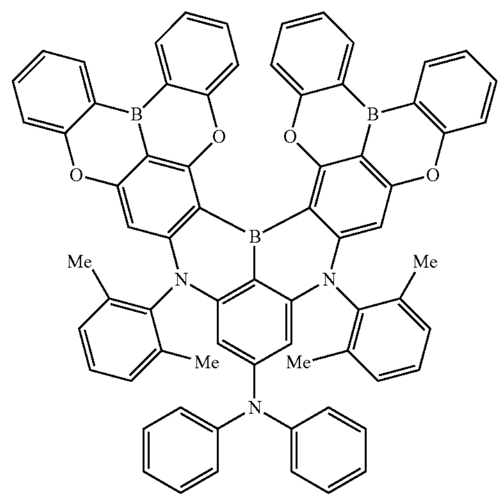
(v-19-3)
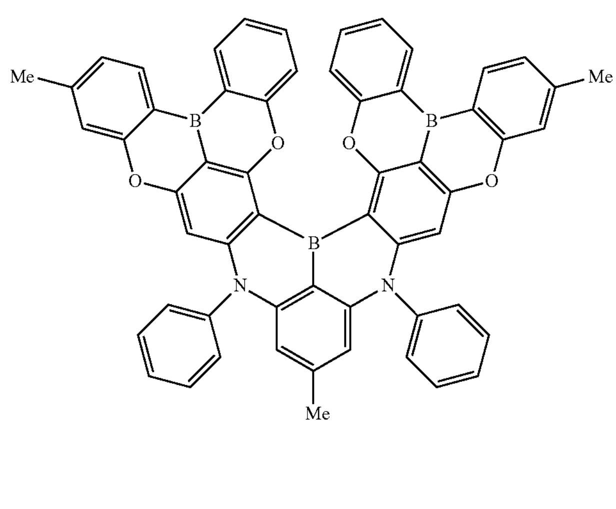

-continued
(v-19-4)
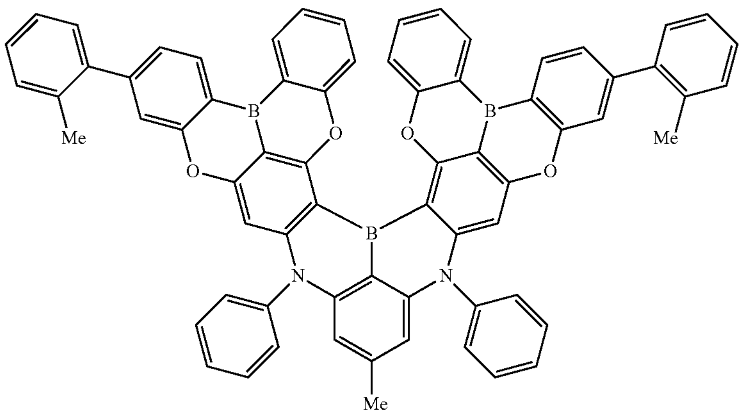
(v-19-5)
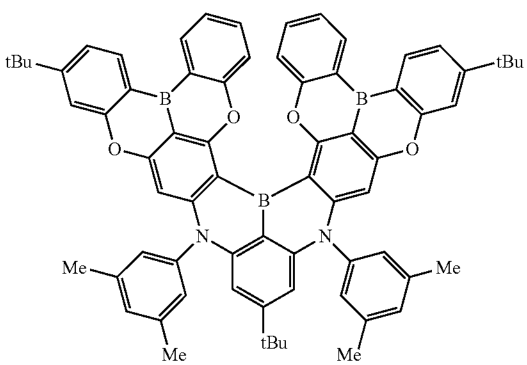
(v-19-6)
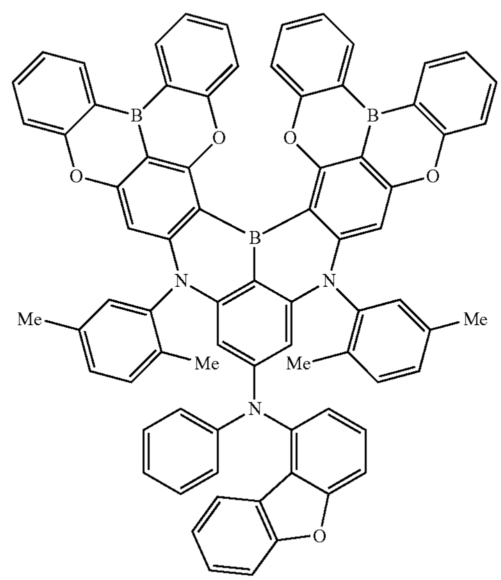
(v-19-7)
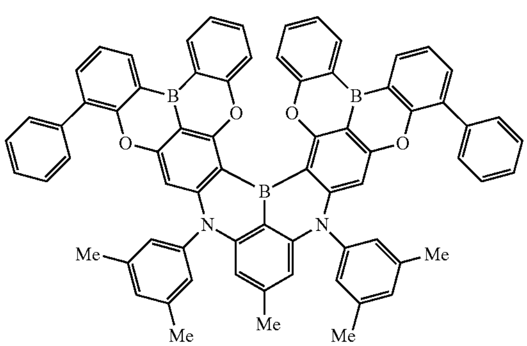
(v-19-8)
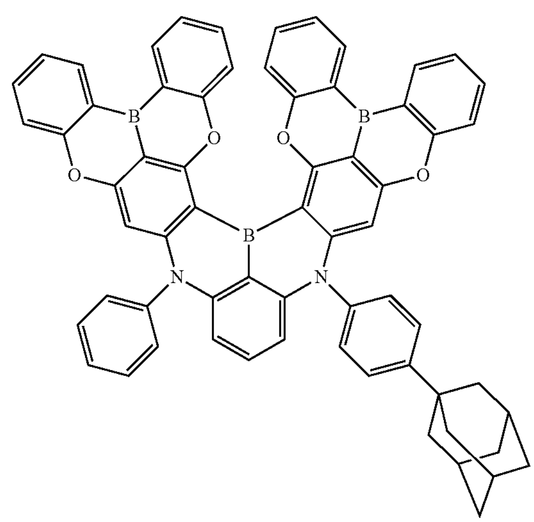

-continued
(v-19-9)
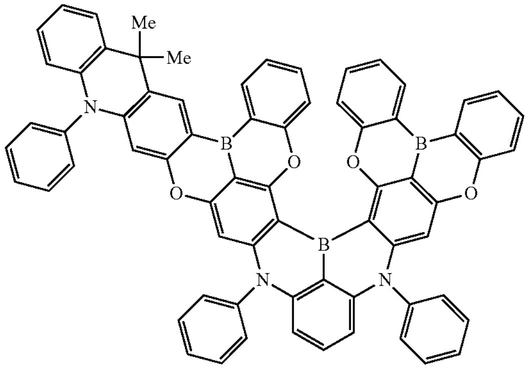
(v-19-10)
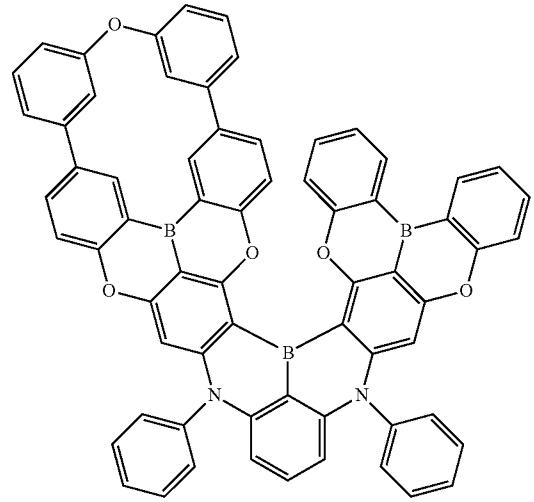
(v-19-11)
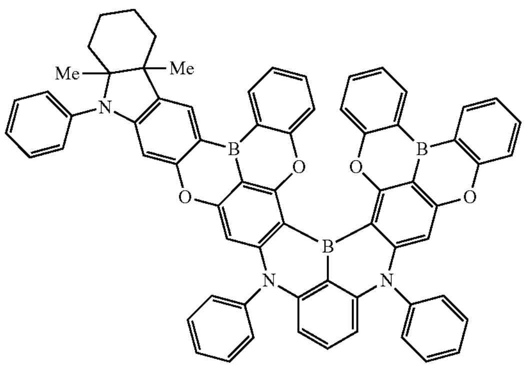
(v-19-12)
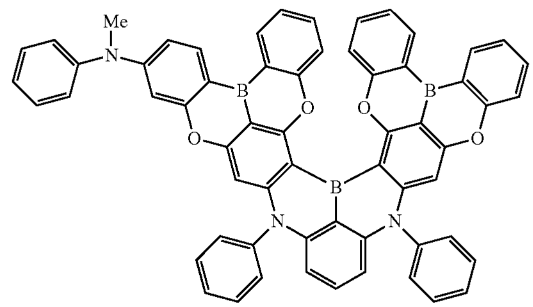
(v-19-13)
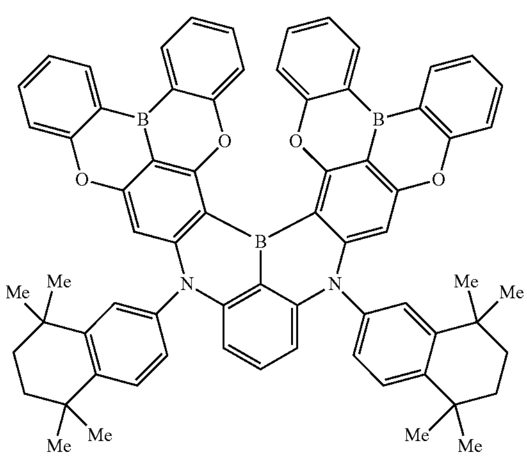
(v-19-14)
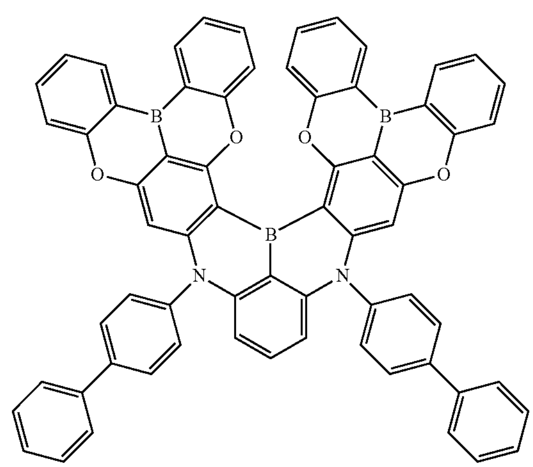

-continued
(v-19-15)
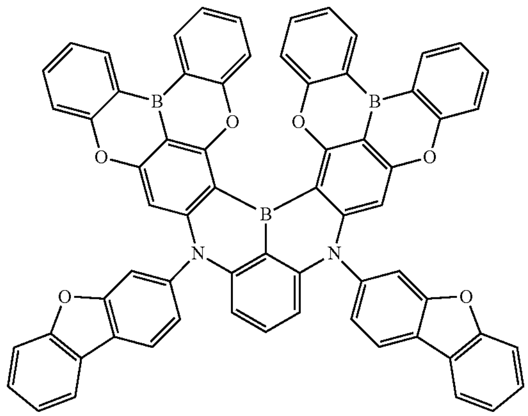
(v-10-16)
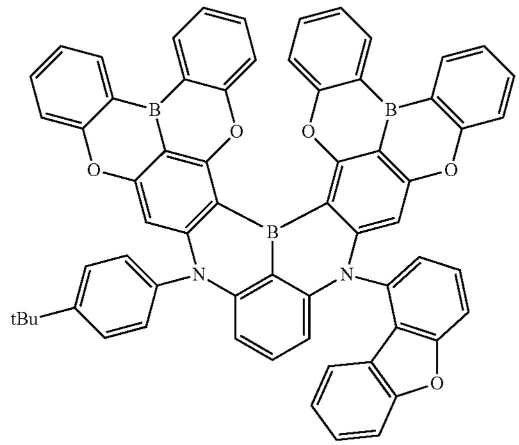
(v-19-17)
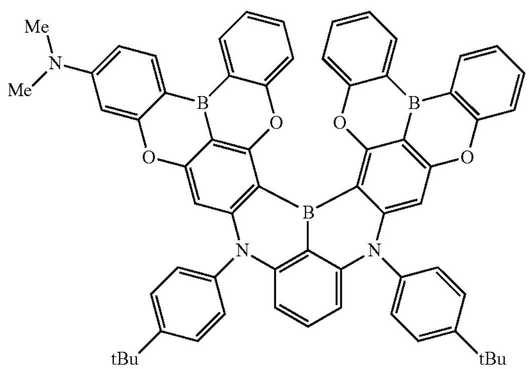
(v-19-18)
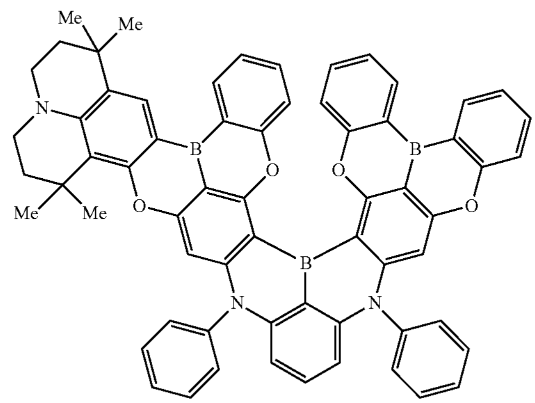
(v-19-19)
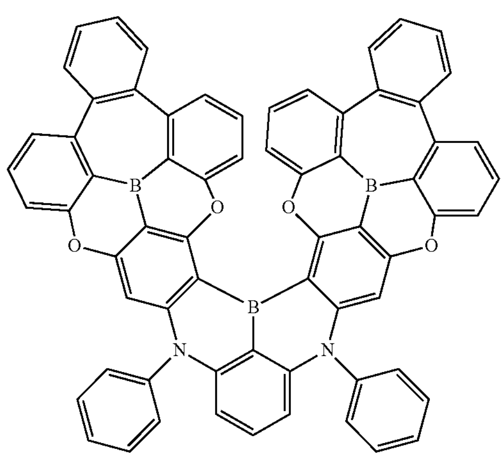

-continued
(v-19-20)
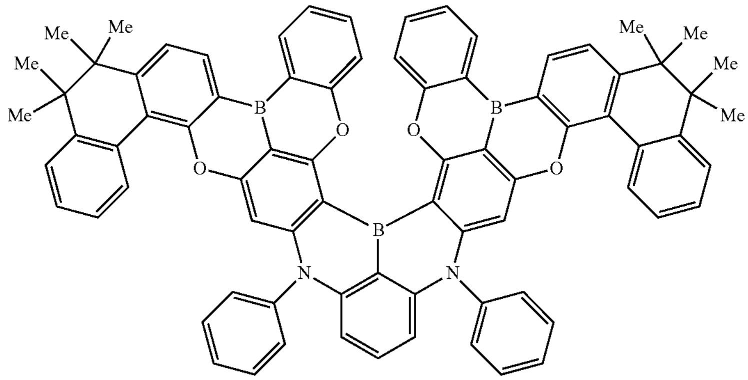
(v-19-21)
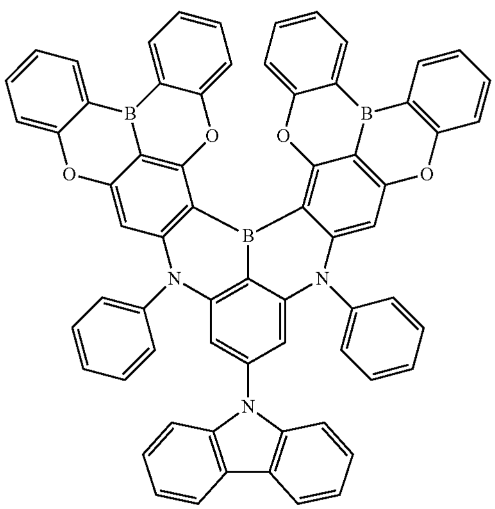
(v-19-22)
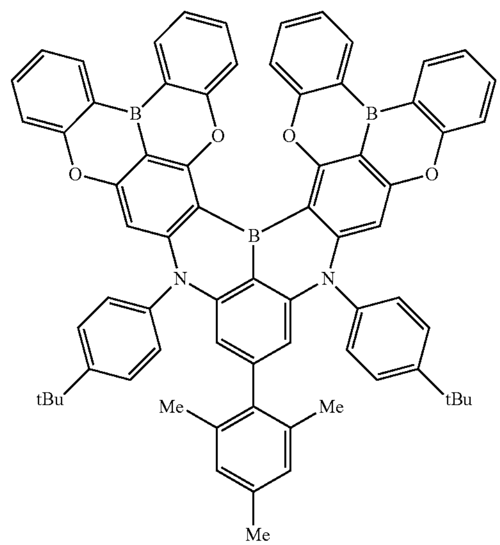
(v-19-23)
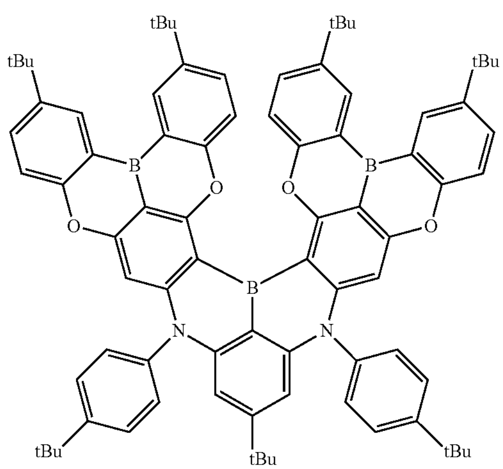

-continued
(v-19-24)
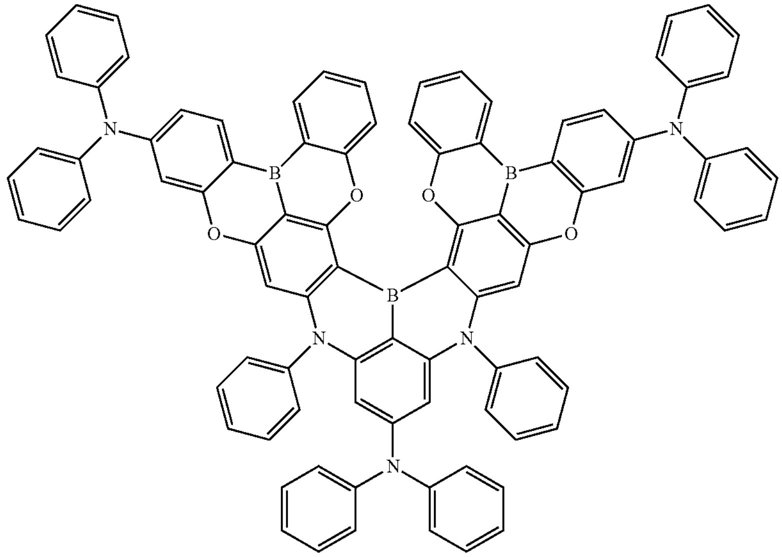
(v-19-25)
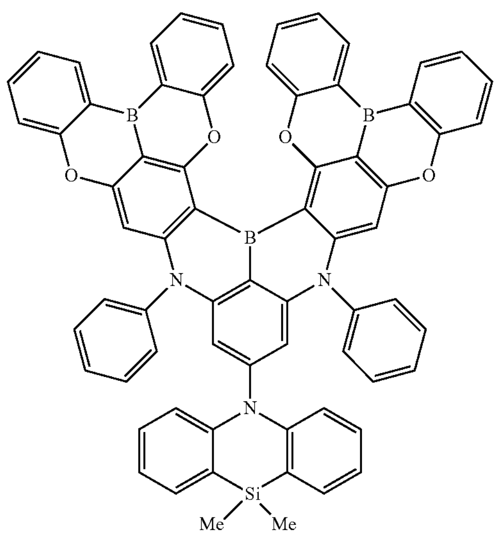
(v-19-26)
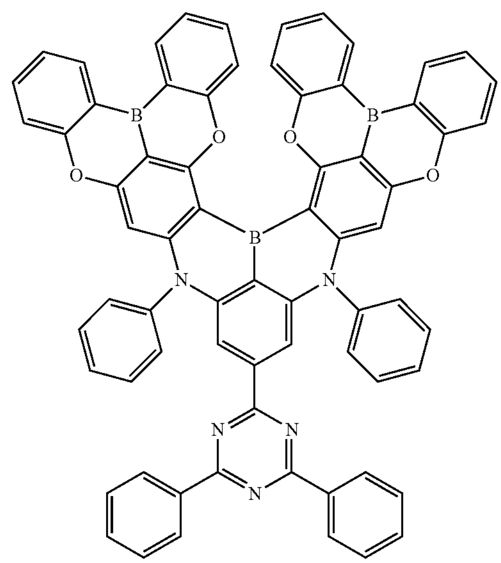
(v-19-27)
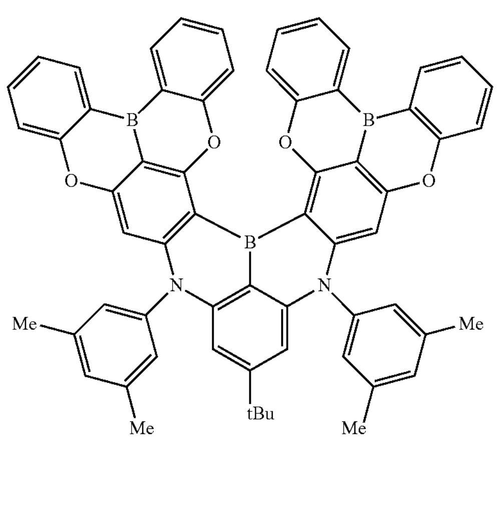
(v-19-28)
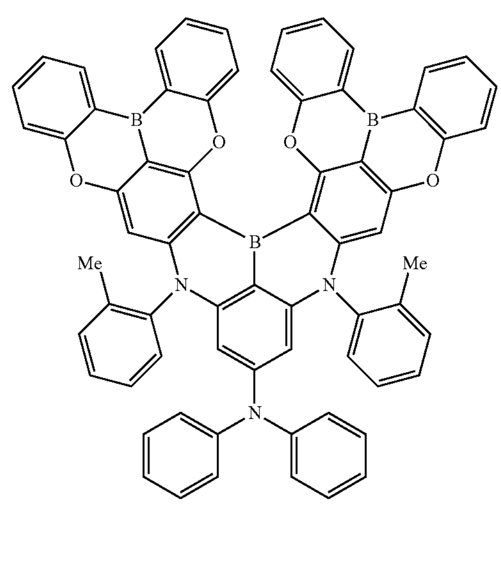

-continued
(v-20-1)
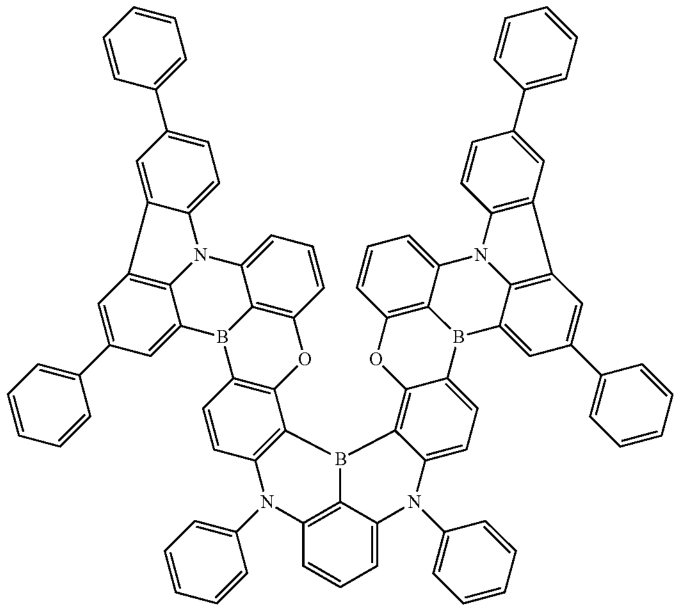
(v-20-2)
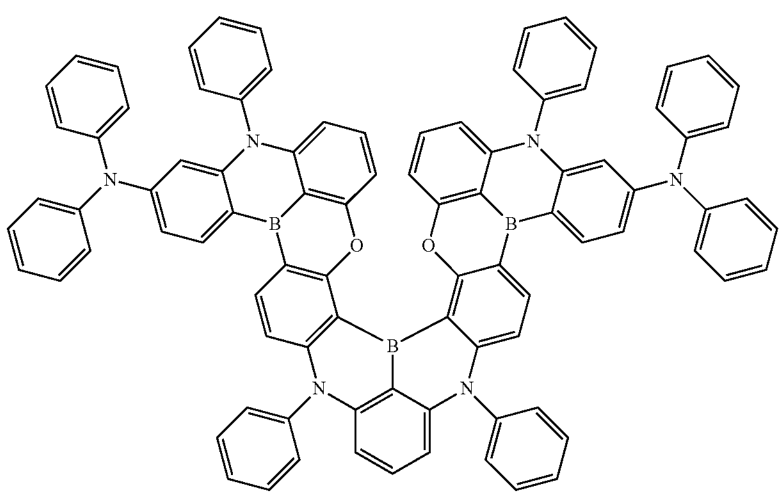

-continued
(V-20-3)
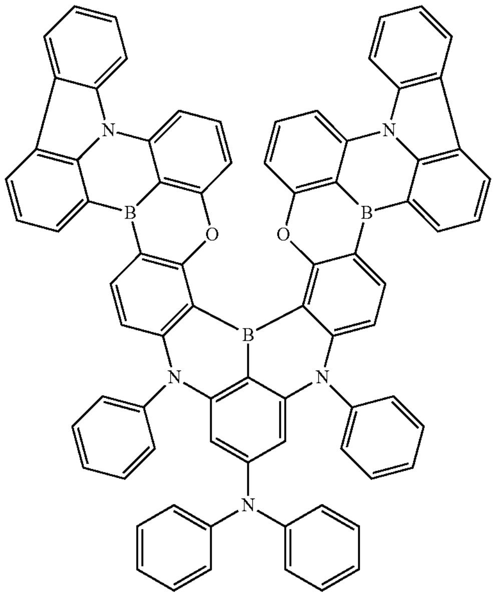
(V-20-4)
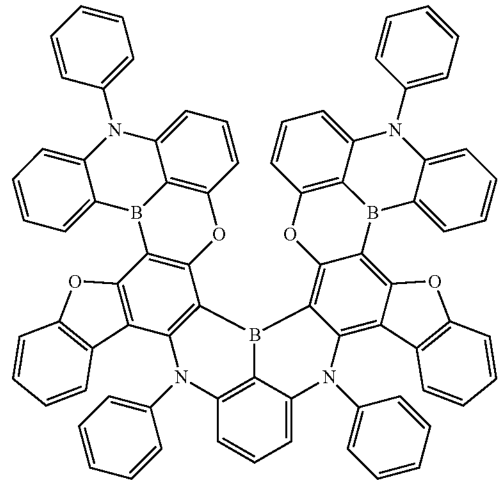
(V-21-1)
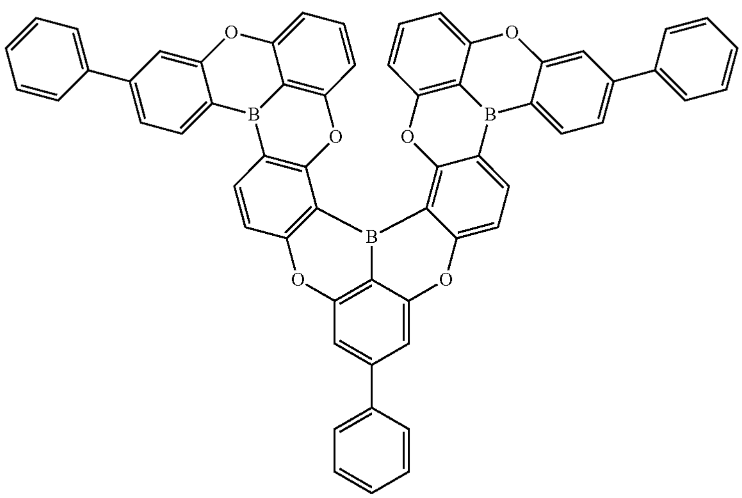
(v-35-1)
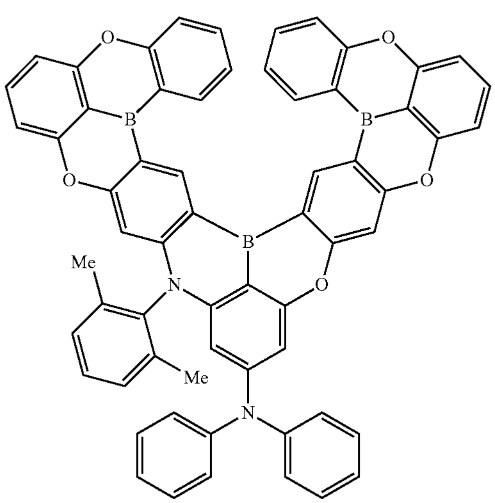
(v-35-2)
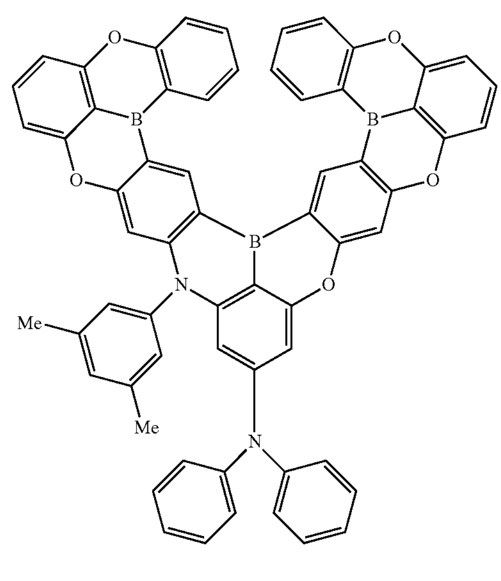

-continued
(v-36-1)
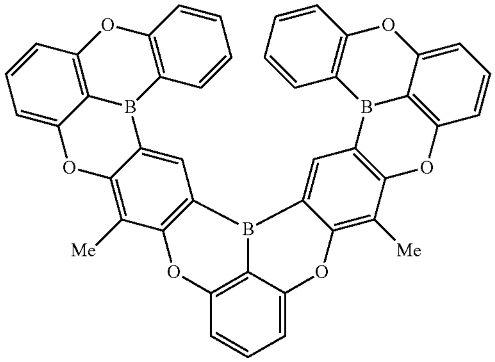
(v-36-2)
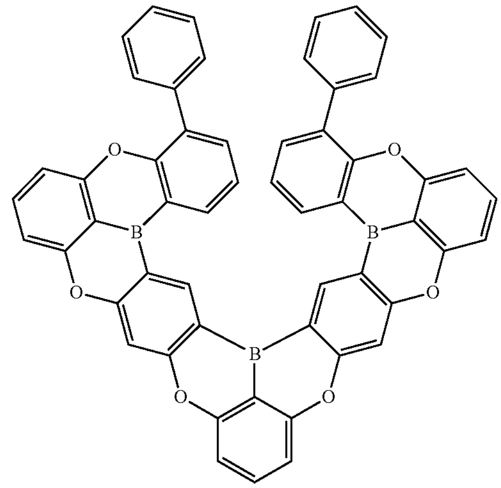
(v-37-1)
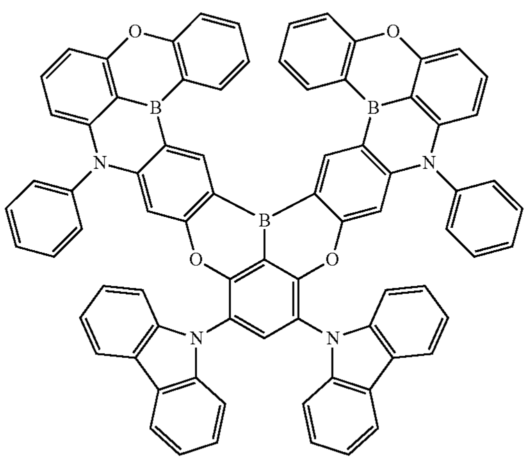
(v-37-2)
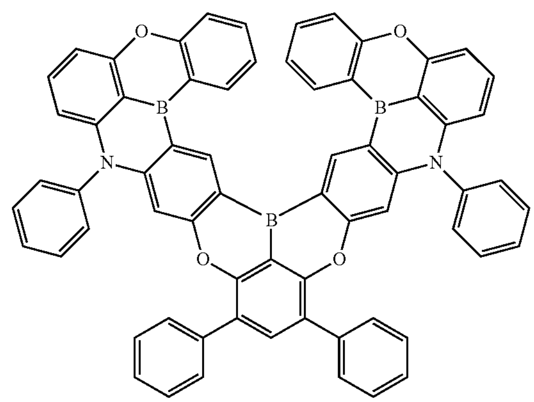
(v-23-1)
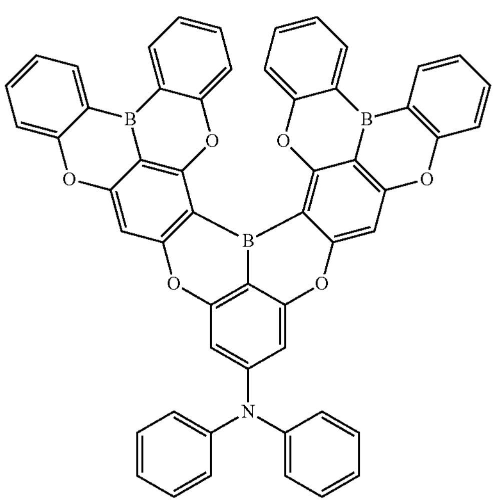
(v-23-2)
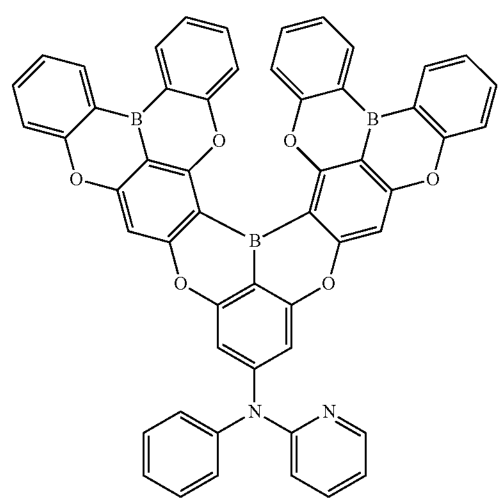

-continued
(v-34N1-1)
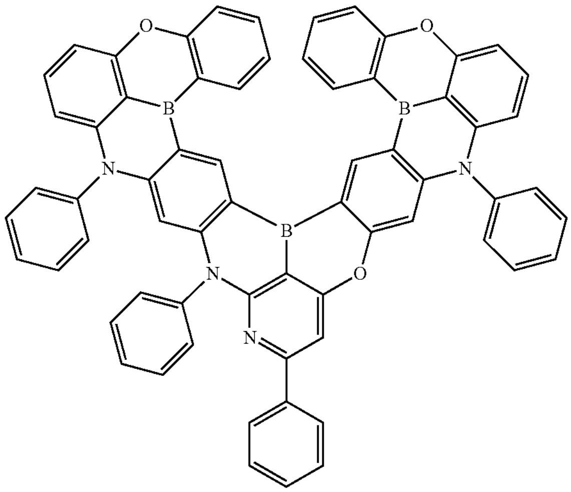
(v-19-27)
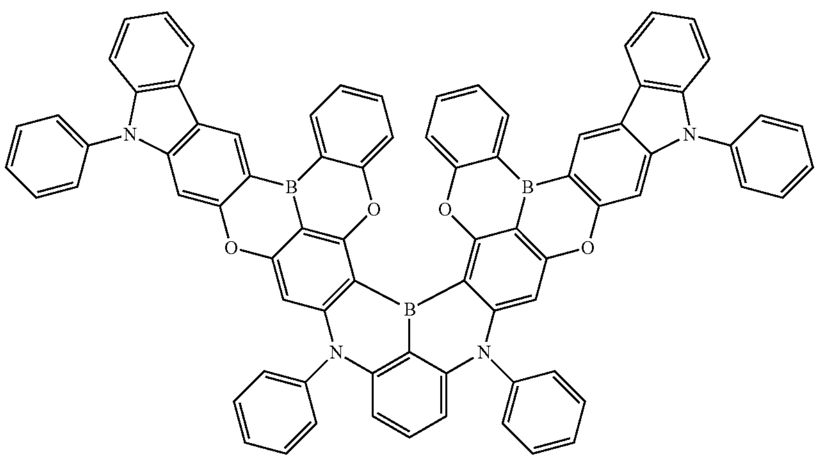
(v-19-28)
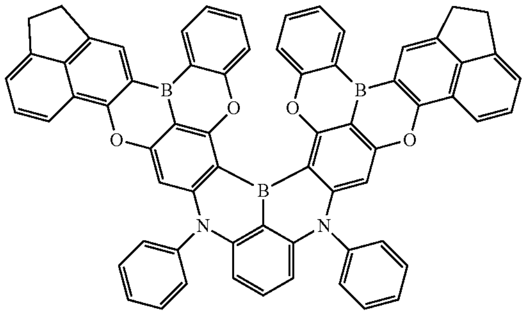
(v-19-29)
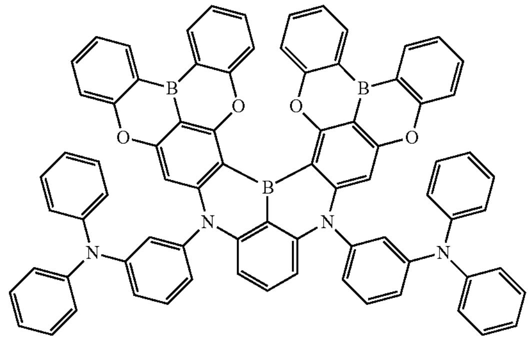

-continued
(v-19-30)
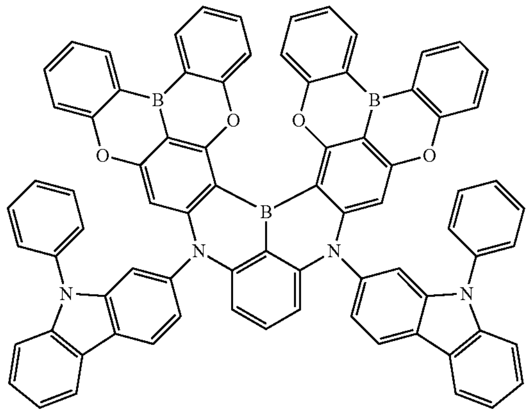
(v-19-31)
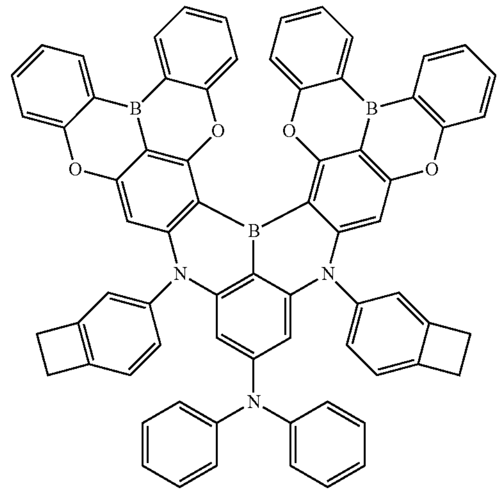
(v-19-32)
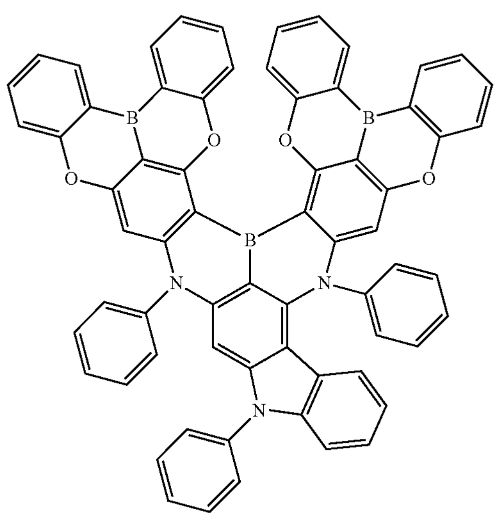
(v-19-33)
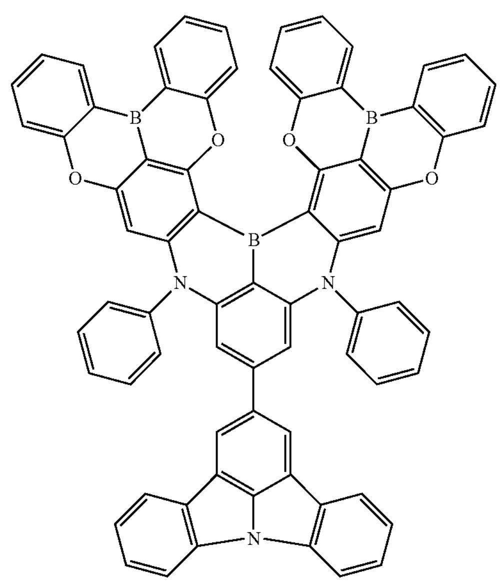

-continued
(v-19-34)
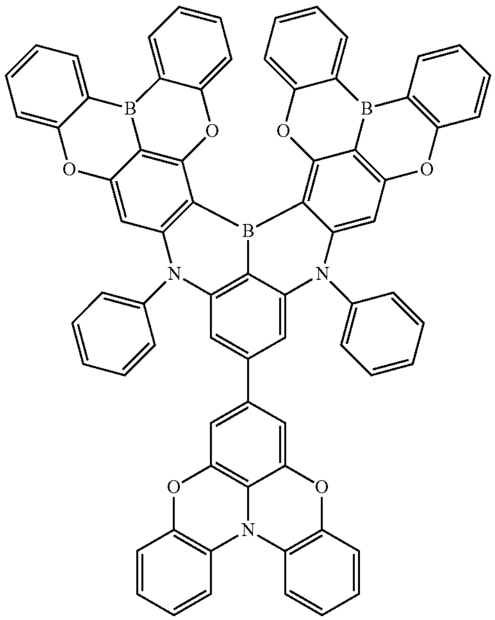
(v-19-35)
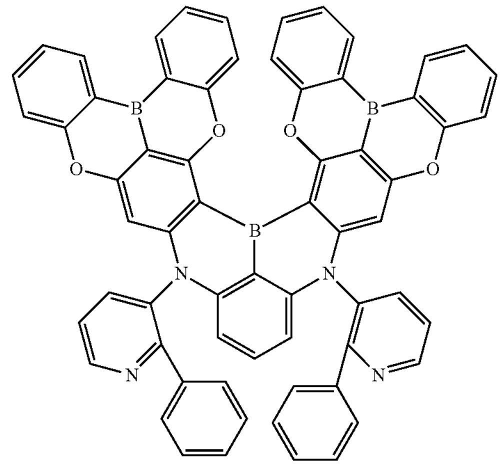
(v-19-36)
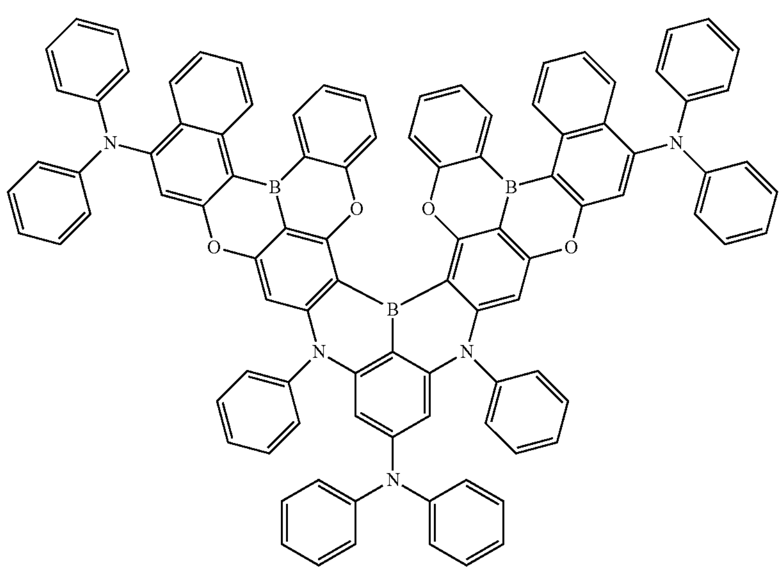

-continued
(v-19-37)
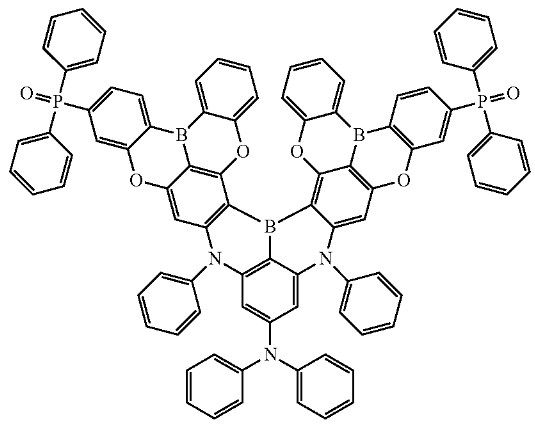
(v-19-38)
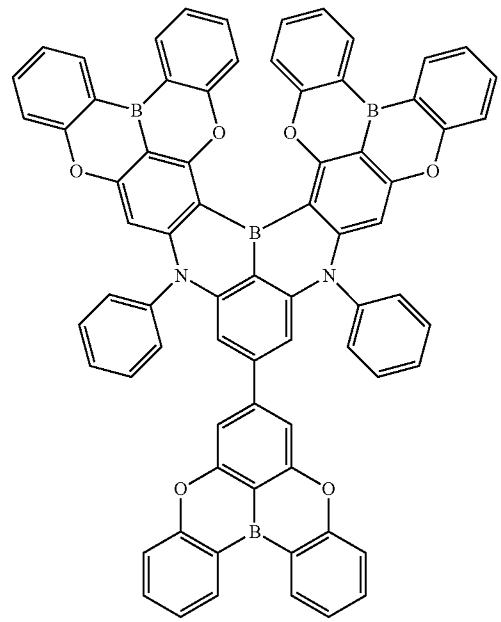
(v-19-39)
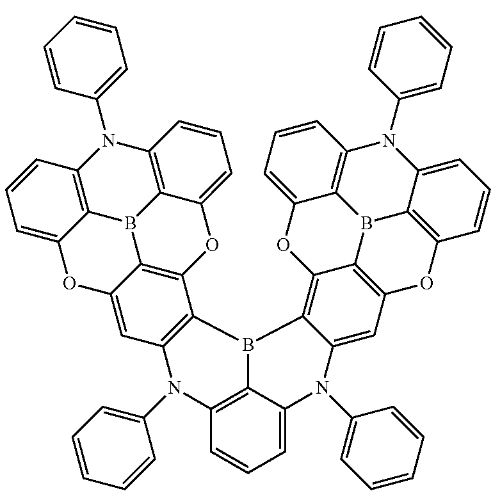
(v-19-40)
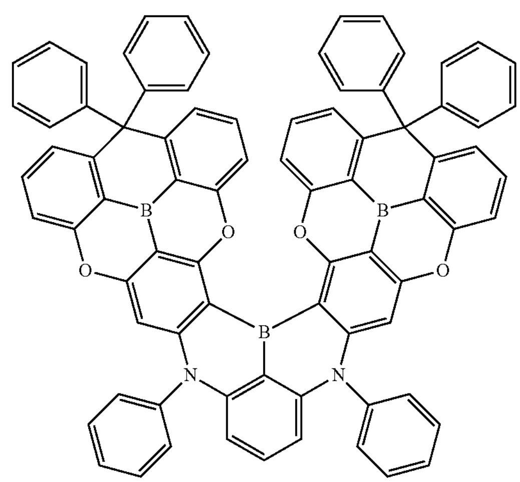

-continued
(v-19-41)
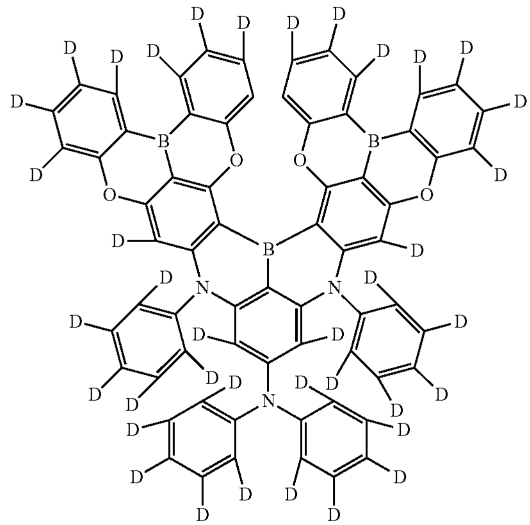
(v-19-42)
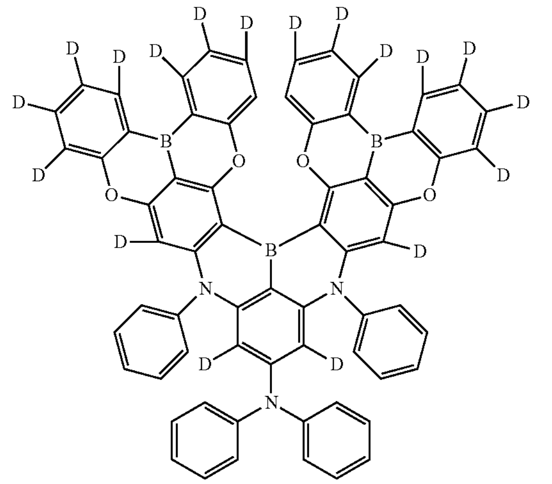
(v-19-43)
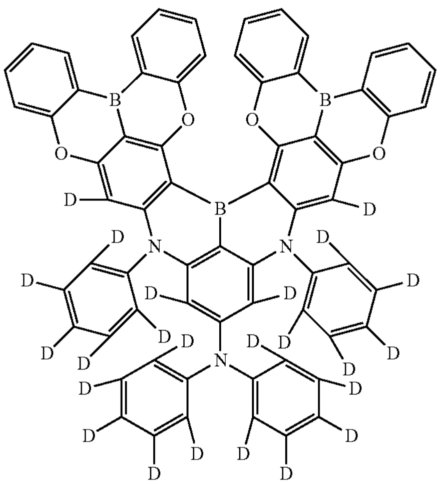
(v-19-44)
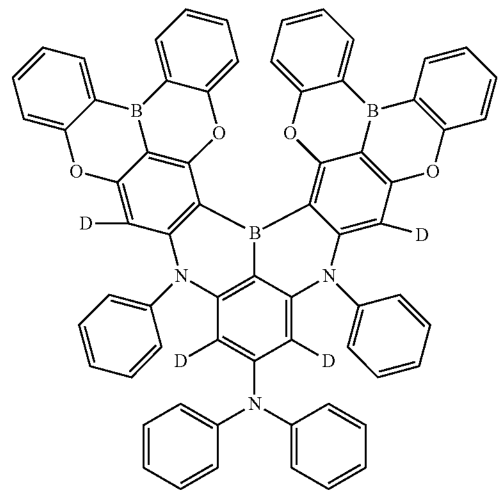
(v-19-45)
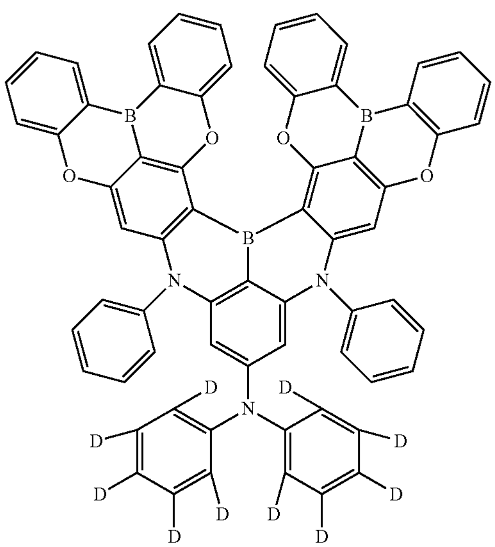
(v-19-46)
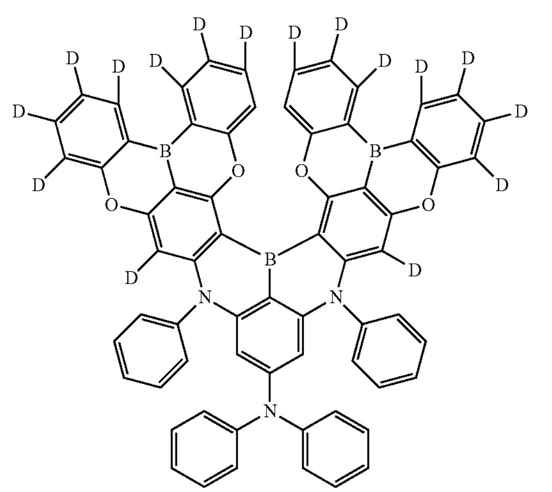

(v-19-47)
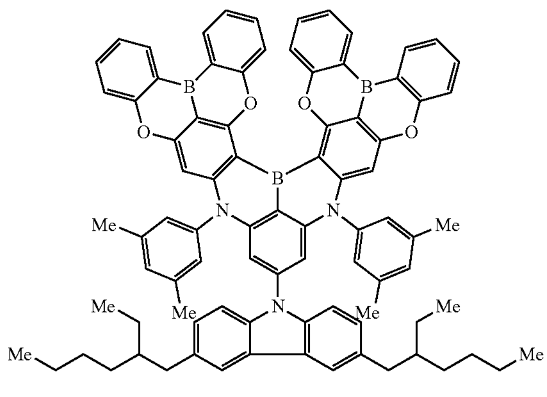
(v-19-48)
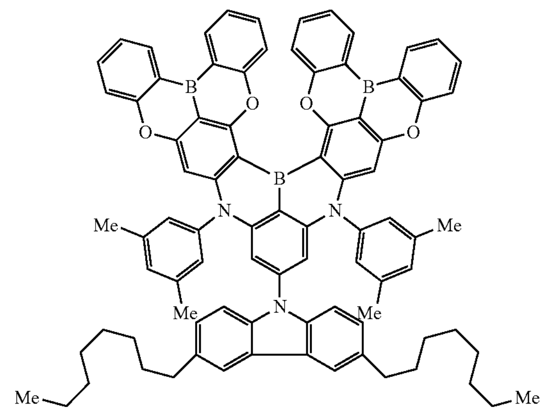
(v-19-49)
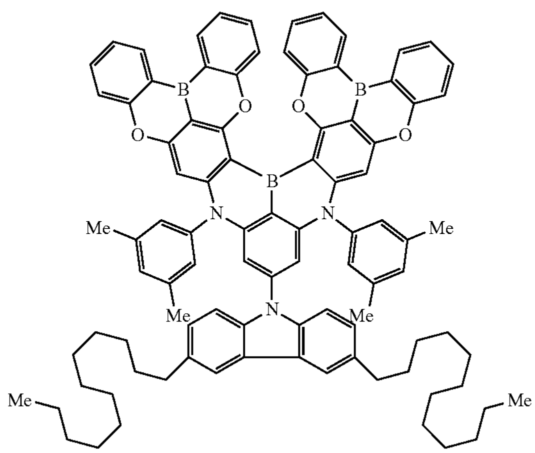
(V-19-50)
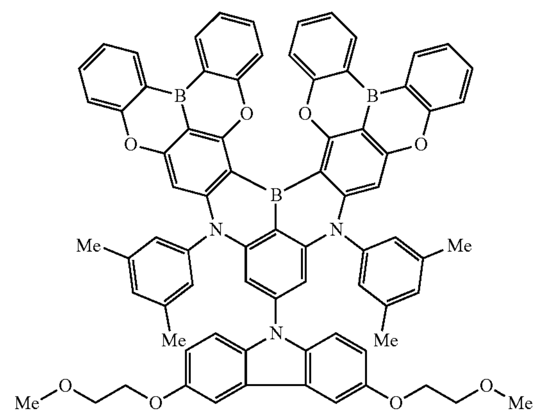
(v-19N1-1)
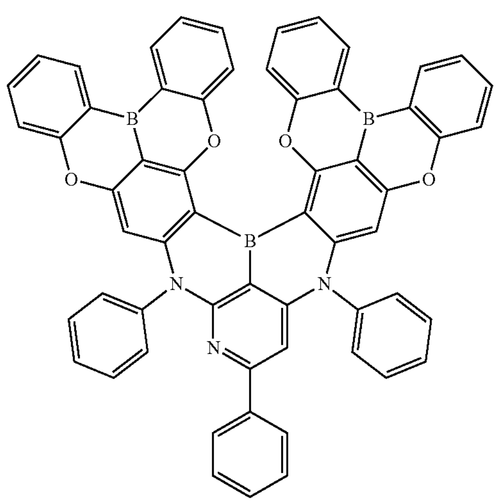
(V-19N1-2)
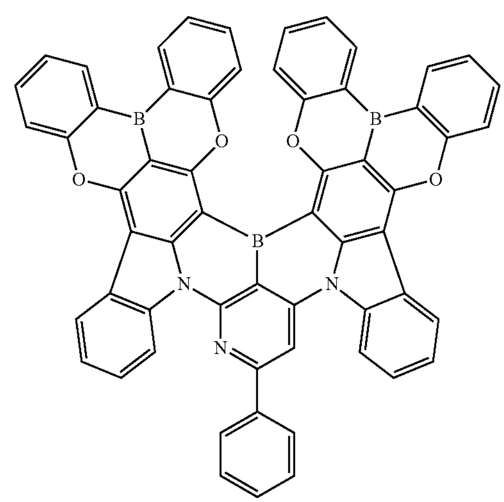

-continued
(v-23-1)
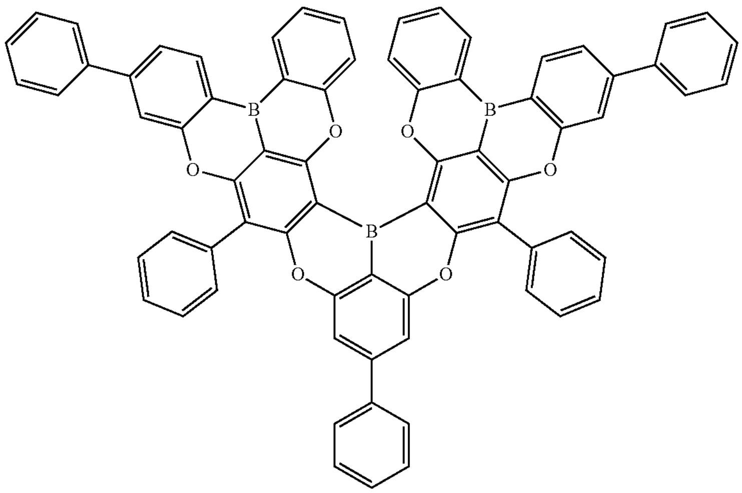
(V-501-1)
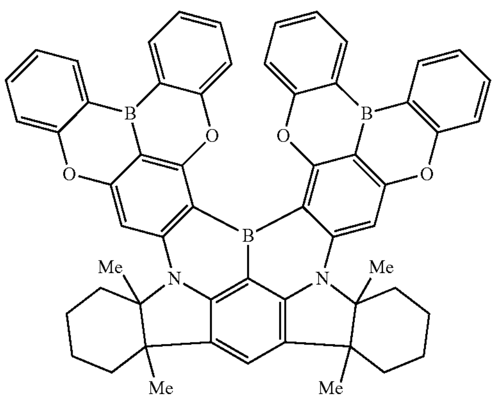
(v-503-1)
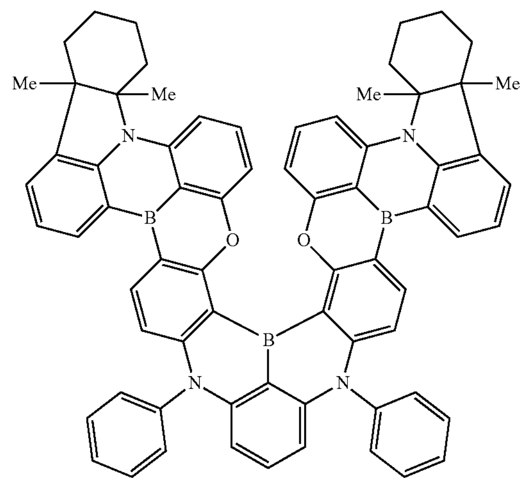
(v-504-1)
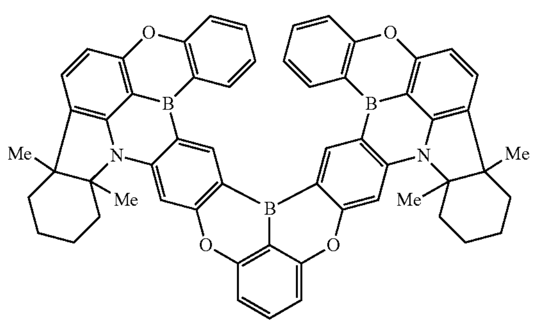
(v-505-1)
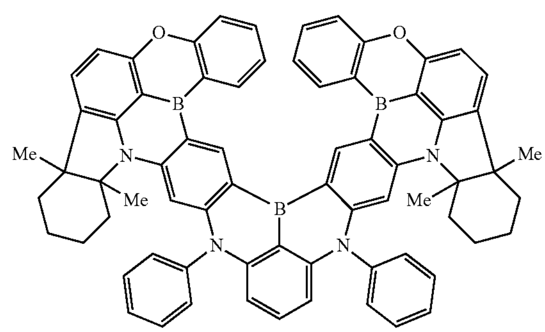

-continued
(v-507-1)
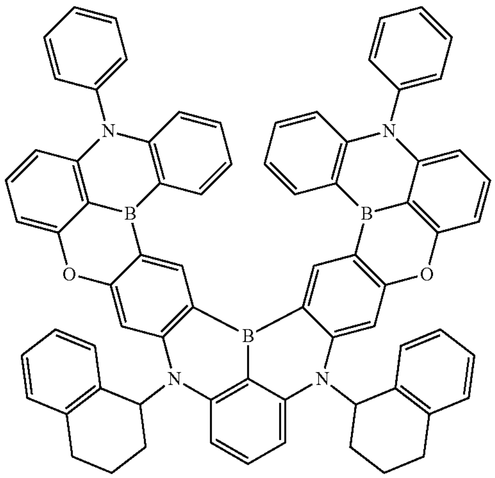
(v-18-1)
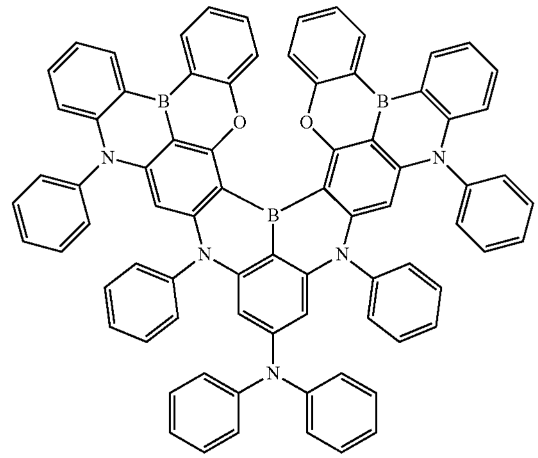
(v-18-2)
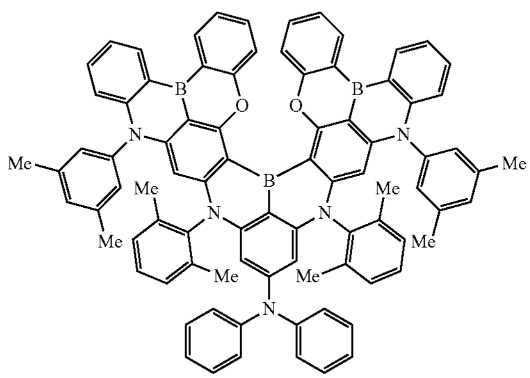
(v-18-3)
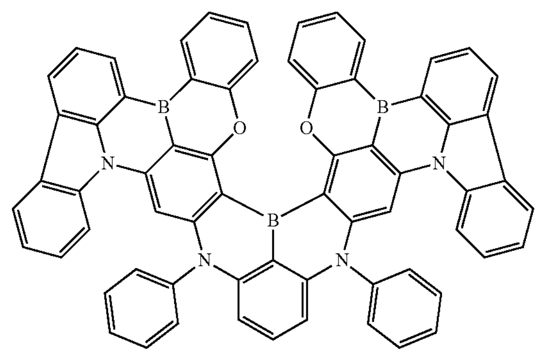
(v-18-4)
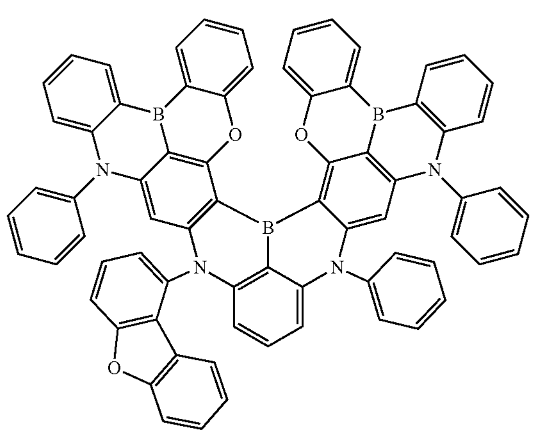
(v-18-5)
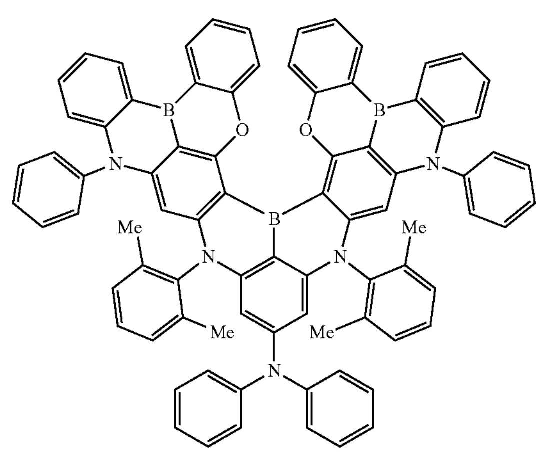

-continued
(v-18-6)
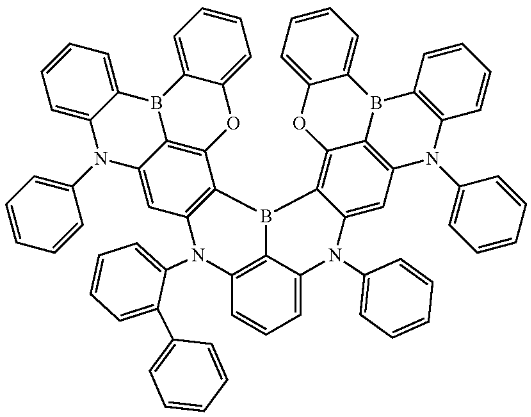
(v-18-7)
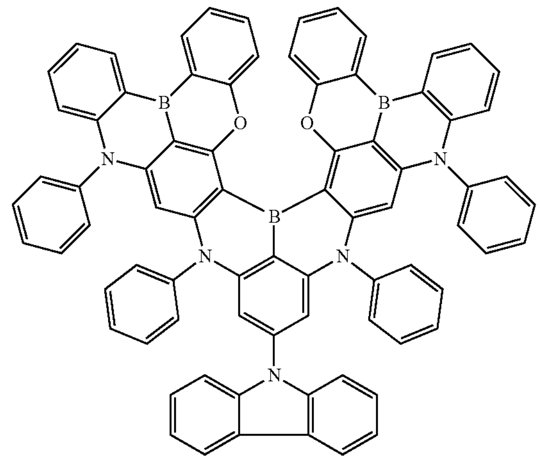
(v-18-8)
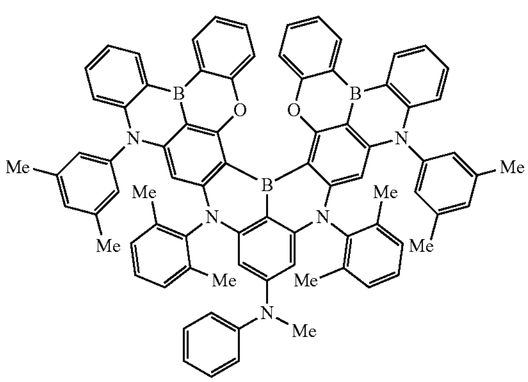
(v-18-9)
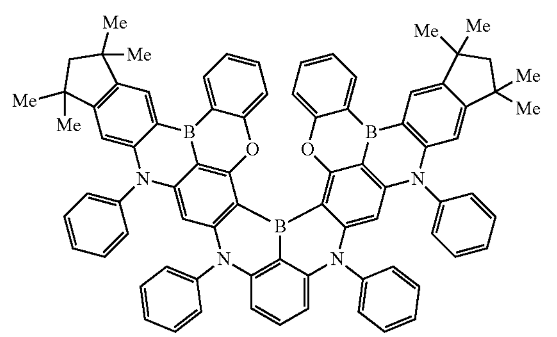
(v-18-10)
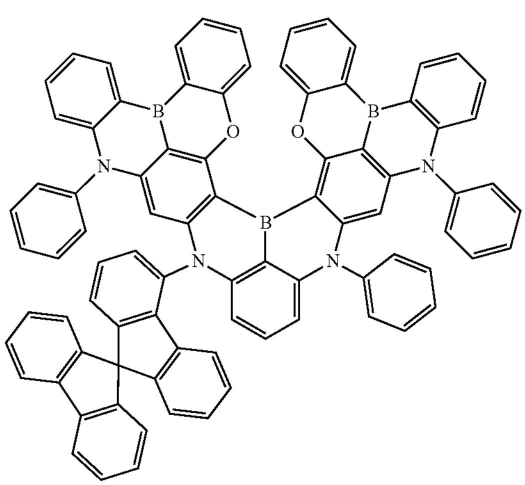

-continued
(v-18-11)
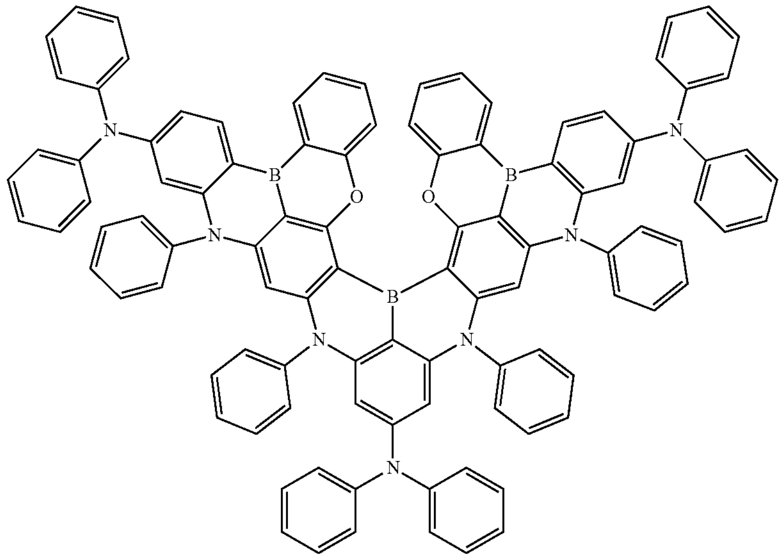
(v-18-12)
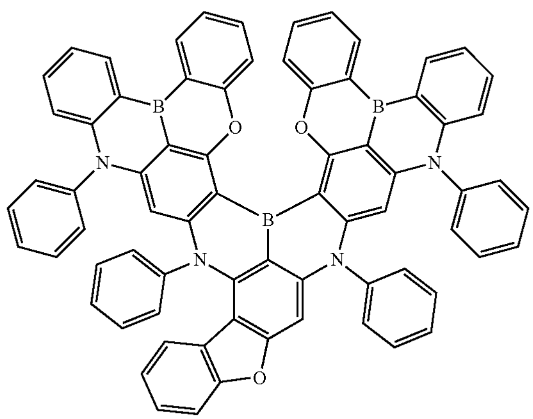
(v-21-1)
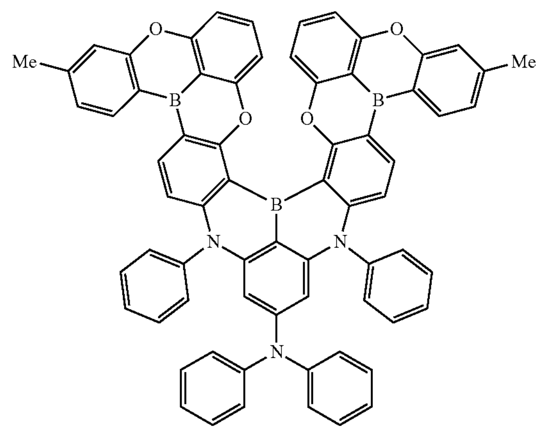
(V-21-2)
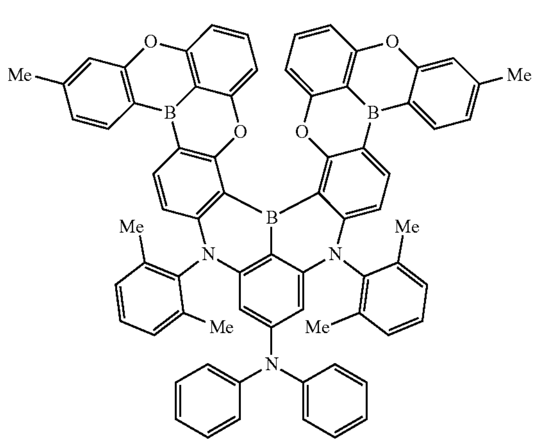

-continued
(v-21-3)
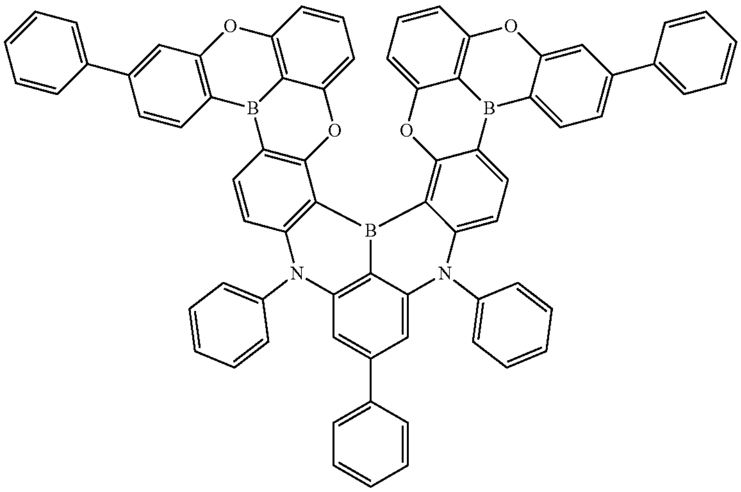
(v-21-4)
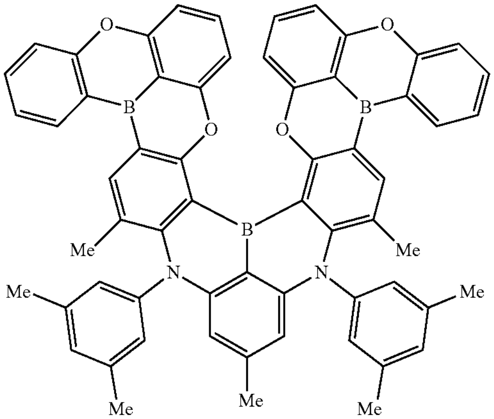
(v-21-5)
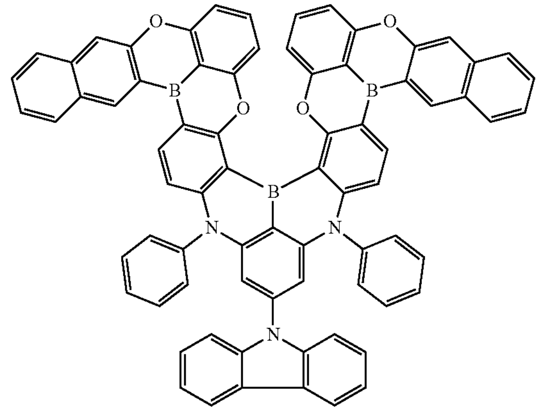
(v-21-6)
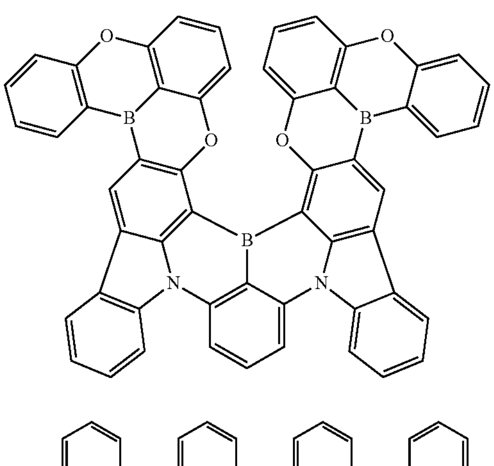
(vi-1)
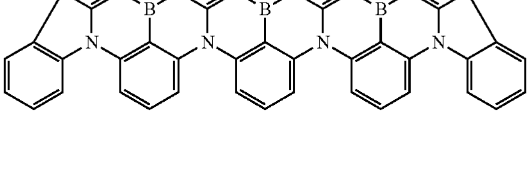

-continued
(vi-2)
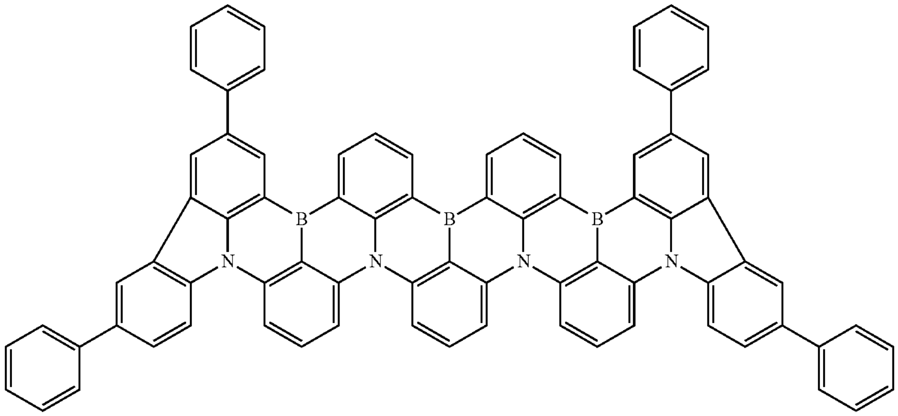
(vi-3)
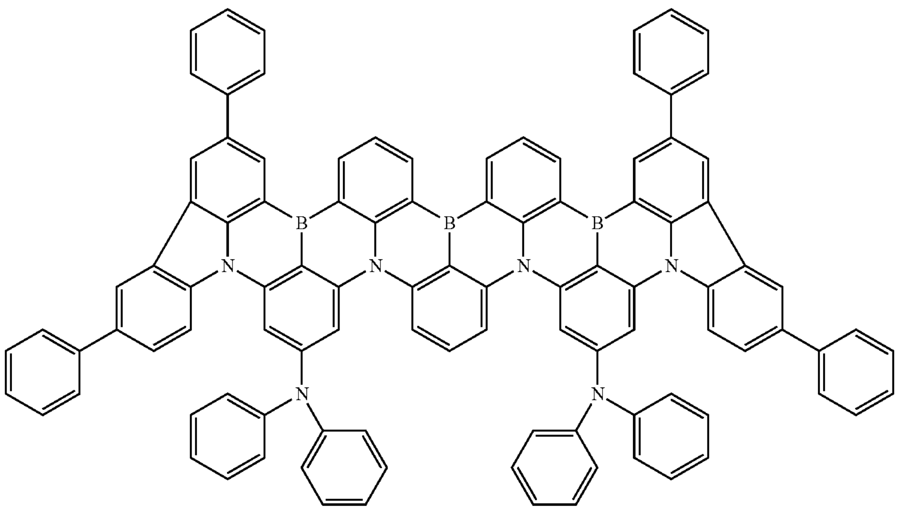
(vi-4)
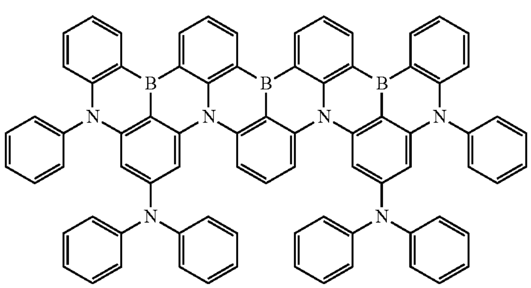
(vi-5)
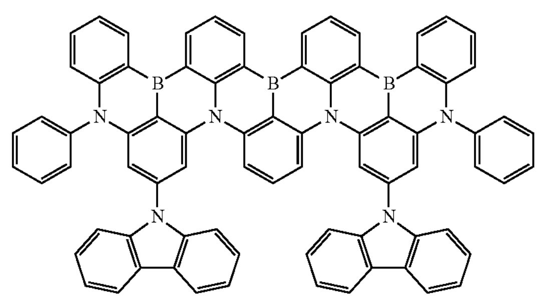
(vi-6)
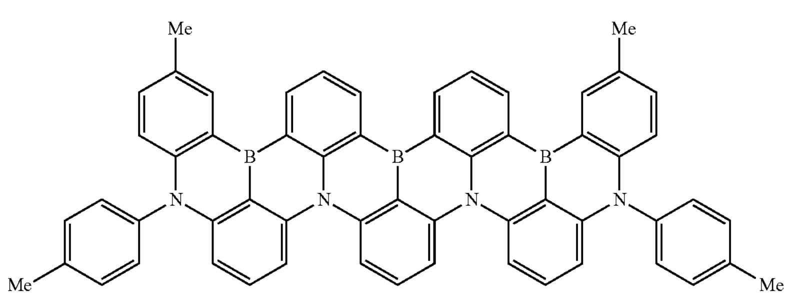

-continued
(vi-7)
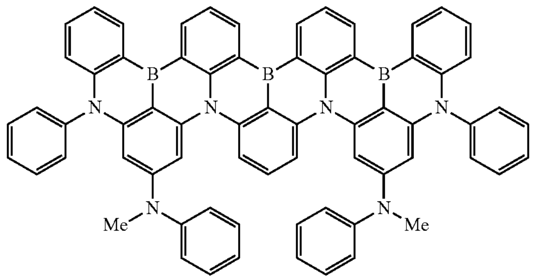
(vi-8)
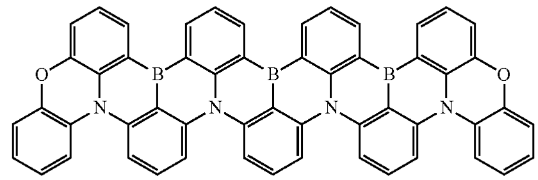
(vi-9)
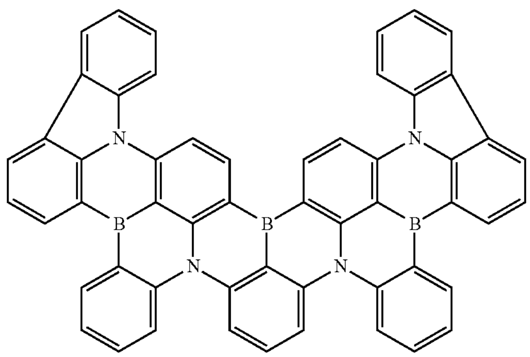
(vi-10)
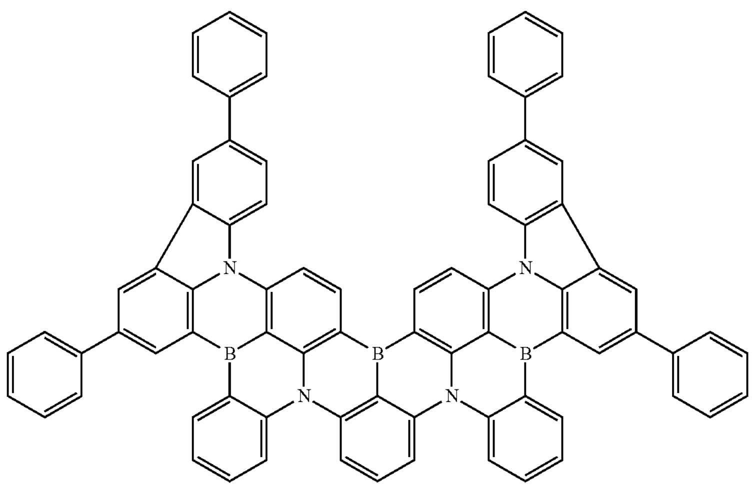
(vi-11)
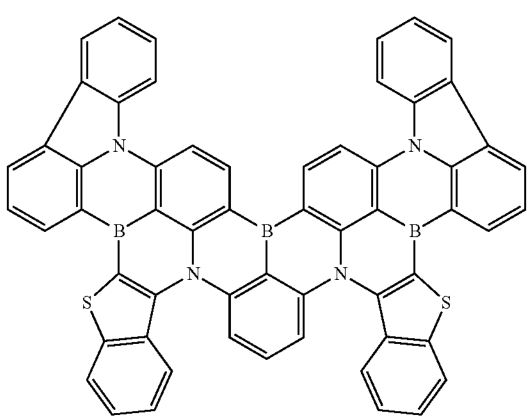
(vi-12)
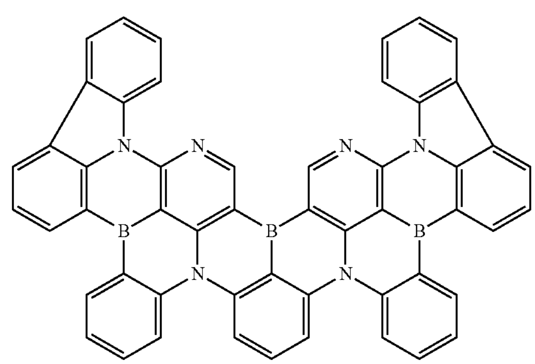

-continued
(vi-13)
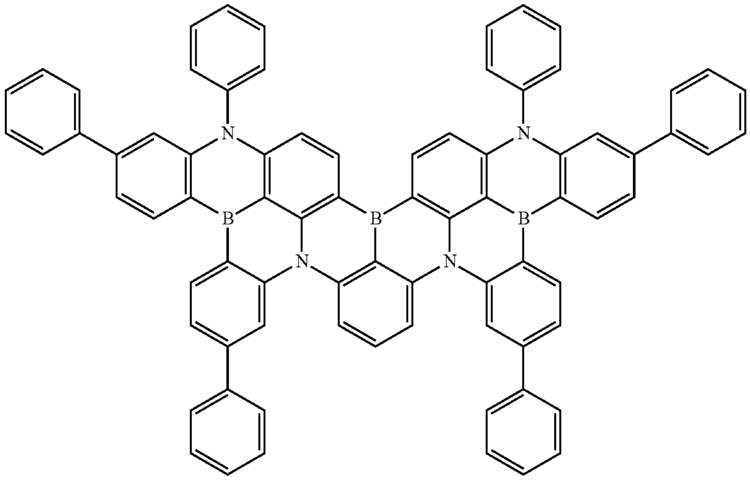
(vi-14)
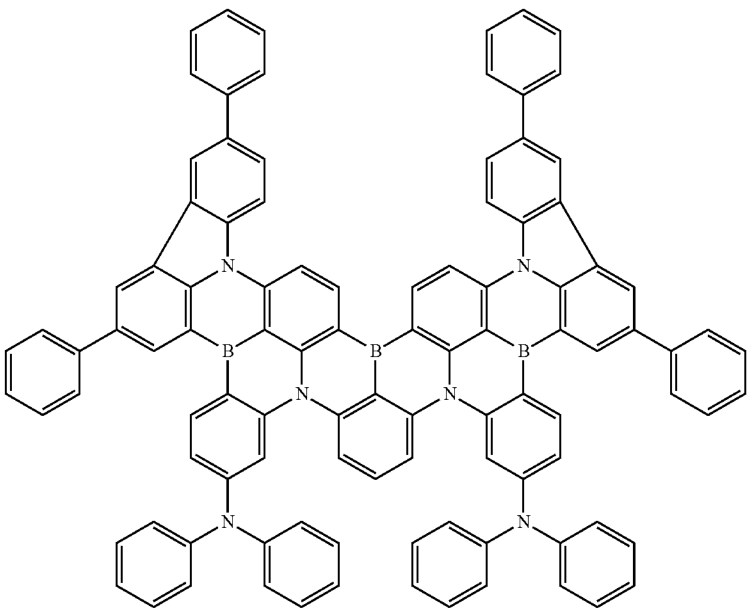
(vi-15)
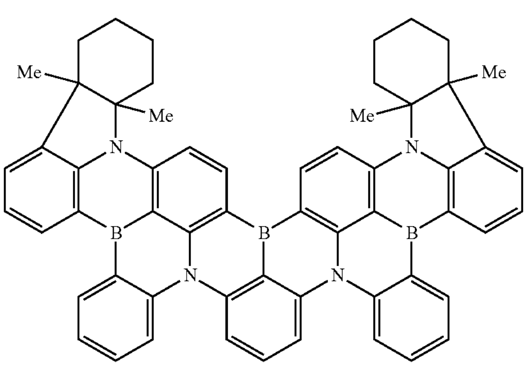
(vi-16)
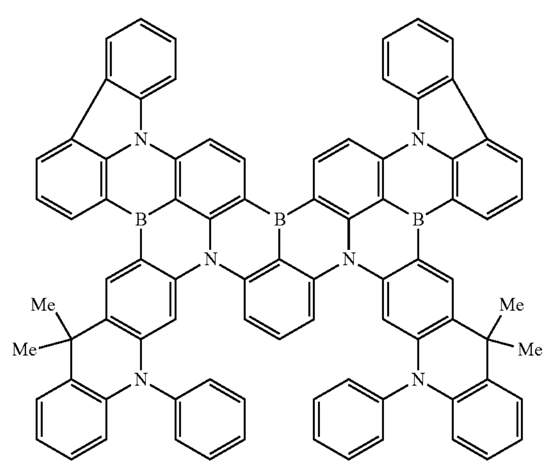

-continued
(vi-17)
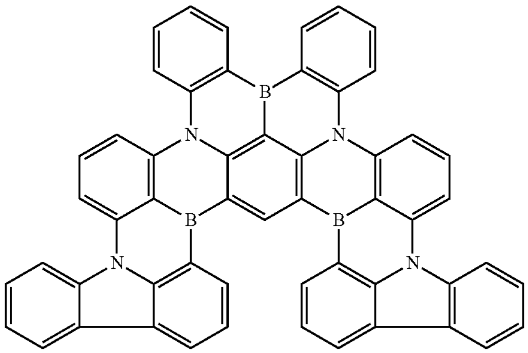
(vi-18)
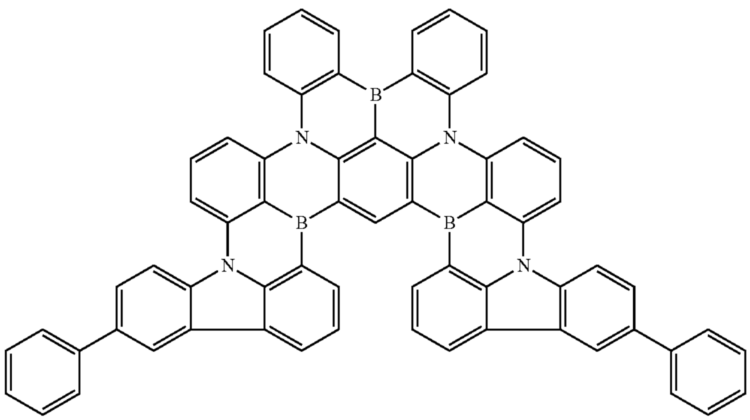
(vi-19)
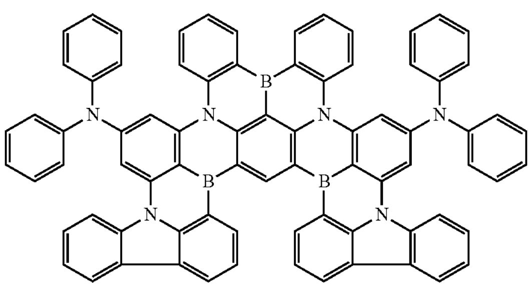
(vi-20)
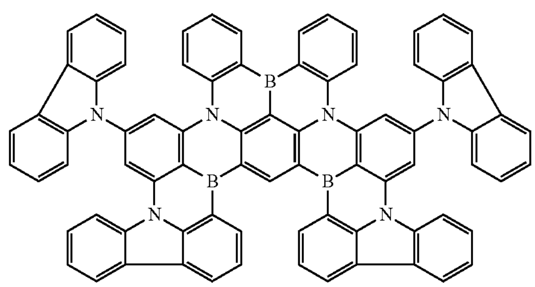
(vi-21)
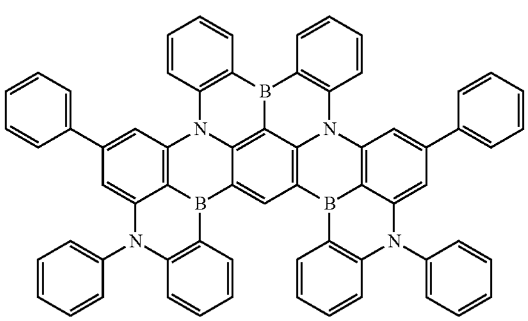
(vi-22)
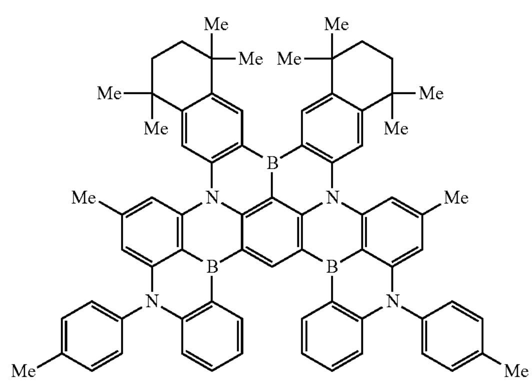

-continued
(vi-23)
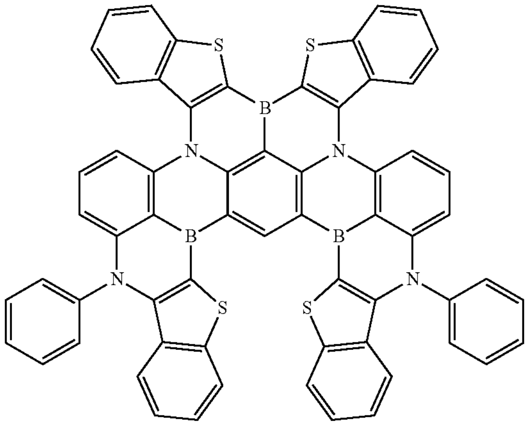
(vi-24)
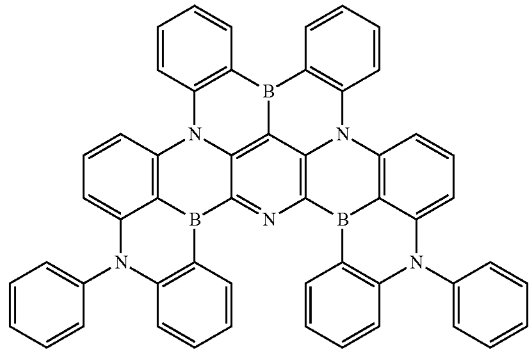
(vi-25)
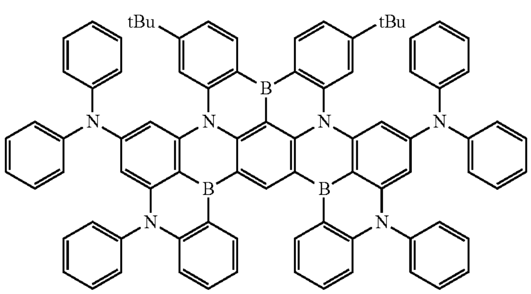
(vi-26)
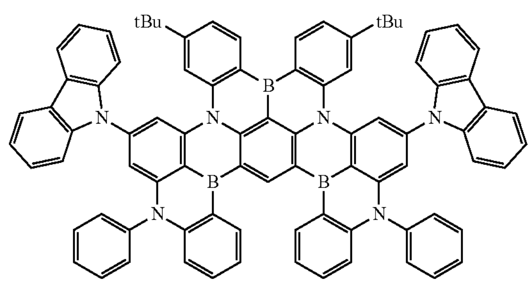
(vi-27)
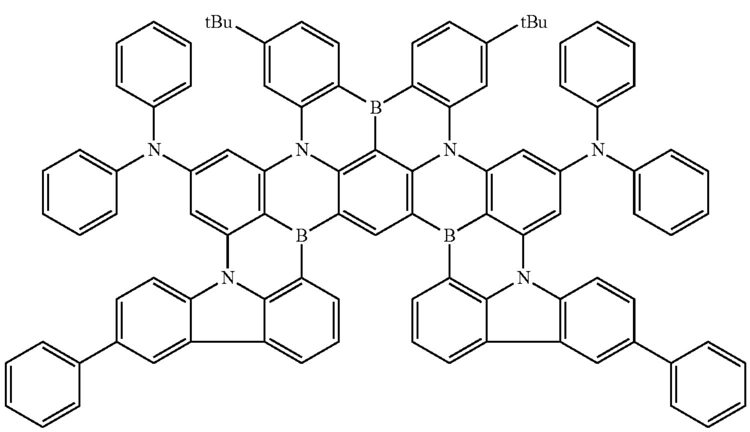
(vi-28)
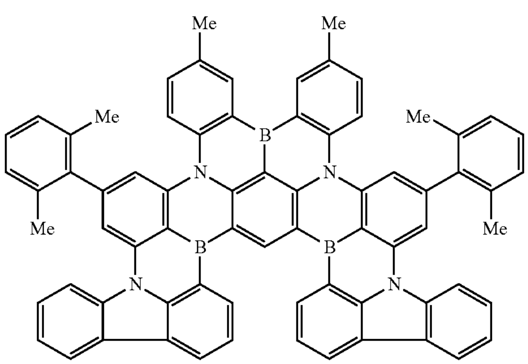

-continued
(vi-29)
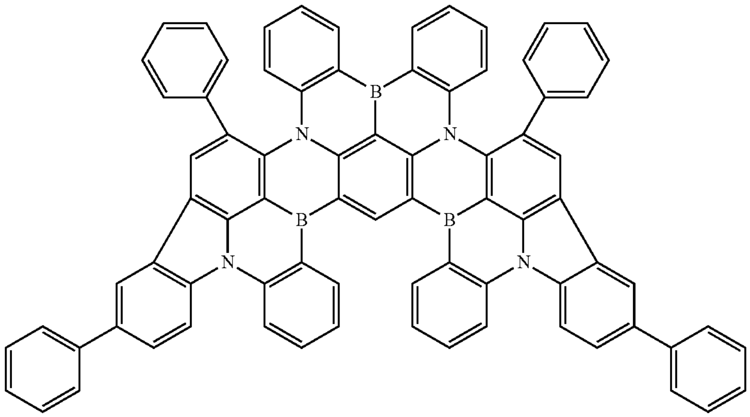
(vi-30)
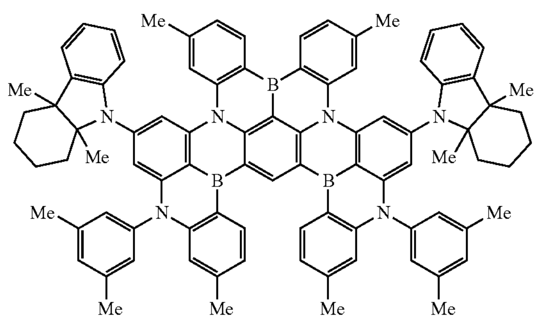
(vi-31)
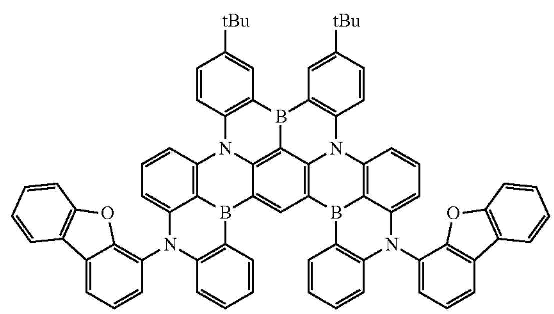
(vi-32)
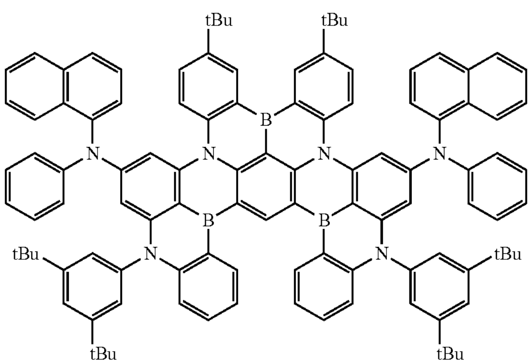
(vi-33)
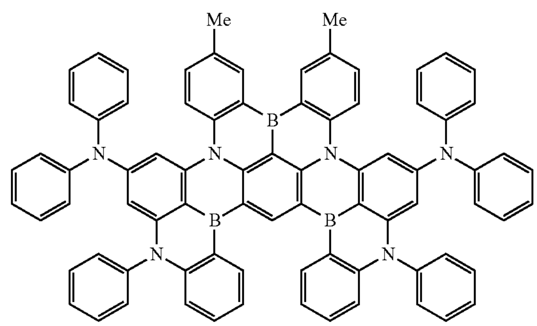
(vi-34)
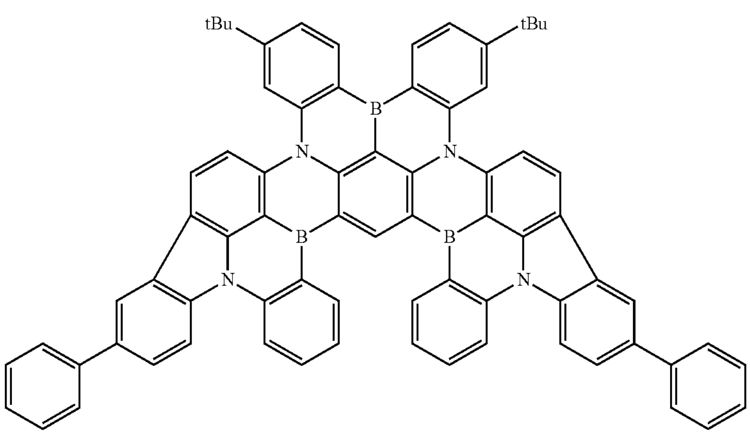

-continued
(vi-35)
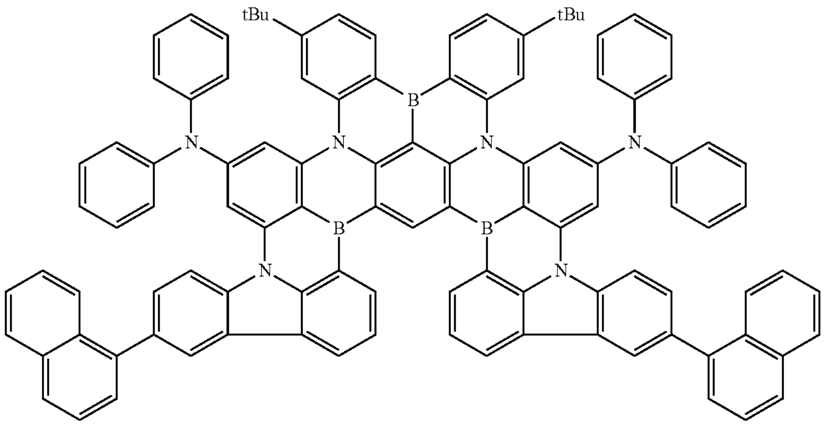
(vi-36)
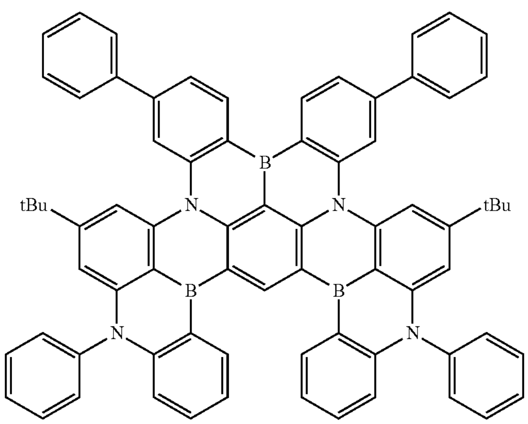
(vi-37)
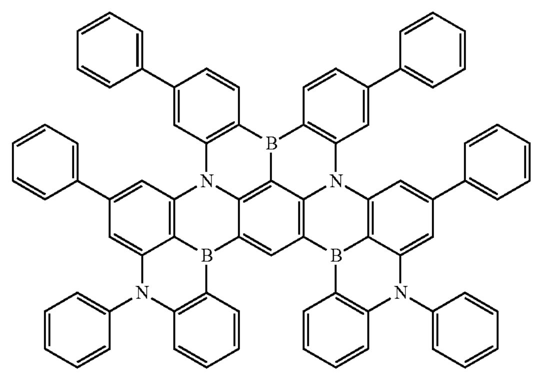
(vi-38)
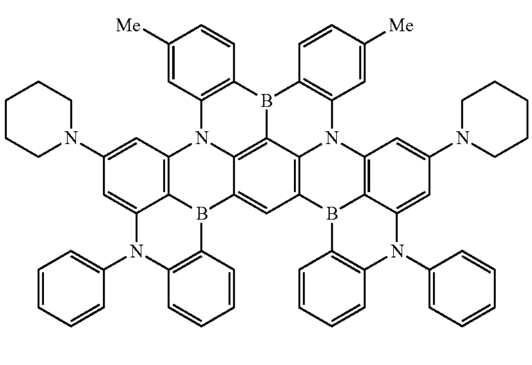
(vi-39)
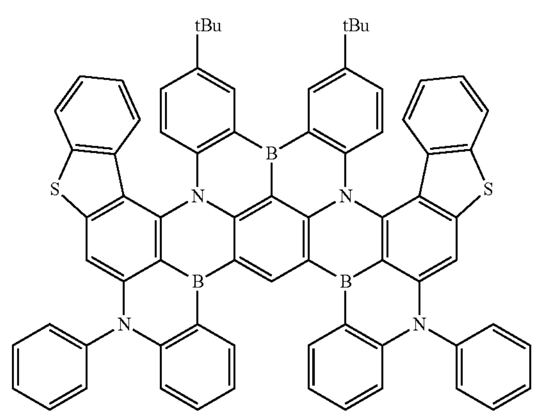

-continued
(vi-40)
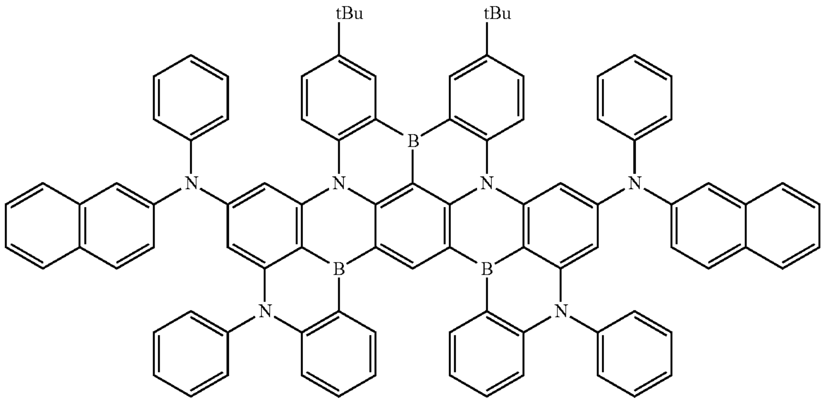
(vi-41)
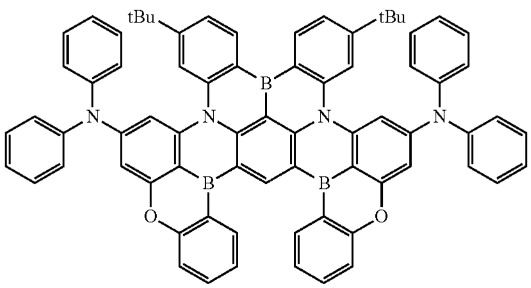
(vi-42)
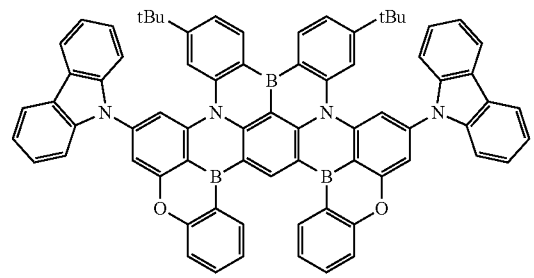
(vi-43)
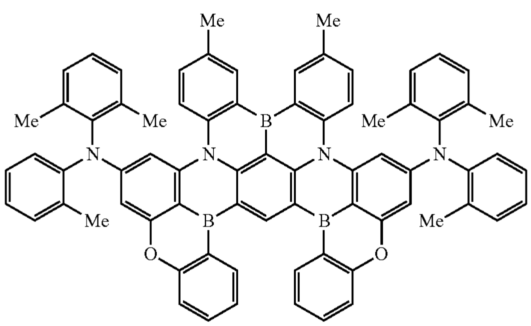
(vi-44)
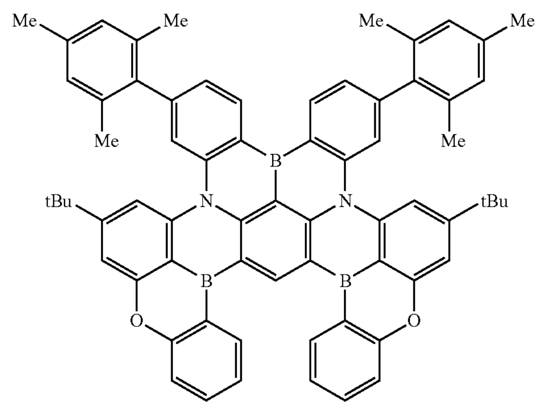
(vi-45)
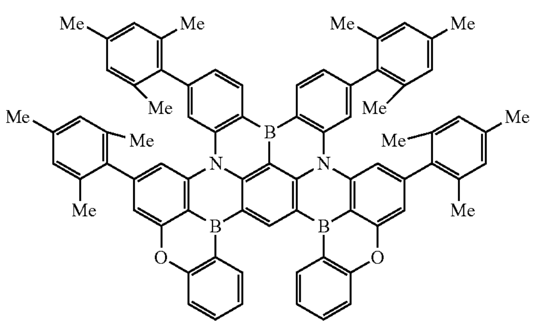
(vi-46)
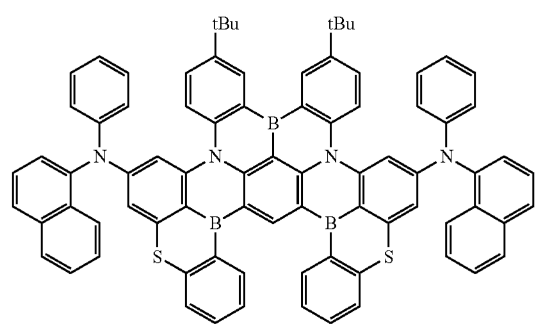

-continued
(vi-47)
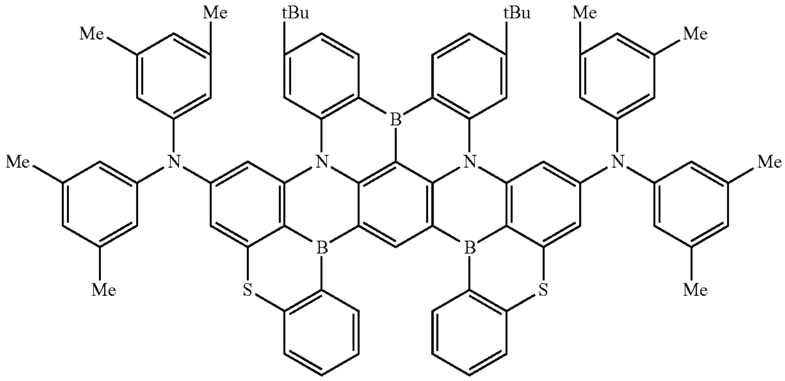
(vi-48)
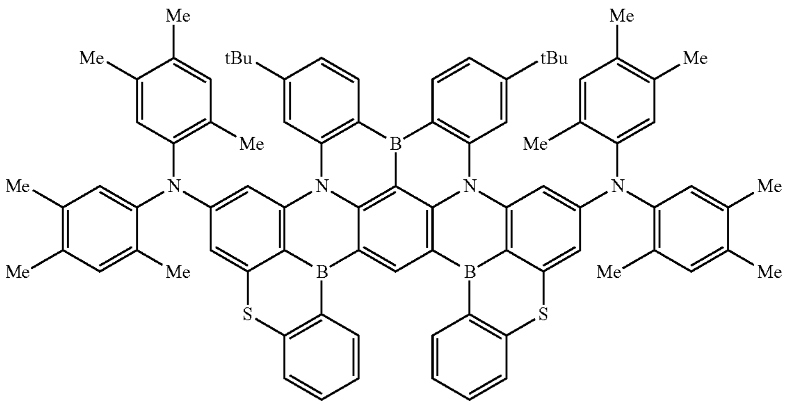
(vi-49)
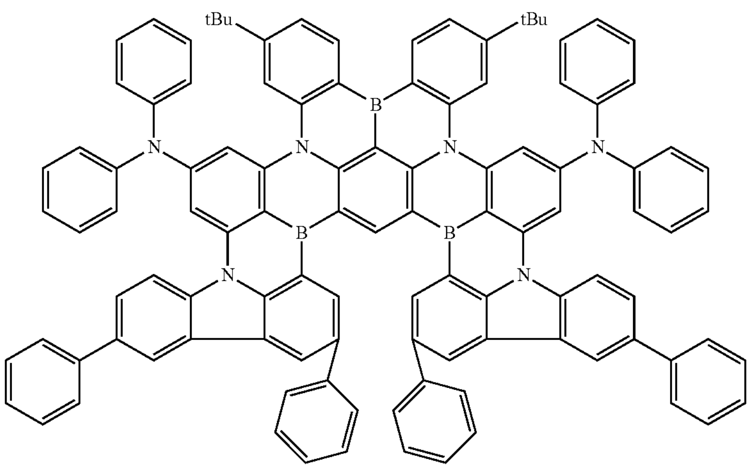
(vi-50)
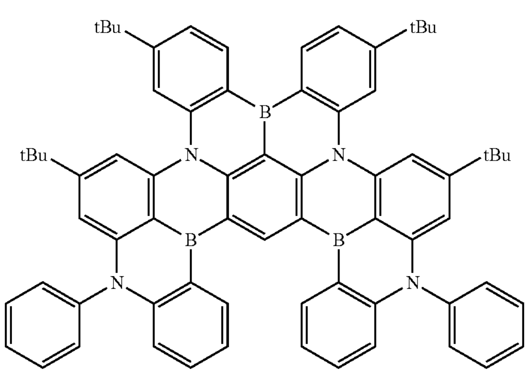
(vi-51)
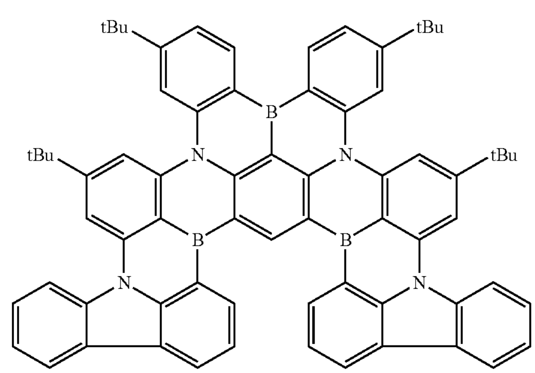

-continued
(vi-52)
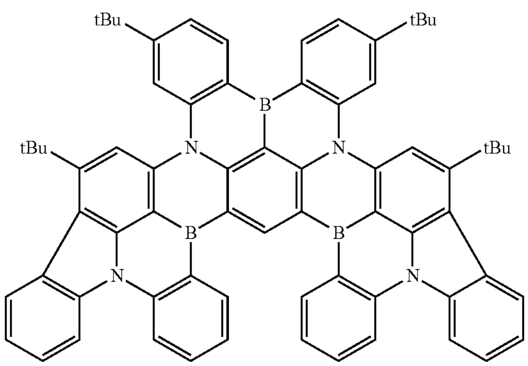
(vi-53)
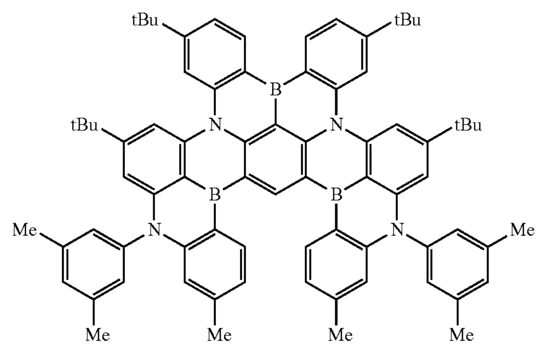
(vi-54)
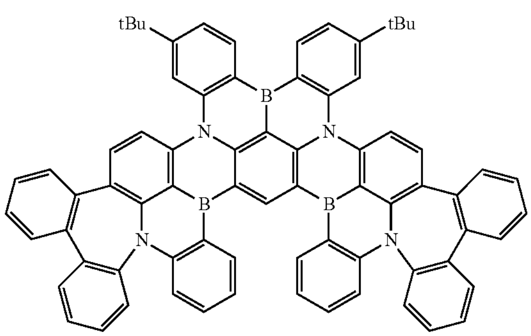
(vi-55)
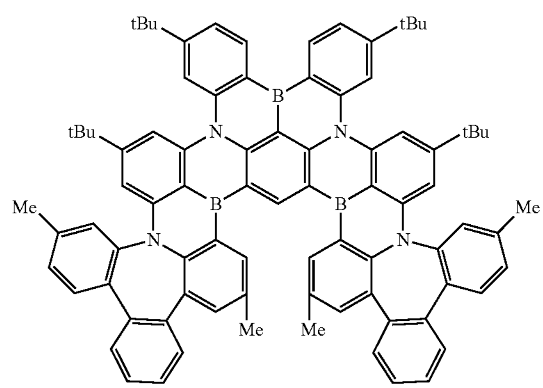
(vi-56)
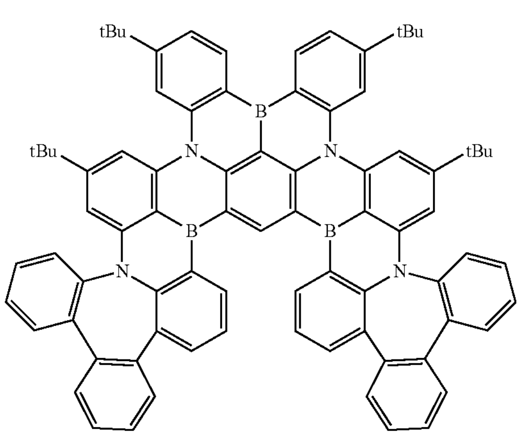
(vi-57)
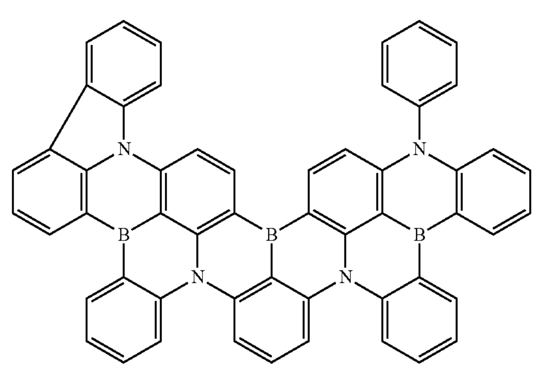

-continued
(vi-58)
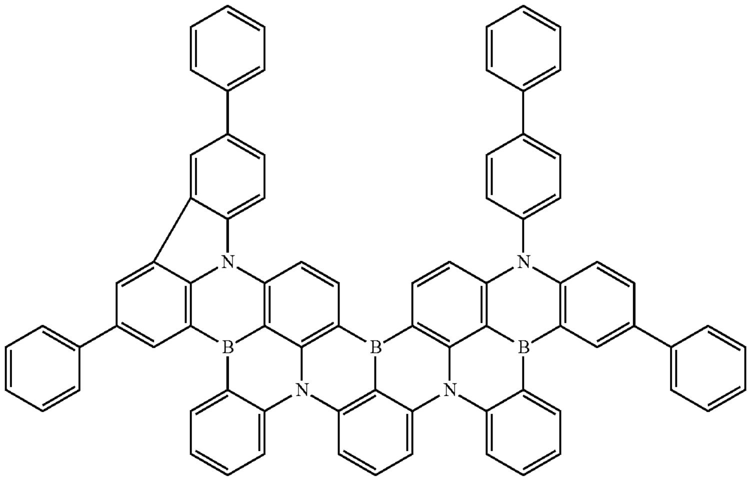
(vi-59)
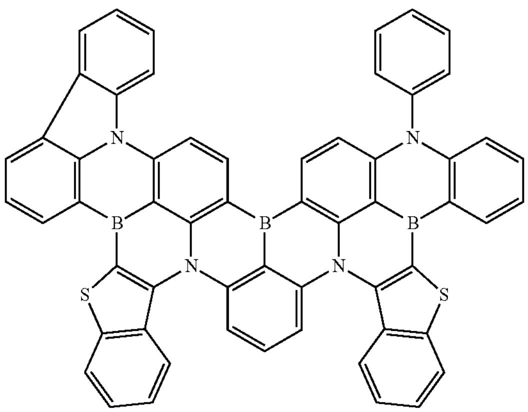
(vi-60)
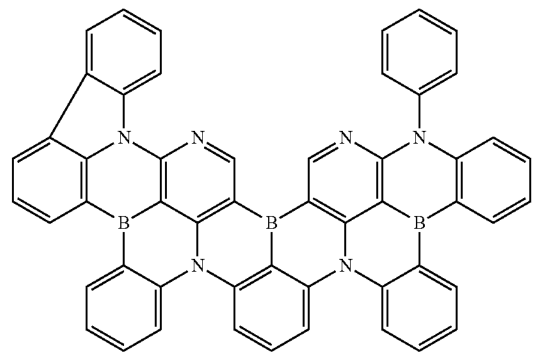
(vi-61)
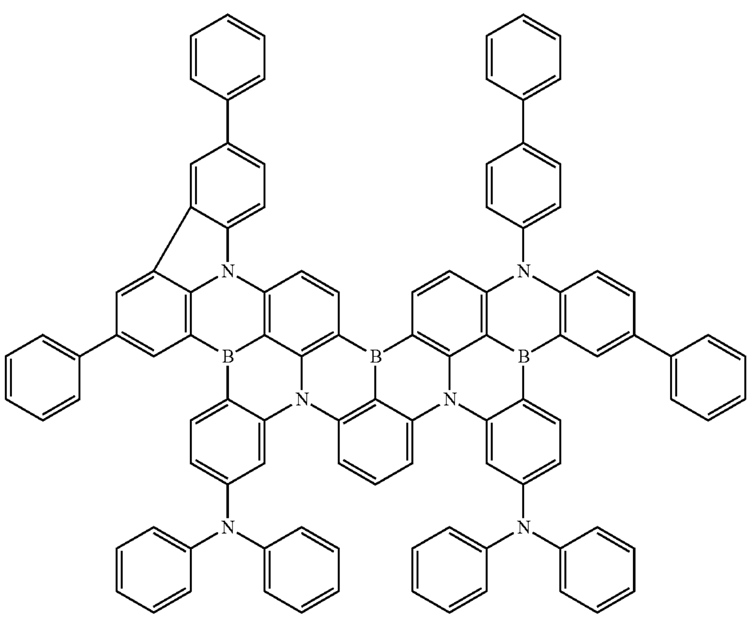

-continued
(vi-62)
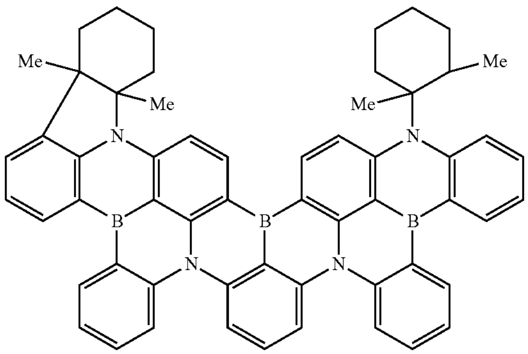
(vi-63)
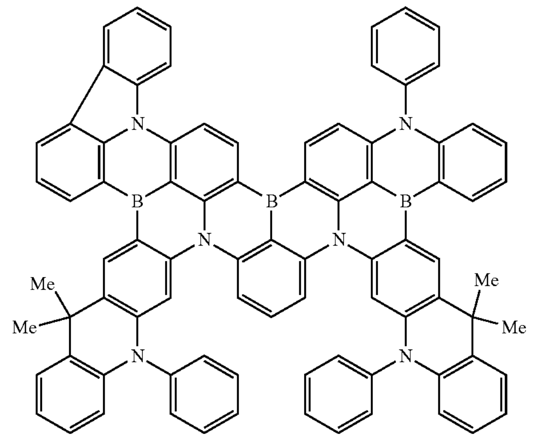
(vi-64)
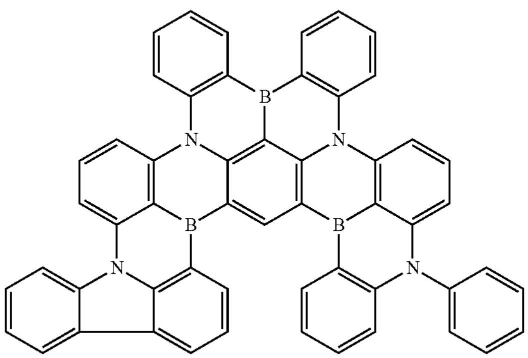
(vi-65)
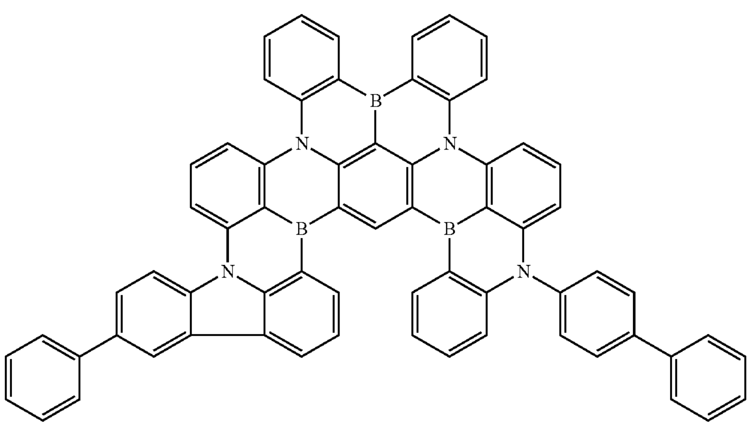
(vi-66)
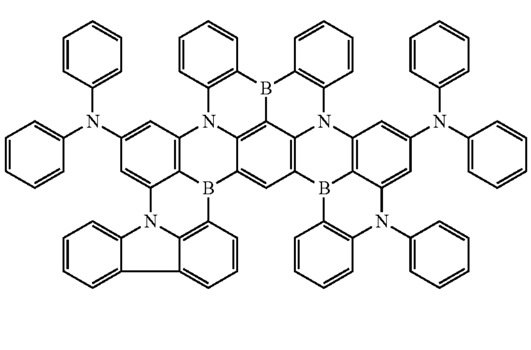
(vi-67)
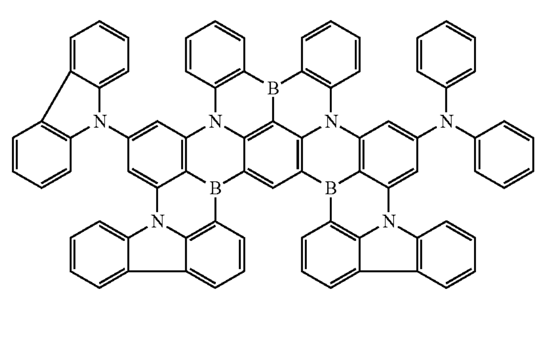

-continued
(vi-68)
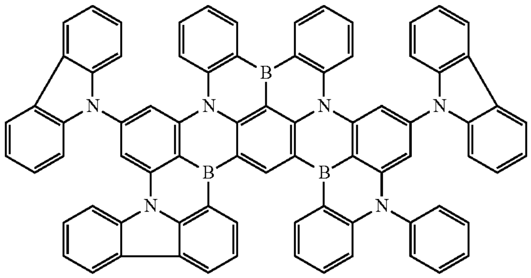
(vi-69)
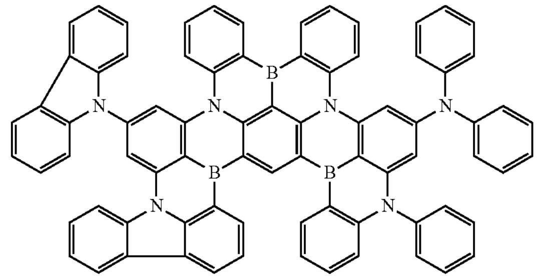
(vi-70)
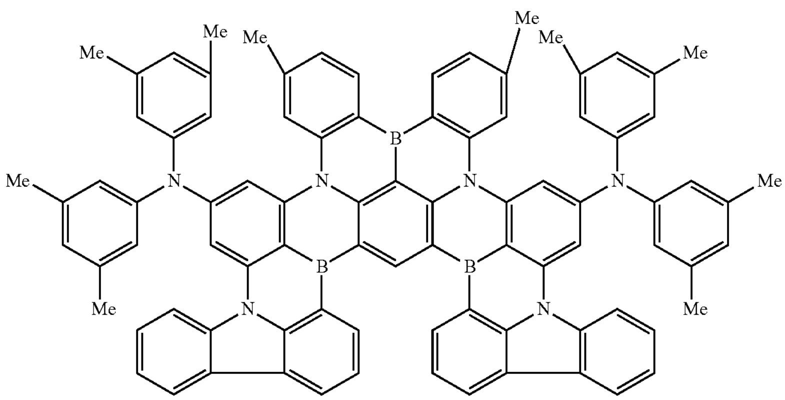
(vi-71)
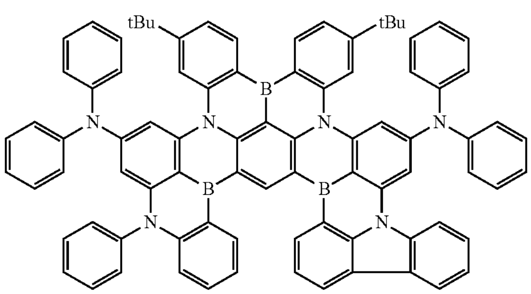
(vi-72)
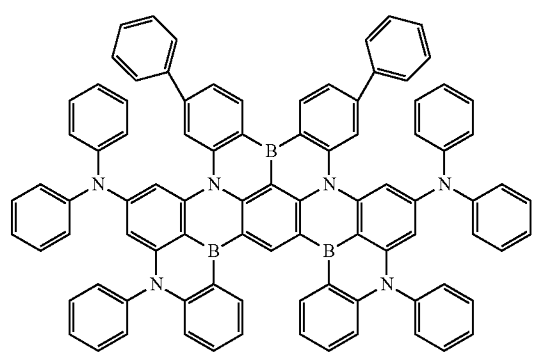
(vi-73)
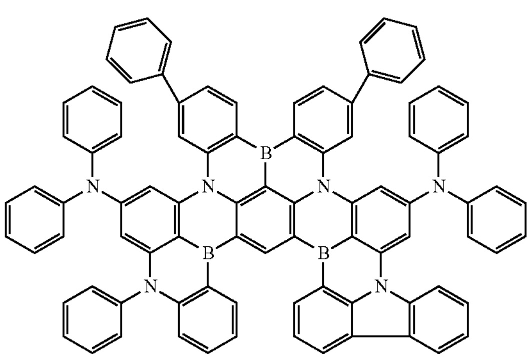
(vi-74)
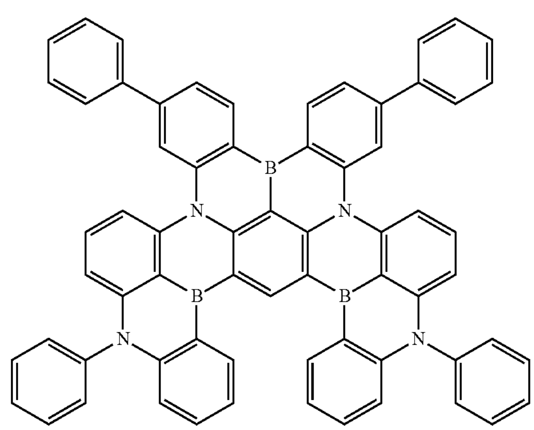

-continued
(vi-75)
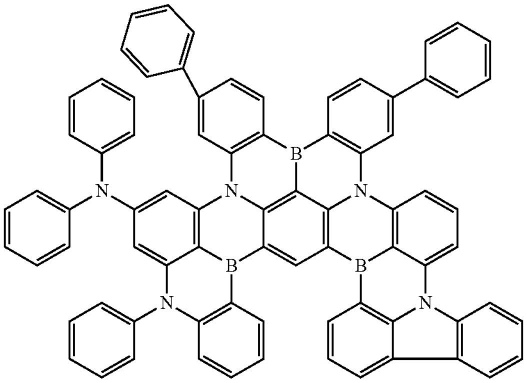
(vi-76)
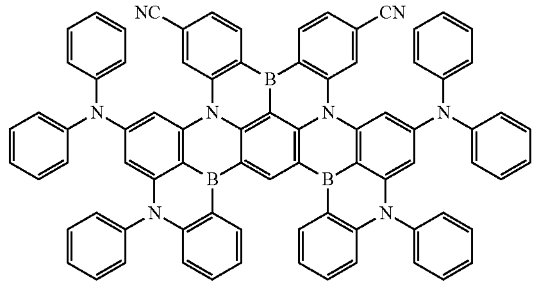
(vi-77)
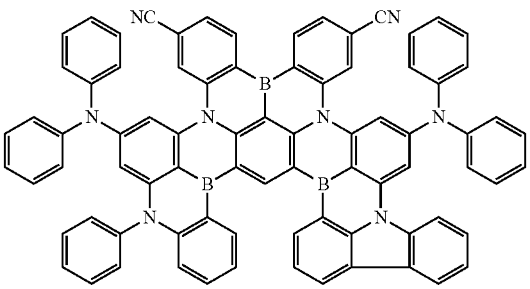
(vi-78)
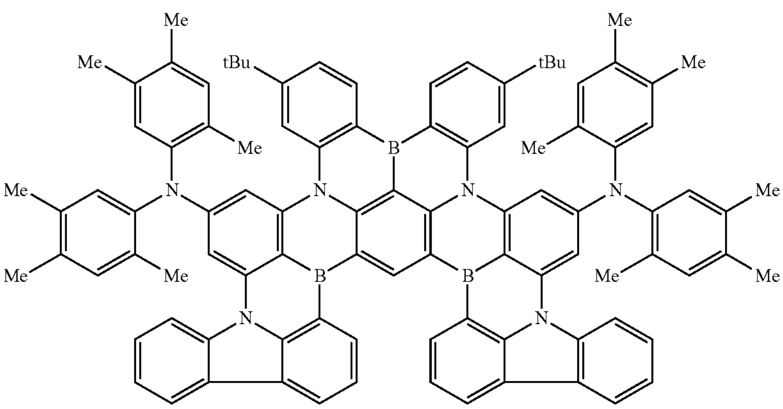
(vi-79)
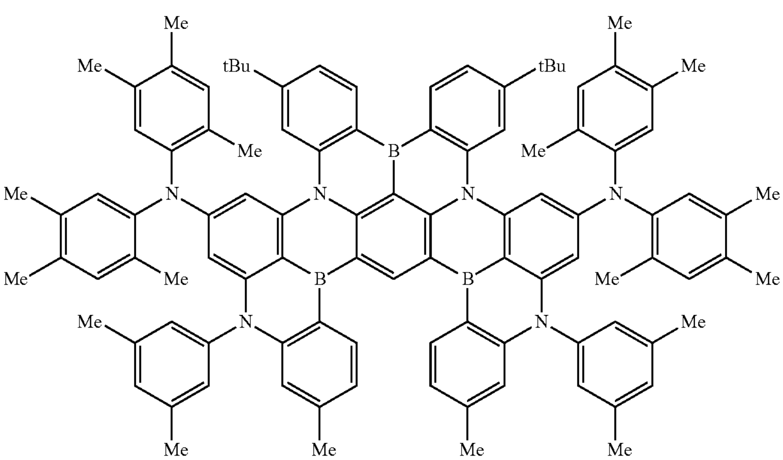

-continued
(vi-80)
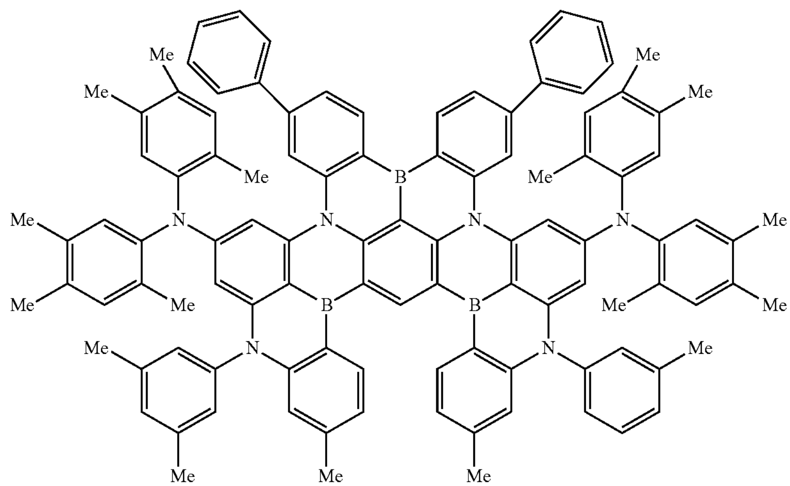
(vi-81)
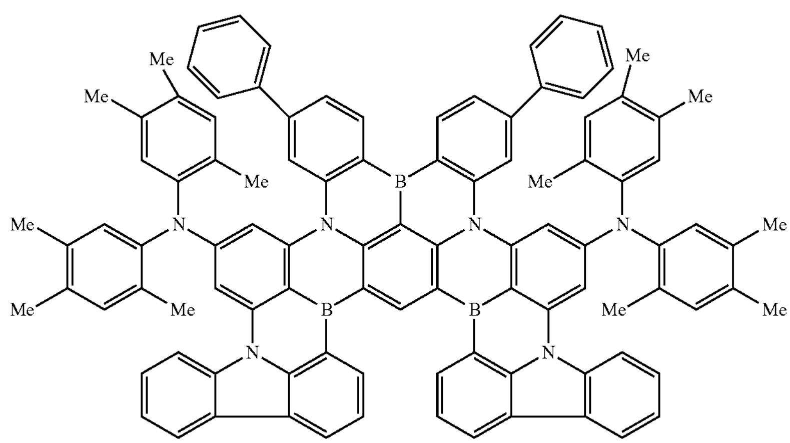
(vi-82)
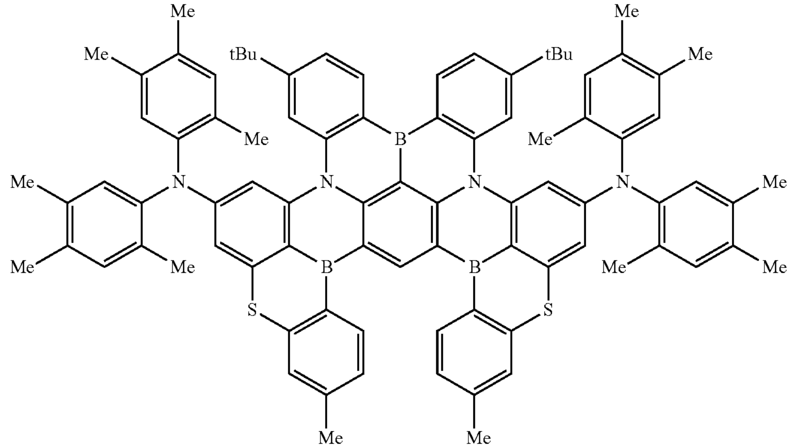

-continued
(vi-83)
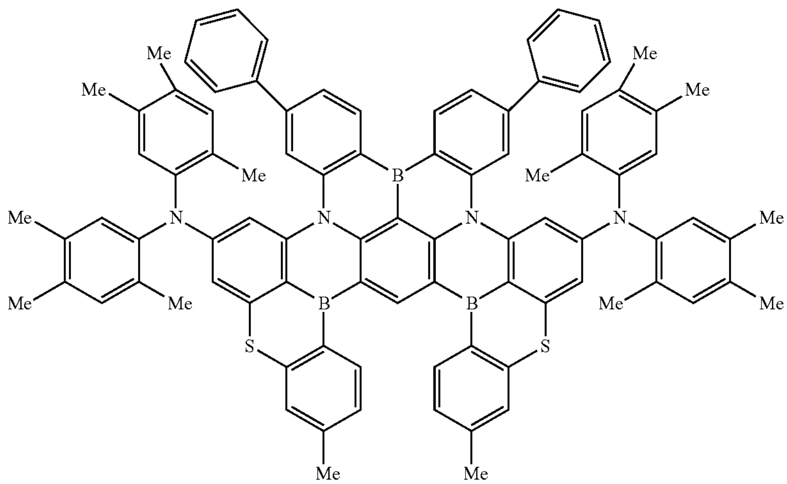
(vi-84)
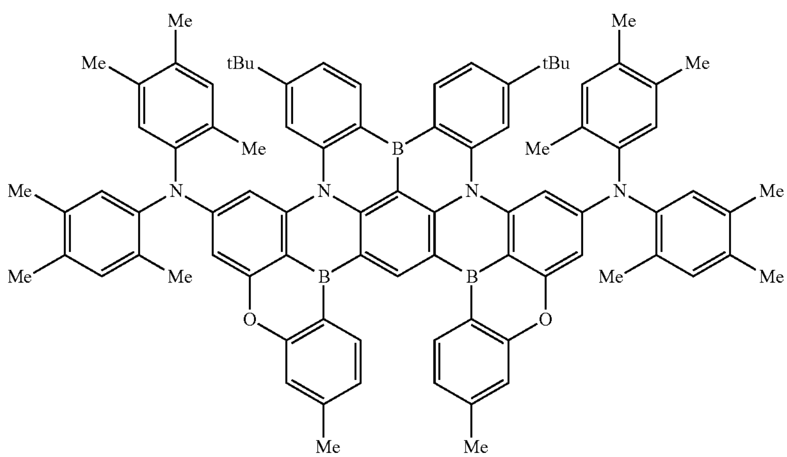
(vi-85)
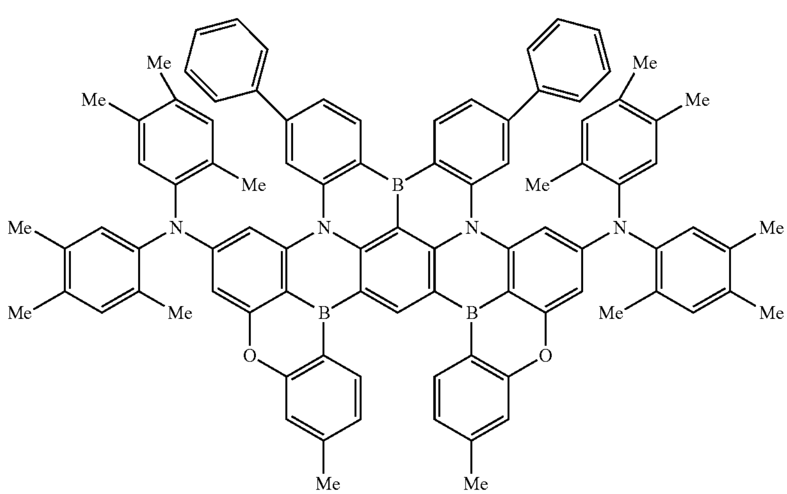

-continued
(v-118-1)
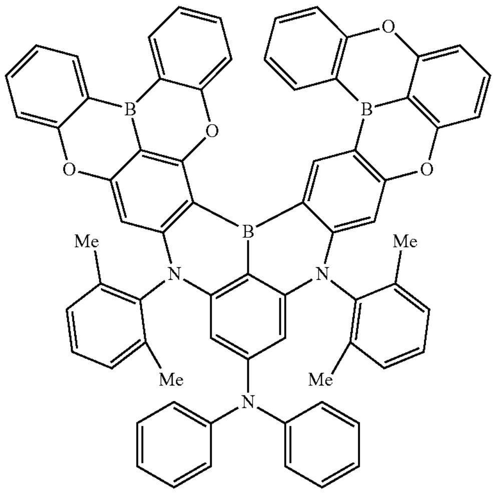
(v-118-2)
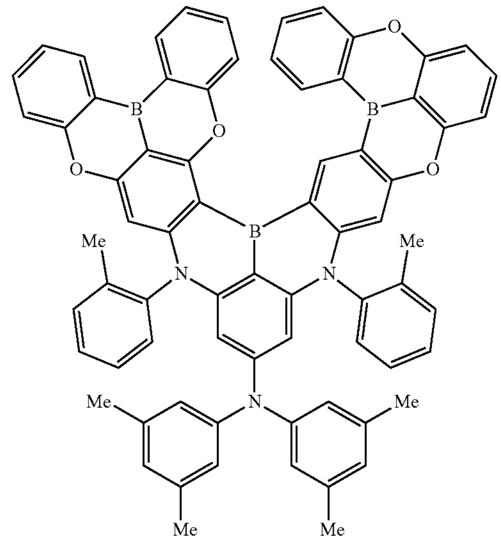
(v-118-3)
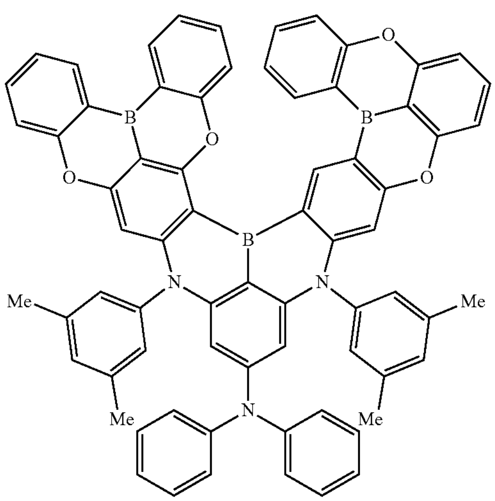
(v-118-4)
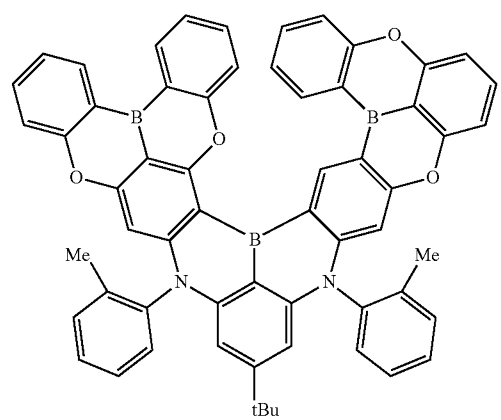
(v-118-5)
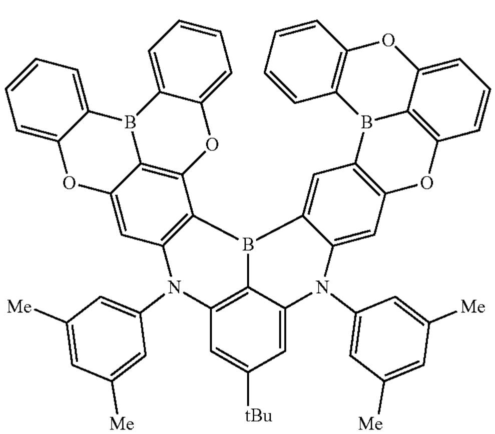
(v-118-6)
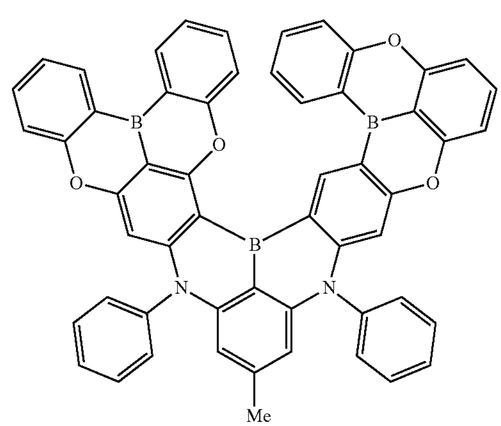

-continued
(v-118-7)
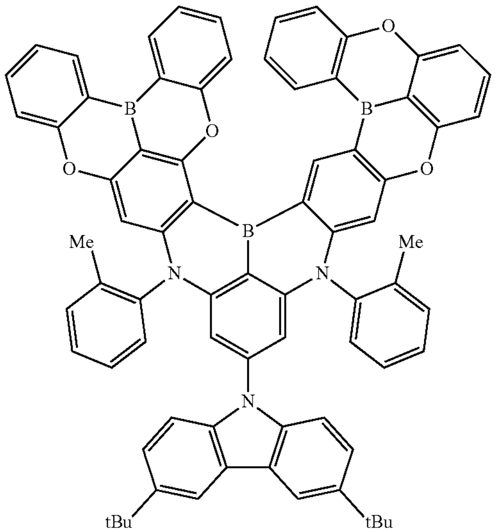
(v-118-8)
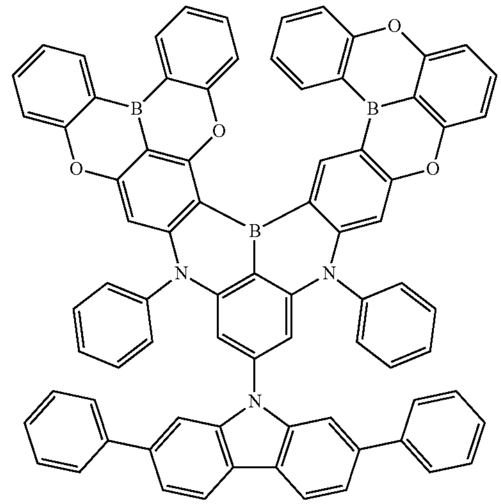
(v-118-9)
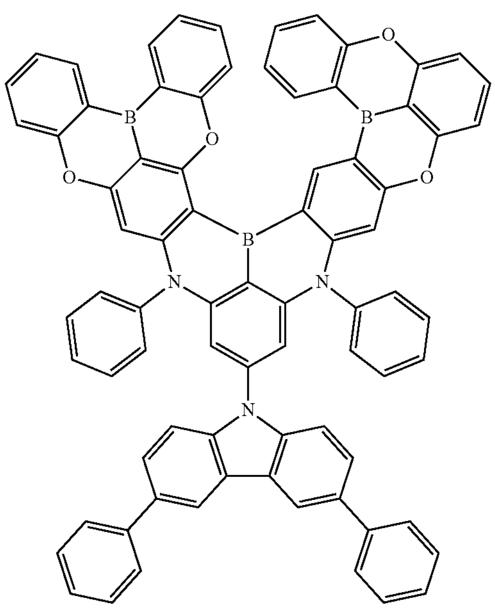
(v-162-1)
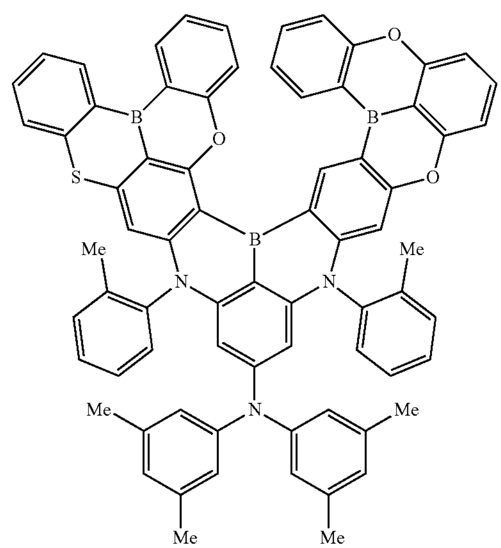

-continued
(v-162-2)
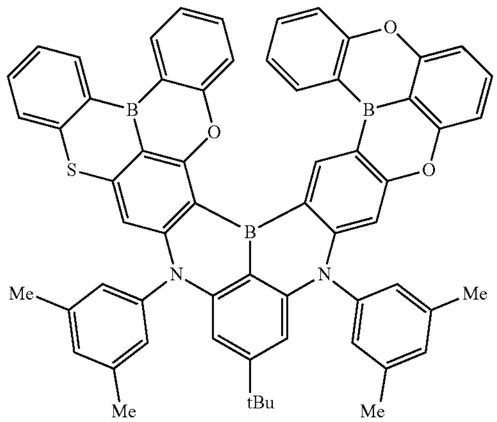
(v-162-3)
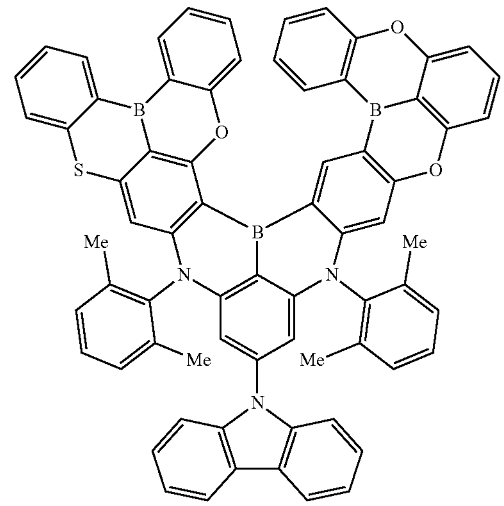
(v-164-1)
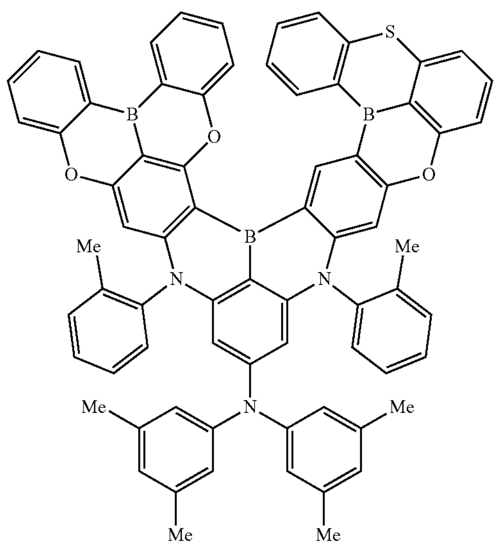
(v-164-2)
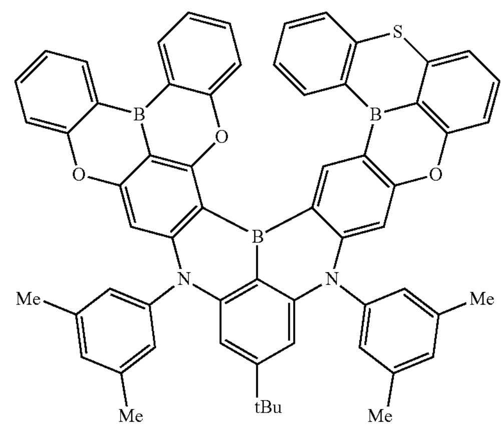
(v-164-3)
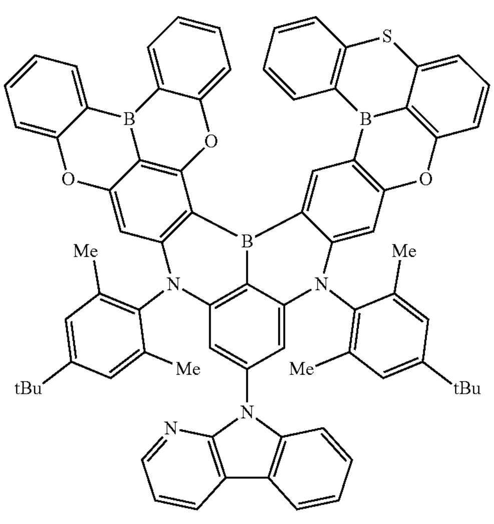
(v-165-1)
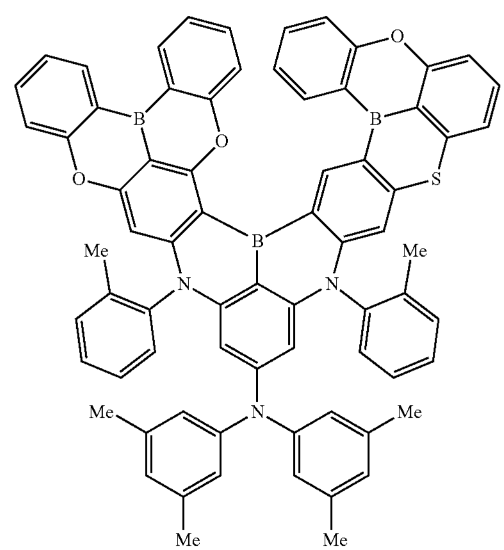

-continued
(v-165-2)
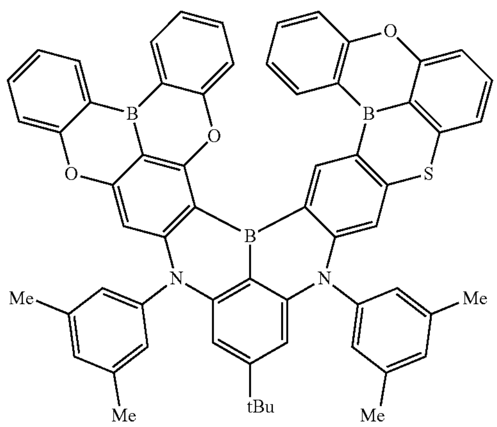
(v-165-3)
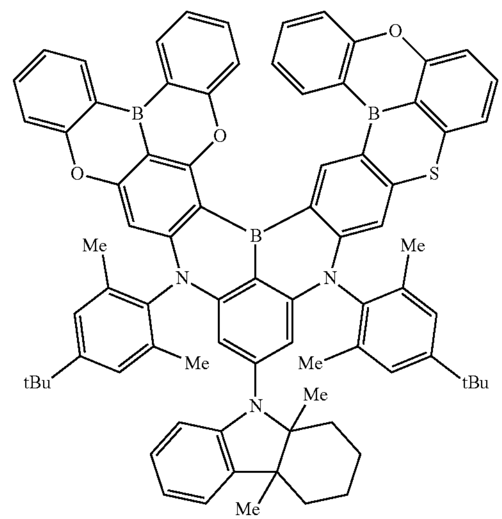
(v-136-1)
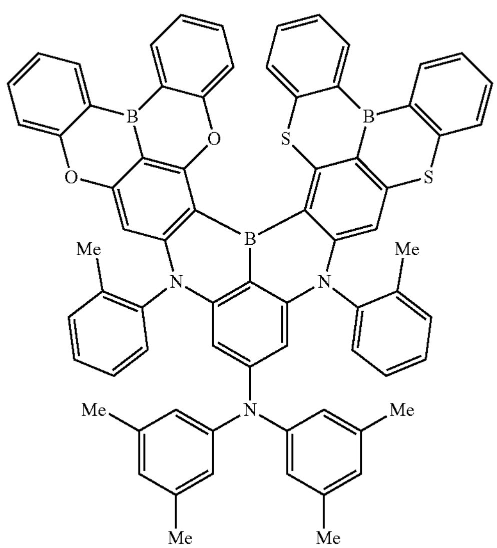
(v-136-2)
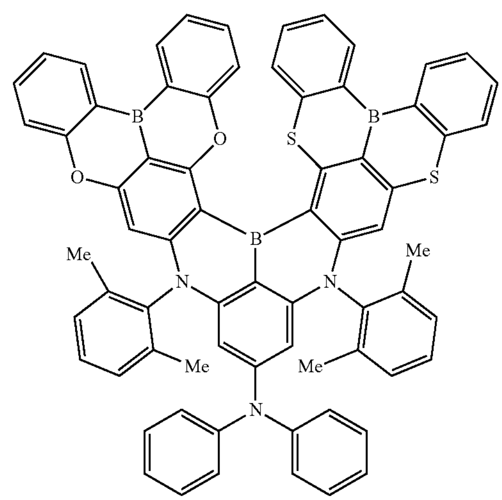
(v-136-3)
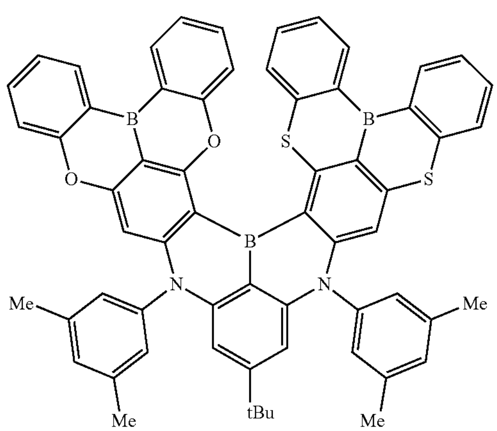
(v-138-1)
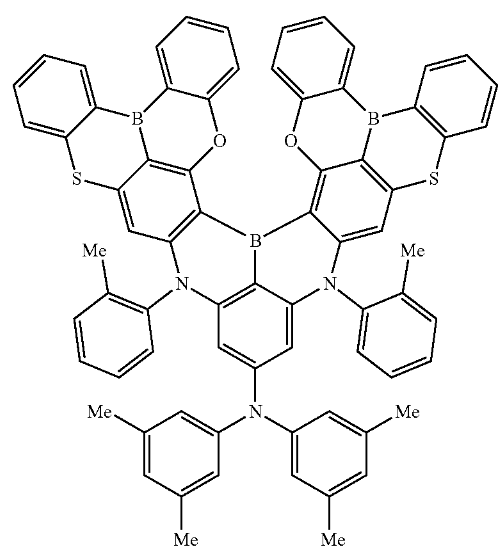

-continued
(v-138-2)
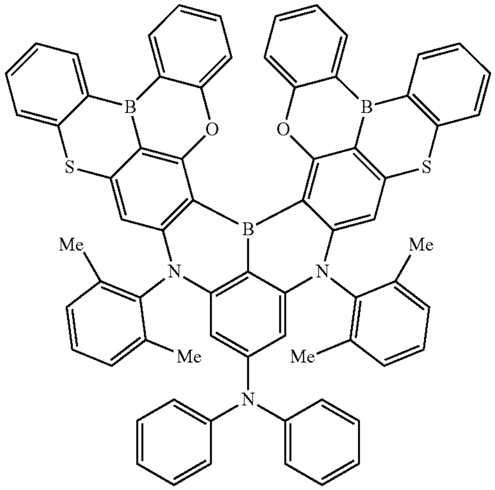
(v-138-3)
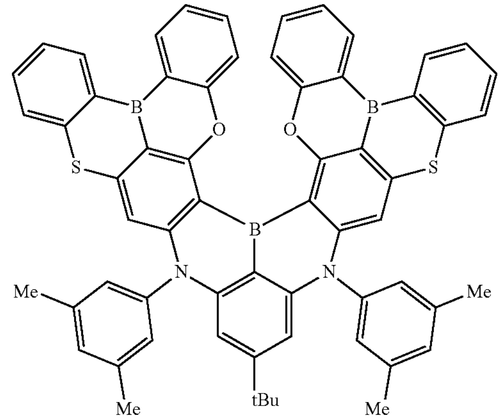
(v-171-1)
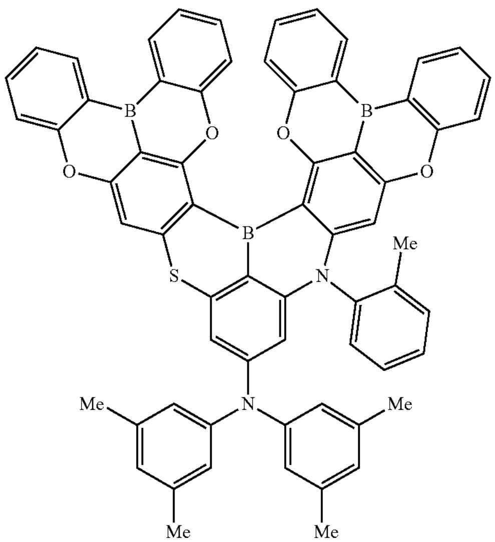
(v-172-2)
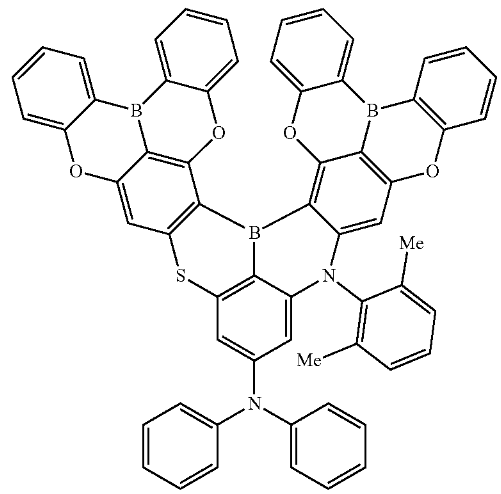
(v-171-3)
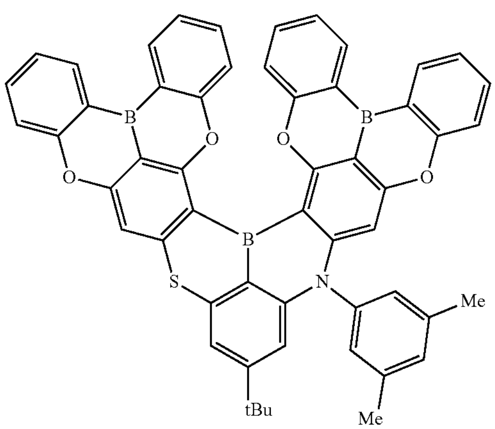
(v-172-1)
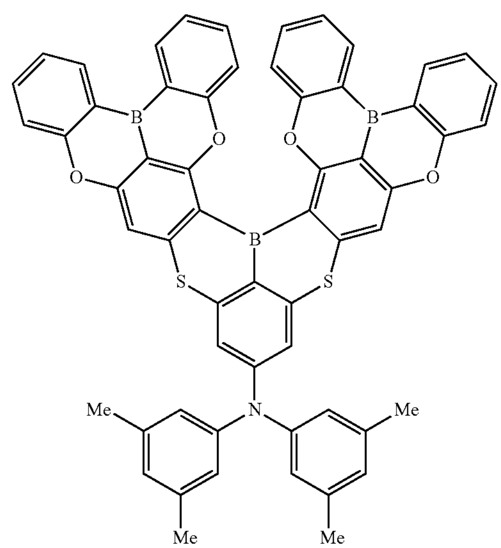

-continued (v-172-2)

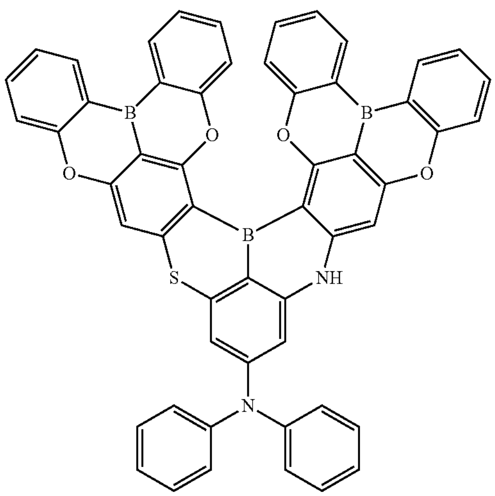

(v-172-3)

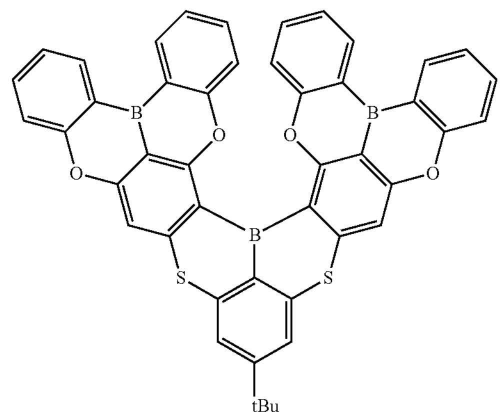

(v-131-1)

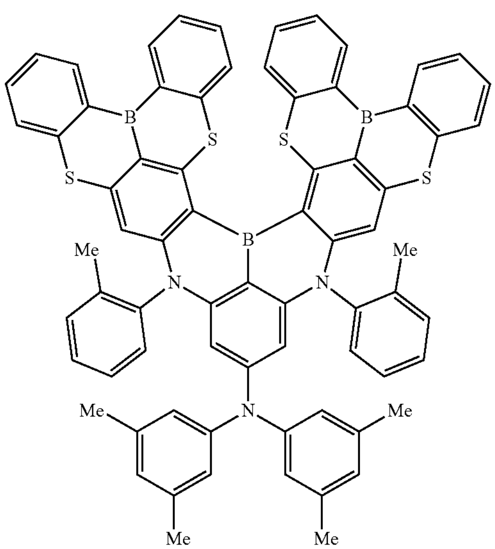

(v-131-2)

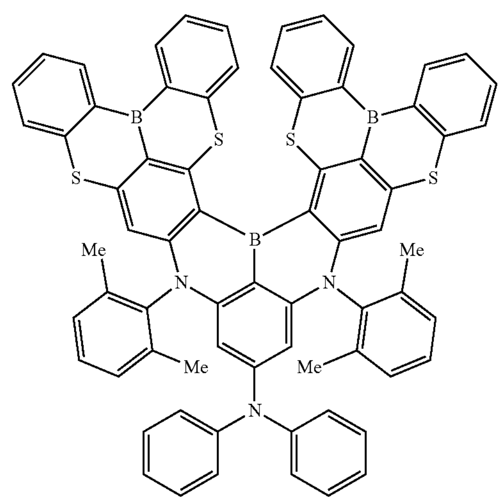

(v-131-3)

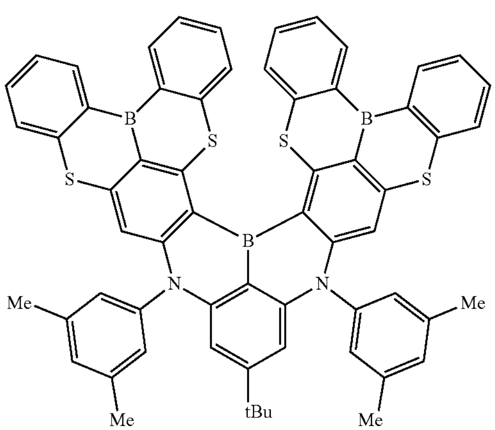

1-3. Reactive Compounds; Polymer Compounds; Cross-linked Polymers; Pendant-Type Polymer Compounds; Pendant-Type the Pendant-Type Crosslinked Polymers A polycyclic aromatic compound consisting of a substructure represented by Formula (1A) and at least two substructures represented by Formula (1B) and a polycyclic aromatic compound represented by formula (D-II-3-1) (D-II-3-11), formula (D-II-3-12) or formula (D-II-3-13) can be used as a material for an organic device, for example, a material for an organic electroluminescent element, a material for an organic field effect transistor, or a material for an organic thin film solar cell, also as a polymer compound obtained by polymerizing a reactive compound in which a reactive substituent is substituted for each of them as a monomer (the monomer for obtaining the polymer compound has a polymerizable substituent), or a crosslinked polymer obtained by further crosslinking the polymer compound (the polymer compound for obtaining the crosslinked polymer has a crosslinkable substituent), or a pendant-type polymer compound obtained by reacting a main chain type polymer with the reactive compound (the reactive compound for obtaining the pendant-type polymer compound has a reactive substituent) or a pendant-type crosslinked polymer in which the pendant-type polymer compound is further crosslinked (the aforementioned pendant-type polymer compound for obtaining this pendant-type crosslinked polymer has a cross-linkable substituent).

Examples of the above-mentioned reactive substituent (including the aforementioned polymerizable substituent, the aforementioned cross-linkable substituent, and a reactive substituent for obtaining a pendant-type polymer, hereinafter also simply referred to as a "reactive substituent") is not particularly limited, as long as it is a substituent capable of polymerizing the above polycyclic aromatic compound, a substituent capable of further crosslinking the polymer compound thus obtained, and a substituent capable of pendant reaction to a main chain type polymer, and include an alkenyl, an alkynyl, an unsaturated product of a cycloalkyl (e.g., cyclobutenyl), a group in which at least one —$CH_2$— in a cycloalkyl is replaced with —O— (e.g., an epoxy), an unsaturated product of a condensed cycloalkane (e.g., a condensed cyclobutene), and the like. Preferable examples include the substituents of the following structures. * in each structural formula indicates the binding position.

(XLS-1)

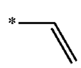

(XLS-2)

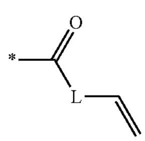

(XLS-3)

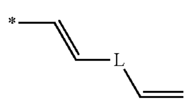

(XLS-4)

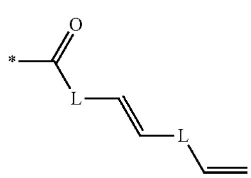

(XLS-5)

(XLS-6)

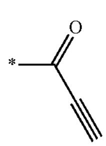

-continued (XLS-7)

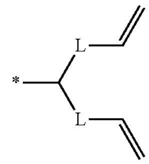

(XLS-8)

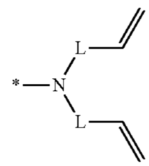

(XLS-9)

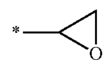

(XLS-10)

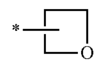

(XLS-11)

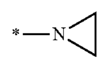

(XLS-12)

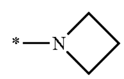

(XLS-13)

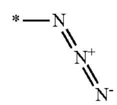

(XLS-14)

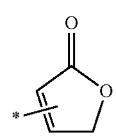

(XLS-15)

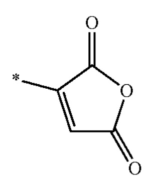

(XLS-16)

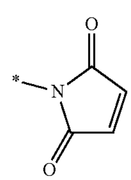

(XLS-17)

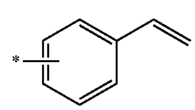

(XLS-18)

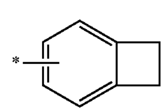

L is each independently single bond, —O—, —S—, >C═O, —O—C(═O)—, a $C_{1-12}$ alkylene, a $C_{1-12}$ oxyalkylene, and a $C_{1-12}$ polyoxyalkylene. Among the above substituents, the substituent represented by Formula (XLS-1), Formula (XLS-2), Formula (XLS-3), Formula (XLS-9), Formula (XLS-10), or Formula (XLS-17) is preferred, and the substituent represented by Formula (XLS-1), Formula (XLS-3) or Formula (XLS-17) is more preferred.

Details of the application of such a polymer compound, a crosslinked polymer, a pendant-type polymer compound and a pendant-type crosslinked polymer (hereinafter, simply referred to as "polymer compound and crosslinked polymer") will be described later.

2. Process for Producing the Polycyclic Aromatic Compounds

The polycyclic aromatic compound consisting of a substructure represented by Formula (1A) and at least two substructures represented by Formula (1B) can basically be produced by binding A ring (a ring), B ring (b ring), C ring (c ring), $R^{XD}$ (D ring, d ring), and $R^{XE}$ (E ring, e ring) by bonding groups (groups containing X) (first reaction) to produce an intermediate, and then binding, A ring (a ring), B ring (b ring), C ring (c ring), $R^{XD}$ (D ring, d ring), and $R^{XE}$ (E ring, e ring) by a bonding group (a group containing Y) (second reaction) to produce the final product. In the first reaction, for example, a general reaction such as a nucleophilic substitution reaction or an Ullmann reaction can be used as an etherification reaction, and a general reaction such as a Buchwald-Hartwig reaction is can be used as an amination reaction. In the second reaction, a tandem hetero-Friedel-Crafts reaction (continuous aromatic electrophilic substitution reaction—the same shall apply hereinunder) can be used. For these production methods, reference can be made to the methods described in prior literature such as WO 2015/102118.

2. Organic Devices

The polycyclic aromatic compound according to the present invention can be used as a material for an organic device. Examples of the organic element include an organic electroluminescent element, an organic field effect transistor, and an organic thin film solar cell.

3-1. Organic Electroluminescent Element

Organic EL element of the present embodiment will be described in the following based on the drawings. FIG. 1 shows a schematic cross-sectional view of an organic EL element of the present embodiment.

3-1-1. Structure of Organic Electroluminescent Element

Organic EL element 100 shown in FIG. 1 has substrate 101, anode 102 provided on substrate 101, hole injection layer 103 provided on anode 102, hole transport layer 104 provided on hole injection layer 103, light-emitting layer 105 provided on hole transport layer 104, electron transport layer 106 provided on light-emitting layer 105, electron injection layer 107 provided on electron transport layer 106 and cathode 108 provided on electron injection layer 107.

In addition, with reversing preparation order, organic EL element 100 may be formed into a configuration having substrate 101, cathode 108 provided on substrate 101, electron injection layer 107 provided on cathode 108, electron transport layer 106 provided on electron injection layer 107, light-emitting layer 105 provided on electron transport layer 106, hole transport layer 104 provided on light-emitting layer 105, hole injection layer 103 provided on hole transport layer 104 and anode 102 provided on hole injection layer 103, for example.

All the respective layers are not necessarily required, and a minimum constitutional unit may be formed into a configuration formed of anode 102, light-emitting layer 105 and cathode 108, and hole injection layer 103, hole transport layer 104, electron transport layer 106 and electron injection layer 107 are an arbitrarily provided layer. Moreover, each layer described above may be formed of a single layer or may be formed of a plurality of layers.

A form of the layers constituting the organic EL element may be, in addition to the constitutional form of "substrate/anode/hole injection layer/hole transport layer/light-emitting layer/electron transport layer/electron injection layer/cathode" described above, in a constitutional form such as "substrate/anode/hole transport layer/light-emitting layer/electron transport layer/electron injection layer/cathode," "substrate/anode/hole injection layer/light-emitting layer/electron transport layer/electron injection layer/cathode," "substrate/anode/hole injection layer/hole transport layer/light-emitting layer/electron injection layer/cathode," "substrate/anode/hole injection layer/hole transport layer/light-emitting layer/electron transport layer/cathode," "substrate/anode/light-emitting layer/electron transport layer/electron injection layer/cathode," "substrate/anode/hole transport layer/light-emitting layer/electron injection layer/cathode," "substrate/anode/hole transport layer/light-emitting layer/electron transport layer/cathode," "substrate/anode/hole injection layer/light-emitting layer/electron injection layer/cathode," "substrate/anode/hole injection layer/light-emitting layer/electron transport layer/cathode," "substrate/anode/light-emitting layer/electron transport layer/cathode" and "substrate/anode/light-emitting layer/electron injection layer/cathode."

3-1-2. Substrate in Organic Electroluminescent Element

The substrate 101 is a support of the organic electroluminescent element, for which generally used are quartz, glass, metals plastics, etc. The substrate 101 is shaped in a tabular form, a filmy form or a sheet form depending on the intended use, and for example, glass plates, metal plates, metal foils, plastic films and plastic sheets are used. Above all, glass plates, and transparent synthetic resin plates of polyester, polymethacrylate, polycarbonate or polysulfone are preferred. For glass substrates, soda lime glass and alkali-free glass are usable, and the thickness may be one that is enough for securing mechanical strength, and is, for example, 0.2 mm or more. The upper limit of the thickness is, for example, 2 mm or less, preferably 1 mm or less. Regarding the glass material, alkali-free glass is preferred as releasing fewer ions. However, soda lime glass coated with a barrier coat of $SiO_2$ or the like is available on the market and can be used here. For increasing gas barrier performance, the substrate 101 may be provided with a gas barrier film of a dense silicon oxide film or the like on at least one surface thereof, and in particular, in the case where a synthetic resin plate, film or sheet having low gas barrier performance is used as the substrate 101, such a gas barrier film is preferably provided.

3-1-3. Anode in Organic Electroluminescent Element

The anode 102 plays a role of injecting holes into the light-emitting layer 105. In the case where the hole injection layer 103 and/or the hole transport layer 104 are/is arranged between the anode 102 and the light-emitting layer 105, holes are injected into the light-emitting layer 105 via these.

The material to form the anode 102 includes an inorganic compound and an organic compound. Examples of the inorganic compound include metals (e.g., aluminum, gold, silver, nickel, palladium, chromium), metal oxides (e.g., indium oxide, tin oxide, indium-tin oxide (ITO), indium-zinc oxide (IZO)), metal halides (e.g., copper iodide), copper sulfide, carbon black, ITO glass and NESA glass. Examples of the organic compound include polythiophenes such as poly(3-methylthiophene, and conductive polymers such as polypyrrole and polyaniline. In addition, the material for use herein can be appropriately selected from substances that are used as an anode of an organic EL element.

The resistance of the transparent electrode is not limited so far as sufficient current for light emission from light-emitting devices can be supplied, but from the viewpoint of power consumption by light-emitting devices, the resistance is preferably low. For example, an ITO substrate with 300 Ω/square or less can function as a device electrode, but at present, a substrate with 10 Ω/square or so is available, and therefore, low-resistance substrates with, for example, 100 to 5 Ω/square, preferably 50 to 5 Ω/square are especially preferably used. The thickness of ITO can be arbitrarily selected in accordance with the resistance value thereof and is generally within a range of 50 to 300 nm in many cases.

3-1-4. Hole Injection Layer, and Hole Transport Layer in Organic Electroluminescent Element The hole injection layer 103 plays a role of efficiently injecting the holes having transferred from the anode 102, into the light-emitting layer 105 or the hole transport layer 104. The hole transport layer 104 plays a role of efficiently transporting the holes injected from the anode 102 or the holes injected from the anode 102 via the hole injection layer 103, into the light-emitting layer 105. The hole injection layer 103 and the hole transport layer 104 each are formed by laminating or mixing one or more of hole injection/transport materials or are formed from a mixture of a hole injection/transport material and a polymer binder. An inorganic salt such as iron (III) chloride may be added to the hole injection/transport material to form a layer.

The hole injection/transport material needs to efficiently inject and transport the holes from the positive electrode between electrodes given an electric field and is one having a high hole injection efficiency and capable of efficiently transporting the injected holes. For that purpose, preferably, the substance has a small ionization potential and has a large hole mobility and is excellent in stability and hardly generates impurities to be traps in production and during use.

The material to form the hole injection layer 103 and the hole transport layer 104 can be arbitrarily selected from compounds heretofore generally used as a charge transport material for holes in a photoconductive material, as well as p-type semiconductors and other known compounds that are used in a hole injection layer and a hole transport layer in an organic electroluminescent element. Specific examples thereof include a carbazole derivative (e.g., N-phenylcarbazole, polyvinylcarbazole), a biscarbazole derivative such as bis(N-arylcarbazole) or bis(N-alkylcarbazole), a triarylamine derivative (e.g., a polymer having an aromatic tertiary amino group in the main chain or the side chain, a triphenylamine derivative such as 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4$,$N^4$-diphenyl-$N^4$,$N^4$-bis(9-phenyl-9H-carbazol-3-yl)-[1,1'-biphenyl]-4,4'-diamine, $N^4$,$N^4$,$N^{4'}$,$N^{4'}$-tetra[1,1'-biphenyl]-4-yl)-[1,1'-biphenyl]-4,4'-diamine, 4,4',4"-tris(3-methylphenyl(phenyl)amino)triphenylamine, N-([1,1'-biphenyl]-4-yl)-9,9-dimethyl-N-(4-(9-phenyl-9H-carbazol-3-yl)phenyl)-9H-fluorene-2-amine, and N,N-bis(4-(dibenzo[b,d]furan-4-yl)phenyl)-[1,1':4',1"-terphenyl]-4-amine, and a starburst amine derivative), a stilbene derivative, a phthalocyanine derivative (e.g., metal-free, or copper phthalocyanine), a pyrazoline derivative, a hydrazone compound, a benzofuran derivative, a thiophene derivative, an oxadiazole derivative, a quinoxaline derivative (e.g., 1,4,5,8,9,12-hexazatriphenylene-2,3,6,7,10,11-hexacarbonitrile), a heterocyclic compound such as a porphyrin derivative, and a polysilane. Regarding the polymer-type substances, a polycarbonate, a styrene derivative, a polyvinyl carbazole and a polysilane having the above-mentioned monomer in the side chain are preferred but are not specifically limited so far as the compounds can form a thin film necessary for production of light-emitting devices and can inject holes from an anode and further can transport holes.

It is known that electric conductivity of organic semiconductors is strongly influenced by doping. Such organic semiconductor matrix substances are formed of compounds having good electron donating performance, or compounds having good electron acceptability. For doping with an electron-donating substance, an electron acceptor such as tetracyanoquinonedimethane (TCNQ) or 2,3,5,6-tetrafluorotetracyano-1,4-benzoquinonedimethane (F4TCNQ) is known (for example, see literature of M. Pfeiffer, A. Beyer, T. Fritz, K. Leo, Appl. Phys. Lett., 73(22), 3202-3204 (1998), and literature of J. Blochwitz, M. Pfeiffer, T. Fritz, K. Leo, Appl. Phys. Lett., 73(6), 729-731 (1998)). These form so-called holes by an electron transfer process in an electron-donating base substance (hole transport substance). Depending on the number of holes and the mobility thereof, the conductivity of the base substance greatly varies. As the matrix substance having a hole transporting property, for example, there are known a benzidine compound (e.g., TPD), and a starburst amine derivative (e.g., TDATA), or a specific metal phthalocyanine (especially, zinc phthalocyanine (ZnPc) or the like) (see JP 2005-167175 A).

The material for the hole injection layer and the material for the hole transport layer described above can also be used for a material for a hole layer as a polymer compound obtained by polymerizing a reactive compound in which a reactive substituent is substituted on these as a monomer, or a crosslinked polymer thereof, or a pendant polymer compound obtained by reacting a main chain type polymer with the reactive compound, or a pendant-type crosslinked polymer. As the reactive substituent in this instance, an explanation for the polycyclic aromatic compound consisting of a substructure represented by Formula (1A) and at least two substructures represented by Formula (1B) can be referred to.

Details of the application of such polymer compound and crosslinked polymer will be described later.

3-1-5. Light-Emitting Layer in Organic Electroluminescent Element

Light-emitting layer 105 is a layer which produces luminescence by allowing holes injected from anode 102 to recombine with electrons injected from cathode 108, between electrodes to which an electric field is applied. A material forming light-emitting layer 105 only needs be a compound (luminescent compound) which produces luminescence by being excited by recombination between the holes and the electrons and is preferably a compound that can forms a stable thin film shape and exhibits strong luminescence (fluorescence) efficiency in a solid state. The light-emitting layer may be formed of a single layer or a plurality of layers, and each layer is formed of a light-emitting layer material (the host material and the dopant material). The host material and the dopant material may be in one kind, or in combination of a plurality of kinds, respectively. For example, emitting and assisting dopants may be used as the dopant material. The dopant material may be wholly contained in the host material or may be partly contained therein. As a doping method, the layer can be formed by vapor code position with the host material, or the dopant material is previously mixed with the host material, and then the resulting mixture may be simultaneously deposited. Further, the light emitting layer can also be formed by a wet film forming method using a light emitting layer forming composition prepared by dissolving materials in an organic solvent.

The polycyclic aromatic compound of the present invention can be preferably used as a material for forming a light emitting layer of an organic electroluminescent element. The polycyclic aromatic compounds of the present invention are more preferably used as an emitting dopant or assisting dopant in the light-emitting layer, and even more preferably as an emitting dopant.

The light-emitting layer comprising the polycyclic aromatic compound of the present invention may comprise a host compound. Here, the kind of the host compound may be one or two or more. In addition, the light emitting layer may be a single layer or a plurality of layers. In addition, the host compound, the emitting dopant material, and the assisting dopant material may be contained in the same layer, and at least one component may be contained in each of a plurality of layers. The host compound and the dopant material (emitting dopant or assisting dopant) contained in the light-emitting layer may be one type or multiple types, respectively. The assisting dopant and the emitting dopant may be wholly contained in the host compound as a matrix or may be partially contained therein.

The amount of the host material used varies depending on the type of the host material and may be determined in accordance with the characteristics of the host material. The amount of the host material to be used is preferably 50 to 99.999% by mass, more preferably 80 to 99.95% by mass, and still more preferably 90 to 99.9% by mass, with respect to the total mass of the light-emitting layer.

The amount of the dopant material used varies depending on the type of the dopant material and may be determined according to characteristics of the dopant material. The amount of the dopant to be used is preferably 0.001 to 50% by mass, more preferably 0.05 to 20% by mass, and still more preferably 0.1 to 10% by mass, with respect to the total mass of the light-emitting layer. The amount within the above-described range is preferred in view of capability of preventing a concentration quenching phenomenon, for example.

On the other hand, in an organic electroluminescent element using a TADF material as a dopant material, it is preferable that the amount of the dopant material used is a low concentration in terms of preventing concentration quenching phenomena, but it is preferable that the amount of the dopant material used is a high concentration in terms of efficiency of the thermally activated delayed fluorescence mechanism. Further, in an organic electroluminescent element using TADF compound as an assisting dopant, the amount of the emitting dopant used is preferably lower than the amount of the assisting dopant used, from the viewpoint of the effectiveness of the thermally activated delayed fluorescence mechanism of the assisting dopant.

In the case where the assisting dopant material is used, a guide of the amount of the host material, the assisting dopant, and the emitting dopant to be used is 40 to 99% by mass, 59 to 1% by mass, and 20 to 0.001% by mass respectively, and is preferably 60 to 95% by mass, 39 to 5% by mass, and 10 to 0.01% by mass, respectively, and more preferably 70 to 90% by mass, 29 to 10% by mass, and 5 to 0.05% by mass, respectively, with respective to the entire material for the light-emitting layer. An assisting dopant material, when used, it may form an exciplex with a host material or an emitting dopant material.

3-1-5-1. Host Compound

Examples of the host material include fused ring derivatives such as anthracene and pyrene, bisstyryl derivatives such as bisstyryl anthracene derivatives and distyrylbenzene derivatives, tetraphenylbutadiene derivatives, cyclopentadiene derivatives, fluorene derivatives, and benzofluorene derivatives, which have been previously known as light emitters.

T1 energy of the host material is preferably higher than T1 energy of the dopant or the assisting dopant having the highest T1 energy in the light emitting layer from the viewpoint of not inhibiting and promoting the generation of TADF in the light emitting layer, and specifically, T1 energy of the host is preferably equal to or higher than 0.01 eV, more preferably equal to or higher than 0.03 eV, and still more preferably equal to or higher than 0.1 eV.

In addition, a TADF active compound may be used for the host-material.

Examples of the host material include a compound represented by the following formula (H1), a compound represented by the following formula (H2), a compound represented by the following formula (H3), a compound containing a structure represented by the following formula (H4), a compound represented by the following formula (H5), and a compound represented by the following formula (H6).

(H1)

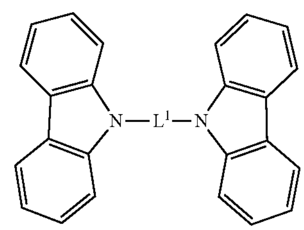

(H2)

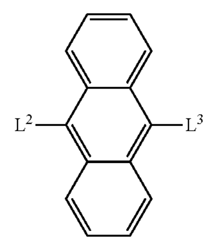

(H3)

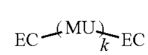

(H4)

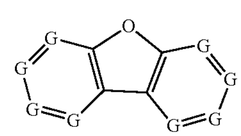

(H5)

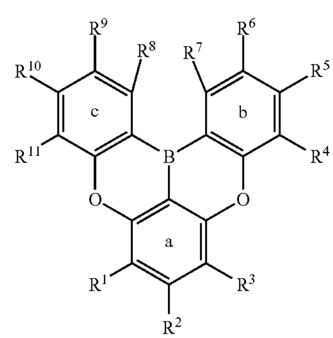

-continued (H6)

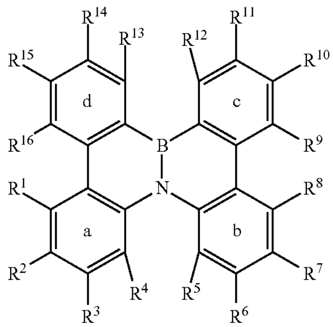

3-1-5-1-1. Compound Represented by Formula (H1)

(H1)

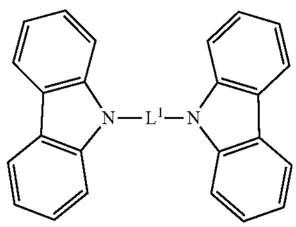

In Formula (H1), L' is an arylene having 6 to 24 carbons, preferably an arylene having 6 to 16 carbons, more preferably an arylene having 6 to 12 carbons, and particularly preferably an arylene having 6 to 10 carbons, and specifically a divalent group of benzene ring, biphenyl ring, naphthalene ring, terphenyl ring, acenaphthylene ring, fluorene ring, phenalene ring, phenanthrene ring, triphenylene ring, pyrene ring, naphthacene ring, perylene ring, pentacene ring or the like.

At least one hydrogen in the compound represented by Formula (H1) may be replaced with an alkyl having 1 to 6 carbons, a cycloalkyl having 3 to 14 carbons, cyano, a halogen or deuterium.

3-1-5-1-2. Compound Represented by Formula (H2)

(H2)

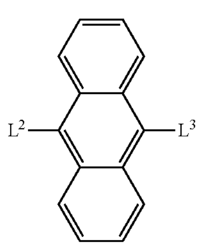

In Formula (H2), $L^2$ and $L^3$ are each independently an aryl having 6 to 30 carbons or a heteroaryl having 2-30 carbons. As an aryl, an aryl having 6-24 carbons is preferable, an aryl having 6-16 carbons is more preferable, an aryl having 6-12 carbons is still more preferable, and an aryl having 6-10 carbons is particularly preferable. Specifically, a monovalent group of benzene ring, biphenyl ring, naphthalene ring, terphenyl ring, acenaphthylene ring, fluorene ring, phenalene ring, phenanthrene ring, triphenylene ring, pyrene ring, naphthacene ring, perylene ring, pentacene ring can be exemplified. As heteroaryl, a heteroaryl having 2-25 carbons is preferable, a heteroaryl having 2-20 carbons is more preferable, a heteroaryl having 2-15 carbons is still more preferable, and a heteroaryl having 2-10 carbons is particularly preferable. Specifically, a monovalent group of pyrrole ring, oxazole ring, isoxazole ring, thiazole ring, isothiazole ring, imidazole ring, oxadiazole ring, thiadiazole ring, triazole ring, tetrazole ring, pyrazole ring, pyridine ring, a pyrimidine ring, pyridazine ring, pyrazine ring, triazine ring, indole ring, isoindole ring, 1H-indazole ring, benzoimidazole ring, benzoxazole ring, benzothiazole ring, 1H-benzotriazole ring, quinoline ring, isoquinoline ring, cinnoline ring, quinazoline ring, quinoxaline ring, phthalazine ring, naphthyridine ring, purine ring, pteridine ring, carbazole ring, acridine ring, phenoxathiin ring, phenoxazine ring, phenothiazine ring, phenazine ring, indolizine ring, furan ring, benzofuran ring, isobenzofuran ring, dibenzofuran ring, thiophene ring, benzothiophene ring, dibenzothiophene ring, furazane ring, oxadiazole ring or thianthrene ring can be exemplified.

At least one hydrogen in the compound represented by Formula (H2) may be replaced with an alkyl having 1 to 6 carbons, a cycloalkyl having 3 to 14 carbons, cyano, a halogen or deuterium.

3-1-5-1-3. Compound Represented by Formula (H3)

$$\mathrm{EC}-(\mathrm{MU})_k-\mathrm{EC} \tag{H3}$$

In Formula (H3),

MU's are each independently a divalent aromatic group, EC's are each independently a monovalent aromatic group, k is an integer of 2 to 50000.

More specifically, MUs are each independently, an arylene, a heteroarylene, a diarylenearylamino, a diarylenearylboryl, an oxaborin-diyl, or an azaborine-diyl.

ECs are each independently, hydrogen, an aryl, a heteroaryl, a diarylamino, a diheteroarylamino, an arylheteroarylamino, or an aryloxy. At least one hydrogen in MU and EC may further be replaced with one or more substituent selected from the group consisting of aryl, heteroaryl, diarylamino, alkyl, and cycloalkyl. k is an integer of 2 to 50000. k is preferably an integer of 20 to 50000, and more preferably an integer of 100 to 50000.

At least one hydrogen in MU and EC in Formula (H3) may be replaced with an alkyl having 1 to 24 carbons, a cycloalkyl having 3 to 24 carbons. Further, any $-CH_2-$ in the above alkyl may be replaced with $-O-$ or $-Si(CH_3)_2-$, any $-CH_2-$ except $-CH_2-$ directly linked to EC in Formula (H3) in the above alkyl may be replaced with an arylene having 6 to 24 carbons, and any hydrogen in the above alkyl may be replaced with fluorine.

Examples of the MU include a divalent derivative of the following structure (e.g., a divalent group obtained by deleting two hydrogens from any of the compounds of the following structures, a divalent group composed of a combination of any two or more of divalent groups each obtained by deleting two hydrogens from any of the compounds of the following structures, a divalent group in which at least one of hydrogens in those groups is replaced with an alkyl or the like).

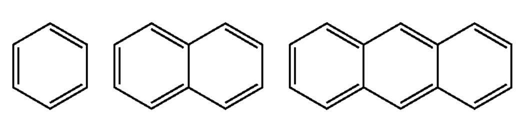

-continued
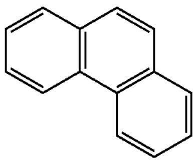
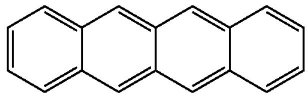
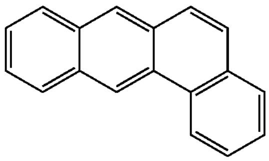
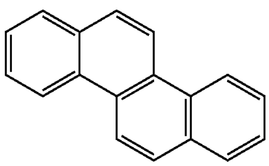
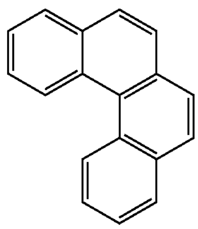
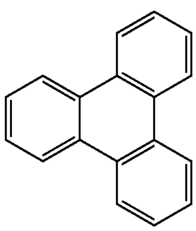
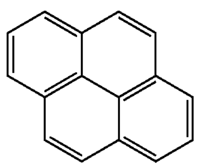
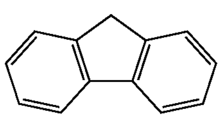
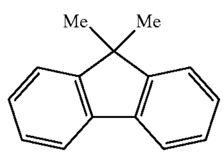
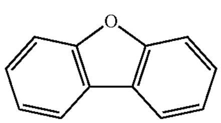
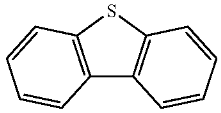
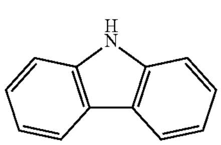
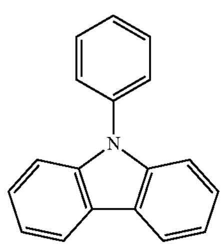
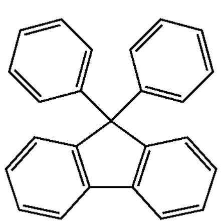
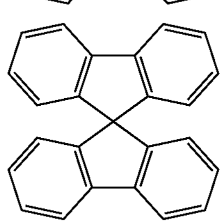
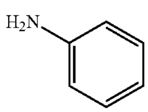
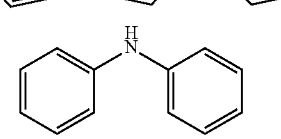
-continued
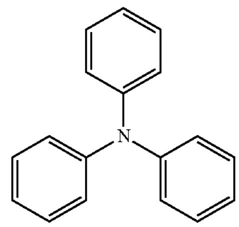
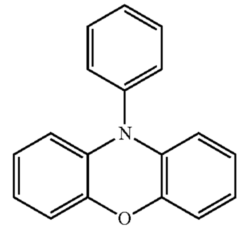
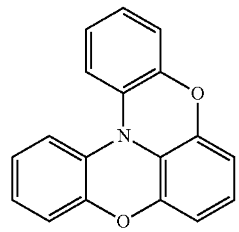
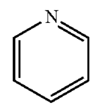
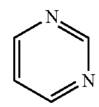
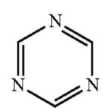
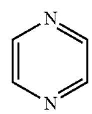
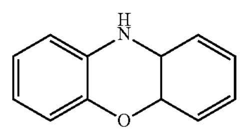
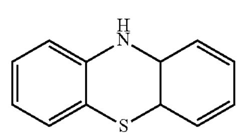
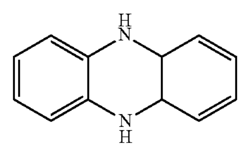
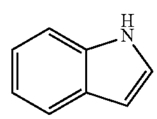
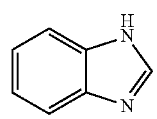
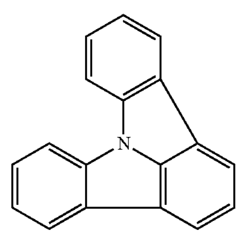
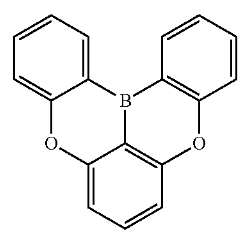
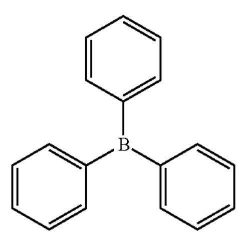
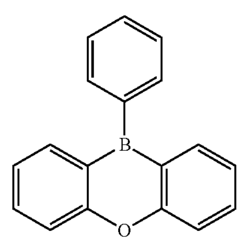
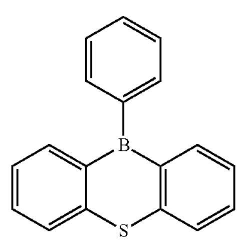
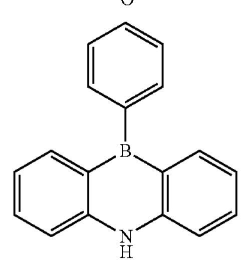

-continued
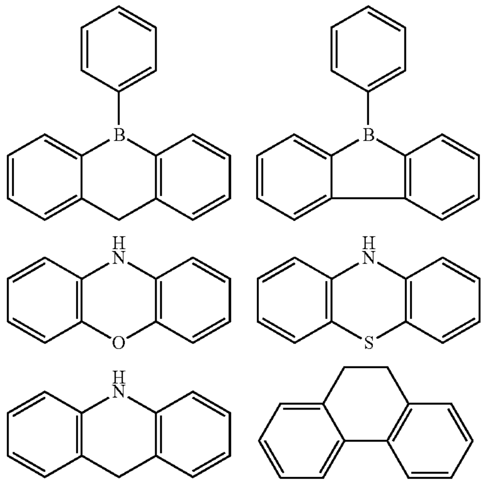
More specifically, a divalent group having any of the following structures can be exemplified. In these structures, the MU binds to another MU or EC at *.
(MU-1-1)
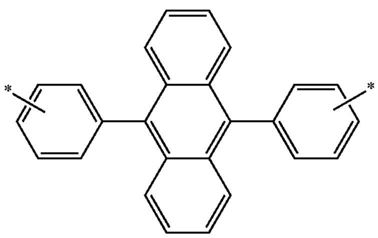
(MU-1-2)
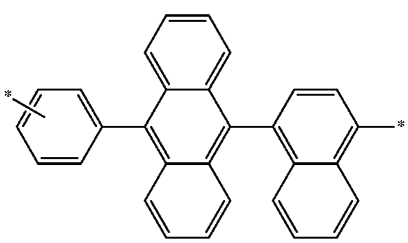
(MU-1-3)
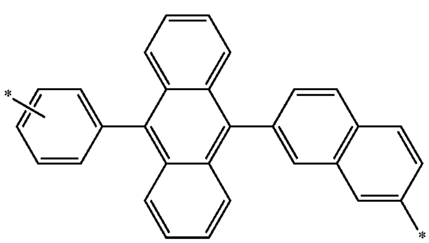
(MU-1-4)
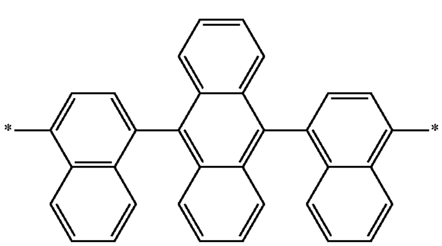
-continued
(MU-1-5)
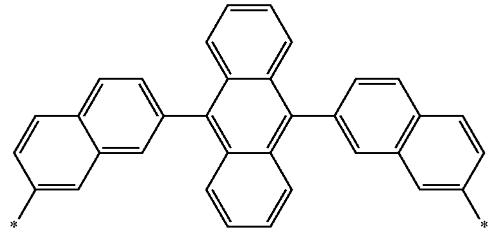
(MU-1-6)
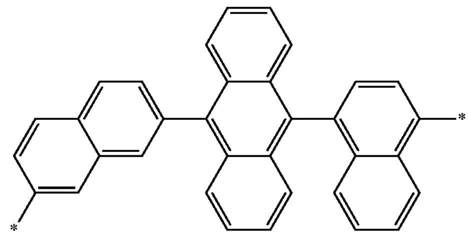
(MU-1-11)
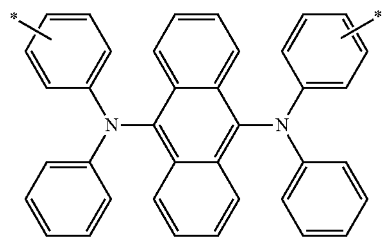
(MU-1-12)
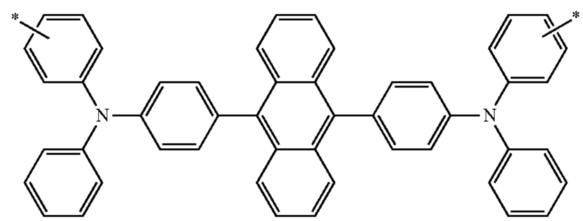
(MU-2-1)
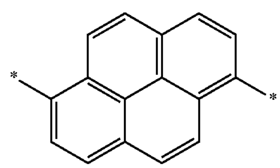
(MU-2-2)
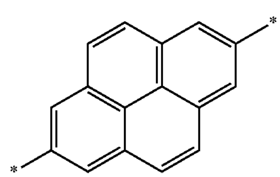
(MU-2-3)
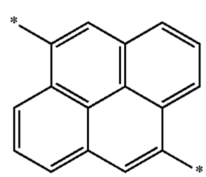

-continued
(MU-2-4)
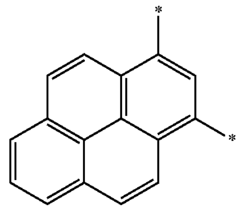
(MU-2-5)
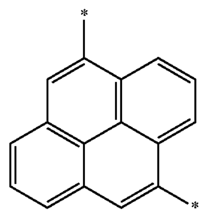
(MU-2-11)
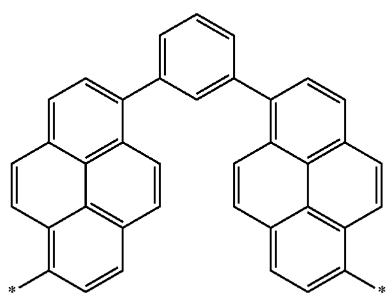
(MU-2-12)
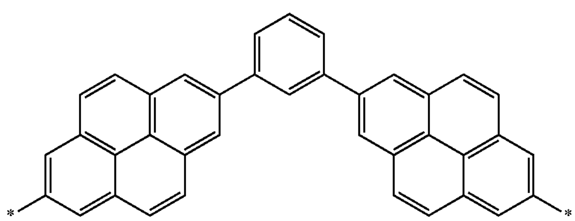
(MU-2-101)
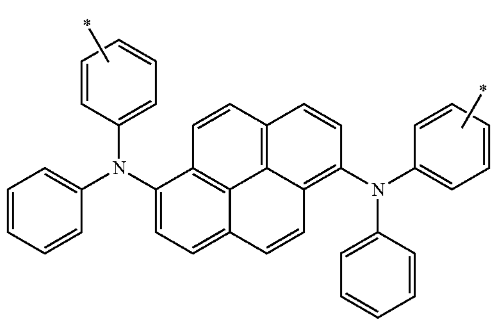
-continued
(MU-2-102)
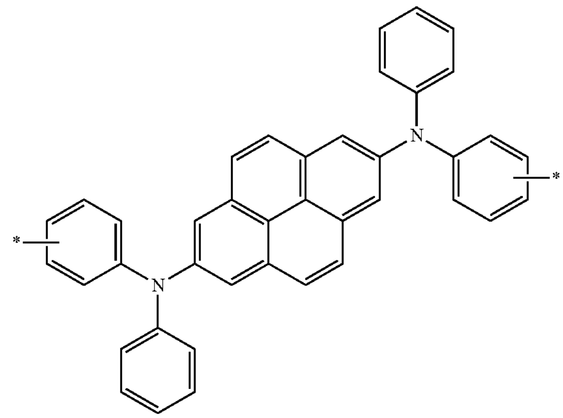
(MU-2-201)
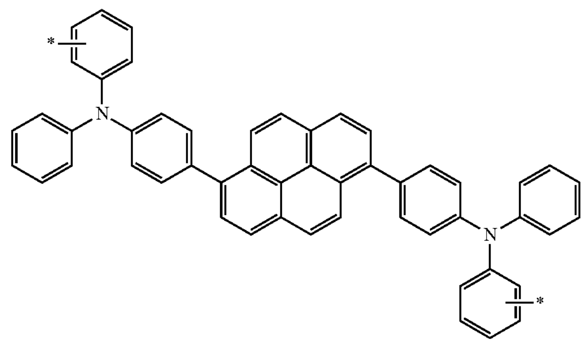
(MU-2-202)
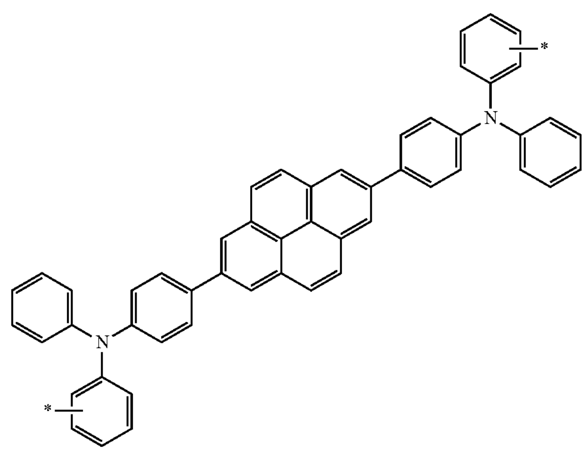
(MU-3-1)
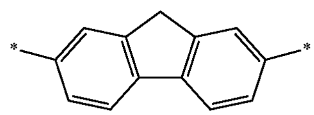
(MU-3-2)
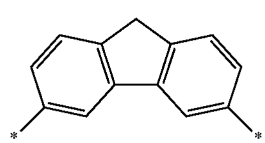

-continued
(MU-3-11)
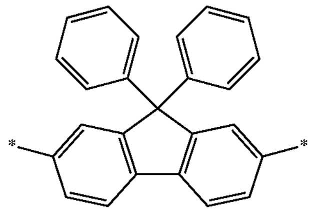
(MU-3-12)
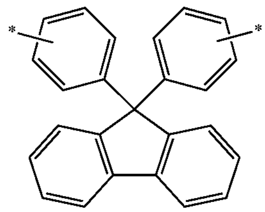
(MU-3-21)
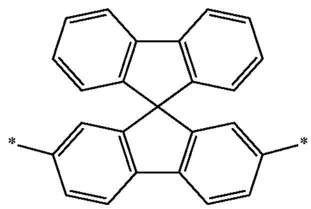
(MU-3-22)
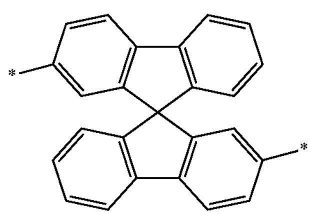
(MU-3-101)
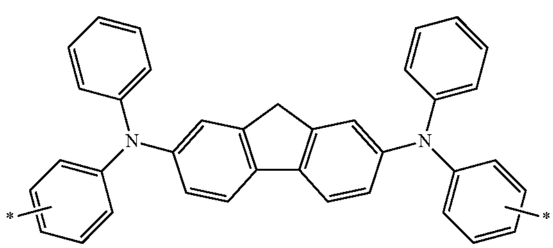
(MU-3-102)
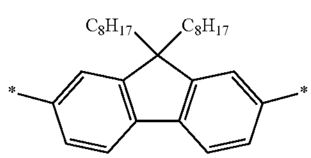
(MU-3-111)
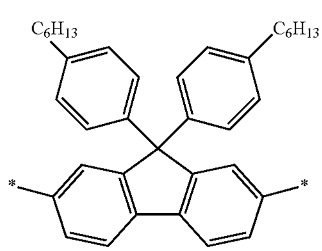
-continued
(MU-3-112)
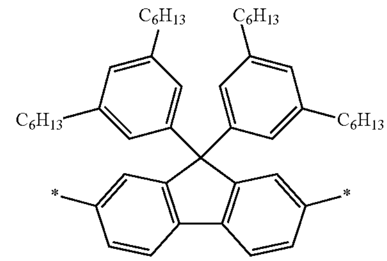
(MU-3-201)
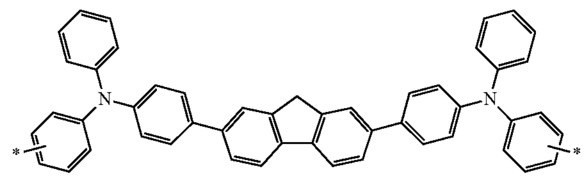
(MU-4-1)
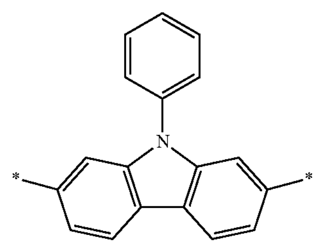
(MU-4-2)
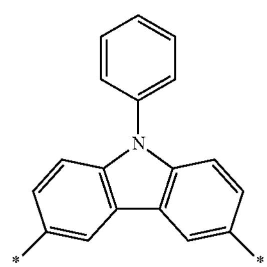
(MU-4-11)
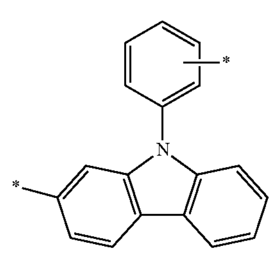
(MU-4-12)
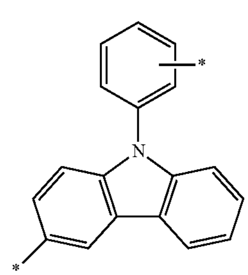

-continued
(MU-4-101)
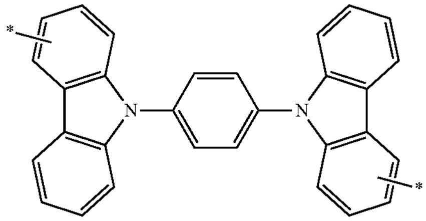
(MU-4-102)
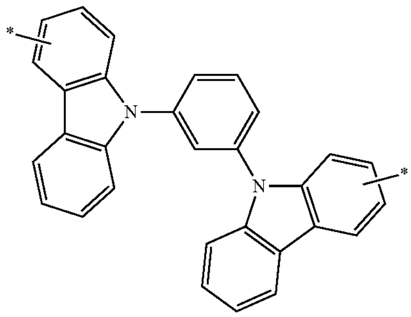
(MU-4-121)
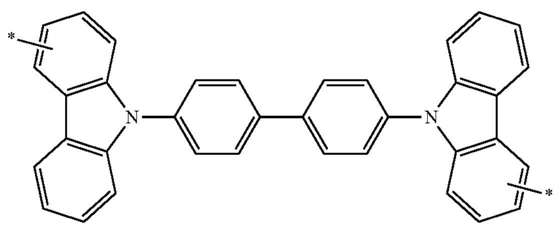
(MU-4-122)
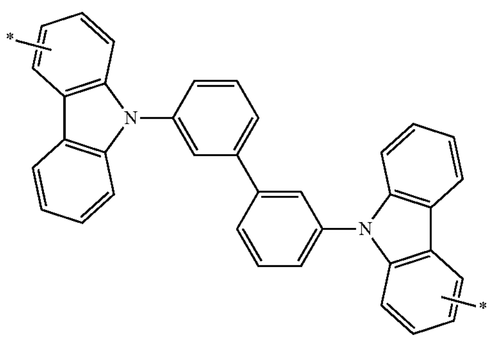
(MU-5-1)
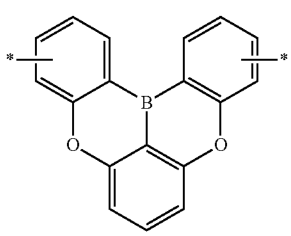
-continued
(MU-5-2)
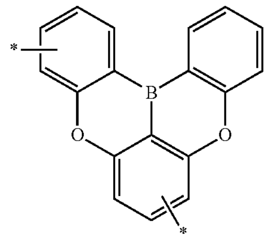
(MU-5-11)
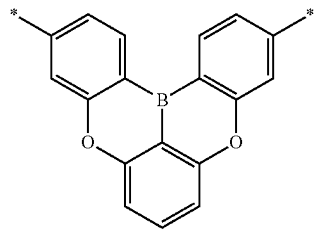
(MU-5-12)
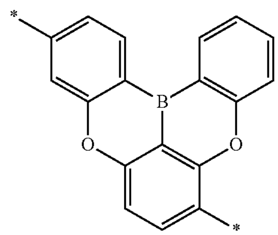
(MU-6-1)
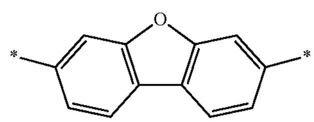
(MU-6-2)
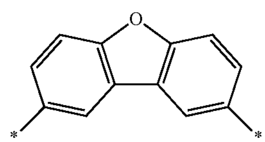
(MU-6-3)
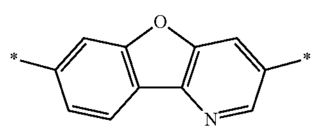
(MU-6-4)
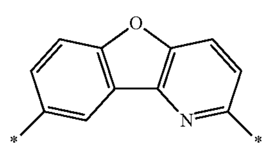
(MU-7-1)
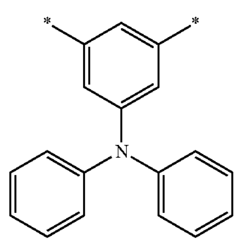

-continued
(MU-7-2)
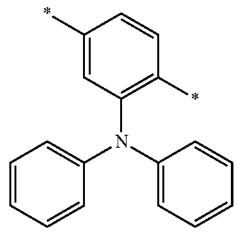
(MU-7-3)
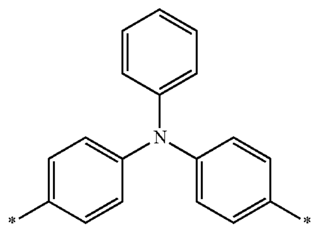
(MU-7-4)
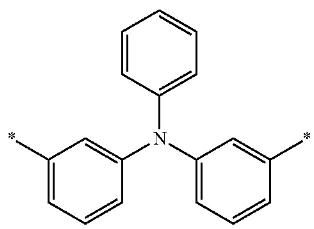
(MU-7-31)
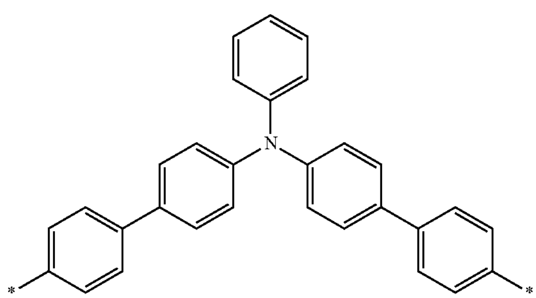
(MU-7-32)
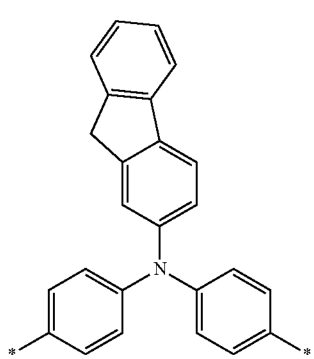
-continued
(MU-7-33)
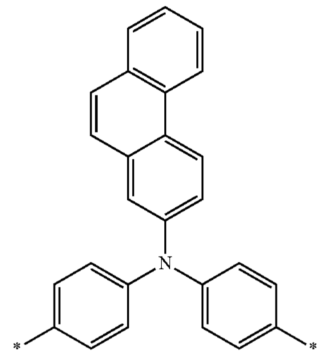
(MU-7-34)
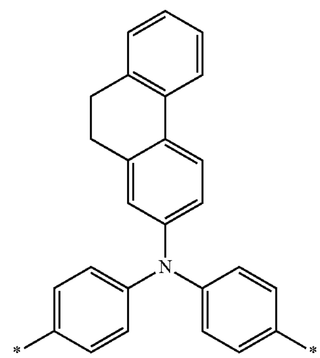
(MU-7-35)
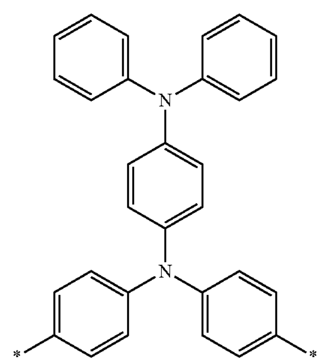
(MU-7-36)
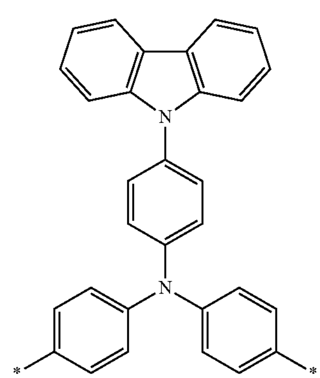

-continued
(MU-7-37)
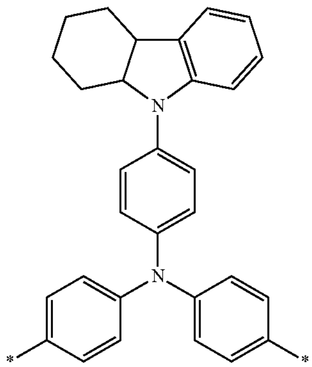
(MU-7-38)
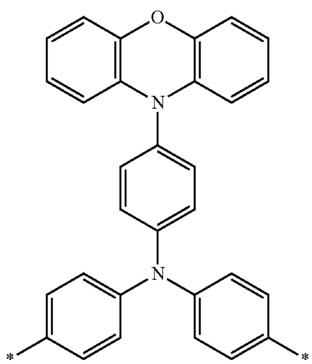
(MU-8-1)
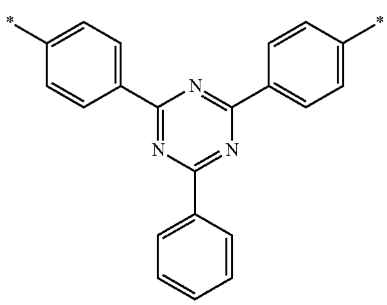
(MU-8-2)
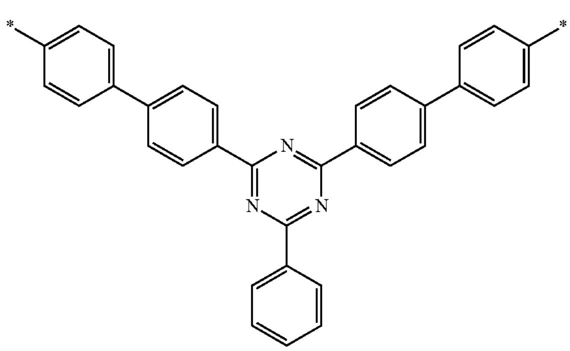
-continued
(MU-8-3)
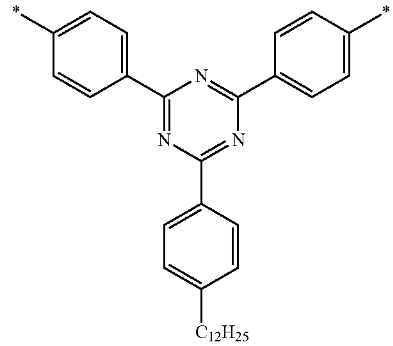
(MU-9-1)
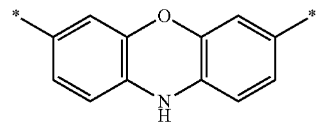
(MU-9-2)
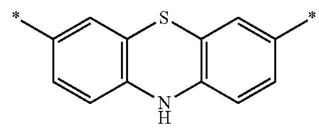
(MU-9-3)
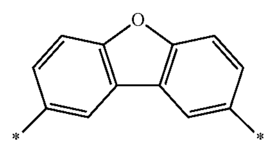
(MU-9-4)
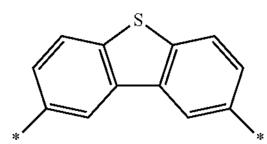
Further, as EC, an example includes a monovalent group represented by any of the following structures. In these substituents, EC binds to MU at *.
(EC-1)
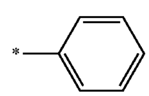
(EC-2)
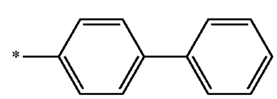
(EC-3)
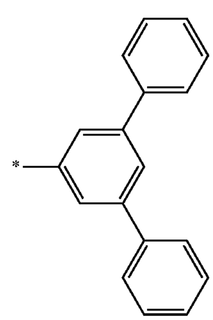

-continued
(EC-4)
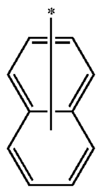
(EC-5)
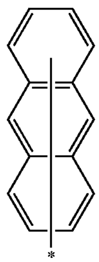
(EC-6)
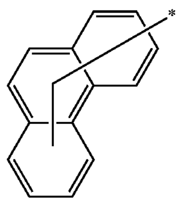
(EC-7)
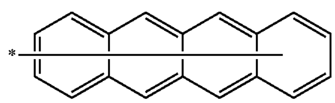
(EC-8)
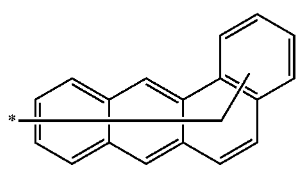
(EC-9)
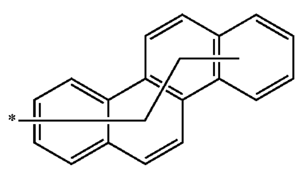
(EC-10)
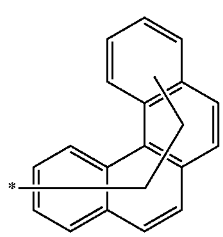
(EC-11)
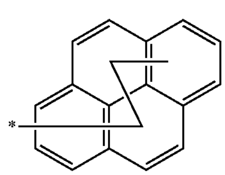
-continued
(EC-21)
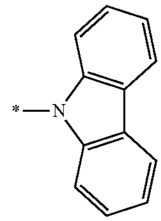
(EC-22)
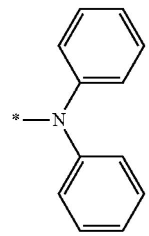
(EC-23)
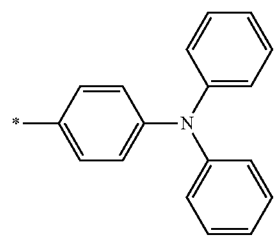
(EC-24)
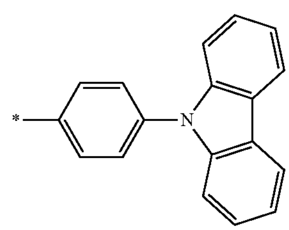
(EC-25)
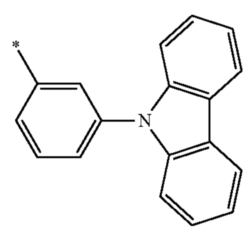
(EC-26)
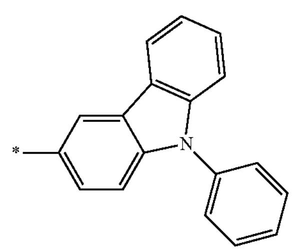

-continued (EC-27)

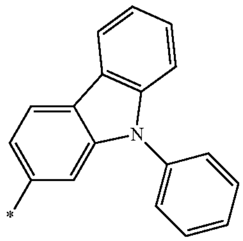

(EC-28)

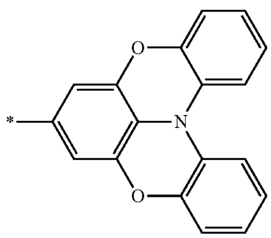

(EC-29)

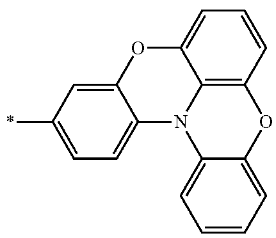

From the viewpoint of solubility and coating formability, the compound represented by formula (H3) preferably has an alkyl having 1 to 24 carbons in an MU of 10 to 100% of the total number of MU (k) in the molecule, more preferably, an MU having 30 to 100% of the total number of MU (k) in the molecule has an alkyl having 1 to 18 carbons (branched chain alkyl having 3 to 18 carbons), and still more preferably, an MU having 50 to 100% of the total number of MU (k) in the molecule has an alkyl having 1 to 12 carbons (branched chain alkyl having 3 to 12 carbons). On the other hand, from the viewpoint of in-plane orientation and charge transport, it is preferable that an MU of 10 to 100% of the total number of MU (k) in the molecule has an alkyl having 7 to 24 carbons, and it is more preferable that an MU of 30 to 100% of the total number of MU (k) in the molecule has an alkyl having 7 to 24 carbons (branched chain alkyl having 7 to 24 carbons).

3-1-5-1-4. A Compound Containing a Structure Represented by Formula (H4)

A compound containing a structure represented by Formula (H4) contains preferably 1 to 5, more preferably 1 to 3, still more preferably 1 to 2, and most preferably 1 of structures represented by Formula (H4), and when a plurality of the structures is contained, the structures are bonded to each other by a direct single bond or a particular linking group.

(H4)

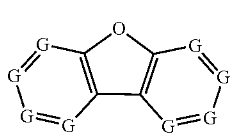

In Formula (H4), G is "═C(—H)—" or "═N—", and H in the aforementioned "═C(—H)—" may be replaced with a substituent or another structure represented by Formula (H4).

As a compound containing a structure represented by Formula (H4), for example, a compound described in WO 2012/153780 and WO 2013/038650 and the like can be used and can be produced according to the method described in the aforementioned documents.

Examples of substituents when H in "═C(—H)—" which is G is replaced include an aryl, a heteroaryl, a substituted silyl, a substituted phosphine oxide group, and a substituted carboxy.

Specific examples of "aryl" which is a substituent include phenyl, tolyl, xylyl, naphthyl, phenanthryl, pyrenyl, chrysenyl, benzo[c]phenanthryl, benzo[g]chrysenyl, benzoanthryl, triphenylenyl, fluorenyl, 9,9-dimethylfluorenyl, benzofluorenyl, dibenzofluorenyl, biphenylyl, terphenylyl, quaterphenylyl, fluoranthenyl, and the like, and preferably phenyl, biphenylyl, terphenylyl, quaterphenylyl, naphthyl, triphenylenyl, and fluorenyl. Examples of the aryl having a substituent include tolyl, xylyl, and 9,9-dimethylfluorenyl. As the specific examples show, the aryl includes both fused and non-fused aryl.

Specific examples of "heteroaryl" which is a substituent include pyrrolyl, pyrazolyl, pyrazinyl, pyrimidinyl, pyridazinyl, pyridyl, triazinyl, indolyl, isoindolyl, imidazolyl, benzimidazolyl, indazolyl, imidazo[1,2-a]pyridinyl, furyl, benzofuranyl, isobenzofuranyl, dibenzofuranyl, azadibenzofuranyl, thienyl, benzothienyl, dibenzothienyl, azadibenzothienyl, quinolyl, isoquinolyl, quinoxalinyl, quinazolinyl, naphthyridinyl, carbazolyl, azacarbazolyl phenanthridinyl, acridinyl, phenanthrolinyl, phenazinyl, phenothiazinyl, phenoxazinyl, oxazolyl, oxadiazolyl, furazanyl, benzoxazolyl, thiazolyl, thiadiazolyl, benzothiazolyl, triazolyl, tetrazolyl, and the like, and preferably dibenzofuranyl, dibenzothienyl, carbazolyl, pyridyl, pyrimidinyl, triazinyl, azadibenzofuranyl, and azadibenzothienyl. Further preferred are dibenzofuranyl, dibenzothienyl, azadibenzofuranyl or azadibenzothienyl.

It is also preferred that "substituted silyl" which is a substituent is a group selected from the group consisting of a substituted or unsubstituted trialkylsilyl, a substituted or unsubstituted arylalkylsilyl, and a substituted or unsubstituted triarylsilyl.

Specific examples of the substituted or unsubstituted trialkylsilyl include trimethylsilyl and triethylsilyl. Specific examples of the substituted or unsubstituted arylalkylsilyl include diphenylmethylsilyl, ditolylmethylsilyl and phenyldimethylsilyl. Specific examples of the substituted or unsubstituted triarylsilyl include triphenylsilyl and tritolylsilyl.

It is also preferred that the "substituted phosphine oxide group" which is a substituent is a substituted or unsubstituted diarylphosphine oxide group. Specific examples of the substituted or unsubstituted diarylphosphine oxide group include diphenylphosphine oxide and ditolylphosphine oxide.

Examples of the "substituted carboxy" which is a substituent include benzoyloxy and the like.

Examples of the linking group for binding a plurality of structures represented by Formula (H4) include 2 to 4 valent, 2 to 3 valent, or 2 valent derivatives of the aryl or heteroaryl described above.

Specific examples of the compound containing a structure represented by Formula (H4) are shown below.

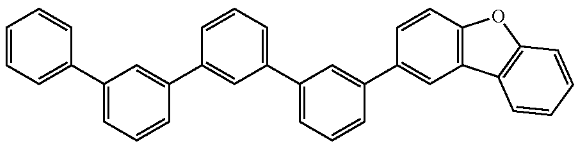
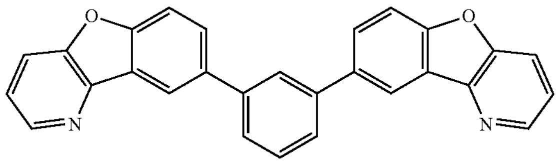
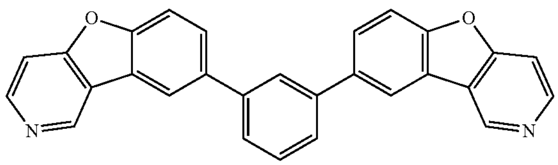
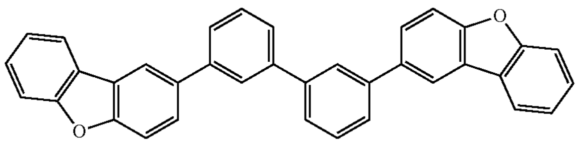
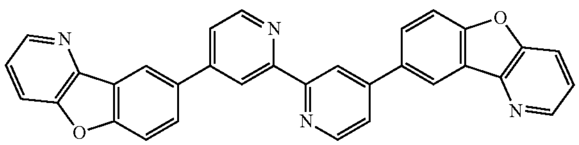
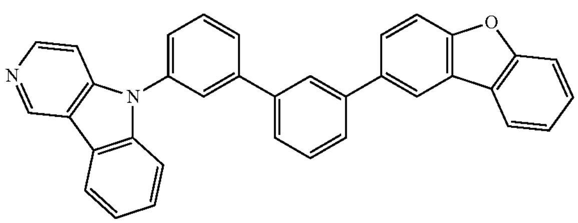
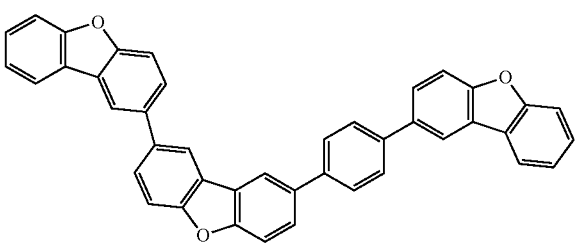
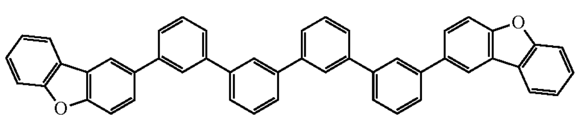
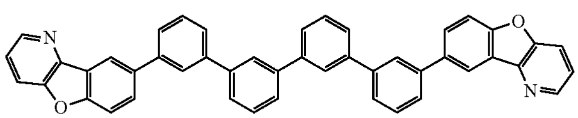
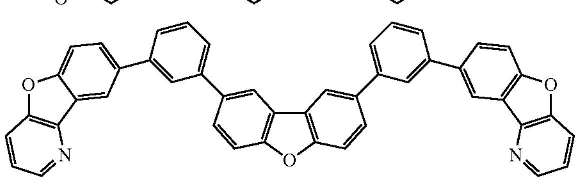
-continued
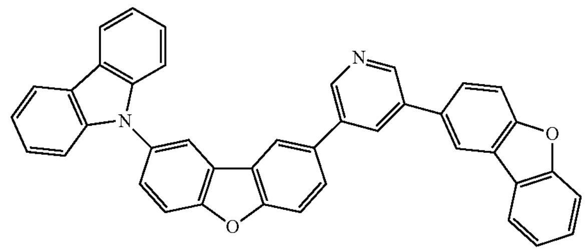
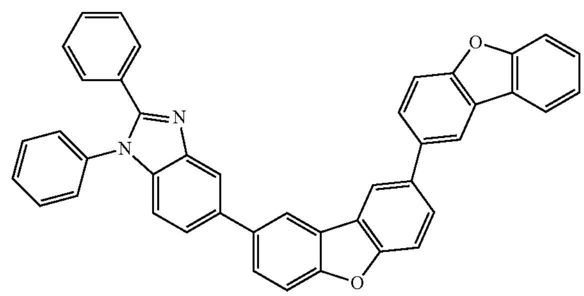
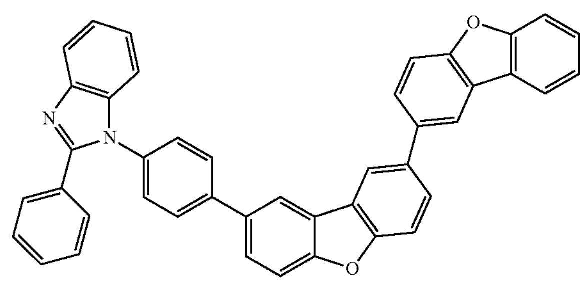
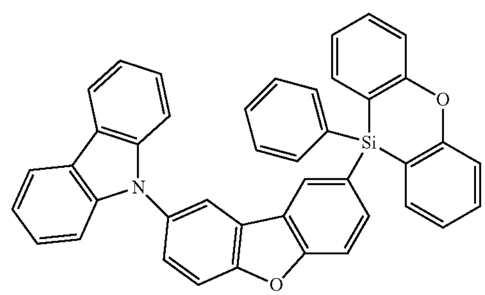
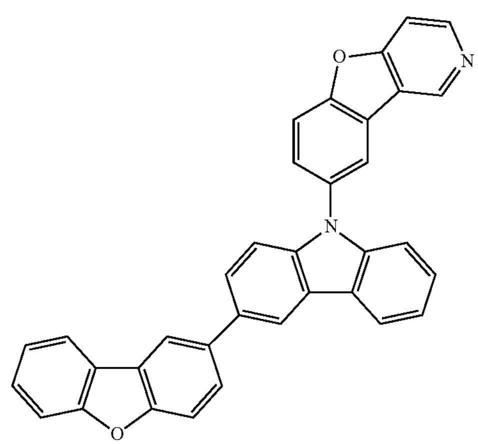

-continued

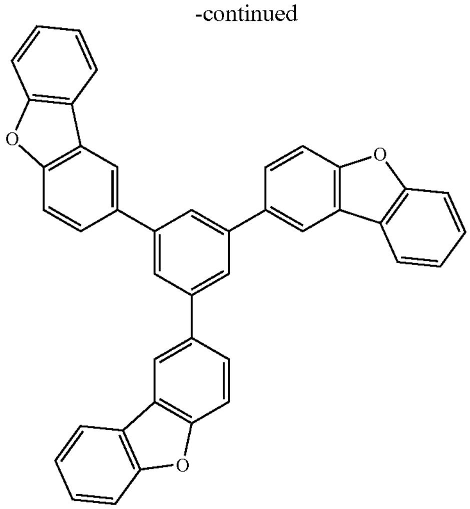

3-1-5-1-5. Compound Represented by Formula (H5), and Compound Represented by Formula (H6). 3-1-5-1-5-1. Compound Represented by Formula (H5)

(H5)

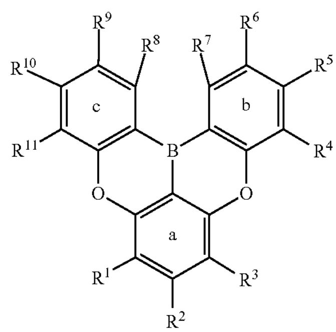

In Formula (H5), $R^1$ to $R^{11}$ are each independently, hydrogen, an aryl, a heteroaryl, a diarylamino, a diheteroarylamino, an arylheteroarylamino, or an aryloxy, and at least one hydrogen in these may further be replaced with an aryl, a heteroaryl, or a diarylamino.

Adjacent groups of $R^1$ to $R^{11}$ may be bonded to form an aryl ring or a heteroaryl ring together with a ring, b ring or c ring, and at least one hydrogen in the formed ring may be replaced with an aryl, a heteroaryl, a diarylamino, a diheteroarylamino, an arylheteroarylamino, an alkyl, or an aryloxy, wherein at least one hydrogen in these may be replaced with an aryl, a heteroaryl, or a diarylamino.

Any at least one (preferably from 1 to 3) —C(Rn)═(n is from 1 to 11) in Formula (H5) may be replaced with —N═.

Further, at least one hydrogen in the compound represented by Formula (H5) may be replaced with an alkyl having 1 to 24 carbons, and further any —$CH_2$— in the alkyl may be replaced with —O— or —$Si(CH_3)_2$—, and any —$CH_2$— in the alkyl, except for —$CH_2$— directly connected to Formula (H5), may be replaced with an arylene having 6 to 24 carbons, and any hydrogen in the alkyl may be replaced with fluorine.

Further, at least one hydrogen in the compound represented by Formula (H5) may be replaced with a halogen or deuterium.

In Formula (H5), adjacent groups of $R^1$ to $R^{11}$ may be bonded to form an aryl ring or a heteroaryl ring together with an a ring, a b ring or a c ring, and at least one hydrogen in the formed ring may be replaced with an aryl, a heteroaryl, a diarylamino, a diheteroarylamino, an arylheteroarylamino, or an aryloxy, wherein at least one hydrogen in these may be replaced with an aryl, a heteroaryl, or a diarylamino. A compound in which "adjacent groups are bonded to form an aryl ring or a heteroaryl ring together with a ring, b ring or c ring" corresponds, for example, to compounds such as those represented by Formula (H5-2) to Formula (H5-17), which are listed as specific compounds below. That is, compounds formed by fusing a benzene ring, an indole ring, a pyrrole ring, a benzofuran ring, or a benzothiophene ring to a ring (or b ring or c ring), for example, and the fused ring formed is a naphthalene ring, a carbazole ring, an indole ring, a dibenzofuran ring or a dibenzothiophene ring, respectively.

3-1-5-1-5-2. Compound Represented by Formula (H6)

(H6)

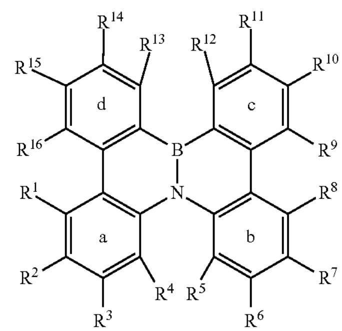

In Formula (H6), $R^1$ to $R^{16}$ are each independently, hydrogen, an aryl, a heteroaryl, a diarylamino, a diheteroarylamino, an arylheteroarylamino, or an aryloxy, and at least one hydrogen in these may further be replaced with an aryl, a heteroaryl, or a diarylamino.

Adjacent groups of $R^1$ to $R^{16}$ may be bonded to form an aryl ring or a heteroaryl ring together with an a ring, a b ring, a c ring, or a d ring, and at least one hydrogen in the formed ring may be replaced with an aryl, a heteroaryl, a diarylamino, a diheteroarylamino, an arylheteroarylamino, an alkyl, or an aryloxy, wherein at least one hydrogen in these may be replaced with an aryl, a heteroaryl, or a diarylamino.

Further, at least one hydrogen in the compound represented by Formula (H6) may be replaced with an alkyl having 1 to 24 carbons, and further any —$CH_2$— in the alkyl may be replaced with —O— or —$Si(CH_3)_2$—, and any —$CH_2$— in the alkyl, except for —$CH_2$— directly connected to Formula (H6), may be replaced with an arylene having 6 to 24 carbons, and any hydrogen in the alkyl may be replaced with fluorine.

Further, at least one hydrogen in the compound represented by Formula (H6) may be replaced with a halogen or deuterium.

In Formula (H6), adjacent groups of $R^1$ to $R^{16}$ may be bonded to form an aryl ring or a heteroaryl ring together with an a ring, a b ring, a c ring, or a d ring, and at least one hydrogen in the formed ring may be replaced with an aryl, a heteroaryl, a diarylamino, a diheteroarylamino, an arylheteroarylamino, or an aryloxy, wherein at least one hydrogen in these may be replaced with an aryl, a heteroaryl, or a diarylamino. A compound in which "adjacent groups are bonded to form an aryl ring or a heteroaryl ring together with an a ring, a b ring, a c ring, or a d ring" can be explained by referring to, for example, compounds such as those represented by Formula (H6-2) to Formula (H6-5), which are listed as specific compound represented by (H6) below. That is, compounds formed by fusing a benzene ring, an indole ring, a pyrrole ring, a benzofuran ring, or a benzothiophene ring to a ring (or b ring, c ring, or d ring), for example, and the fused ring formed is a naphthalene ring, a carbazole ring, an indole ring, a dibenzofuran ring or a dibenzothiophene ring, respectively.

3-1-5-1-5-3. "$R^1$ to $R^{11}$ in Formula (H5)" and "$R^1$ to $R^{16}$ in Formula (H6)"

"$R^1$ to $R^{11}$ in Formula (H5)" and "$R^1$ to $R^{16}$ in Formula (H6)" are each independently, hydrogen, aryl, heteroaryl, diarylamino, diheteroarylamino, arylheteroarylamino, or aryloxy and preferably are aryl having 6 to 30 carbons, heteroaryl having 2 to 30 carbons, diarylamino(amino having two aryls each having 6 to 30 carbons), diheteroarylamino(amino having two heteroaryls each having 2 to 30 carbons), arylheteroarylamino(amino having an aryl having 6 to 30 carbons and a heteroaryl having 2 to 30 carbons), or aryloxy having 6 to 30 carbons.

Specific examples of "aryl", aryl in "diarylamino", aryl in "arylheteroarylamino", and aryl in "aryloxy" include monovalent groups of a monocyclic benzene ring, a bicyclic biphenyl ring, a fused bicyclic naphthalene ring, a tricyclic terphenyl ring (m-terphenyl, o-terphenyl, p-terphenyl), a fused tricyclic acenaphthylene ring, fluorene ring, phenalene ring and phenanthrene ring, a fused tetracyclic triphenylene ring, pyrene ring and naphthacene ring, a fused pentacyclic perylene ring and pentacene ring. Furthermore, as described below, these aryls substituted with heteroaryls defined below are also defined as aryl in Formula (H5) and Formula (H6).

As "heteroaryl", heteroaryl of "diheteroarylamino", and heteroaryl of "arylheteroarylamino", a monovalent group of pyrrole ring, oxazole ring, isoxazole ring, thiazole ring, isothiazole ring, imidazole ring, oxadiazole ring, thiadiazole ring, triazole ring, tetrazole ring, pyrazole ring, pyridine ring, a pyrimidine ring, pyridazine ring, pyrazine ring, triazine ring, indole ring, isoindole ring, 1H-indazole ring, benzoimidazole ring, benzoxazole ring, benzothiazole ring, 1H-benzotriazole ring, quinoline ring, isoquinoline ring, cinnoline ring, quinazoline ring, quinoxaline ring, phthalazine ring, naphthyridine ring, purine ring, pteridine ring, carbazole ring, acridine ring, phenoxathiin ring, phenoxazine ring, phenothiazine ring, phenazine ring, indolizine ring, furan ring, benzofuran ring, isobenzofuran ring, dibenzofuran ring, thiophene ring, benzothiophene ring, dibenzothiophene ring, furazane ring, oxadiazole ring or thianthrene ring, or any one of the above heteroaryl that is N-aryl substituted can be exemplified. Furthermore, as described below, these heteroaryls substituted with aryls defined above are also defined as heteroaryl in Formula (H5) and Formula (H6).

Furthermore, at least one hydrogen in an aryl, a heteroaryl, a diarylamino, a diheteroarylamino, an arylheteroarylamino, or an aryloxy which are described as $R^1$ to $R^{11}$ in Formula (H5) and $R^1$ to $R^{16}$ in Formula (H6) may further be replaced with an aryl, a heteroaryl, or a diarylamino. Examples of the aryl, the heteroaryl, or the diarylamino thus substitutes include the same groups explained for $R^1$ to $R^{11}$ and $R^1$ to $R^{16}$.

Specific examples of $R^1$ to $R^{11}$ and $R^1$ to $R^{16}$ include groups represented by the following Formulas (RG-1) to (RG-10). Note that the group represented by each of the following formula (RG-1) to formula (RG-10) is bonded to Formula (H5) or Formula (H6) at the position of *.

(RG-1)

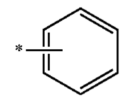

(RG-2)

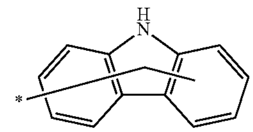

(RG-3)

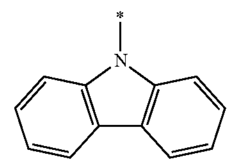

(RG-4)

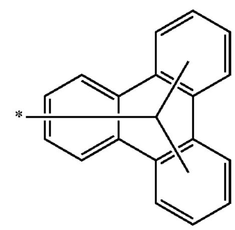

(RG-5)

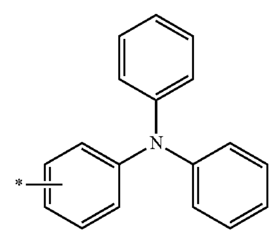

(RG-6)

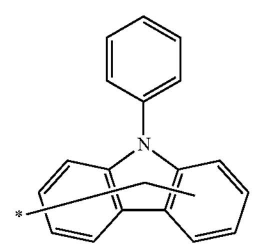

(RG-7)

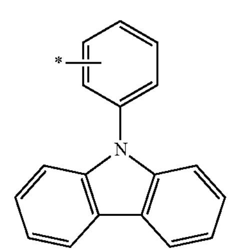

(RG-8)

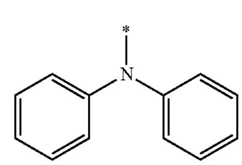

-continued (RG-9)

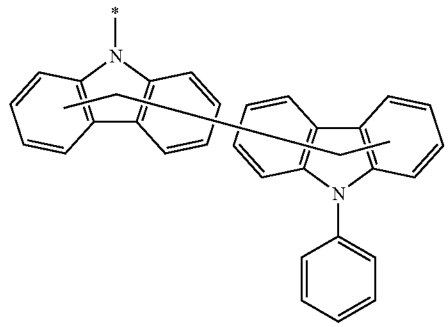

(RG-10)

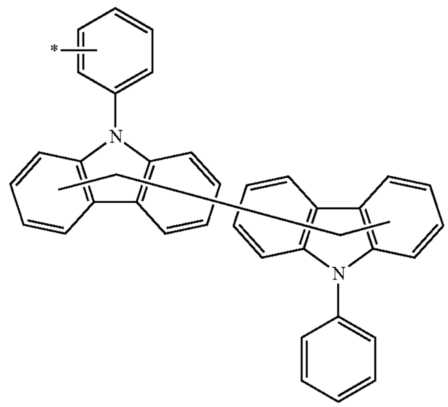

With reference to the specific groups described above, description will be given of "aryl" and "heteroaryl" defined in Formula (H5) and Formula (H6), wherein each of Formula (RG-1), Formula (RG-4), and Formula (RG-7) is an aryl, each of Formula (RG-2), Formula (RG-3), and Formula (RG-6) is a heteroaryl, Formula (RG-9) is a heteroaryl substituted by a heteroaryl, and Formula (RG-10) is an aryl substituted by a heteroaryl. Formula (RG-5) is an aryl (phenyl) substituted by a diarylamino (diphenylamino), and Formula (RG-8) is a diarylamino (diphenylamino).

(RG-9)

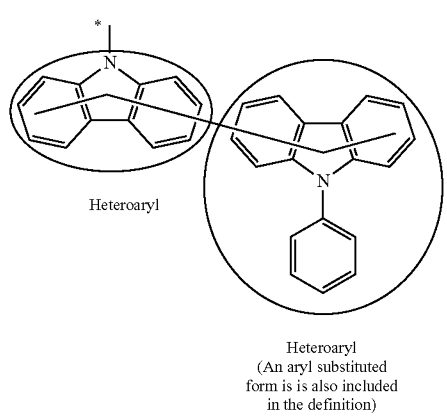

-continued (RG-10)

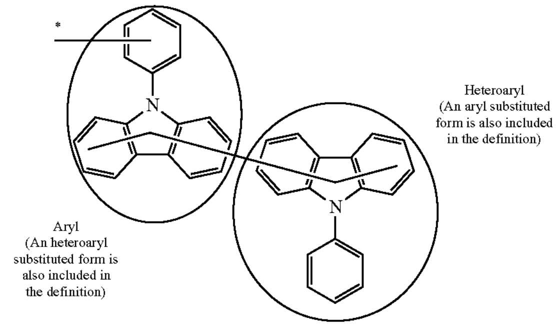

3-1-5-1-5-4. Ring Formed from the Adjacent Groups of a Ring, b Ring or c Ring Bonded to Each Other in Formula (H5), and a Ring Formed from the Adjacent Groups of a Ring, b Ring, c Ring or d Ring Bonded to Each Other in Formula (H6)

As the "aryl ring formed from any adjacent groups among $R^1$ to $R^{11}$ bonded to each other together with a ring, b ring or c ring" in Formula (H5) and the "aryl ring formed from any adjacent groups among $R^1$ to $R^{16}$ bonded to each other together with a ring, b ring, c ring or the d ring" in Formula (H6), for example, an aryl ring having 6 to 30 carbons is exemplified, an aryl ring having 6 to 16 carbons is preferred, an aryl ring having 6 to 12 carbons is more preferred, and an aryl ring having 6 to 10 carbons is particularly preferred. However, the number of carbons of the aryl ring formed includes 6 carbons of a ring, b ring, c ring or d ring.

Specific examples of the aryl formed include naphthalene ring as a fused bicyclic ring, acenaphthylene ring, fluorene ring, phenalene ring, and phenanthrene ring as a fused tricyclic ring, triphenylene ring, pyrene ring, and naphthacene ring as a fused tetracyclic ring, perylene ring and pentacene ring as a fused pentacyclic ring As the "heteroaryl ring formed from any adjacent groups among $R^1$ to $R^{11}$ bonded to each other together with a ring, b ring or c ring", in Formula (H5) and the "heteroaryl ring formed from any adjacent groups among $R^1$ to $R^{16}$ bonded to each other together with a ring, b ring, C ring or the d ring" in Formula (H6), for example, a heteroaryl ring having 6 to 30 carbons is exemplified, a heteroaryl ring having 6 to 25 carbons is preferred, a heteroaryl ring having 6 to 20 carbons is more preferred, a heteroaryl ring having 6 to 15 carbons is further preferred, and a heteroaryl ring having 6 to 10 carbons is particularly preferred. Further, examples of the "heteroaryl ring" include a hetero ring containing 1 to 5 heteroatoms selected from oxygen, sulfur, and nitrogen in addition to carbon as ring constituting atoms. Note that, the number of carbons of the heteroaryl ring formed includes 6 carbons of a ring, b ring, c ring or d ring.

Specific examples of the heteroaryl ring that is formed include an indole ring, an isoindole ring, a 1H-indazole ring, a benzimidazole ring, a benzooxazole ring, a benzothiazole ring, a 1H-benzotriazol ring, a quinoline ring, an isoquinoline ring, a cinnoline ring, a quinazoline ring, a quinoxaline ring, a phthalazine ring, a carbazole ring, an acridine ring, a phenoxathiin ring, a phenoxazine ring, a phenothiazine ring, a phenazine ring, benzofuran ring, an isobenzofuran ring, a dibenzofuran ring, a benzothiophene ring, a dibenzothiophene ring, and a thianthrene ring.

At least one hydrogen in the formed ring may be replaced with an aryl, a heteroaryl, a diarylamino, a diheteroarylamino, an arylheteroarylamino, an alkyl, or an aryloxy, wherein at least one hydrogen in these may be replaced with an aryl, a heteroaryl, or a diarylamino. For this explanation, the explanations of $R^1$ to $R^{11}$ in Formula (H5) and $R^1$ to $R^{16}$ in Formula (H6) can be quoted.

3-1-5-1-5-5. Specific Examples of Compounds

More specific structures of compounds represented by Formula (H5) or Formula (H6) are shown below.

The specific structures of the compounds represented by Formula (H5) or Formula (H6) below may be substituted with one or more alkyls having 1 to 24 carbons.

(H5-1)

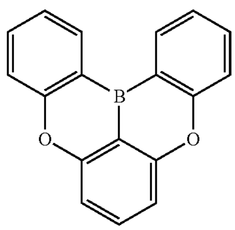

(H5-2)

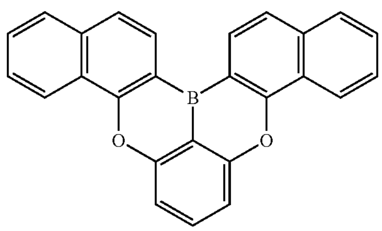

(H5-3)

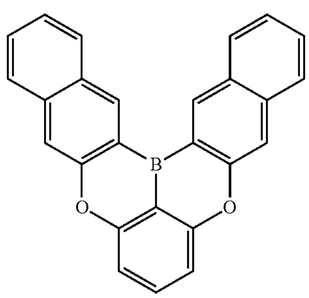

(H5-4)

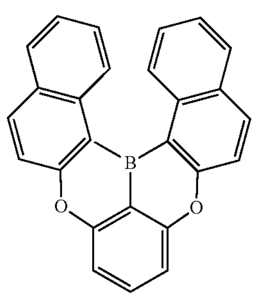

(H5-5)

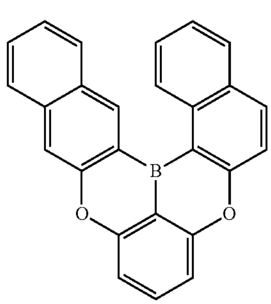

-continued (H5-6)

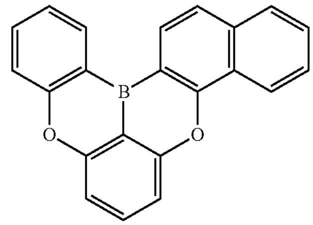

(H5-7)

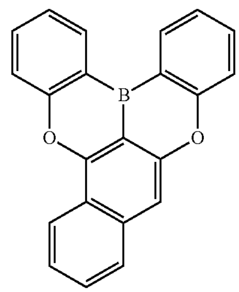

(H5-8)

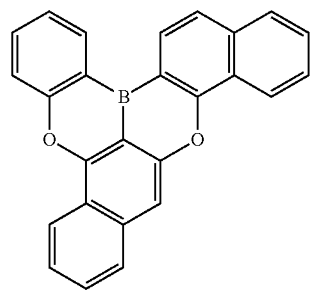

(H6-9)

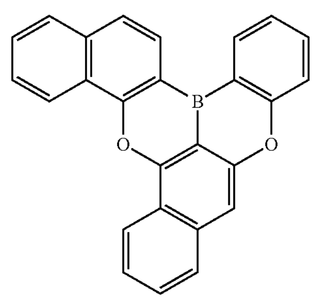

(H5-10)

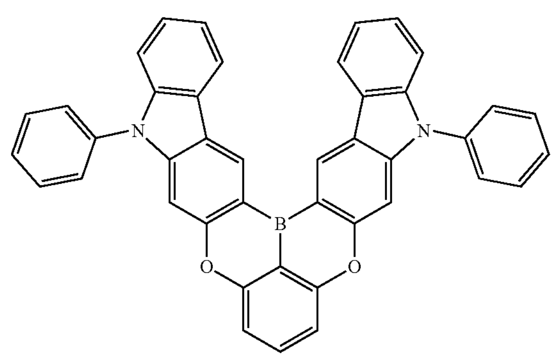

-continued
(H5-11)
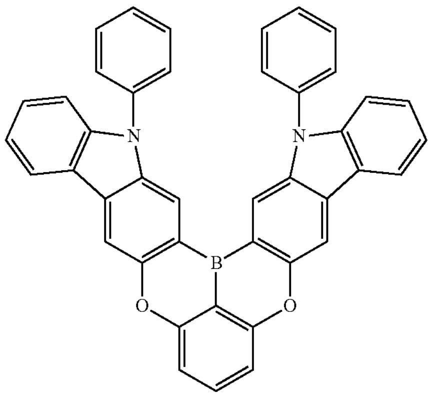
(H5-12)
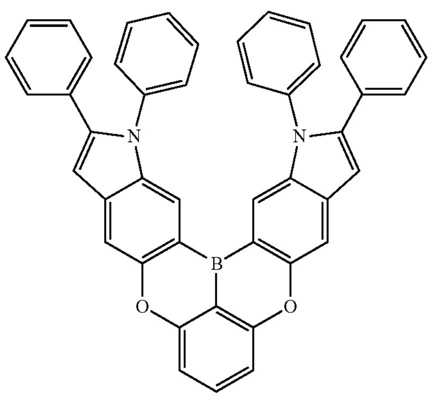
(H5-13)
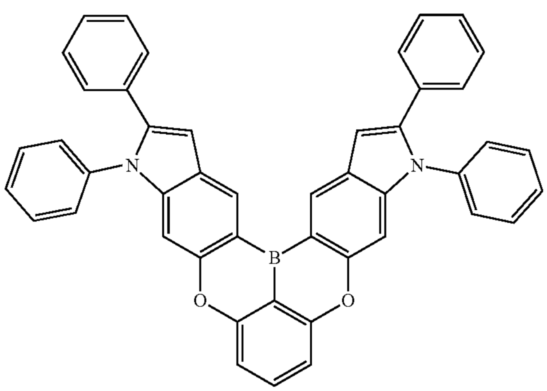
(H5-14)
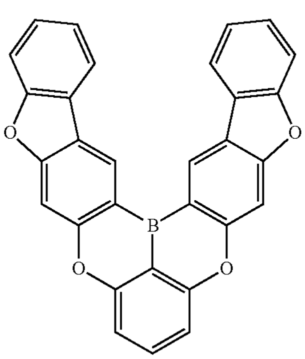
-continued
(H5-15)
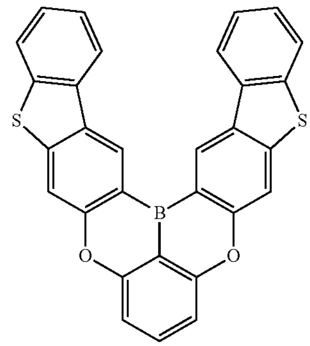
(H5-16)
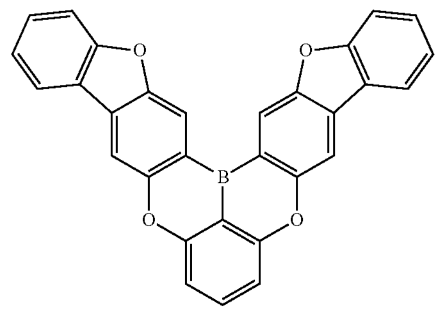
(H5-17)
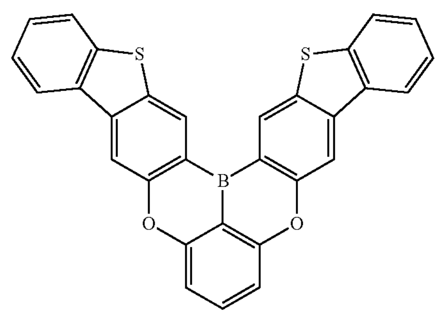
(H5-41)
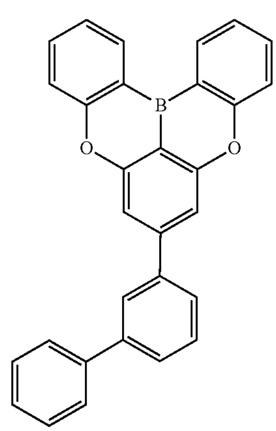

-continued
(H5-42)
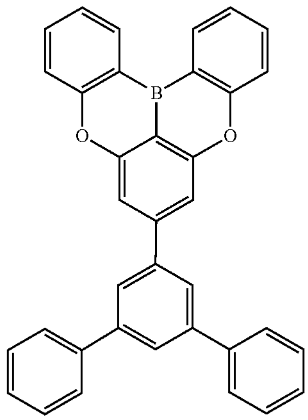
(H5-43)
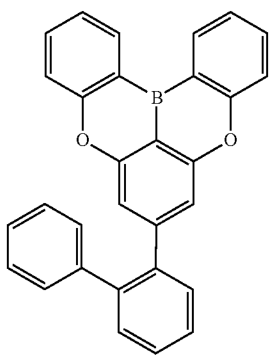
(H5-44)
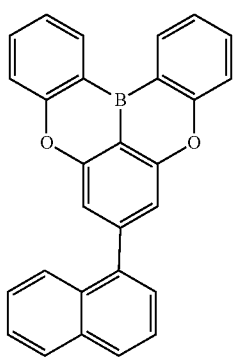
(H5-45)
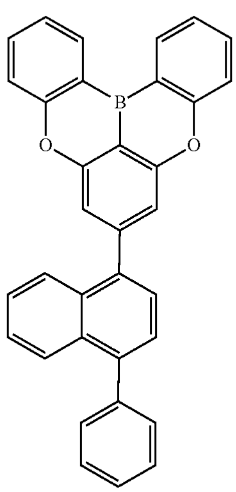
-continued
(H5-46)
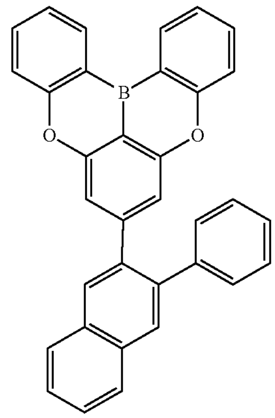
(H5-47)
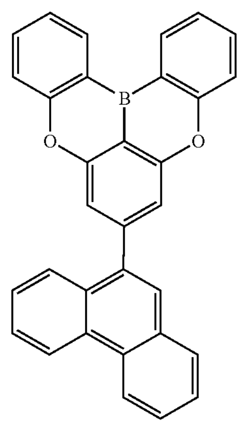
(H5-48)
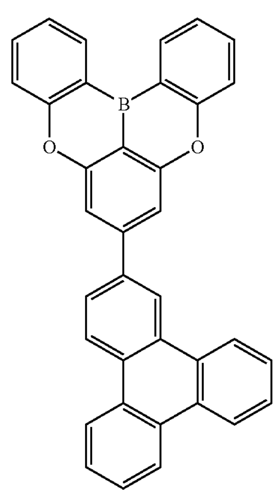

(H5-49)
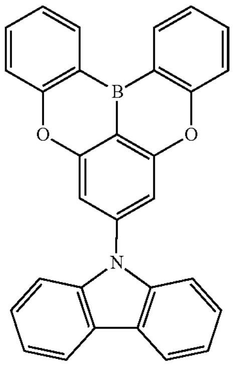
(H5-50)
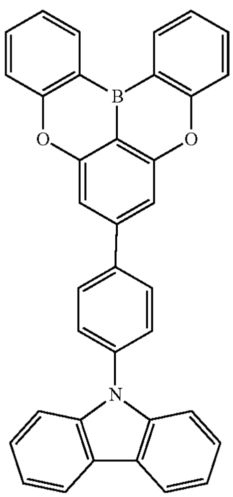
(H5-51)
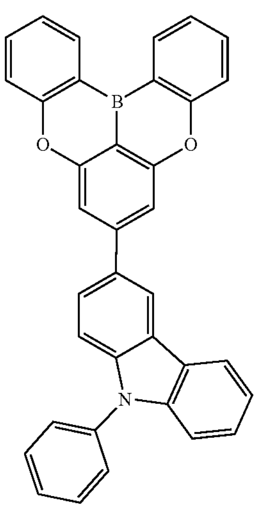
(H5-52)
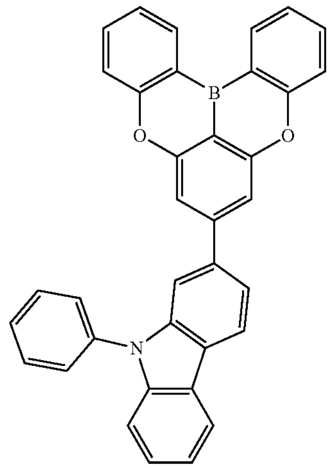
(H5-61)
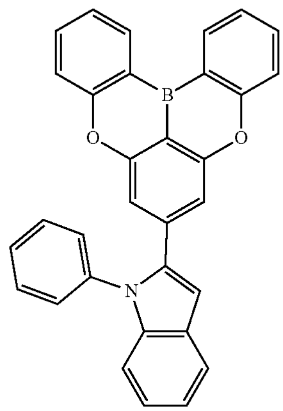
(H5-62)
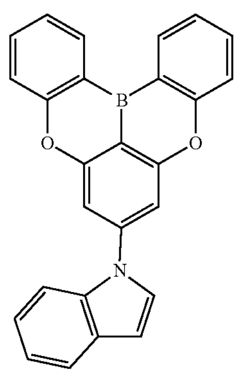
(H5-63)
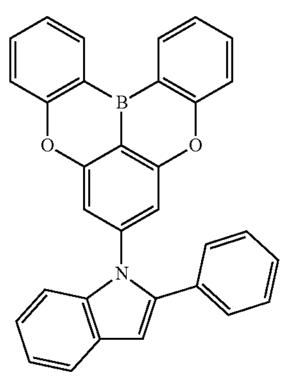

-continued
(H5-64)
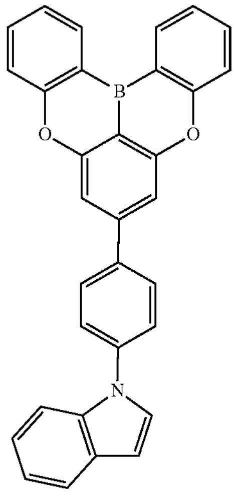
(H5-65)
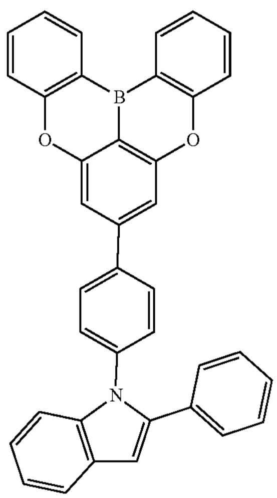
(H5-66)
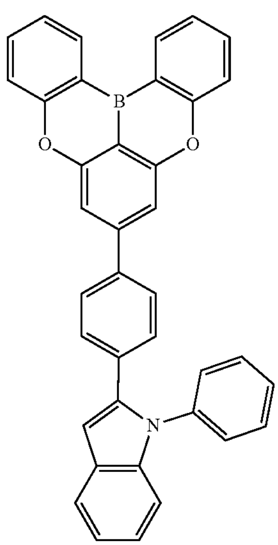
-continued
(H5-67)
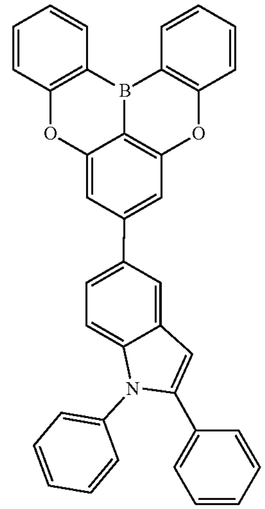
(H5-68)
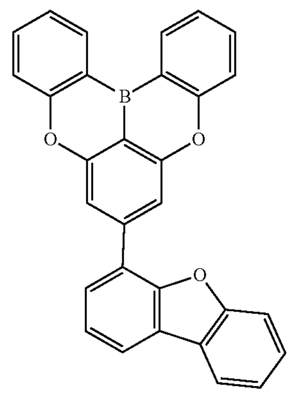
(H5-69)
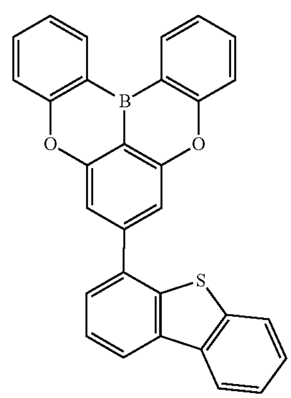
(H5-70)
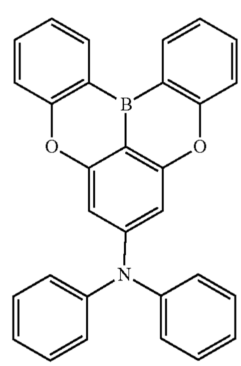

-continued
(H5-71)
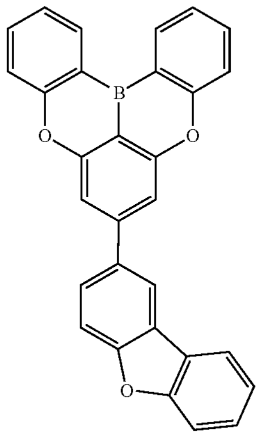
(H5-72)
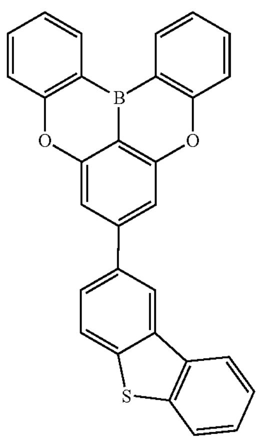
(H5-73)
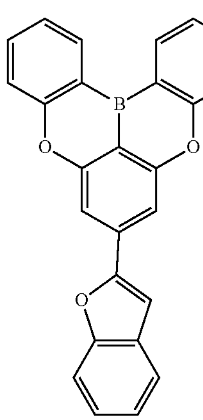
-continued
(H5-74)
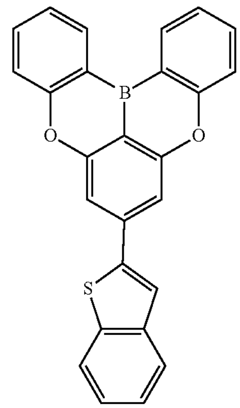
(H5-75)
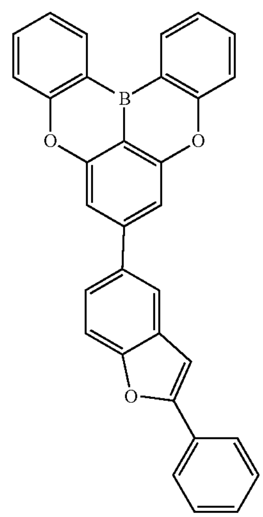
(H5-76)
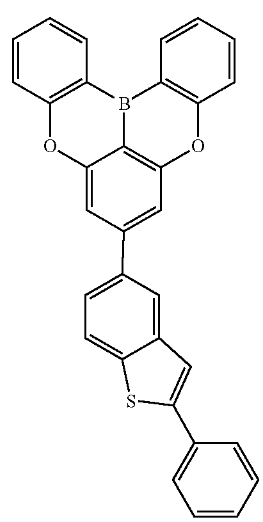

-continued
(H5-77)
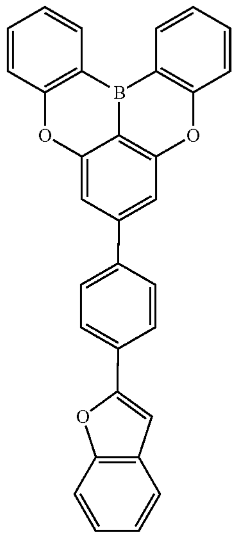
(H5-78)
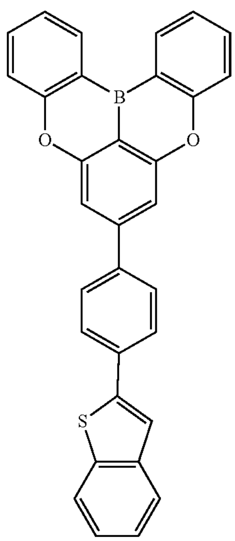
(H5-79)
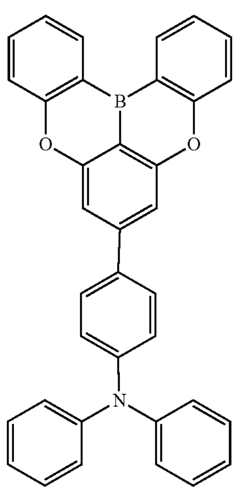
-continued
(H5-80)
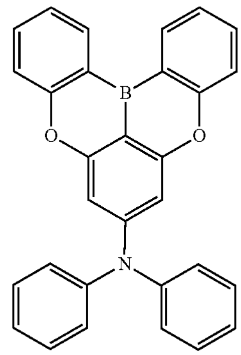
(H5-81)
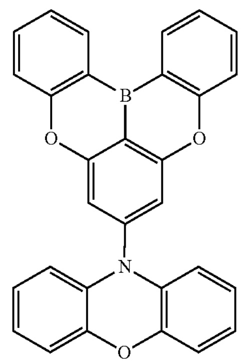
(H5-82)
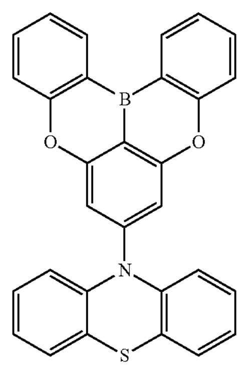
(H5-83)
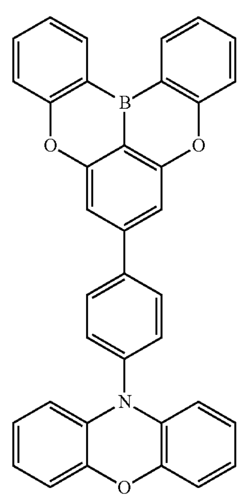

-continued
(H5-84)
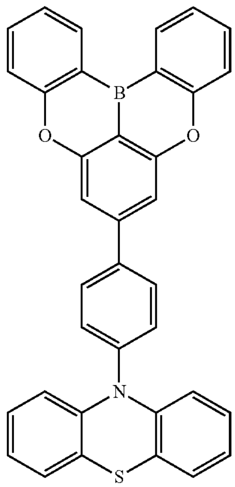
(H5-91)
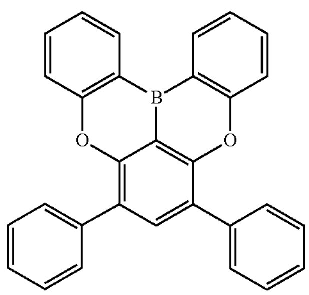
(H5-92)
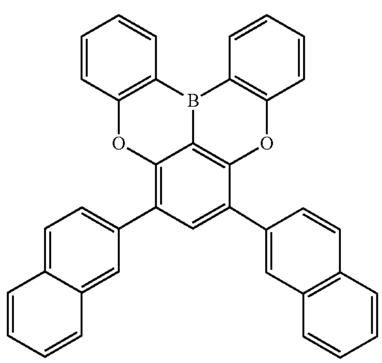
(H5-93)
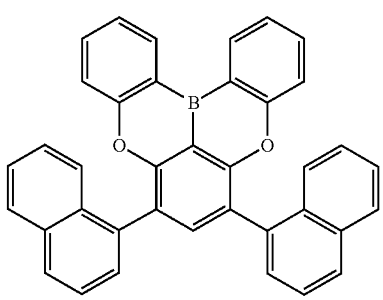
-continued
(H5-94)
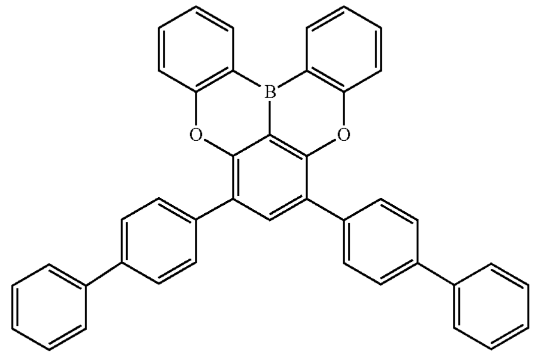
(H5-95)
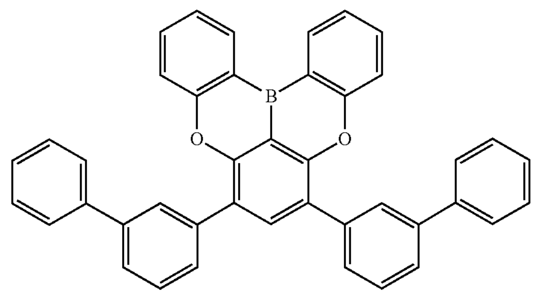
(H5-96)
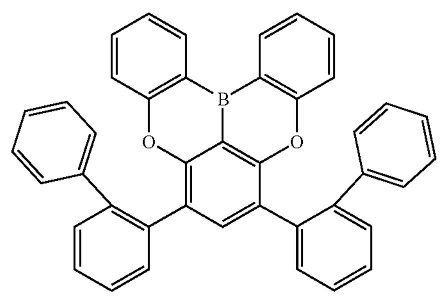
(H5-97)
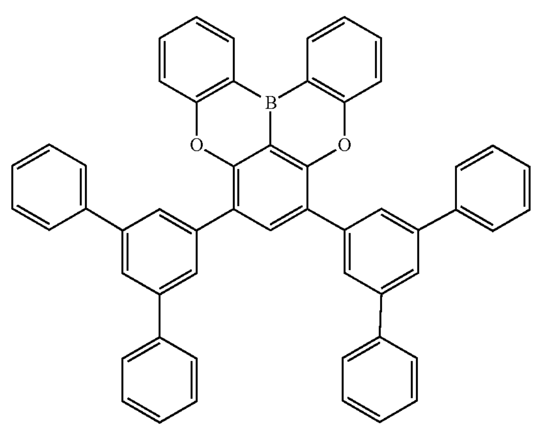

(H5-98)
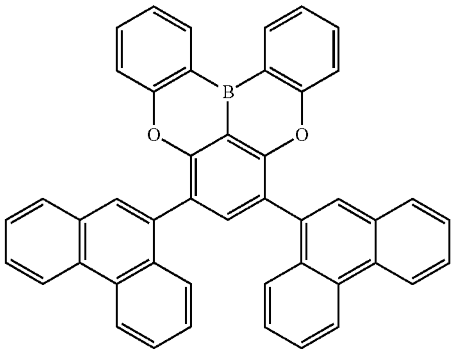
(H5-99)
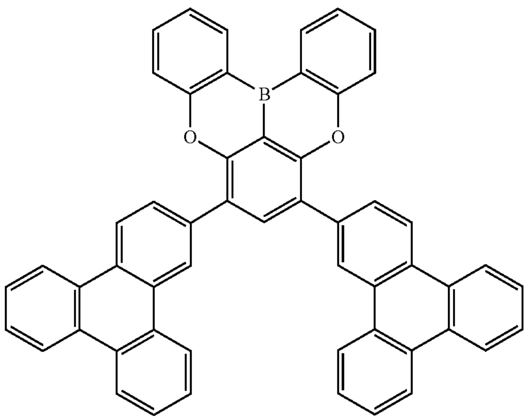
(H5-100)
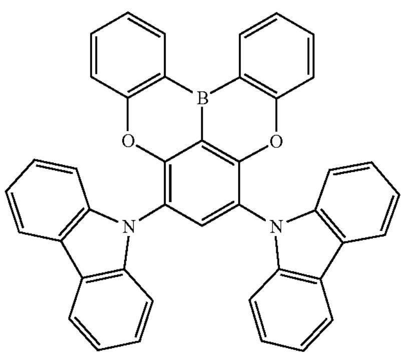
(H5-101)
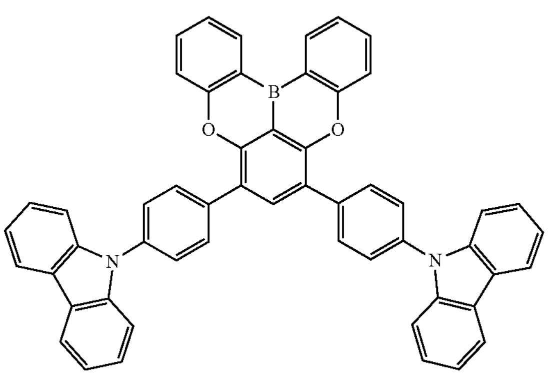
(H5-111)
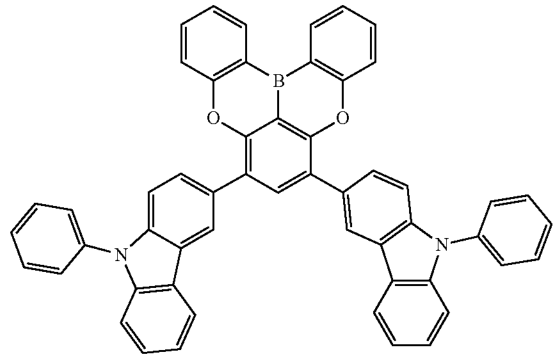
(H5-112)
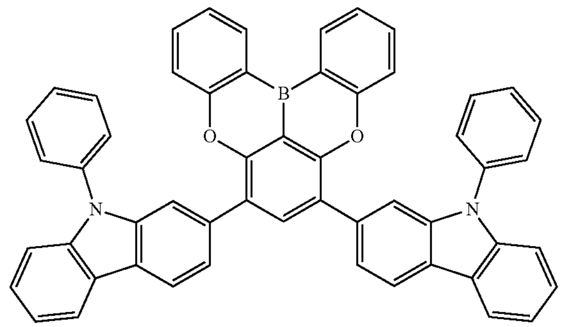
(H5-113)
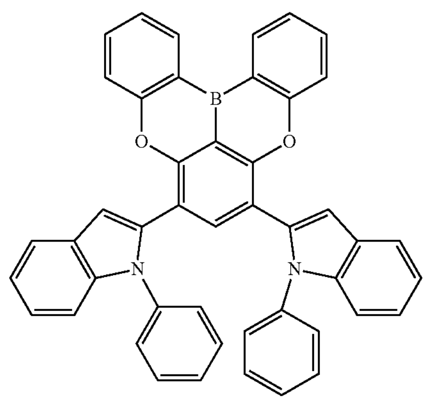
(H5-114)
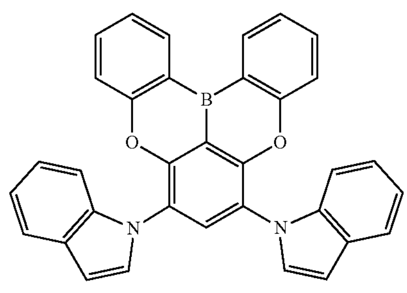

(H5-115)
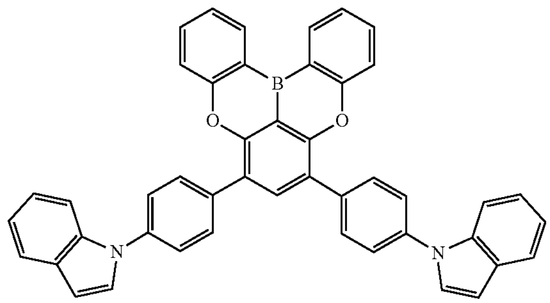
(H5-116)
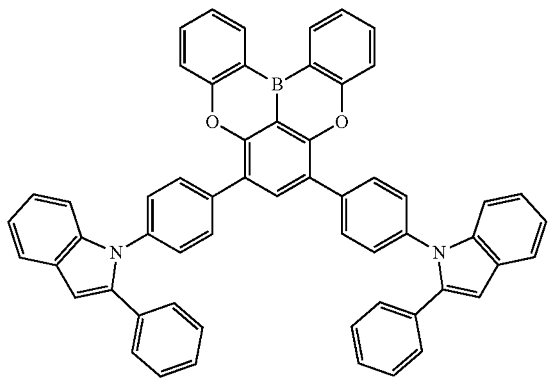
(H5-117)
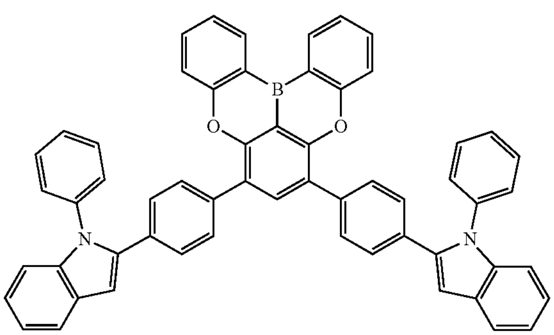
(H5-118)
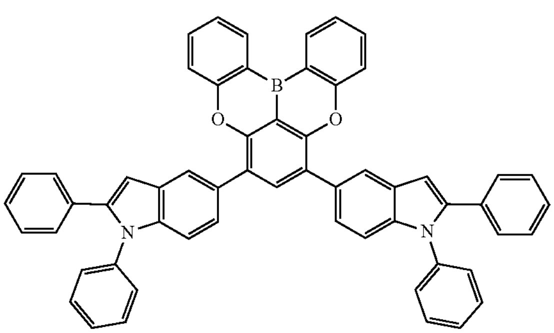
(H5-121)
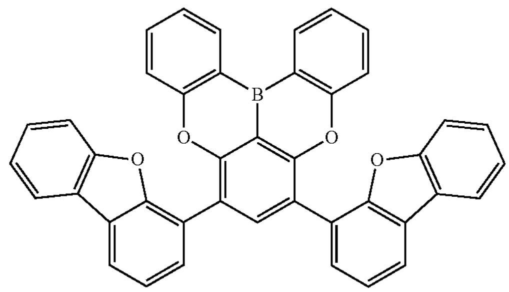
(H5-122)
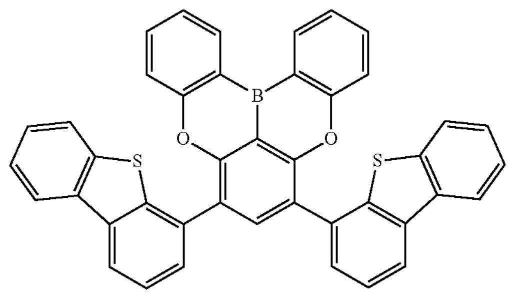
(H5-123)
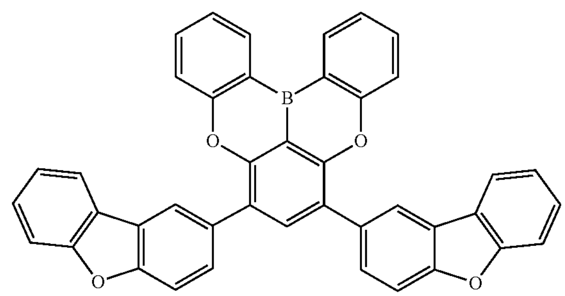
(H5-124)
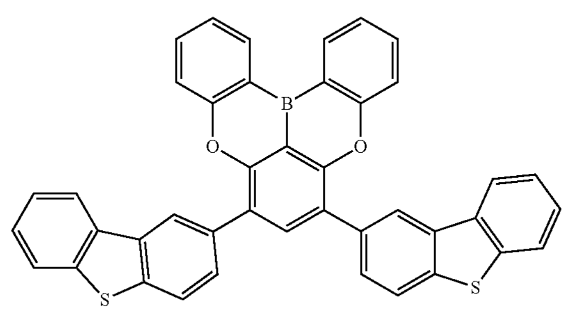
(H5-125)
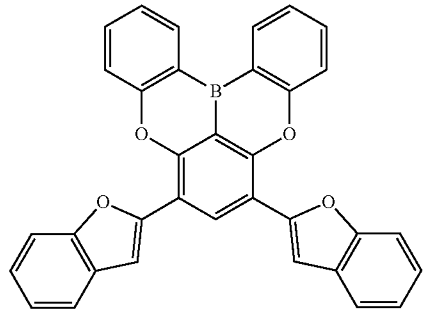

-continued
(H5-126)
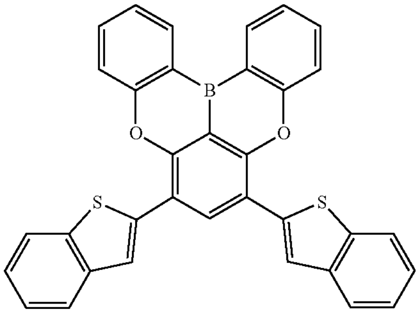
(H5-127)
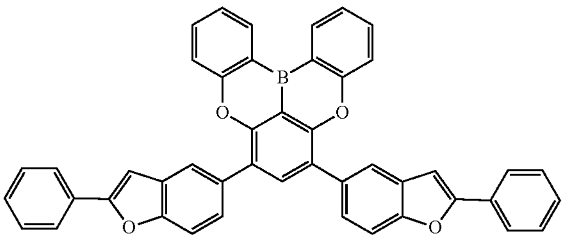
(H5-128)
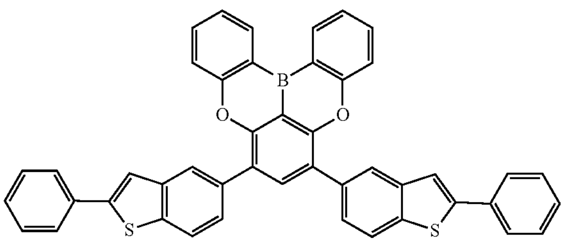
(H5-129)
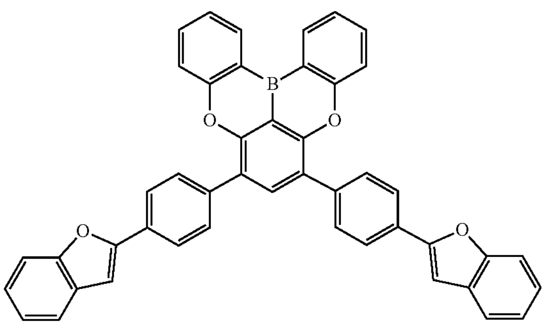
(H5-130)
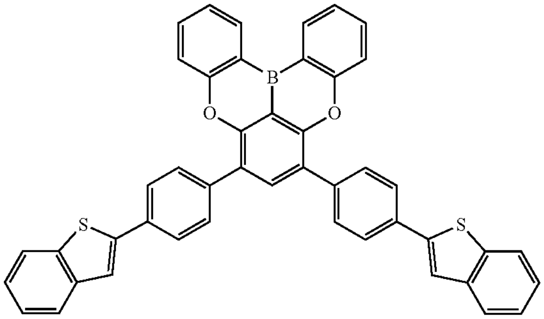
-continued
(H5-141)
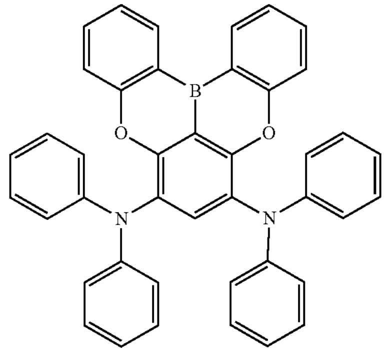
(H5-142)
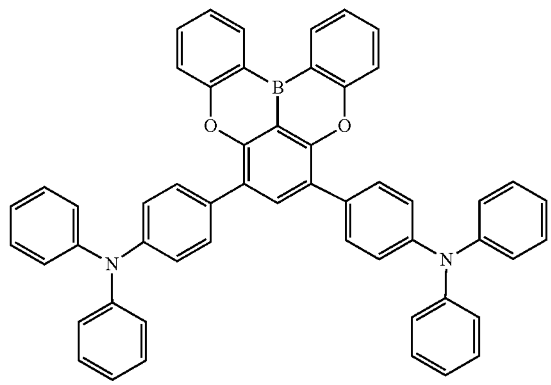
(H5-143)
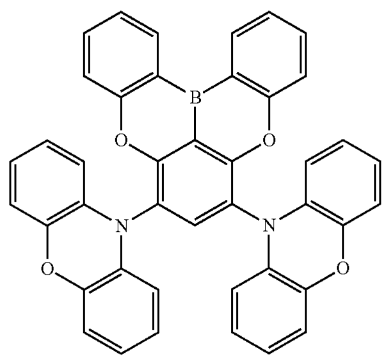
(H5-144)
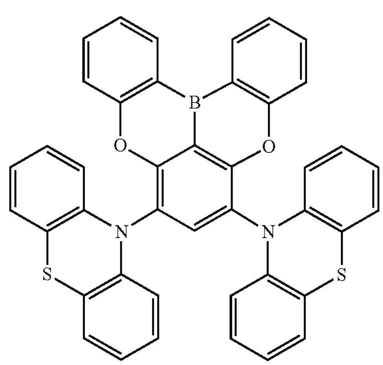

-continued
(H5-145)
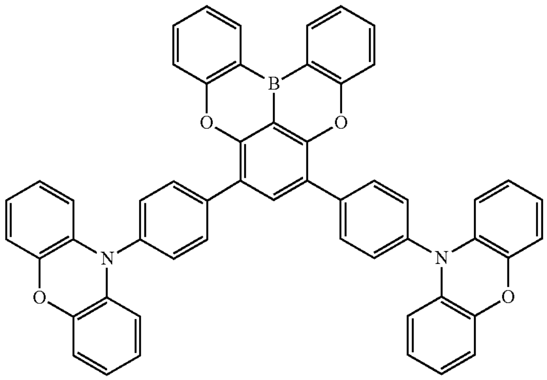
(H5-146)
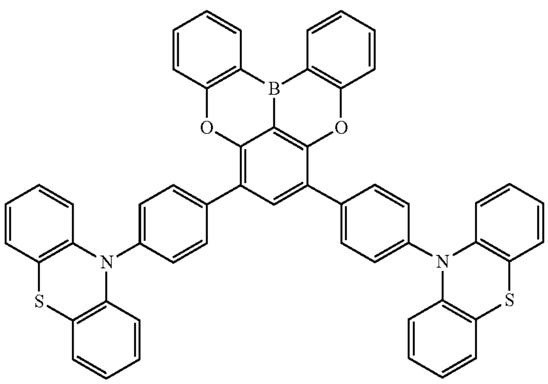
(H5-151)
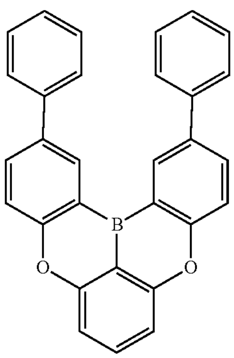
(H5-152)
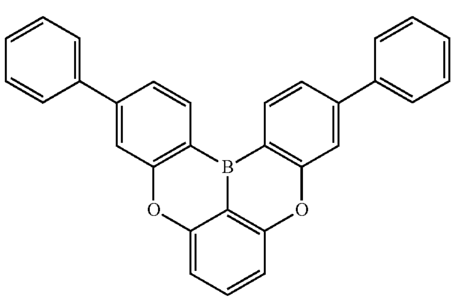
-continued
(H5-153)
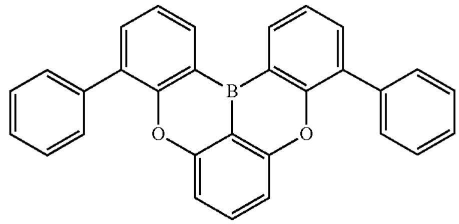
(H5-154)
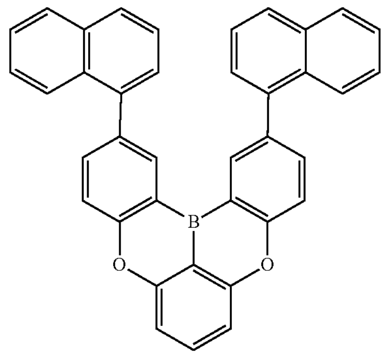
(H5-155)
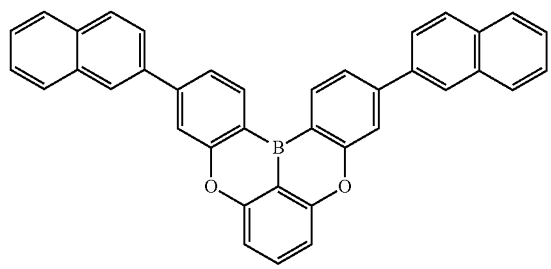
(H5-156)
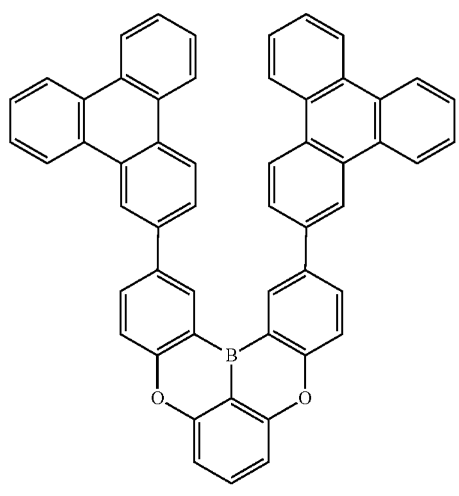

-continued
(H5-157)
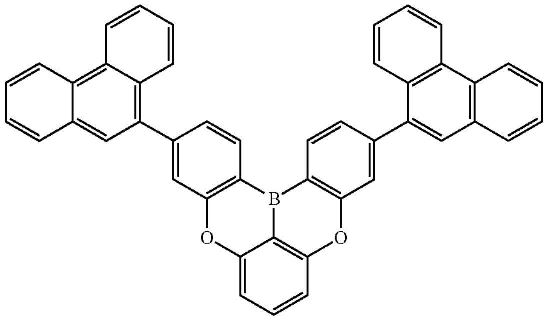
(H5-158)
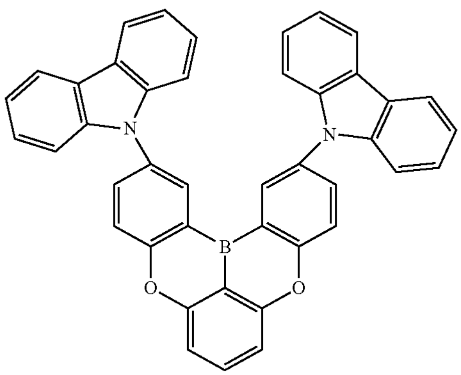
(H5-159)
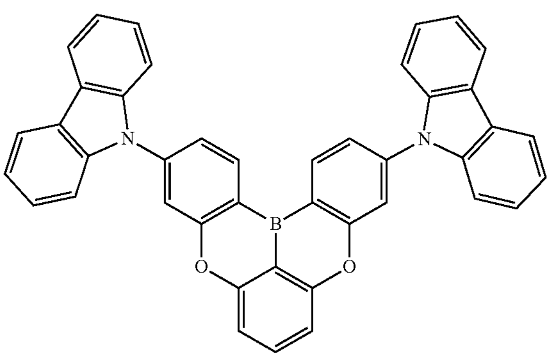
(H5-160)
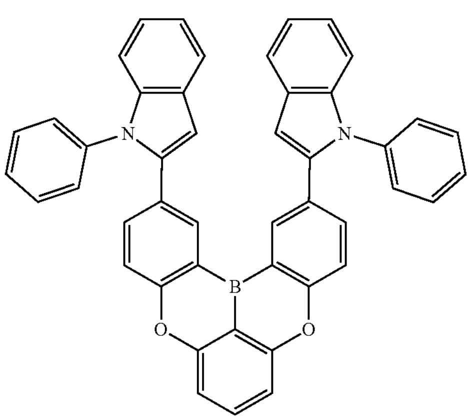
-continued
(H5-161)
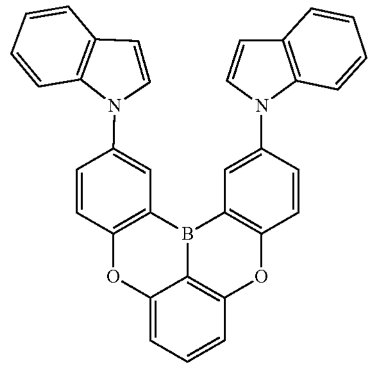
(H5-171)
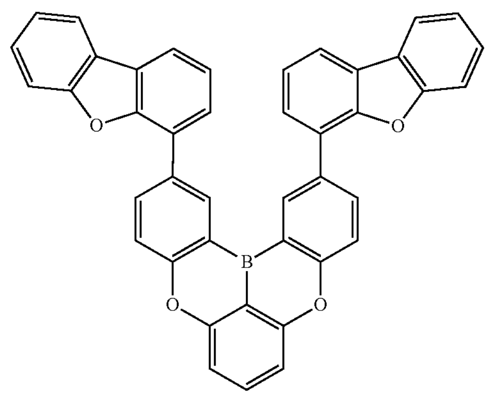
(H5-172)
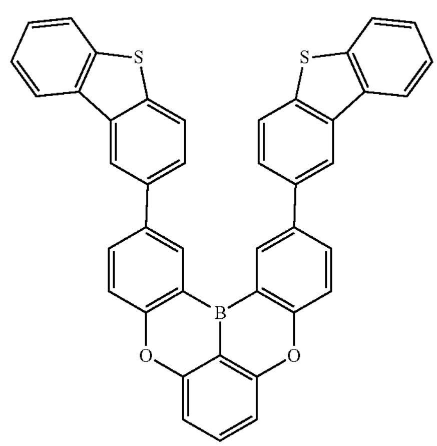

-continued
(H5-173)
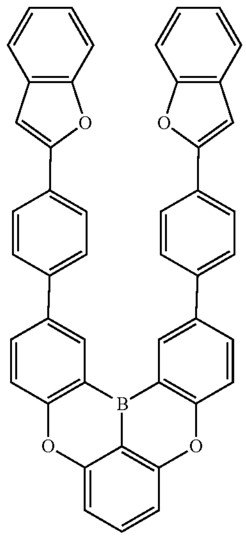
(H5-174)
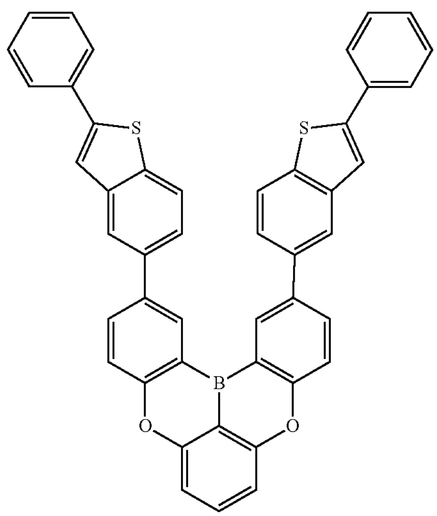
(H5-175)
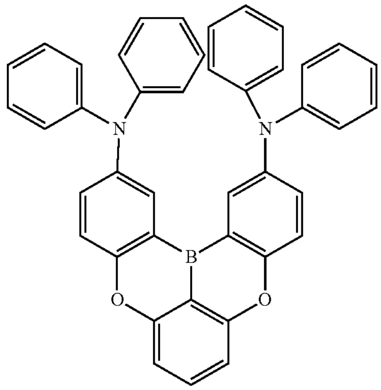
-continued
(H5-176)
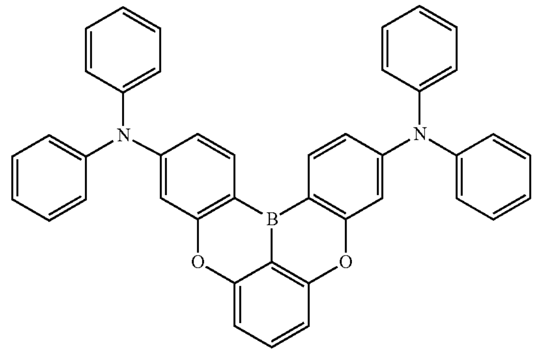
(H5-177)
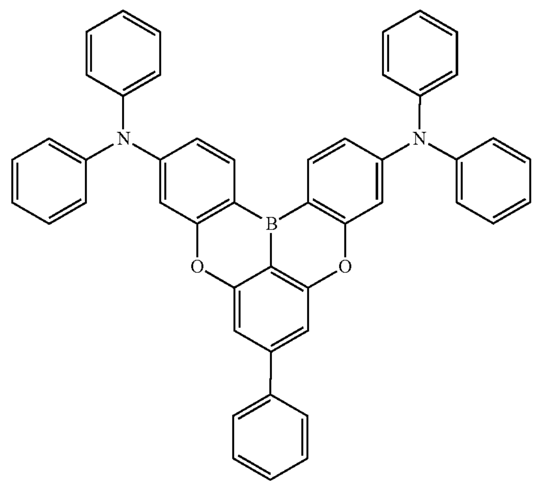
(H5-178)
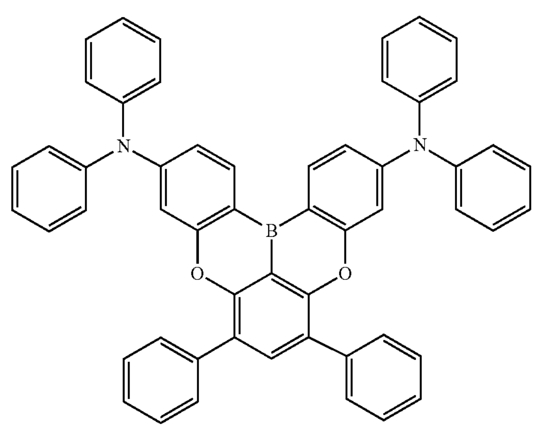

-continued
(H5-179)
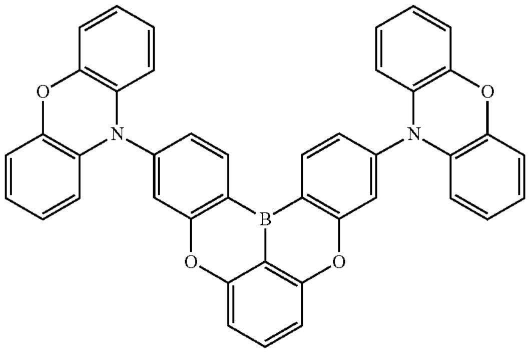
(H5-1001)
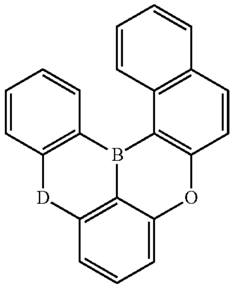
(H5-1002)
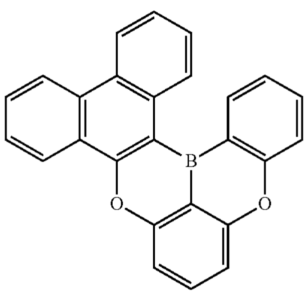
(H5-1003)
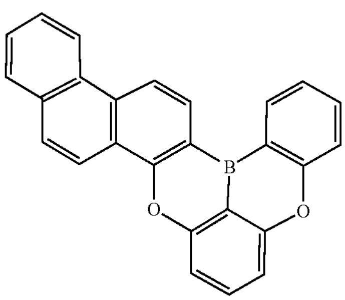
(H5-1004)
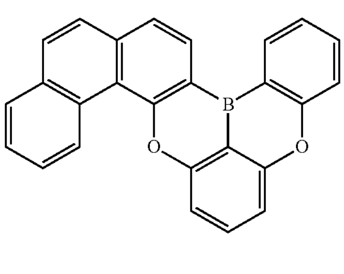
-continued
(H5-1005)
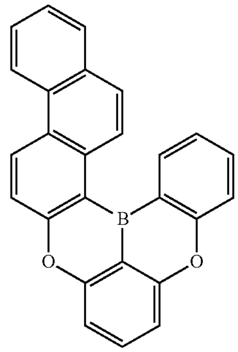
(H5-1006)
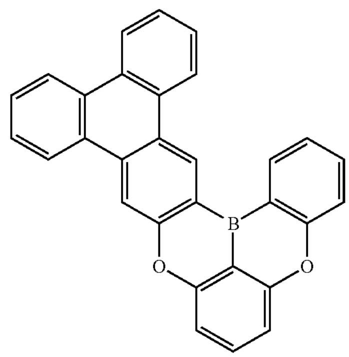
(H5-1007)
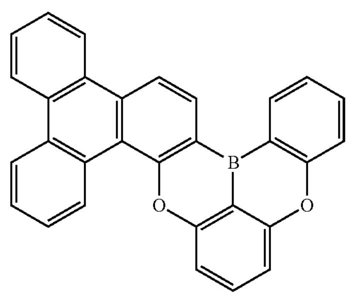
(H5-1008)
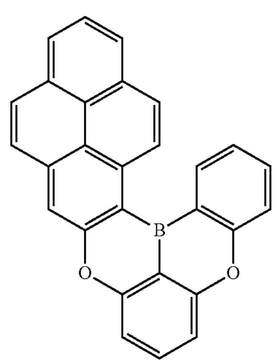

-continued
(H5-1009)
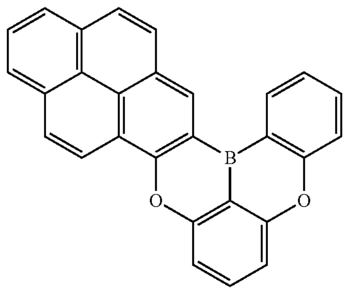
(H5-1010)
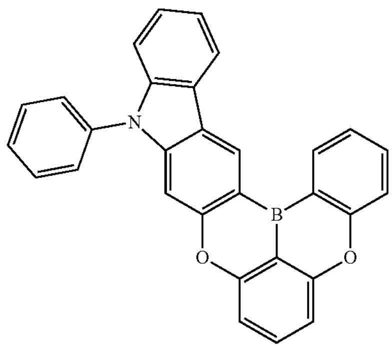
(H5-1011)
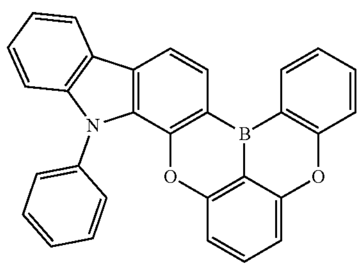
(H5-1012)
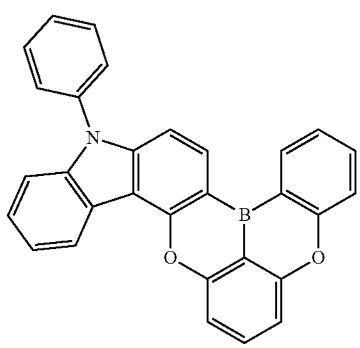
(H5-1013)
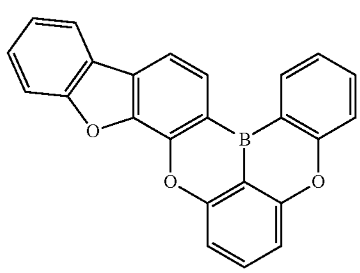
-continued
(H5-1014)
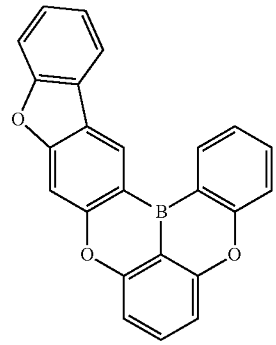
(H5-1015)
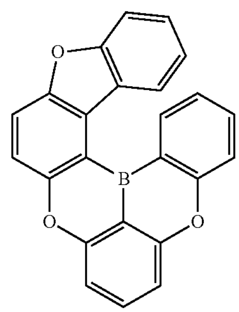
(H5-1016)
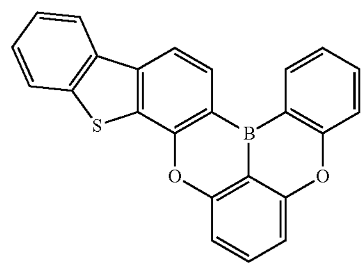
(H5-1017)
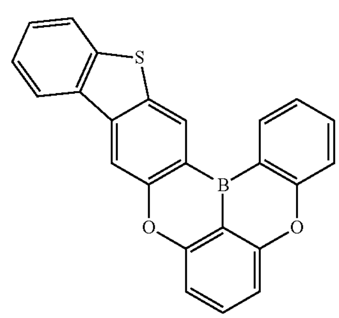
(H5-1018)
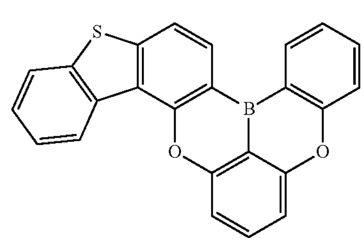

-continued
(H5-1021)
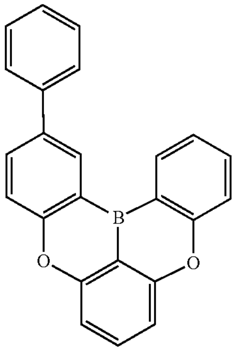
(H5-1022)
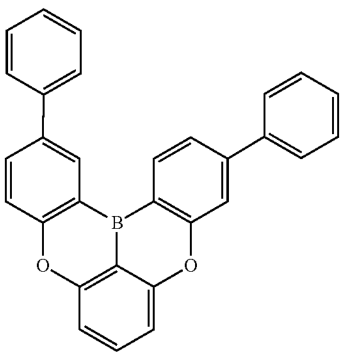
(H5-1023)
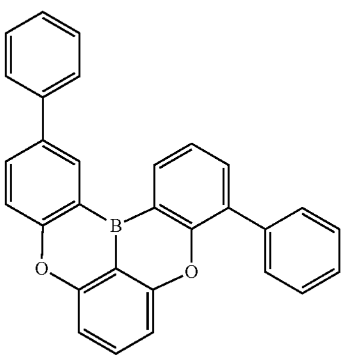
(H5-1024)
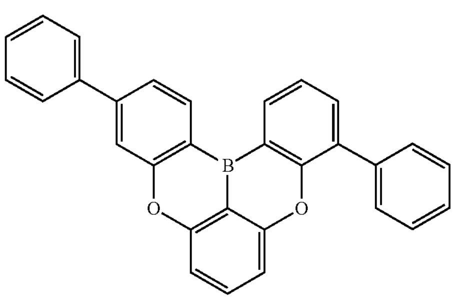
-continued
(H5-1025)
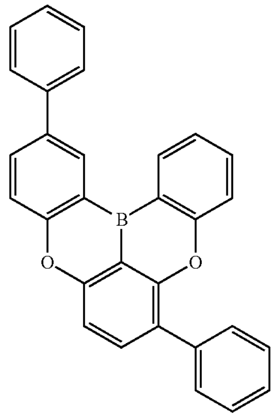
(H5-1026)
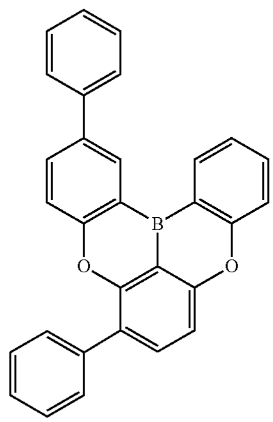
(H5-1027)
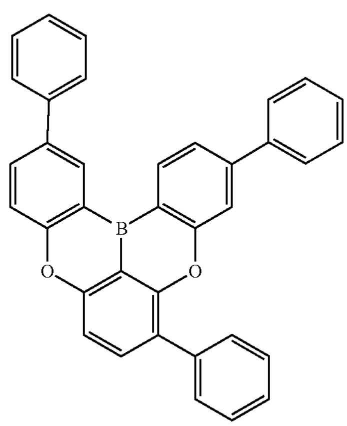

-continued
(H5-1028)
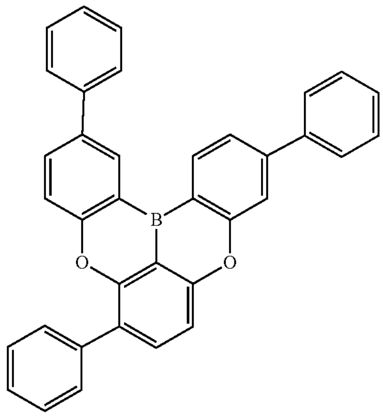
(H5-1029)
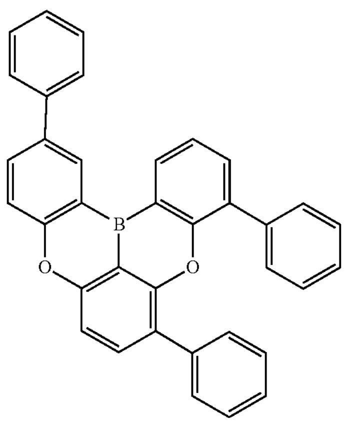
(H5-1030)
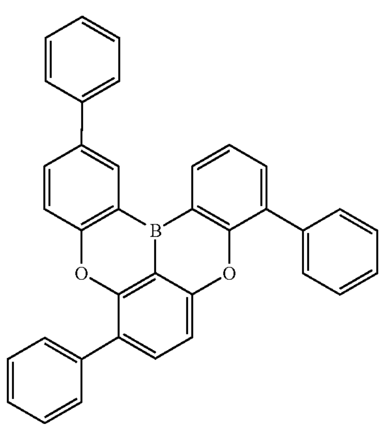
-continued
(H5-1031)
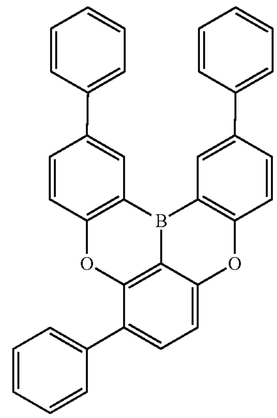
(H5-1032)
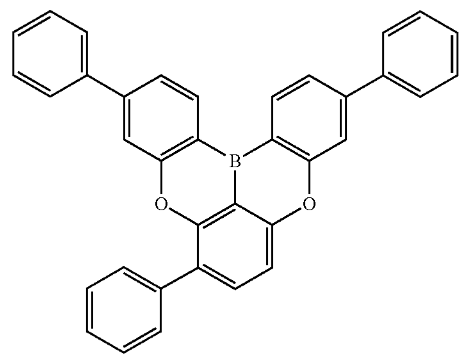
(H5-1033)
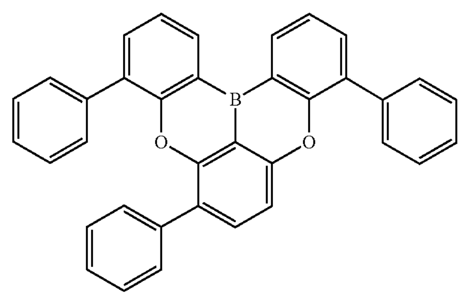
(H5-1034)
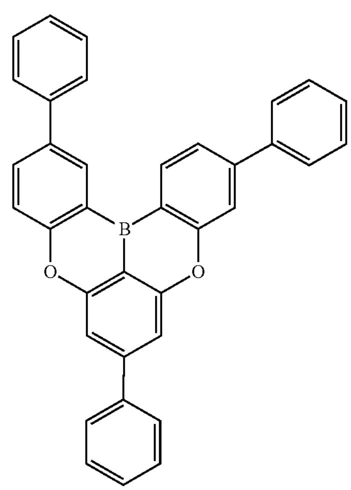

-continued
(H5-1035)
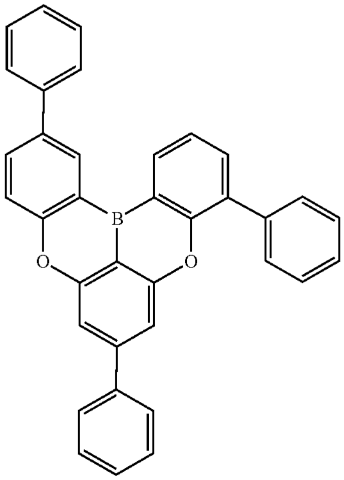
(H5-1036)
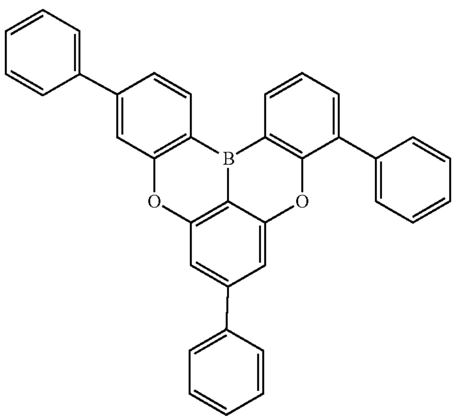
(H5-1037)
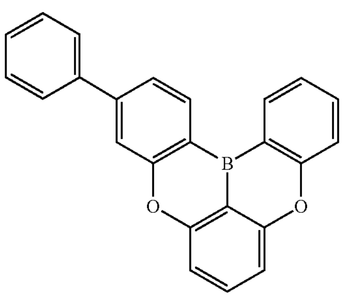
(H5-1038)
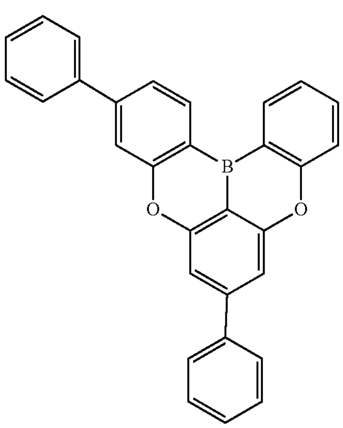
-continued
(H5-1039)
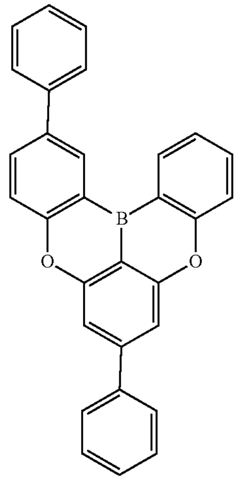
(H5-1041)
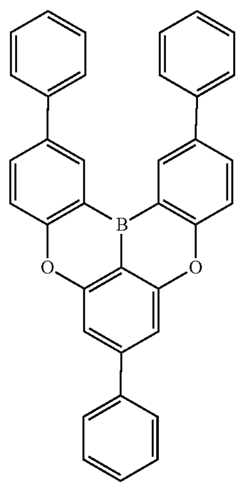
(H5-1042)
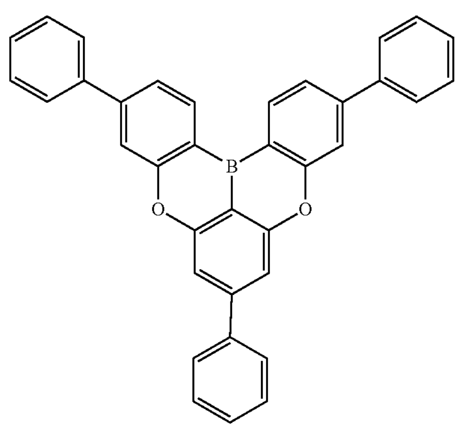

-continued
(H5-1043)
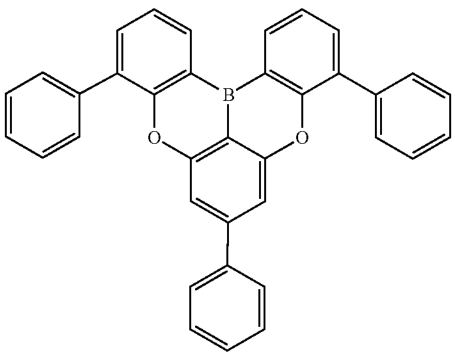
(H5-1044)
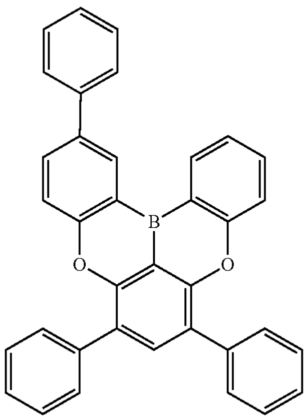
(H5-1045)
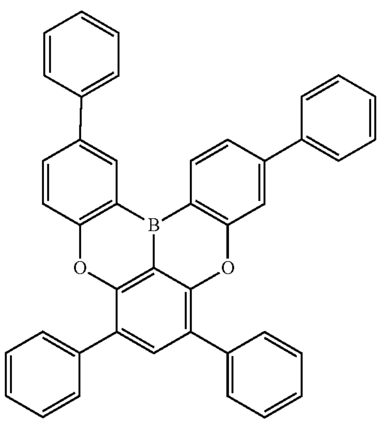
(H5-1046)
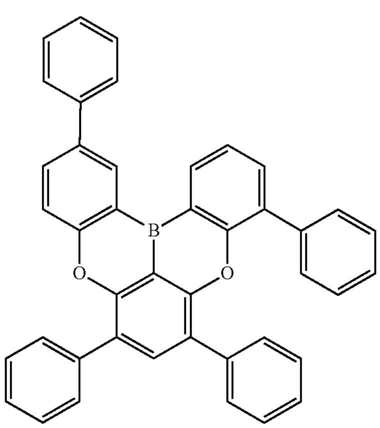
-continued
(H5-1047)
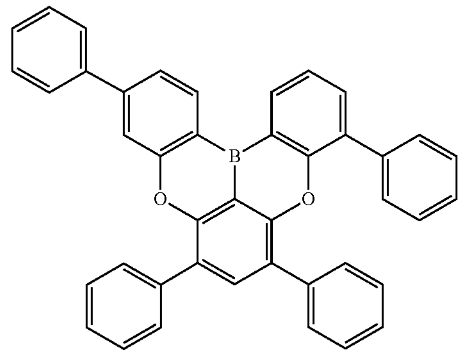
(H5-1048)
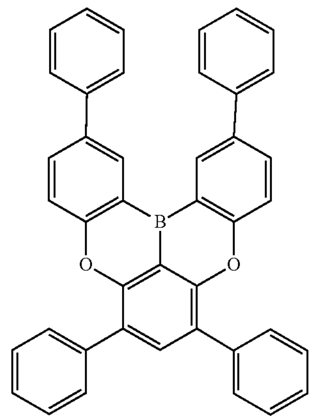
(H5-1049)
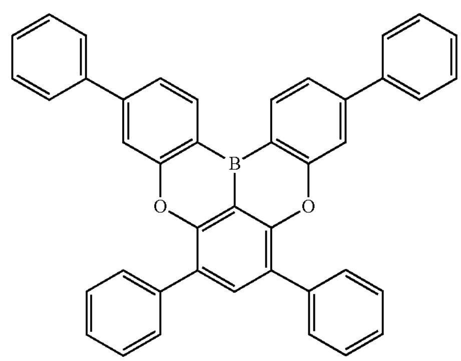
(H5-1050)
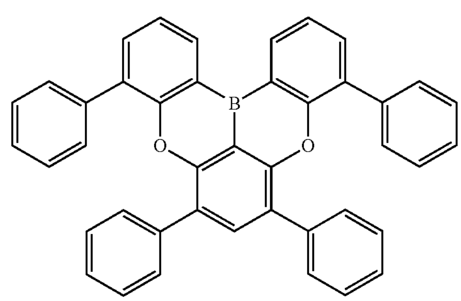

-continued
(H5-1061)
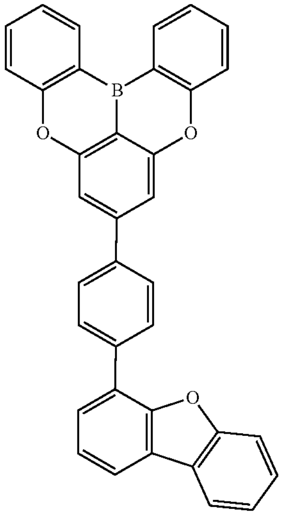
(H5-1062)
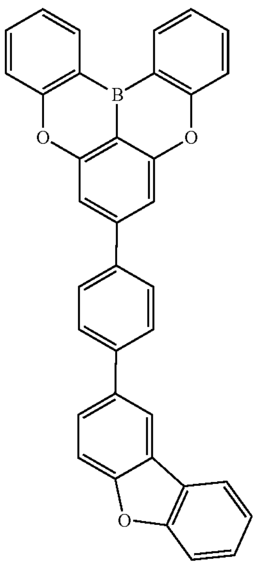
(H5-1063)
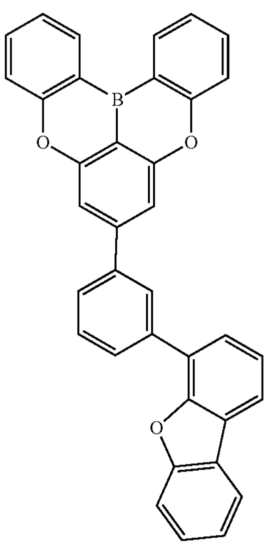
-continued
(H5-1064)
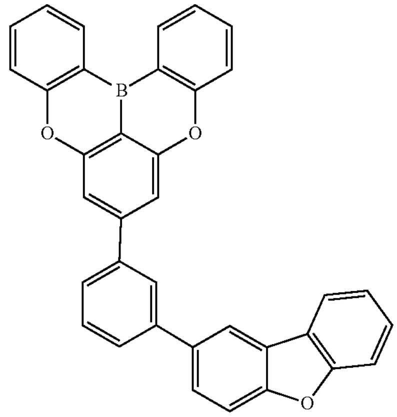
(H5-1065)
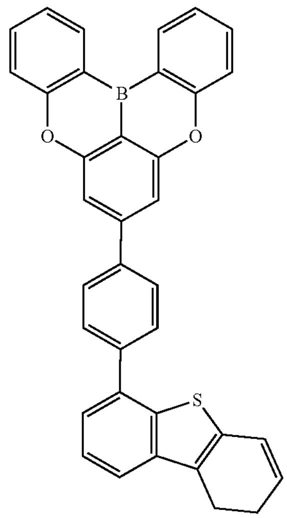
(H5-1066)
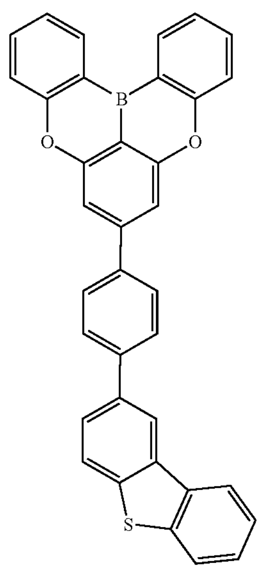

-continued
(H5-1067)
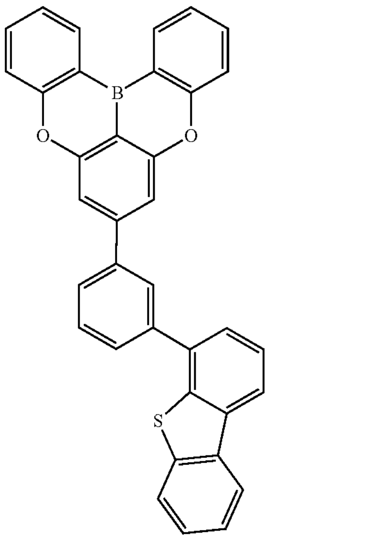
(H5-1068)
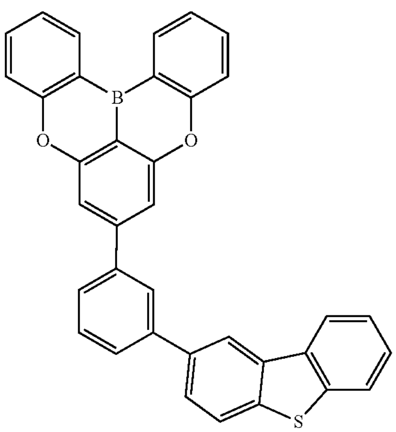
(H5-1069)
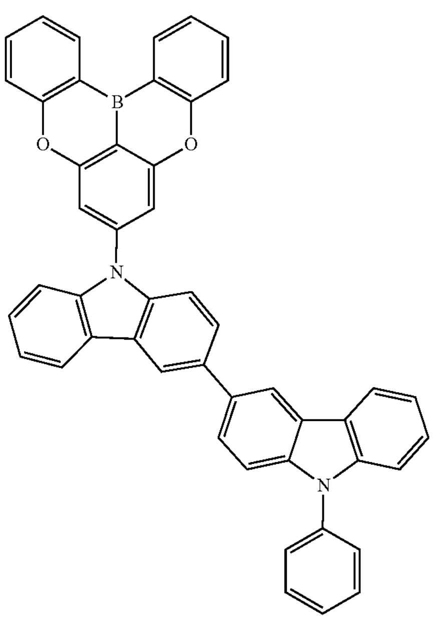
-continued
(H5-1070)
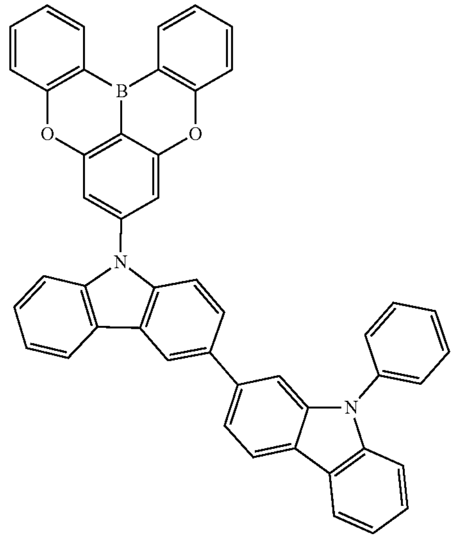
(H5-1071)
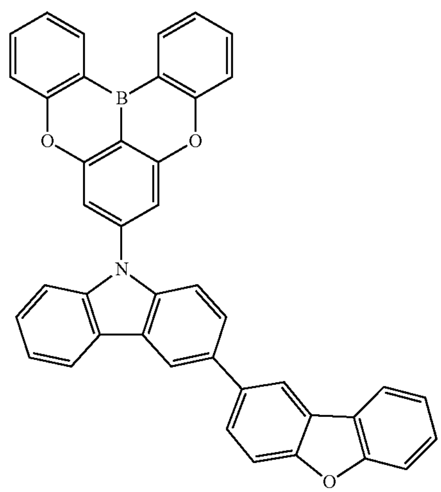
(H5-1072)
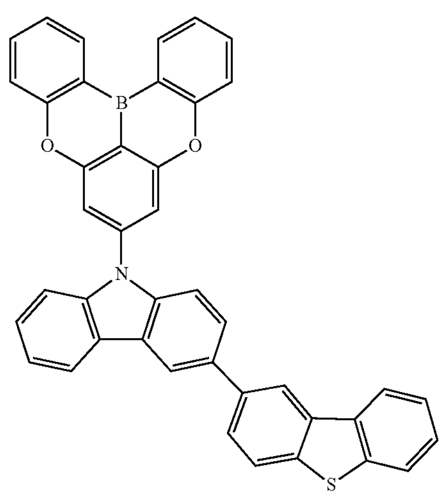

-continued
(H5-1081)
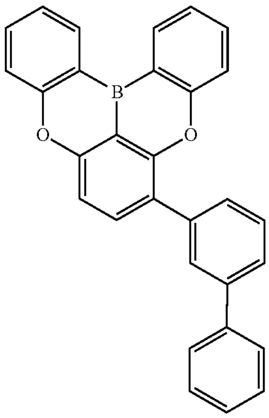
(H5-1082)
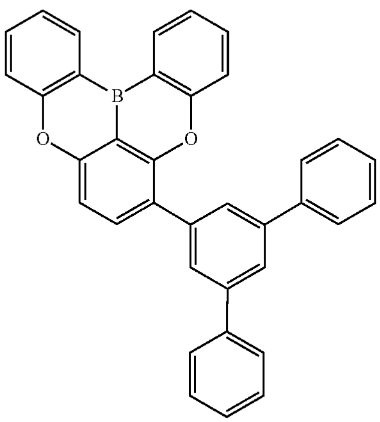
(H5-1083)
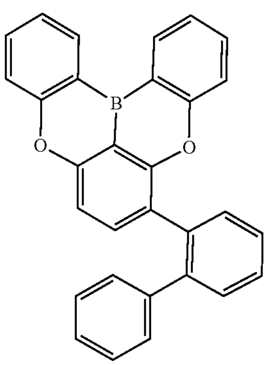
(H5-1084)
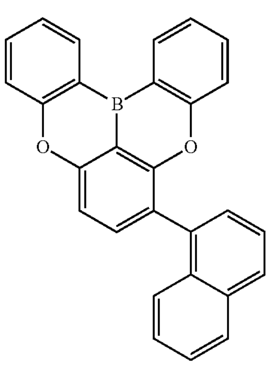
-continued
(H5-1085)
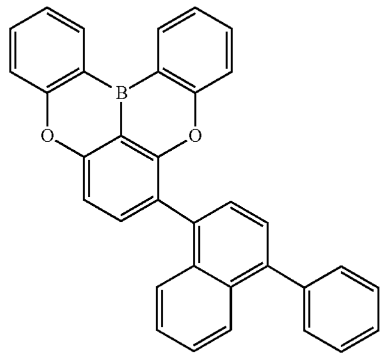
(H5-1086)
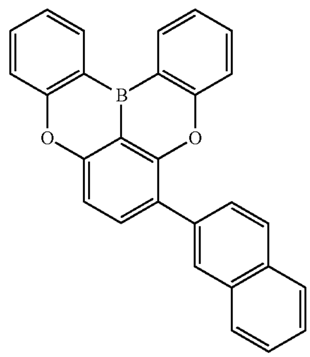
(H5-1087)
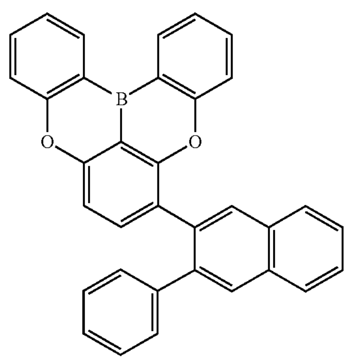
(H5-1088)
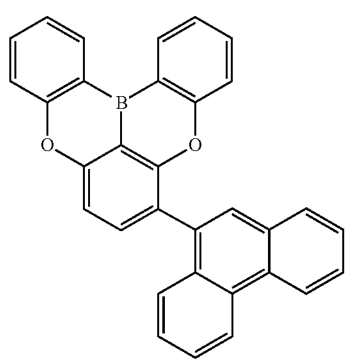

-continued
(H5-1089)
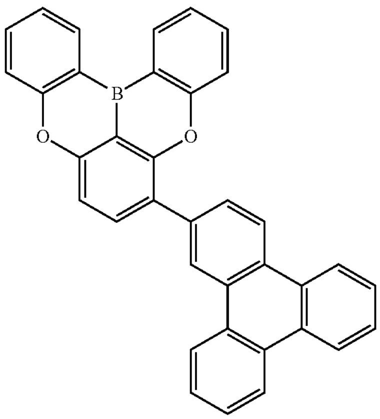
(H5-1090)
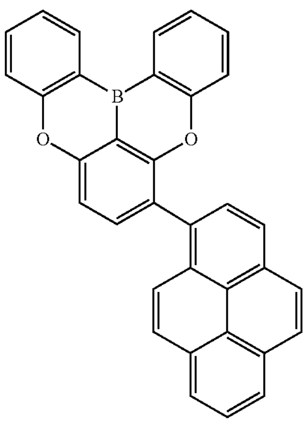
(H5-1091)
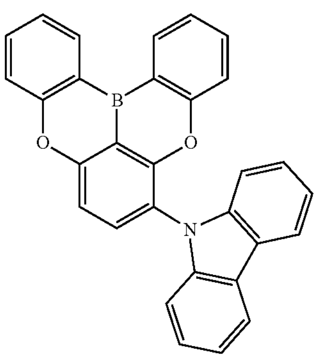
(H5-1092)
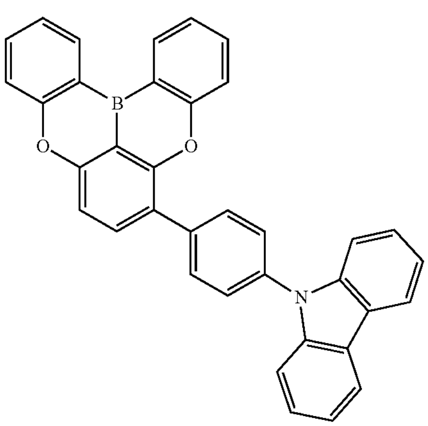
-continued
(H5-1093)
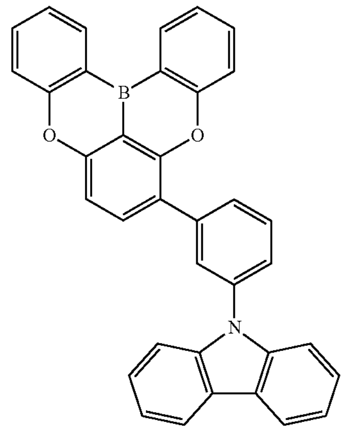
(H5-1094)
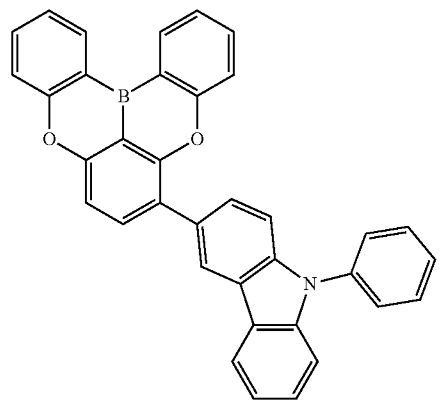
(H5-1095)
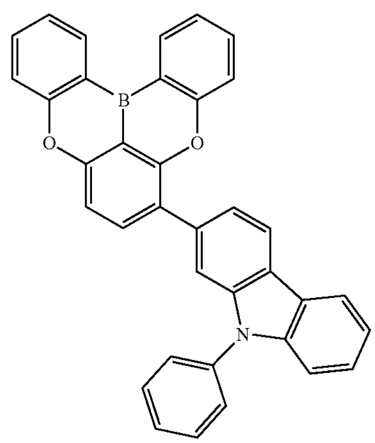
(H5-1096)
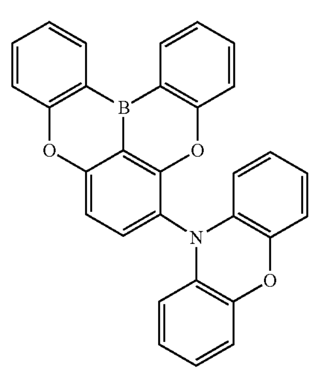

-continued
(H5-1101)
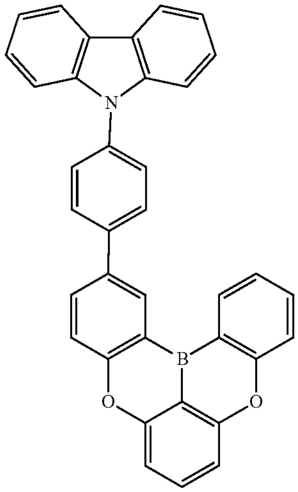
(H5-1102)
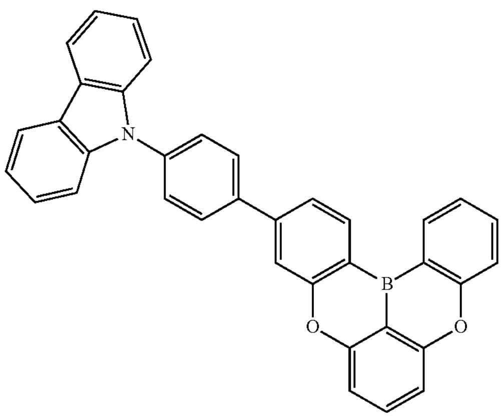
(H5-1103)
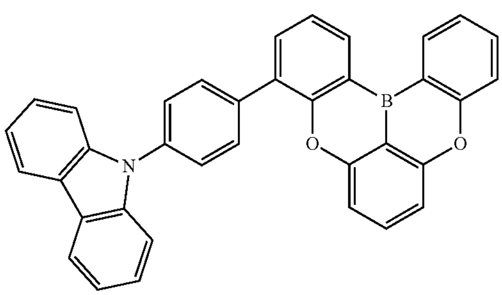
(H5-1104)
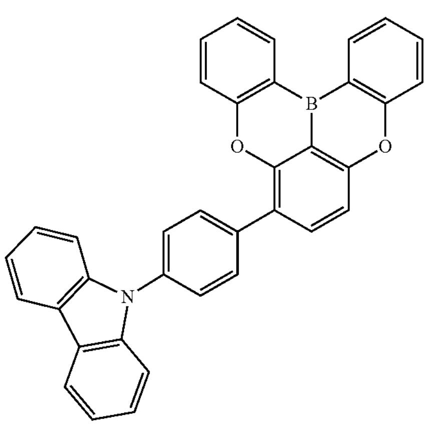
-continued
(H5-1105)
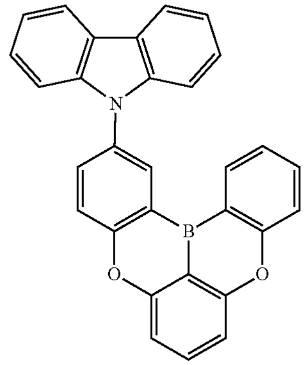
)H5-1106)
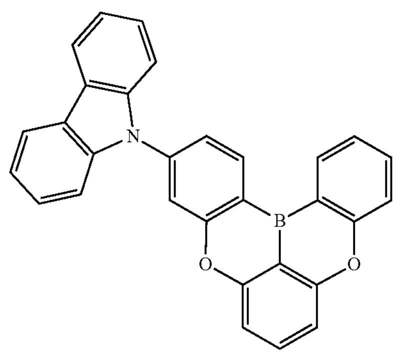
(H5-1107)
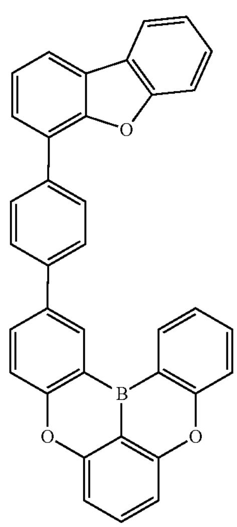

-continued
(H5-1108)
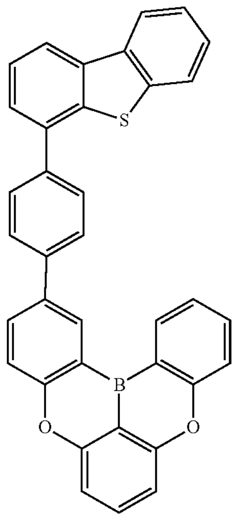
(H5-1109)
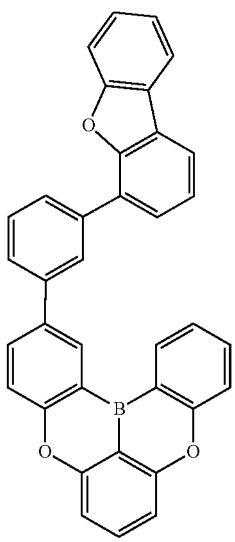
(H5-1110)
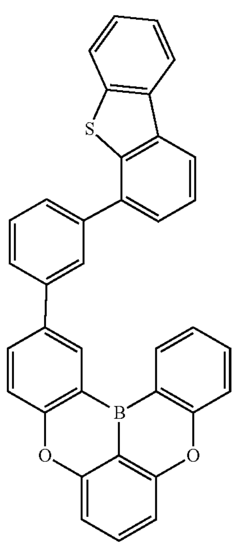
-continued
(H5-1111)
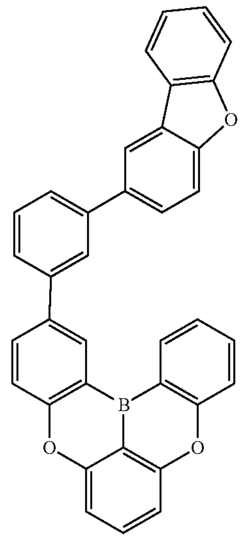
(H5-1112)
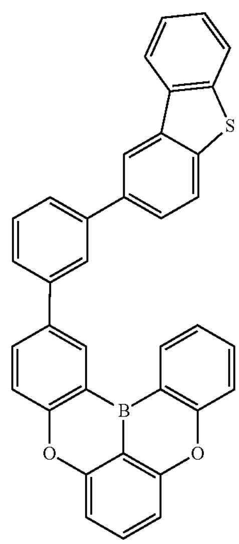
(H5-1113)
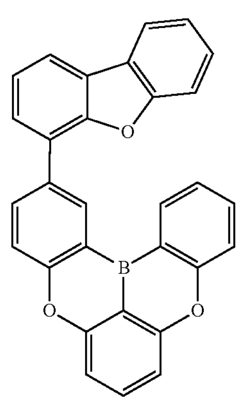

-continued
(H5-1114)
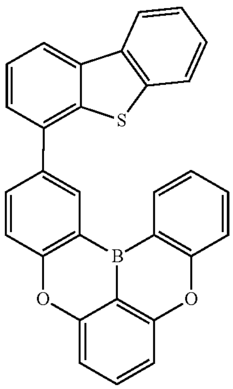
(H5-1121)
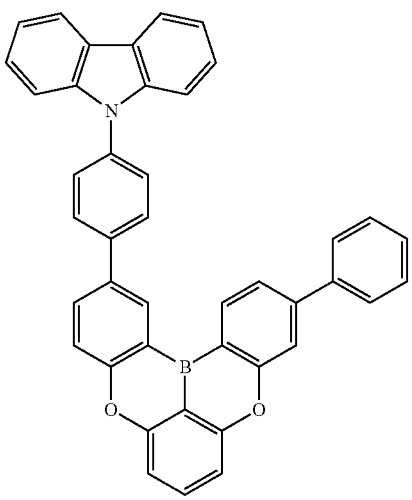
(H5-1122)
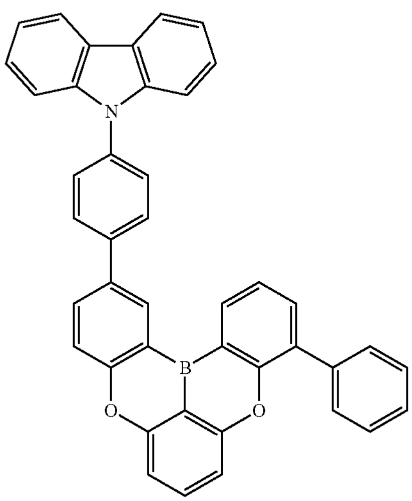
-continued
(H5-1123)
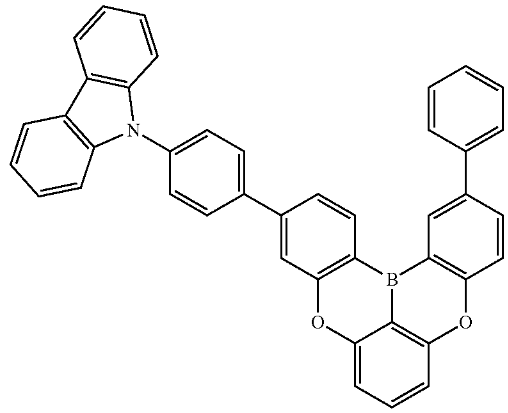
(H5-1124)
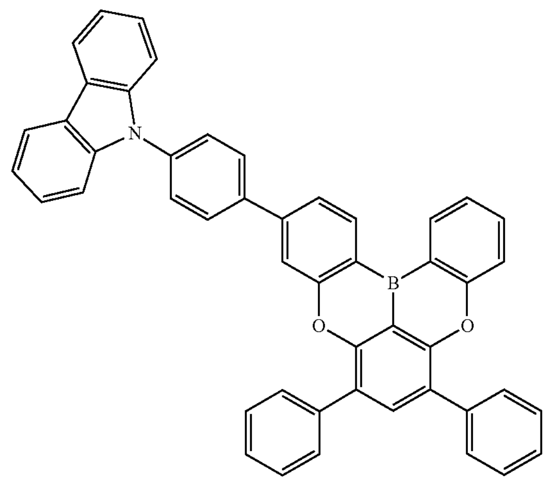
(H5-1125)
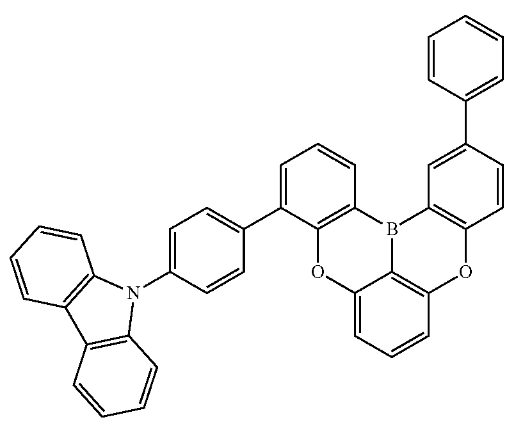

-continued
(H5-1126)
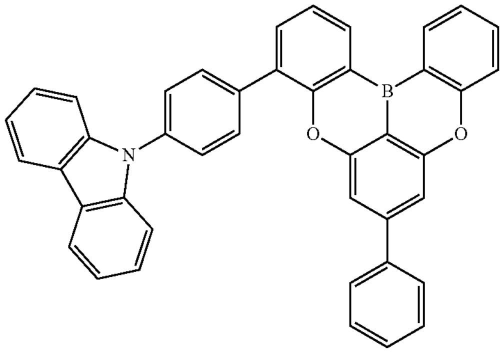
(H5-1127)
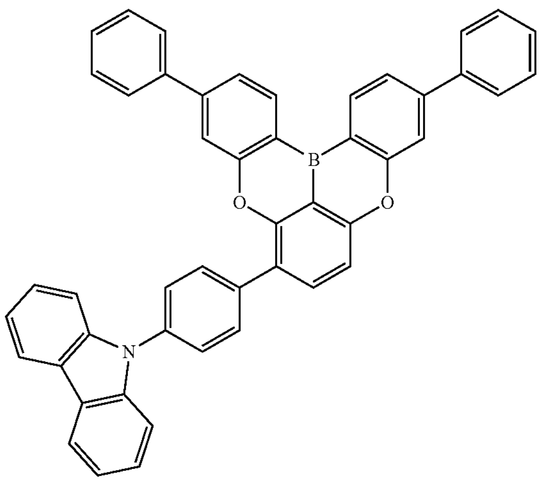
(H5-1128)
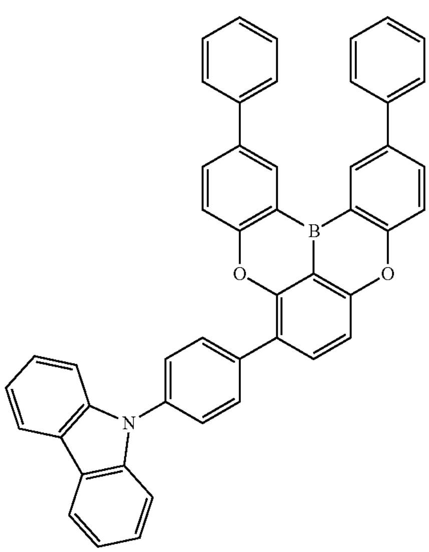
-continued
(H5-1129)
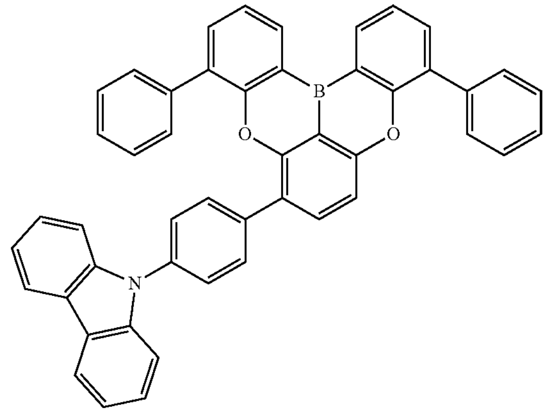
(H5-1130)
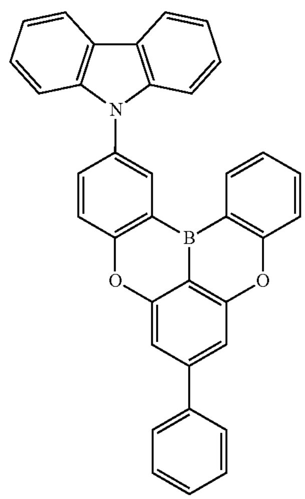
(H5-1131)
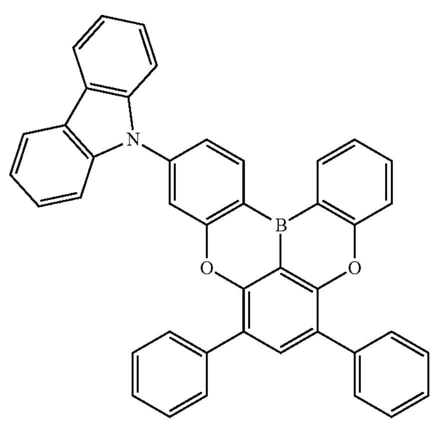

-continued
(H5-1132)
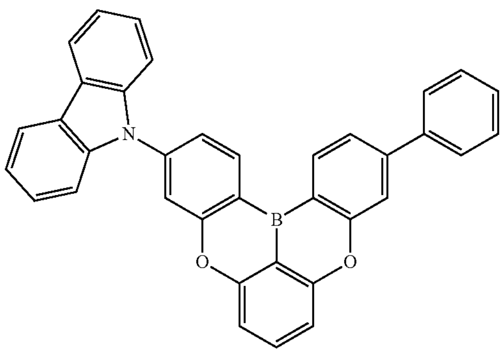
(H5-1141)
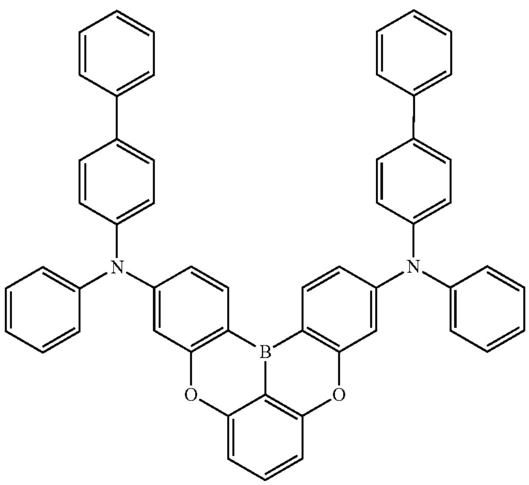
(H5-1142)
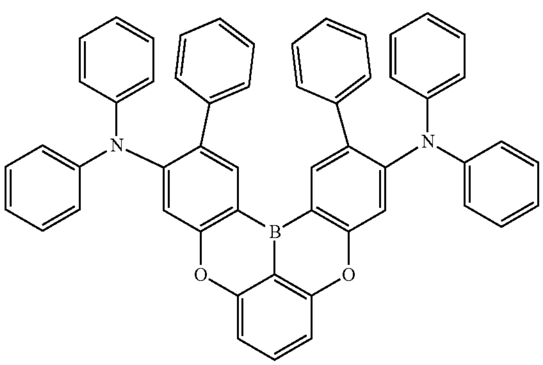
(H5-1143)
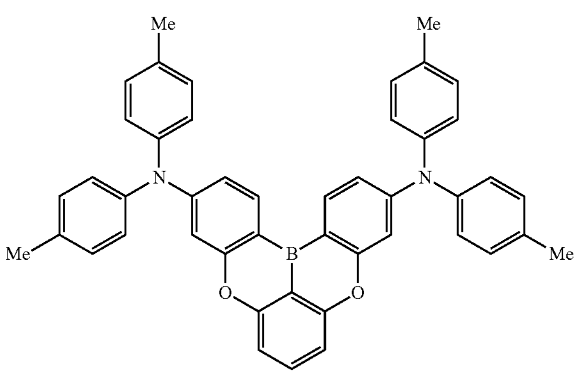
-continued
(H5-1144)
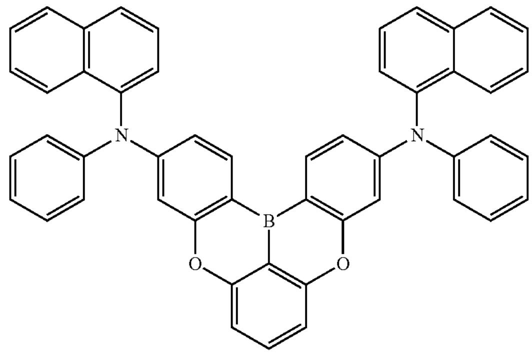
(H5-1145)
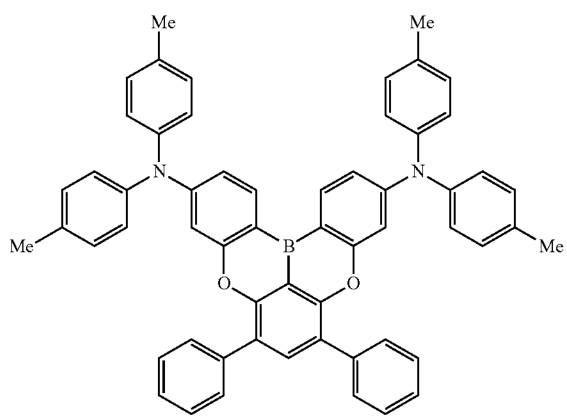
(H5-1146)
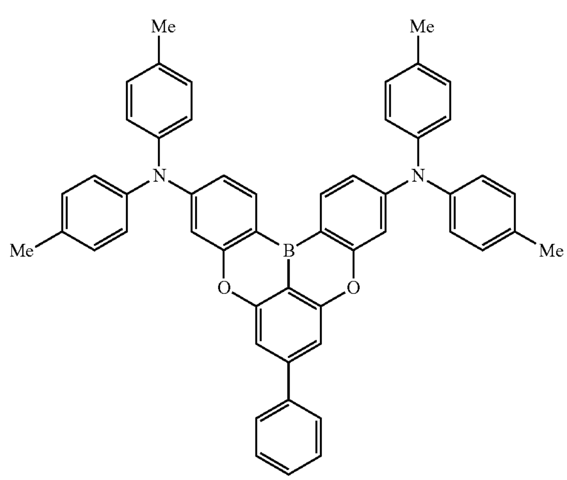

-continued
(H5-1147)
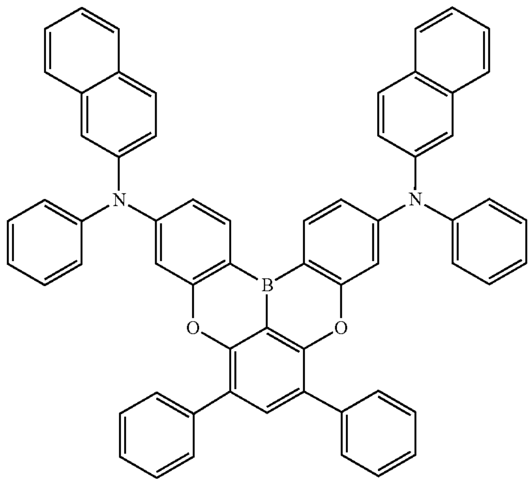
(H5-1148)
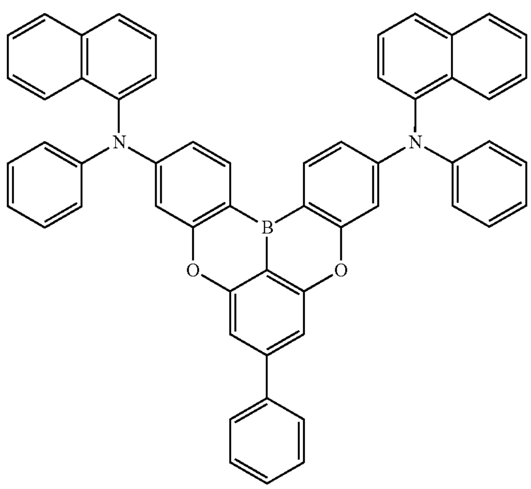
(H5-1271)
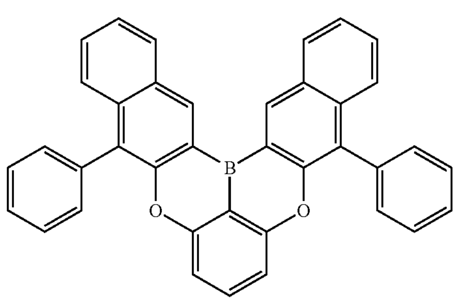
(H6-1)
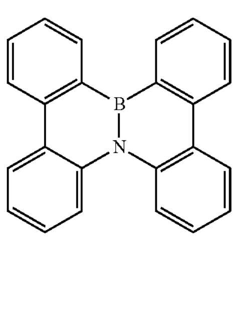
-continued
(H6-2)
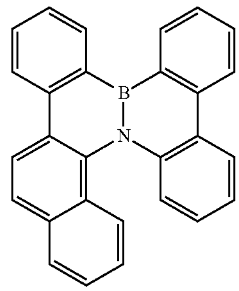
(H6-3)
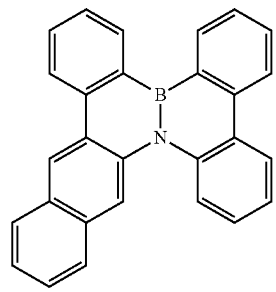
(H6-4)
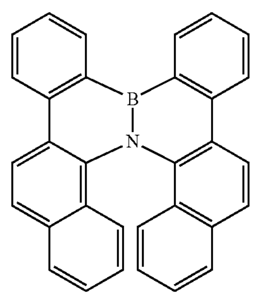
(H6-5)
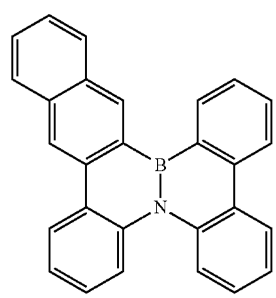
(H6-51)
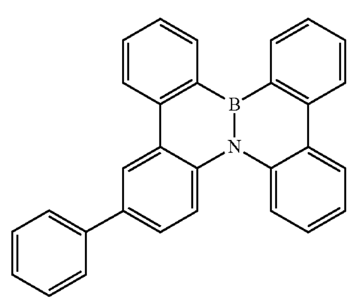

-continued
(H6-52)
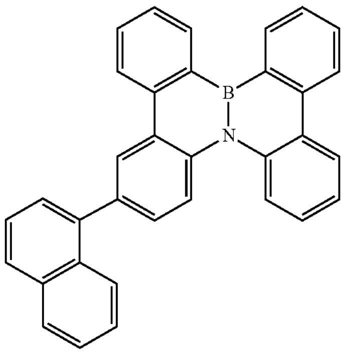
(H6-53)
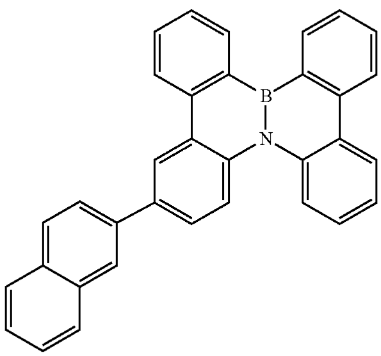
(H6-54)
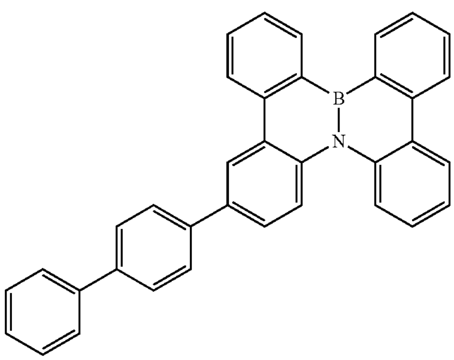
(H6-55)
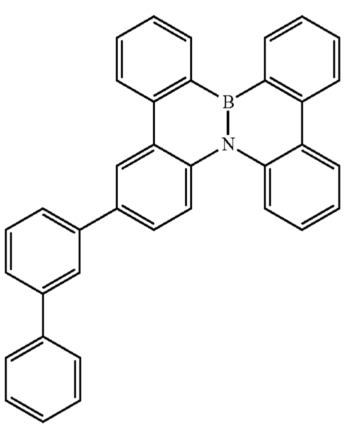
-continued
(H6-56)
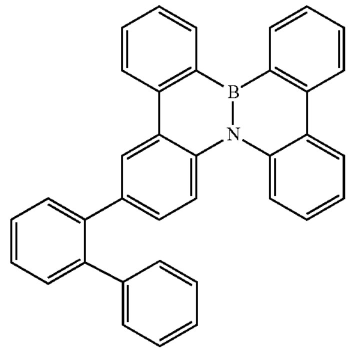
(H6-57)
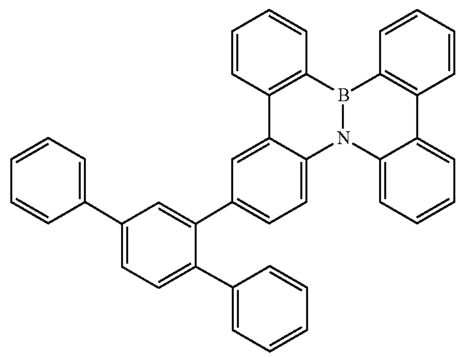
(H6-58)
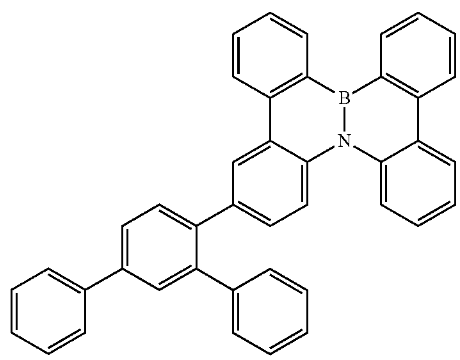
(H6-59)
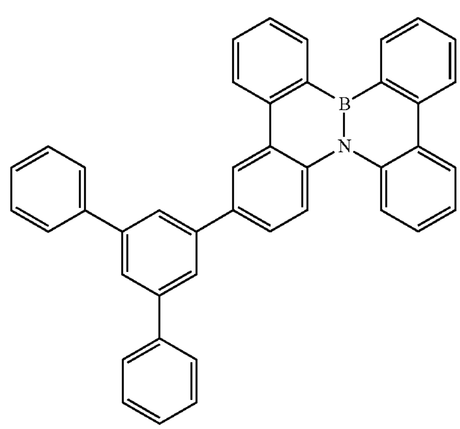

-continued
(H6-60)
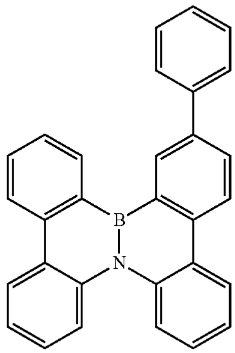
(H6-61)
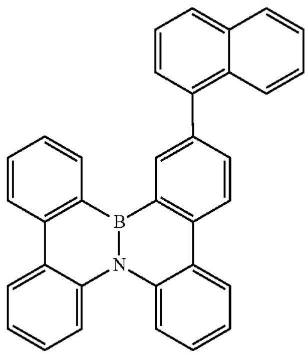
(H6-62)
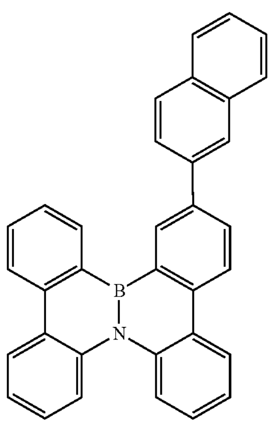
(H6-63)
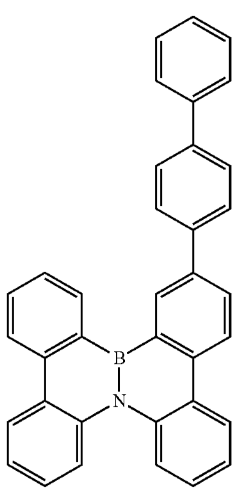
-continued
(H6-64)
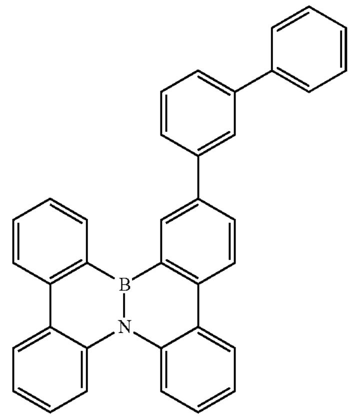
(H6-65)
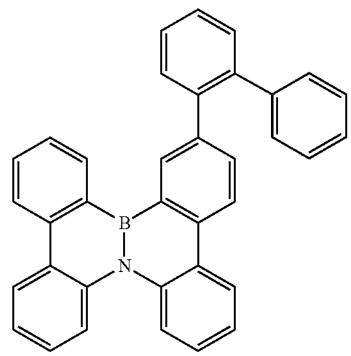
(H6-66)
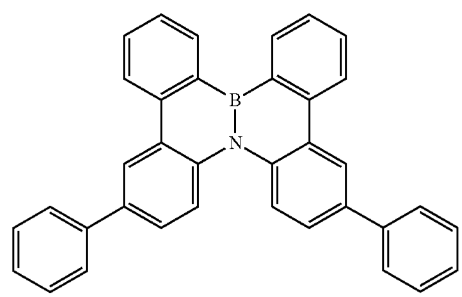
(H6-67)
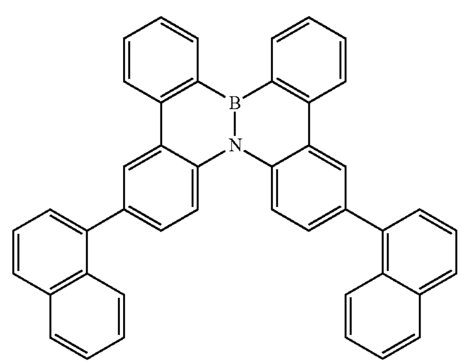

-continued
(H6-68)
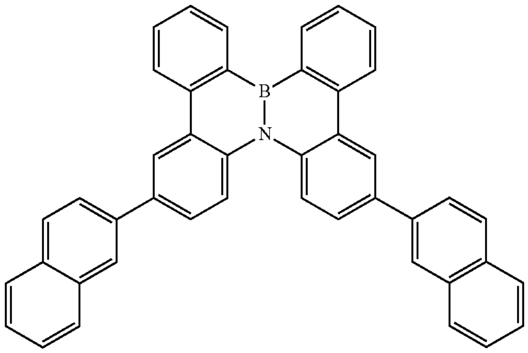
(H6-69)
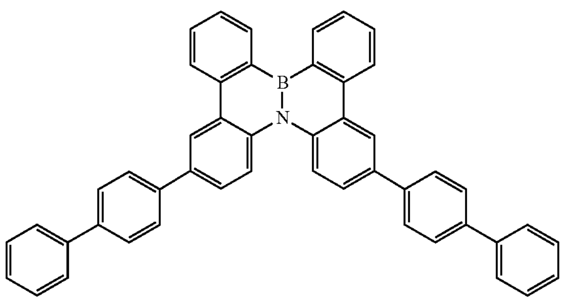
(H6-70)
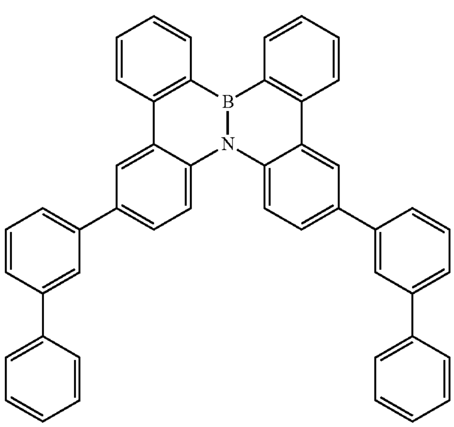
(H6-71)
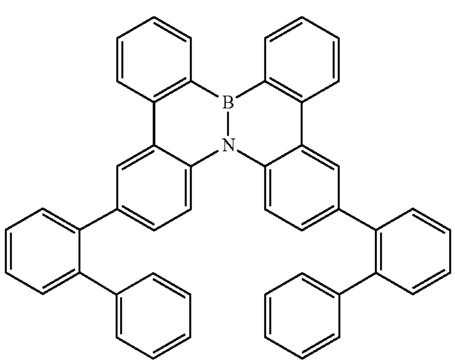
-continued
(H6-72)
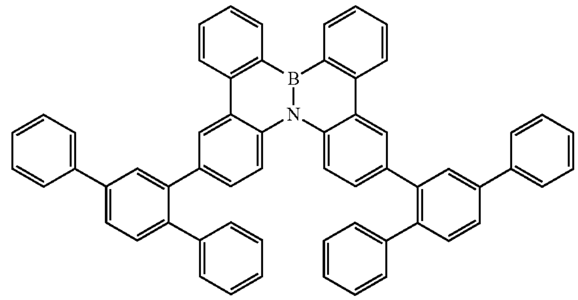
(H6-73)
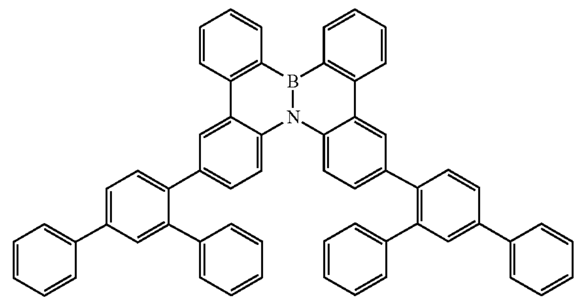
(H6-74)
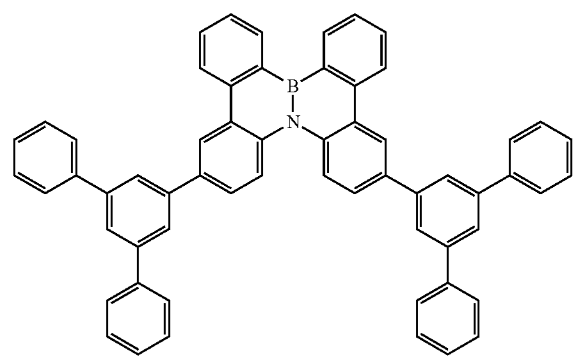
(H6-75)
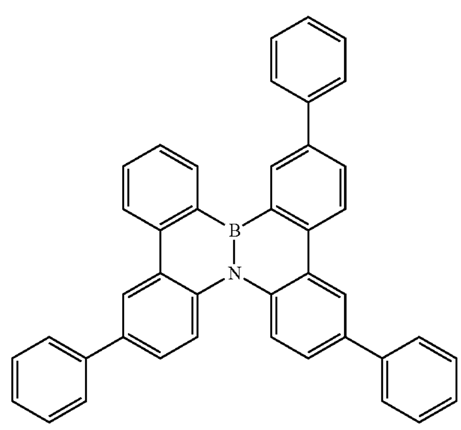

-continued
(H6-76)
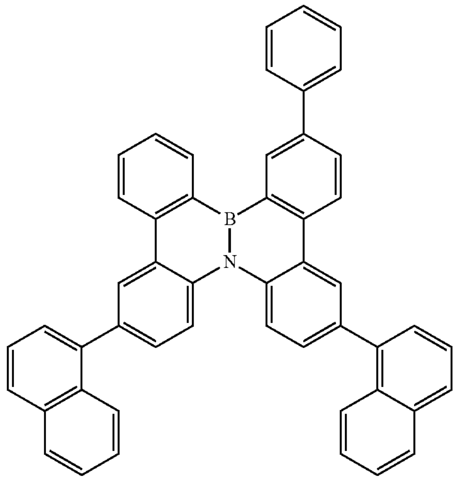
(H6-77)
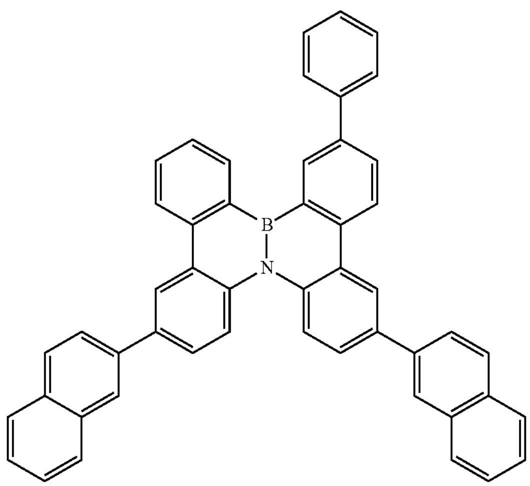
(H6-78)
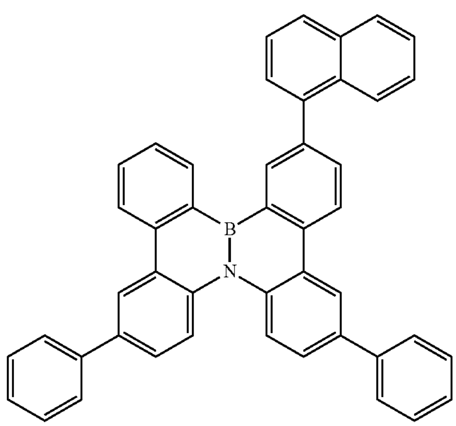
-continued
(H6-79)
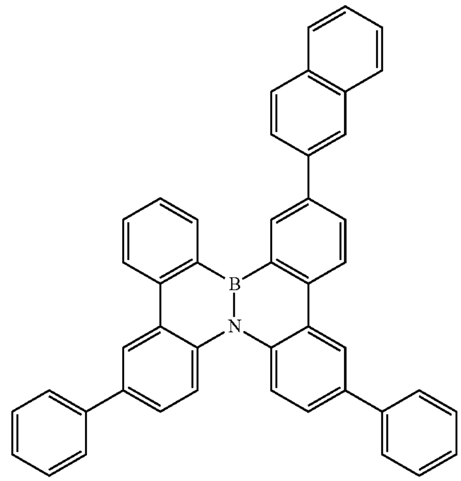
(H6-80)
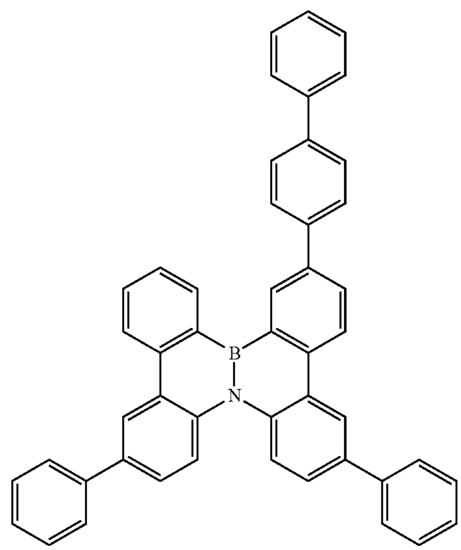
(H6-81)
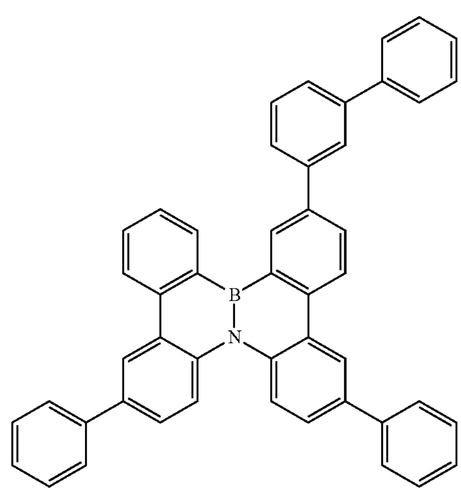

-continued
(H6-82)
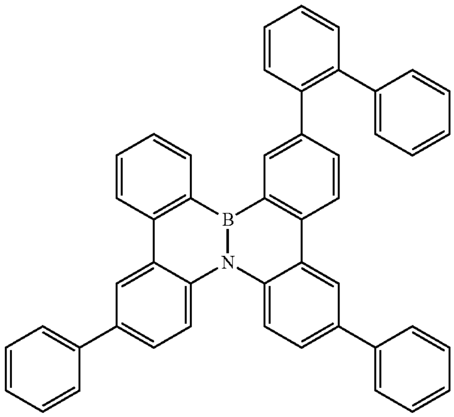
(H6-83)
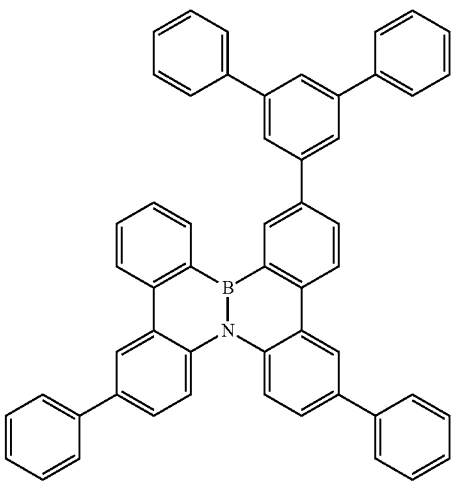
(H6-84)
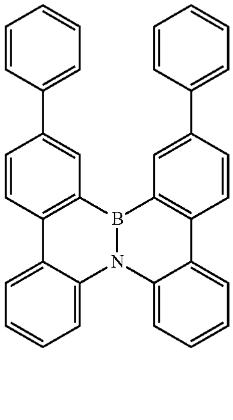
-continued
(H6-85)
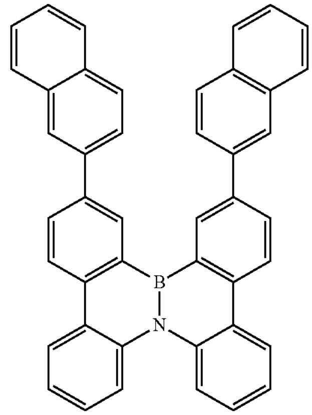
(H6-86)
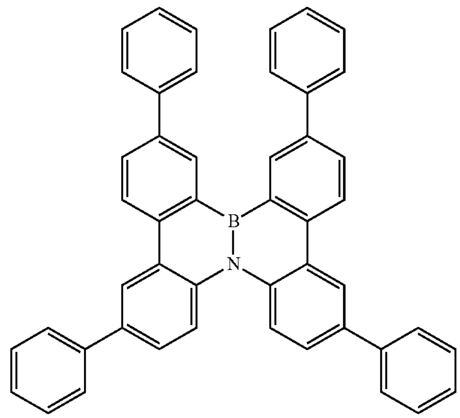
(H6-87)
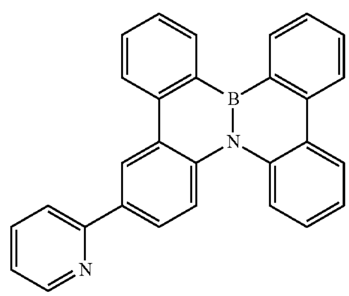
(H6-88)
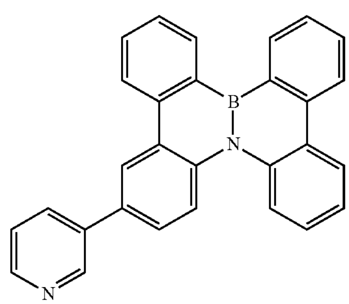

-continued
(H6-89)
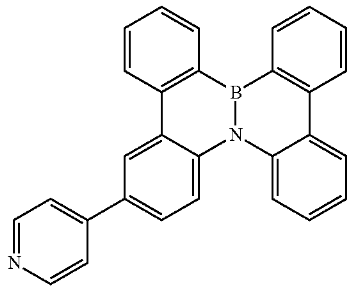
(H6-90)
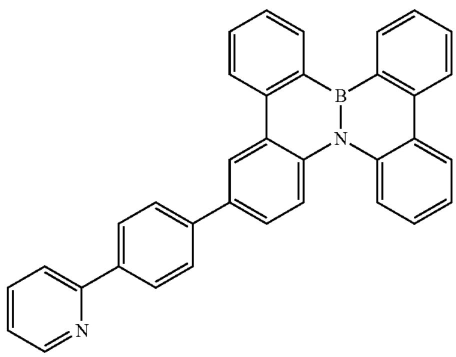
(H6-91)
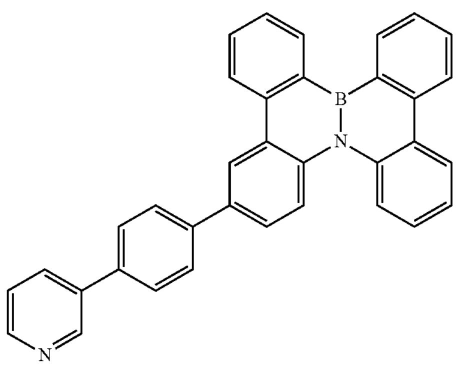
(H6-92)
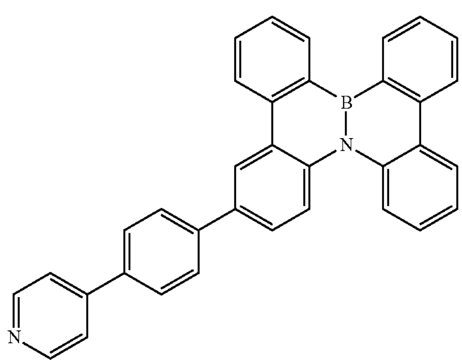
-continued
(H6-93)
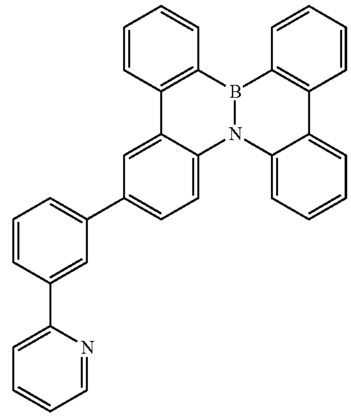
(H6-94)
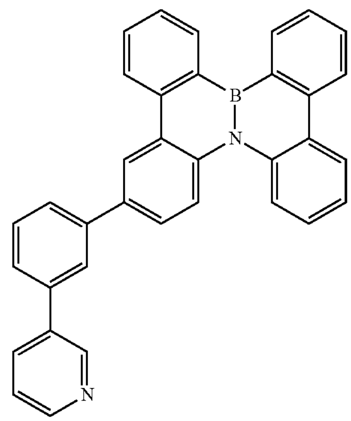
(H6-95)
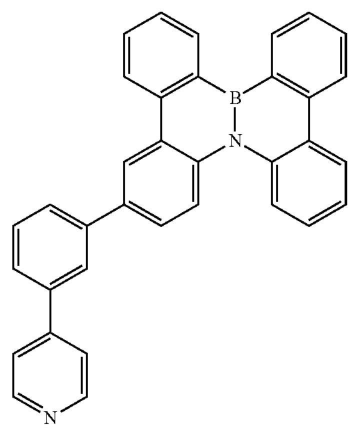
(H6-101)
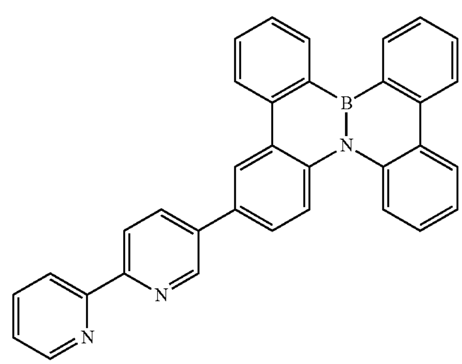

-continued
(H6-102)
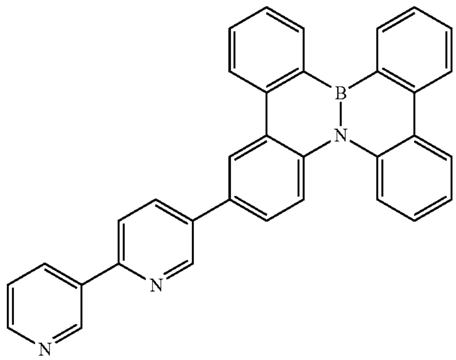
(H6-103)
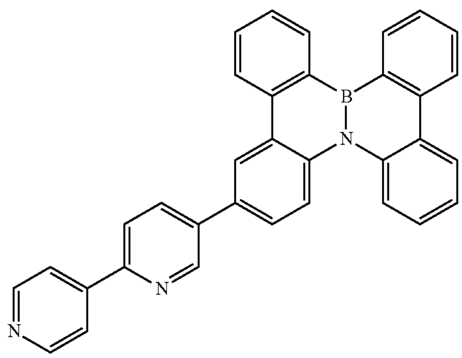
(H6-104)
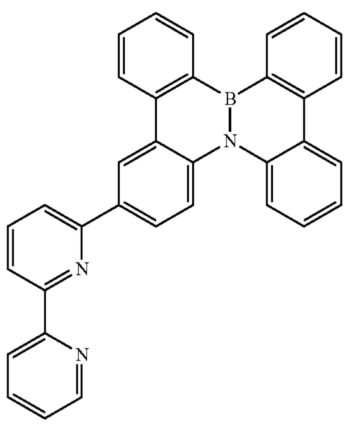
(H6-105)
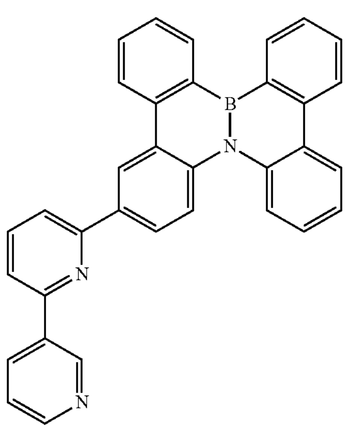
-continued
(H6-106)
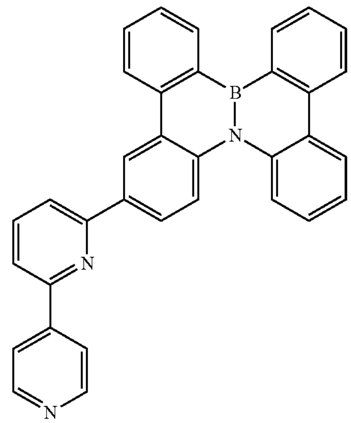
(H6-107)
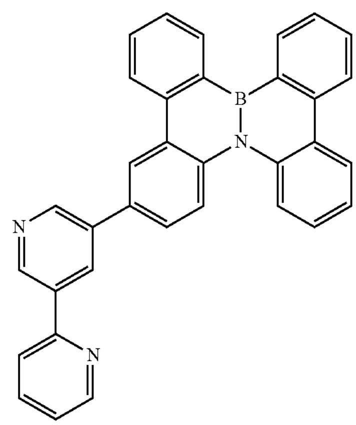
(H6-108)
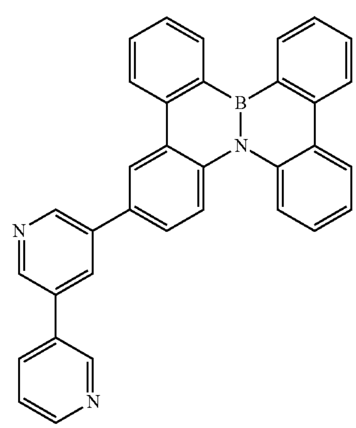

-continued
(H6-109)
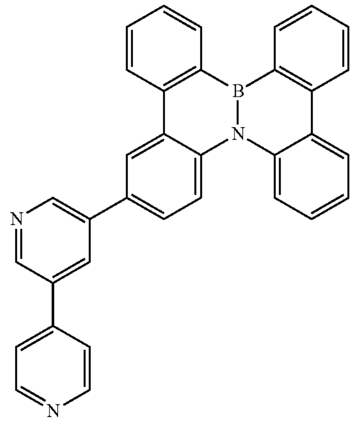
(H6-110)
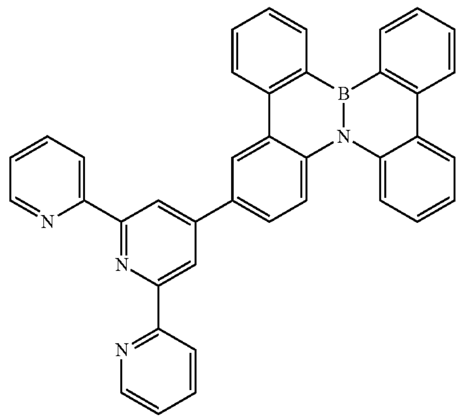
(H6-111)
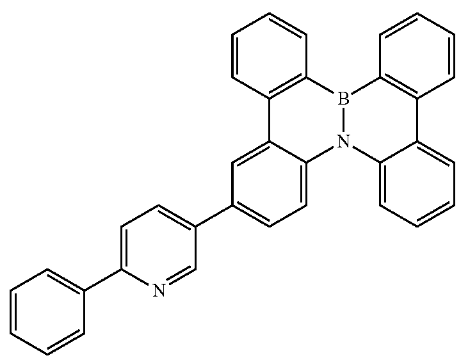
(H6-112)
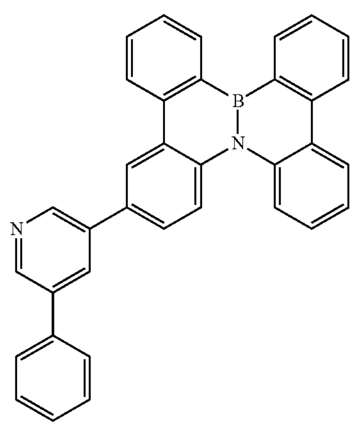
-continued
(H6-113)
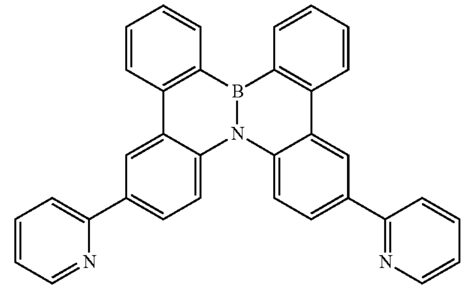
(H6-114)
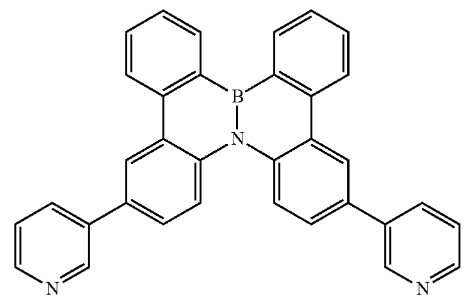
(H6-115)
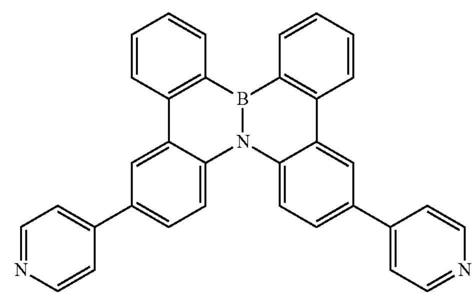
(H6-116)
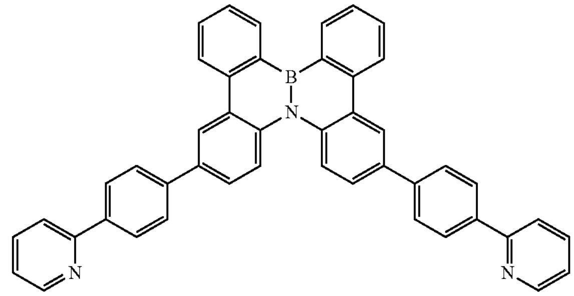

-continued
(H6-117)
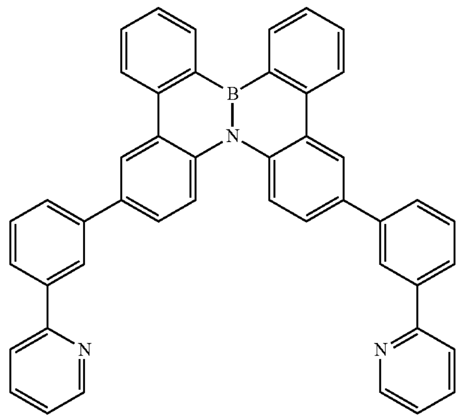
(H6-118)
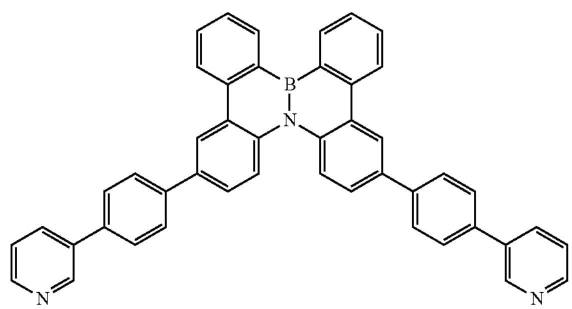
(H6-119)
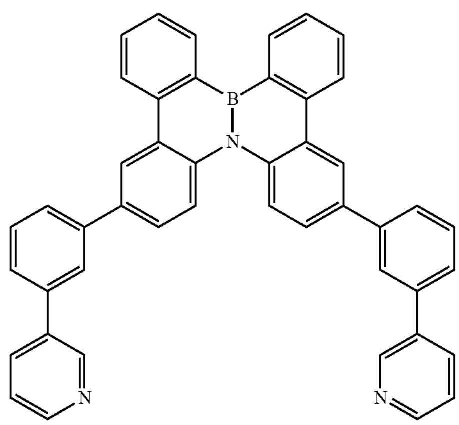
(H6-120)
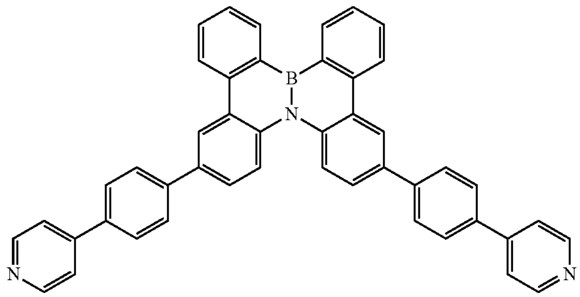
-continued
(H6-121)
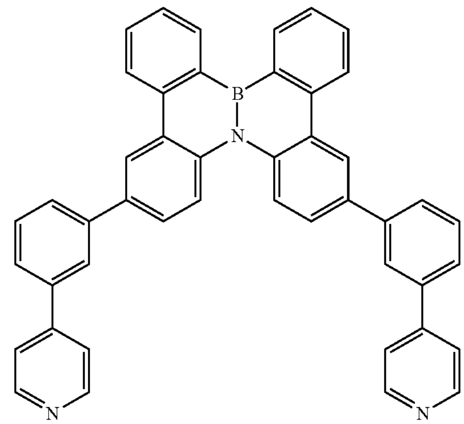
(H6-131)
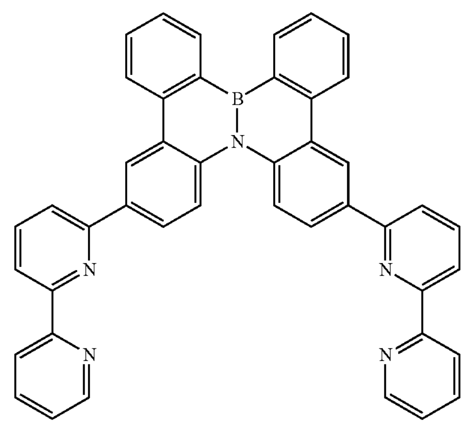
(H6-132)
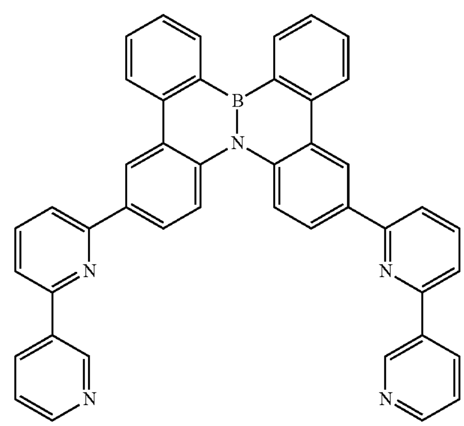

-continued
(H6-133)
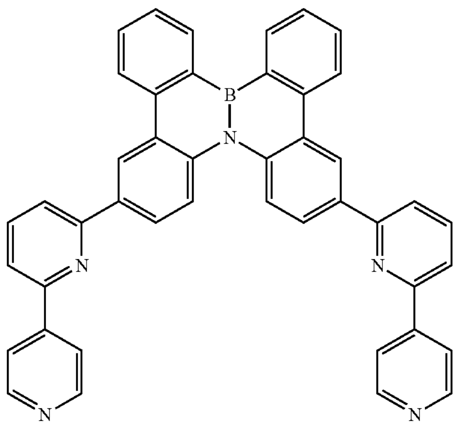
(H6-134)
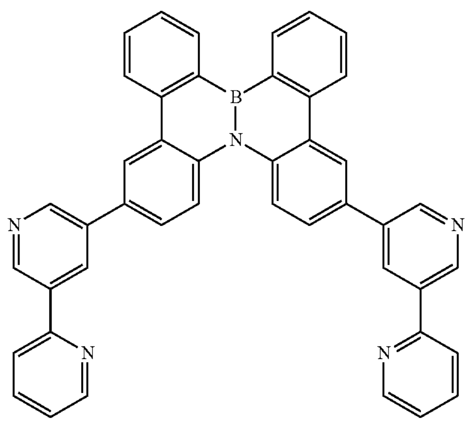
(H6-135)
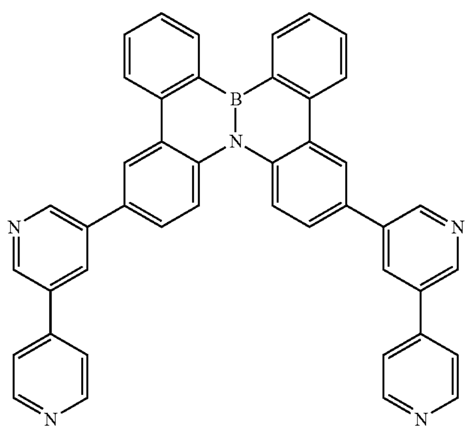
(H6-136)
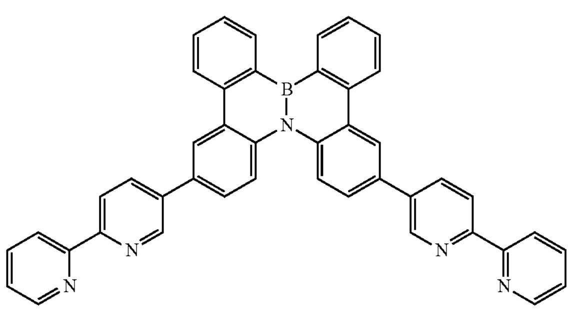
-continued
(H6-137)
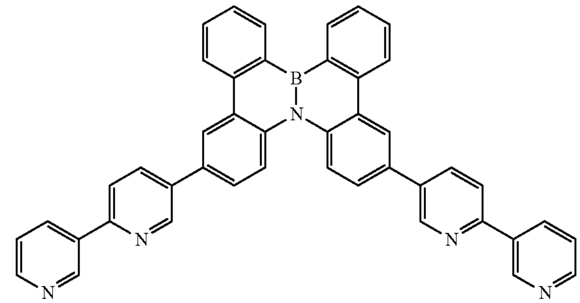
(H6-138)
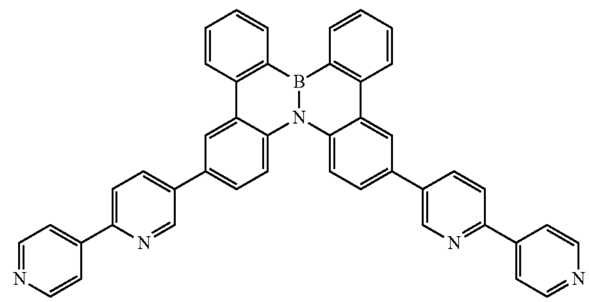
(H6-139)
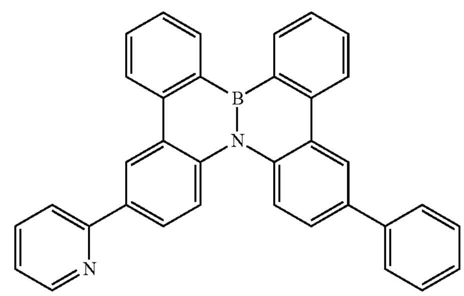
(H6-140)
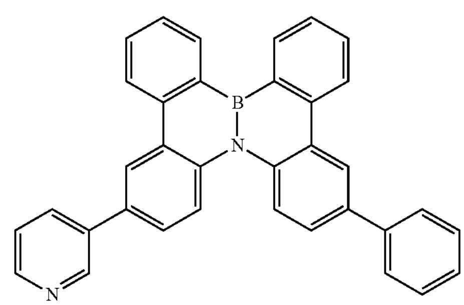
(H6-141)
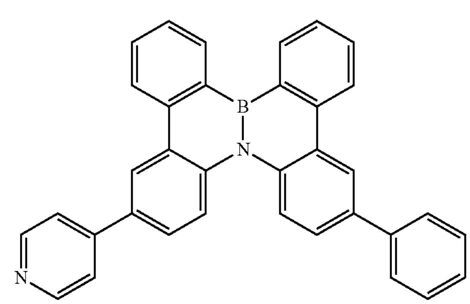

-continued
(H6-142)
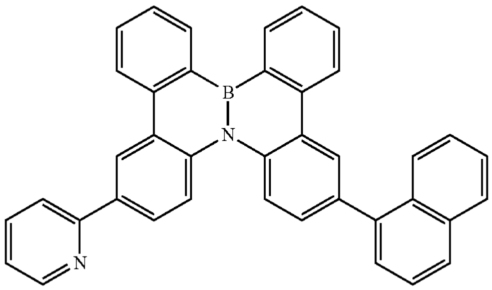
(H6-143)
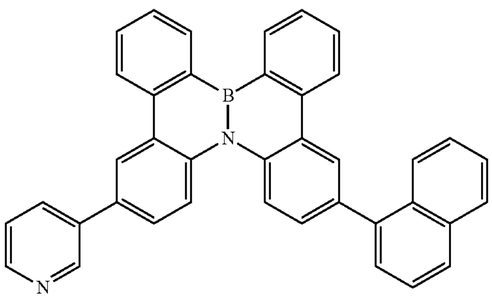
(H6-144)
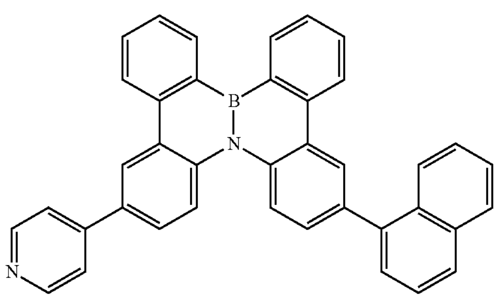
(H6-145)
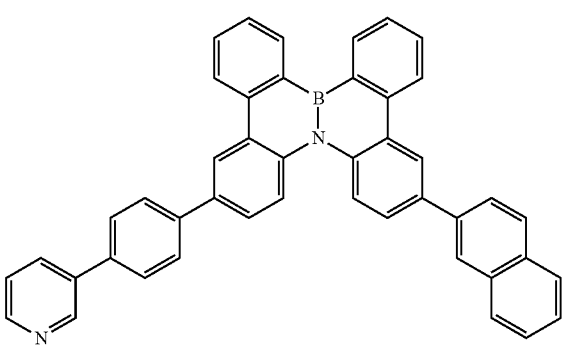
-continued
(H6-146)
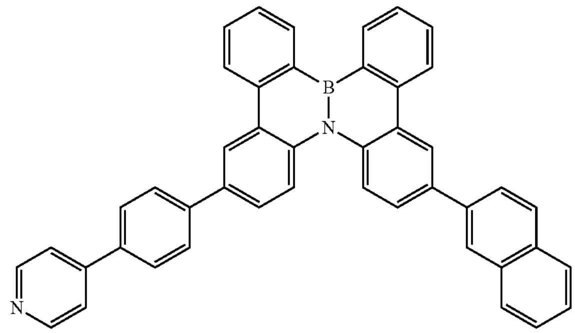
(H6-151)
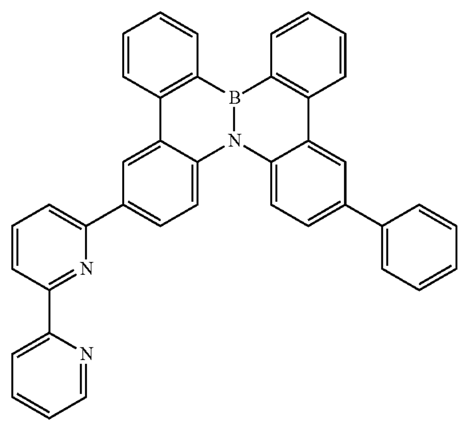
(H6-152)
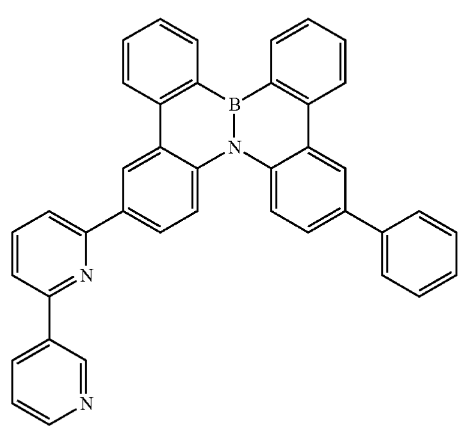

-continued
(H6-153)
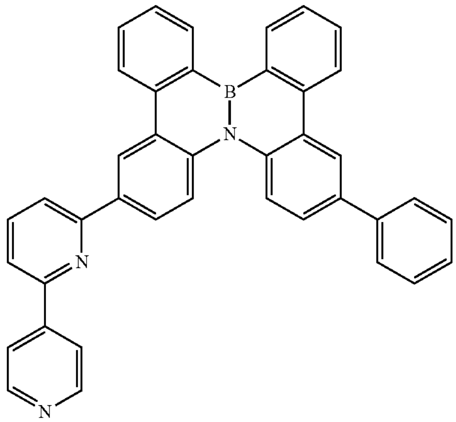
(H6-154)
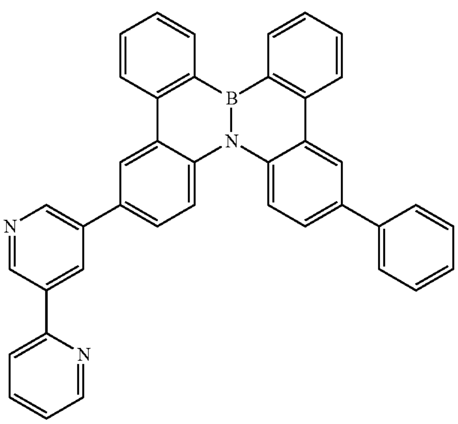
(H6-155)
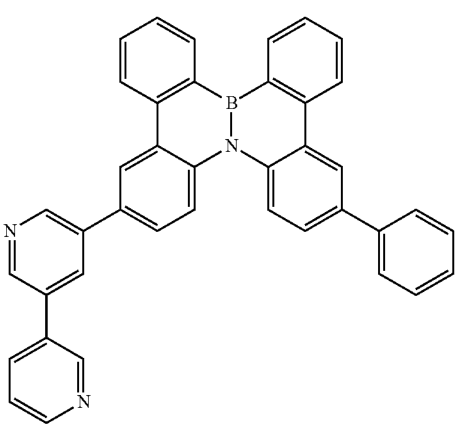
-continued
(H6-156)
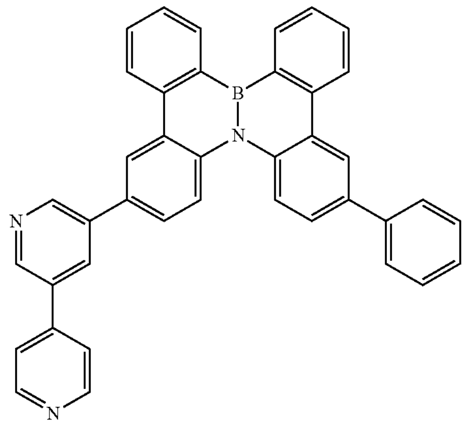
(H6-157)
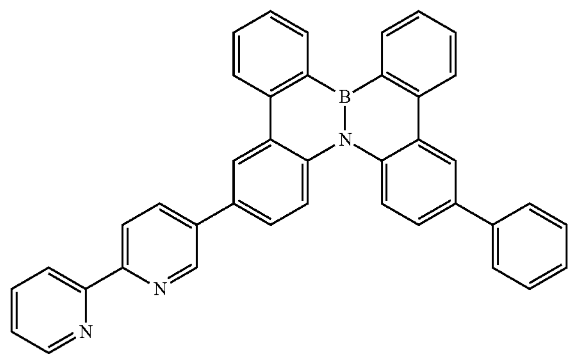
(H6-158)
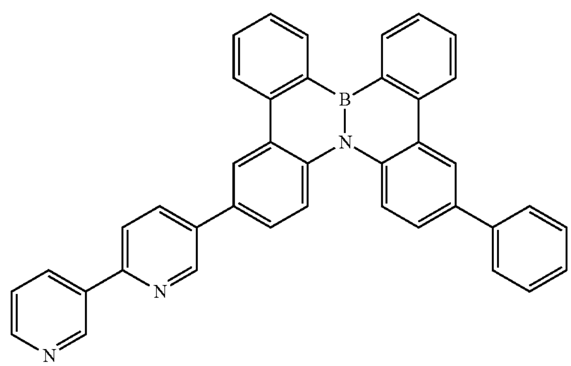
(H6-159)
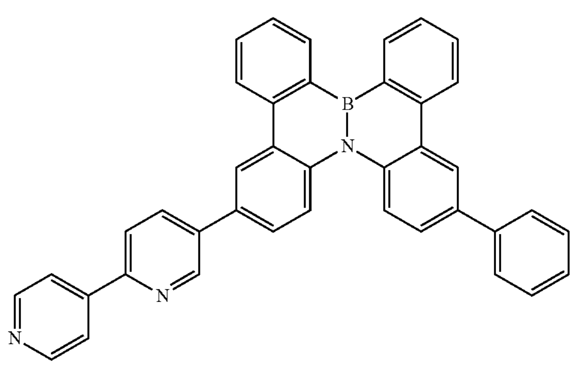

-continued
(H6-160)
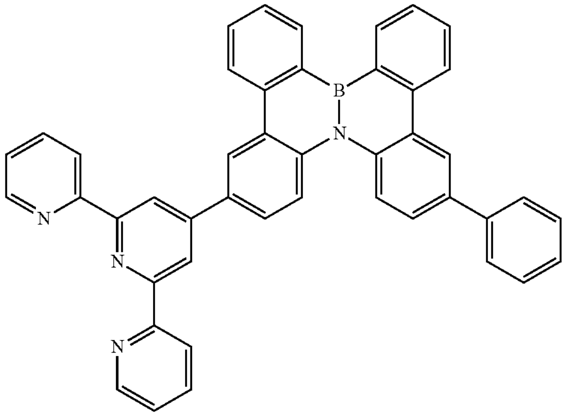
(H6-161)
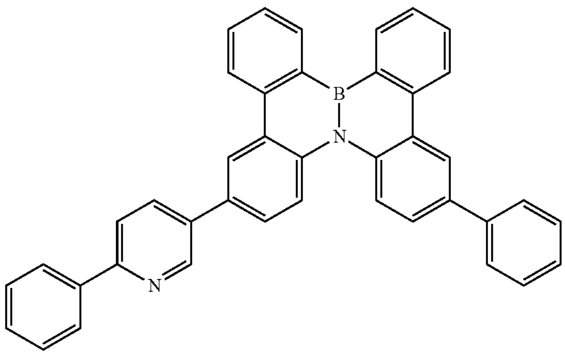
(H6-162)
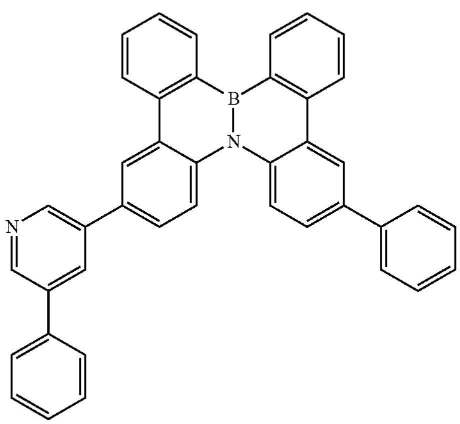
(H6-163)
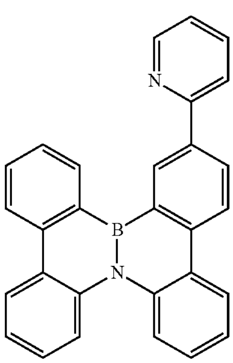
-continued
(H6-164)
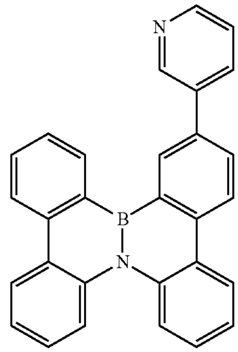
(H6-165)
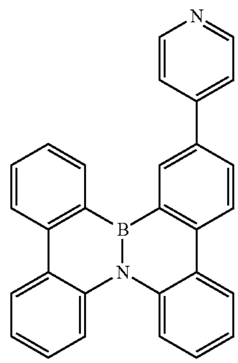
(H6-166)
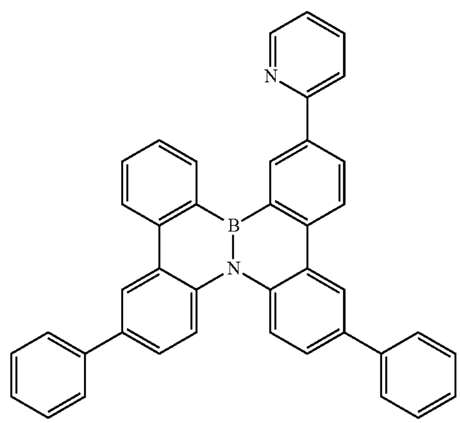
(H6-167)
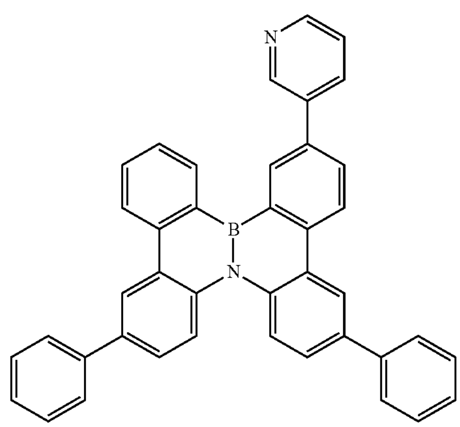

-continued
(H6-168)
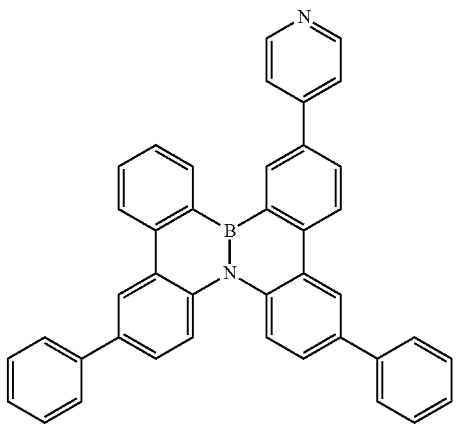
(H6-171)
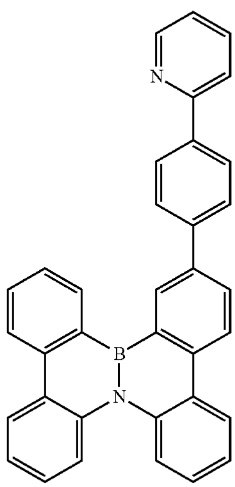
(H6-172)
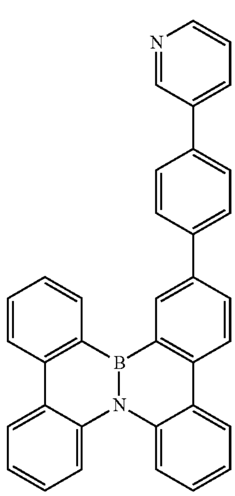
-continued
(H6-173)
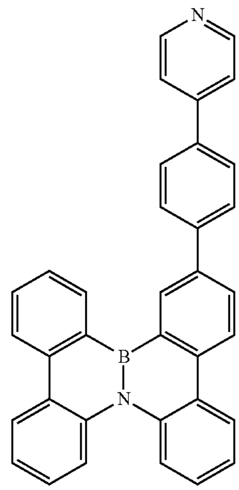
(H6-174)
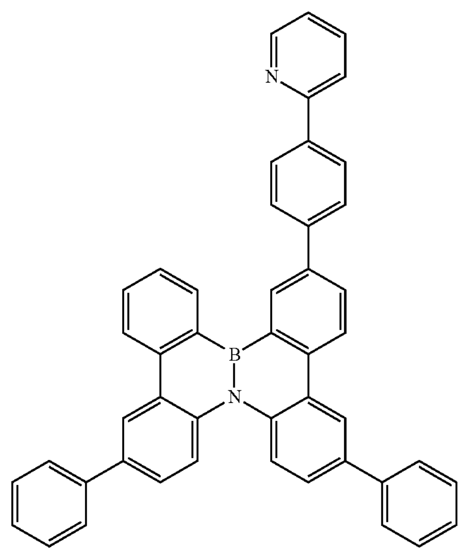
(H6-175)
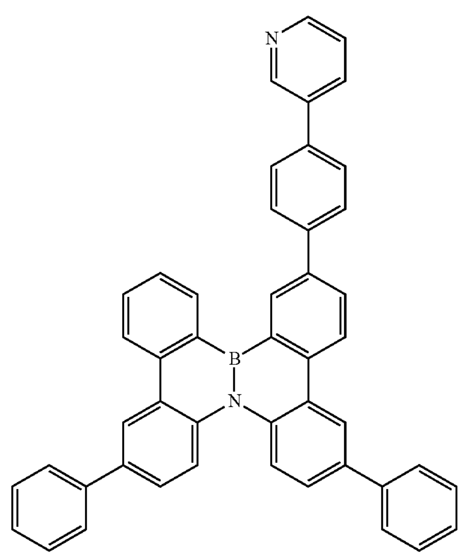

-continued
(H6-176)
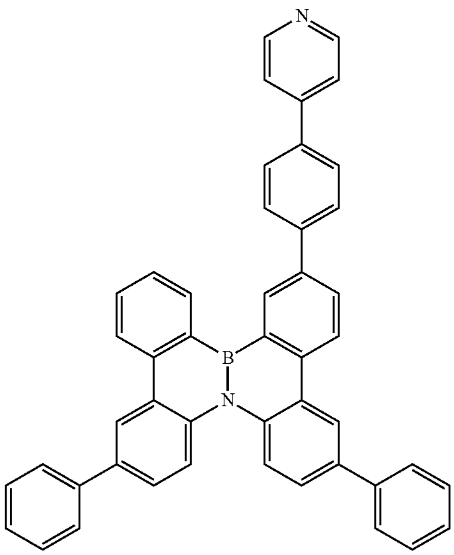
(H6-181)
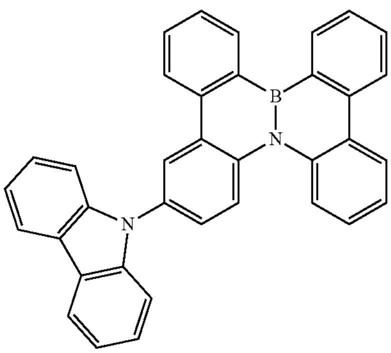
(H6-191)
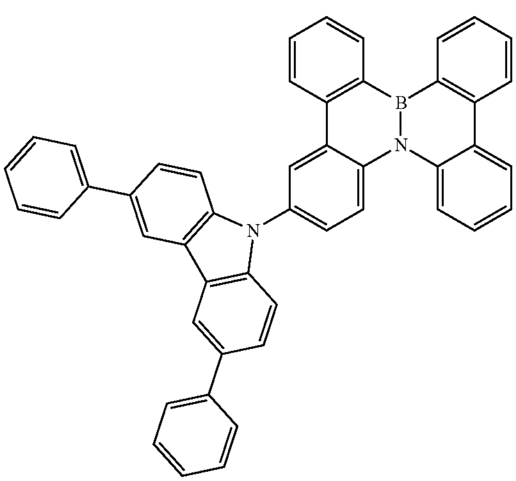
-continued
(H6-192)
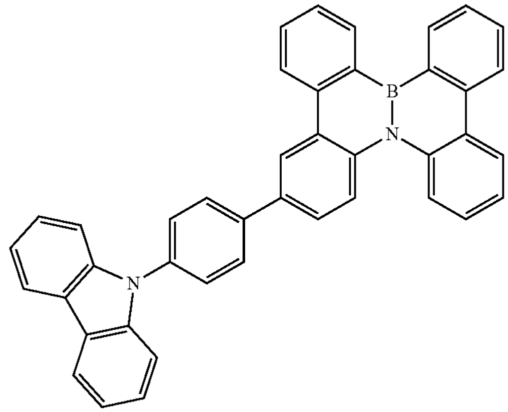
(H6-193)
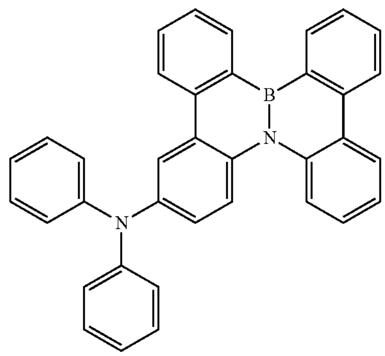
(H6-194)
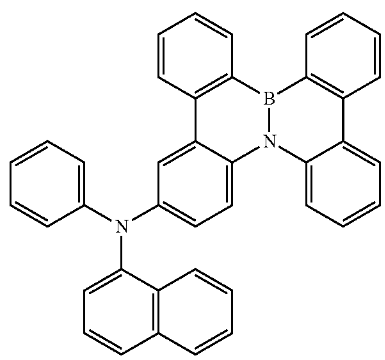
(H6-195)
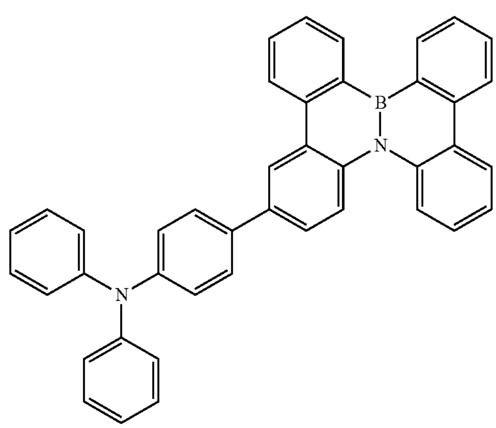

(H6-196)
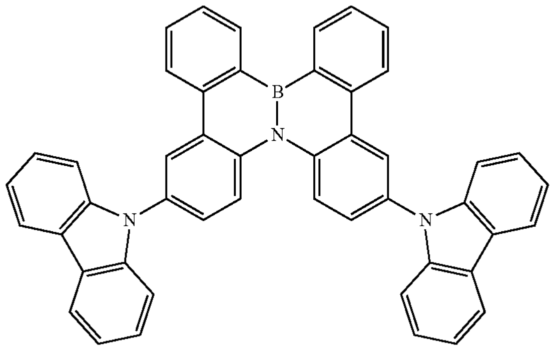
(H6-197)
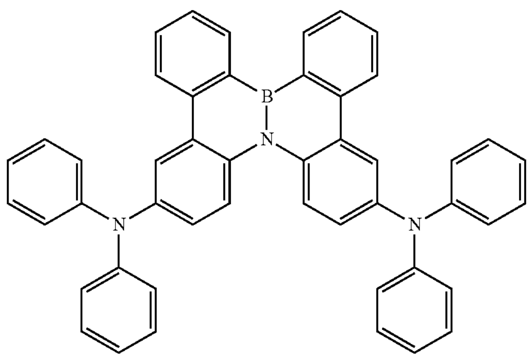
(H6-198)
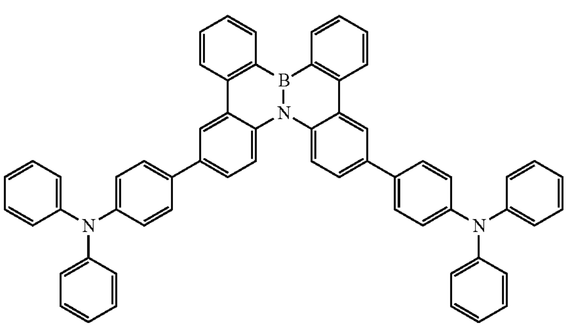
(H6-201)
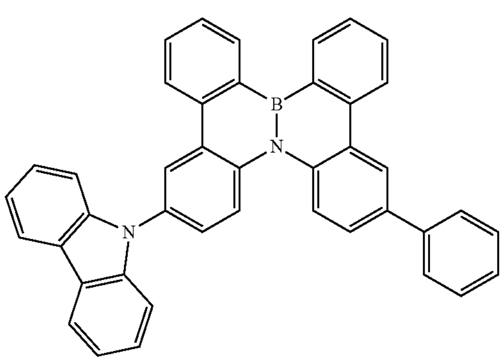
(H6-202)
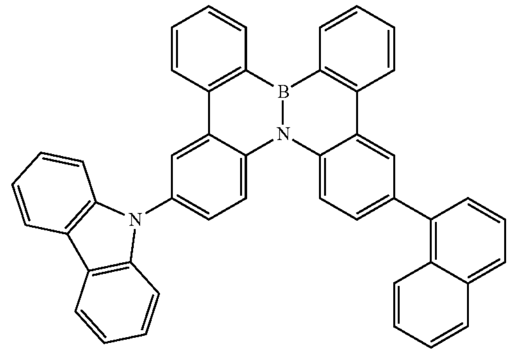
(H6-203)
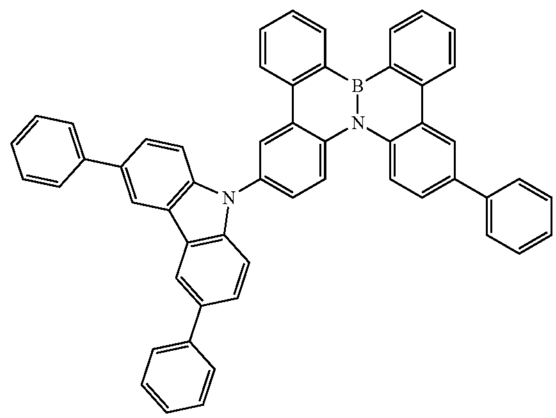
(H6-204)
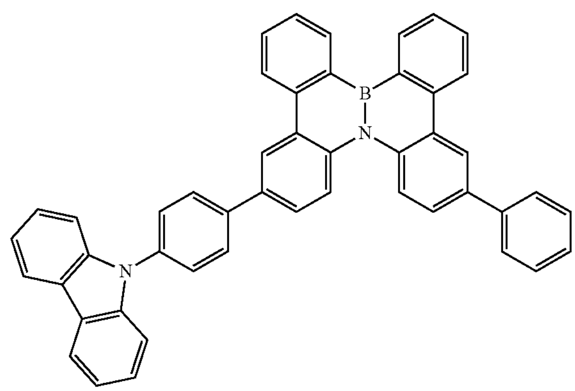
(H6-205)
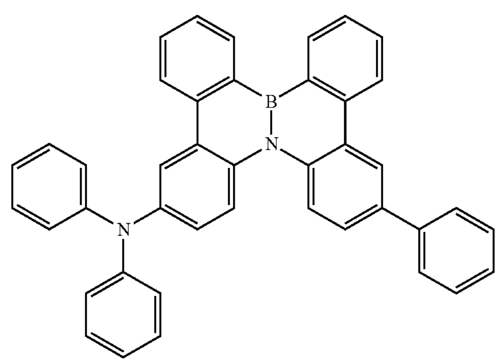

-continued
(H6-206)
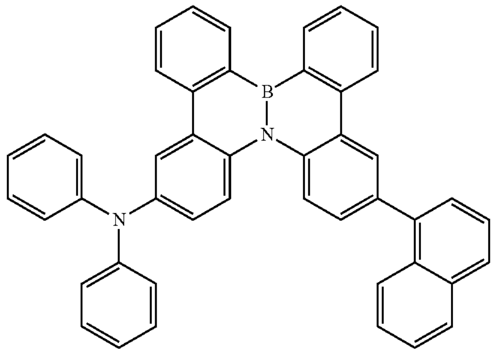
(H6-207)
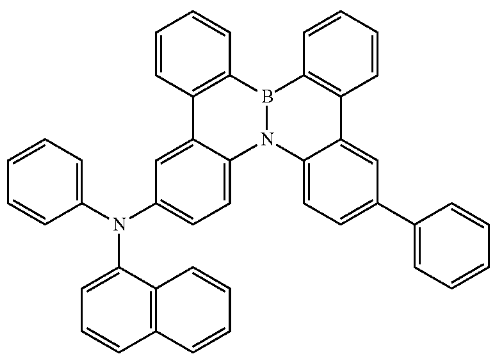
(H6-208)
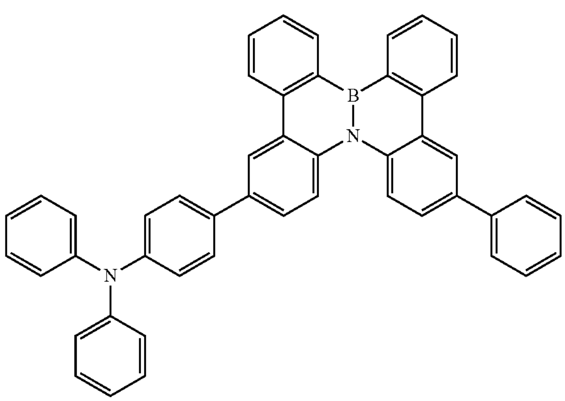
(H6-211)
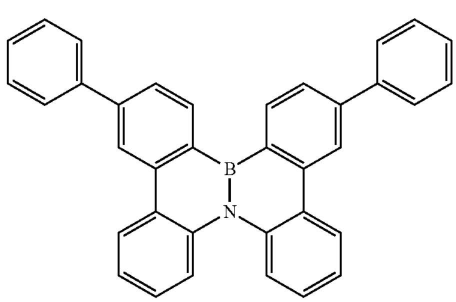
-continued
(H6-212)
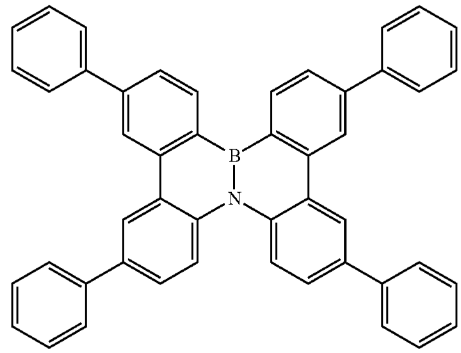
(H6-213)
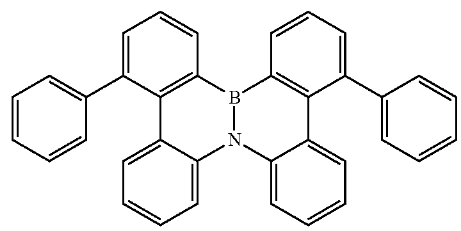
(H6-214)
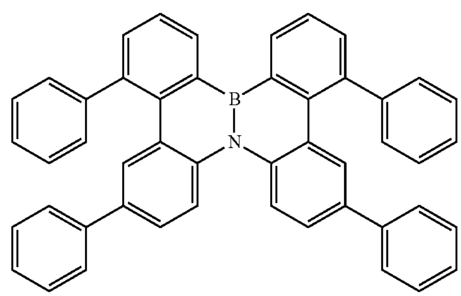
(H6-215)
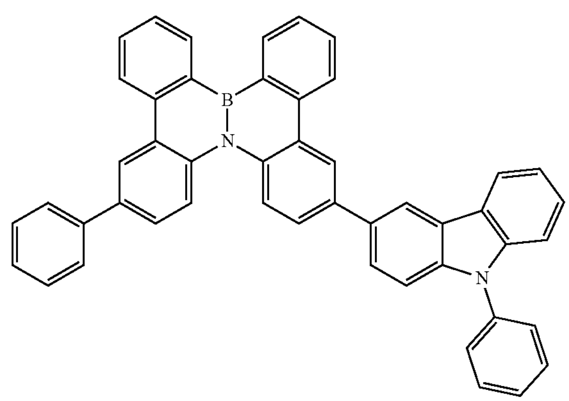

-continued (H6-216)

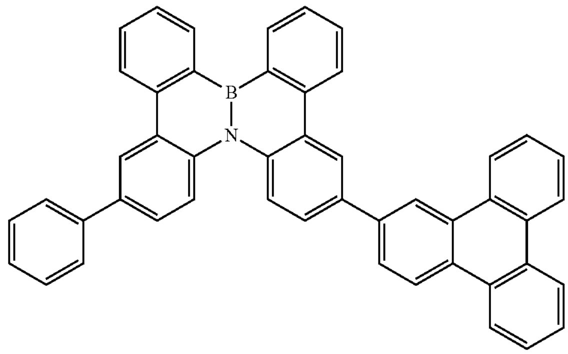

3-1-5-1-5-6. Process for Producing a Compound Represented by Formula (H-5) or Formula (H-6)

The compound represented by Formula (H-5) is produced by first binding a to e rings via a binding group (—O—) to produce an intermediate (first reaction), and thereafter binding a to e rings via a binding group (group containing B) to produce a final product (secondary reaction). In addition, the compound represented by Formula (H-6) can be produced by first combining a to d rings with a bind group (>NH or single bond) to produce an intermediate (first reaction), and thereafter binding a to d rings via a binding group (group containing B) to produce a final product (second reaction). In the first reaction, for example, a general reaction such as a nucleophilic substitution reaction or an Ullmann reaction can be used as an etherification reaction, and a general reaction such as a Buchwald-Hartwig reaction can be used as an amination reaction. In the second reaction, a tandem hetero-Friedel-Crafts reaction (continuous aromatic electrophilic substitution reaction—the same shall apply hereinunder) can be used.

<Production Process: Example of the Second Reaction of the Compound Represented by Formula (H5)>

The second reaction is a reaction for introducing B (boron) which binds a-ring, the b-ring and c-ring as shown in Scheme (1) below, and an example of the reaction is shown below for the compound represented by Formula (H5). First, the hydrogen between the two O's is ortho-metalized with n-butyl lithium, sec-butyl lithium or t-butyl lithium. Next, boron trifluoride or boron tribromide is added for lithium-boron metal interchange, and then a Brønsted base such as N,N-diisopropylethylamine is added for a tandem hetero-Friedel-Crafts reaction to give an intended product. In the second reaction, a Lewis acid such as aluminium trichloride may be added for promoting the reaction.

Scheme(1)

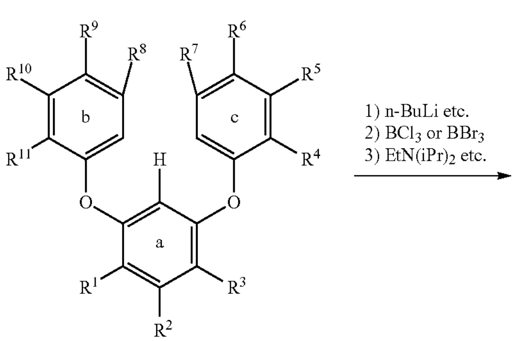

(Intermediate)

-continued

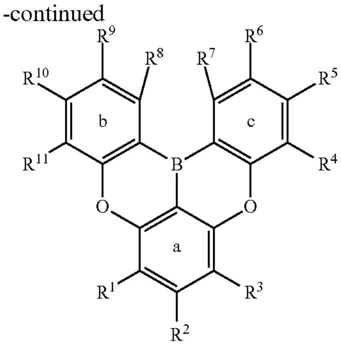

Compound of Formula(H5)

In the above scheme, a lithium is introduced into a desired position through ortho-metallization, but as in the following scheme (2), a bromine atom may be introduced into the position into which a lithium is desired to be introduced, and thereafter a lithium may be introduced into the desired position by halogen-metal interchange.

Scheme(2)

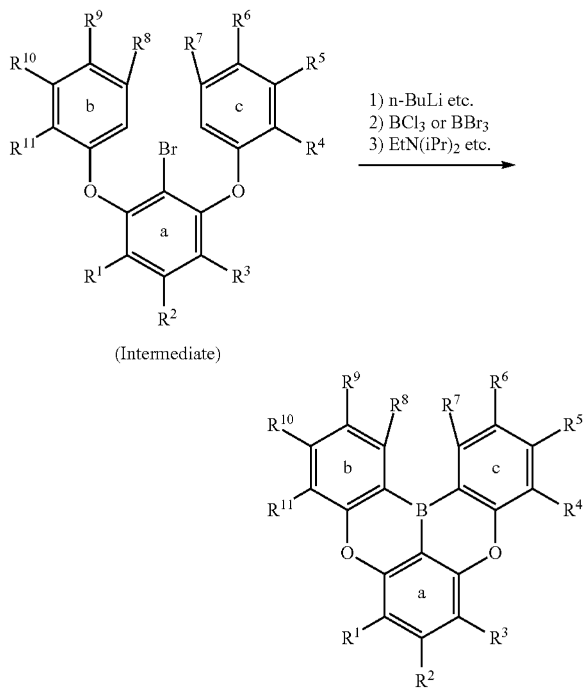

Compound of Formula(H5)

Appropriately selecting the above-mentioned synthesis methods, and appropriately selecting the raw materials to be used, a compound represented by Formula (H5) having a substituent at the desired position can be synthesized.

<Production Process: Examples of a Production Process of a Compound Represented by Formula (H6)>

As for the method for producing a compound represented by formula (H6), the first reaction and the second reaction in the method for producing a compound represented by formula (H5) described above can be applied. In other words, the second reaction is a reaction for introducing B (boron)

which binds c ring and the d ring with NH, and the hydrogen atoms of NH are orthometalated with n-butyllithium, sec-butyllithium, or t-butyllithium, and the like. Next boron trichloride, boron tribromide, or the like is added for lithium-boron metal interchange, and then a Brønsted base such as N,N-diisopropylethylamine is added for a tandem hetero-Friedel-Crafts reaction to give an intended product. Again, in the second reaction, a Lewis acid such as aluminum trichloride may be added to promote the reaction.

3-1-5-2. TADF Material

It is also preferable that the light-emitting layer contains TADF material.

In this specification, TADF material means a material which is a "thermally activated delayed fluorescent material". In the "thermally activated delayed fluorescent material", by reducing the energy difference between the excited singlet state and the excited triplet state, the reverse energy transfer from the excited triplet state to the excited singlet state is generated with high-efficiency, and the light emission from the singlet (thermally activated delayed fluorescence, TADF) is generated. In conventional fluorescence emission, 75% of the triplet exciton produced by current excitation cannot be taken out as fluorescence because it passes through the thermal deactivation pathway. On the other hand, in TADF, all excitons can be utilized for fluorescent emission, and a highly efficient organic EL element can be realized.

TADF is preferably a donor-acceptor type TADF compound (a D-A type TADF compound) designed to localize HOMO and LUMO in a molecule using an electron-donating substituent called a donor and an electron-accepting substituent called an acceptor so that an efficient inverse interterm crossing (reverse intersystem crossing) occurs.

Here, the term "electron-donating substituent" (donor) means a substituent or a partial structure in which a HOMO is localized in a TADF compound molecule, and the term "electron-accepting substituent" (acceptor) means a substituent or a partial structure in which a LUMO is localized in a TADF compound molecule.

Generally, a TADF compound using a donor and an acceptor have a large spin-orbit coupling (SOC: Spin Orbit Coupling) due to their structure, and a very fast reciprocal cross-over speed due to the small $\Delta E_{ST}$ of HOMO and LUMO interchange interactions. On the other hand, a TADF compound using a donor or an acceptor has a large structural relaxation in an excited state (when a structure is changed from a ground state to an excited state by an external stimulus in a certain molecule in which a stable structure is different between a ground state and an excited state, the structure is changed to a stable structure in an excited state), so that a wide emission spectrum is given, and thus a color purity may be lowered when used as a light emitting material.

However, by simultaneously using the polycyclic aromatic compound of the present invention, high-color purity can be imparted with the polycyclic aromatic compound of the present invention as an emitting dopant, and TADF material as an assisting dopant. TADF material may be any compound whose emission spectrum at least partially overlaps with the absorbance spectrum of the polycyclic aromatic compound of the present invention. Both of the polycyclic aromatic compound of the present invention and a TADF material may be contained in the same layer, and may be contained in an adjacent layer.

Examples of TADF material which can be used for such purpose include a compound represented by the following Formula (H7) or a compound having the following Formula (H7) as a substructure.

$$\text{ED-Ln-EA} \tag{H7}$$

In Formula (H7), ED is an electron-donating group, Ln is a linking group, and EA is an electron-accepting group, and the energy difference ($\Delta E_{ST}$) between the lowest excited singlet energy level ($E_{S1}$) and the lowest excited triplet energy level ($E_{T1}$) of the compound represented by Formula (H7) is less than or equal to 0.2 eV (Hiroki Uoyama, Kenichi Goushi, Katsuyuki Shizu, Hiroko Nomura, Chihaya Adachi, Nature, 492, 234-238 (2012)). The energy-difference ($\Delta E_{ST}$) is preferably less than or equal to 0.15 eV, more preferably less than or equal to 0.10 eV, and still more preferably less than or equal to 0.08 eV.

As an electron donating group (the donor-type structure) and an electron accepting group (the acceptor-type structure) for use in the TADF material, for example, the structures described in Chemistry of Materials, 2017, 29, 1946-1963 can be used.

Examples of ED include functional groups containing sp3 nitrogen, more specifically, groups derived from carbazole, dimethylcarbazole, di-tert-butylcarbazole, dimethoxycarbazole, tetramethylcarbazole, benzofluorocarbazole, benzothienocarbazole, phenyldihydroindolocarbazole, phenylbicarbazole, bicarbazole, tercarbazole, diphenylcarbazolylamine, tetraphenylcarbazolyldiamine, phenoxazine, dihydrophenazine, phenothiazine, dimethyldihydroacridine, diphenylamine, bis(tert-butylphenyl)amine, N1-(4-(diphenylamino) phenyl)-N4,N4-diphenybenzene-1,4-diamine, dimethyltetraphenyldihydroacridinediamine, tetramethyl-dihydro-indenoacridine, diphenyl-dihydrodibenzazaserine, and the like. In addition, examples of EA include groups derived from sp2 nitrogen-containing aromatic rings, CN-substituted aromatic rings, and rings having ketones and cyano, more specifically, sulfonyldibenzene, benzophenone, phenylenebis(phenylmethanone), benzonitrile, isonicotinonitrile, phthalonitrile, isophthalonitrile, paraphthalonitrile, triazole, oxazole, thiadiazole, benzothiazole, benzobis(thiazole), benzoxazole, benzobis(oxazole), quinoline, benzimidazole, dibenzoquinoxaline, heptaazaphenalene, thioxanthone dioxide, dimethylanthrazene, anthracenedione, pyridine, 5H-cyclopenta[1,2-b:5,4-b']dipyridine, benzenetricarbonitrile, fluorenedicarbonitrile, pyrazinecarbonitrile, pyridinedicarbonitrile, dibenzoquinoxalinedicarbonitrile, pyrimidine, phenylpyrimidine, methylpyrimidine, triazine, triphenyltriazine, bis(phenylsulfonyl)benzene, dimethylthioxanthone dioxide, thianthrene tetroxide, tris(dimethylphenyl)borane and the like. Examples of Ln include single bonds and arylenes, more specifically, phenylene, biphenylene, and naphthylene. In any of the structures, the hydrogen may be substituted with alkyl, cycloalkyl or aryl. Particularly preferred is a compound having, as a partial structure, at least one selected from the group consisting of carbazole, phenoxazine, acridine, triazine, pyrimidine, pyrazine, thioxanthene, benzonitrile, phthalonitrile, isophthalonitrile, diphenyl sulfone, triazole, oxadiazole, thiadiazole and benzophenone.

In Formula (H7), the linking group Ln functions as a spacer structure that separates the donor and acceptor substructures.

Compounds represented by Formula (H7) can be more specifically compounds represented by any of Formula (117-1), Formula (H7-2) and Formula (H7-3).

(H7-1)

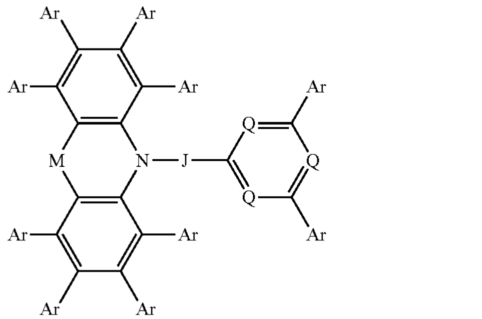

(H7-2)

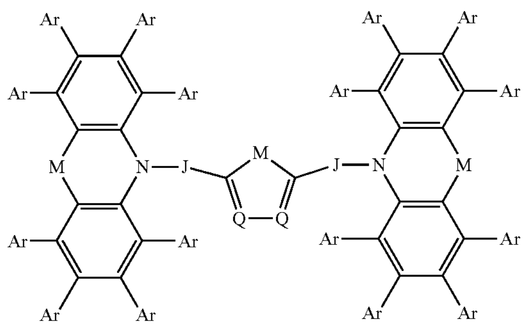

(H7-3)

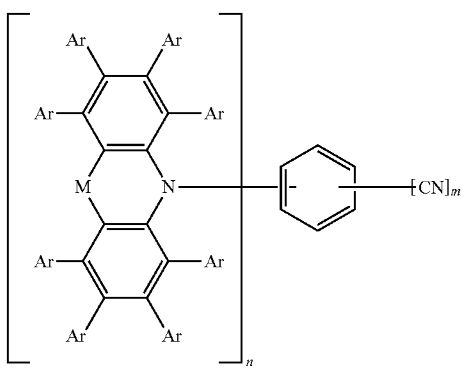

In Formulas (117-1), (H7-2) and (H7-3),

M is each independently a single bond, —O—, >N—Ar or >C(—Ar)$_2$, and is preferably a single bond, —O—, or >N—Ar in terms of the depth of HOMO of the substructure to be formed and the height of the lowest excited singlet energy level and the lowest excited triplet energy level. J is a spacer structure that separates the donor and acceptor substructures, and each is independently an arylene having 6 to 18 carbons. From the viewpoint of the magnitude of conjugation that seeps out of the donor and acceptor substructures, an arylene having 6 to 12 carbons is preferable. More specifically, phenylene, methylphenylene and dimethylphenylene can be exemplified. Q's are each independently =C(—H)— or =N—, and preferably =N—, in terms of the shallowness of LUMO of the substructure forming and the height of the lowest excited singlet energy level and the lowest excited triplet energy level. Ar's are each independently hydrogen, an aryl having 6 to 24 carbons, a heteroaryl having 2 to 24 carbons, an alkyl having 1 to 12 carbons, or a cycloalkyl having 3 to 18 carbons, and Ar is preferably hydrogen, an aryl having 6 to 12 carbons, a heteroaryl having 2 to 14 carbons, an alkyl having 1 to 4 carbons, or a cycloalkyl having 6 to 10 carbons, and more preferably hydrogen, phenyl, tolyl, xylyl, mesityl, biphenyl, pyridyl, bipyridyl, triazyl, carbazolyl, dimethylcarbazolyl, di-tert-butylcarbazolyl, benzoimidazolyl, and pheny benzoimidazolyl, further preferably hydrogen, phenyl, or carbazolyl, from the viewpoint of the depth of HOMO of the substructures formed and the height of the lowest excited singlet energy level and lowest excited triplet energy level. m is 1 or 2. n is an integer of 1 to (6-m), and preferably an integer of 4 to (6-m) from the viewpoint of steric hindrance. Further, at least one hydrogen in the compound represented by each of the above formulas may be replaced with a halogen or deuterium.

Examples of the compounds represented by Formula (H7) include compounds represented by the following structure. In the structural formula, * indicates the bonding position, "Me" represents methyl, and "tBu" represents t-butyl.

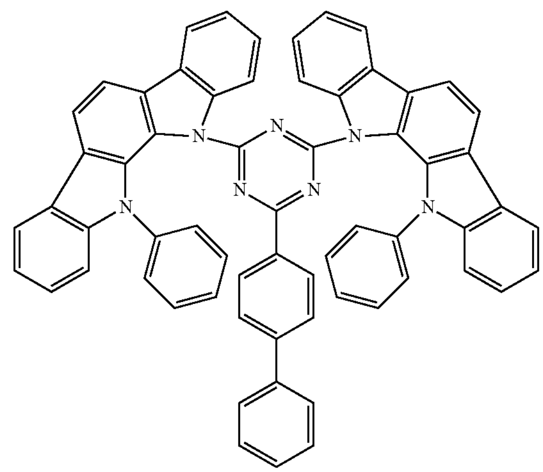

PIC-TRZ

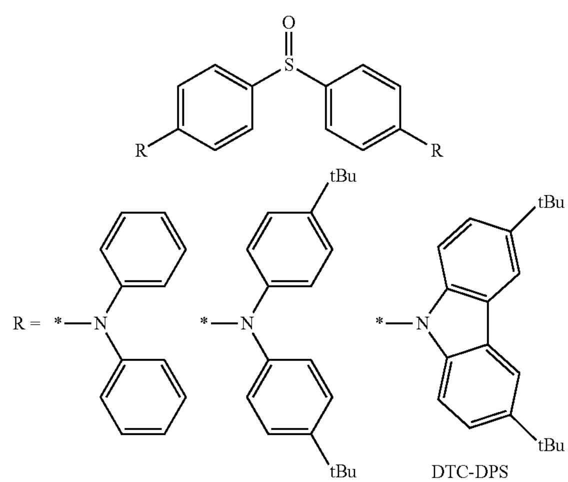

DTC-DPS

-continued
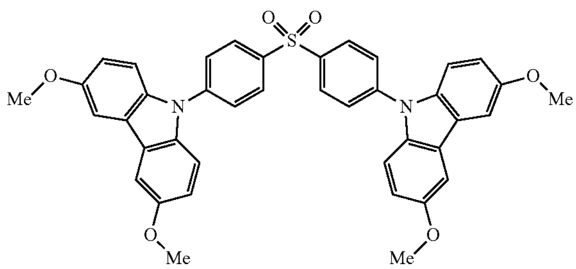
DMOC-DPS
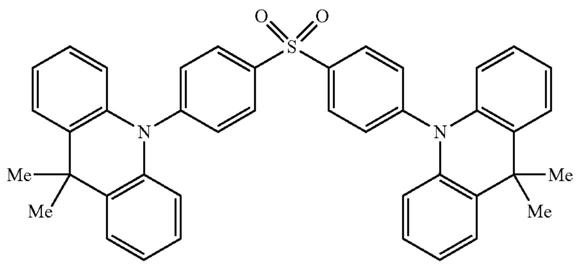
DMAC-DPS
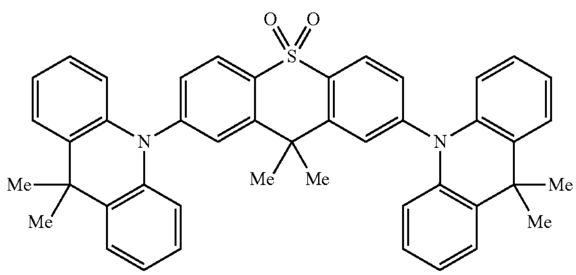
DMTDAc
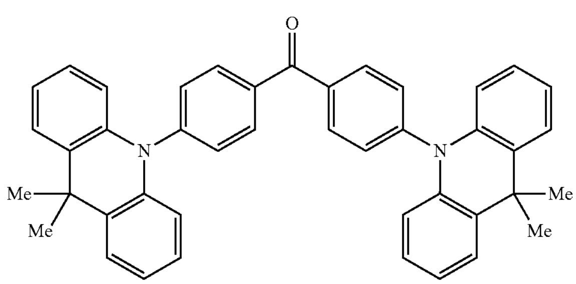
DMAC-BP
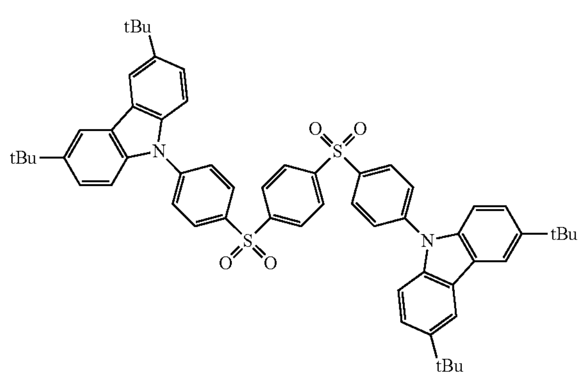
DTC-pBPSB
-continued
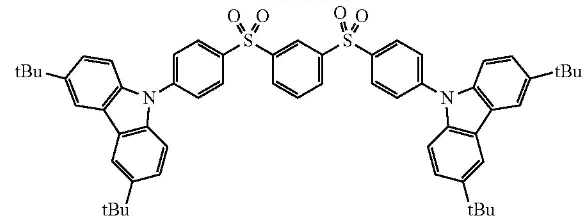
DTC-mBPSB
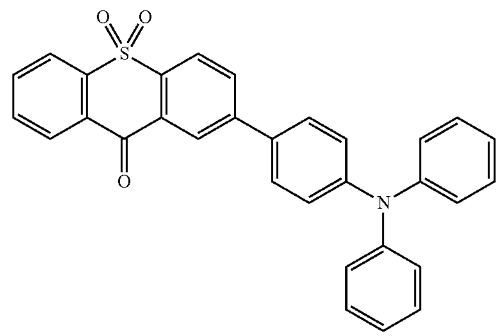
TXO-TPA
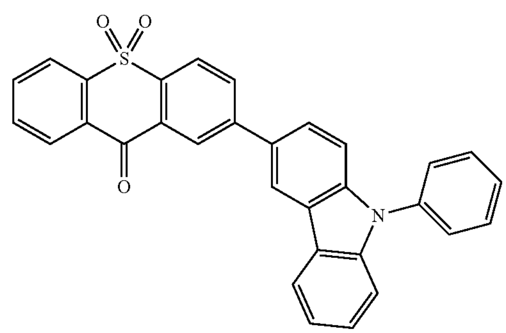
TXO-PhCz
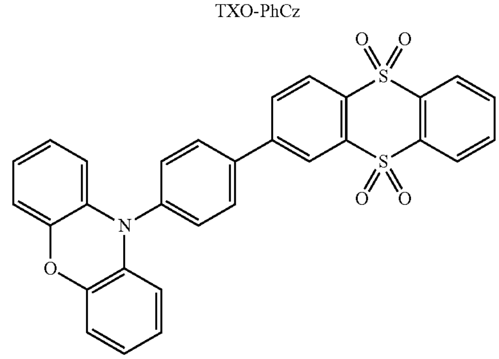
PXZD SO2
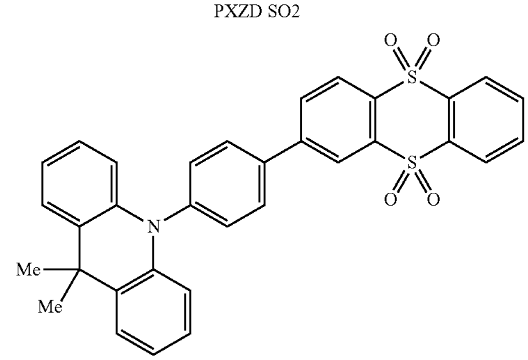
ACRD SO2

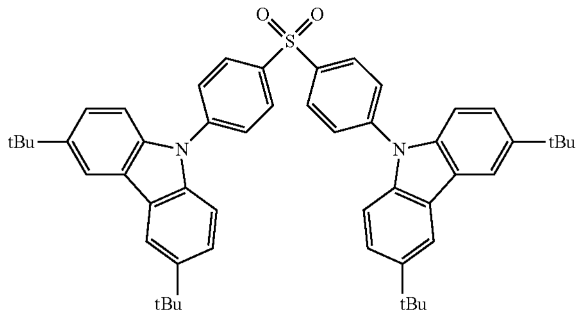
DTC-DBT
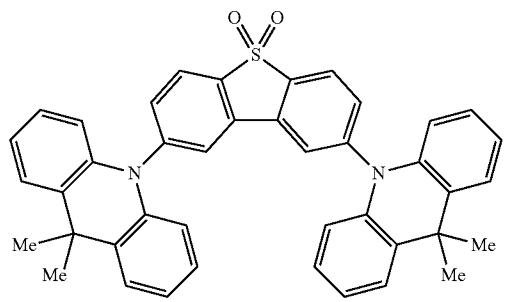
DTAO
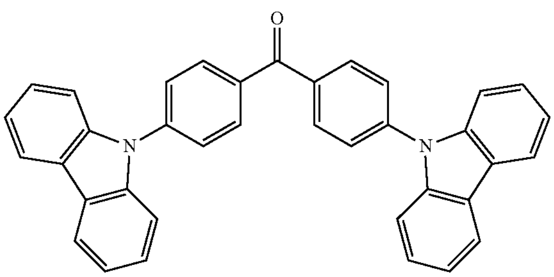
Cz2BP
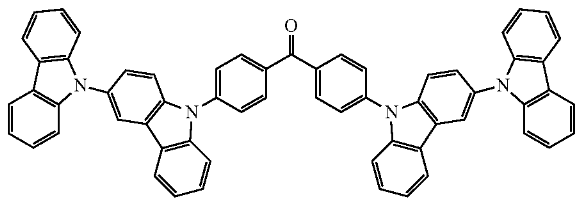
CC2BP
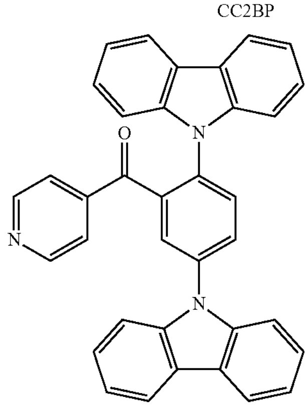
DCBPy
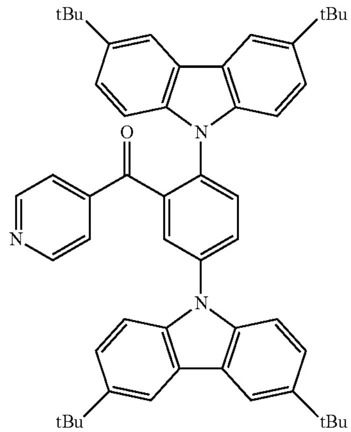
DTCBPy
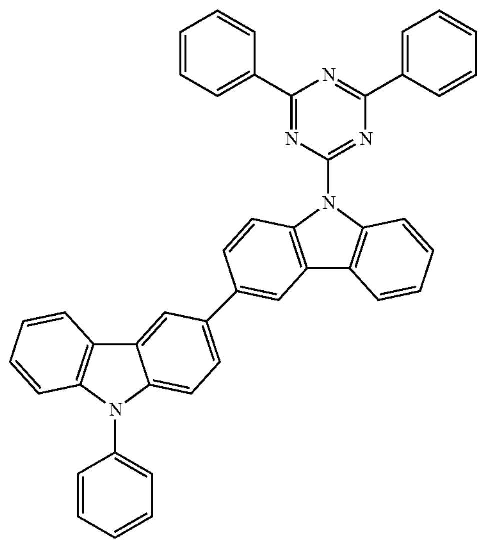
CzT
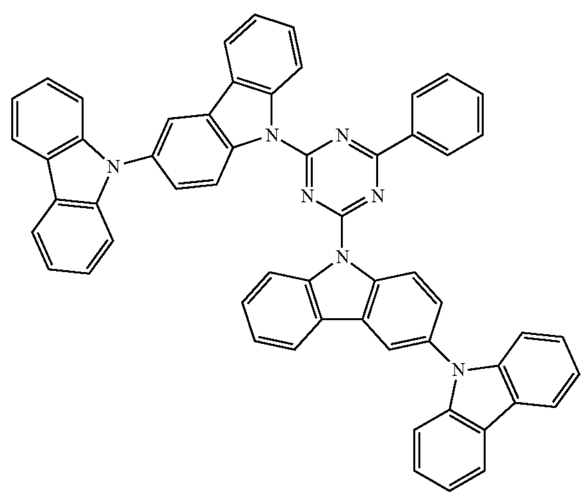
CC2TA -continued
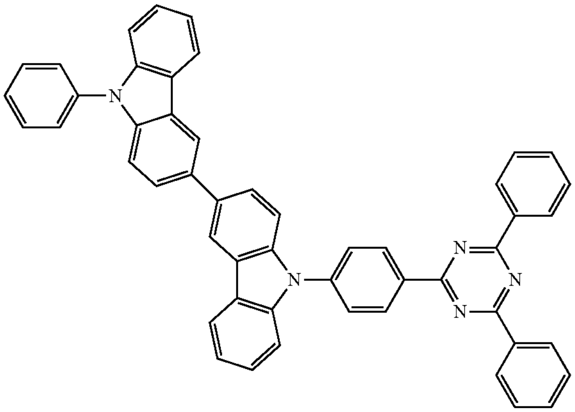
BCzT
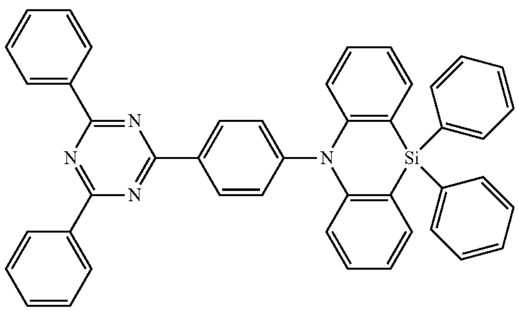
DTPDDA
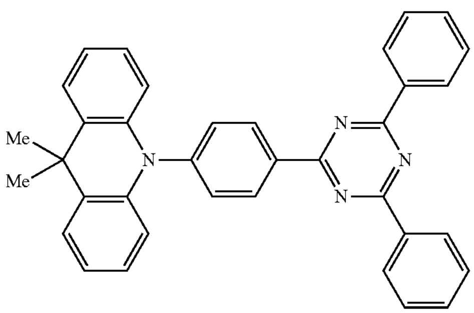
DMAC-TRZ
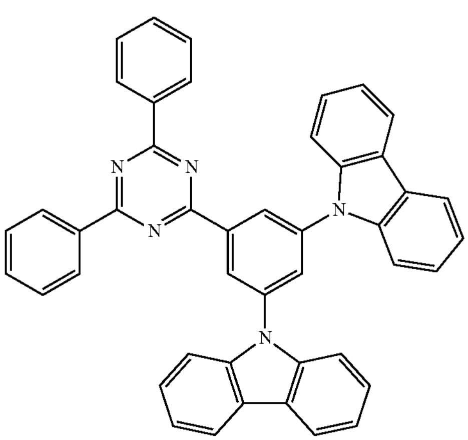
DCzTrz
-continued
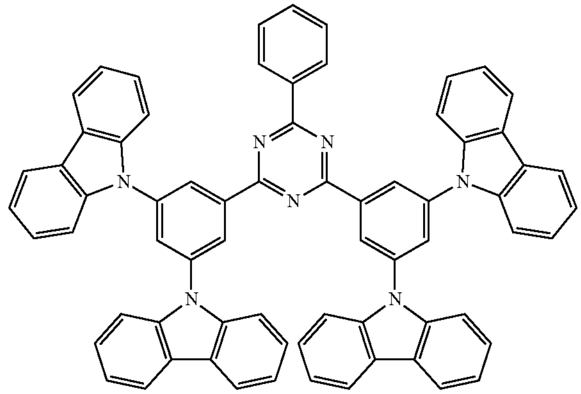
DCzTrz
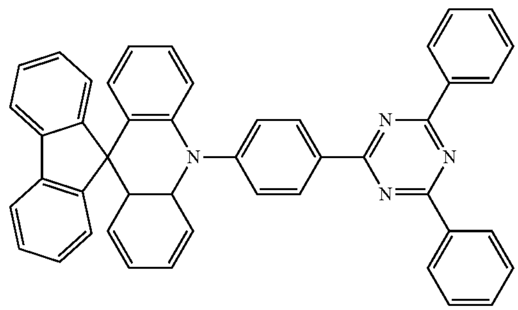
spiroAC-TRZ
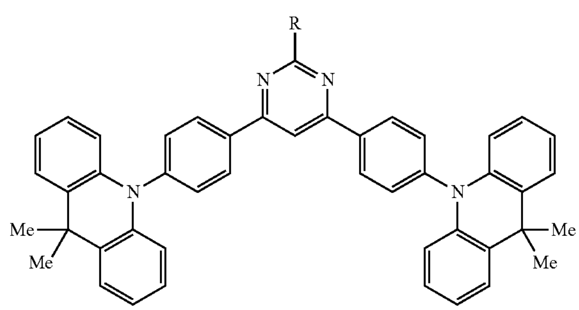
R = H, Ac-HPM
R = Ph, Ac-PPM
R = Me Ac-MPM
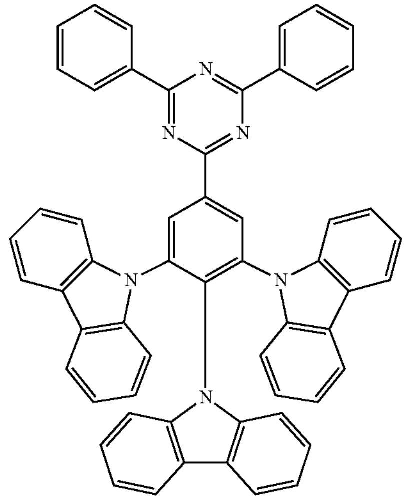
TCzTrz -continued
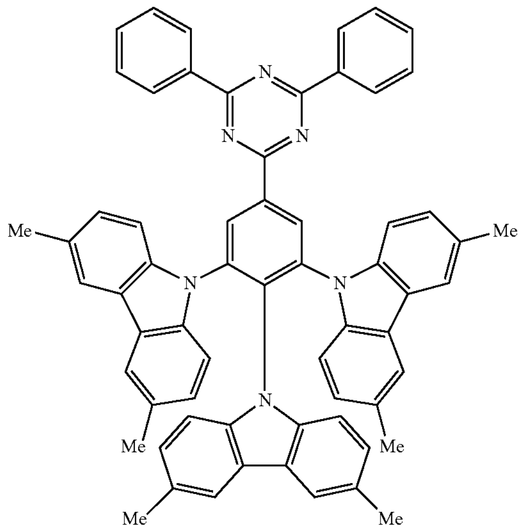
TmCzTrz
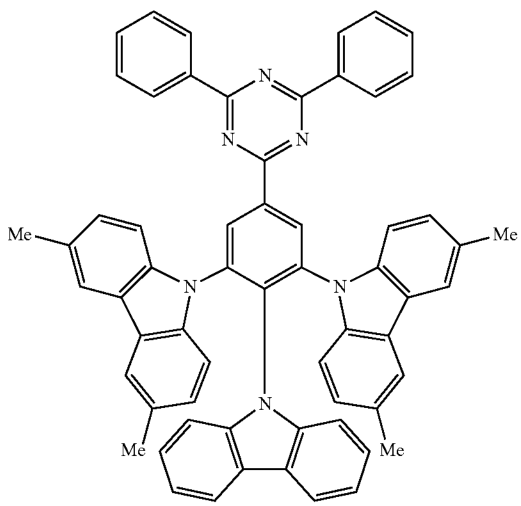
DCzmCzTrz
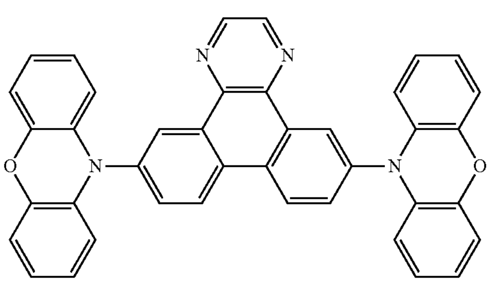
ATP-PXZ
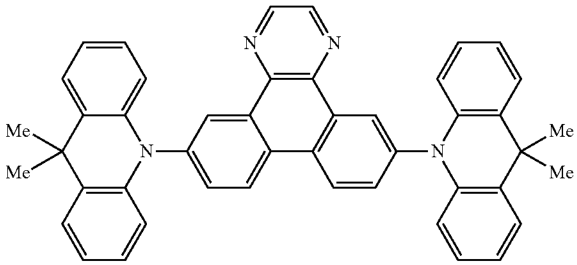
ATP-ACR
-continued
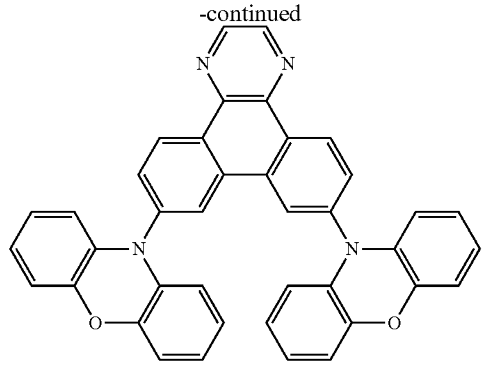
m-ATP-PXZ
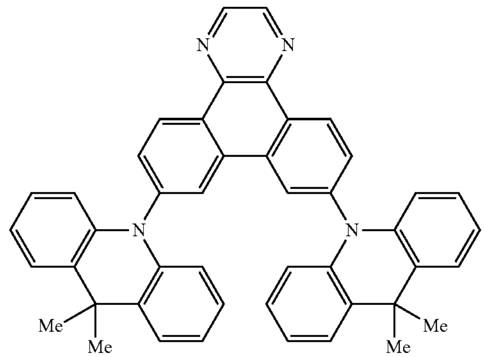
m-ATP-ACR
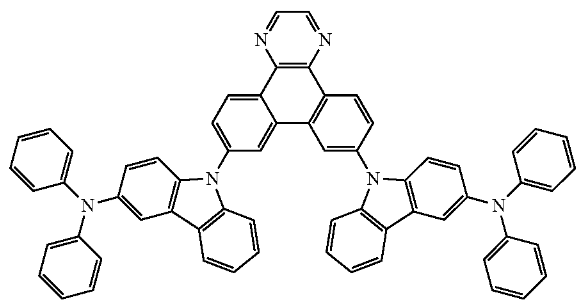
m-ATP-CDP
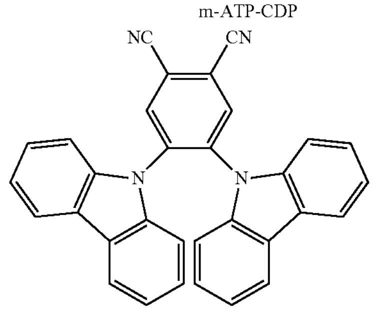
2CzPN
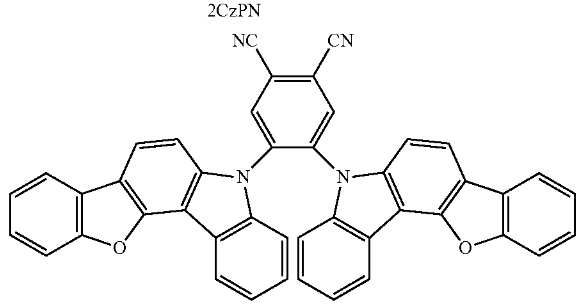
BFCz-2CN -continued
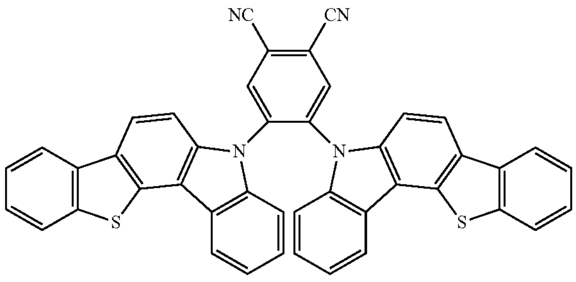
BTCz-2CN
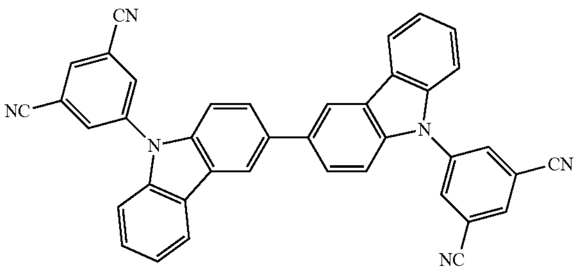
35IPNDCz
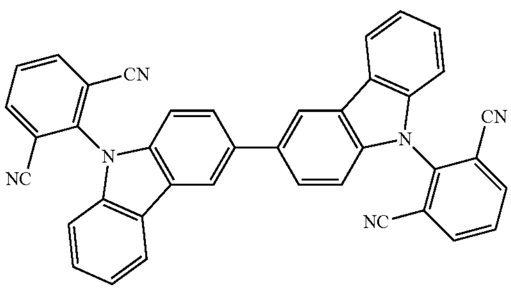
26IPNDCz
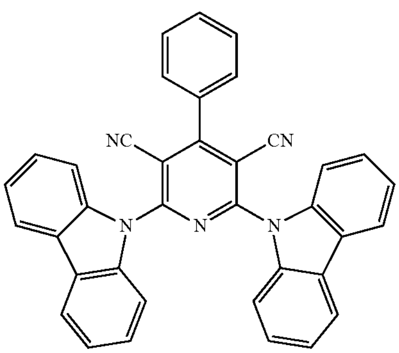
CPC
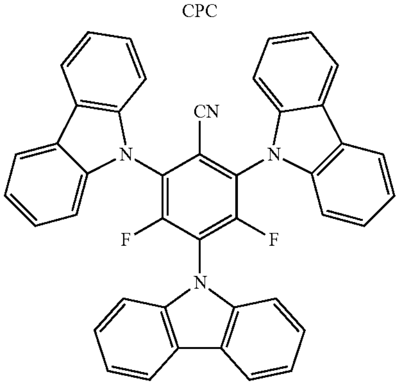
3CzFCN
-continued
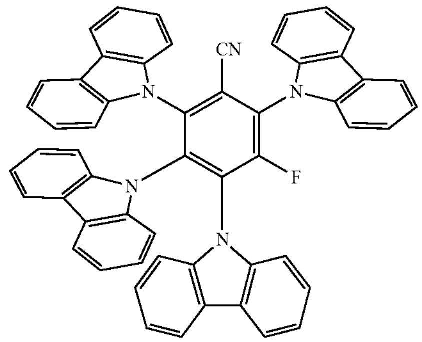
4CzFCN
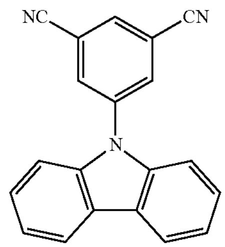
DCN1
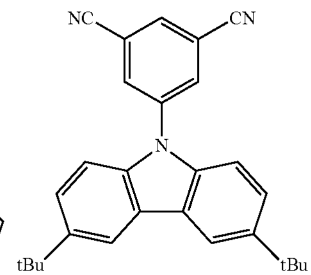
DCN2
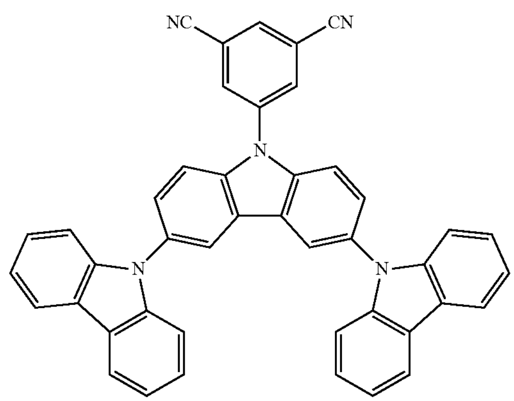
DCN3
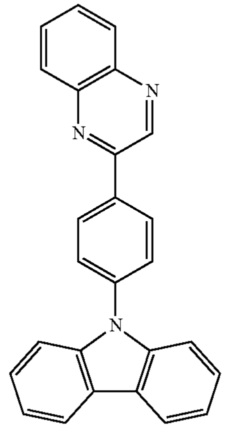
CZQ

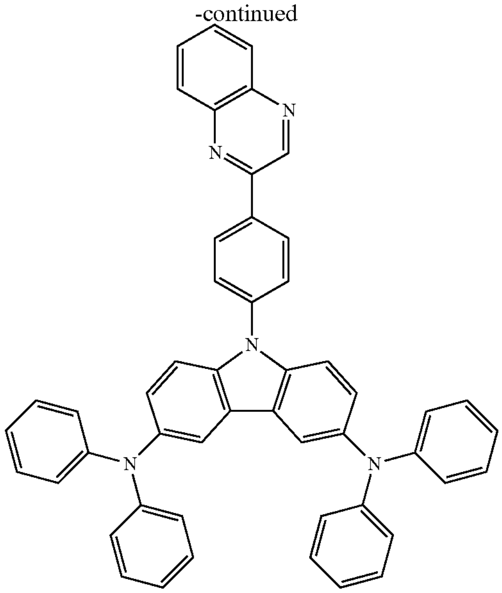
DACQ
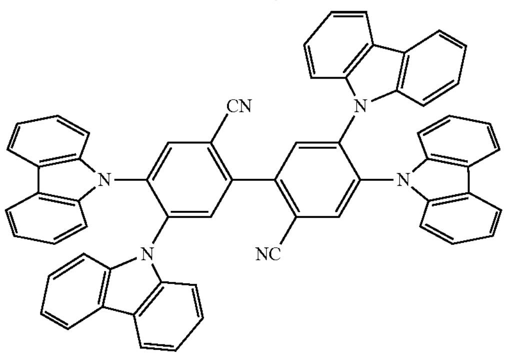
CNBPCz
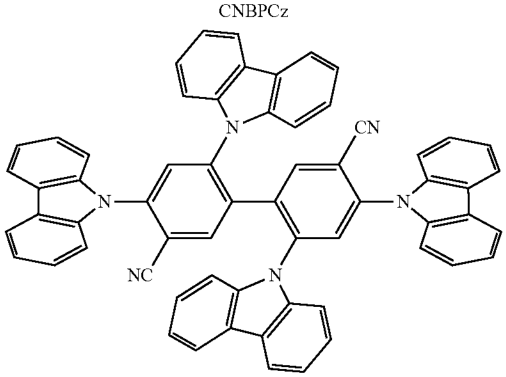
CzBPCN
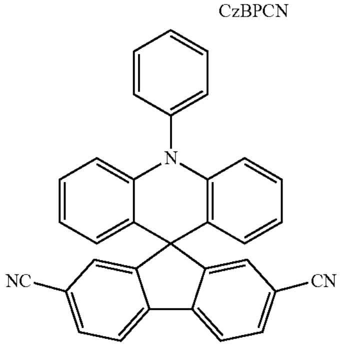
ACRFLCN
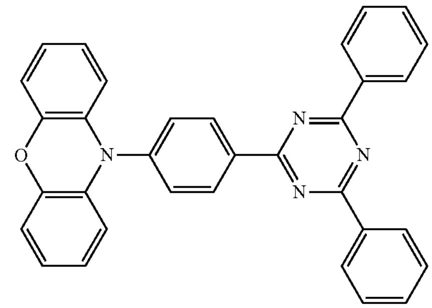
PXZ-TRZ
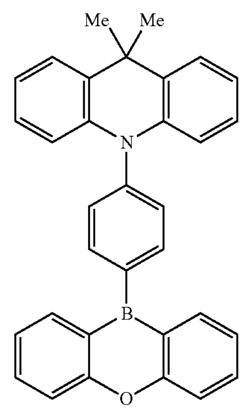
DMAC-PXB
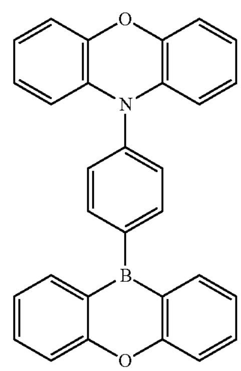
PXZ-PXB
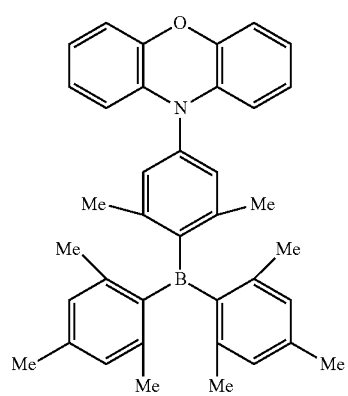
PXZ-$Mes_3B$ -continued
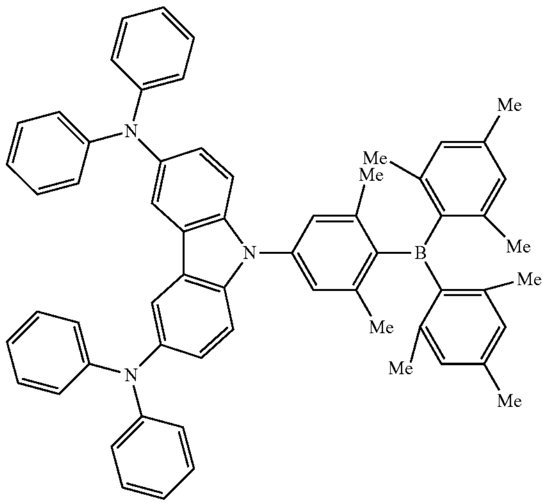
2DAC-Mes$_3$B
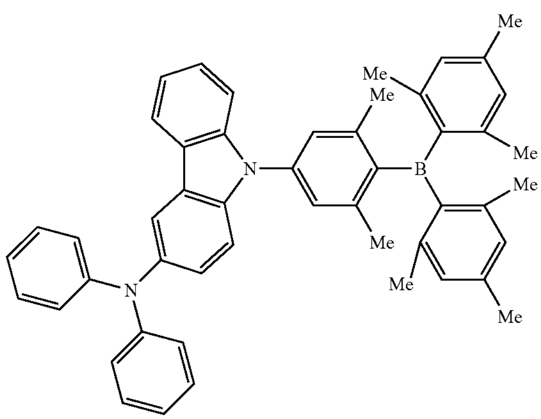
DAC-Mes$_3$B
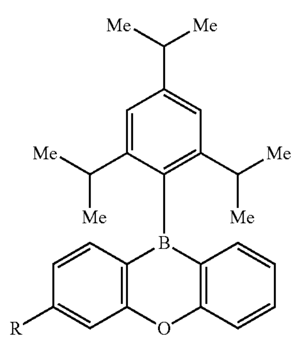
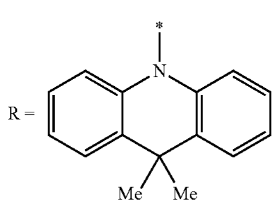
ACRPOB
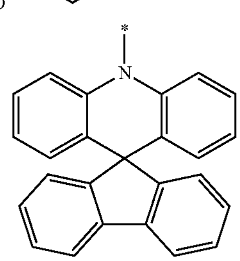
SFDPAPOB
-continued
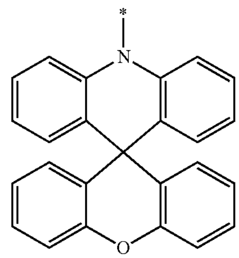
SXDPAPOB
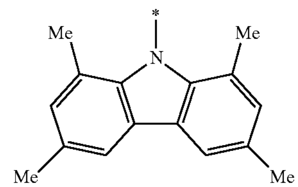
TMCPOB
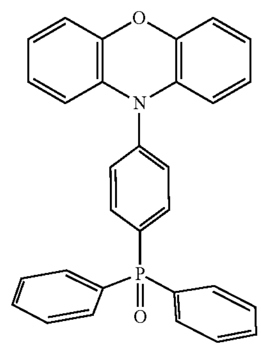
PXZPO
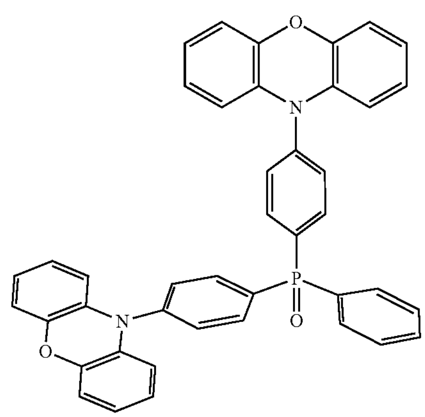
DPXZPO
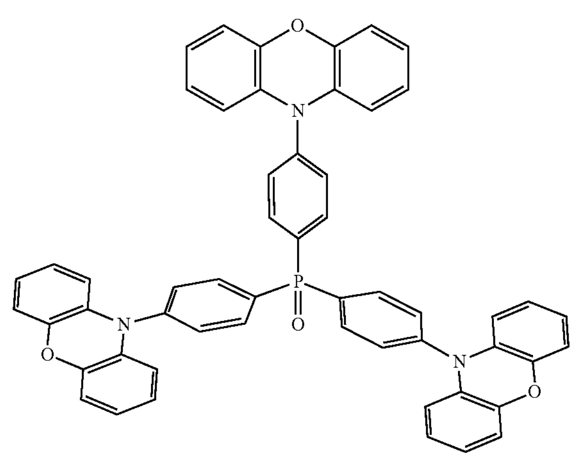
TPXZPO -continued
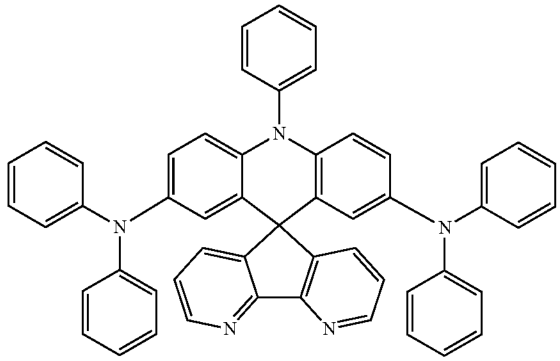
DPAA-AF
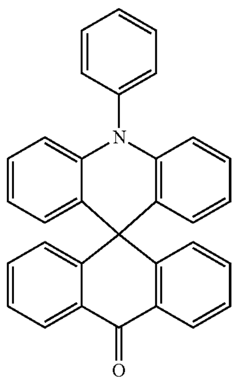
ACRSA
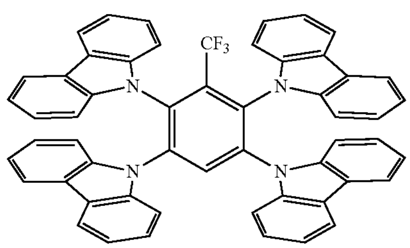
4CzCF$_3$Ph
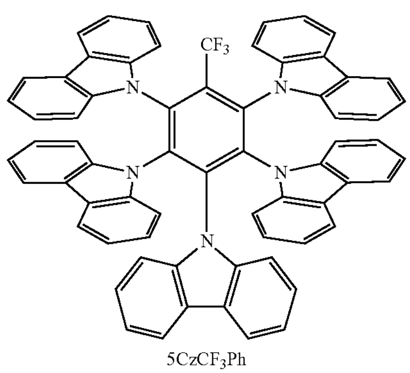
5CzCF$_3$Ph
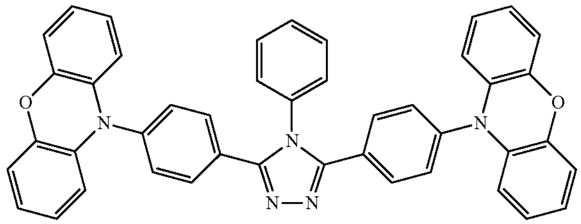
2PXZ-TAZ
-continued
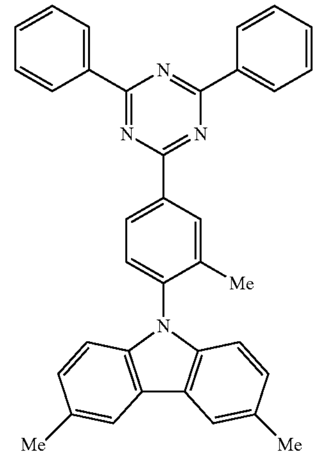
Cz-TRZ3
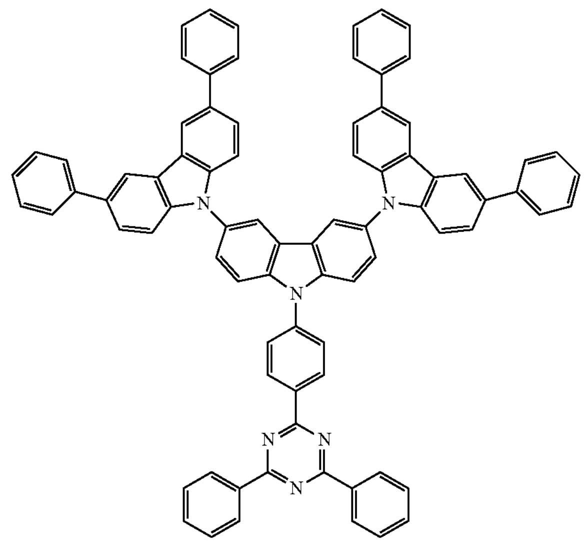
BDPCC-TPTA
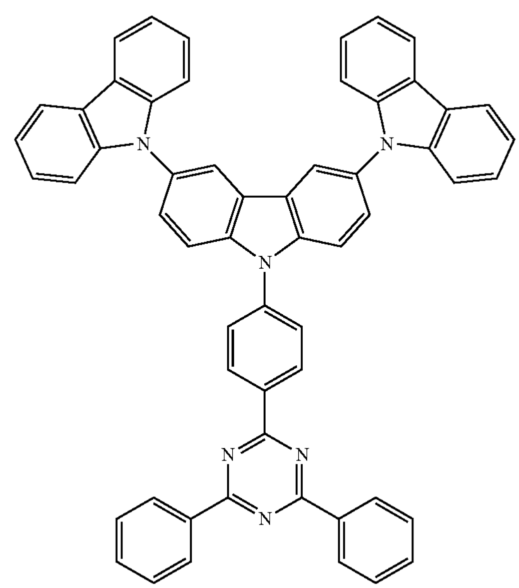
BCC-TPTA -continued
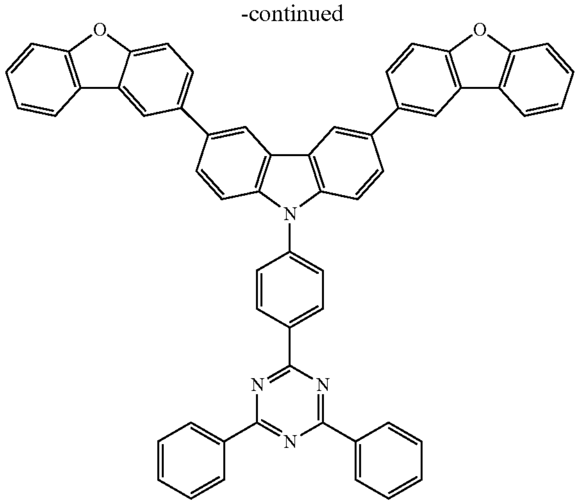
BDBFCz-Trz
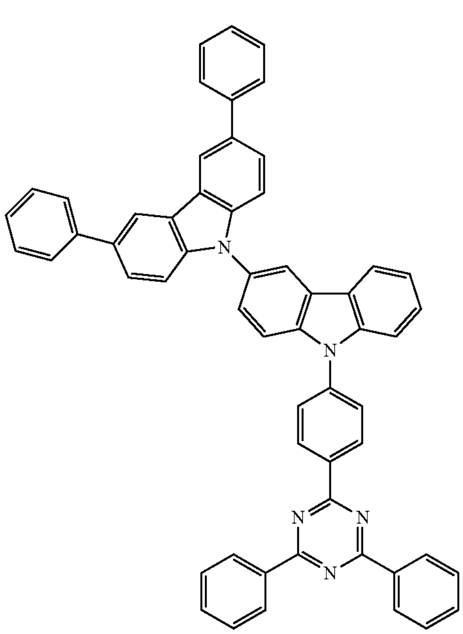
BDPCC-TPTA
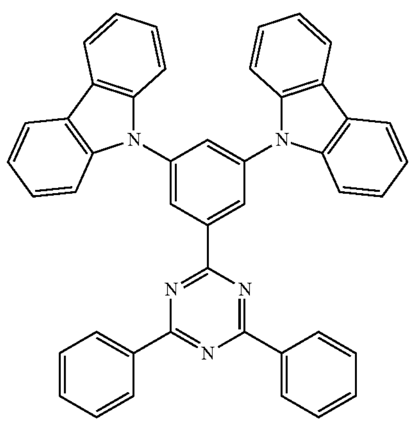
DCzTrz
-continued
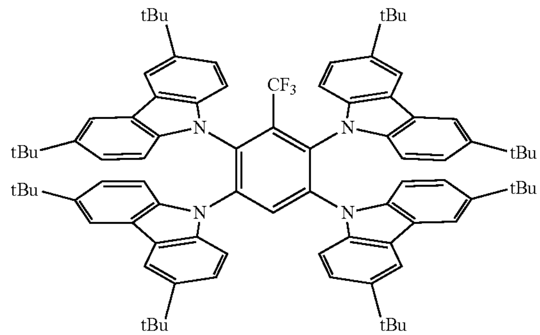
4TCzBN
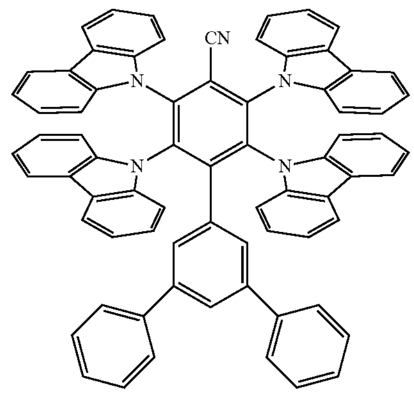
4CzBN-TP
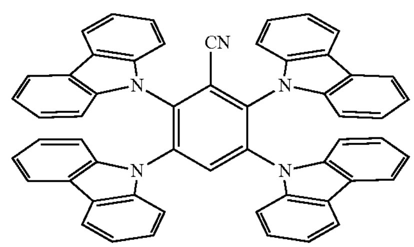
4CzBN
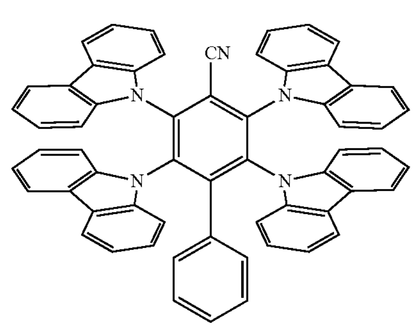
4CzBN-Ph -continued

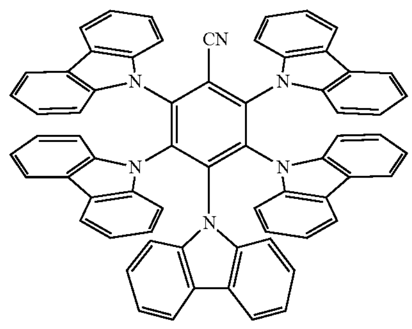

5CzBN

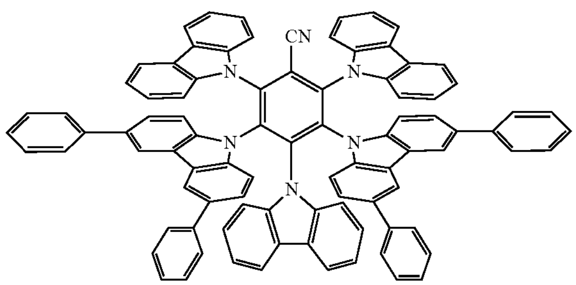

3Cz2DPhCzBN

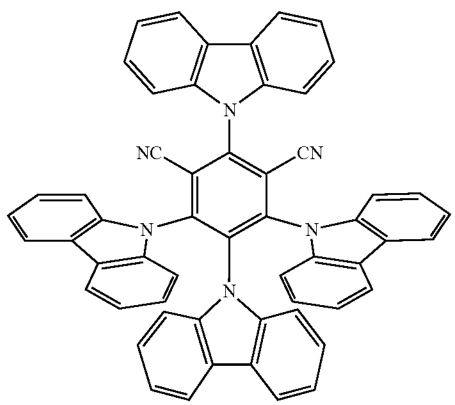

4CzIPN

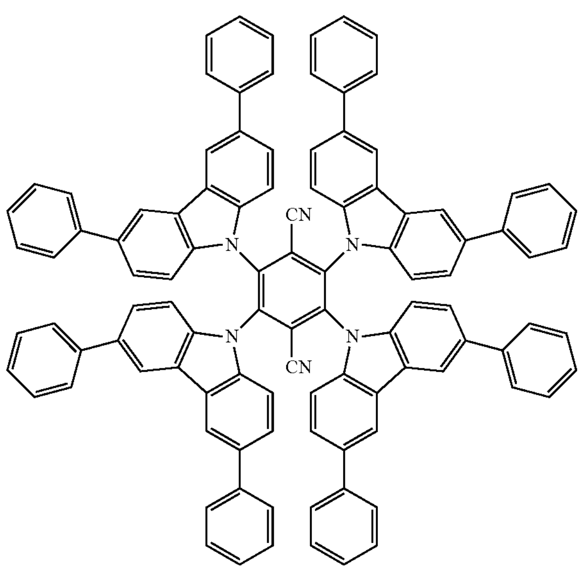

4CzTPN-Ph

-continued

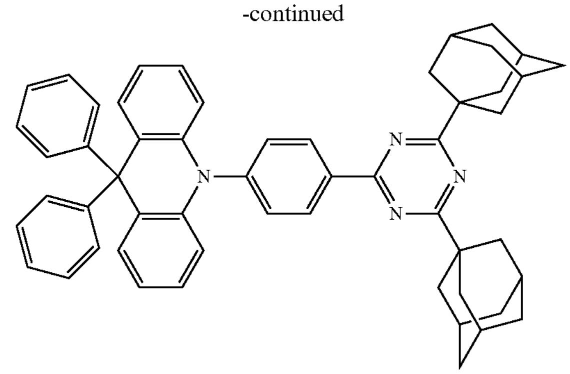

PA-TA

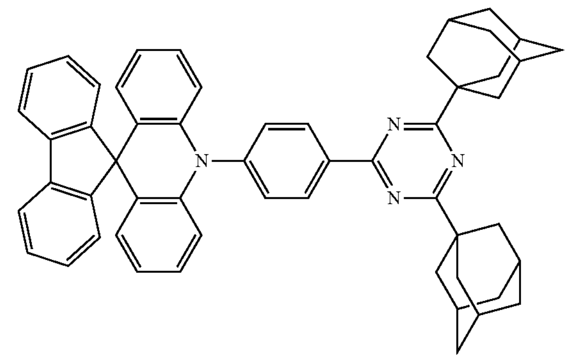

FA-TA

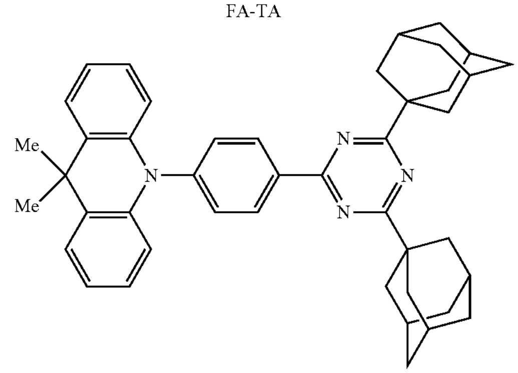

MA-TA

Among the above example compounds as the compounds represented by Formula (H7), PIC-TRZ, TXO-TPA, TXO-PhCz, PXZD SO2, ACRD SO2, DTC-DBT, DTAO, 4CzBN, 4CzBN-Ph, 5CzBN, 3Cz2DPhCzBN, 4CzIPN, 2PXZ-TAZ, Cz-TRZ3, BDPCC-TPTA, MA-TA, PA-TA, FA-TA, PXZ-TRZ, DMAC-TRZ, BCzT, DCzTrz, DDCzTrz, spiroAC-TRZ, Ac-HPM, Ac-PPM, Ac-MPM, TCzTrz, TmCzTrz, and DCzmCzTrz are preferred.

3-1-5-3. Dopant Material

The polycyclic aromatic compound of the present invention is preferably used as a dopant material.

A dopant material that can be used other than the polycyclic aromatic compound of the present invention is not specifically limited and may be any known compound. The dopant material can be selected from various materials depending on the desired emission color. Specific examples of the compound include a condensed ring derivative such as phenanthrene, anthracene, pyrene, tetracene, pentacene, perylene, naphthopyrene, dibenzopyrene, rubrene and chrysene, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative (JP 1-245087 A) and a bisstyrylarylene derivative (JP 2-247278 A) such as a bisstyrylanthracene derivative and a distyrylbenzene derivative, a diazaindacene derivative, a furan derivative, a benzofuran derivative, an isobenzofurane derivative such as phenylisobenzofuran, dimesitylisobenzofuran, di(2-methylphenyl)isobenzofuran, di(2-trifluoromethylphenyl)isobenzofuran and phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative and a 3-benzoxazolylcoumarin derivative, a dicyanomethylenepyran derivative, a dicyanomethylenethiopyran derivative, a polymethine derivative, a cyanine derivative, an oxobenzanthracene derivative, an xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, furopyridine derivative, a 1,2,5-thiadiazolopyrene derivative, a pyrromethene derivative, a perinone derivative, a pyrrolopyrrole derivative, squarylium derivative, a violanthrone derivative, a phenazine derivative, an acridone derivative, a deazaflavin derivative, a fluorene derivative and a benzofluorene derivative.

When the materials are exemplified for each emission color, examples of blue to bluish green dopant materials include an aromatic hydrocarbon compound and a derivative thereof, such as naphthalene, anthracene, phenanthrene, pyrene, triphenylene, perylene, fluorene, indene, or chrysene; an aromatic heterocyclic compound and a derivative thereof, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, a distyrylbenzene derivative, a tetraphenylbutadiene derivative, a stilbene derivative, an aldazine derivative, a coumarin derivative, an azole derivative such as imidazole, thiazole, thiadiazole, carbazole, oxazole, oxadiazole, or triazole and a metal complex thereof, and an aromatic amine derivative represented by N,N'-diphenyl-N,N'-di(3-methylphenyl)-4,4'-diphenyl-1,1'-diamine.

Examples of green to yellow dopant materials include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples thereof include compounds obtained by introducing a substituent capable of making a wavelength longer, such as an aryl, a heteroaryl, an arylvinyl, an amino, or cyano, into the above compounds exemplified as the blue to bluish green dopant material.

Furthermore, examples of orange to red dopant materials include a naphthalimide derivative such as bis(diisopropylphenyl) perylene tetracarboxylic acid imide, a perinone derivative, a rare earth complex containing acetylacetone, benzoylacetone, or phenanthroline as a ligand, such as an Eu complex, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples thereof include compounds obtained by introducing a substituent capable of making a wavelength longer, such as an aryl, a heteroaryl, an arylvinyl, an amino, or cyano, into the above compounds exemplified as blue to bluish green and green to yellow dopant materials.

In addition, dopants can be appropriately selected for use from among compounds described in "Kagaku Kogyo (Chemical Industry)", June 2004, p. 13, and reference documents described therein.

Among the dopant materials described above, particularly, an amine having a stilbene structure, a perylene derivative, a borane derivative, an aromatic amine derivative, a coumarin derivative, a pyran derivative, and a pyrene derivative are preferable.

An amine having a stilbene structure is represented by, for example, the following formula:

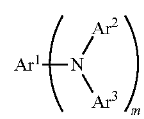

In the formula, $Ar^1$ represents an m-valent group derived from an aryl having 6 to 30 carbon atoms, and Are and $Ar^3$ each independently represent an aryl having 6 to 30 carbon atoms, in which at least one of $Ar^1$ to $Ar^3$ has a stilbene structure, $Ar^1$ to $Ar^3$ may be substituted by an aryl, a heteroaryl, an alkyl, a trisubstituted silyl (silyl trisubstituted by an aryl and/or an alkyl), or cyano, and m represents an integer of 1 to 4.

The amine having a stilbene structure is more preferably a diaminostilbene represented by the following formula.

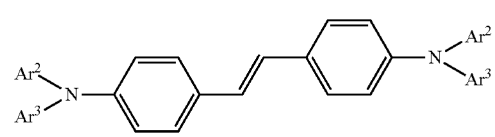

In the formula, $Ar^2$ and $Ar^3$ each independently represent an aryl having 6 to 30 carbon atoms, and $Ar^2$ and $Ar^3$ may be substituted by an aryl, a heteroaryl, an alkyl, a trisubstituted silyl (silyl trisubstituted by an aryl and/or an alkyl), or cyano.

Specific examples of the aryl having 6 to 30 carbon atoms include phenyl, naphthyl, acenaphthylenyl, fluorenyl, phenalenyl, phenanthrenyl, anthryl, fluoranthenyl, triphenylenyl, pyrenyl, chrysenyl, naphthacenyl, perylenyl, stilbenyl, distyrylphenyl, distyrylbiphenylyl, and distyrylfluorenyl.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis

[4''-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Amines having a stilbene structure described in JP 2003-347056A, JP 2001-307884 A, and the like may also be used.

Examples of the perylene derivative include 3,10-bis(2,6-dimethylphenyl)perylene, 3,10-bis(2,4,6-trimethylphenyl)perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075A, JP 2001-217077 A, and the like may also be used.

Examples of the borane derivative include 1,8-diphenyl-10-(dimesitylboryl)anthracene, 9-phenyl-10-(dimesitylboryl)anthracene, 4-(9'-anthryl)dimesitylborylnaphthalene, 4-(10'-phenyl-9'-anthryl)dimesitylborylnaphthalene, 9-(dimesitylboryl)anthracene, 9-(4'-biphenylyl)-10-(dimesitylboryl)anthracene, and 9-(4'-(N-carbazolyl)phenyl)-10-(dimesitylboryl)anthracene.

A borane derivative described in WO 2000/40586 A or the like may also be used.

The aromatic amine derivative is represented by, for example, the following formula:

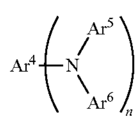

The aromatic amine derivative is represented by, for example, the following formula:

In the formula, $Ar^4$ represents an n-valent group derived from an aryl having 6 to 30 carbon atoms, $Ar^5$ and $Ar^6$ each independently represent an aryl having 6 to 30 carbon atoms, $Ar^4$ to $Ar^6$ may be substituted by an aryl, a heteroaryl, an alkyl, a trisubstituted silyl trisubstituted by an aryl and/or an alkyl), or cyano, and n represents an integer of 1 to 4.

Particularly, an aromatic amine derivative, in which $Ar^4$ is a divalent group derived from anthracene, chrysene, fluorene, benzofluorene, or pyrene, $Ar^5$ and $Ar^6$ each independently represent an aryl having 6 to 30 carbon atoms, $Ar^4$ to $Ar^6$ may be substituted by an aryl, a heteroaryl, an alkyl, a trisubstituted silyl (silyl trisubstituted by an aryl and/or an alkyl), or cyano, and n represents 2, is preferable.

Specific examples of the aryl having 6 to 30 carbon atoms include phenyl, naphthyl, acenaphthylenyl, fluorenyl, phenalenyl, phenanthryl, triphenylenyl, pyrenyl, naphthacenyl, perylenyl, and pentacenyl.

As the aromatic amine derivative, examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra(m-tolyl)chrysene-6,12-diamine, N,N,N',N'-tetrakis(4-isopropylphenyl)chrysene-6,12-diamine, N,N,N',N'-tetra(naphthalen-2-yl)chrysene-6,12-dimine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-di amine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1$,$N^6$-diphenyl-N',$N^6$-bis(4-trimethylsilanyl-phenyl)-1H,8H-pyrene-1,6-diamine.

Examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-di amine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl)anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylaminophenyl)anthracene-9,10-bis(4-di(1-naphthylamino)phenyl) anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl)anthracene.

Other examples include [4-(4-diphenylaminophenyl)naphthalen-1-yl]-diphenylamine, [6-(4-diphenylaminophenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4''-bis[4-diphenylaminonaphthalen-1-yl]-p-terphenyl, and 4,4''-bis[6-diphenylaminonaphthalen-2-yl]-p-terphenyl.

An aromatic amine derivative described in JP 2006-156888 A or the like may also be used.

Examples of the coumarin derivative include coumarin-6 and coumarin-334.

Coumarin derivatives described in JP 2004-43646 A, JP 2001-76876 A, JP 6-298758 A, and the like may also be used.

Examples of the pyran derivative include DCM and DCJTB described below.

DCM

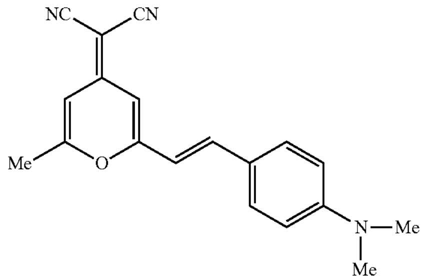

DCJTB

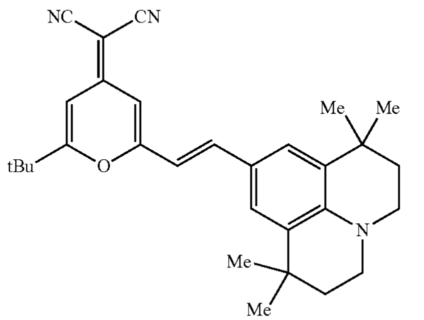

Pyran derivatives described in JP 2005-126399 A, JP 2005-097283 A, JP 2002-234892 A, JP 2001-220577 A, JP 2001-081090A, JP 2001-052869 A, and the like may also be used.

3-1-6. Electron Injection Layer and an Electron Transport Layer in Organic Electroluminescent Element Electron injection layer 107 plays a role of efficiently injecting electrons moved from cathode 108 into light-emitting layer 105 or electron transport layer 106. Electron transport layer 106 plays a role of efficiently transport the electrons injected from cathode 108 or the electrons injected from cathode 108 through electron injection layer 107 to light-emitting layer 105. Electron injection layer 107 and electron transport layer 106 are formed by lamination and mixing one kind or two or more kinds of electron injection/transport materials or formed by a mixture of electron injection/transport materials and polymer binders An electron injection/transport layer means a layer that manages injection of the electrons from the cathode and transportation of the electrons, and desirably has high electron injection efficiency and efficiently transports the electrons injected. Accordingly, a material having large electron affinity, large electron mobility and excellent stability, and hard to generate impurities to be a trap during production and use is preferred. However, in consideration of a transport balance between the holes and the electrons, when the material mainly plays a role of being able to efficiently inhibit the holes from the anode from flowing to a cathode side without recombination, even if the material has a comparatively low electron transport capability, the material has an effect on improving luminescent efficiency as high as a material having high electron transport capability. Accordingly, the electron injection/transport layer in the present embodiment may also include a function of a layer that can efficiently inhibit movement of the holes.

A material (electron transport material) that forms electron transport layer 106 or electron injection layer 107 can be selected and used from a compound which has been commonly used so far as an electron transfer compound in a photoconductive material, and a publicly known compound used for a hole injection layer and a hole transport layer of an organic EL element.

A material used for the electron transport layer or the electron injection layer preferably contains at least one kind selected from a compound formed of an aromatic ring or a complex aromatic ring composed of one or more atoms selected from carbon, hydrogen, oxygen, sulfur, silicon and phosphorus, a pyrrole derivative and a fused ring derivative thereof and a metal complex having electron accepting nitrogen. Specific examples thereof include a fused ring-based aromatic ring derivative such as naphthalene and anthracene, a styryl-based aromatic ring derivative typified by 4,4'-bis(diphenylethenyl)biphenyl, a perinon derivative, a coumarin derivative, a naphthalimide derivative, a quinone derivative such as anthraquinone and diphenoquinone, a phosphine oxide derivative, an aryl nitrile derivative, and an indole derivative. Specific examples of the metal complex having electron accepting nitrogen include a hydroxy azole complex such as a hydroxyphenyl oxazole complex, an azomethine complex, a tropolone metal complex, a flavonol metal complex and a benzoquinoline metal complex. The above materials may be used alone, or in combination of a different material.

Specific examples of other electron transport compounds include a pyridine derivative, a naphthalene derivative, an anthracene derivative, a benzofluorene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (such as 1,3-bis[(4-t-butylphenyl)1,3,4-oxadiazolyl]phenylene), a thiophene derivative, a triazole derivative (such as N-naphthyl-2,5-diphenyl-1,3,4-triazole), a thiadiazole derivative, a metal complex of an oxime derivative, a quinolinol metal complex, a quinoxaline derivative, a polymer of a quinoxaline derivative, a benzazole compound, a gallium complex, a pyrazol derivative, a perfluorophenylene derivative, a triazine derivative, a pyrazine derivative, a benzoquinoline derivative (such as 2,2'-bis(benzo[h]quinolin-2-yl)-9,9'-spirobifluorene), an imidazopyridine derivative, a borane derivative, a benzimidazole derivative (such as tris(N-phenylbenzimidazole-2-yl)benzene), a benzooxazol derivative, a benzothiazole derivative, a quinoline derivative, an oligo pyridine derivative such as terpyridine, a bipyridine derivative, a terpyridine derivative (such as 1,3-bis(4'-(2,2':6',2"-terpyridinyl))benzene), a naphthyridine derivative (such as bis(1-naphthyl)-4-(1,8-naphthyridine-2-yl)phenyl phosphine oxide), an aldazine derivative, an aryl nitrile derivative, an indole derivative, a phosphorus oxide derivative, and a bisstyryl derivative.

Moreover, a metal complex having electron accepting nitrogen can also be used, and specific examples thereof include a quinolinol-based metal complex, a hydroxyazole complex such as a hydroxyphenyloxazole complex, an azomethine complex, a tropolone metal complex, a flavonol metal complex and a benzoquinoline metal complex.

The above materials may be used alone, or in combination of a different material.

Among the above-mentioned materials, a borane derivative, a pyridine derivative, a fluoranthene derivative, a BO-based derivative, an anthracene derivative, a benzofluorene derivative, a phosphine oxide derivative, a pyrimidine derivative, an aryl nitrile derivative, a triazine derivative, a benzimidazole derivative, a phenanthroline derivative, and a quinolinol metal complex are preferred.

<Borane Derivative>

The borane derivative is a compound represented by formula (ETM-1), for example, and is disclosed in detail in JP 2007-27587 A.

(ETM-1)

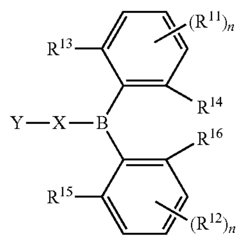

In Formula (ETM-1), $R^1$ and $R^{12}$ are independently at least one of hydrogen, an alkyl, a cycloalkyl, an aryl which may be substituted, a silyl which is subjected to substitution, a nitrogen-containing heterocyclic ring which may be substituted, or cyano, and $R^{13}$ to $R^{16}$ are independently an alkyl which may be substituted, a cycloalkyl which may be substituted or an aryl which may be substituted, and X is an arylene which may be substituted, and Y is an aryl having 16 or less carbons which may be substituted, a boryl which is subjected to substitution, or a carbazolyl which may be substituted, and n is independently an integer from 0 to 3. Moreover, specific examples of the substituent in the case of "which may be substituted" or "which is subjected to substitution" include an aryl, a heteroaryl, an alkyl or a cycloalkyl.

Among the compounds represented by Formula (ETM-1), a compound represented by (ETM-1-1) and a compound represented by Formula (ETM-1-2) are preferred.

(ETM-1-1)

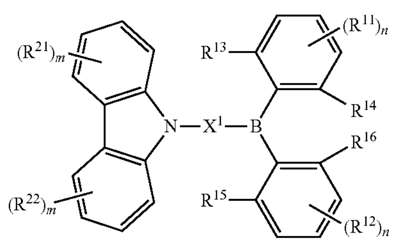

In Formula (ETM-1-1), $R^{11}$ and $R^{12}$ are independently at least one of hydrogen, an alkyl, a cycloalkyl, an aryl which may be substituted, a silyl which is subjected to substitution, a nitrogen-containing heterocyclic ring which may be substituted or cyano, and $R^{13}$ to $R^{16}$ are independently an alkyl which may be substituted, a cycloalkyl which may be substituted or an aryl which may be substituted, and $R^{21}$ and $R^{22}$ are independently at least one of hydrogen, an alkyl, a cycloalkyl, an aryl which may be substituted, a silyl which is subjected to substitution, a nitrogen-containing heterocyclic ring which may be substituted or cyano, and $X^1$ is an arylene having 20 or less carbons which may be substituted, and n is independently an integer from 0 to 3, and m is independently an integer from 0 to 4. Moreover, specific examples of the substituent in the case of "which may be substituted" or "which is subjected to substitution" include an aryl, a heteroaryl, an alkyl or a cycloalkyl.

(ETM-1-2)

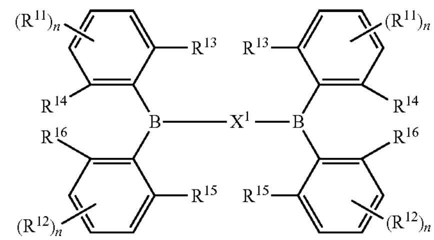

In Formula (ETM-1-2), $R^{11}$ and $R^{12}$ are independently at least one of hydrogen, an alkyl, a cycloalkyl, an aryl which may be substituted, a silyl which is subjected to substitution, a nitrogen-containing heterocyclic ring which may be substituted or cyano, and $R^3$ to $R^{16}$ are independently an alkyl which may be substituted, a cycloalkyl which may be substituted or an aryl which may be substituted, and $X^1$ is an arylene having 20 or less carbons which may be substituted, and n is independently an integer from 0 to 3. Moreover, specific examples of the substituent in the case of "which may be substituted" or "which is subjected to substitution" include an aryl, a heteroaryl, an alkyl or a cycloalkyl.

Specific examples of $X^1$ include divalent groups represented by any of Formulas (X-1) to (X-9).

(X-1)

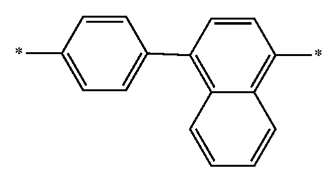

(X-2)

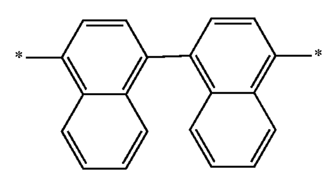

(X-3)

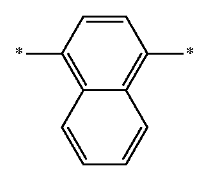

(X-4)

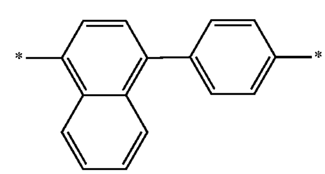

(X-5)

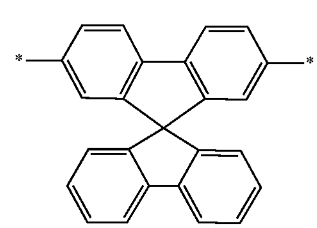

-continued (X-6)

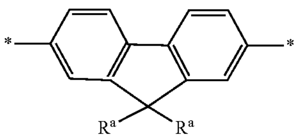

(X-7)

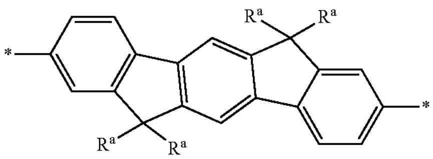

(X-8)

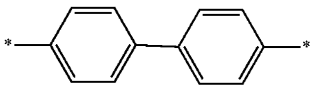

(X-9)

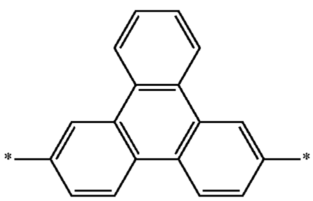

(In each formula, $R^a$ is independently an alkyl, a cycloalkyl or a phenyl which may be substituted, and a position "*" represents a bonding position.)

Specific examples of the borane derivative include compounds described below.

ET-1

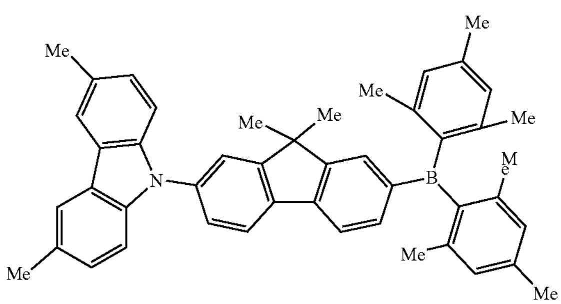

The borane derivative can be produced by using a publicly known raw material and a publicly-known synthesis method.

<Pyridine Derivative>

The pyridine derivative is a compound represented by Formula (ETM-2), for example, and is preferably a compound represented by Formula (ETM-2-1) or Formula (ETM-2-2).

(ETM-2)

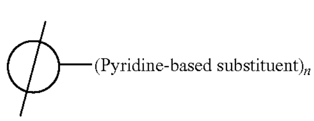

-continued (ETM-2-1)

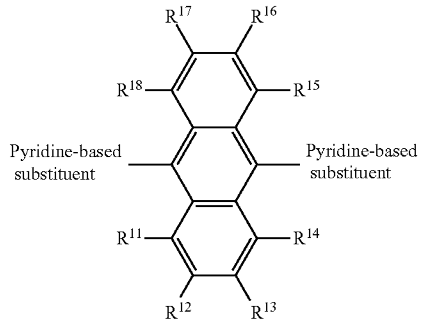

(ETM2-2)

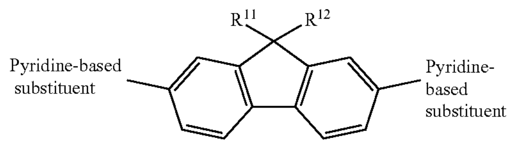

φ is an n-valent aryl ring (preferably, an n-valent benzene ring, naphthalene ring, anthracene ring, fluorene ring, benzofluorene ring, phenalene ring, phenanthrene ring or triphenylene ring), and n is an integer from 1 to 4.

In Formula (ETM-2-1), $R^{11}$ to $R^{18}$ are independently hydrogen, an alkyl (preferably an alkyl having 1 to 24 carbons), a cycloalkyl (preferably a cycloalkyl having 3 to 12 carbons) or an aryl (preferably an aryl having 6 to 30 carbons).

In Formula (ETM-2-2), $R^{11}$ and $R^{12}$ are independently hydrogen, an alkyl (preferably an alkyl having 1 to 24 carbons), a cycloalkyl (preferably cycloalkyl having 3 to 12 carbons), or an aryl (preferably aryl having 6 to 30 carbons), and $R^{11}$ and $R^{12}$ may be bonded to each other to form a ring.

In each formula, the "pyridine-based substituents" is represented by any of Formulas (Py-1) to (Py-15), and the pyridine-based substituent may be independently subjected substitution for alkyl having 1 to 4 carbons or cycloalkyl having 5 to 10 carbons. Specific examples include methyl, ethyl, n-propyl, isopropyl, n-butyl, isobutyl, s-butyl, t-butyl and the like, with methyl being preferred. Moreover, the pyridine-based substituent may be bonded to φ, an anthracene ring or a fluorene ring in each formula through a phenylene or a naphthylene.

(Py-1)

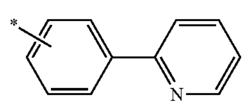

(Py-2)

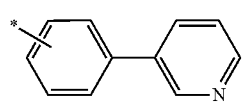

(Py-3)

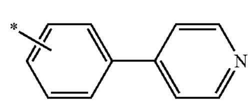

(Py-4)

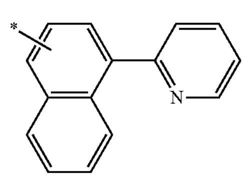

-continued
(Py-5)
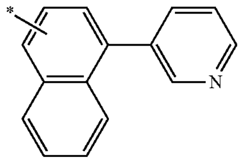
(Py-6)
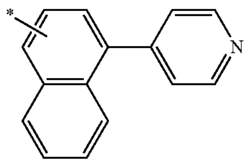
(Py-7)
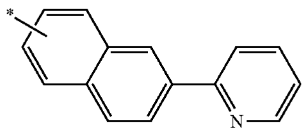
(Py-8)
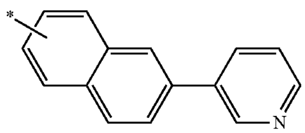
(Py-9)
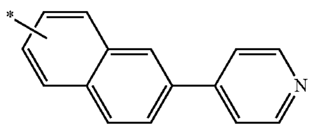
(Py-10)
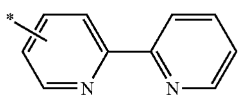
(Py-11)
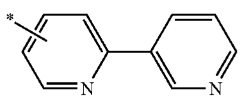
(Py-12)
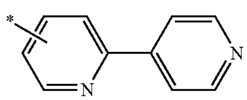
(Py-13)
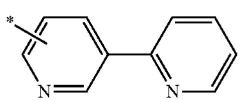
(Py-14)
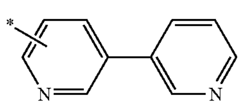
(Py-15)
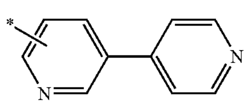
The pyridine-based substituents is represented by any of Formulas (Py-1) to (Py-15), and is preferably represented by any of Formulas (Py-21) to (Py-44) among the formulas (a position "*" in the formula represents a bonding position).
(Py-21)
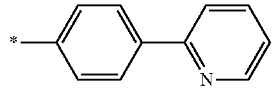
(Py-22)
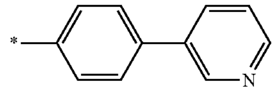
(Py-23)
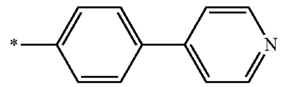
(Py-24)
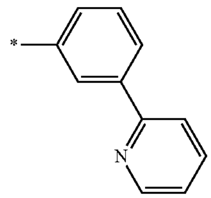
(Py-25)
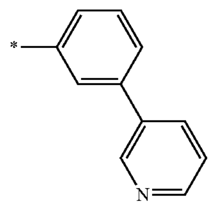
(Py-26)
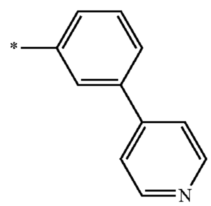
(Py-27)
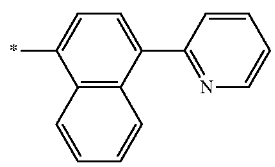
(Py-28)
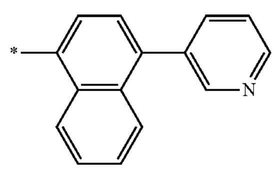
(Py-29)
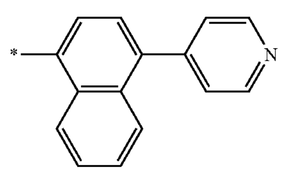
(Py-30)
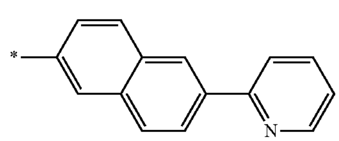

-continued (Py-31)

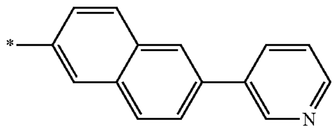

(Py-32)

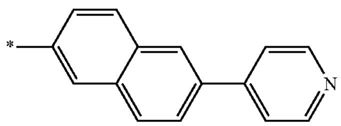

(Py-33)

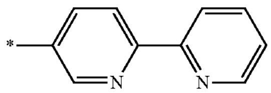

(Py-34)

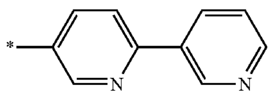

(Py-35)

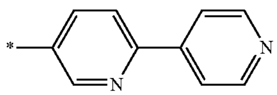

(Py-36)

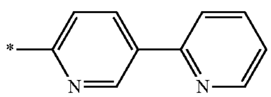

(Py-37)

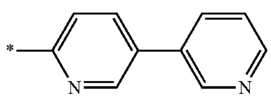

(Py-38)

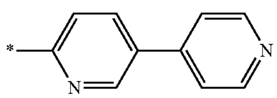

(Py-39)

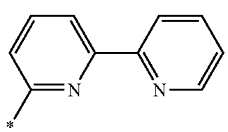

(Py-40)

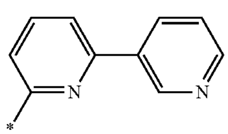

(Py-41)

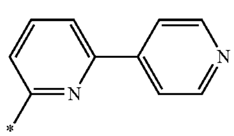

(Py-42)

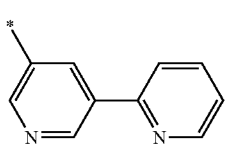

(Py-43)

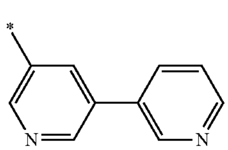

-continued (Py-44)

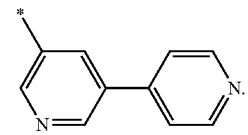

At least one hydrogen in each pyridine derivative may be replaced with deuterium, and one of two "pyridine-based substituents" in Formula (ETM-2-1) and Formula (ETM-2-2) may be subjected to substitution for aryl.

The "alkyl" in $R^{11}$ to $R^{18}$ may be any of a straight-chain alkyl and a branched-chain alkyl, and specific examples thereof include a straight-chain alkyl having 1 to 24 carbons or a branched-chain alkyl having 3 to 24 carbons. Preferred "alkyl" is alkyl having 1 to 18 carbons (branched-chain alkyl having 3 to 18 carbons). Further preferred "alkyl" is alkyl having 1 to 12 carbons (branched-chain alkyl having 3 to 12 carbons). Still further preferred "alkyl" is alkyl having 1 to 6 carbons (branched-chain alkyl having 3 to 6 carbons). Particularly preferred "alkyl" is alkyl having 1 to 4 carbons (branched-chain alkyl having 3 to 4 carbons).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

As the alkyl having 1 to 4 carbons by which a pyridine-based substituent is replaced, the above-mentioned description for the alkyl can be quoted.

Specific examples of the "cycloalkyl" in $R^1$ to $R^{18}$ include a cycloalkyl having 3 to 12 carbons. Preferred "cycloalkyl" is a cycloalkyl having 3 to 10 carbons. Further preferred "cycloalkyl" is a cycloalkyl having 3 to 8 carbons. Still further preferred "cycloalkyl" is a cycloalkyl having 3 to 6 carbons. Specific examples of the "cycloalkyl" include cyclopropyl, cyclobutyl, cyclopentyl, cyclohexyl, methyl cyclopentyl, cycloheptyl, methylcyclohexyl, cyclooctyl or dimethylcyclohexyl.

The "aryl" in $R^{11}$ to $R^{18}$ is preferably an aryl having 6 to 30 carbons, further preferably an aryl having 6 to 18 carbons, still further preferably an aryl having 6 to 14 carbons, and particularly preferably an aryl having 6 to 12 carbons.

Specific examples of the "aryl having 6 to 30 carbons" include phenyl as monocyclic aryl, (1-,2-)naphthyl as fused bicyclic aryl, acenaphthylene(1-,3-,4-,5-)yl, fluorene-(1-, 2-, 3-, 4-, 9-)yl, phenalene(1-,2-)yl, and (1-,2-,3-,4-,9-)phenanthryl as fused tricyclic aryl, triphenylene(1-,2-)yl, pyrene(1-,2-,4-)yl, and naphthacene(1-,2-,5-)yl as fused tetracyclic aryl, perylene(1-,2-,3-)yl and pentacene(1-,2-,5-,6-)yl as fused pentacyclic aryl.

Preferred examples of the "aryl having 6 to 30 carbons" include phenyl, naphthyl, phenanthryl, chrysenyl or triphenylenyl, and further preferred examples thereof include phenyl, I-naphthyl, 2-naphthyl or phenanthryl, and particularly preferred examples thereof include phenyl, I-naphthyl or 2-naphthyl.

$R^{11}$ and $R^{12}$ in Formula (ETM-2-2) may be bonded to each other to form a ring, and as a result, cyclobutane, cyclopentane, cyclopentene, cyclopentadiene, cyclohexane, fluorene, indene, or the like may be spiro-bonded to a 5-membered ring of a fluorene skeleton.

Specific examples of the pyridine derivative include compounds described below.

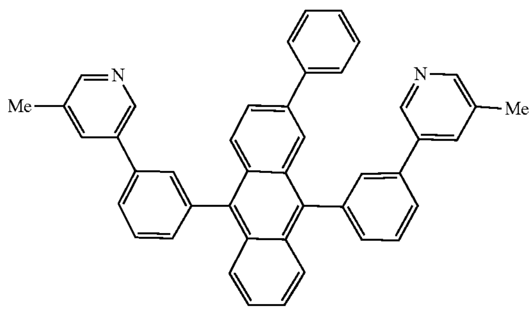

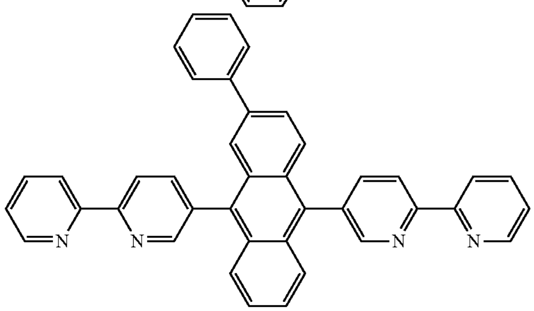

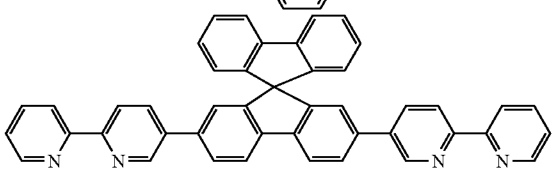

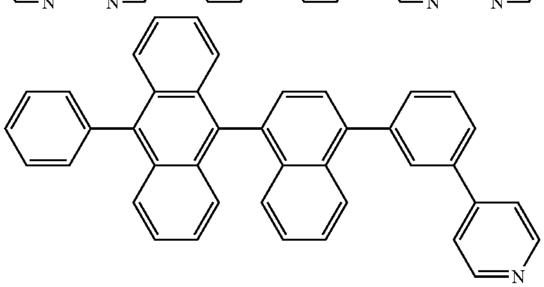

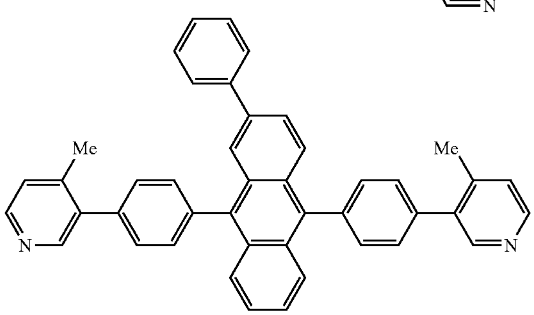

The pyridine derivative can be produced by using a publicly known raw material and a publicly-known synthesis method.

<Fluoranthene Derivative>

The fluoranthene derivative is a compound represented by Formula (ETM-3), for example, and is disclosed in detail in WO 2010/134352 A.

(ETM-3)

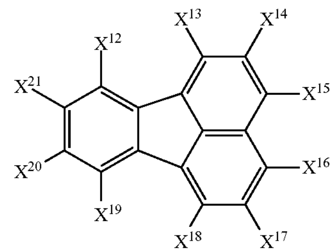

In Formula (ETM-3), $X^{12}$ to $X^{21}$ represent hydrogen, a halogen, a straight-chain, a branched-chain or cyclic alkyl, a straight-chain, branched-chain or cyclic alkoxy, a substituted or unsubstituted aryl or a substituted or unsubstituted heteroaryl. Here, specific examples of a substituent in the case of being subjected to substitution include an aryl, a heteroaryl, an alkyl, or a cycloalkyl.

Specific examples of the fluoranthene derivative include compounds described below.

(ETM-3-1)

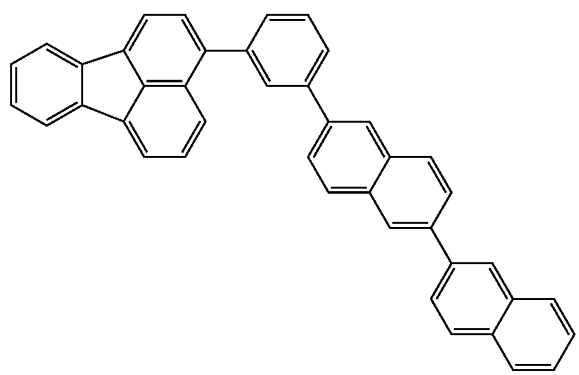

(ETM-3-2)

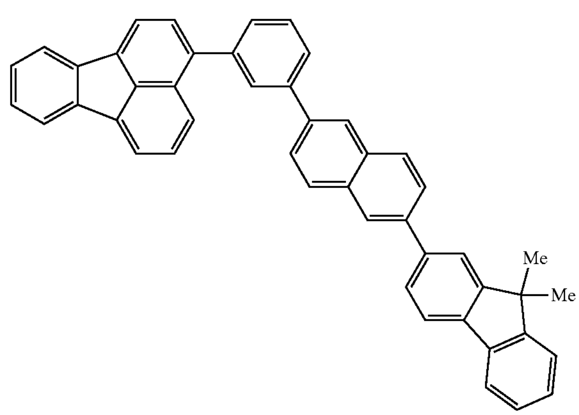

-continued (ETM-3-3)

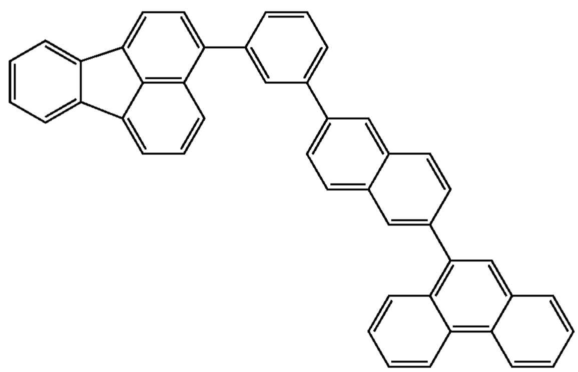

<BO-Based Derivative>

The BO-based derivative is a polycyclic aromatic compound represented by Formula (ETM-4) or a multimer of a polycyclic aromatic compound having a plurality of structures represented by Formula (ETM-4), for example.

(ETM-4)

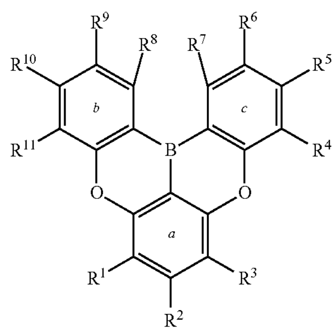

$R^1$ to $R^{11}$ are independently hydrogen, an aryl, a heteroaryl, a diarylamino, a diheteroarylamino, an arylheteroarylamino, an alkyl, a cycloalkyl, an alkoxy or an aryloxy, and at least one hydrogen in the groups may be replaced with an aryl, a heteroaryl, ah alkyl or a cycloalkyl.

Moreover, adjacent groups of $R^1$ to $R^{11}$ may be bonded to form an aryl ring or a heteroaryl ring together with an a ring, a b ring or a c ring, and at least one hydrogen in the ring formed may be replaced with an aryl, a heteroaryl, a diarylamino, a diheteroarylamino, an arylheteroarylamino, an alkyl, a cycloalkyl, an alkoxy or an aryloxy, and at least one hydrogen in the groups may be replaced with an aryl, a heteroaryl, an alkyl or a cycloalkyl.

Moreover, at least one hydrogen in the compound or the structure represented by Formula (ETM-4) may be replaced with a halogen or deuterium.

For description of a substituent or a form of ring formation in Formula (ETM-4), the above-mentioned description for the polycyclic aromatic compound represented by Formula (1A) or (1B) can be quoted.

Specific examples of the BO-based derivative include compounds described below.

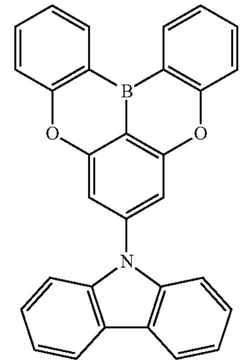

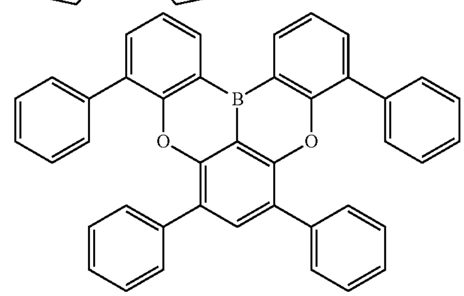

The BO-based derivative can be produced by using a publicly known raw material and a publicly-known synthesis method.

<Anthracene Derivative>

One of the anthracene derivatives is a compound represented by Formula (ETM-5), for example.

(ETM-5)

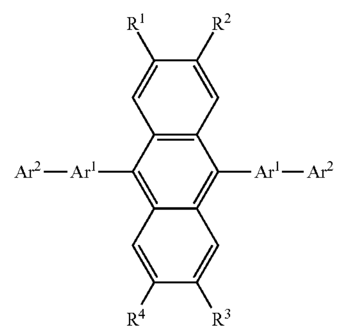

$Ar^1$ is independently a single bond, divalent benzene, naphthalene, anthracene, fluorene or phenalene.

$Ar^2$ is independently an aryl having 6 to 20 carbons, preferably an aryl having 6 to 16 carbons, more preferably an aryl having 6 to 12 carbons, further preferably an aryl having 6 to 10 carbons. Specific examples of the "aryl having 6 to 20 carbons" include phenyl, (o-, m-, p-)tolyl, (2,3-, 2,4-, 2,5-, 2,6-, 3,4-, 3,5-)xylyl, mesityl(2,4,6-trimethylphenyl) and (o-, m-, p-)cumenyl as monocyclic aryl, (2-,3-,4-)biphenylyl as bicyclic aryl, (1-,2-)naphthyl as fused bicyclic aryl, terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, and p-terphenyl-4-yl) as tricyclic aryl, anthracene-(1-,2-,9-)yl, acenaphthylene(1-,3-,4-,5-)yl, fluorene-(1-,2-,3-,4-,9-)yl, phenalene (1-,2-)yl, and (1-,2-,3-,4-,9-)phenanthryl as fused tricyclic aryl, triphenylene(1-,2-)yl, pyrene(1-,2-,4-)yl, and tetracene (1-,2-,5-)yl as fused tetracyclic aryl, and perylene-(1-,2-,3-)yl as fused pentacyclic aryl. Specific examples of aryl having 6 to 10 carbons include phenyl, biphenylyl, naphthyl, terphenylyl, anthracenyl, acenaphthylenyl, fluorenyl, phenalenyl, phenanthryl, triphenylenyl, pyrenyl, tetracenyl and perylenyl.

$R^1$ to $R^4$ are independently hydrogen, an alkyl having 1 to 6 carbons, a cycloalkyl having 3 to 6 carbons or an aryl having 6 to 20 carbons.

Alkyl having 1 to 6 carbons in $R^1$ to $R^4$ may be any of a straight-chain alkyl and a branched-chain alkyl. More specifically, a straight-chain alkyl having 1 to 6 carbons or a branched-chain alkyl having 3 to 6 carbons is preferred. An alkyl having 1 to 4 carbons (branched-chain alkyl having 3 to 4 carbons) is further preferred. Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl or 2-ethylbutyl, and methyl, ethyl, n-propyl, isopropyl, n-butyl, isobutyl, s-butyl or t-butyl is preferred, and methyl, ethyl or t-butyl is further preferred.

Specific examples of the cycloalkyl having 3 to 6 carbons in $R^1$ to $R^4$ include cyclopropyl, cyclobutyl, cyclopentyl, cyclohexyl, methylcyclopentyl, cycloheptyl, methylcyclohexyl, cyclooctyl or dimethylcyclohexyl.

As the aryl having 6 to 20 carbons in $R^1$ to $R^4$, an aryl having 6 to 16 carbons is preferred, an aryl having 6 to 12 carbons is further preferred, and an aryl having 6 to 10 carbons is particularly preferred. As specific examples of the "aryl having 6 to 20 carbons," the same specific examples of the "aryl having 6 to 20 carbons," in $Ar^2$ can be quoted As the "aryl having 6 to 20 carbons," phenyl, biphenylyl, terphenylyl or naphthyl is preferred, phenyl, biphenylyl, 1-naphthyl, 2-naphthyl or m-terphenyl-5'-yl is further preferred, phenyl, biphenylyl, 1-naphthyl or 2-naphthyl is still further preferred, and phenyl is most preferred.

Specific examples of the above anthracene derivatives include compounds described below.

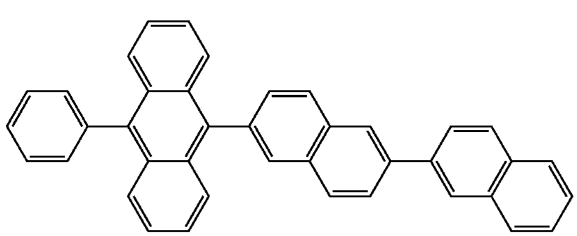 [SMILES: c1ccc(-c2c3ccccc3c(-c3ccc4cc(-c5ccc6ccccc6c5)ccc4c3)c3ccccc23)cc1]

The above anthracene derivatives can be produced by using a publicly known raw material and a publicly known synthesis method.

<Benzofluorene Derivative>

The benzofluorene derivative is a compound represented by formula (ETM-6), for example.

(ETM-6)

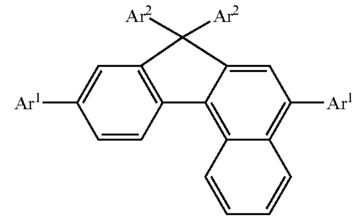

$Ar^1$ is independently aryl having 6 to 20 carbons, and the same description as the "aryl having 6 to 20 carbons" in $Ar^2$ of formula (ETM-5) can be quoted. Aryl having 6 to 16 carbons is preferred, aryl having 6 to 12 carbons is further preferred, and aryl having 6 to 10 carbons is particularly preferred. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl and perylenyl.

$Ar^2$ is independently hydrogen, alkyl (preferably alkyl having 1 to 24 carbons), cycloalkyl (preferably cycloalkyl having 3 to 12 carbons), or aryl (preferably aryl having 6 to 30 carbons), and two $Ar^2$'s may be bonded to form a ring.

The "alkyl" in $Ar^2$ may be any of straight-chain alkyl and branched-chain alkyl, and specific examples thereof include straight-chain alkyl having 1 to 24 carbons or branched-chain alkyl having 3 to 24 carbons. Preferred "alkyl" is alkyl having 1 to 18 carbons (branched-chain alkyl having 3 to 18 carbons). Further preferred "alkyl" is alkyl having 1 to 12 carbons (branched-chain alkyl having 3 to 12 carbons). Still further preferred "alkyl" is alkyl having 1 to 6 carbons (branched-chain alkyl having 3 to 6 carbons). Particularly preferred "alkyl" is alkyl having 1 to 4 carbons (branched-chain alkyl having 3 to 4 carbons). Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl and 1-methylhexyl.

Specific examples of the "cycloalkyl" in $Ar^2$ include cycloalkyl having 3 to 12 carbons. Preferred "cycloalkyl" is cycloalkyl having 3 to 10 carbons. Further preferred "cycloalkyl" is cycloalkyl having 3 to 8 carbons. Still further preferred "cycloalkyl" is cycloalkyl having 3 to 6 carbons. Specific examples of the "cycloalkyl" include cyclopropyl, cyclobutyl, cyclopentyl, cyclohexyl, methyl cyclopentyl, cycloheptyl, methylcyclohexyl, cyclooctyl or dimethylcyclohexyl.

As the "aryl" in $Ar^2$, aryl having 6 to 30 carbons is preferred, aryl having 6 to 18 carbons is further preferred, aryl having 6 to 14 carbons is still further preferred, and aryl having 6 to 12 carbons is particularly preferred.

Specific examples of the "aryl having 6 to 30 carbons" include phenyl, naphthyl, acenaphthylenyl, fluorenyl, phenalenyl, phenanthryl, triphenylenyl, pyrenyl, naphthacenyl, perylenyl and pentacenyl.

Two $Ar^2$'s may be bonded to form a ring, and as a result, cyclobutane, cyclopentane, cyclopentene, cyclopentadiene, cyclohexane, fluorene, indene, or the like may be spiro-bonded to a 5-membered ring of a fluorene skeleton.

Specific examples of the benzofluorene derivative include compounds described below.

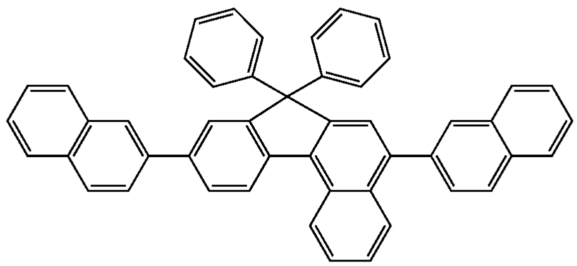

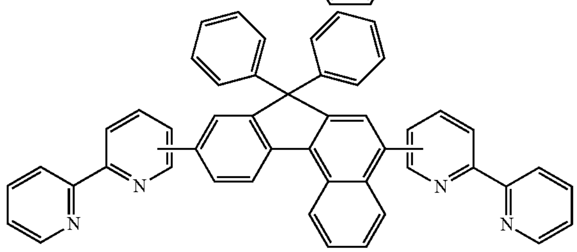

The benzofluorene derivative can be produced by using a publicly known raw material and a publicly known synthesis method.

<Phosphine Oxide Derivative>

The phosphine oxide derivative is a compound represented by Formula (ETM-7-1), for example. The detail is also described in WO 2013/079217 A and WO 2013/079678 A.

(ETM-7-1)

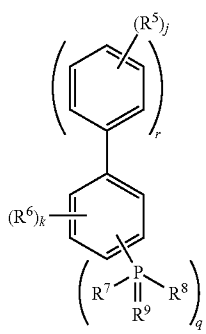

- $R^5$ is substituted or unsubstituted, an alkyl having 1 to 20 carbons, a cycloalkyl having 3 to 16 carbons, an aryl having 6 to 20 carbons or heteroaryl having 5 to 20 carbons,
- $R^6$ is CN, substituted or unsubstituted, an alkyl having 1 to 20 carbons, a cycloalkyl having 3 to 16 carbons, a heteroalkyl having 1 to 20 carbons, an aryl having 6 to 20 carbons, a heteroaryl having 5 to 20 carbons, an alkoxy having 1 to 20 carbons or an aryloxy having 5 to 20 carbons,
- $R^7$ and $R^8$ are independently substituted or unsubstituted, an aryl having 6 to 20 carbons or a heteroaryl having 5 to 20 carbons,
- $R^9$ is oxygen or sulfur, and
- j is 0 or 1, k is 0 or 1, r is an integer from 0 to 4, and q is an integer from 1 to 3.

Here, specific examples of the substituent in the case of being subjected to substitution include aryl, heteroaryl, alkyl or cycloalkyl.

The phosphine oxide derivative may be a compound represented by Formula (ETM-7-2), for example.

(ETM-7-2)

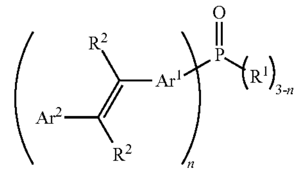

$R^1$ to $R^3$ may be identical to or different from each other, and is selected from hydrogen, an alkyl, a cycloalkyl, an aralkyl, an alkenyl, a cycloalkenyl, an alkynyl, an alkoxy, an alkylthio, a cycloalkylthio, an aryl ether (an aryl ether group), an aryl thioether (an aryl thioether group), an aryl, a heterocyclic group, a halogen, cyano, an aldehyde, a carbonyl, carboxyl, amino, nitro, silyl and a fused ring formed between an adjacent substituent and one of $R^1$ to $R^3$.

$Ar^1$ may be identical to or different from each other and is an allylene or a heteroalkylene. $Ar^2$ may be identical to or different from each other, and is an aryl or a heteroaryl, in which, at least one of $Ar^1$ and $Ar^2$ has a substituent, or forms a fused ring between an adjacent substituent and one of $Ar^1$ and $Ar^2$. Then, n is an integer from 0 to 3, and when n is 0, an unsaturated structure part does not exist, and when n is 3, $R^1$ does not exist.

Among the above substituents, the alkyl represents a saturated aliphatic hydrocarbon group such as methyl, ethyl, propyl and butyl, which may be unsubstituted or substituted. The substituent in the case of being subjected to substitution is not particularly limited, and specific examples thereof include alkyl, aryl and a heterocycle group, and the above point is common also in the following description. Moreover, the number of carbons of the alkyl is not particularly limited and is ordinarily in the range of 1 to 20 in view of ease of availability or cost.

Moreover, the cycloalkyl represents a saturated alicyclic hydrocarbon group such as cyclopropyl, cyclohexyl, norbornyl and adamanthyl, which may be unsubstituted or substituted. The number of carbons in an alkyl part is not particularly limited and is ordinarily in the range of 3 to 20.

Moreover, the aralkyl represents an aromatic hydrocarbon group through aliphatic hydrocarbon such as benzyl and phenylethyl, for example, and both of the aliphatic hydrocarbon and the aromatic hydrocarbon may be unsubstituted or substituted. The number of carbons on an aliphatic part is not particularly limited and is ordinarily in the range of 1 to 20.

Moreover, the alkenyl represents an unsaturated aliphatic hydrocarbon group containing a double bond such, as vinyl, allyl and butadienyl, for example, which may be unsubstituted or substituted. The number of carbons in the alkenyl is not particularly limited and is ordinarily in the range of 2 to 20.

Moreover, the cycloalkenyl represents an unsaturated alicyclic hydrocarbon group containing a double bond, such as cyclopentenyl, cyclopentadienyl and cyclohexenyl, for example, which may be unsubstituted or substituted.

Moreover, the alkynyl represents an unsaturated aliphatic hydrocarbon group containing a triple bond, such as acetylenyl, for example, which may be unsubstituted or substituted. The number of carbons in the alkynyl is not particularly limited and is ordinarily in the range of 2 to 20.

Moreover, the alkoxy represents an aliphatic hydrocarbon group through an ether bond, such as methoxy, for example, which may be unsubstituted or substituted. The number of carbons in the alkoxy is not particularly limited and is ordinarily in the range of 1 to 20.

Moreover, the alkylthio is a group in which an oxygen atom of an ether bond in the alkoxy is replaced with a sulfur atom.

Moreover, the cycloalkylthio is a group in which an oxygen atom of an ether bond in the cycloalkoxy is replaced with a sulfur atom.

Moreover, the aryl ether represents an aromatic hydrocarbon group through an ether bond such as phenoxy, for example, which may be unsubstituted or substituted. The number of carbons in the aryl ether is not particularly limited and is ordinarily in the range of 6 to 40.

Moreover, the aryl thioether is a group in which an oxygen atom of an ether bond in the aryl ether is replaced with a sulfur atom.

Moreover, the aryl represents an aromatic hydrocarbon group such as phenyl, naphthyl, biphenyl, phenanthryl, terphenyl and pyrenyl, for example. The aryl may be unsubstituted or substituted. The number of carbons in the aryl is not particularly limited and is ordinarily in the range of 6 to 40.

Moreover, the heterocycle group represents a cyclic structure group having an atom other than carbon, such as furanyl, thienyl, oxazolyl, pyridyl, quinolinyl and carbazolyl, for example, which may be unsubstituted or substituted. The number of carbons in the heterocycle group is not particularly limited and is ordinarily in the range of 2 to 30.

The halogen represents fluorine, chlorine, bromine, or iodine.

The aldehyde, the carbonyl and the amino can also include those group substituted with aliphatic hydrocarbon, alicyclic hydrocarbon, aromatic hydrocarbon, a heterocyclic ring or the like.

Moreover, the aliphatic hydrocarbon, the alicyclic hydrocarbon, the aromatic hydrocarbon, and the heterocyclic ring may be unsubstituted or substituted.

The silyl represents a silicon compound group such as trimethylsilyl, for example, which may be unsubstituted or substituted. The number of carbons in the silyl is not particularly limited and is ordinarily in the range of 3 to 20. Moreover, the number of silicon is ordinarily 1 to 6.

The fused ring formed between the adjacent substituent and one of substituents is a conjugated or unconjugated fused ring formed between $Ar^1$ and $R^2$, $Ar^1$ and $R^3$, $Ar^2$ and $R^2$, $Ar^2$ and $R^3$, $R^2$ and $R^3$, $Ar^1$ and $Ar^2$ and the like, for example. Here, when n is 1, two R's may form a conjugated or unconjugated fused ring. The above fused rings may contain nitrogen, oxygen and sulfur atoms in an endocyclic structure, and may be fused to another ring.

Specific examples of the phosphine oxide derivative include compounds described below, for example.

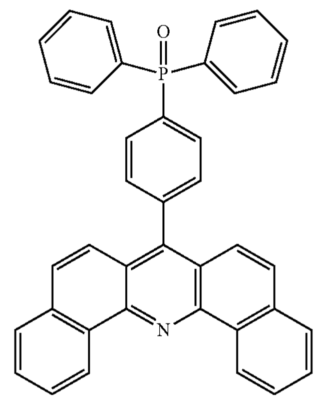

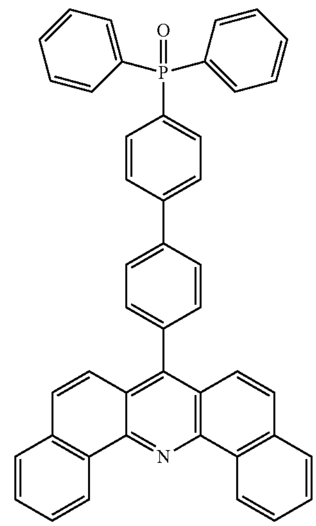

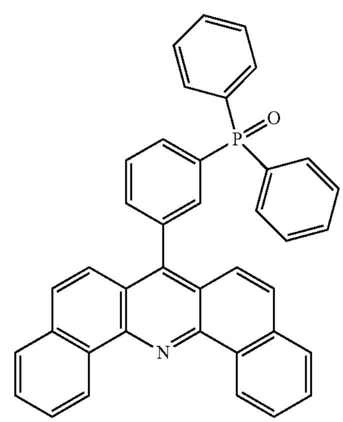

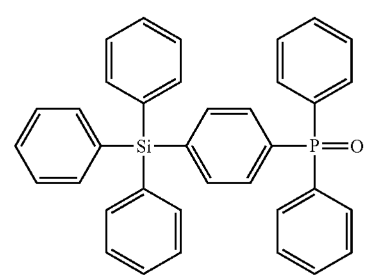

-continued

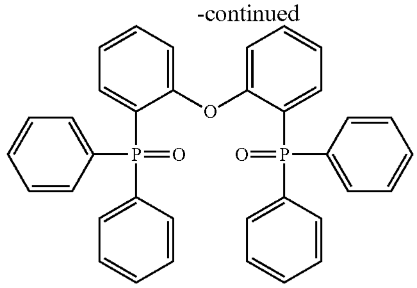

The phosphine oxide derivative can be produced by using a publicly known raw material and a publicly known synthesis method.

<Pyrimidine Derivative>

The pyrimidine derivative is a compound represented by Formula (ETM-8), for example, and is preferably a compound represented by Formula (ETM-8-1). The detail is described also in WO 2011/021689 A.

(ETM-8)

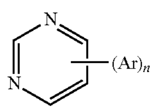

(ETM-8-1)

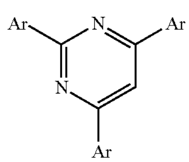

Ar is independently an aryl which may be substituted, or a heteroaryl which may be substituted. Then, n is an integer from 1 to 4, is preferably an integer from 1 to 3, and is further preferably 2 or 3.

Specific examples of the "aryl" of the "aryl which may be substituted" include an aryl having 6 to 30 carbons, and an aryl having 6 to 24 carbons is preferred, an aryl having 6 to 20 carbons is further preferred, and an aryl having 6 to 12 carbons is still further preferred.

Specific examples of the "aryl" include phenyl as monocyclic aryl, (2-, 3-, 4-)biphenylyl as bicyclic aryl, (1-, 2-)naphthyl as fused bicyclic aryl, terphenylyl(m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl), which are tricyclic aryl, acenaphthylene(1-,3-,4-,5-)yl, fluorene-(1-,2-,3-,4-,9-)yl, phenalene-(1-,2-)yl, and (1-,2-,3-,4-,9-)phenanthryl as fused tricyclic aryl, quaterphenylyl(5'-phenyl-m-terphenyl-2-yl, 5'-phenyl-m-terphenyl-3-yl, 5'-phenyl-m-terphenyl-4 yl, and m-quaterphenylyl) as tetracyclic aryl, triphenylene (1-, 2-)yl, pyrene(1-, 2-, 4-)yl, and naphthacene-(1-,2-,5-)yl as fused tetracyclic aryl, and perylene(1-,2-,3-)yl and pentacene(1-,2-,5-,6-)yl as fused pentacyclic aryl.

Specific examples of the "heteroaryl" of the "heteroaryl which may be substituted" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of the heteroaryl include a heterocyclic ring containing, in addition to carbon, 1 to 5 hetero atoms selected from oxygen, sulfur and nitrogen as a ring-forming atom.

Specific examples of the heteroaryl include furyl, thienyl, pyrrolyl, oxazolyl, isoxazolyl, thiazolyl, isothiazolyl, imidazolyl, pyrazolyl, oxadiazolyl, furazanyl, thiadiazolyl, triazoryl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

Moreover, the aryl and the heteroaryl may each have a substituent, which may be the aryl or the heteroaryl, for example.

Specific examples of the pyrimidine derivative include compounds described below.

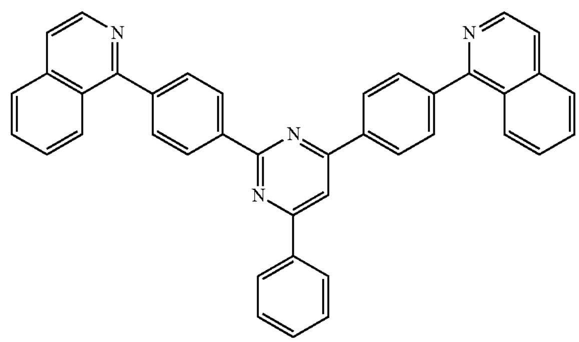 [SMILES: c1ccc(-c2cc(-c3ccc(-c4nccc5ccccc45)cc3)nc(-c3ccc(-c4nccc5ccccc45)cc3)n2)cc1]

The pyrimidine derivative can be produced by using a publicly known raw material and a publicly known synthesis method.

<Aryl Nitrile Derivative>

The aryl nitrile derivative is a compound represented by Formula (ETM-9), or a multimer formed by bonding a plurality of compounds by a single bond or the like, for example. The detail is described in US 2014/0197386 A.

$$(Ar)_m\text{—}Ar_{ni}\text{—}(CN)_n \quad \text{(ETM-9)}$$

$Ar_{ni}$ preferably has a large number of carbon atoms from the viewpoint of fast electron transportability, and preferably has a small number of carbon atoms from the viewpoint of high T1. Specifically, $Ar_{ni}$ preferably has a high T1 for use in a layer adjacent to the light emitting layer, and is an aryl having 6 to 20 carbon atoms, preferably an aryl having 6 to 14 carbons, and more preferably an aryl having 6 to 10 carbons. Further, the number of substitutions n of the nitrile groups is preferably large from the viewpoint of high T1 and preferably small from the viewpoint of high S1. Specifically, the number of substitutions n of the nitrile group is an integer of 1 to 4, preferably an integer of 1 to 3, more preferably an integer of 1 to 2, and even more preferably 1.

Ar are each independently an aryl which may be substituted or a heteroaryl which may be substituted. From the viewpoint of high S1 and high T1, a donor type heteroaryl is preferable, and since it is used in an electron transport layer, a number of a donor type heteroaryl is preferably small. From the viewpoint of charge transportability, aryl or heteroaryl having a larger number of carbon atoms is preferable, and it is preferable to have a large number of substituents. Specifically, the number of substitutions m of Ar is an integer of 1 to 4, preferably an integer of 1 to 3, and more preferably 1 to 2.

Specific examples of the "aryl" of the "aryl which may be substituted" include aryl having 6 to 30 carbons, and aryl having 6 to 24 carbons is preferred, aryl having 6 to 20 carbons is further preferred, and aryl having 6 to 12 carbons is still further preferred.

Specific examples of the "aryl" include phenyl as monocyclic aryl, (2-, 3-, 4-)biphenylyl as bicyclic aryl, (1-, 2-)naphthyl as fused bicyclic aryl, terphenylyl(m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl), which are tricyclic aryl, acenaphthylene(1-,3-,4-,5-)yl, fluorene-(1-,2-,3-,4-,9-)yl, phenalene-(1-,2-)yl, and (1-,2-,3-,4-,9-)phenanthryl as fused tricyclic aryl, quaterphenylyl(5'-phenyl-m-terphenyl-2-yl, 5'-phenyl-m-terphenyl-3-yl, 5'-phenyl-m-terphenyl-4 yl, and m-quaterphenylyl) as tetracyclic aryl, triphenylene (1-, 2-)yl, pyrene(1-, 2-, 4-)yl, and naphthacene-(1-,2-,5-)yl as fused tetracyclic aryl, and perylene(1-,2-,3-)yl and pentacene(1-,2-,5-,6-)yl as fused pentacyclic aryl.

Specific examples of the "heteroaryl" of the "heteroaryl which may be substituted" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of the heteroaryl include a heterocyclic ring containing, in addition to carbon, 1 to 5 hetero atoms selected from oxygen, sulfur and nitrogen as a ring-forming atom.

Specific examples of the heteroaryl include furyl, thienyl, pyrrolyl, oxazolyl, isoxazolyl, thiazolyl, isothiazolyl, imidazolyl, pyrazolyl, oxadiazolyl, furazanyl, thiadiazolyl, triazoryl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

Moreover, the aryl and the heteroaryl may each have one or more substituents which may be the aryl or the heteroaryl, for example.

The aryl nitrile derivative may be the multimer formed by bonding the plurality of compounds represented by Formula (ETM-9) by a single bond or the like. In the above case, the compounds may be bonded by, in addition to the single bond, an aryl ring (preferably a polyvalent benzene ring, a naphthalene ring, an anthracene ring, a fluorene ring, a benzofluorene ring, a phenalene ring, a phenanthrene ring or a triphenylene ring).

Specific examples of the aryl nitrile derivative include compounds described below.

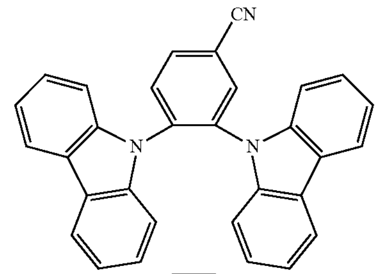

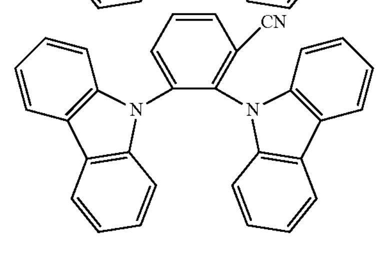

The aryl nitrile derivative can be produced by using a publicly known raw material and a publicly-known synthesis method.

<Triazine Derivative>

The triazine derivative is a compound represented by Formula (ETM-10), for example, and is preferably a compound represented by Formula (ETM-10-1). The detail is described in US 2011/0156013 A.

(ETM-10)

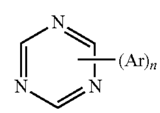

(ETM-10-1)

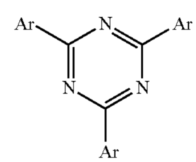

Ar is independently aryl which may be substituted, or heteroaryl which may be substituted. Then, n is an integer from 1 to 3, and is preferably 2 or 3.

Specific examples of the "aryl" of the "aryl which may be substituted" include aryl having 6 to 30 carbons, and aryl having 6 to 24 carbons is preferred, aryl having 6 to 20 carbons is further preferred, and aryl having 6 to 12 carbons is still further preferred.

Specific examples of the "aryl" include phenyl as monocyclic aryl, (2-,3-,4-)biphenylyl as bicyclic aryl, (1-,2-)naphthyl as fused bicyclic aryl, terphenylyl(m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl), which are tricyclic aryl, acenaphthylene-(1-,3-,4-, -)yl, fluorene-(1-,2-,3-,4-,9-)yl, phenalene-(1-,2-)yl, and (1-,2-,3-,4-,9-)phenanthryl as fused tricyclic aryl, quaterphenylyl(5'-phenyl-m-terphenyl-2-yl, 5'-phenyl-m-terphenyl-3-yl, 5'-phenyl-m-terphenyl-4 yl, m-quaterphenylyl), which are tetracyclic aryl, triphenylene-(1-,2-)yl, pyrene-(1-,2-,4-)yl, naphthacene-(1-,2-,5-)yl, which are fused tetracyclic aryl, and perylene-(1-,2-,3-)yl and pentacene-(1-,2-,5-,6-)yl as fused pentacyclic aryl.

Specific examples of the "heteroaryl" of the "heteroaryl which may be substituted" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of the heteroaryl include a heterocyclic ring containing, in addition to carbon, 1 to 5 hetero atoms selected from oxygen, sulfur and nitrogen as a ring-forming atom.

Specific examples of the heteroaryl include furyl, thienyl, pyrrolyl, oxazolyl, isoxazolyl, thiazolyl, isothiazolyl, imidazolyl, pyrazolyl, oxadiazolyl, furazanyl, thiadiazolyl, triazoryl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

Moreover, the aryl and the heteroaryl may each have one or more substituents, which may be the aryl or the heteroaryl, for example.

Specific examples of the triazine derivative include compounds described below.

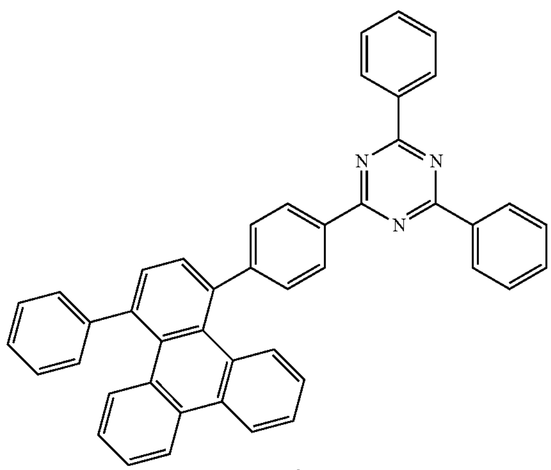

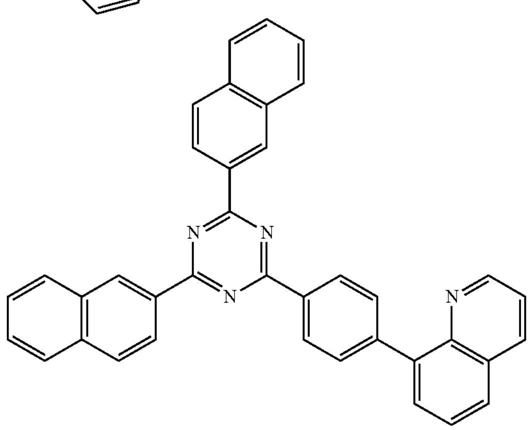

The triazine derivative can be produced by using a publicly known raw material and a publicly known synthesis method.

<Benzimidazole Derivative>

The benzimidazole derivative is a compound represented by Formula (ETM-11), for example.

$$\varnothing\text{-(benzimidazole-based substituent)}_n \quad \text{(ETM-11)}$$

Then, φ is an n-valent aryl ring (preferably an n-valent benzene ring, naphthalene ring, anthracene ring, fluorene ring, benzofluorene ring, phenalene ring, phenanthrene ring or triphenylene ring), and n is an integer from 1 to 4, and a "benzimidazole-based substituent" is a substituent in which a pyridyl in the "pyridine-based substituent" in Formula (ETM-2), Formula (ETM-2-1) and Formula (ETM-2-2) is replaced with a benzimidazolyl (* represents a bonding position), and at least one hydrogen in the benzimidazole derivative may be replaced with deuterium.

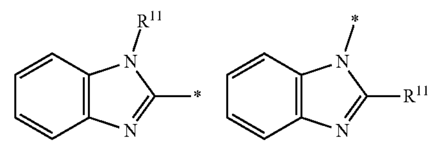

Benzimidazolyl $R^{11}$ in the benzimidazole group is hydrogen, an alkyl having 1 to 24 carbons, a cycloalkyl having 3 to 12 carbons or an aryl having 6 to 30 carbons, and the description for $R^{11}$ in Formula (ETM-2-1) and Formula (ETM-2-2) can be quoted.

Then, φ is preferably an anthracene ring or a fluorene ring, and for the structure in the above case, the description in Formula (ETM-2-1) or Formula (ETM-2-2) can be quoted, and for $R^{11}$ to $R^{18}$ in each formula, the description in Formula (ETM-2-1) or Formula (ETM-2-2) can be quoted. Moreover, in Formula (ETM-2-1) or Formula (ETM-2-2), described in a form in which the two pyridine-based substituents are bonded, and when the substituent is replaced with the benzimidazole-based substituent, both of the pyridine-based substituents may be replaced with the benzimidazole-based substituent (namely, n=2), or one of the pyridine-based substituents may be replaced with the benzimidazole-based substituent, and the other of the pyridine-based substituents may be replaced with $R^{11}$ to $R^{18}$ (namely, n=1). Further, for example, at least one of $R^{11}$ to $R^{18}$ in Formula (ETM-2-1) may be replaced with the benzimidazole-based substituent, and the "pyridine-based substituent" may be replaced with $R^{11}$ to $R^{18}$.

Specific examples of the benzimidazole derivative include 1-phenyl-2-(4-(10-phenylanthracen-9-yl)phenyl)-1H-benzo[d]imidazole, 2-(4-(10-(naphthalene-2-yl)anthracene-9-yl)phenyl)-1-phenyl-1H-benzo[d]imidazole, 2-(3-(10-(naphthalene-2-yl)anthracene-9-yl)phenyl)-1-phenyl-1H-benzo[d]imidazole, 5-(10-(naphthalene-2-yl)anthracene-9-yl)-1,2-diphenyl-1H-benzo[d]imidazole, 1-(4-(10-(naphthalene-2-yl)anthracene-9-yl)phenyl)-2-phenyl-1H-benzo[d] imidazole, 2-(4-(9,10-di(naphthalene-2-yl)anthracene-2-yl)phenyl-1-phenyl-1H-benzo[d]imidazole, 1-(4-(9,10-di(naphthalene-2-yl)anthracene-2-yl)phenyl-2-phenyl-1H-benzo[d]imidazole and 5-(9,10-di(naphthalene-2-yl)anthracene-2-yl-1,2-diphenyl-1H-benzo[d]imidazole.

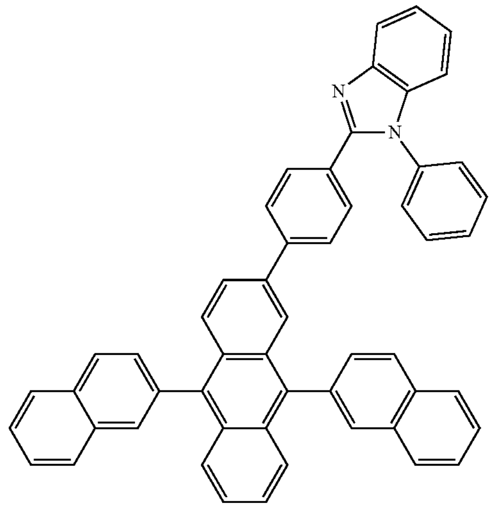

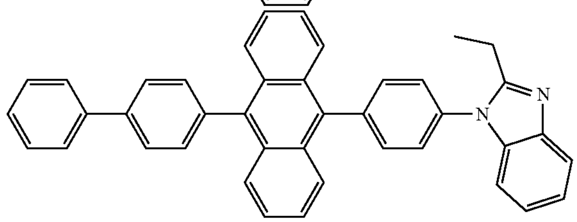

The benzimidazole derivative can be produced by using a publicly known raw material and a publicly known synthesis method.

<Phenanthroline Derivative>

The phenanthroline derivative is a compound represented by Formula (ETM-12) or Formula (ETM-12-1), for example. The detail is described in WO 2006/021982 A.

(ETM-12)

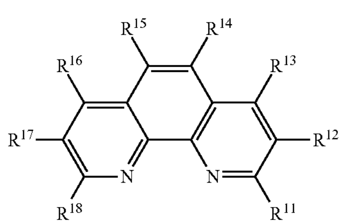

(ETM-12-1)

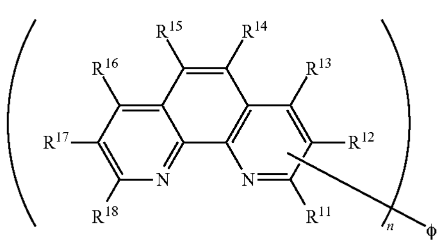

Then, p is an n-valent aryl ring (preferably, an n-valent benzene ring, naphthalene ring, anthracene ring, fluorene ring, benzofluorene ring, phenalene ring, phenanthrene ring or triphenylene ring), and n is an integer from 1 to 4.

$R^{11}$ to $R^{18}$ in each formula are independently hydrogen, an alkyl (preferably alkyl having 1 to 24 carbons), a cycloalkyl (preferably cycloalkyl having 3 to 12 carbons) or an aryl (preferably aryl having 6 to 30 carbons). In Formula (ETM-12-1), any one of $R^1$ to $R^{18}$ is a bonding hand with φ being an aryl ring.

At least one hydrogen in each phenanthroline derivative may be replaced with deuterium.

As the alkyl, the cycloalkyl and the aryl in $R^{11}$ to $R^{18}$, the description for $R^{11}$ to $R^{18}$ in Formula (ETM-2) can be quoted. Moreover, specific examples of φ include the following structural formula in addition to the above examples. In addition, R in the structural formulas described below is independently hydrogen, methyl, ethyl, isopropyl, cyclohexyl, phenyl, 1-naphthyl, 2-naphthyl, biphenylyl or terphenylyl, and a position "*" represents a bonding position.

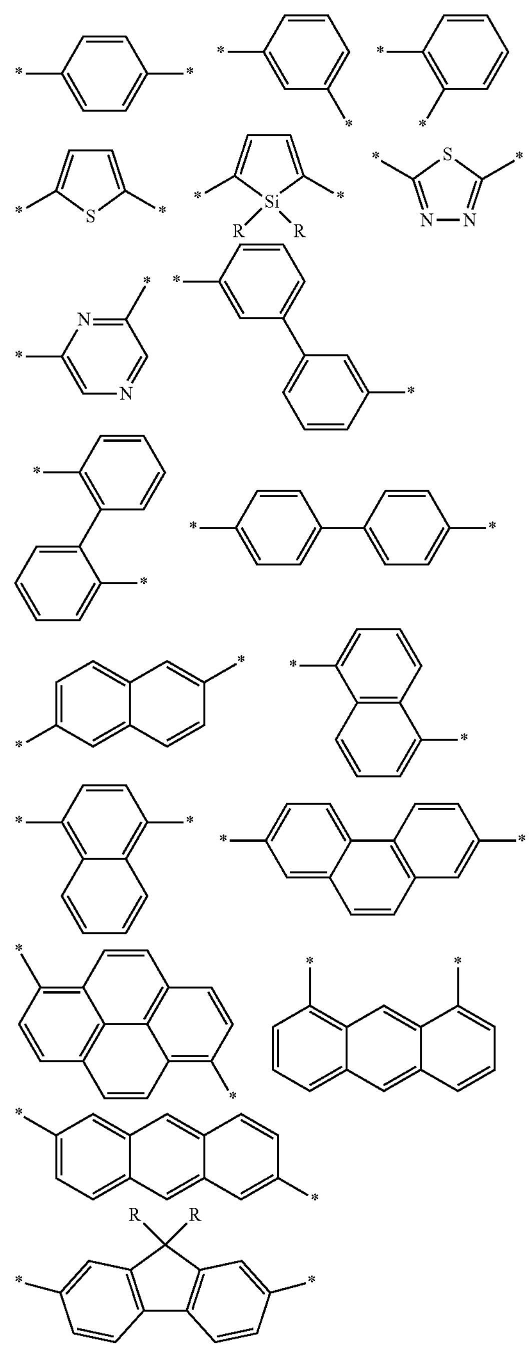

-continued

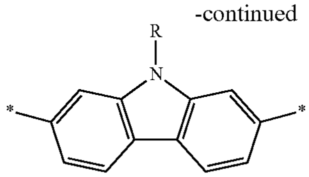

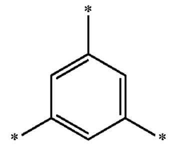

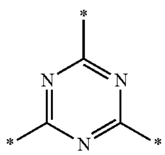

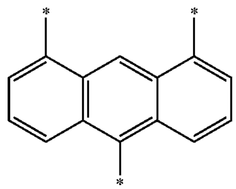

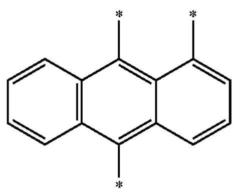

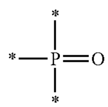

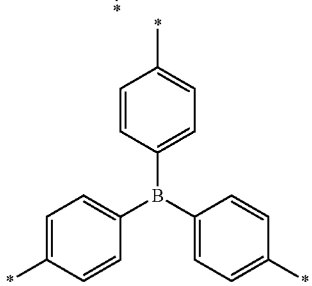

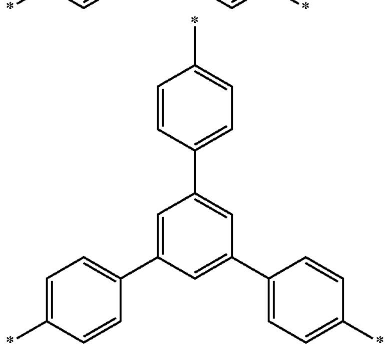

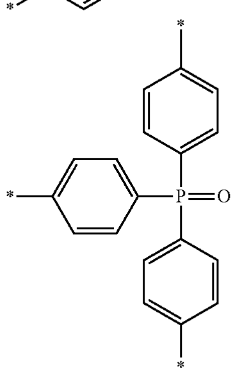

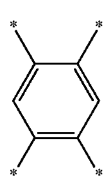

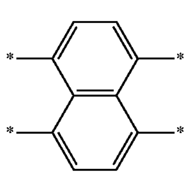

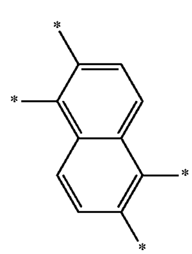

-continued

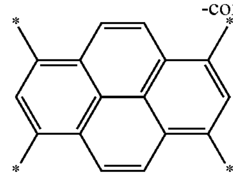

Specific examples of the phenanthroline derivative include 4,7-diphenyl-1,10-phenanthroline, 2,9-dimethyl-4,7-diphenyl-1,10-phenanthroline, 9,10-di(1,10-phenanthroline-2-yl)anthracene, 2,6-di(1,10-phenanthroline-5-yl)pyridine, 1,3,5-tri(1,10-phenanthroline-5-yl)benzene, 9,9'-difluoro-bi(1,10-phenanthroline-5-yl, bathocuproine, 1,3-bis(2-phenyl-1,10-phenanthroline-9-yl)benzene, and a compound represented by the following structural formula.

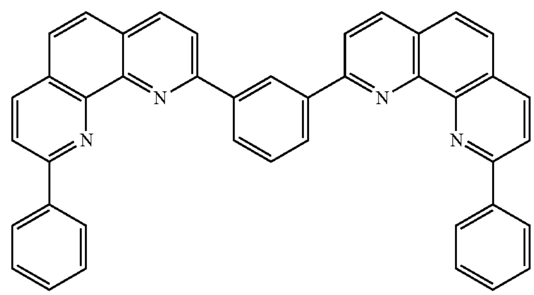 [SMILES: c1ccc(-c2ccc3ccc4ccc(-c5cccc(-c6ccc7ccc8ccc(-c9ccccc9)nc8c7n6)c5)nc4c3n2)cc1]

The phenanthroline derivative can be produced by using a publicly known raw material and a publicly known synthesis method.

<Quinolinol Metal Complex>

The quinolinol metal complex is a compound represented by Formula (ETM-13), for example.

(ETM-13)

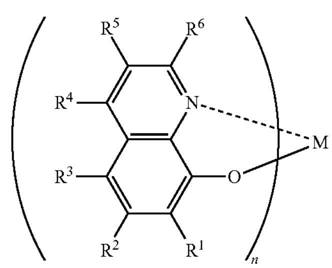

In the formula, $R^1$ to $R^6$ are independently hydrogen, fluorine, alkyl, cycloalkyl, aralkyl, alkenyl, cyano, alkoxy or aryl, and M is Li, Al, Ga, Be or Zn, and n is an integer from 1 to 3.

Specific examples of the quinolinol metal complex include 8-quinolinol lithium, tris(8-quinolate)aluminum, tris(4-methyl-8-quinolate)aluminum, tris(5-methyl-8-quinolate)aluminum, tris(3,4-dimethyl-8-quinolate)aluminum, tris(4,5-dimethyl-8-uinolate)aluminum, tris(4,6-dimethyl-8-quinolate)aluminum, bis(2-methyl-8-quinolate(phenolate) aluminum, bis(2-methyl-8-quinolate(2-methylphenolate) aluminum, bis(2-methyl-8-quinolate(3-methylphenolate) aluminum, bis(2-methyl-8-quinolate(4-methylphenolate) aluminum, bis(2-methyl-8-quinolate(2-phenylphenolate) aluminum, bis(2-methyl-8-quinolate(3-phenylphenolate) aluminum, bis(2-methyl-8-quinolate(4-phenylphenolate)

aluminum, bis(2-methyl-8-quinolate(2,3-dimethylphenolate)aluminum, bis(2-methyl-8-quinolate(2,6-dimethylphenolate)aluminum, bis(2-methyl-8-quinolate(3,4-dimethylphenolate)aluminum, bis(2-methyl-8-quinolate(3,5-dimethylphenolate)aluminum, bis(2-methyl-8-quinolate(3,5-di-t-butylphenolate)aluminum, bis(2-methyl-8-quinolate (2,6-diphenylphenolate)aluminum, bis(2-methyl-8-quinolate(2,4,6-triphenylphenolate)aluminum, bis(2-methyl-8-quinolate(2,4,6-trimethylphenolate)aluminum, bis (2-methyl-8-quinolate(2,4,5,6-tetramethylphenolate) aluminum, bis(2-methyl-8-quinolate(1-naphtholate) aluminum, bis(2-methyl-8-quinolate(2-naphtholate) aluminum, bis(2,4-dimethyl-8-quinolate(2-phenylphenolate)aluminum, bis(2,4-dimethyl-8-quinolate (3-phenylphenolate)aluminum, bis(2,4-dimethyl-8-quinolate(4-phenylphenolate)aluminum, bis(2,4-dimethyl-8-quinolate(3,5-dimethylphenolate)aluminum, bis(2,4-dimethyl-8-quinolate(3,5-di-t-butylphenolate)aluminum, bis(2-methyl-8-quinolate)aluminum-p-oxo-bis(2-methyl-8-quinolate)aluminum, bis(2,4-dimethyl-8-quinolate)aluminum-p-oxo-bis(2,4-dimethyl-8-quinolate)aluminum, bis(2-methyl-4-ethyl-8-quinolate)aluminum-p-oxo-bis(2-methyl-4-ethyl-8-quinolate)aluminum, bis(2-methyl-4-methoxy-8-quinolate)aluminum-p-oxo-bis(2-methyl-4-methoxy-8-quinolate)aluminum, bis(2-methyl-5-cyano-8-quinolate) aluminum-g-oxo-bis(2-methyl-5-cyano-8-quinolate) aluminum, bis(2-methyl-5-trifluoromethyl-8-quinolate) aluminum-p-oxo-bis(2-methyl-5-trifluoromethyl-8-quinolate)aluminum and bis(10-hydroxybenzo[h]quinoline) beryllium.

The quinolinol metal complex can be produced by using a publicly known raw material and a publicly known synthesis method.

<Thiazole Derivative and a Benzothiazole Derivative>

The thiazole derivative is a compound represented by Formula (ETM-14-1), for example.

(ETM-14-1)

∅-(thiazole-based substituent)$n$

The benzothiazole derivative is a compound represented by Formula (ETM-14-2), for example.

(ETM-14-2)

∅-(benzothiazole-based substituent)$n$

Then, φ in each formula is an n-valent aryl ring (preferably an n-valent benzene ring, naphthalene ring, anthracene ring, fluorene ring, benzofluorene ring, phenalene ring, phenanthrene ring or triphenylene ring), and n is an integer from 1 to 4, and the "thiazole-based substituent" or the "benzothiazole-based substituent" are a substituent in which the pyridyl group in the "pyridine-based substituent" in Formula (ETM-2), Formula (ETM-2-1) and Formula (ETM-2-2) is replaced with a thiazolyl or a benzothiazolyl described below (a position "*" in the formulas represents a bonding position), and at least one hydrogen in the thiazole derivative and the benzothiazole derivative may be replaced with deuterium.

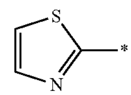

thiazolyl

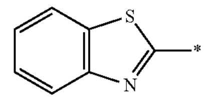

benzothiazolyl

Then, φ is preferably an anthracene ring or a fluorene ring, and for the structure in the above case, the description in Formula (ETM-2-1) or Formula (ETM-2-2) can be quoted, and for $R^{11}$ to $R^{18}$ in each formula, the description in Formula (ETM-2-1) or Formula (ETM-2-2) can be quoted. Moreover, in Formula (ETM-2-1) or Formula (ETM-2-2), described in a form in which the two pyridine-based substituents are bonded, and when the substituent is replaced with the thiazole-based substituent (or benzothiazole-based substituent), both of the pyridine-based substituents may be replaced with the thiazole-based substituent (or benzothiazole-based substituent) (namely, n=2), or one of the pyridine-based substituents may be replaced with the thiazole-based substituent (or benzothiazole-based substituent), and the other of the pyridine-based substituents may be replaced with $R^{11}$ to $R^{18}$ (namely, n=1). Further, for example, at least one of $R^{11}$ to $R^{18}$ in Formula (ETM-2-1) may be replaced with the thiazole-based substituent (or benzothiazole-based substituent), and the "pyridine-based substituent" may be replaced with $R^{11}$ to $R^{18}$.

The above thiazole derivative or benzothiazole derivative can be produced by using a publicly known raw material and a publicly known synthesis method.

<Silol Derivatives>

The silole derivative is a compound represented by Formula (ETM-15), for example. The details are described in JP 9-194487 A.

(ETM-15)

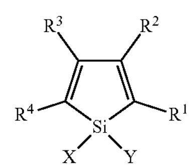

X and Y are each independently an alkyl, a cycloalkyl, an alkenyl, an alkynyl, an alkoxy, an alkenyloxy, an alkynyloxy, an aryl, a heteroaryl, each of which may be substituted. For a detailed description of these groups, the description in Formulae (1A) and (1B), as well as the description in Formula (ETM-7-2), can be quoted. In addition, an alkenyloxy and an alkynyloxy are groups in which an alkyl moiety in an alkoxy is replaced with an alkenyl or an alkynyl, respectively, thus for details, the description of the alkenyl and alkynyl in Formula (ETM-7-2) can be quoted.

Further, X and Y, each of which is an alkyl, may be bonded to form a ring.

$R^1$ to $R^4$ are, each independently, hydrogen, a halogen, an alkyl, a cycloalkyl, an alkoxy, an aryloxy, amino, an alkylcarbonyl, an arylcarbonyl, an alkoxycarbonyl, an aryloxycarbonyl, azo group, an alkylcarbonyloxy, an arylcarbonyloxy, an alkoxycarbonyloxy, an aryloxycarbonyloxy, sulfinyl, sulfonyl, sulfanyl, silyl, carbamoyl, an aryl, a heteroaryl, an alkenyl, an alkynyl, nitro, formyl, nitroso, formyloxy, isocyano, cyanate, isocyanate, thiocyanate, isothiocyanate, or cyano, each of which may be substituted with an alkyl, a cycloalkyl, an aryl or a halogen, and may form a fused ring between the adjacent substituents.

For details of the halogen, alkyl, cycloalkyl, alkoxy, aryloxy, amino, aryl, heteroaryl, alkenyl and alkynyl in $R^1$ to $R^4$, the description in Formulae (1A) and (1B) can be quoted.

Also, for details of the alkyl, aryl and alkoxy in alkylcarbonyl, arylcarbonyl, alkoxycarbonyl, aryloxycarbonyl, alkylcarbonyloxy, arylcarbonyloxy, alkoxycarbonyloxy and aryloxycarbonyloxy in $R^1$ to $R^4$, the description in Formulae (1A) and (1B) can be quoted.

Examples of silyl include silyl and a group in which at least one of 3 hydrogens in silyl are each independently replaced with an aryl, alkyl or cycloalkyl, and trisubstituted silyl is preferred, and examples thereof include a triarylsilyl, a trialkylsilyl, a tricycloalkylsilyl, a dialkylcycloalkylsilyl an alkyldicycloalkylsilyl, and the like. For the details of the aryl, alkyl and cycloalkyl in these, the description in Formulae (1A) and (1B) can be quoted.

The fused ring formed between adjacent substituents is, for example, a conjugated or unconjugated fused ring formed between $R^1$ and $R^2$, $R^2$ and between $R^3$, $R^3$ and $R^4$, and the like. The above fused rings may contain nitrogen, oxygen or sulfur atoms in an endocyclic structure, and may be fused to another ring.

Preferably, however, when $R^1$ and $R^4$ are phenyl, X and Y are not alkyl or phenyl. Also preferably, when $R^1$ and $R^4$ are thienyl, it is not simultaneously satisfied that X and Y are alkyls and $R^2$ and $R^3$ are any of an alkyl, an aryl, and an alkenyl, or $R^2$ and $R^3$ are coupled to each other to form a ring. Also preferably, when $R^1$ and $R^4$ are silyl, $R^2$, $R^3$, X and Y are each independently, not hydrogen or an alkyl having 1 to 6 carbons. Also preferably, when the benzene ring is fused at $R^1$ and $R^2$, X and Y are not an alkyl and phenyl.

The above silole derivatives can be produced by using a publicly known raw material and a publicly known synthesis method.

<Azoline Derivatives>

The azoline derivative is a compound represented by Formula (ETM-16), for example. Details are described in WO 2017/014226.

(ETM-16)

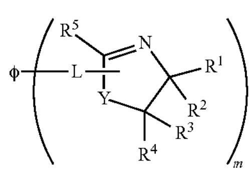

In Formula (ETM-16),

φ is an m-valent group derived from an aromatic hydrocarbon having 6 to 40 carbons or an m-valent group derived from an aromatic heterocycle having 2 to 40 carbons, and at least one hydrogen in φ may be replaced with an alkyl having 1 to 6 carbons, a cycloalkyl having 3 to 14 carbons, an aryl having 6 to 18 carbons or a heteroaryl having 2 to 18 carbons, Y are each independently —O—, —S— or >N—Ar, wherein Ar is an aryl having 6 to 12 carbons or a heteroaryl having 2 to 12 carbons, and at least one hydrogen in Ar may be replaced with an alkyl having 1 to 4 carbons, a cycloalkyl having 5 to 10 carbons, an aryl having 6 to 12 carbons or a heteroaryl having 2 to 12 carbons. $R^1$ to $R^5$ are each independently hydrogen, an alkyl having 1 to 4 carbons or a cycloalkyl having 5 to 10 carbons, provided that any one of Ar in the above >N—Ar and the above $R^1$ to $R^5$ is the site that binds to L, L are each independently selected from the group consisting of a divalent group represented by the following Formula (L-1) and a divalent group represented by the following Formula (L-2), (L-1)

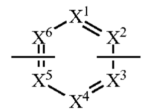

(L-2)

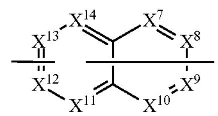

In Formula (L-1), $X^1$ to $X^6$ are each independently $=CR^6-$ or $=N-$, at least two of X' to $X^6$ are $=CR^6-$, $R^6$ in the two $=CR^6-$ of $X^1$ to $X^6$ is the site that binds to p or azoline ring, and each $R^6$ in the other $=CR^6-$ is hydrogen, In Formula (L-2), $X^7$ to $X^{14}$ are each independently $=CR^6-$ or $=N-$, at least two of $X^7$ to $X^{14}$ are $=CR^6-$, $R^6$ in the two $=CR^6-$ of $X^7$ to $X^{14}$ is the site that binds to p or azoline ring, and each $R^6$ in the other $=CR^6-$ is hydrogen, at least one hydrogen in L may be replaced with an alkyl having 1 to 4 carbons, a cycloalkyl having 5 to 10 carbons, an aryl having 6 to 10 carbons or a heteroaryl having 2 to 10 carbons, m is an integer from 1 to 4, and when m is 2 to 4, the groups formed between the azoline ring and L may be the same or different, and at least one hydrogen in the compound represented by Formula (ETM-16) may be replaced with deuterium.

Specific azoline derivatives are compounds represented by the following Formula (ETM-16-1) or Formula (ETM-16-2).

(ETM-16-1)

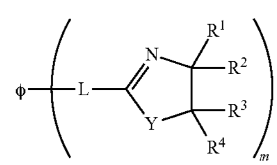

(ETM-16-2)

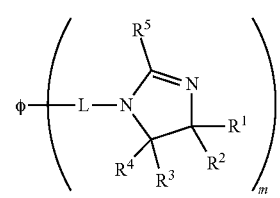

In Formula (ETM-16-1) and Formula (ETM-16-2),

φ is an m-valent group derived from an aromatic hydrocarbon having 6 to 40 carbons or an m-valent group derived from an aromatic heterocycle having 2 to 40 carbons, and at least one hydrogen of p may be replaced with an alkyl having 1 to 6 carbons, a cycloalkyl having 3 to 14 carbons, an aryl having 6 to 18 carbons or a heteroaryl having 2 to 18 carbons.

In Formula (ETM-16-1), Y are each independently —O—, —S— or >N—Ar. Ar is an aryl having 6 to 12 carbons or a heteroaryl having 2 to 12 carbons, and at least one hydrogen in Ar may be replaced with an alkyl having 1 to 4 carbons, a cycloalkyl having 5 to 10 carbons, an aryl having 6 to 12 carbons or a heteroaryl having 2 to 12 carbons.

In Formula (ETM-16-1), $R^1$ to $R^4$ are each independently hydrogen, alkyl having 1 to 4 carbons, cycloalkyl having 5 to 10 carbons, provided that $R^1$ and $R^2$ are identical, and $R^3$ and $R^4$ are identical.

In Formula (ETM-16-2), $R^1$ to $R^5$ are each independently hydrogen, alkyl having 1 to 4 carbons, cycloalkyl having 5 to 10 carbons, provided that $R^1$ and $R^2$ are identical, and $R^3$ and $R^4$ are identical.

In Formula (ETM-16-1) and Formula (ETM-16-2),

L are each independently selected from the group consisting of a divalent group represented by the following formula (L-1) and a divalent group represented by the following Formula (L-2).

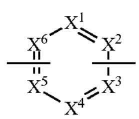

(L-1)

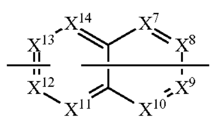

(L-2)

In Formula (L-1), $X^1$ to $X^6$ are each independently $=CR^6—$ or $=N—$, at least two of $X^1$ to $X^6$ are $=CR^6—$, $R^6$ in the two $=CR^6—$ of X to $X^6$ is the site that binds to p or azoline ring, and each $R^6$ in the other $=CR^6—$ is hydrogen, In Formula (L-2), $X^7$ to $X^{14}$ are each independently $=CR^6—$ or $=N—$, at least two of $X^7$ to $X^{14}$ are $=CR^6—$, $R^6$ in the two $=CR^6—$ of $X^7$ to $X^{14}$ is the site that binds to p or azoline ring, and each $R^6$ in the other $=CR^6—$ is hydrogen, at least one hydrogen of L may be replaced with an alkyl having 1 to 4 carbons, a cycloalkyl having 5 to 10 carbons, an aryl having 6 to 10 carbons or a heteroaryl having 2 to 10 carbons, m is an integer from 1 to 4, and when m is 2 to 4, the groups formed between the azoline ring and L may be the same or different, and at least one hydrogen in the compound represented by Formula (ETM-16-1) or Formula (ETM-16-2) may be replaced with deuterium.

Preferably, φ is selected from the group consisting of a monovalent group represented by the following Formulas (φ 1-1) to (φ 1-18), a divalent group represented by the following Formulas (φ 2-1) to (φ 2-34), a trivalent group represented by the following Formulas (φ 3-1) to (φ 3-3), and a tetravalent group represented by the following Formulas (φ 4-1) to (φ 4-2). at least one of hydrogens of φ may be replaced with an alkyl having 1 to 6 carbons, a cycloalkyl having 3 to 14 carbons, an aryl having 6 to 18 carbons, a heteroaryl having 2 to 18 carbons.

(ϕ1-1)

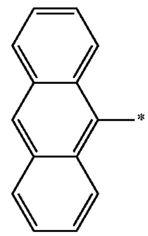

(ϕ1-2)

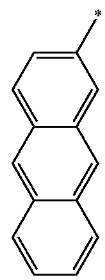

(ϕ1-3)

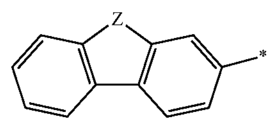

(ϕ1-4)

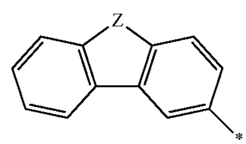

(ϕ1-5)

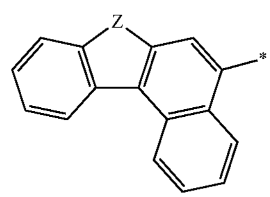

(ϕ1-6)

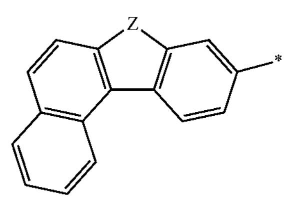

(ϕ1-7)

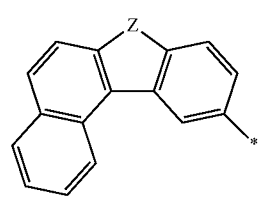

(ϕ1-8)

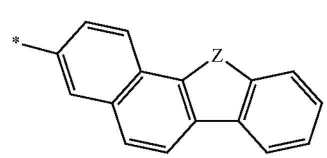

-continued
(φ1-9)
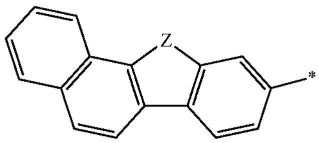
(φ1-10)
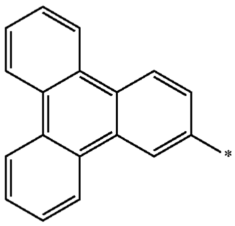
(φ1-11)
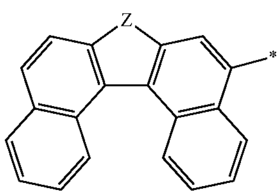
(φ1-12)
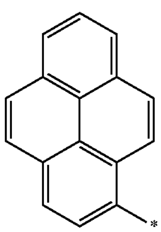
(φ1-13)
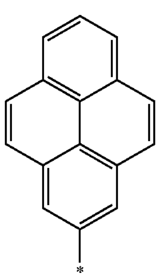
(φ1-14)
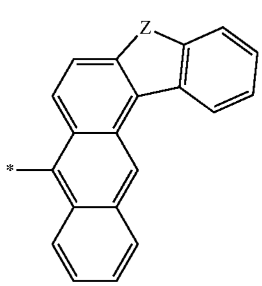
-continued
(φ1-15)
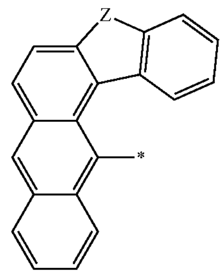
(φ1-16)
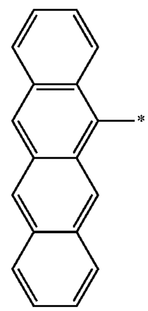
(φ1-17)
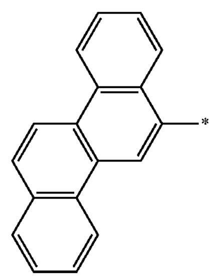
(φ1-18)
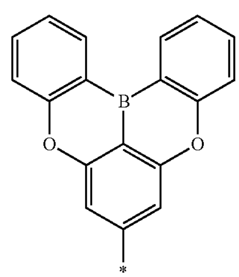
(φ2-1)
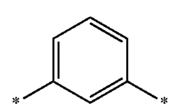
(φ2-2)
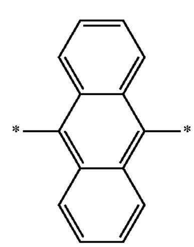

-continued
(φ2-3)
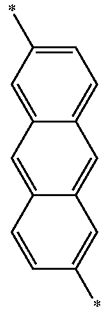
(φ2-4)
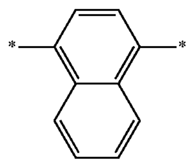
(φ2-5)
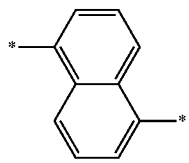
(φ2-6)
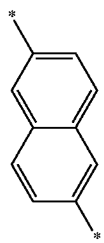
(φ2-7)
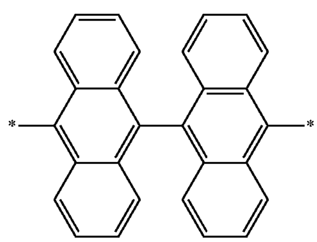
(φ2-8)
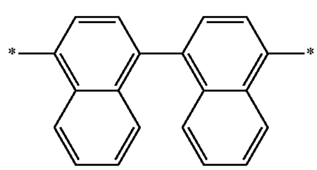
(φ2-9)
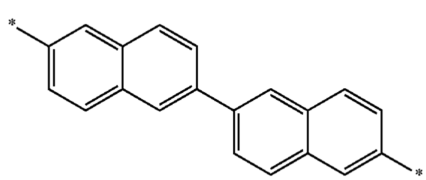
(φ2-10)
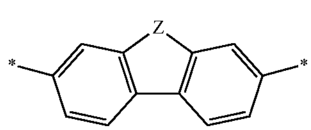
-continued
(φ2-11)
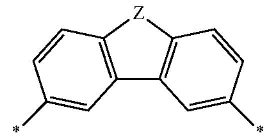
(φ2-12)
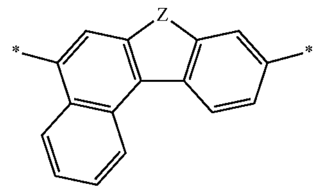
(φ2-13)
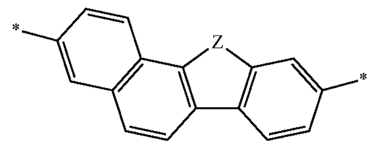
(φ2-14)
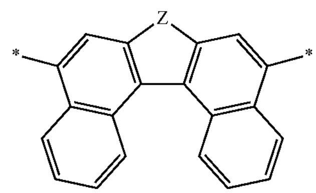
(φ2-15)
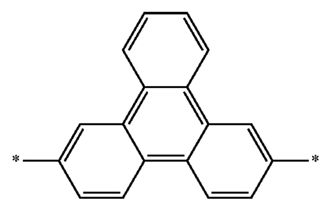
(φ2-16)
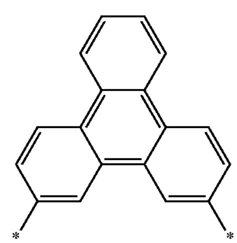
(φ2-17)
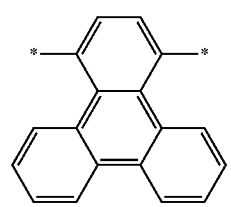
(φ2-18)
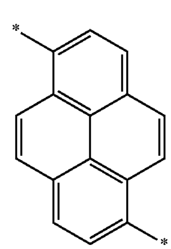

-continued
(φ2-19)
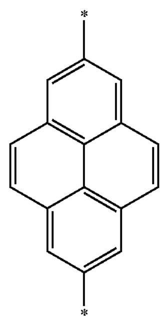
(φ2-20)
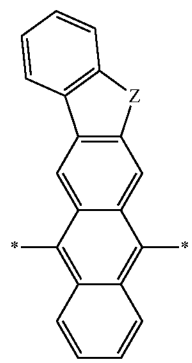
(φ2-21)
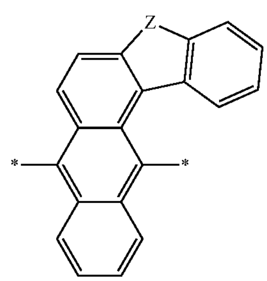
(φ2-22)
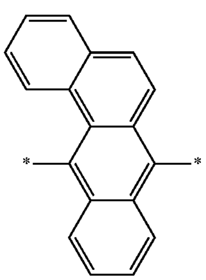
(φ2-23)
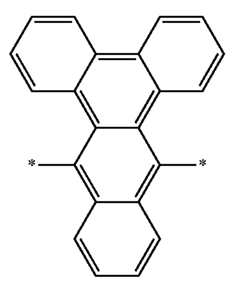
-continued
(φ2-24)
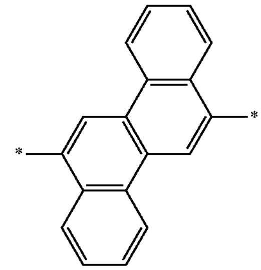
(φ2-25)
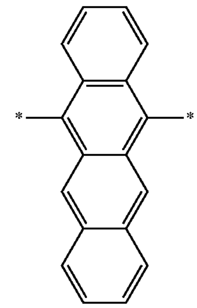
(φ2-26)
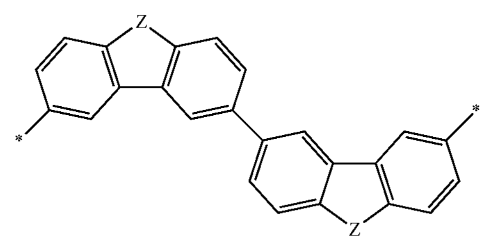
(φ2-27)
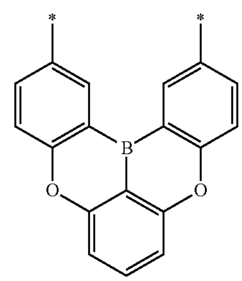
(φ2-28)
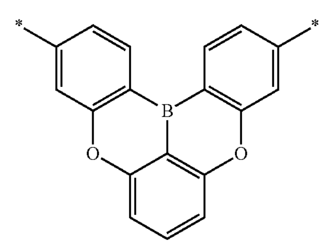
(φ2-29)
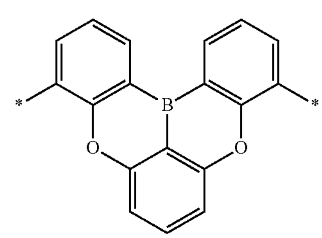

(φ2-30)

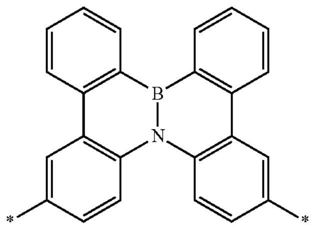

(φ2-31)

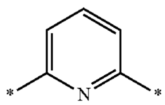

(φ2-32)

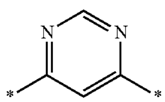

(φ2-33)

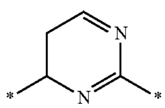

(φ2-34)

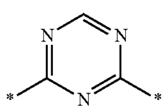

(φ3-1)

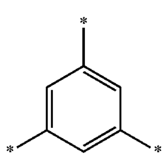

(φ3-2)

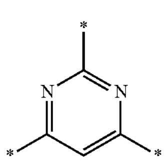

(φ3-3)

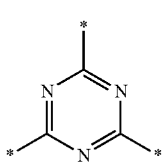

(φ4-1)

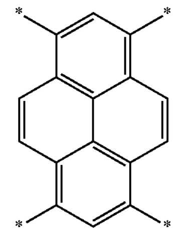

(φ4-2)

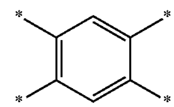

Z in the formula is >$CR_2$, >N—Ar, >N-L, —O— or —S—, R in >$CR_2$ are each independently an alkyl having 1 to 4 carbons, a cycloalkyl having 5 to 10 carbons, an aryl having 6 to 12 carbons, or a heteroaryl having 2 to 12 carbons, R may be bonded to each other to form a ring, Ar in >N—Ar is an aryl having 6 to 12 carbons or a heteroaryl having 2 to 12 carbons, and L in >N-L is L in Formula (ETM-16), Formula (ETM-16-1), or Formula (ETM-16-2). In the formula, * represents a binding position.

Preferably, L is a divalent group of a ring selected from the group consisting of benzene, naphthalene, pyridine, pyrazine, pyrimidine, pyridazine, triazine, quinoline, isoquinoline, naphthyridine, phthalazine, quinoxaline, quinazoline, cinnoline, and pteridine, wherein at least one hydrogen in L may be replaced with an alkyl having 1 to 4 carbons, a cycloalkyl having 5 to 10 carbons, an aryl having 6 to 10 carbons or a heteroaryl having 2 to 10 carbons.

Preferably, Ar in >N—Ar as Y or Z is selected from the group consisting of phenyl, naphthyl, pyridinyl, pyrazinyl, pyrimidinyl, pyridazinyl, triazinyl, quinolinyl, isoquinolinyl, naphthyridinyl, phthalazinyl, quinoxalinyl, quinazolinyl, cinnolinyl, and pteridinyl, wherein at least one hydrogen in Ar in >N—Ar as Y may be replaced with an alkyl having 1 to 4 carbons, a cycloalkyl having 5 to 10 carbons or an aryl having 6 to 10 carbons.

Preferably, $R^1$ to $R^4$ are each independently hydrogen, an alkyl having 1 to 4 carbons or a cycloalkyl having 5 to 10 carbons, wherein $R^1$ and $R^2$ are identical, $R^3$ and $R^4$ are identical, and not all of $R^1$ to $R^4$ are simultaneously hydrogen, and when m is 1 or 2 and m is 2, the groups formed by the azoline ring and L are identical.

Specific examples of azoline derivative include compounds described below. "Me" in the structural formula represents methyl.

ETM-16-(1)
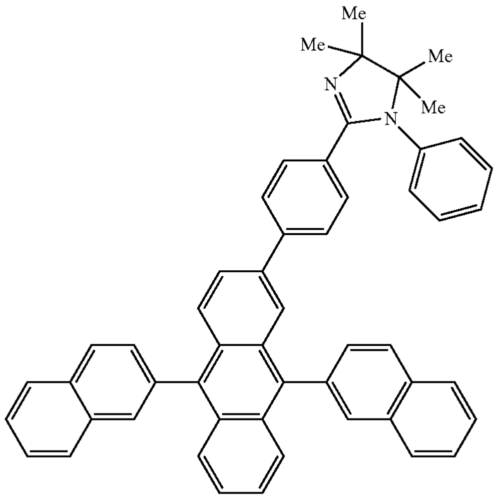
ETM-16-(2)
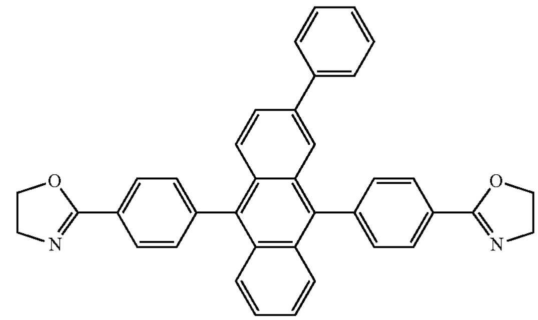
ETM-16-(3)
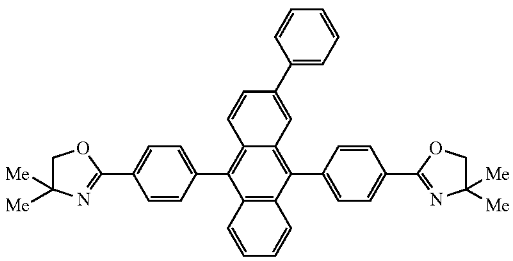
ETM-16-(4)
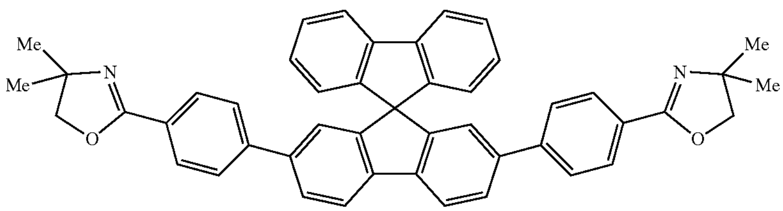
ETM-16-(5)
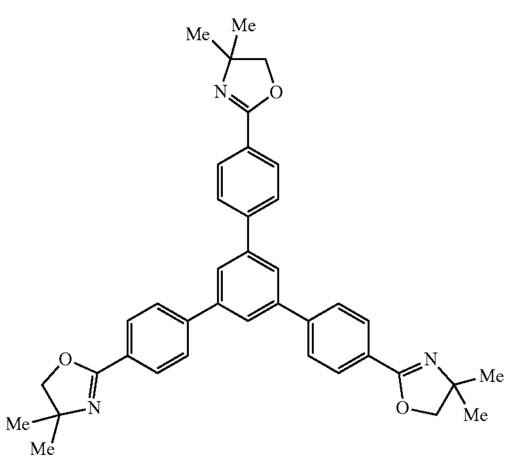
ETM-16-(6)
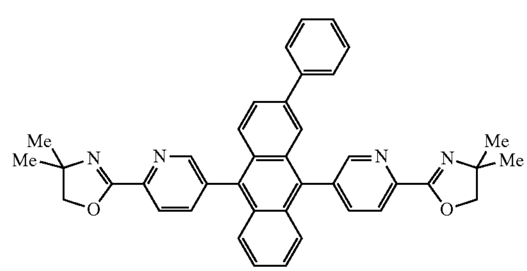

-continued
ETM-16-(7)
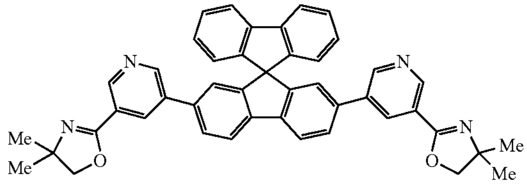
ETM-16-(8)
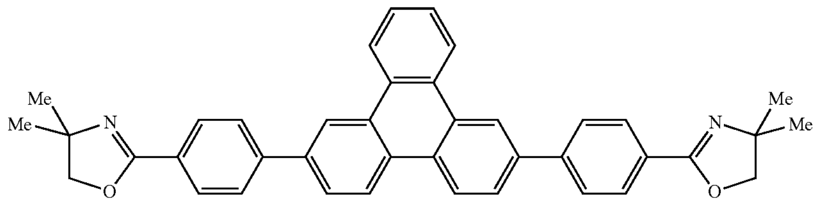
ETM-16-(9)
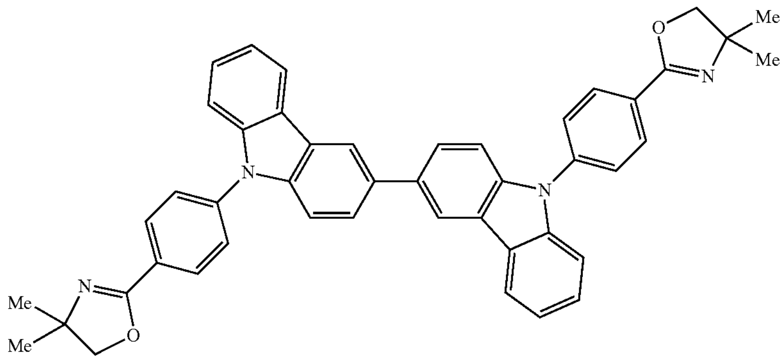
ETM-16-(10)
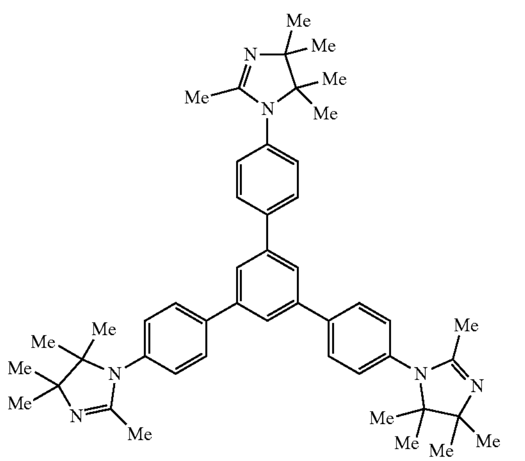
More preferably, φ is selected from the group consisting of divalent groups represented by Formulae (φ 2-1), (φ 2-31), (φ 2-32), (φ 2-33) and (φ 2-34) below, wherein at least one hydrogen in φ may be replaced with an aryl having 6 to 18 carbons. A position "*" in the following formulas represents a bonding position.
(ϕ2-1)
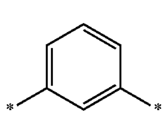
-continued
(ϕ2-31)
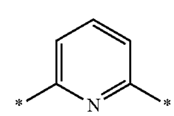
(ϕ2-32)
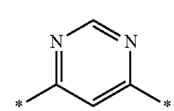
(ϕ2-33)
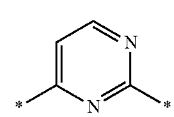

-continued (ϕ2-34)

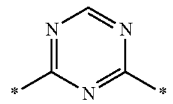

L is a divalent group of a ring selected from the group consisting of benzene, pyridine, pyrazine, pyrimidine, pyridazine, and triazine, wherein at least one hydrogen of L may be replaced with an alkyl having 1 to 4 carbons, a cycloalkyl having 5 to 10 carbons, an aryl having 6 to 10 carbons or a heteroaryl having 2 to 14 carbons, Ar in >N—Ar as Y is selected from the group consisting of phenyl, pyridinyl, pyrazinyl, pyrimidinyl, pyridazinyl, and triazinyl, wherein at least one hydrogen in Ar may be replaced with an alkyl having 1 to 4 carbons, a cycloalkyl having 5 to 10 carbons or an aryl having 6 to 10 carbons, $R^1$ to $R^4$ are each independently hydrogen, alkyl with 1 to 4 carbons, or cycloalkyl with 5 to 10 carbons, provided that $R^1$ and $R^2$ are identical, $R^3$ and $R^4$ are identical, and not all of R, to $R^4$ are simultaneously hydrogen, m is 2, and the group formed by the azoline ring and L are identical.

Additional specific examples of the azoline derivative include compounds described below. "Me" in the structural formula represents methyl.

ETM-16-(11)

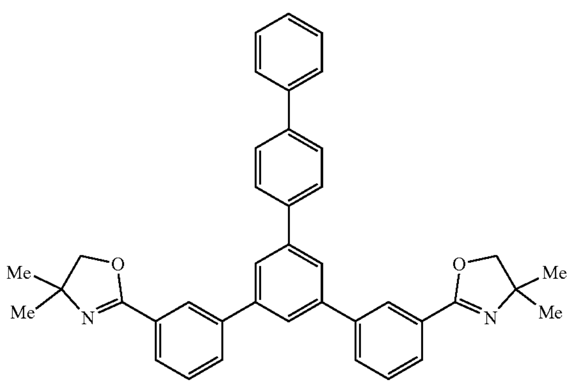

ETM-16-(12)

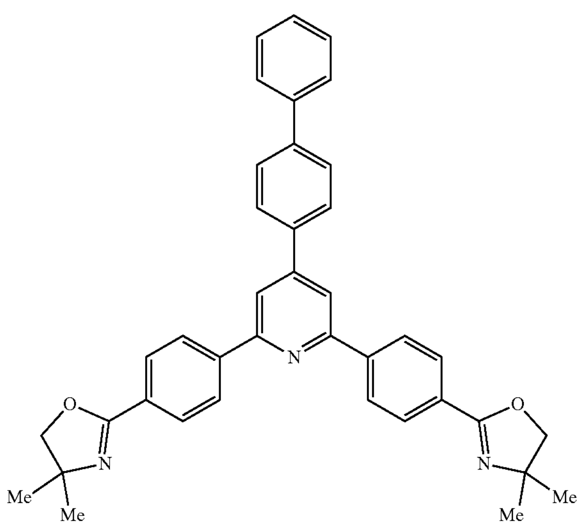

-continued

ETM-16-(13)

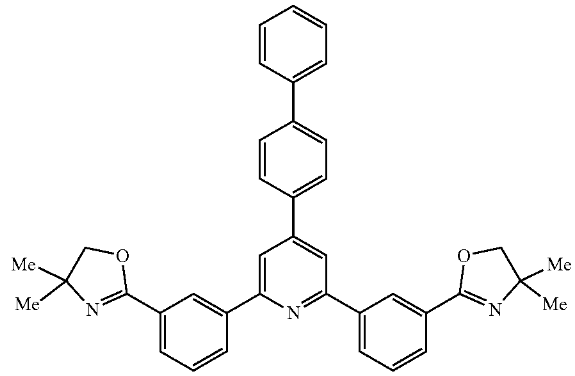

ETM-16-(14)

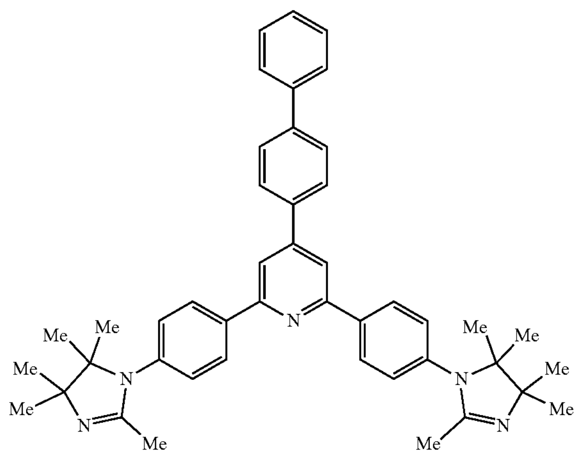

ETM-16-(15)

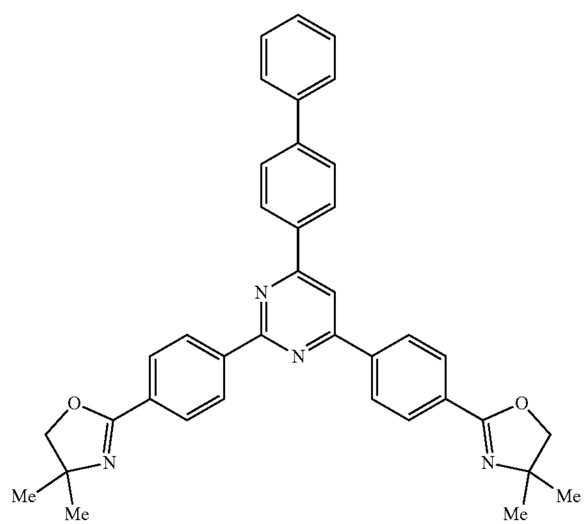

-continued

ETM-16-(16)

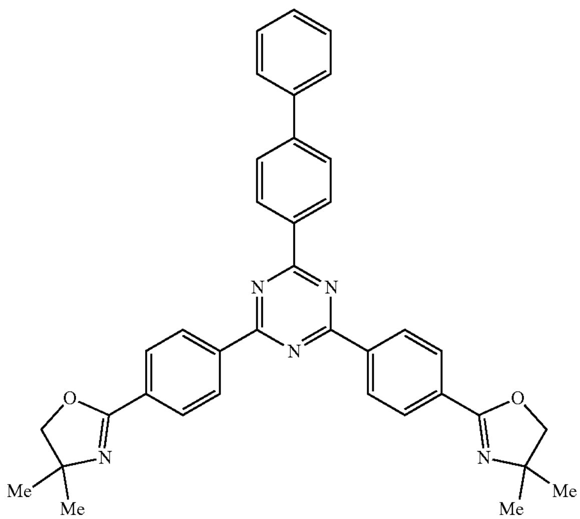

For details of the alkyl, cycloalkyl, aryl or heteroaryl in each of the above formulas defining the azoline derivative, the description in Formula (1A) and Formula (1B) can be quoted.

The azoline derivative can be produced by using a publicly known raw material and a publicly known synthesis method.

<Reducing Substance>

The electron transport layer or the electron injection layer further includes a substance that can reduce a material forming the electron transport layer or the electron injection layer. Various substances are used as the reducing substance if the substance has predetermined reducing properties. For example, at least one selected from the group of alkali metal, alkaline earth metal, rare earth metal, an oxide of alkali metal, a halide of alkali metal, an oxide of alkaline earth metal, a halide of alkaline earth metal, an oxide of rare earth metal, a halide of rare earth metal, an organic complex of alkali metal, an organic complex of alkaline earth metal and an organic complex of rare earth metal can be preferably used.

Specific examples of the preferred reducing substance include alkali metal such as Na (work function: 2.36 eV), K (work function: 2.28 eV), Rb (work function: 2.16 eV) or Cs (work function 1.95 eV), and alkaline earth metal such as Ca (work function: 2.9 eV), Sr (work function: 2.0 to 2.5 eV) or Ba (work function: 2.52 eV), and a substance having a work function of 2.9 eV or less is particularly preferred. Among the above substances, as the reducing substance, alkali metal of K, Rb or Cs is preferred, Rb or Cs is further preferred, and Cs is most preferred. The above alkali metals have particularly high reduction capability, and improvement in luminance and extension of a service life in the organic EL element can be achieved by adding a relatively small amount thereof to the material forming the electron transport layer or the electron injection layer. Moreover, as the reducing substance having a work function of 2.9 eV or less, a combination of two or more kinds of alkali metals is preferred, and a combination including Cs, for example, a combination of Cs and Na, Cs and K, Cs and Rb, or Cs and Na and K is particularly preferred. The reduction capability can be efficiently exhibited by containing Cs, and improvement in luminance and extension of a service life in the organic EL element can be achieved by adding Cs to the material forming the electron transport layer or the electron injection layer.

The material for an electron injection layer and the material for an electron transport layer described above can also be used for a material for an electron layer as a polymer compound obtained by polymerizing a reactive compound in which a reactive substituent is substituted on these as a monomer, or a crosslinked polymer thereof, or a pendant polymer compound obtained by reacting a main chain type polymer with the reactive compound, or a pendant-type crosslinked polymer thereof. As the reactive substituent in this instance, an explanation for the polycyclic aromatic compound consisting of a substructure represented by Formula (1A) and at least two substructures represented by Formula (1B) can be referred to.

Details of the application of such polymer compound and crosslinked polymer will be described later.

3-1-7. Cathode in Organic Electroluminescent Element

Cathode 108 plays a role of injecting electrons into light-emitting layer 105 through electron injection layer 107 and electron transport layer 106.

A material forming cathode 108 is not particularly limited, as long as the material can efficiently inject electrons into an organic layer, and a material similar to the material forming anode 102 can be used. Particularly, metal such as tin, indium, calcium, aluminum, silver, copper, nickel, chromium, gold, platinum, iron, zinc, lithium, sodium, potassium, cesium and magnesium, or alloy thereof (such as magnesium-silver alloy, magnesium-indium alloy and aluminum-lithium alloy such as lithium fluoride/aluminum), or the like is preferred. In order to enhance electron injection efficiency to improve device characteristics, lithium, sodium, potassium, cesium, calcium, magnesium, or alloy containing the above low-work-function metals is effective. However, the above low-work-function metals are generally unstable in atmospheric air in many cases. In order to improve the above point, a method of doping a small amount of lithium, cesium and magnesium to an organic layer, and using an electrode having high stability is known, for example. As other dopants, inorganic salt such as lithium fluoride, cesium fluoride, lithium oxide and cesium oxide can also be used, but not limited thereto.

Further, preferred examples for protecting the electrode include lamination of metals such as platinum, gold, silver, copper, iron, tin, aluminum and indium, alloy using the above metals, inorganic substances such as silica, titania and silicon nitride, polyvinyl alcohol, polyvinyl chloride, a hydrocarbon-based polymer compound, or the like. A method of preparing the above electrodes is not particularly limited, as long as conduction, such as resistance heating, electron beam vapor deposition, sputtering, ion plating and coating, can be achieved.

3-1-8. Binding Agent that May be Used in Each Layer

The above materials used for the hole injection layer, the hole transport layer, the light-emitting layer, the electron transport layer and the electron injection layer can form each layer alone, but can also be dispersed and used, as a polymer binding agent, in a solvent-soluble resin such as polyvinyl chloride, polycarbonate, polystyrene, poly(N-vinylcarbazole), polymethylmethacrylate, polybutylmethacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin and a polyurethane resin; or a curable resin such as a phenolic resin, a xylene resin, a petroleum resin, a urea resin, a melamine resin, an unsaturated polyester resin, an alkyd resin, an epoxy resin and a silicone resin.

3-1-9. Production Method for Organic Electroluminescent Element

The layers constituting the organic EL element can be formed each as a thin film of a material to constitute each layer, according to a vapor deposition method, a low resistance vapor deposition method, an electron beam vapor deposition method, a sputtering method, a molecular lamination method, a printing method, a spin coating method, a casting method or a coating method. The thickness of each layer thus formed in the manner is not specifically limited and can be appropriately set depending on the properties of the material. In general, the thickness falls within a range of 2 nm to 5000 nm. The film thickness can be measured generally according to a crystal oscillation-type thickness meter. In the case where a thin film is formed according to a vapor deposition method, the deposition condition varies depending on the kind of the material, and the crystal structure and the association structure intended for the film. In general, it is preferable to appropriately set the vapor deposition conditions in the ranges of a heating temperature for the boat for deposition of +50 to +400° C., a degree of vacuum of $10^{-6}$ to $10^{-3}$ Pa, a rate of deposition of 0.01 to 50 nm/sec, a substrate temperature of −150 to +300° C., and a film thickness of 2 nm to 5 μm.

In a case where a direct current voltage is applied to the organic electroluminescent element thus obtained, it is only required to apply the voltage by assuming a positive electrode as a positive polarity and assuming a negative electrode as a negative polarity. By applying a voltage of about 2 to 40 V, light emission can be observed from a transparent or semitransparent electrode side (the positive electrode or the negative electrode, or both the electrodes). Furthermore, this organic EL element also emits light even in a case where a pulse current or an alternating current is applied. A waveform of an alternating current applied may be any waveform.

Next, as one example of a method for producing an organic electroluminescent element, a production method for an organic electroluminescent element having a layer configuration of an anode/a hole injection layer/a hole transport layer/a light-emitting layer containing a host material and a dopant material/an electron transport layer/an electron injection layer/a cathode is described.

<Vapor Deposition Method>

On an appropriate substrate, a thin film of an anode material is formed according to a vapor deposition method to be an anode, and on the anode, thin films of a hole injection layer and a hole transport layer are formed. On this, a host material and a dopant material are co-deposited to form a thin film to be a light-emitting layer, then on the light-emitting layer, an electron transport layer and an electron injection layer are formed, and further a thin film of a cathode substance is formed according to a vapor deposition method to be a cathode, thereby providing an intended organic EL element. In production of the organic EL element, the process order may be reversed to form the layers in reverse order of a cathode, an electron injection layer, an electron transport layer, a light-emitting layer, a hole transport layer, a hole injection layer and an anode.

<Wet Film Forming Method>

The wet film forming method is carried out by preparing a low molecular weight compound capable of forming each organic layer of an organic EL element as a liquid organic layer forming composition and using the composition. When there is no suitable organic solvent for dissolving this low molecular weight compound, a composition for forming an organic layer may be prepared from a polymer compound made through polymerization of the low molecular weight compound together with another monomer having a soluble function or a main chain type polymer as a reactive compound in which a reactive substituent is substituted for the low molecular weight compound.

In the wet film formation method, generally, a coating film is formed through an applying step of applying an organic layer-forming composition onto a substrate and a drying step of removing a solvent from the applied organic layer-forming composition. According to a difference in the applying step, a method using a spin coater is referred to as a spin coating method, a method using a slit coater is referred to as a slit coating method, a method using a plate is referred to gravure, offset, reverse offset, and flexographic printing methods, a method using an ink jet printer is referred to as an inkjet method, and a method for spraying the composition is referred to as a spraying method.

As an example, with reference to FIG. 2, a method for forming a coating film on a substrate having a bank by an ink jet method will be described. First, a bank (200) is provided on an electrode (120) on a substrate (110). In this case, a coating film (130) can be manufactured by dropping an ink droplet (310) between the banks (200) from an inkjet head (300) and drying the ink droplet (310). If this process is repeated, a subsequent coating film (140) and a light emitting layer (150) are manufactured, and an electron transport layer, an electron injection layer, and an electrode are formed by a vacuum deposition method, an organic EL element in which a light emitting part is partitioned by a bank material can be manufactured.

Examples of the drying step include methods of air drying, heating, and drying under reduced pressure. The drying step may be performed only once or may be performed a plurality of times using different methods and conditions. Furthermore, different methods may be used in combination like calcination under reduced pressure.

The wet film formation method is a film formation method using a solution, and includes, for example, a certain type of a printing method (inkjet method), a spin coating method, a casting method, or a coating method. Different from a vacuum deposition method, the wet film formation method need not to use an expensive vacuum deposition apparatus and can form a film in air. In addition, the wet film formation method enables continuous production of large area films, and therefore can reduce production cost.

On the other hand, as compared with a vacuum deposition method, lamination may be difficult in the wet film formation method. In the case where a laminate film is produced according to the wet film formation method, the under layer needs to be prevented from being dissolved by the composition of the upper layer, and therefore, in the case, a solubility-controlled composition, as well as underlayer crosslinking and orthogonal solvents (solvents not dissolving each other) are used appropriately. However, even though such techniques are used, the wet film formation method will be still difficult in formation of all films by coating in some cases.

Accordingly, in general, an organic EL element is produced according to a method of forming some layers in a wet film formation method and forming the remaining layers in a vacuum deposition method.

For example, a process of producing an organic EL element partly using a wet film formation method is described below.

(Step 1) Film formation for an anode by a vacuum deposition method (Step 2) Film formation of a hole injection layer forming composition containing a material for a hole injection layer by a wet film formation method (Step 3) Film formation of a hole transport layer forming composition containing a material for a hole transport layer by a wet film formation method (Step 4) Film formation of a light-emitting layer forming composition containing a host material and a dopant material by a wet film formation method (Step 5) Film formation for an electron transport layer by a vacuum deposition method (Step 6) Film formation for an electron injection layer by a vacuum deposition method (Step 7) Film formation for a cathode by a vacuum deposition method According to the process, an organic EL element composed of an anode/a hole injection layer/a hole transport layer/a light-emitting layer formed of a host material and a dopant material/an electron transport layer/an electron injection layer/cathode is produced.

Of course, the electron transport layer and the electron injection layer may be formed by a wet film forming method using a layer forming composition containing a material for an electron transport layer and a material for an electron injection layer, respectively. At that time, it is preferable to use a means for preventing dissolution of the light-emitting layer in the lower layer or a means for forming a film from the cathode side contrary to the above procedure.

<The Other Method for Film Formation>

For film formation of the organic layer-forming composition, a laser heating drawing method (LITI) can be used. LITI is a method for heating and depositing a compound attached to a base material with a laser, and the organic layer-forming composition can be used for a material to be applied to a base material.

<Optional Step>

An appropriate treatment step, washing step, and drying step may be appropriately performed before and after each of the steps of film formation. Examples of the treatment step include an exposure treatment, a plasma surface treatment, an ultrasonic treatment, an ozone treatment, a washing treatment using a suitable solvent, and a heat treatment. Examples of the treatment step further include a series of steps for manufacturing a bank.

A photolithography technique can be used for manufacturing a bank. As a bank material that can be used for photolithography, a positive resist material and a negative resist material can be used. A patternable printing method such as an ink jet method, gravure offset printing, reverse offset printing, or screen printing can also be used. In this case, a permanent resist material can also be used.

Examples of a material used for a bank include a polysaccharide and a derivative thereof, a homopolymer and a copolymer of a hydroxyl-containing ethylenic monomer, a biopolymer compound, a polyacryloyl compound, polyester, polystyrene, polyimide, polyamideimide, polyetherimide, polysulfide, polysulfone, polyphenylene, polyphenyl ether, polyurethane, epoxy (meth)acrylate, melamine (meth)acrylate, polyolefin, cyclic polyolefin, an acrylonitrile-butadiene-styrene copolymer (ABS), a silicone resin, polyvinyl chloride, chlorinated polyethylene, chlorinated polypropylene, polyacetate, polynorbornene, a synthetic rubber, a fluorinated polymer such as polyfluorovinylidene, polytetrafluoroethylene, or polyhexafluoropropylene pyrene, a fluoroolefin-hydrocarbon olefin copolymer, and a fluorocarbon polymer, but are not limited thereto.

<Organic Layer-Forming Composition Used for Wet Film Formation Method>

Organic layer-forming composition is obtained by dissolving in an organic solvent a low-molecular compound that can form each organic layer of an Organic EL element or a polymer compound in which the low-molecular compound is polymerized into a high molecular weight. For example, the organic layer-forming composition includes at least one polycyclic aromatic compound (or a polymer compound thereof) as a first component; at least one host material as a second component; and at least one organic solvent as a third component. The first component functions as a dopant component of a light emitting layer obtained from the composition, and the second component functions as a host component of the light emitting layer. The third component functions as a solvent for dissolving the first component and the second component in the composition. At the time of application, the third component provides a smooth and uniform surface shape due to a controlled evaporation rate of the third component itself.

<Organic Solvent>

The organic layer-forming composition contains at least one organic solvent. By controlling an evaporation rate of an organic solvent at the time of film formation, it is possible to control and improve film formability, presence or absence of defects in a coating film, surface roughness, and smoothness. At the time of film formation using an ink jet method, by controlling meniscus stability at a pinhole of an ink jet head, ejection performance can be controlled and improved. In addition, by controlling a drying speed of a film and orientation of a derivative molecule, it is possible to improve electrical characteristics, luminescence characteristics, efficiency, and a lifetime of an organic EL element having an organic layer obtained from the organic layer-forming composition.

(1) Physical Properties of Organic Solvent

The boiling point of at least one organic solvent is from 130° C. to 300° C., more preferably from 140° C. to 270° C., and still more preferably from 150° C. to 250° C. A case where the boiling point is higher than 130° C. is preferable from a viewpoint of ink jet ejection performance. A case where the boiling point is lower than 300° C. is preferable from a viewpoint of defects in a coating film, surface roughness, a residual solvent, and smoothness. The third component more preferably contains two or more kinds of organic solvents from a viewpoint of good ink jet ejection performance, film formability, smoothness, and the small amount of a residual solvent. Meanwhile, in some cases, in consideration of transportability and the like, the third component may be a solid composition obtained by removing a solvent from the organic layer-forming composition.

Furthermore, a particularly preferable configuration is that the third component contains a good solvent (GS) and a poor solvent (PS) for the host material of the second component, and the boiling point ($BP_{GS}$) of the good solvent (GS) is lower than the boiling point ($BP_{PS}$) of the poor solvent (PS).

By adding a poor solvent having a high boiling point, a good solvent having a low boiling point is volatilized earlier at the time of film formation, and the concentration of contents in the composition and the concentration of the poor solvent are increased to promote prompt film formation. As a result, a coating film having few defects, less surface roughness, and high smoothness can be obtained.

A difference insolubility ($S_{GS}$–$S_{PS}$) is preferably 1% or more, more preferably 3% or more, and still more preferably 5% or more. A difference in boiling point ($BP_{PS}$–$BP_{GS}$) is preferably 10° C. or more, more preferably 30° C. or more, and still more preferably 50° C. or more.

After the film formation, an organic solvent is removed from a coating film through a drying step such as evacuation, reduction in pressure, or heating. In a case of heating, heating is preferably performed at a glass transition temperature (Tg) of the first component +30° C. or lower from a viewpoint of improving coating film formability. Heating is preferably performed at a glass transition point (Tg) of the first component −30° C. or higher from a viewpoint of reducing a residual solvent. Even when the heating temperature is lower than the boiling point of an organic solvent, the organic solvent is sufficiently removed because the film is thin. Drying may be performed a plurality of times at different temperatures, or a plurality of drying methods may be used in combination.

(2) Specific Examples of Organic Solvent

Examples of an organic solvent used in the organic layer-forming composition include an alkylbenzene-based solvent, a phenyl ether-based solvent, an alkyl ether-based solvent, acyclic ketone-based solvent, an aliphatic ketone-based solvent, a monocyclic ketone-based solvent, a solvent having a diester skeleton, and a fluorine-containing solvent. Specific examples thereof include pentanol, hexanol, heptanol, octanol, nonanol, decanol, undecanol, dodecanol, tetradecanol, hexan-2-ol, heptan-2-ol, octan-2-ol, decan-2-ol, dodecan-2-ol, cyclohexanol, α-terpineol, β-terpineol, γ-terpineol, δ-terpineol, terpineol (mixture), ethylene glycol monomethyl ether acetate, propylene glycol monomethyl ether acetate, diethylene glycol dimethyl ether, dipropylene glycol dimethyl ether, diethylene glycol ethyl methyl ether, diethylene glycol isopropyl methyl ether, dipropylene glycol monomethyl ether, diethylene glycol diethyl ether, diethylene glycol monomethyl ether, diethylene glycol butyl methyl ether, tripropylene glycol dimethyl ether, triethylene glycol dimethyl ether, diethylene glycol monobutyl ether, ethylene glycol monophenyl ether, triethylene glycol monomethyl ether, diethylene glycol dibutyl ether, triethylene glycol butyl methyl ether, polyethylene glycol dimethyl ether, tetraethylene glycol dimethyl ether, p-xylene, m-xylene, o-xylene, 2,6-lutidine, 2-fluoro-m-xylene, 3-fluoro-o-xylene, 2-chlorobenzo trifluoride, cumene, toluene, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, mesitylene, 1,2,4-trimethylbenzene, t-butylbenzene, 2-methylanisole, phenetole, benzodioxole, 4-methylanisole, s-butylbenzene, 3-methylanisole, 4-fluoro-3-methylanisole, cymene, 1,2,3-trimethylbenzene, 1,2-dichlorobenzene, 2-fluorobenzonitrile, 4-fluorobellaterol, 2,6-dimethylanisole, n-butylbenzene, 3-fluorobenzonitrile, decalin (decahydronaphthalene), neopentylbenzene, 2,5-dimethylanisole, 2,4-dimethylanisole, benzonitrile, 3,5-dimethylanisole, diphenyl ether, 1-fluoro-3,5-dimethoxybenzene, methyl benzoate, isopentylbenzene, 3,4-dimethylanisole, o-tolunitrile, n-amylbenzene, veratrole, 1,2,3,4-tetrahydronaphthalene, ethyl benzoate, n-hexylbenzene, propyl benzoate, cyclohexylbenzene, 1-methylnaphthalene, butyl benzoate, 2-methylbiphenyl, 3-phenoxytoluene, 2,2'-vitrile, dodecylbenzene, dipentylbenzene, tetramethylbenzene, trimethoxy benzene, trimethoxytoluene, 2,3-dihydrobenzofuran, 1-methyl-4-(propoxymethyl) benzene, 1-methyl-4-(butyloxymethyl) benzene, 1-methyl-4-(pentyloxymethyl) benzene, 1-methyl-4-(hexyloxymethyl) benzene, 1-methyl-4-(heptyloxymethyl) benzenebenzyl butyl ether, benzyl pentyl ether, benzyl hexyl ether, benzyl heptyl ether, and benzyl octyl ether, but are not limited thereto. Furthermore, these solvents may be used singly or in a mixture thereof.

<Optional Component>

The organic layer-forming composition may contain an optional component as long as properties thereof are not impaired. Examples of an optional component include a binder and a surfactant.

(1) Binder

The organic layer-forming composition may contain a binder. The binder forms a film at the time of film formation, and bonds the obtained film to a substrate. The binder also plays a role of dissolving, dispersing, and binding other components in the organic layer-forming composition.

Examples of a binder used in the organic layer-forming composition include an acrylic resin, polyethylene terephthalate, an ethylene-vinyl acetate copolymer, an ethylene-vinyl alcohol copolymer, an acrylonitrile-ethylene-styrene copolymer (AES) resin, an ionomer, chlorinated polyether, a diallyl phthalate resin, an unsaturated polyester resin, polyethylene, polypropylene, polyvinyl chloride, polyvinylidene chloride, polystyrene, polyvinyl acetate, Teflon, an acrylonitrile-butadiene-styrene copolymer (ABS) resin, an acrylonitrile-styrene copolymer (AS) resin, a phenol resin, an epoxy resin, a melamine resin, a urea resin, an alkyd resin, polyurethane, and a copolymer of the above resins and polymers, but are not limited thereto.

The binder used in the organic layer-forming composition may be used singly or in a mixture of a plurality of kinds thereof.

(2) Surfactant

The organic layer-forming composition may contain, for example, a surfactant for controlling film surface uniformity of the organic layer-forming composition, solvent affinity of a film surface, and liquid repellency. The surfactant is classified into an ionic surfactant and a nonionic surfactant based on the structure of a hydrophilic group and is further classified into an alkyl-based surfactant, a silicon-based surfactant, and a fluorine-based surfactant based on the structure of a hydrophobic group. The surfactant is classified into a monomolecule-based surfactant having a relatively small molecular weight and a simple structure, and a polymer-based surfactant having a large molecular weight and a side chain or a branched chain based on the structure of a molecule. The surfactant is classified into a single surfactant and a mixed surfactant obtained by mixing two or more kinds of surfactants with a base material based on the composition. As a surfactant that can be used in the organic layer-forming composition, all kinds of surfactants can be used.

Examples of the surfactant include Polyflow No. 45, Polyflow KL-245, Polyflow No. 75, Polyflow No. 90, Polyflow No. 95 (trade names, manufactured by Kyoeisha Chemical Co., Ltd.), Disperbyk 161, Disperbyk 162, Disperbyk 163, Disperbyk 164, Disperbyk 166, Disperbyk 170, Disperbyk 180, Disperbyk 181, Disperbyk 182, BYK 300, BYK 306, BYK 310, BYK 320, BYK 330, BYK 342, BYK 344, BYK 346 (trade names, manufactured by BYK Japan KK), KP-341, KP-358, KP-368, KF-96-50CS, KF-50-100CS (trade names, manufactured by Shin-Etsu Chemical Co., Ltd.), Surflon SC-101, Surflon KH-40 (trade names, manufactured by Seimi Chemical Co., Ltd.), Futargent 222F, Futargent 251, FTX-218 (trade names, manufactured by Neos Co., Ltd.), EFTOPEF-351, EFTOPEF-352, EFTOPEF-601, EFTOPEF-801, EFTOP EF-802 (trade names, manufactured by Mitsubishi Materials Corporation), Megafac F-470, Megafac F-471, Megafac F-475, Megafac R-08, Megafac F-477, Megafac F-479, Megafac F-553, Megafac F-554, (trade names, manufactured by DIC Corporation), fluoroalkyl benzene sulfonate, fluoroalkyl carboxylate, fluoroalkyl polyoxyethylene ether, fluoroalkyl ammonium iodide, fluoroalkylbetaine, fluoroalkyl sulfonate, diglycerin tetrakis(fluoroalkyl polyoxyethylene ether), a fluoroalkyl trimethyl ammonium salt, fluoroalkyl aminosulfonate, polyoxyethylene nonyl phenyl ether, polyoxyethylene octyl phenyl ether, polyoxyethylene alkyl ether, polyoxyethylene laurate, polyoxyethylene oleate, polyoxyethylene stearate, polyoxyethylene lauryl amine, sorbitan laurate, sorbitan palmitate, sorbitan stearate, sorbitan oleate, sorbitan fatty acid ester, polyoxyethylene sorbitan laurate, polyoxyethylene sorbitan palmitate, polyoxyethylene sorbitan stearate, polyoxyethylene sorbitan oleate, polyoxyethylene naphthyl ether, alkylbenzene sulfonate, and alkyl diphenyl ether disulfonate.

The surfactant may be used singly or in combination of two or more kinds thereof.

<Composition and Properties of Compositions for Forming Organic Layer>

As for the contents of the components in the organic layer-forming composition, preferably, the content of the first component is from 0.0001% by weight to 2.0% by weight with respect to the total weight of the organic layer-forming composition, the content of the second component is from 0.0999% by weight to 8.0% by weight with respect to the total weight of the organic layer-forming composition, and the content of the third component is from 90.0% by weight to 99.9% by weight with respect to the total weight of the organic layer-forming composition from a viewpoint of good solubility of the components in the organic layer-forming composition, storage stability, film formability, high quality of a coating film obtained from the organic layer-forming composition, good ejection performance in a case of using an ink jet method, and good electrical characteristics, luminescent characteristics, efficiency, and a lifetime of an organic EL element having a light emitting layer manufactured using the composition.

More preferably, the content of the first component is from 0.005% by weight to 1.0% by weight with respect to the total weight of the organic layer-forming composition, the content of the second component is from 0.095% by weight to 4.0% by weight with respect to the total weight of the organic layer-forming composition, and the content of the third component is from 95.0% by weight to 99.9% by with respect to the total weight of the organic layer-forming composition. Still more preferably, the content of the first component is from 0.05% by weight to 0.5% by weight with respect to the total weight of the organic layer-forming composition, the content of the second component is from 0.25% by weight to 2.5% by weight with respect to the total weight of the organic layer-forming composition, and the content of the third component is from 97.0% by weight to 99.7% by with respect to the total weight of the organic layer-forming composition.

The organic layer-forming composition can be manufactured by appropriately selecting and performing stirring, mixing, heating, cooling, dissolving, dispersing, and the like of the above components by a known method. After preparation, filtration, removal of gas (also referred to as degassing), an ion exchange treatment, an inert gas replacement/encapsulation treatment, and the like may be appropriately selected and performed.

The organic layer-forming composition having a high viscosity brings about good film formability and good ejection performance in a case of using an ink jet method. Meanwhile, the lower viscosity makes it easier to make a thin film. Therefore, the viscosity of the organic layer-forming composition is preferably from 0.3 mPa-s to 3 mPa-s, and more preferably from 1 mPa-s to 3 mPa-s at 25° C. In the present invention, the viscosity is a value measured using a cone plate type rotational viscometer (cone plate type).

The organic layer-forming composition having a low surface tension brings about a coating film having good film formability and no defects. Meanwhile, the organic layer-forming composition having a high surface tension brings about good ink jet ejection performance. Therefore, the surface tension of the organic layer-forming composition is preferably from 20 mN/m to 40 mN/m, and more preferably from 20 mN/m to 30 mN/m at 25° C. In the present invention, the surface tension is a value measured using a hanging drop method.

<Crosslinking Polymer Compound: Compound Represented by Formula (XLP-1)>

Next, the case in which the polymer compound described above has a crosslinking substituent will be described. Examples of such crosslinking polymer compounds include compounds represented by the following Formula (XLP-1).

$$\mathrm{ECx}\!-\!\left(\mathrm{MUx}\right)_k\!-\!\mathrm{ECx} \qquad \text{(XLP-1)}$$

In Formula (XLP-1),

MUx, ECx, and k are defined identically to MU, EC and k in Formula (H3), respectively provided that a compound represented by Formula (XLP-1) has at least one crosslinking substituent (XLS). The content of a monovalent or divalent aromatic group having the crosslinking substituent is preferably 0.1 to 80% by mass.

The content of a monovalent or divalent aromatic group having the crosslinking substituent is preferably 0.5 to 50% by mass, and more preferably 1 to 20% by mass in a molecule.

Examples of crosslinking substituents (XLS) are not limited, as long as the groups are capable of further crosslinking the polymeric compounds described above, but substituents of the following structures are preferred. In each structural formula, * indicates the bonding position.

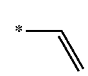
(XLS-1)

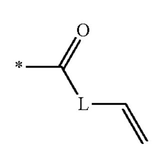
(XLS-2)

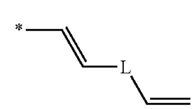
(XLS-3)

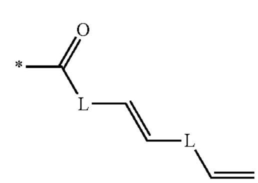
(XLS-4)

-continued (XLS-5)

(XLS-6)

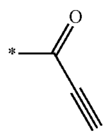

(XLS-7)

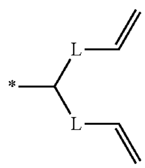

(XLS-8)

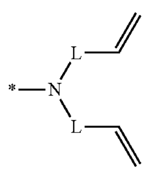

(XLS-9)

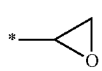

(XLS-10)

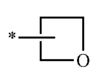

(XLS-11)

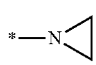

(XLS-12)

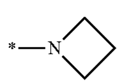

(XLS-13)

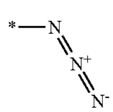

(XLS-14)

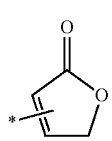

(XLS-15)

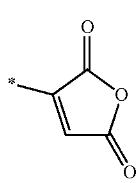

-continued (XLS-16)

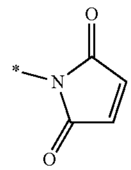

(XLS-17)

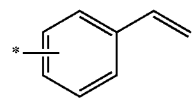

(XLS-18)

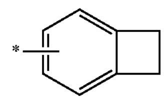

L is single bond, —O—, —S—, >C═O, —O—C(═O)—, a $C_{1-12}$ alkylene, a $C_{1-12}$ oxyalkylene, and a $C_{1-12}$ polyoxyalkylene. Among the above substituents, the substituent represented by Formula (XLS-1), Formula (XLS-2), Formula (XLS-3), Formula (XLS-9), or Formula (XLS-10), or Formula (XLS-17) is preferred, and the substituent represented by Formula (XLS-1), Formula (XLS-3) or Formula (XLS-17) is more preferred.

Examples of divalent aromatic compounds having cross-linking substituents include compounds having the following partial substructures.

(MUx-1-1)

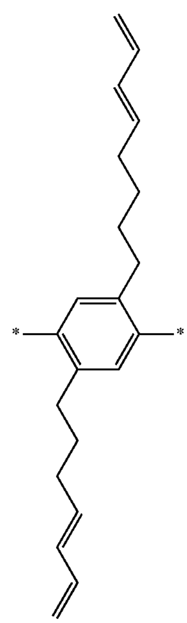

-continued
(MUx-1-2)
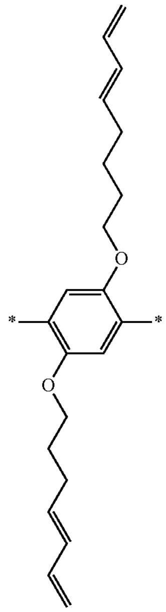
(MUx-1-3)
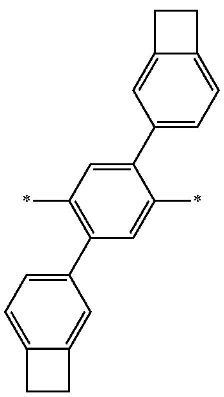
(MUx-1-4)
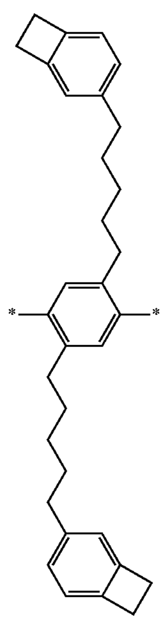
-continued
(MUx-2-1)
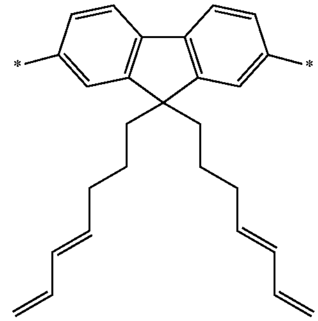
(MUx-2-2)
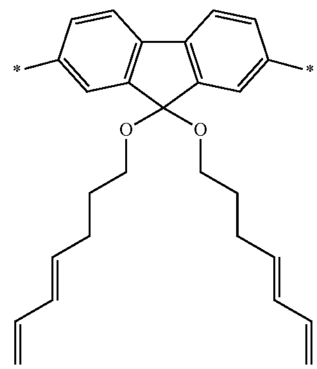
(MUx-2-3)
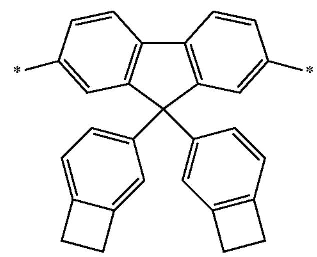
(MUx-2-4)
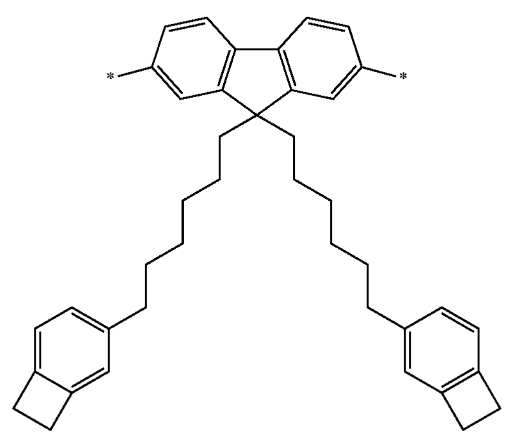

(MUx-2-5)

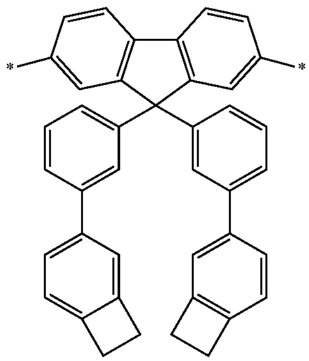

(MUx-3-1)

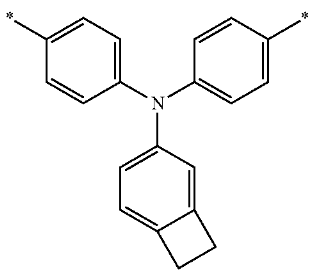

(MUx-3-2)

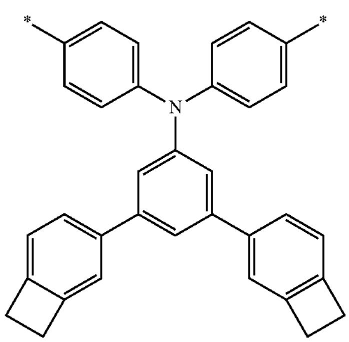

(MUx-3-3)

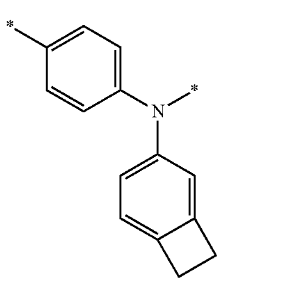

(MUx-4-1)

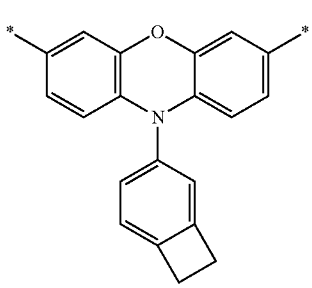

(MUx-4-2)

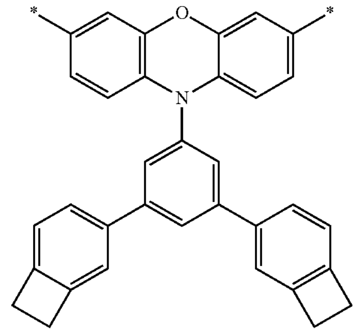

(MUx-4-3)

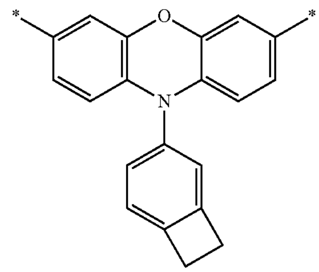

(MUx-4-4)

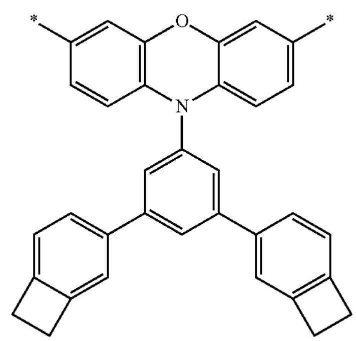

<Methods for Producing a Polymer Compound and a Cross-linking Polymer Compound>

The methods for producing polymer compounds and a crosslinking polymer compound will be described using as examples the compound represented by Formula (H3) and the compound represented by Formula (XLP-1), which are described above. These compounds may be synthesized by suitably combining some known production methods.

Examples of solvents that may be used in the reaction include aromatic solvents, saturated/unsaturated hydrocarbon solvents, alcohol solvents, ether solvents, and the like. For example, dimethoxyethane, 2-(2-methoxyethoxy)ethane, 2-(2-ethoxyethoxy)ethane, or the like may be mentioned as examples thereof.

The reaction may be performed in a two-phase system. When the reaction is performed in a two-phase system, a phase-transfer catalyst such as a quaternary ammonium salt may be optionally added.

The compounds represented by Formula (H3) and Formula (XLP-1) each may be produced in a single step or may be produced through multi-steps. In addition, the production may be performed by a batch polymerization method in which a reaction is started after all raw materials are charged in a reaction vessel, may be performed by a dropping polymerization method in which a raw material is added dropwise in a reaction vessel, or may be performed by a precipitation polymerization method in which a product precipitates as the reaction proceeds, or may be performed by appropriately combining these polymerization methods. For example, when a compound represented by Formula (H3) is synthesized in a single step, the reaction is performed in a state where a monomer with a polymerizable group attached to a monomer unit (MU) and a monomer with a polymerizable group attached to an end-capping unit (EC) are put in a reaction vessel, thereby obtaining an object product. Alternatively, when a compound represented by Formula (SPH-1) is synthesized in multi-steps, a monomer with a polymerizable group attached to a monomer unit (MU) is first polymerized to a target molecular weight, and then a monomer with a polymerizable group attached to an end-capping unit (EC) is added thereto to cause a reaction, thereby obtaining an object product. When monomers with polymerizable groups attached different types of monomer units (MUs) are added, and reactions are performed in multi-steps, a polymer having a concentration gradient with respect to monomer unit structures may be obtained. Alternatively, an object product may be obtained by first preparing a precursor polymer and then performing a subsequent reaction.

The primary structure of the polymer can be controlled by choosing the polymerizable group of the monomer. For example, as shown in Schemes 1 to 3, it is possible to synthesize polymers with a random primary structure (Scheme 1) and polymers with a regular primary structure (Scheme 2 and 3), which can be combined according to the target product. Furthermore, when monomers having three or more polymerizable groups are used, hyperbranch polymers and dendrimers can be synthesized.

a, b=MU or MUx

Polymerizable group=x, y (x and y respectively couple)

1) A Polymer Synthesized by Using Two Types of Monomers (x-a-y) and (x-b-y)

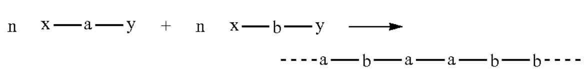

A polymer in which a and b are randomly linked is synthesized.

2) A Polymer Synthesized by Using Two Types of Monomers (x-a-x) and (y-b-y)

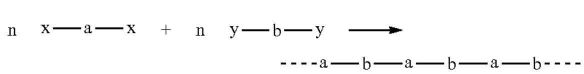

A polymer in which a and b are alternately linked is synthesized.

3) A Polymer Synthesized by Using Two Types of Monomers (x-a-y) and (y-b-y)

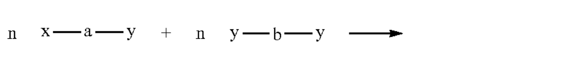

A polymer in which bs are not adjacent to each other is synthesized.

A monomer usable in the present invention may be synthesized by a method disclosed in Japanese Patent Application Publication No. 2010-189630, WO 2012/086671, WO 2013/191088, WO 2002/045184, WO 2011/049241, WO 2013/146806, WO 2005/049546, WO 2015/145871, Japanese Patent Application Publication No. 2010-215886, Japanese Patent Application Publication No. 2008-106241, Japanese Patent Application Publication No. 2010-215886, WO 2016/031639, Japanese Patent Application Publication No. 2011-174062, WO 2016/031639, WO 2016/031639, or WO 2002/045184.

Specific procedures of polymer synthesis may include synthesis conforming to a method disclosed in Japanese Patent Application Publication No. 2012-036388, WO 2015/008851, Japanese Patent Application Publication No. 2012-36381, Japanese Patent Application Publication No. 2012-144722, WO 2015/194448, WO 2013/146806, WO 2015/145871, WO 2016/031639, WO 2016/125560, WO 2016/031639, WO 2016/031639, WO 2016/125560, WO 2015/145871, WO 2011/049241, or Japanese Patent Application Publication No. 2012-144722.

3-1-10. Application for Organic Electroluminescent Element

The present invention is also applicable to a display device equipped with an organic EL element or a lighting device equipped with an organic EL element.

The display device and the lighting device equipped with an organic EL element can be produced by connecting the organic EL element of the present embodiment and a known driving device, according to a known method, and can be driven appropriately using a known driving method of direct current driving, pulse driving or alternate current driving.

Examples of the lighting device include panel displays such as color flat panel displays, and flexible displays such as flexible color organic electroluminescent (EL) displays (for example, see JP 10-335066 A, JP 2003-321546 A, JP 2004-281086 A). Examples of the display system include a matrix and/or segment system. A matrix display and a segment display may co-exist in the same panel.

In a matrix, pixels for display are two-dimensionally arranged such as in a lattice-like or mosaic-like form, and pixel aggregation displays a letter and an image. The shape and the size of pixels are determined depending on the intended use. For example, for image and letter display on personal computers, monitors and televisions, square pixels of 300 m or less on each side are generally used, while in the case of a large-size display such as a display panel, pixels of mm order on each side are used. In the case of monochromatic display, pixels of the same color may be aligned, but in the case of color display, pixels of red, green, and blue are aligned and displayed. In this case, typically, there is known a delta type and a stripe type. Regarding the driving method for the matrix, any of a line-sequential drive method or an active-matrix method may be employed. A line-sequential drive method has an advantage that the structure is simple, but in consideration of operation characteristics, an active matrix may often be superior to it, as the case may be. Accordingly, the two need to be used individually depending on the intended use.

In a segment type, patterns are formed so as to display previously determined information, and a determined region is made to emit light. Examples thereof include time and temperature display in digital watches and thermometers, operating state display in audio instruments and induction cookers, and panel display in automobiles.

Examples of the lighting device include a lighting device for in-room lighting, and a backlight in liquid-crystal display devices (for example, see JP 2003-257621 A, JP 2003-277741 A, and JP 2004-119211 A). A backlight is used mainly for the purpose of improving the visibility in non-luminescent devices, and is used, for example, in liquid-crystal display devices, watches, audio instruments, automobile panels, display boards and sign boards. In particular, regarding a backlight for liquid-crystal displays, especially for personal computers whose issue is to be thinned, a conventional system uses a fluorescent lamp or a light guide plate and is therefore difficult to thin, and taking this into consideration, a backlight using the light-emitting device of the present embodiment is characterized in that it is thin and light.

3-2. Other Organic Devices

The polycyclic aromatic compound according to the present invention can be used for manufacturing an organic field effect transistor, an organic thin film solar cell, or the like, in addition to the organic electroluminescent element described above.

The organic field effect transistor is a transistor that controls a current by means of an electric field generated by voltage input, and is provided with a source electrode, a drain electrode, and a gate electrode. When a voltage is applied to the gate electrode, an electric field is generated, and the organic field effect transistor can control a current by arbitrarily damming a flow of electrons (or holes) flowing between the source electrode and the drain electrode. The field effect transistor can be easily miniaturized compared with a simple transistor (bipolar transistor) and is often used as an element constituting an integrated circuit or the like.

The structure of the organic field effect transistor is usually as follows. That is, a source electrode and a drain electrode are provided in contact with an organic semiconductor active layer formed using the polycyclic aromatic compound according to the present invention, and it is only required to further provide a gate electrode so as to interpose an insulating layer (dielectric layer) in contact with the organic semiconductor active layer. Examples of the element structure include the following structures.

(1) Substrate/gate electrode/insulator layer/source electrode and drain electrode/organic semiconductor active layer.

(2) Substrate/gate electrode/insulator layer/organic semiconductor active layer/source electrode and drain electrode.

(3) Substrate/organic semiconductor active layer/source electrode and drain electrode/insulator layer/gate electrode.

(4) Substrate/source electrode and drain electrode/organic semiconductor active layer/insulator layer/gate electrode.

An organic field effect transistor thus configured can be applied as a pixel driving switching element of an active matrix driving type liquid crystal display or an organic electroluminescent display, or the like.

An organic thin film solar cell has a structure in which a positive electrode such as ITO, a hole transport layer, a photoelectric conversion layer, an electron transport layer, and a negative electrode are laminated on a transparent substrate of glass or the like. The photoelectric conversion layer has a p-type semiconductor layer on the positive electrode side and has an n-type semiconductor layer on the negative electrode side. The polycyclic aromatic compound according to the present invention can be used as a material for a hole transport layer, a p-type semiconductor layer, an n-type semiconductor layer, or an electron transport layer depending on physical properties thereof. The polycyclic aromatic compound according to the present invention can function as a hole transport material or an electron transport material in an organic thin film solar cell. The organic thin film solar cell may appropriately include a hole blocking layer, an electron blocking layer, an electron injection layer, a hole injection layer, a smoothing layer, and the like, in addition to the members described above. For the organic thin film solar cell, known materials used for an organic thin film solar cell can be appropriately selected and used in combination.

4. Wavelength Conversion Material

The polycyclic aromatic compound of the present invention may be used as a wavelength conversion material.

Currently, the application of a multicoloring technique by a color conversion method to a liquid crystal display, an organic EL display, illumination, and the like has been energetically studied. Color conversion refers to a wavelength conversion of emitted light from a light-emitting substance into light with a longer wavelength and includes, for example, conversion of UV light or blue light into green light or red emitted light. By molding a wavelength conversion material having this color conversion function into a film and then combining the film with a blue light source, three primary colors of blue, green, and red can be taken out; that is, white light can be taken out from a blue light source. A full-color display can be constructed using such a white light source, in which a blue light source is combined with a wavelength conversion film having a color conversion function, as a light source unit and combining the white light source with a liquid crystal-driving part and a color filter. When a liquid crystal-driving part is omitted, such a white light source is used as a white light source as it is and can be applied to a white light source for, for example, an LED illumination. A full-color organic EL display can be constructed without a metal mask using a combination of a blue organic EL element as a light source and a wavelength conversion film that converts blue light into green light and red light. A low-cost full-color organic micro-LED display can be constructed by using a combination of a blue micro-LED as a light source and a wavelength conversion film that converts blue light into green light and red light.

The polycyclic aromatic compound of the present invention may be used as this wavelength conversion material. By using a wavelength conversion material containing a polycyclic aromatic compound of the present invention, light from a light source or a light-emitting element that generates UV light or blue light with a shorter wavelength into blue light or green light with high color purity, suitable for the use in a display device (a display device using an organic EL element or a liquid crystal display device). The color to be converted may be adjusted by appropriately selecting the substituent of the polycyclic aromatic compound of the present invention, a binder resin used in a wavelength-converting composition that will be described below, or the like. The wavelength conversion material may be prepared as a wavelength-converting composition containing a polycyclic aromatic compound of the present invention. A wavelength conversion film may be formed by using this wavelength-converting composition.

The wavelength-converting composition may contain a binder resin, another additive, and a solvent in addition to the polycyclic aromatic compound of the present invention. As the binder resin, for example, those disclosed in paragraphs [0173]-[0176] of WO 2016/190283 may be used. As the other additive, for example, those disclosed in paragraphs [0177]-[0181] of WO 2016/190283 may be used. As the solvent, the description about the solvents contained in the light-emitting layer forming composition may be referred to.

The wavelength conversion film includes a wavelength conversion layer formed by curing a wavelength-converting composition. A known film formation method may be referred to as a method for constructing a wavelength conversion layer from a wavelength-converting composition. The wavelength conversion film may consist only of wavelength conversion layers formed from a composition containing a polycyclic aromatic compound of the present invention and may include other wavelength conversion layers (for example, a wavelength conversion layer converting blue light into green light or red light, or a wavelength conversion layer converting blue light into green light or red light). Furthermore, the wavelength conversion film may include a substrate layer or a barrier layer for preventing deterioration of a color conversion layer due to oxygen, moisture, or heat.

EXAMPLES

Hereinunder the present invention is described specifically with reference to Examples, but the present invention is not whatsoever restricted by these Examples.

In each formula in Examples, Me represents methyl, Et represents ethyl, $^{i}$Pr represents isopropyl, tBu represents t-butyl, and Bpin represents pinacolatoboryl.

Synthesis Examples for the polycyclic aromatic compounds are first shown below.

Synthesis Example (1): Synthesis of Compound (v-19-1

(v-19-1)

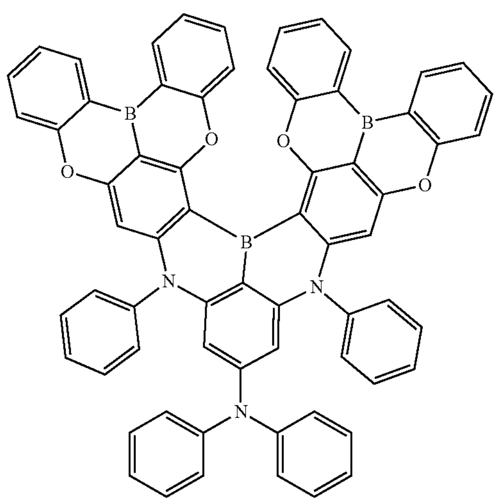

To a flask containing Intermediate (Int-v-19-1) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) (Japan Alcohol Trading Co., Ltd.) was added, and the precipitated crystals were filtered. The resulting crystals were washed with methanol to obtain Compound (v-19-1) (0.11 g).

Compound (v-19-1) obtained was identified by NMR measurement.

$^{1}$H-NMR (500 MHz, $CDCl_3$): δ=5.84 (s, 2H), 6.38 (dd, 2H), 6.55 (s, 2H), 6.91-6.99 (m, 10H), 7.11 (t, 4H), 7.35 (dt, 2H), 7.38 (d, 4H), 7.43-7.48 (m, 4H), 7.56 (t, 4H), 7.65 (dt, 2H), 8.42 (dd, 2H), 8.63 (dd, 2H)

The target Compound (v-19-1) was identified by MALDI-TOF/MS at m/z=971.33.

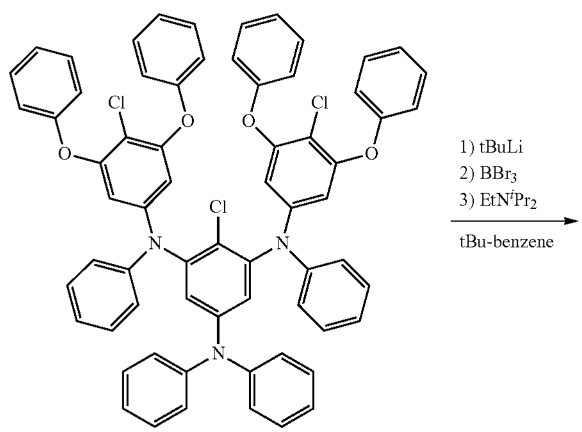

(Int-v-19-1)

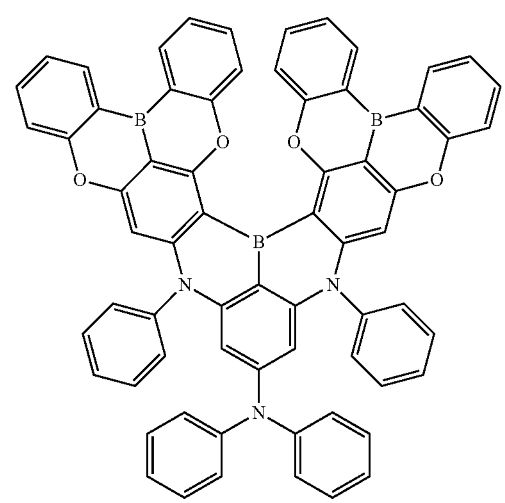

(v-19-1)

Synthesis Example (2): Synthesis of Compound (v-18-1

(v-18-1)

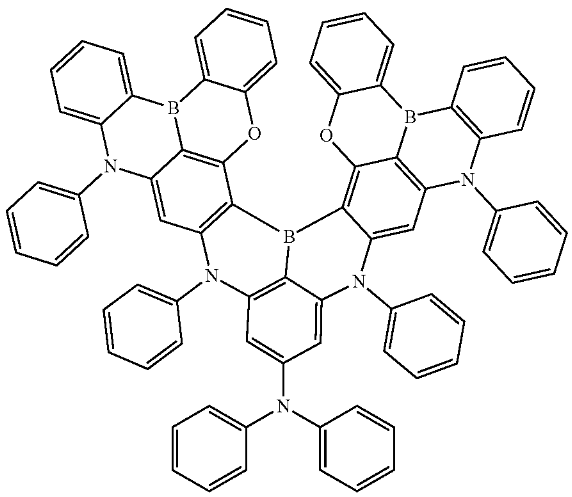

To a flask containing Intermediate (Int-v-18-1) (2.5 g) and tert-butylbenzene (22 ml) was added a 1.53M of butyl-lithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.5 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 3 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-18-1) (0.15 g).

The target Compound (v-18-1) was identified by LC-MS at m/z=1122, 4334.

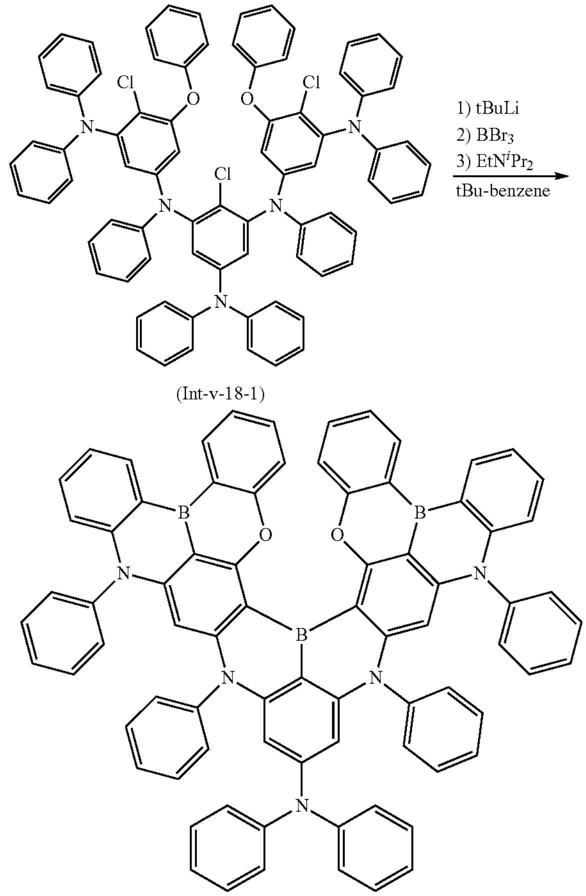

(Int-v-18-1)

(v-18-1)

Synthesis Example (3): Synthesis of Compound (v-21-2

(v-21-2)

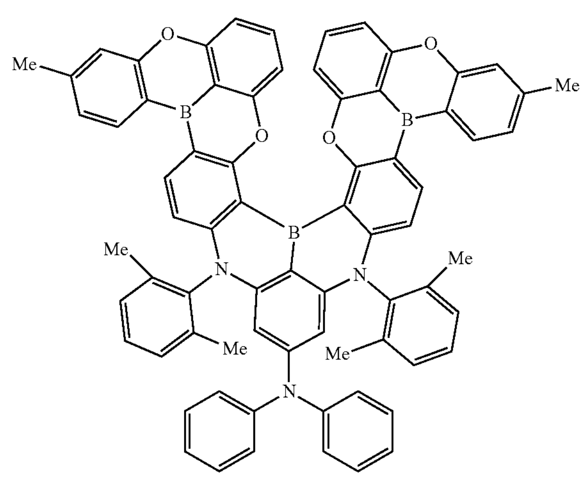

To a flask containing Intermediate (Int-v-21-2) (2.0 g) and tert-butylbenzene (20 ml) was added a 1.53M of butyl-lithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-21-2) (0.04 g).

The target Compound (v-21-2) was identified by LC-MS at m/z=1056.4311.

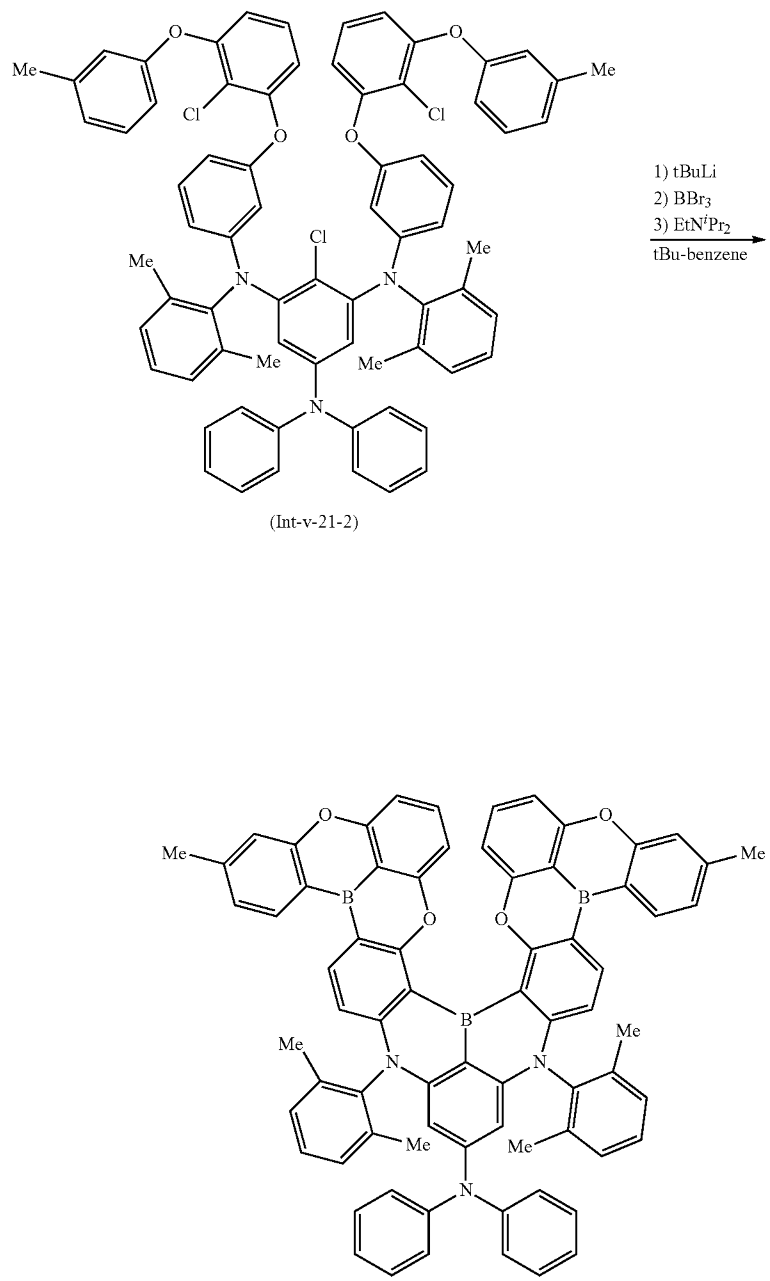

(Int-v-21-2)

(v-21-2)

Synthesis Example (4): Synthesis of Compound (vi-14

(vi-14)

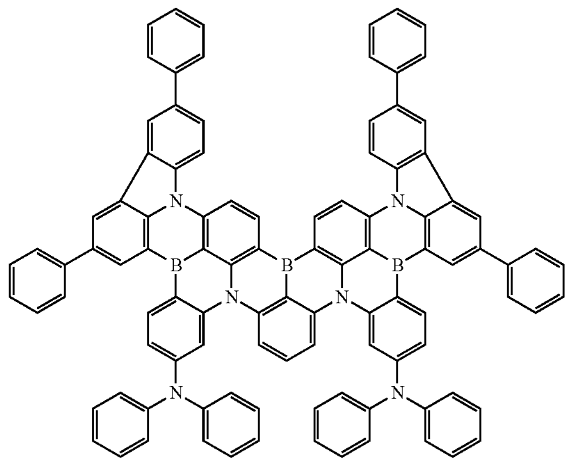

To a flask containing Intermediate (Int-vi-14) (3.0 g) and tert-butylbenzene (40 ml) was added a 1.53M of butyllithium pentane solution (10.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (3.0 g), and stirred for 0.5 hours after the temperature was increased to room temperature. Thereafter, the reaction mixture was cooled again to 0° C. and added with N,N-diisopropylethylamine (0.8 g), and stirred at room temperature until exothermic heat had settled, and then heated and stirred for 3 hours at a temperature increased to 100° C. The reaction mixture was cooled to room temperature, added with an aqueous sodium acetate solution cooled in an ice bath, followed by toluene, and stirred for 12 hours. The yellow suspension was subjected to a filtration and the precipitate was washed with methanol. The yellow crystals are dissolved in dichlorobenzene under heating and purified on a silica gel short column (eluent: dichlorobenzene). To the crude product obtained, dichlorobenzene was added and concentrated, then Solmix (A-11) was added, and the precipitated crystals were filtered. The resulting crystals were washed with toluene to obtain Compound (vi-14) (0.02 g).

The target Compound (vi-14) was identified by LC-MS at m/z=1405.5459.

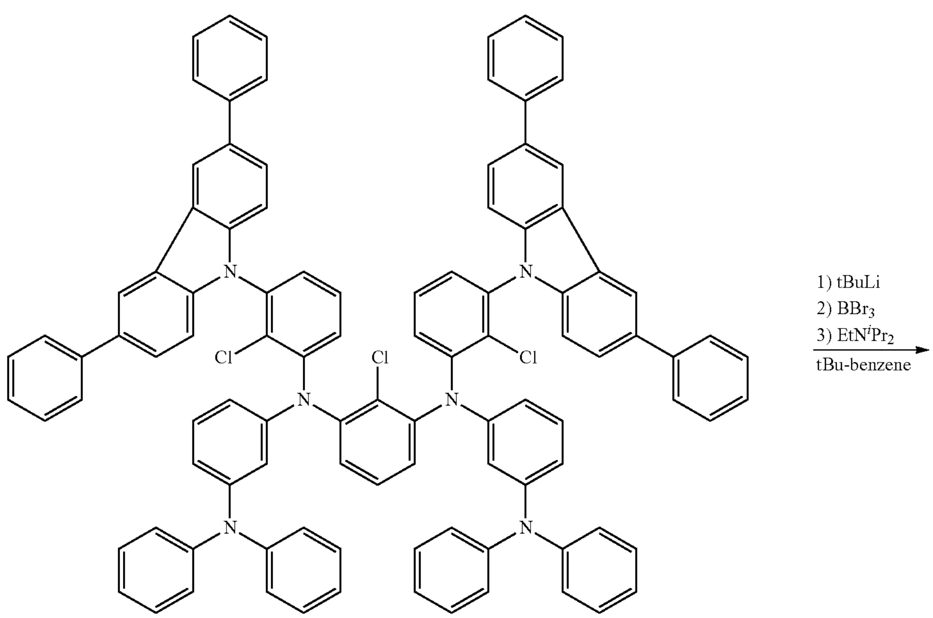

(Int-vi-14)

-continued

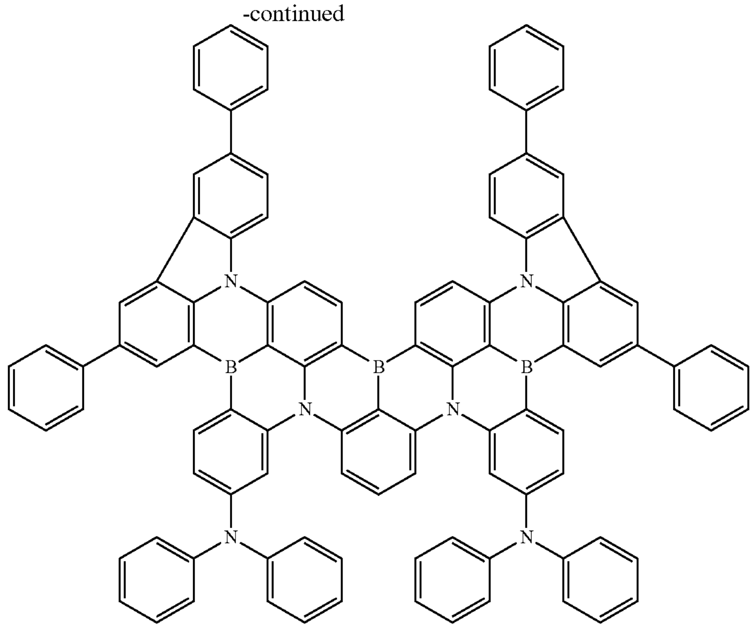

(vi-14)

Synthesis Example (5): Synthesis of Compound (vi-3

(vi-3)

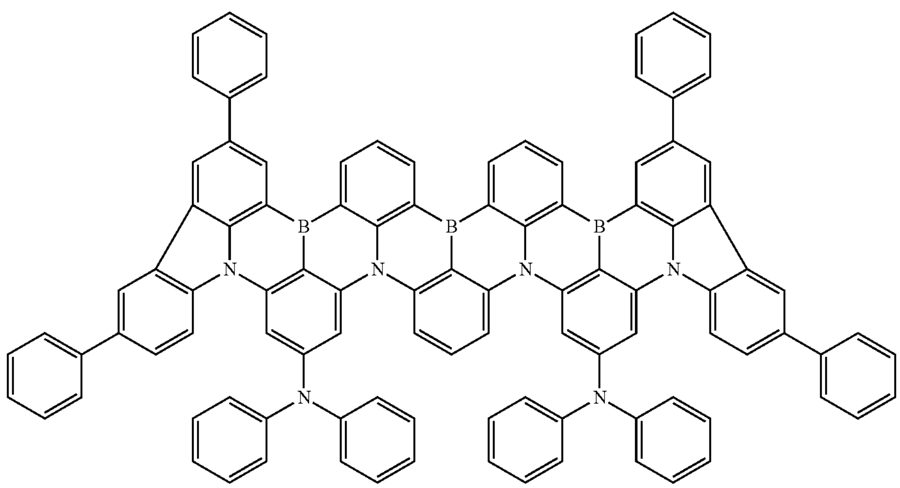

To a flask containing Intermediate (Int-vi-3) (4.0 g) and tert-butylbenzene (40 ml) was added a 1.53M of butyllithium pentane solution (10.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (3.0 g), and stirred for 0.5 hours after the temperature was increased to room temperature. Thereafter, the reaction mixture was cooled again to 0° C. and added with N,N-diisopropylethylamine (0.8 g), and stirred at room temperature until exothermic heat had settled, and then heated and stirred for 3 hours at a temperature increased to 100° C. The reaction mixture was cooled to room temperature, added with an aqueous sodium acetate solution cooled in an ice bath, followed by toluene, and stirred for 12 hours. The yellow suspension was subjected to a filtration and the precipitate was washed with methanol. The yellow crystals are dissolved in dichlorobenzene under heating and purified on a silica gel short column (eluent: dichlorobenzene). To the crude product obtained, dichlorobenzene was added and concentrated, then Solmix (A-11) was added, and the precipitated crystals were filtered. The resulting crystals were washed with toluene to obtain Compound (vi-3) (0.01 g).

The target Compound (vi-3) was identified by LC-MS at m/z=1405.5481.

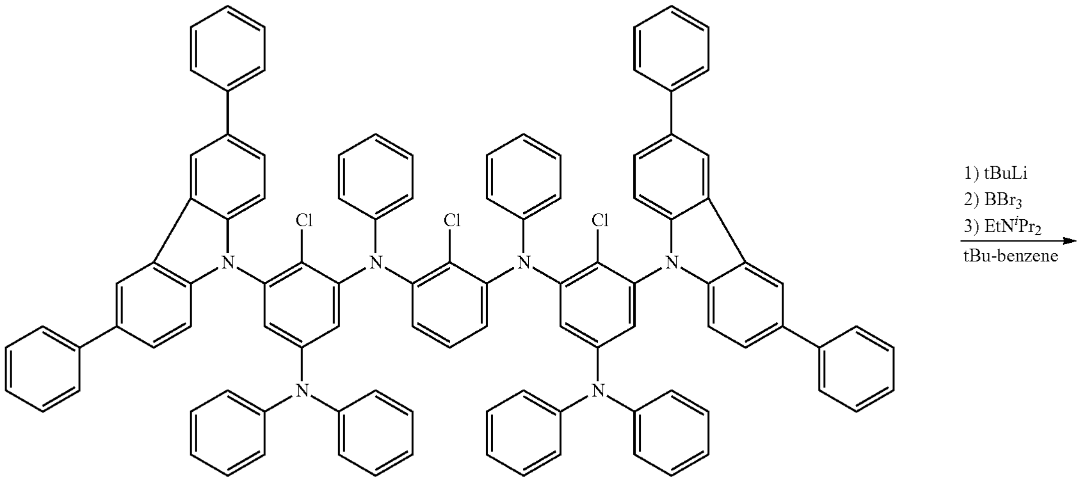
(Int-vi-3)
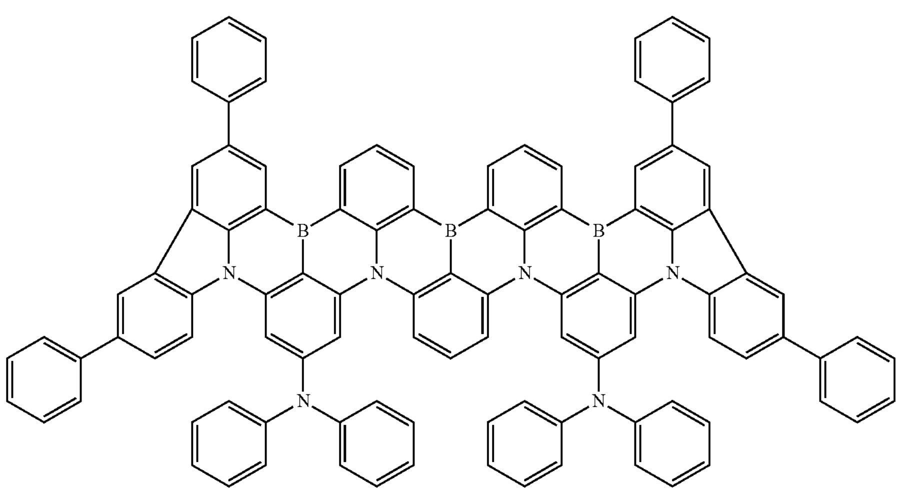
(vi-3)

Synthesis Example (6): Synthesis of Compound (v-19N1-1

(v-19N1-1)

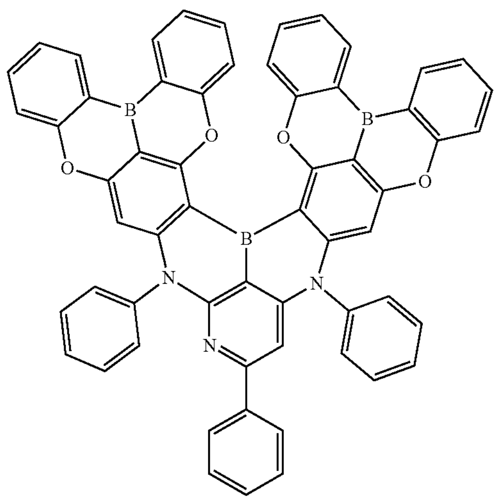

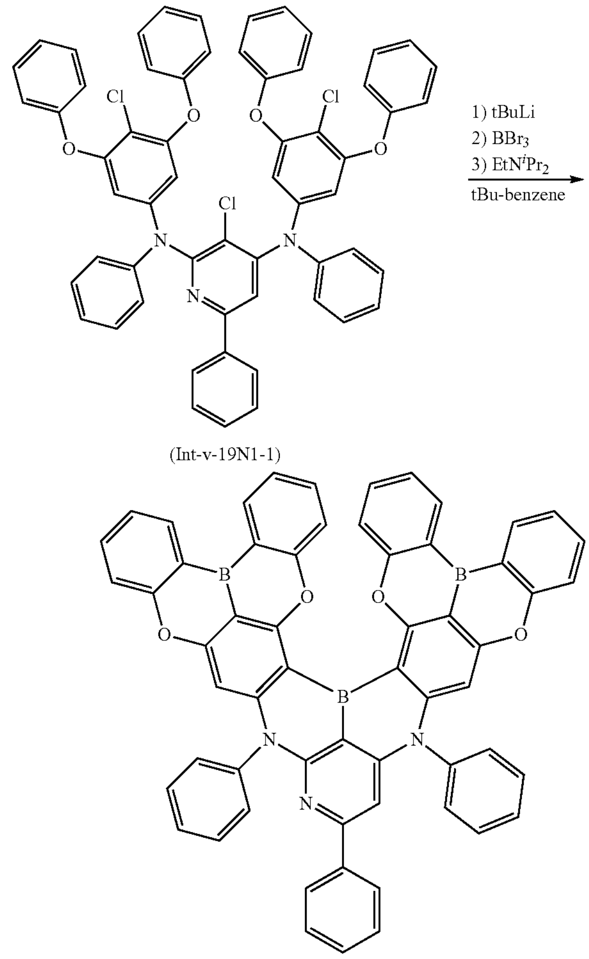

(Int-v-19N1-1)

(v-19N1-1)

To a flask containing Intermediate (Int-v-19N1-1) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-19N1-1) (0.01 g).

The target Compound (v-19N1-1) was identified by LC-MS at m/z=881.2901.

Synthesis Example (7): Synthesis of Compound (v-118-1

(v-118-1)

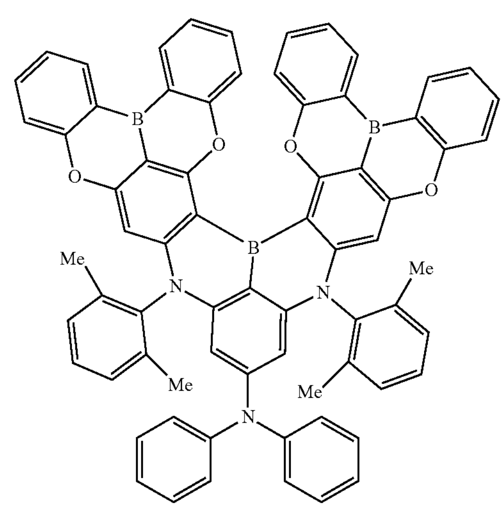

To a flask containing Intermediate (Int-v-118-1) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-118-1) (0.08 g).

The target Compound (v-118-1) was identified by LC-MS at m/z=1028.4011.

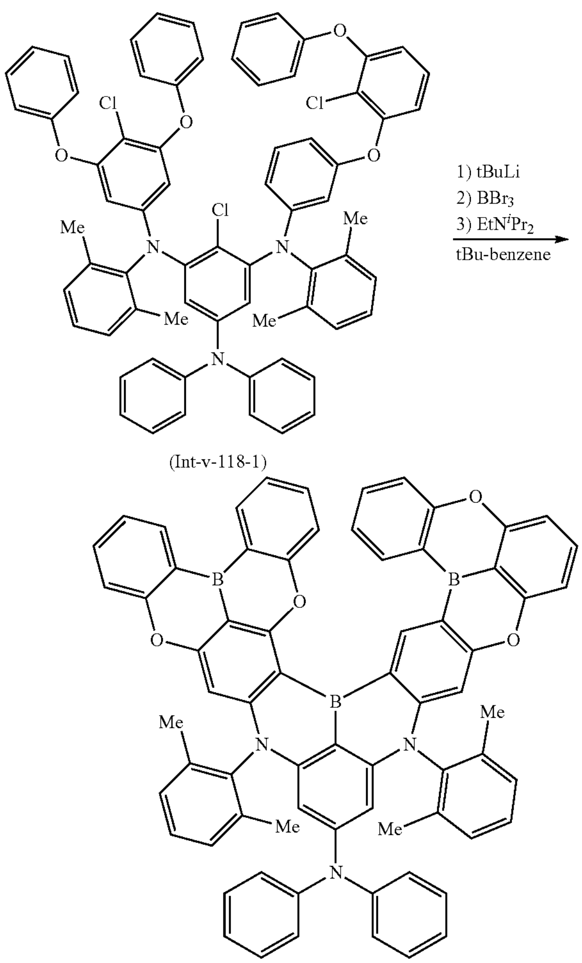

(Int-v-118-1)

(v-118-1)

Synthesis Example (8): Synthesis of Compound (v-164-1

(v-164-1)

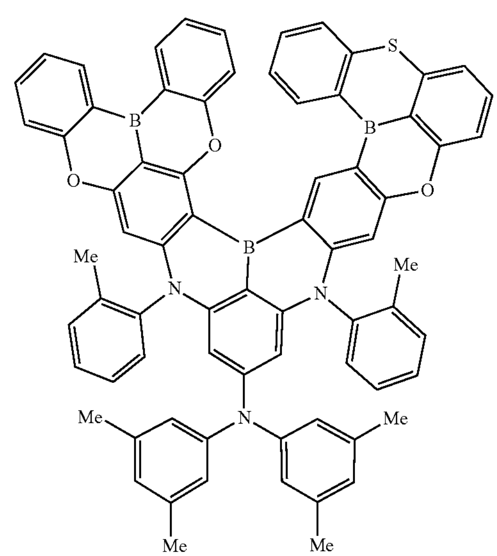

To a flask containing Intermediate (Int-v-164-1) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-164-1) 0.08 g).

The target Compound (v-164-1) was identified by LC-MS at m/z=1072.4011.

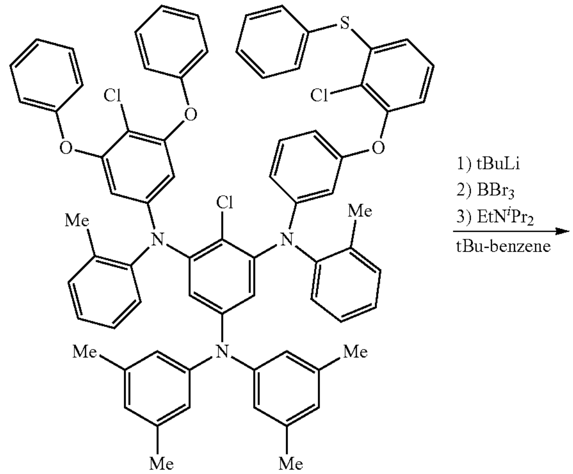

(Int-v-164-1)

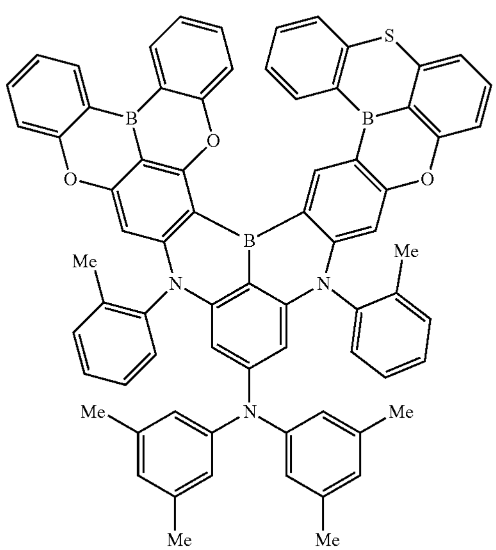

(v-164-1)

Synthesis Example (9): Synthesis of Compound (v-19-27

(v-19-27)

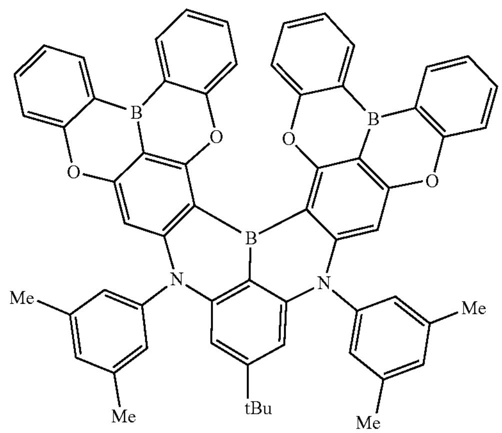

To a flask containing Intermediate (Int-v-19-27) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-19-27) (0.10 g).

Compound (v-19-27) obtained was identified by NMR measurement.

$^1$H-NMR (500 MHz, $CDCl_3$): δ=8.65 (dd, J=7.4, 1.7 Hz, 2H), 8.43 (dd, J=7.4, 1.7 Hz, 2H), 7.68-7.65 (m, 2H), 7.50-7.48 (m, 2H), 7.37-7.34 (m, 2H), 7.31 (s, 2H), 7.17 (s, 4H), 6.99-6.91 (m, 4H), 6.67 (s, 2H), 6.42 (s, 2H), 6.39 (dd, J=8.6, 1.1 Hz, 2H), 2.51 (s, 12H), 1.08 (s, 9H)

The target Compound (v-19-27) was identified by LC-MS at m/z=917.3890.

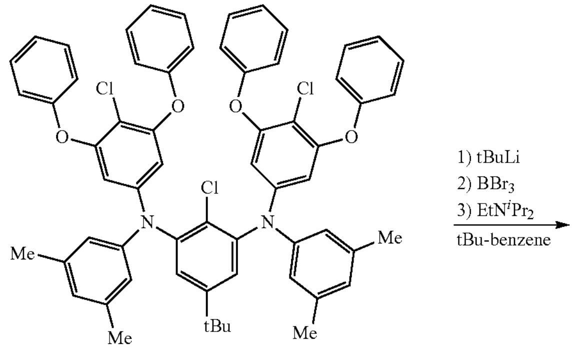

(Int-v-19-27)

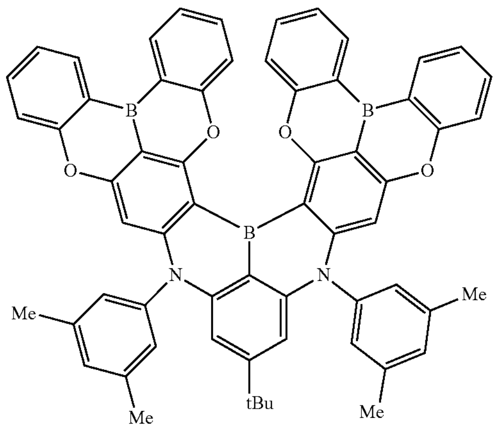

(v-19-27)

Synthesis Example (10): Synthesis of Compound (v-118-2

(v-118-2)

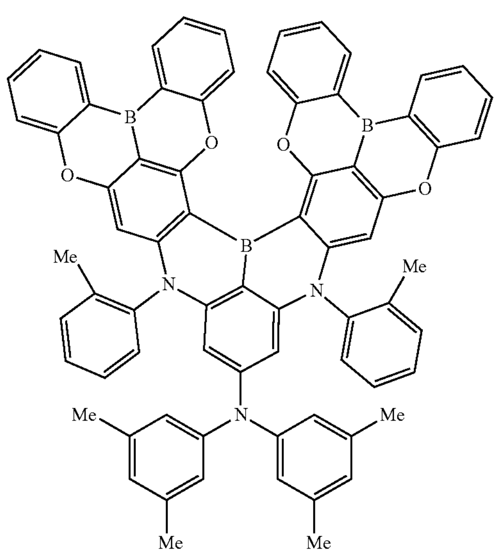

To a flask containing Intermediate (Int-v-118-2) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-118-2) (0.08 g).

Structure of the compound obtained was identified by NMR measurement.

$^{1}$H-NMR (500 MHz, $CDCl_3$): δ=1.96-2.19 (m, 18H), 5.59-5.77 (m, 2H), 6.36 (t, 1H), 6.45-6.51 (s, 1H), 6.58-6.63 (m, 6H), 6.68-6.77 (s, 1H), 6.90 (t, 1H), 7.04 (t, 1H), 7.12 (d, 1H), 7.17-7.46 (m, 14H), 7.66 (t, 1H), 7.72 (t, 1H), 8.03 (d, 1H), 8.64 (d, 1H), 8.74 (d, 1H), 10.3 (s, 1H)

The target Compound (v-118-2) was identified by LC-MS at m/z=1056.4278.

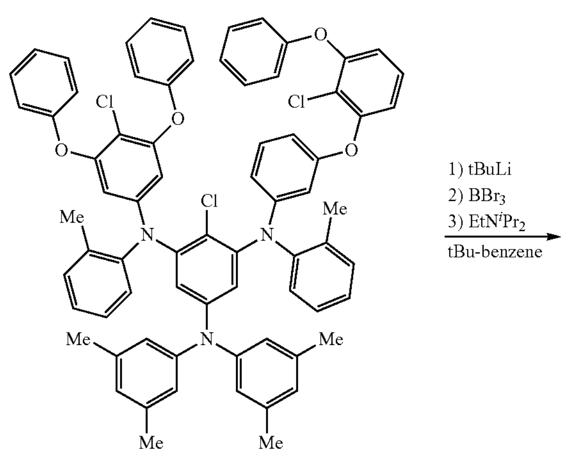

(Int-v-118-2)

-continued

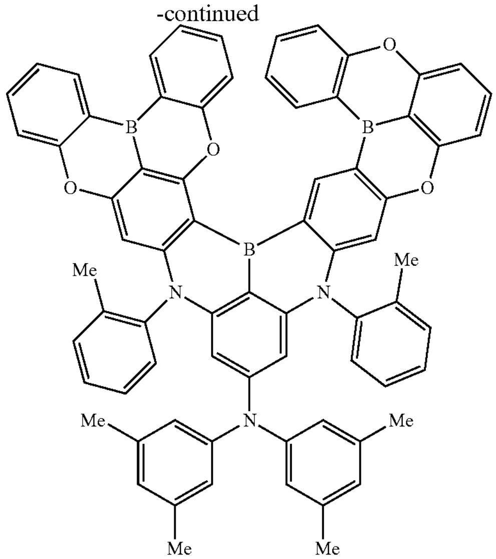

(v-118-2)

Synthesis Example (11): Synthesis of Compound (v-19-28

(v-19-28)

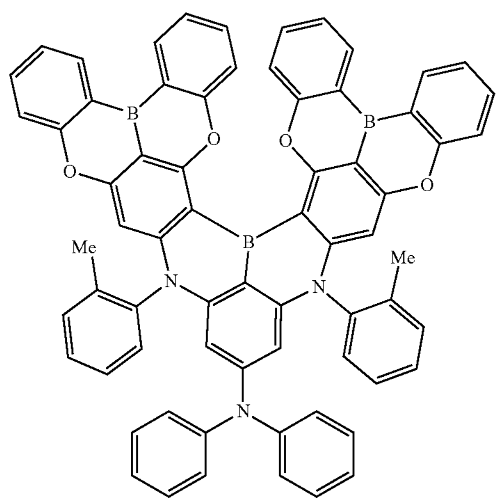

To a flask containing Intermediate (Int-v-19-28) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-19-28) (0.03 g).

The target Compound (v-19-28) was identified by LC-MS at m/z=1000.3690.

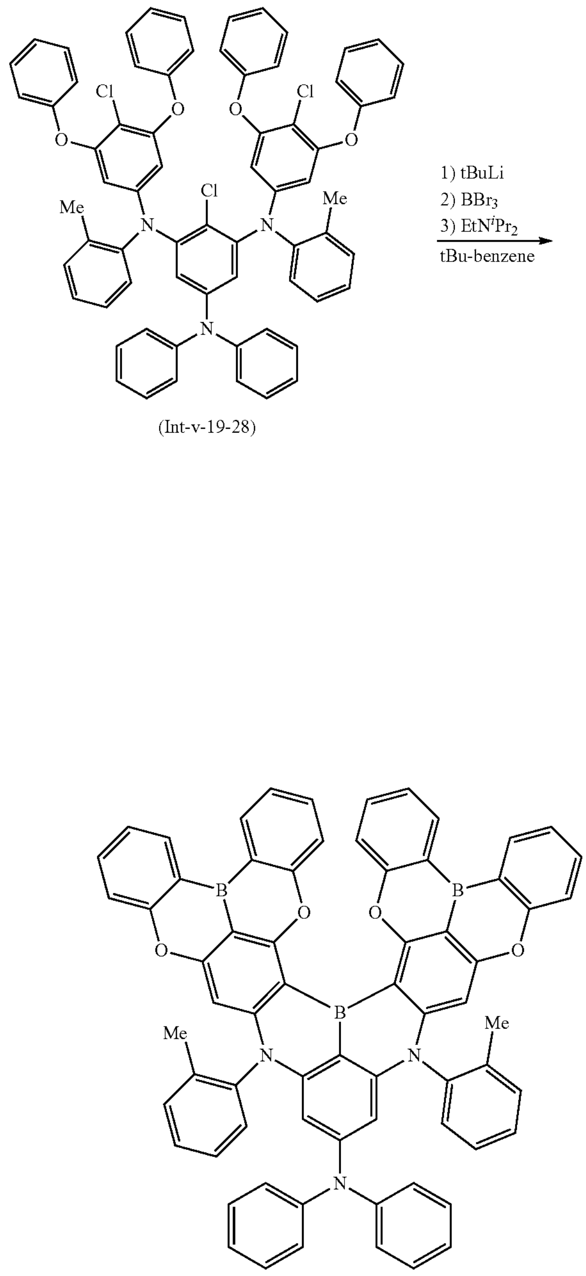

(Int-v-19-28)

(v-19-28)

Synthesis Example (12): Synthesis of Compound (v-138-2

(v-138-2)

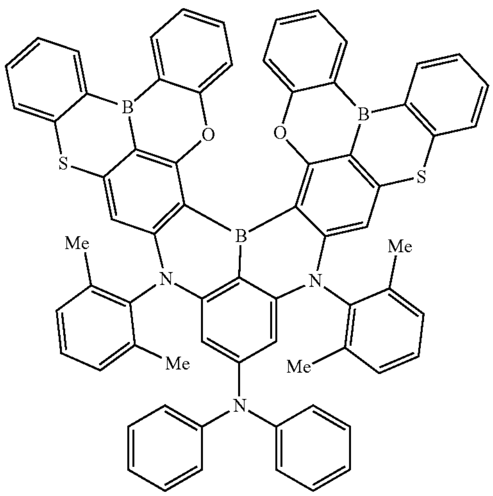

To a flask containing Intermediate (Int-v-138-2) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-li) was added, and the precipitated crystals were filtered. The resulting crystals were washed with methanol to obtain Compound (v-138-2) (0.15 g).

The target Compound (v-138-2) was identified by MALDI-TOF/MS at m/z=1060.3511.

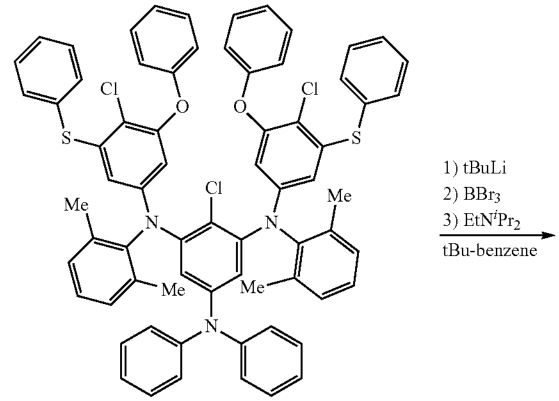

(Int-v-138-2)

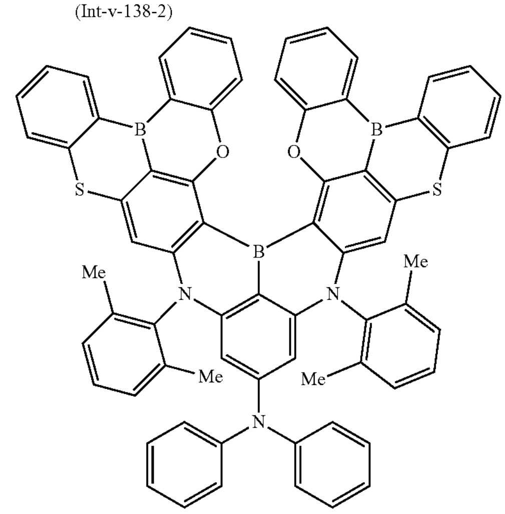

(v-138-2)

Synthesis Example (13): Synthesis of Compound (v-136-2

(v-136-2)

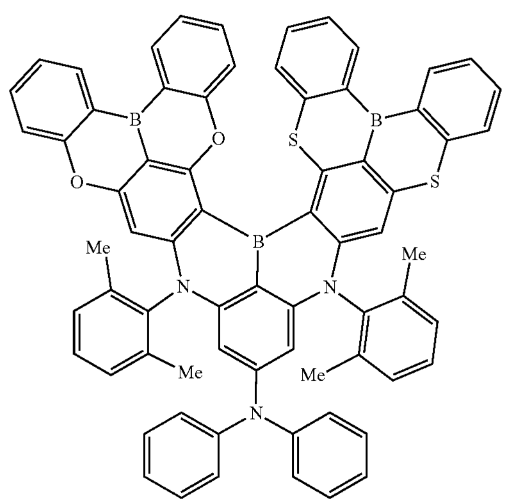

To a flask containing Intermediate (Int-v-136-2) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-136-2) (0.20 g).

The target Compound (v-136-2) was identified by MALDI-TOF/MS at m/z=1060.3571.

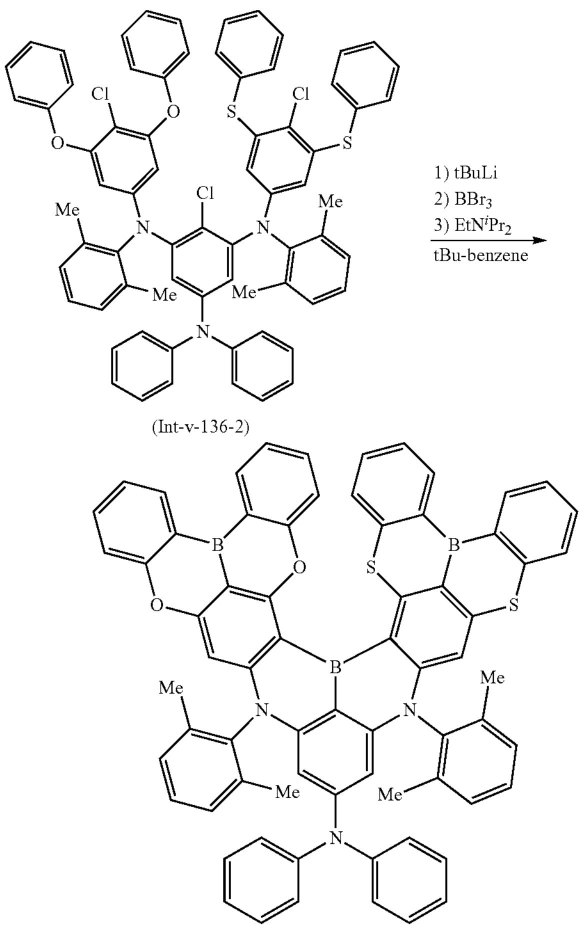

(Int-v-136-2)

(v-136-2)

Synthesis Example (14): Synthesis of Compound (v-171-2

(v-171-2)

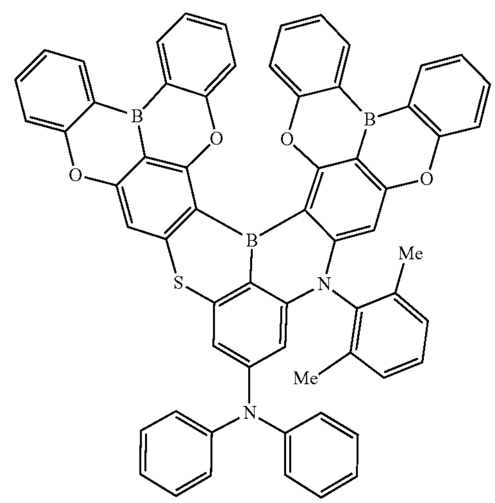

To a flask containing Intermediate (Int-v-171-2) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-171-2) (0.02 g).

The target Compound (v-171-2) was identified by MALDI-TOF/MS at m/z=941.2489.

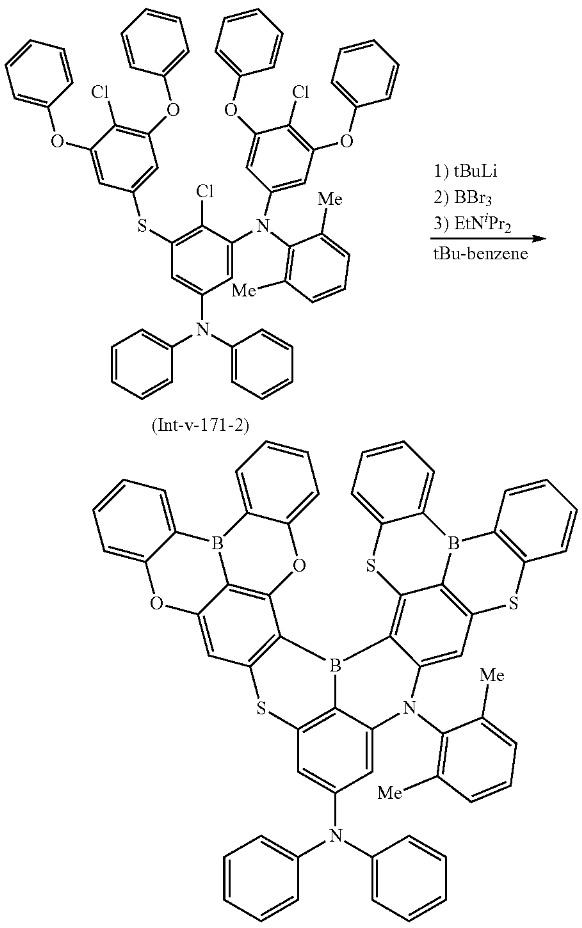

(Int-v-171-2)

(v-171-2)

Synthesis Example (15): Synthesis of Compound (v-131-3

(v-131-3)

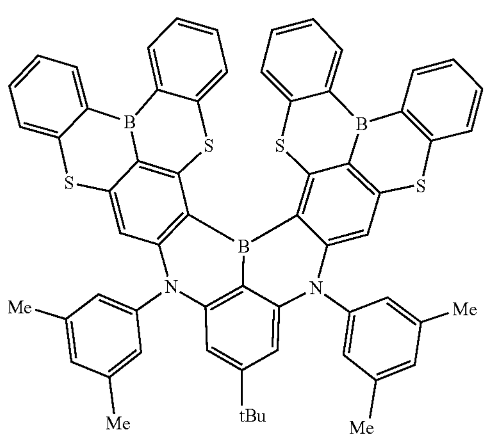

To a flask containing Intermediate (Int-v-131-3) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-131-3) (0.01 g).

The target Compound (v-131-3) was identified by LC-MS at m/z=981.2989.

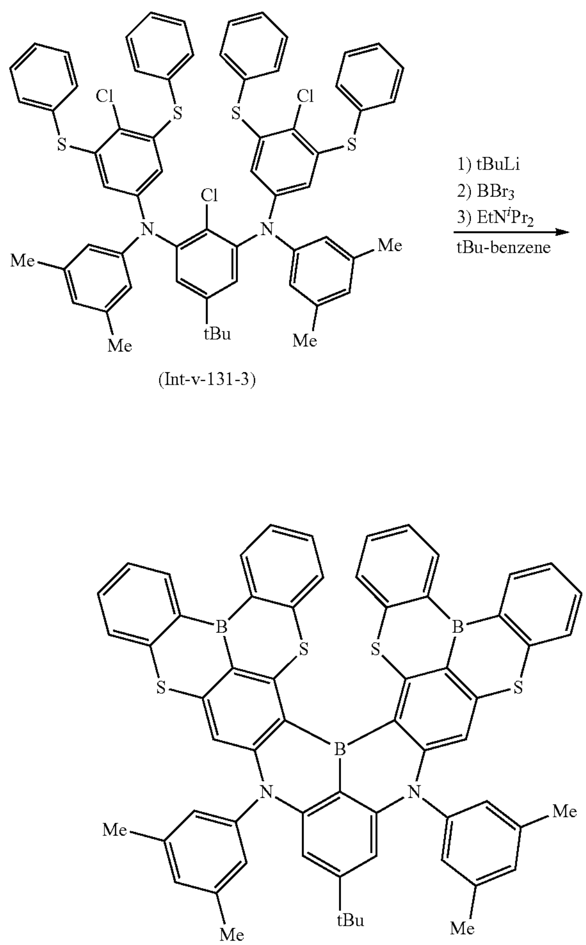

(Int-v-131-3)

(v-131-3)

Synthesis Example (16): Synthesis of Compound (vi-25

(vi-25)

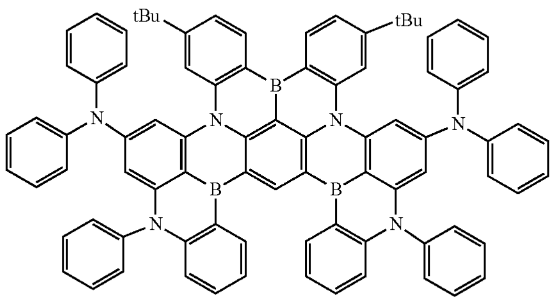

To a flask containing Intermediate (Int-vi-25) (3.60 g, 3.0 mmol, 1 eq.) and o-dichlorobenzene (400 ml) was added boron tribromide (1.13 ml, 12 mmol, 4 eq.) at room temperature under a nitrogen atmosphere. After completion of the dropwise addition, the temperature was increased to 180° C., and the reaction mixture was stirred for 20 hours. The reaction mixture was cooled again to room temperature and added with N,N-diisopropylethylamine (7.70 ml, 45 mmol, 15 eq.), and stirred until exothermic heat had settled. The reaction solution was then distilled off under reduced pressure at 60° C. to obtain a crude product. The crude product was washed with acetonitrile, methanol, and toluene in that order, purified by silica gel column (eluent: toluene), and the crude product was recrystallized twice with o-dichlorobenzene to give compound (vi-25) (0.15 g).

The target Compound (vi-25) was identified by LC-MS at m/z=1217.5780.

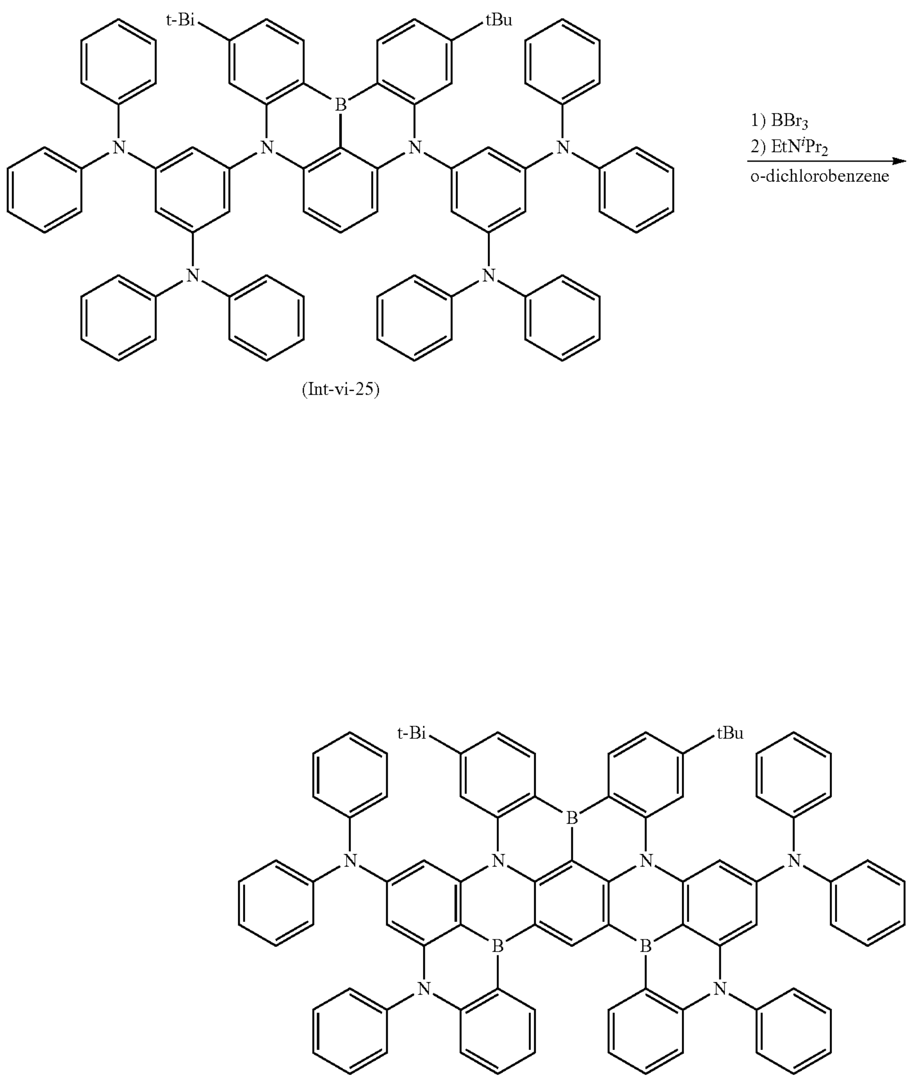

(vi-25)

Synthesis Example (17): Synthesis of Compound (v-19-27) (Alternative Method 1

To a flask containing Intermediate (Int2-v-19-27) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. Thereafter, the reaction mixture was cooled again to 0° C. and added with N,N-diisopropylethylamine (0.5 g), and stirred at room temperature until exothermic heat had settled, and then heated and stirred for 1 hours at a temperature increased to 100° C. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-19-27) (0.88 g).

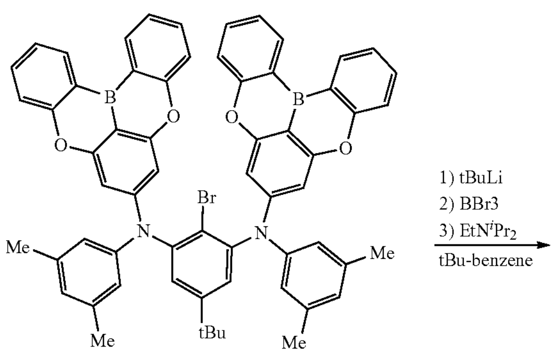

(Int2-v-19-27)

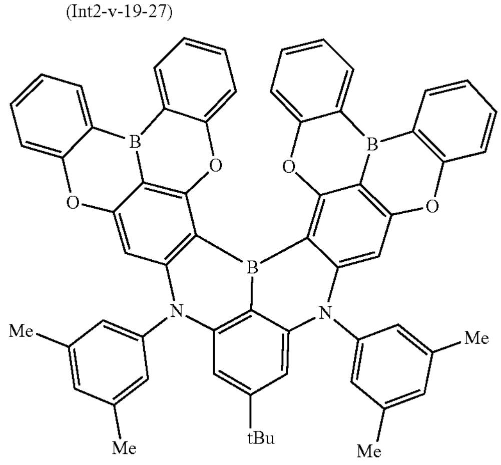

(v-19-27)

Synthesis Example (18): Synthesis of Compound (v-19-27) (Alternative Method 2

Compound (v-19-27) (0.43 g) was obtained by the same procedure as in Synthesis Example (19), except that Intermediate (Int2-v-19-27) was changed to Intermediate (Int3-v-19-27).

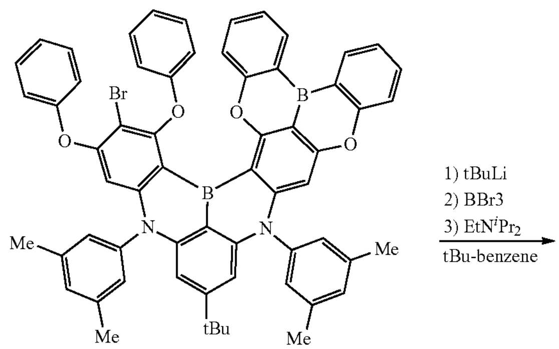

(Int3-v-19-27)

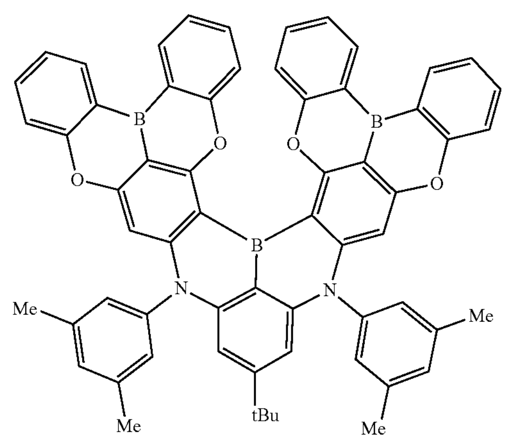

(v-19-27)

Synthesis Example (19): Synthesis of Compound (v-21-4

(v-21-4)

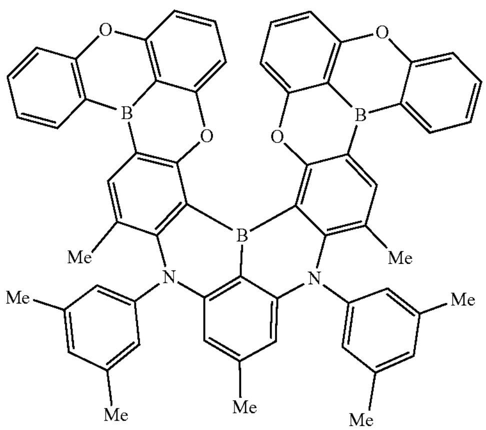

Intermediate (Int2-v-21-4) (2.0 g) and aluminum chloride (1.2 g) were dissolved in chlorobenzene (20 ml) and stirred under heat reflux for 5 hours. The reaction mixture was cooled to room temperature, and added with N,N-diisopropylethylamine (11 ml), and stirred until exothermic heat had settle. The reaction mixture was added with an aqueous sodium acetate solution cooled in an ice bath, followed by toluene, and separated. The organic layer was concentrated and purified by silica gel short column (eluent: toluene/heptane=1/1 (volume ratio)). The crude product obtained was re-precipitated with heptane to give compound (v-21-4) (0.08 g).

The target Compound (v-21-4) was identified by LC-MS at m/z=903.3790.

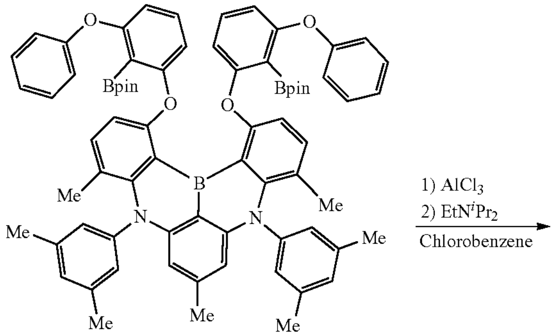

(Int-v-21-4)

-continued

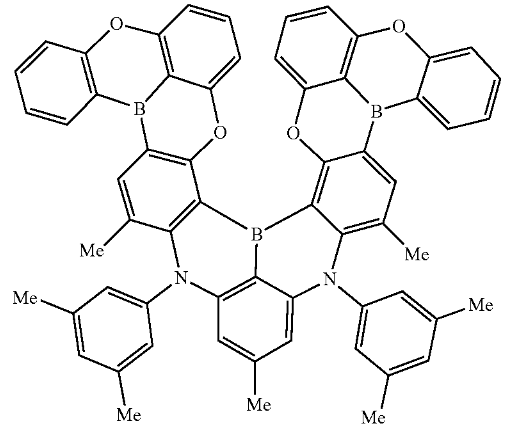

(v-21-4)

Synthesis Example (20): Synthesis of Compound (vi-14) (Alternative Method 1

(vi-14)

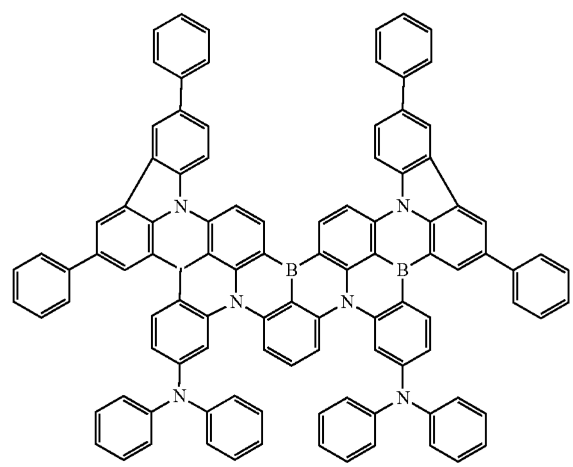

Compound (vi-14) (0.01 g) was obtained by the same procedure as in Synthesis Example (19) except that Intermediate (Int2-v-19-27) was changed to Intermediate (Int2-vi-14).

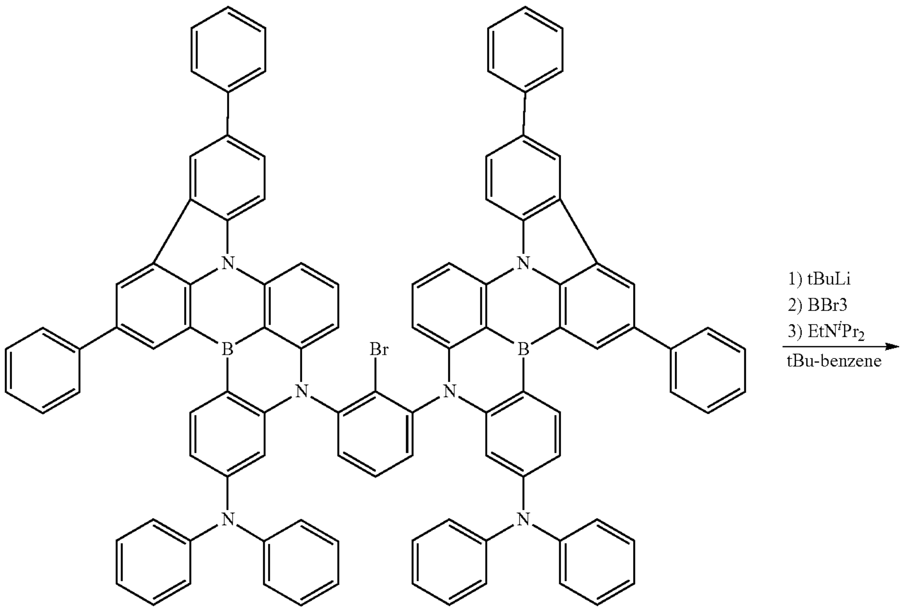
(Int2-vi-14)
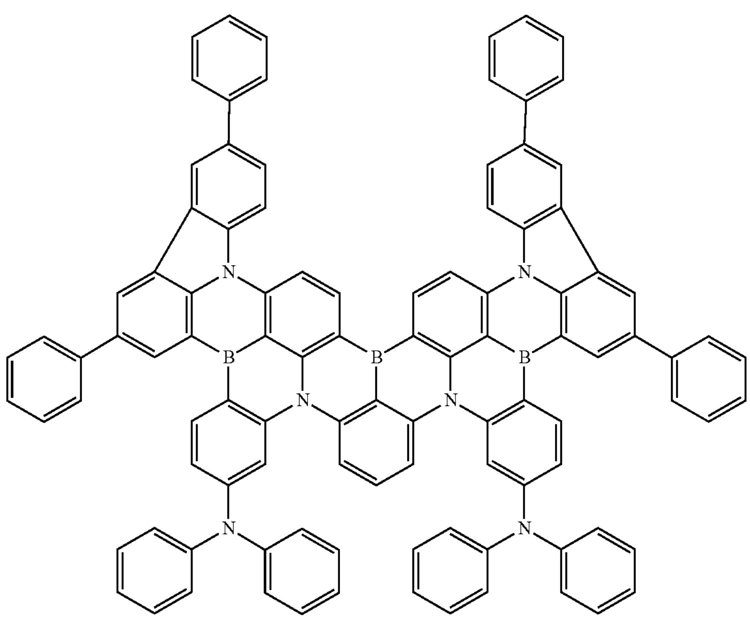
(vi-14)

Synthesis Example (21): Synthesis of Compound (v-118-2) (Alternative Method 1

(v-118-2)

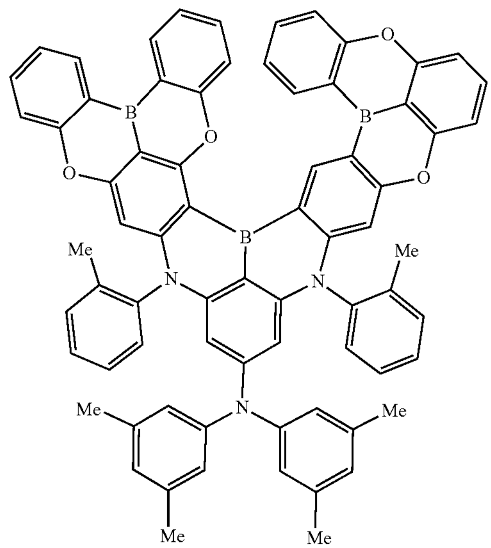

To a flask containing Intermediate (Int2-v-118-2) (0.105 g, 0.10 mmol) and chlorobenzene (2.0 ml) was added boron tribromide (38.0 μl, 0.40 mmol) at room temperature under a nitrogen atmosphere. After completion of the dropwise addition, the temperature was increased to 150° C., and the reaction mixture was stirred for 20 hours. The reaction mixture was cooled to room temperature, and hydrogen bromide in the reaction mixture was removed under reduced pressure. The reaction mixture was cooled to 0° C., and added with water and extracted with dichloromethane, which was then concentrated under reduced pressure. The crude product obtained was purified by silica gel column chromatography (eluent: hexane:dichloromethane=4:1) to obtain Compound (v-118-2) (0.06 g).

Compound (v-118-2) was identified by NMR measurement.

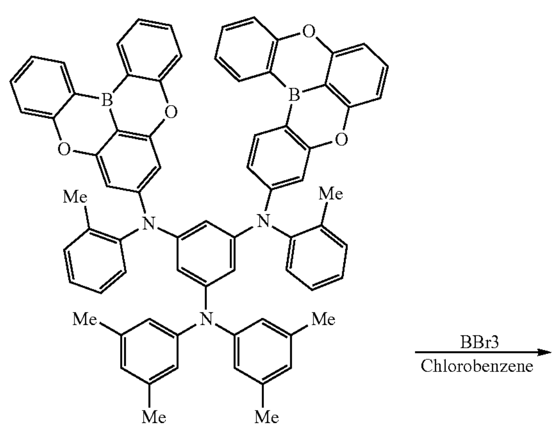

(Int2-v-118-2)

-continued

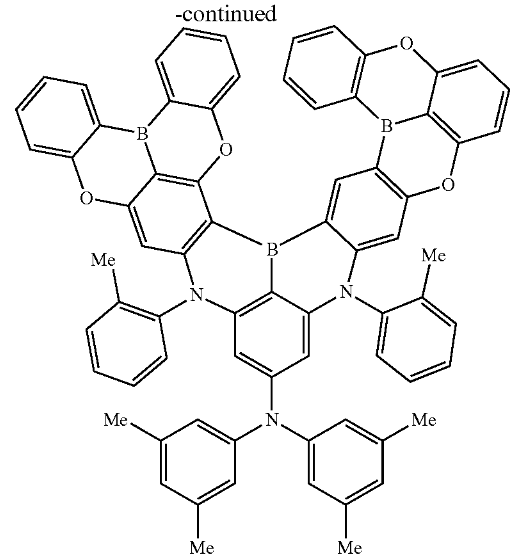

(v-118-2)

Structure of the compound obtained was identified by NMR measurement.

$^{1}$H-NMR (500 MHz, $CDCl_3$): δ=1.96-2.19 (m, 18H), 5.59-5.77 (m, 2H), 6.36 (t, 1H), 6.45-6.51 (s, 1H), 6.58-6.63 (m, 6H), 6.68-6.77 (s, 1H), 6.90 (t, 1H), 7.04 (t, 1H), 7.12 (d, 1H), 7.17-7.46 (m, 14H), 7.66 (t, 1H), 7.72 (t, 1H), 8.03 (d, 1H), 8.64 (d, 1H), 8.74 (d, 1H), 10.3 (s, 1H)

The target Compound (v-118-2) was identified by LC-MS at m/z=1056.4322.

Synthesis Example (22): Synthesis of Compound (v-19-27) (Alternative Method 3

(v-19-27)

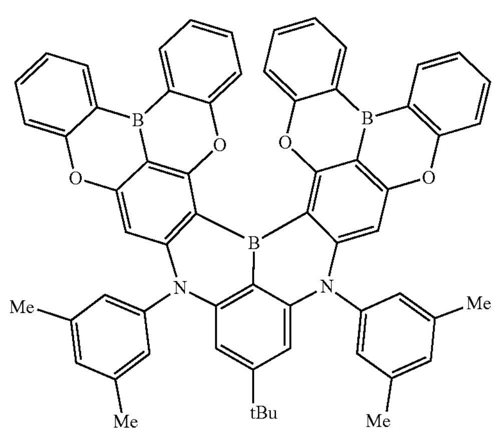

To a flask containing Intermediate (Int2-v-19-27) (2.0 g) and tert-butylbenzene (20 ml) was added a 1.53M of butyllithium pentane solution (5.0 ml) at 0° C. under a nitrogen atmosphere. After completion of the dropwise addition, the temperature was increased to 60° C., and the reaction mixture was stirred for 0.5 hours, and then the components having a lower boiling point than that of tert-butylbenzene were distilled off under reduced pressure. The reaction mixture was cooled to −50° C., added with boron tribromide (2.0 g), and stirred for 0.5 hours after the temperature was increased to room temperature. The reaction mixture was then heated to 100° C. and stirred under heating for 1 hour. The reaction mixture was cooled to room temperature, added with an aqueous sodium acetate solution cooled in an ice bath, followed by ethyl acetate, and stirred for 1 hours. The yellow suspension was subjected to a filtration and the precipitate was washed with methanol. The yellow crystals are dissolved in toluene under heating and purified on a silica gel short column (eluent: toluene). To the crude product obtained, toluene was added and concentrated, then Solmix (A-11) was added, and the precipitated crystals were filtered. The resulting crystals were washed with methanol to obtain Compound (v-19-27) (0.69 g).

Compound (v-19-27) was identified by NMR measurement.

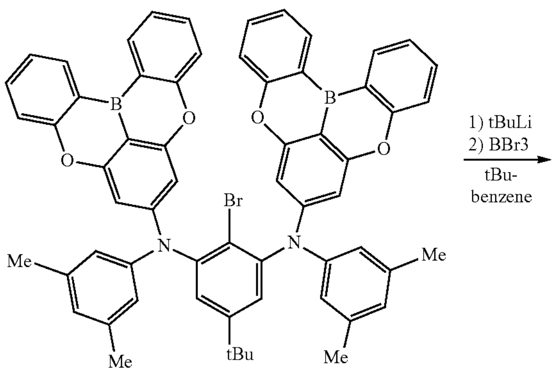

(Int2-v-19-27)

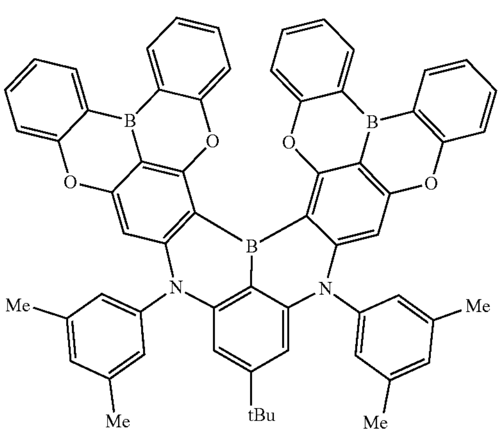

(v-19-27)

Synthesis Example (23): Synthesis of Compound (v-19-1) (Alternative Method 1

(v-19-1)

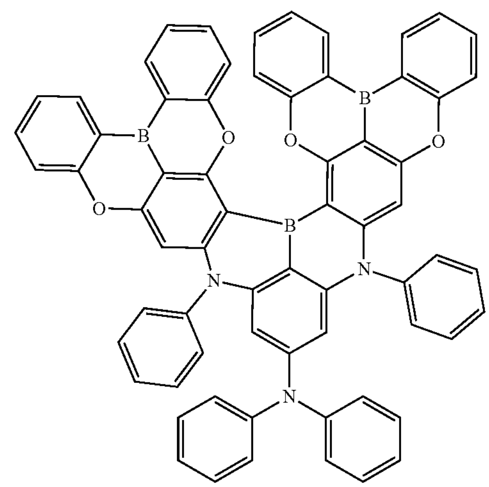

Compound (v-19-1) (0.01 g) was obtained by the same procedure as in Synthesis Example (25), except that Intermediate (Int2-v-118-2) was changed to Intermediate (Int2-v-19-1).

Compound (v-19-1) was identified by NMR measurement.

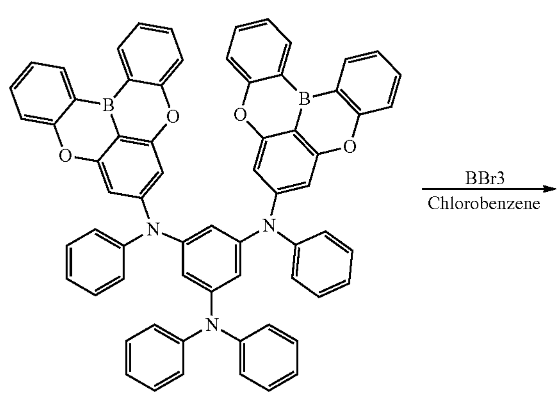

(Int2-v-19-1)

-continued

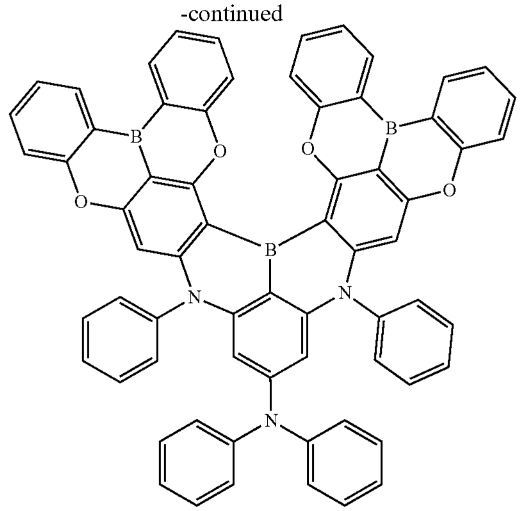

(v-19-1)

Synthesis Example (24): Synthesis of Compound (v-165-1

(v-165-1)

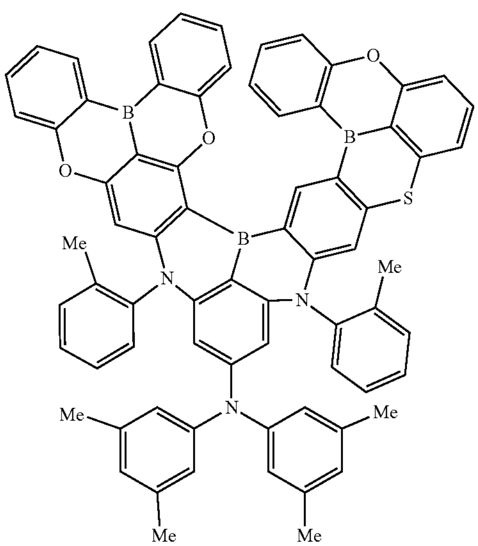

To a flask containing Intermediate (Int-v-165-1) (0.108 g, 0.10 mmol) and chlorobenzene (2.0 ml) was added boron tribromide (0.114 ml, 1.2 mmol) at room temperature under a nitrogen atmosphere. After completion of the dropwise addition, the temperature was increased to 150° C., and the reaction mixture was stirred for 20 hours. The reaction mixture was cooled to room temperature, and hydrogen bromide in the reaction mixture was removed under reduced pressure. After diluting the reaction solution with dichloromethane (50 ml), phosphate buffer solution (pH=7, 50 ml) was added at 0° C., the aqueous layer was extracted three times with dichloromethane, and the solvent was removed under reduced pressure. The crude product obtained was purified by silica gel column chromatography (eluent: hexane:dichloromethane=3:1) and GPC (eluent: 1,2-dichloroethane) to obtain a mixture of stereoisomers of Compound (v-165-1) (20.3 mg, yield 19%) as a yellow solid.

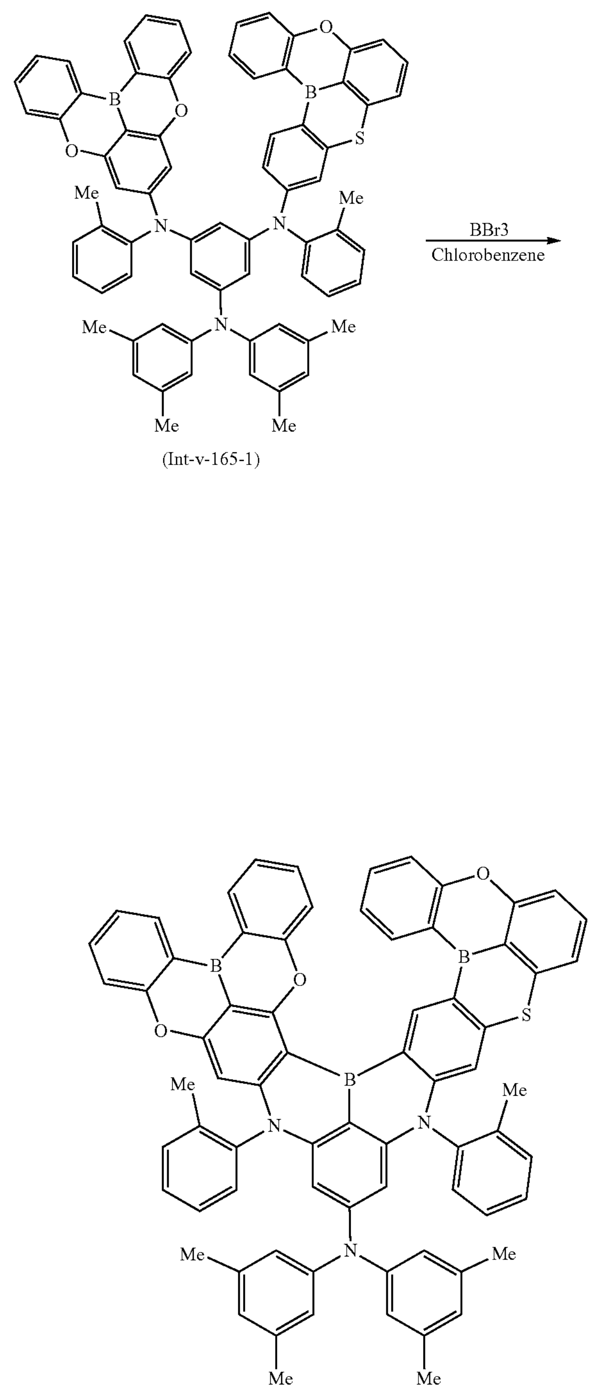

Structure of the compound obtained was identified by NMR measurement.

$^{1}$H-NMR (500 MHz, $CDCl_3$): δ=1.95-2.16 (m, 18H), 5.59-5.74 (m, 2H), 6.39-6.62 (m, 9H), 6.88-7.02 (m, 3H), 7.19-7.45 (m, 14H), 7.60-7.65 (m, 2H), 8.24 (d, 1H), 8.49 (d, 1H), 8.67 (d, 1H), 10.5 (s, 1H) MALDI m/z $[M]^+$ calcd. for $C_{72}H_{52}B_3N_3O_3S$ 1071.4033, observed 1071.4035

Synthesis Example (25): Synthesis of Compound (v-19-47

(v-19-47)

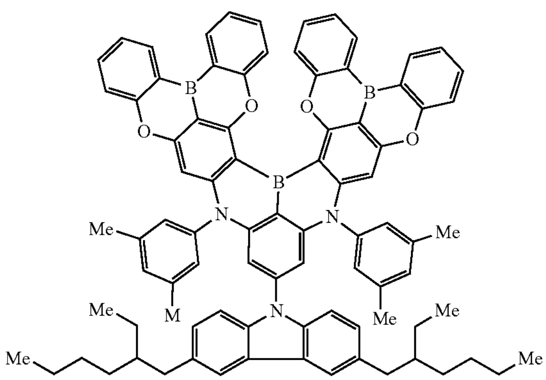

To a flask containing boron triiodide (0.627 g, 1.6 mmol) was added Intermediate (Int-v-19-47) (0.249 g, 0.20 mmol), 2,6-di-tert-butylpyridine (0.26 ml, 1.2 mmol), and ortho-dichlorobenzene (2.0 ml) at 0° C. under a nitrogen atmosphere. After completion of the dropwise addition, the reaction mixture was stirred for 4 hours. Hydrogen iodide in the reaction solution was distilled off at 0° C. under reduced pressure. After diluting the reaction solution with dichloromethane (50 ml), phosphate buffer solution (pH=7, 50 ml) was added at room temperature, the aqueous layer was extracted three times with dichloromethane, and the solvent was removed under reduced pressure. The crude product obtained was purified by silica gel column chromatography (eluents: hexane, hexane/dichloromethane=10/1, 8/1, 6/1, 4/1) to obtain Compound (v-19-47) (0.106 g, yield 42%) as a yellow solid.

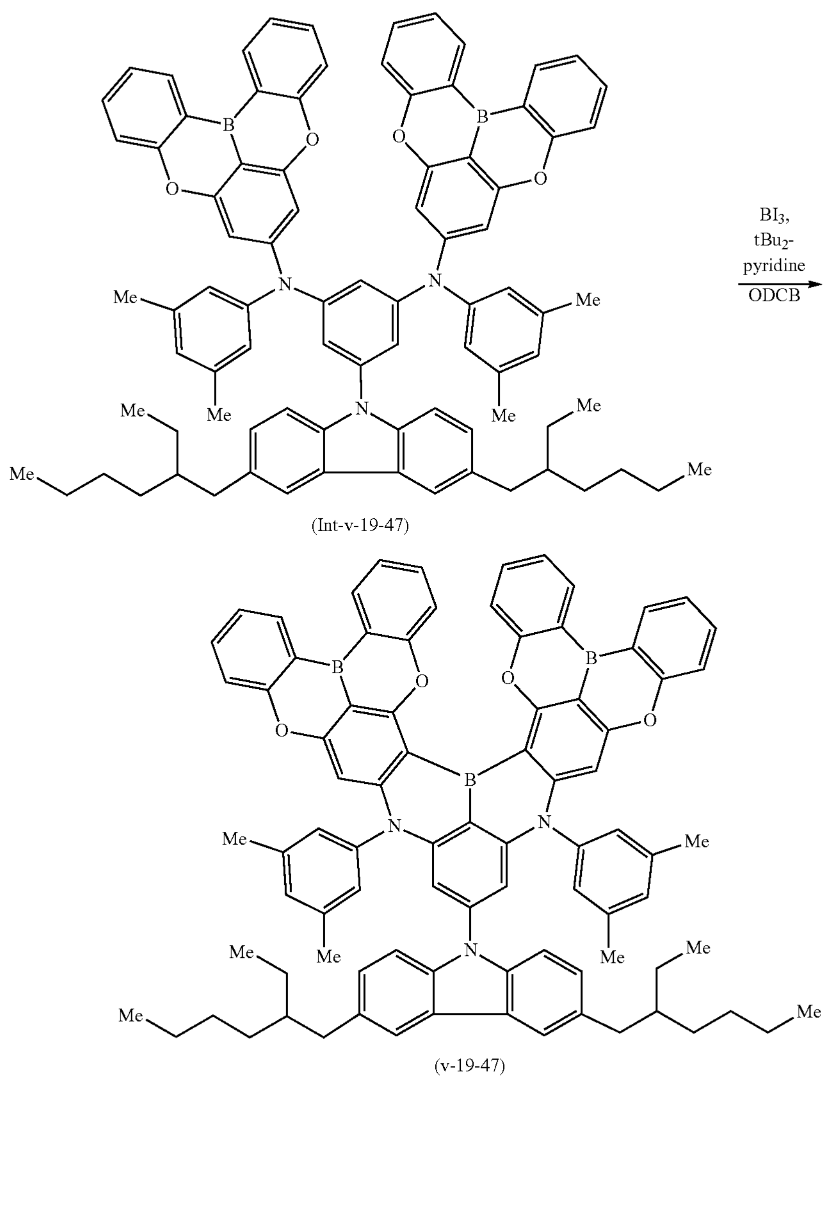

(Int-v-19-47)

(v-19-47)

Structure of the compound obtained was identified by NMR measurement.

1H-NMR (400 MHz, $CDCl_3$): δ=0.88-0.92 (m, 12H), 1.28-1.30 (m, 16H), 1.60-1.63 (m, 2H), 2.44-2.49 (d, 12H), 2.68 (d, 4H), 6.42 (d, 2H), 6.56 (s, 2H), 6.76 (s, 2H), 6.95-7.02 (m, 4H), 7.09 (d, 2H), 7.18-7.26 (m, 6H), 7.32 (d, 2H), 7.39 (t, 2H), 7.52 (d, 2H), 7.69 (t, 2H), 7.79 (s, 2H), 8.46 (d, 2H), 8.67 (d, 2H)

Synthesis Example (26): Synthesis of Compound (v-131-3) (Alternative Method 1

(v-131-3)

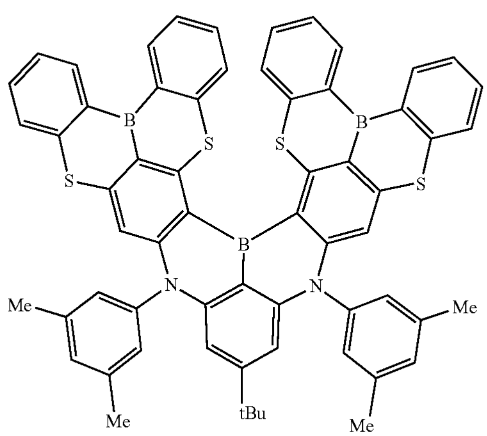

Compound (v-131-3) (0.06 g) was obtained by the same procedure as in Synthesis Example (22), except that Intermediate (Int2-v-19-27) was changed to Intermediate (Int2-131-3).

Compound (v-131-3) obtained was identified by NMR measurement.

1H-NMR (500 MHz, $CDCl_3$): δ=8.21 (d, 2H), 8.14 (d, 2H), 7.66 (d, 2H), 7.52 (t, 2H), 7.38 (t, 2H), 7.29 (s, 2H), 7.12-7.07 (m, 8H), 6.76 (t, 2H), 6.58 (d, 2H), 6.38 (s, 2H), 2.48 (s, 12H), 1.05 (s, 9H)

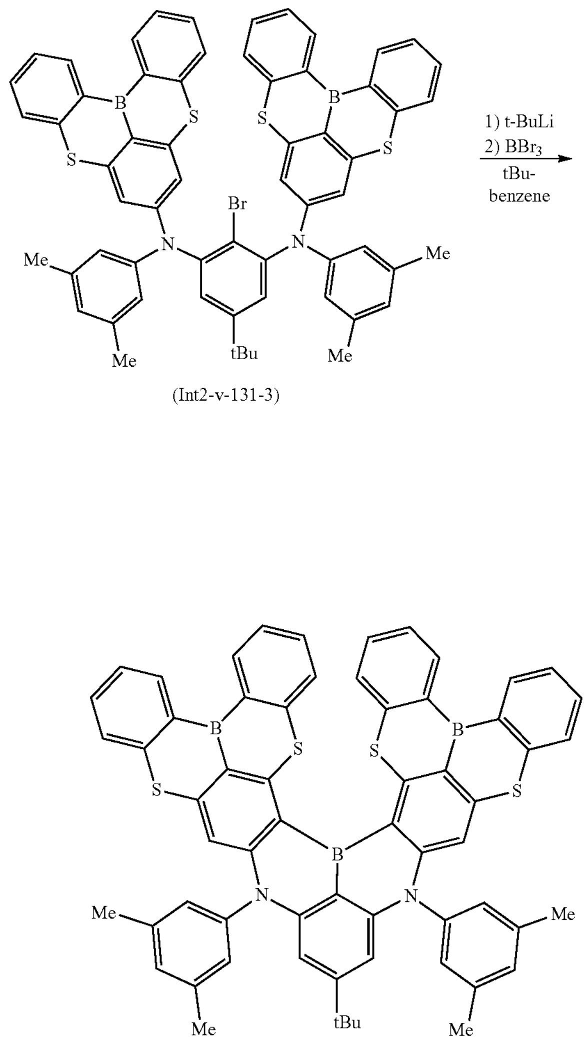

(Int2-v-131-3)

(v-131-3)

Synthesis Example (27): Synthesis of Compound (vi-70

(vi-70)

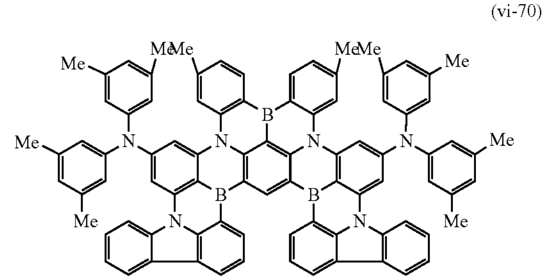 [SMILES: Cc1cc(C)cc(N(c2cc(C)cc(C)c2)c2cc3c4c(c2)-n2c5ccccc5c5cccc(c52)B4c2cc4c5c6c2N3c2cc(C)ccc2B6c2ccc(C)cc2N5c2cc(N(c3cc(C)cc(C)c3)c3cc(C)cc(C)c3)cc3c2B4c2cccc4c5ccccc5n-3c24)c1]

Compound (vi-70) (0.02 g) was obtained by the same procedure as in Synthesis Example (25), except that Intermediate (Int-v-19-47) was changed to Intermediate (Int-vi-70).

The target Compound (vi-70) was identified by LC-MS at m/z=1241.5759.

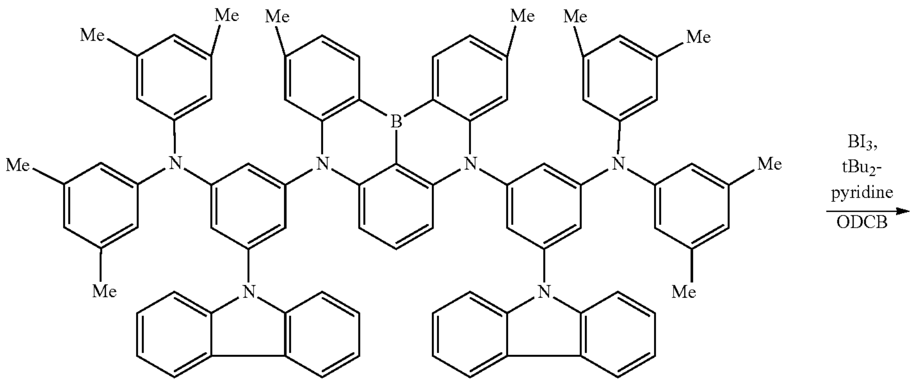
(Int-vi-70)
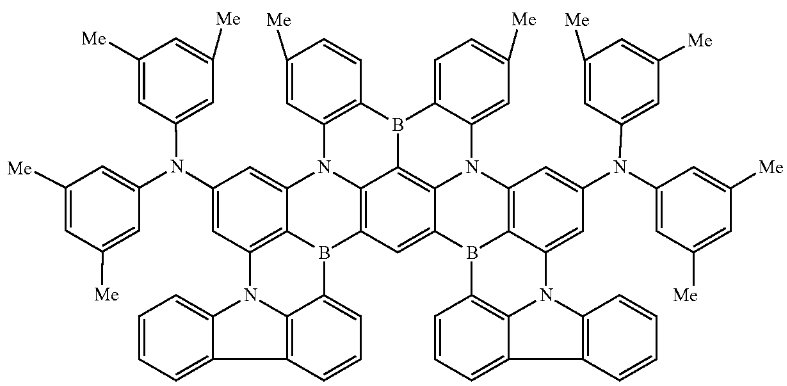
(vi-70)
Synthesis Example (28): Synthesis of Compound (vi-82
(vi-82)
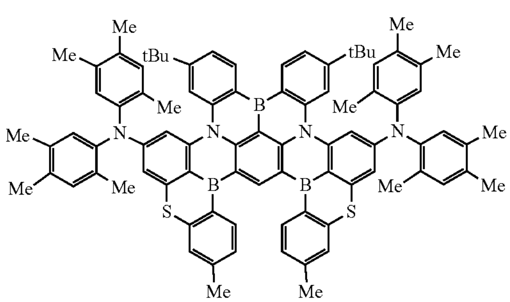
Compound (vi-82) (0.01 g) was obtained by the same procedure as in Synthesis Example (25), except that Intermediate (Int-v-19-47) was changed to Intermediate (Int-vi-82).
The target Compound (vi-82) was identified by LC-MS at m/z=1295.6571.

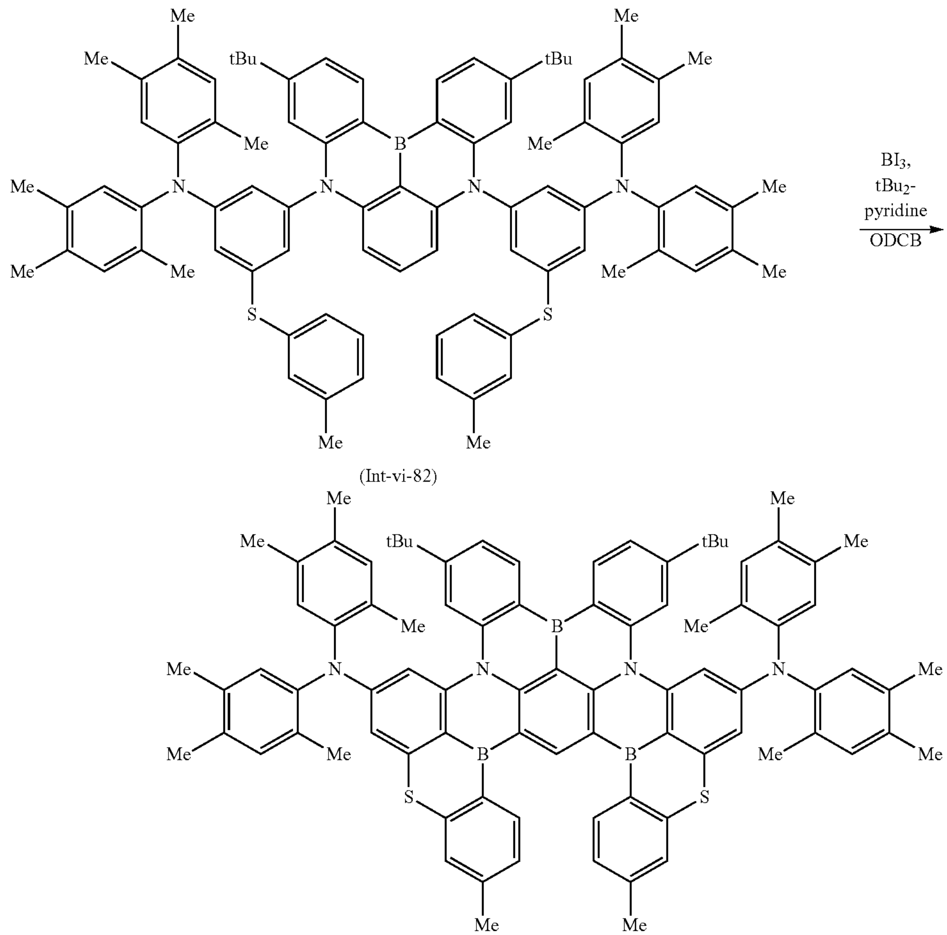
(Int-vi-82)
(vi-82)
Synthesis Example (29): Synthesis of Compound (vi-53
(vi-53)
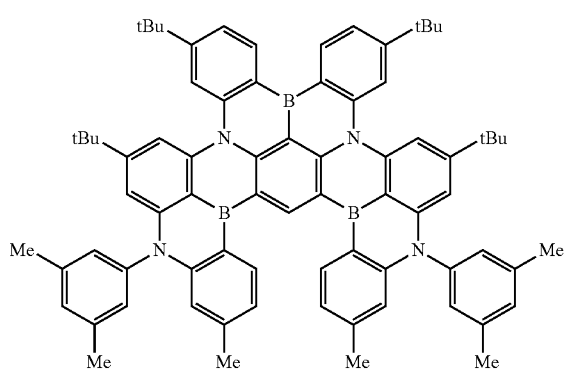
Compound (vi-53) (0.01 g) was obtained by the same procedure as in Synthesis Example (16), except that Intermediate (Int-vi-25) was changed to Intermediate (Int-vi-53).
The target Compound (vi-53) was identified by LC-MS at m/z=1079.6501.

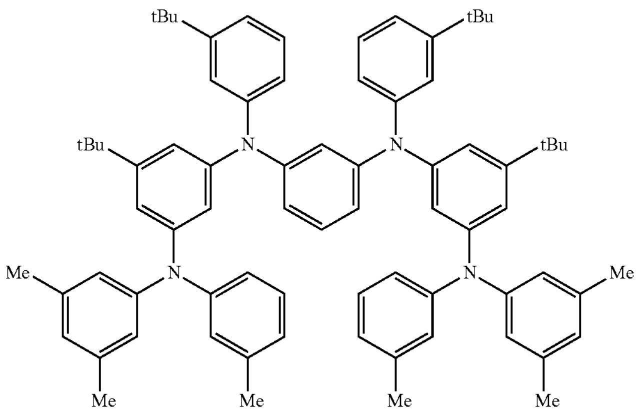

(Int-vi-53)

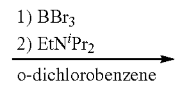

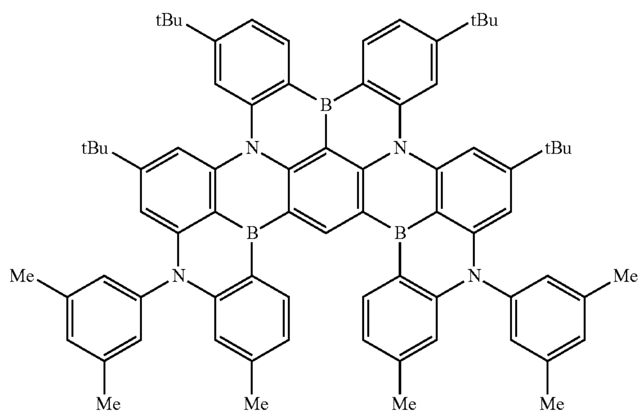

(vi-53)

Next, the evaluation of basic physical properties of the compound of the present invention and production and evaluation of an organic EL element using the compound of the present invention will be described. The application of the compounds of the invention is not limited to the examples shown below, and the film thickness and materials constituting each layer can be changed as needed depending on the basic physical properties of the compounds of the invention.

<<Production and Evaluation of Evaporation-Type Organic EL Element>>

TABLE 1

| | Hole injection layer | Hole transport layer 1 | Hole transport layer 2 | Light-emitting layer (20 nm) | | Electron-transport layer 1 | Electron-transport layer 2 | Cathode |
|---|---|---|---|---|---|---|---|---|
| | (40 nm) | (15 nm) | (15 nm) | Host | Dopant | (10 nm) | (20 nm) | (1 nm/100 nm) |
| Example 1 | NPD | TcTa | mCP | BH-1 | Compound (v-19-1) | 2CzBN | BPy-TP2 | LiF/Al |
| Comparative Example 1 | NPD | TcTa | mCP | BH-1 | Compound (RBD-1) | 2CzBN | BPy-TP2 | LiF/Al |
| Reference Example 1 | NPD | TcTa | mCP | BH-1 | Compound (RBD-2) | 2CzBN | BPy-TP2 | LiF/Al |
| Comparative Example 2 | NPD | TcTa | mCP | BH-1 | Compound (RBD-3) | 2CzBN | BPy-TP2 | LiF/Al |

In Table 1,
"NPD" is N,N'-diphenyl-N,N'-dinaphthyl-4,4'-diaminobiphenyl,
"TcTa" is 4,4',4"-tris(N-carbazolyl)triphenylamine,
"mCP" is 1,3-bis(N-carbazolyl)benzene,
"2CzBN" is 3,4-dicarbazolylbenzonitrile, and
"BPy-TP2" is 2,7-di([2,2'-bipyridin]-5-yl)triphenylene.
Chemical structures of them are shown below together with those of "BH-1" and "RBD-1".
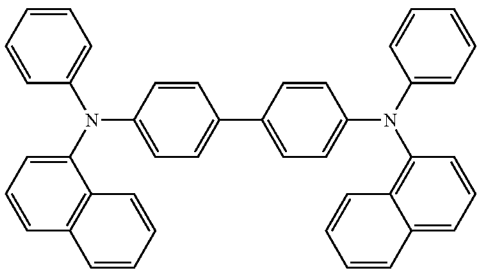
(NPD)
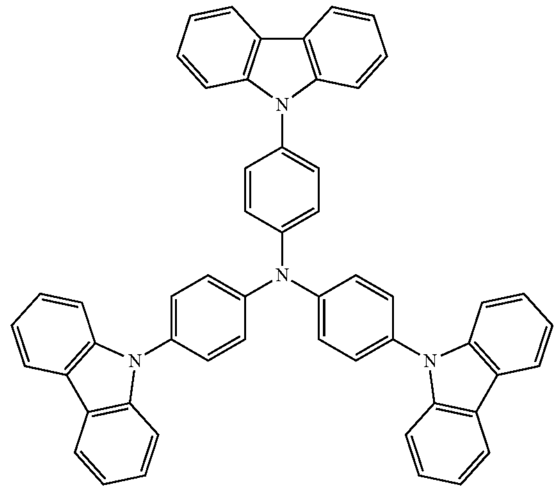
(TcTa)
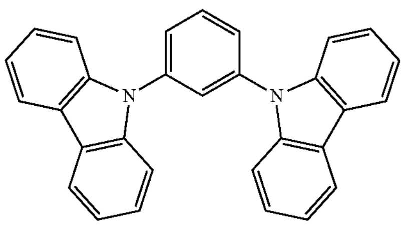
(mCP)
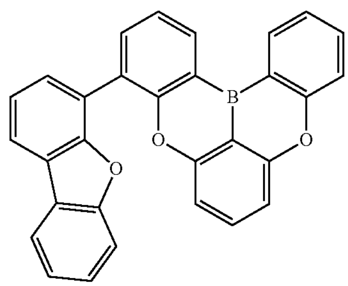
(BH-1)
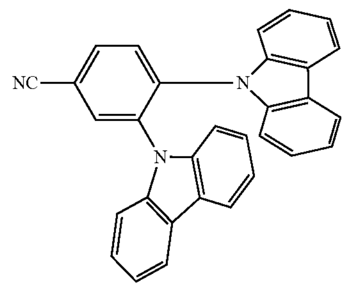
(2CzBN)
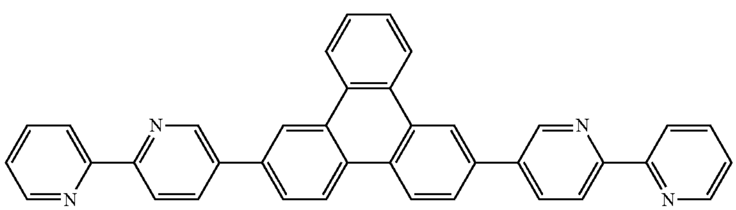
(BPy-TP2)
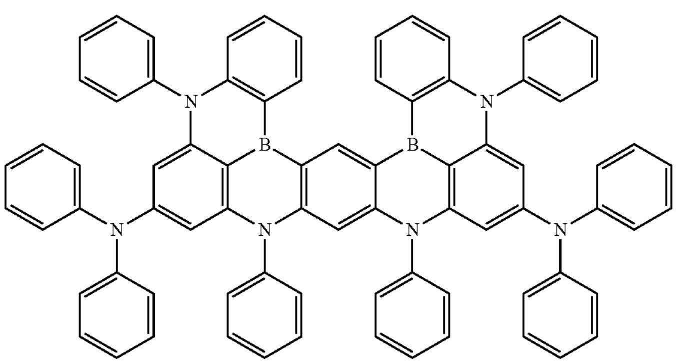
(RBD-1)

-continued

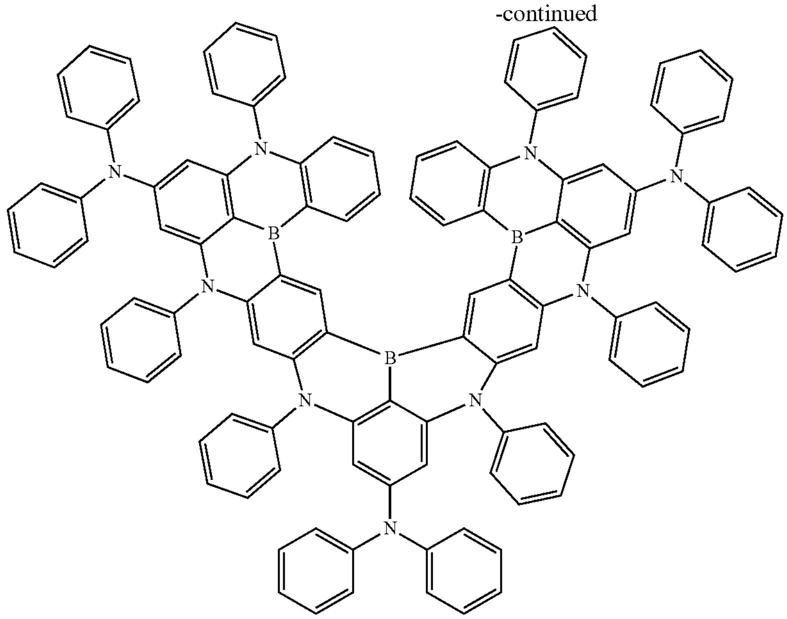

(RBD-2)

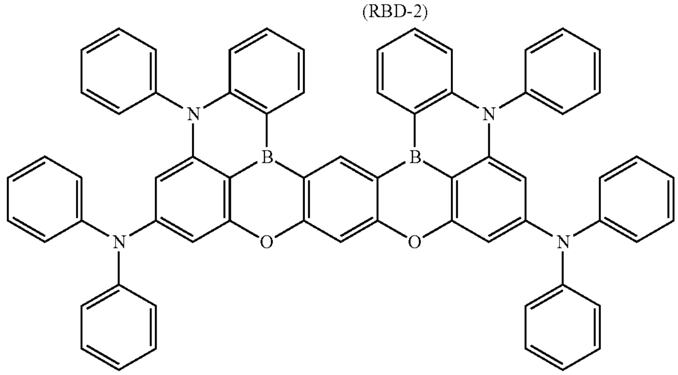

(RBD-3)

Each sample of Compound (v-19-1), RBD-1, RBD-2, and RBD-3 was dissolved in toluene with PMMA (polymethyl methacrylate) to obtain 1 wt % solution, and the solution was applied to a transparent supporting substrate of quartz (10 mm×10 mm) by a spin coating method to prepare a film in which the sample is dispersed in PMMA.

The sample was excited at a wavelength of 280 nm at room temperature to measure the photoluminescence thereof. Further, using a fluorescence lifetime measuring device (C11367-01, by Hamamatsu Photonics KK), the fluorescence lifetime was measured at 300 K. Specifically, a light-emitting component having a fast fluorescence lifetime and a light-emitting component having a slow fluorescence lifetime were observed at a maximum light emission wavelength to be measured at an excitation wavelength of 280 nm. In fluorescence lifetime measurement at room temperature for an ordinary organic EL material that emits fluorescence, a slow light emission component in which a phosphorescence-derived triplet component may participate owing to deactivation of the triplet component by heat is observed little. In the case where a slow light emission component is observed in a target compound, this indicates that the delayed fluorescence was observed by transfer of triplet energy having a long excitation lifetime to singlet energy by thermal activation.

Results are shown in Table 2.

TABLE 2

| | Evaluation_Results (dispersed in PMMA film) | |
|---|---|---|
| | emission wavelength [nm] | Tau(delay)[μsec] |
| Compound (v-19-1) | 445 | 2.4 |
| Compound (RBD-1) | 466 | 3.4 |
| Compound (RBD-2) | 477 | 1.3 |
| Compound (RBD-3) | 441 | 43 |

Example 1

<Configuration A: Element in which the Dopant is Compound (v-19-1)>

A glass substrate having a size of 26 mm×28 mm×0.7 mm prepared by forming a film of ITO having a thickness of 200 nm by sputtering and polishing the ITO film to 50 nm (manufactured by Opto Science, Inc.) was used as a transparent supporting substrate. The transparent support substrate was fixed to a substrate holder of a commercially available deposition apparatus (manufactured by Showa Vacuum Co., Ltd.), molybdenum deposition boats each containing NPD, TcTa, mCP, BH-1, Compound (v-19-1), 2CzBN, and BPy-TP2 respectively, and tungsten deposition boat containing LiF and aluminum were mounted.

The following layers were sequentially formed on the ITO film of the transparent supporting substrate. The vacuum chamber was depressurized to $5\times10^{-4}$ Pa, a deposition was performed by heating NPD to a thickness of 40 nm to form a hole injection layer. Then a deposition was performed by heating TcTa to a thickness of 15 nm to form a hole transport layer. Next, a deposition was performed by heating mCP to a thickness of 15 nm to form an electron blocking layer. Next, a deposition was performed by simultaneously heating BH-1 and compound (v-19-1) to form a light-emitting layer to a thickness of 20 nm. The deposition rate was adjusted so that the mass ratios of BH-1 and compound (v-19-1) were approximately 99 to 1. Next, depositions were performed by heating 2CzBN to a thickness of 10 nm and by heating BPy-TP2 to a thickness of 20 nm to form a to form a two-layered electron-transport layer. The deposition rate of each of the above layers was 0.01 to 1 nm/sec. Thereafter, a deposition was performed by heating LiF at a deposition rate of 0.01 to 0.1 nm/sec to a film thickness of 1 nm, and then a deposition was performed by heating aluminum to a film thickness of 100 nm to form a cathode, thereby obtaining an organic EL element. At this time, the deposition rate of aluminum was adjusted to be 1 nm to 10 nm/sec.

Comparative Example 1: Comparative Example 2 and Reference Example 1

Elements were manufactured by changing the dopant in Example 1, Compound (v-19-1) to each of the dopants listed in Table 1.

<Evaluation>

For the elements obtained above, DC voltages were applied with the ITO electrode as an anode and aluminum electrode as a cathode, emission wavelength, half-width, drive voltage, current density, and external quantum efficiency of the organic EL elements during 500 cd/m$^2$ light emission were measured, and LT50 (the time to 250 cd/m$^2$ when continuously driven at current density at initial luminance of 500 cd/m$^2$) was measured.

Results are shown in Table 3.

TABLE 3

| | | Evaluation results at 500 cd/m$^2$ luminance | | | | | |
|---|---|---|---|---|---|---|---|
| | Dopant | emission wavelength [nm] | half-width [nm] | drive voltage [V] | current density [mA/cm$^2$] | efficiency (EQE) [%} | Lifetime LT50 [hrs] |
| Example1 | Compound (v-19-1) | 450 | 27 | 4.9 | 2.1 | 27 | 52 |
| Comparative Example 1 | Compound (RBD-1) | 471 | 20 | 4.9 | 2 | 27 | 29 |
| Reference Example 1 | Compound (RBD-2) | 410 | 60 | 5.1 | 2 | 1.0 | <1 |
| Comparative Example 2 | Compound (RBD-3) | 445 | 23 | 4.9 | 2.2 | 19 | 10 |

In Example 1, longer lifetime was obtained than in Comparative Example 1 due to the compound's higher TADF property (smaller Tau(delay)). For Compound RBD-2, the result of the evaluation of the film was different from the emission wavelength of the device (Reference Example 1). The host is considered to emit light in the elements. The reason may be that decomposition occurred during deposition due to the large molecular weight of the compound. Comparing Example 1 with Example 2 for compounds with similar skeletons having one or two substructures represented by formula (1B), compounds having two substructures represented by formula (1B) have a higher TADF property. As for the characteristics of the elements, the one using the compound (v-19-1), which has high TADF, had higher efficiency and longer lifetime.

Example 2

<Configuration B: Element in which the Dopant is Compound (v-19-1)>

A glass substrate having a size of 26 mm×28 mm×0.7 mm prepared by forming a film of ITO having a thickness of 200 nm by sputtering and polishing the ITO film to 50 nm (manufactured by Opto Science, Inc.) was used as a transparent supporting substrate. The transparent support substrate was fixed to a substrate holder of a commercially available deposition apparatus (manufactured by Showa Vacuum Co., Ltd.), molybdenum deposition boats each containing NPD, TcTa, mCP, BH-2, Compound (v-19-1), 2CzBN, and BPy-TP2 respectively, and tungsten deposition boat containing LiF and aluminum were mounted.

The following layers were sequentially formed on the ITO film of the transparent supporting substrate. The vacuum chamber was depressurized to $5\times10^{-4}$ Pa, a deposition was performed by heating NPD to a thickness of 40 nm to form a hole injection layer. Then a deposition was performed by heating TcTa to a thickness of 15 nm to form a hole transport layer. Next, a deposition was performed by heating mCP to a thickness of 15 nm to form an electron blocking layer. Next, a deposition was performed by simultaneously heating BH-2 and compound (v-19-1) to form a light-emitting layer to a thickness of 20 nm. The deposition rate was adjusted so that the mass ratios of BH-2 and compound (v-19-1) were approximately 99 to 1. Next, depositions were performed by heating 2CzBN to a thickness of 10 nm and by heating BPy-TP2 to a thickness of 20 nm to form a two-layered electron-transport layer. The deposition rate of each of the above layers was 0.01 to 1 nm/sec. Thereafter, a deposition was performed by heating LiF at a deposition rate of 0.01 to 0.1 nm/sec to a film thickness of 1 nm, and then a deposition was performed by heating aluminum to a film thickness of 100 nm to form a cathode, thereby obtaining an organic EL element. At this time, the deposition rate of aluminum was adjusted to be 1 nm to 10 nm/sec.

Comparative Example 3, Examples 3 to 13

Each organic EL element was produced by changing Compound (v-19-1), the dopant in Example 2, to each dopant listed in Table 4.

<Evaluation>

For the elements obtained above, DC voltages were applied with the ITO electrode as an anode and aluminum electrode as a cathode, emission wavelength, half-width, drive voltage, current density, and external quantum efficiency of the organic EL elements during 500 cd/m$^2$ light emission were measured, and LT50 (the time to 250 cd/m$^2$ when continuously driven at current density at initial luminance of 500 cd/m$^2$) was measured.

Results are shown in Table 5.

TABLE 4

| | Hole injection layer | Hole transport layer 1 | Hole transport layer 2 | Light-emitting layer (20 nm) | | Electron-transport layer 1 | Electron-transport layer 2 | Cathode |
|---|---|---|---|---|---|---|---|---|
| | (40 nm) | (15 nm) | (15 nm) | Host | Dopant | (10 nm) | (20 nm) | (1 nm/100 nm) |
| Example 2 | NPD | TcTa | mCP | BH-2 | Compound (v-19-1) | 2CzBN | BPy-TP2 | LiF/Al |
| Comparative Example 3 | NPD | TcTa | mCP | BH-2 | Compound (RBD-4) | 2CzBN | BPy-TP2 | LiF/Al |
| Example 3 | NPD | TcTa | mCP | BH-2 | Compound (v-118-1) | 2CzBN | BPy-TP2 | LiF/Al |
| Example 4 | NPD | TcTa | mCP | BH-2 | Compound (v-164-1) | 2CzBN | BPy-TP2 | LiF/Al |
| Example 5 | NPD | TcTa | mCP | BH-2 | Compound (v-19-27) | 2CzBN | BPy-TP2 | LiF/Al |
| Example 6 | NPD | TcTa | mCP | BH-2 | Compound (v-118-2) | 2CzBN | BPy-TP2 | LiF/Al |
| Example 7 | NPD | TcTa | mCP | BH-2 | Compound (v-19-28) | 2CzBN | BPy-TP2 | LiF/Al |
| Example 8 | NPD | TcTa | mCP | BH-2 | Compound (v-138-2) | 2CzBN | BPy-TP2 | LIF/Al |
| Example 9 | NPD | TcTa | mCP | BH-2 | Compound (v-136-2) | 2CzBN | BPy-TP2 | LiF/Al |
| Example 10 | NPD | TcTa | mCP | BH-2 | Compound (v-171-2) | 2CzBN | BPy-TP2 | LiF/Al |
| Example 11 | NPD | TcTa | mCP | BH-2 | Compound (vi-25) | 2CzBN | BPy-TP2 | LiF/Al |
| Example 12 | NPD | TcTa | mCP | BH-2 | Compound (v-131-3) | 2CzBN | BPy-TP2 | LiF/Al |
| Example 13 | NPD | TcTa | mCP | BH-2 | Compound (v-165-1) | 2CzBN | BPy-TP2 | LiF/Al |

The structures of “BH-2” and “RBD-4” are shown below.

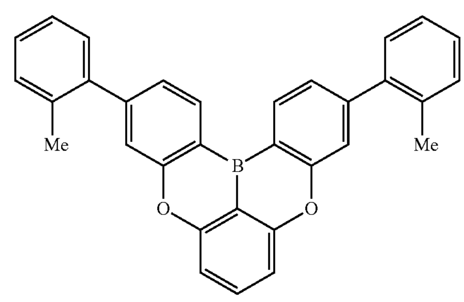

(BH-2)

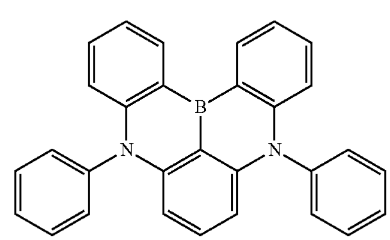

(RBD-4)

TABLE 5

| | Dopant | Evaluation results at 500 cd/m$^2$ luminance emission wavelength [nm] | half-width [nm] | drive voltage [V] | current density [mA/cm$^2$] | efficiency (EQE) [%} | Lifetime LT50 [hrs] |
|---|---|---|---|---|---|---|---|
| Example 2 | Compound (v-19-1) | 450 | 27 | 4.8 | 2.1 | 24 | 52 |
| Comparative Example 3 | Compound (RBD-4) | 455 | 27 | 5.3 | 2 | 12 | <1 |
| Example 3 | Compound (v-118-1) | 455 | 23 | 4.8 | 2.1 | 24 | 69 |
| Example 4 | Compound (v-164-1) | 457 | 24 | 4.8 | 2.1 | 26 | 91 |
| Example 5 | Compound (v-19-27) | 455 | 27 | 4.7 | 2.1 | 22 | 55 |
| Example 6 | Compound (v-118-2) | 456 | 24 | 4.8 | 2.1 | 25 | 82 |
| Example 7 | Compound (v-19-28) | 452 | 24 | 4.8 | 2.1 | 24 | 61 |
| Example 8 | Compound (v-138-2) | 467 | 26 | 4.8 | 2.1 | 27 | 77 |
| Example 9 | Compound (v-136-2) | 467 | 26 | 4.8 | 2.1 | 26 | 80 |
| Example 10 | Compound (v-171-2) | 462 | 26 | 4.7 | 2.1 | 25 | 74 |
| Example 11 | Compound (vi-25) | 477 | 25 | 4.6 | 2.1 | 25 | 60 |
| Example 12 | Compound (v-131-3) | 516 | 43 | 4.3 | 1.9 | 29 | 84 |
| Example 13 | Compound (v-165-1) | 461 | 27 | 4.7 | 2.0 | 25 | 77 |

Compounds with asymmetric structures, Compound (v-118-1), Compound (v-118-2) and Compound (v-164-1), showed higher efficiency or longer lifetime than those with symmetric structures. Similarly, Compound (v-164-1), Compound (v-138-2), Compound (v-136-2), and Compound (v-171-2), which are compounds with sulfur atoms in the molecule, showed higher efficiency or longer lifetime than those without sulfur atoms in the molecule.

<<Production and Evaluation of Coating-Type (Light-Emitting Layer) Organic EL Element>>

Synthesis Example: Synthesis of High Molecular Host Compound: SPH-101

SPH-101 was synthesized according to the method described in WO2015/008851. A copolymer in which M2 or M3 is bonded next to M1 was obtained. From the charging ratio, each unit is estimated to be 50:26:24 (molar ratio). In the following formula, Me is methyl, Bpin is pinacolatoboryl, and * is a linking position of each unit.

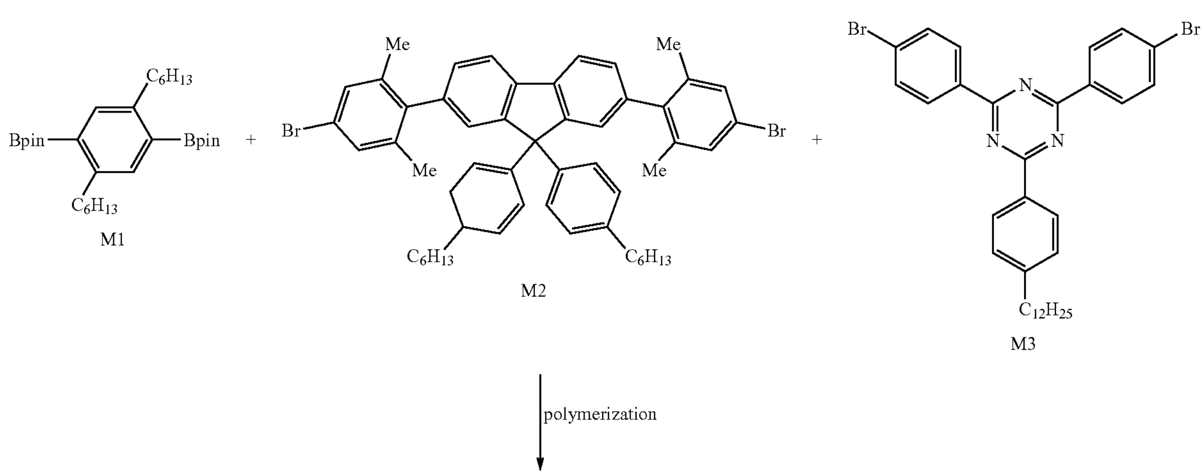

-continued

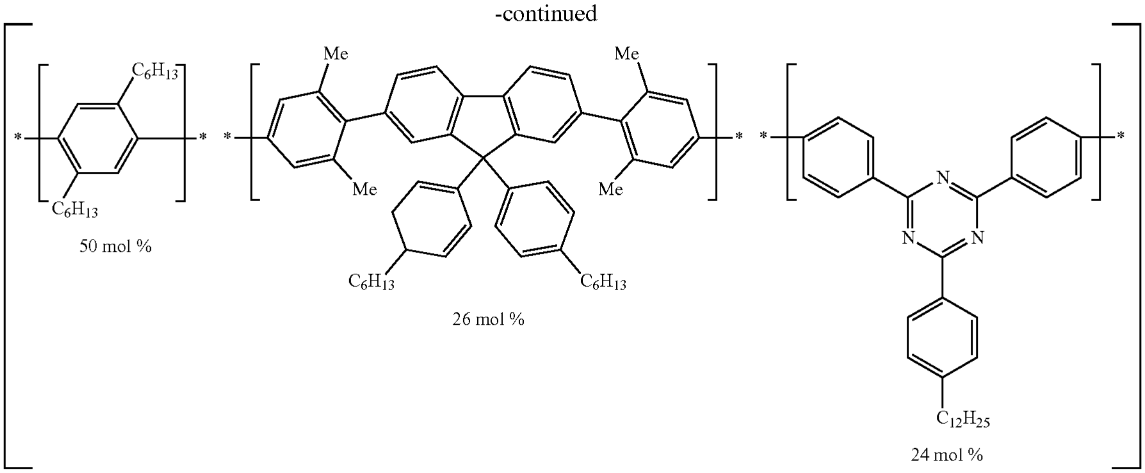

SPH-101

Synthesis Example: Synthesis of High Molecular Hole Transport Compound: XLP-101

XLP-101 was synthesized according to the method described in JP 2018-61028 A. A copolymer in which M4 or M5 were bonded next to M6 was obtained. From the charging ratio, each unit is estimated to be 40:10:50 (molar ratio). In the following formula, Me is methyl, Bpin is pinacolatoboryl, and * is a linking position of each unit.

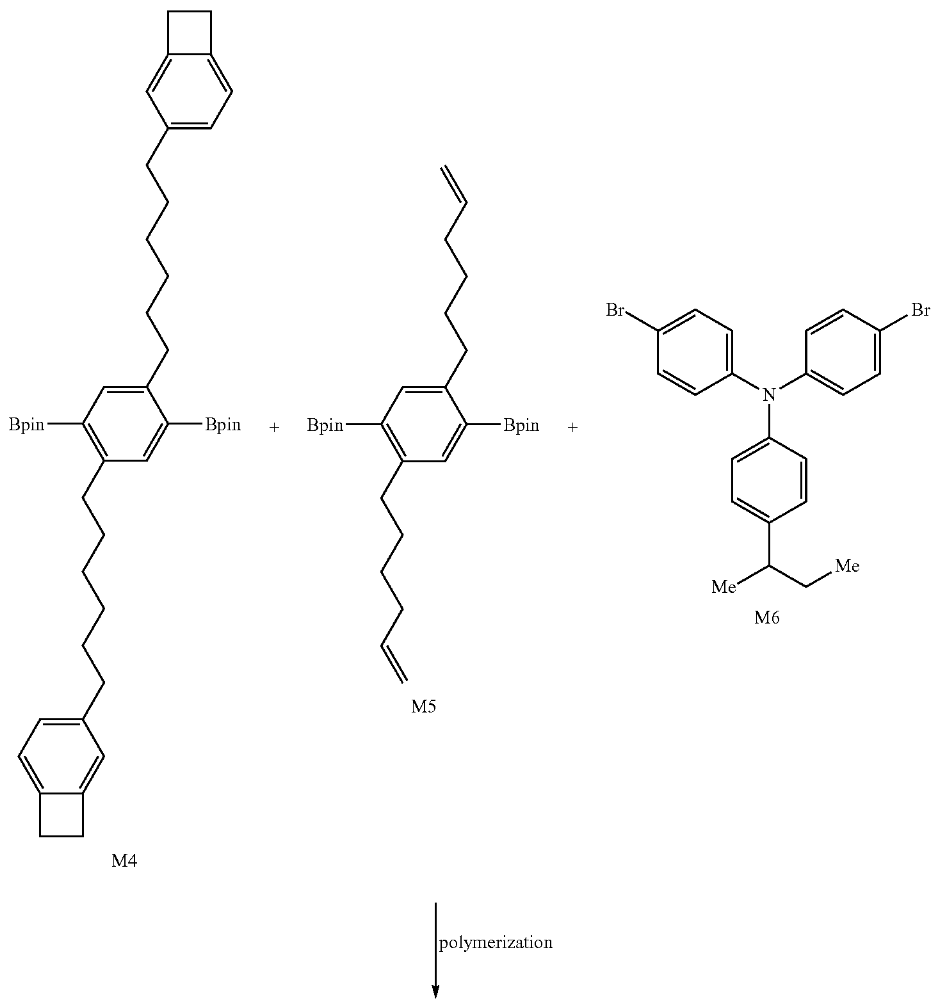

-continued

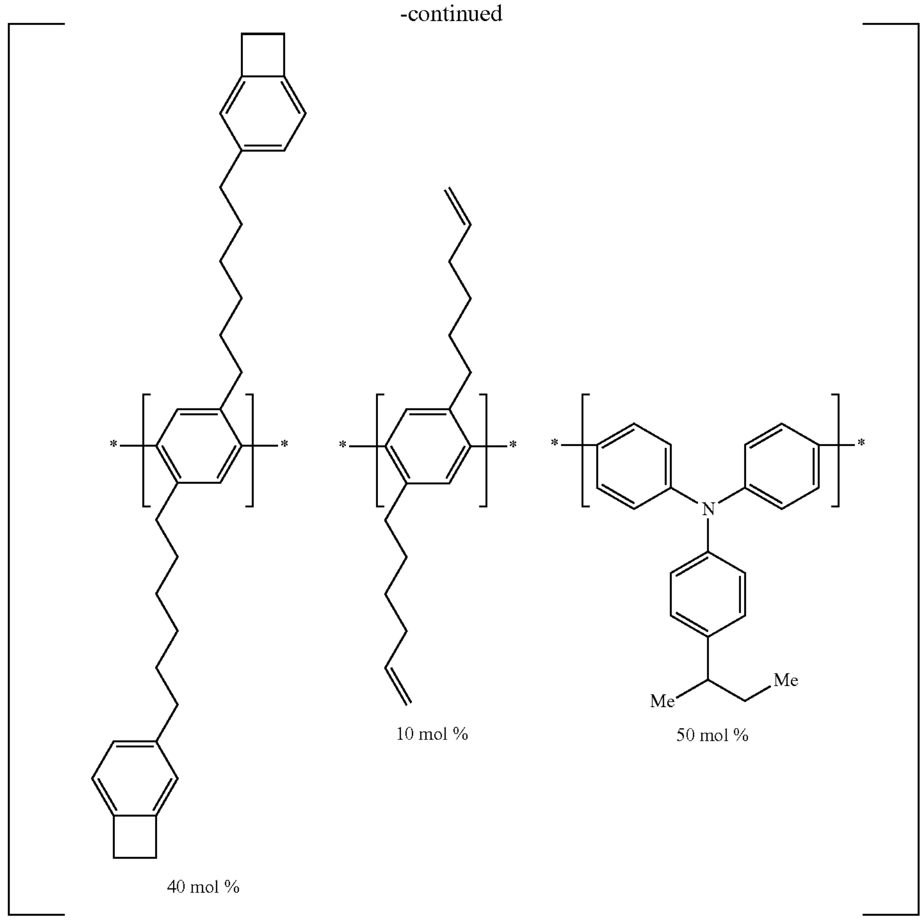

XLP-101

<Preparation of XLP-101 Solution>

A 0.6 wt % XLP-101 Solution was prepared by dissolving XLP-101 in xylene.

<Preparation of Light-Emitting Layer Forming Composition>

A light-emitting layer forming composition of Example F-1 can be prepared. The compounds used for the preparation of the composition are shown below.

Example F-1

A light-emitting layer forming composition is prepared by stirring the following components until a uniform solution is obtained.

| | |
|---|---|
| Compound (v-19-1) | 0.04 % by mass |
| SPH-101 | 1.96 % by mass |
| xylene | 69.00 % by mass |
| Decalin | 29.00 % by mass |

By spin-coating the prepared light-emitting layer forming composition on a glass substrate and heating and drying under reduced pressure, a coating film having no film defects and excellent smoothness is obtained.

<Production of Organic EL Element>

Examples S-1 and S-2 show a method of manufacturing an organic EL element using a crosslinkable hole transport material, and Example S-3 shows a method of manufacturing an organic EL element using an orthogonal solvent system. The material composition of each layer in the organic EL element to be manufactured is shown in Table 6.

TABLE 6

| | Hole injection layer | Hole transport layer | Light-emitting layer (20 nm) | | | Electron transport layer | Cathode |
|---|---|---|---|---|---|---|---|
| | (40 nm) | (30 nm) | Host | Dopant | Composition | (30 nm) | (1 nm/100 nm) |
| Example S-1 | PEDOT:PSS | OTPD | SPH-101 | v-19-1 | Example F-1 | ET1 | LiF/Al |
| Example S-2 | PEDOT:PSS | XLP-101 | SPH-101 | v-19-1 | Example F-1 | ET1 | LiF/Al |

TABLE 6-continued

| | Hole injection layer (40 nm) | Hole transport layer (30 nm) | Light-emitting layer (20 nm) Host | Dopant | Composition | Electron transport layer (30 nm) | Cathode (1 nm/100 nm) |
|---|---|---|---|---|---|---|---|
| Example S-3 | PEDOT:PSS | PCz | SPH-101 | v-19-1 | Example F-1 | ET1 | LiF/Al |

The structures of "PEDOT:PSS", "OTPD", "PCz", "ET1" in Table 6 are shown below.

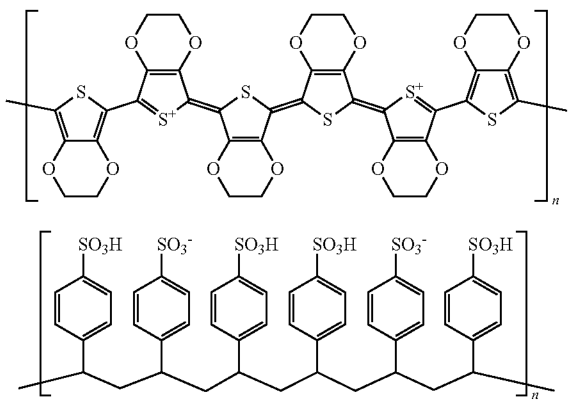

PEDOT:PSS

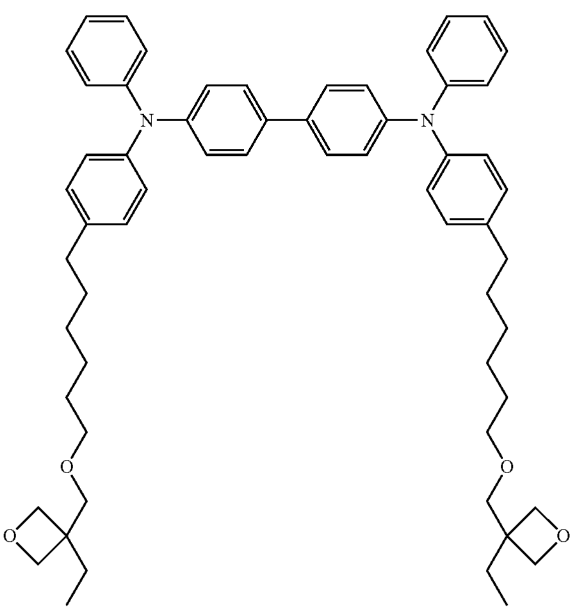

OTPD

-continued

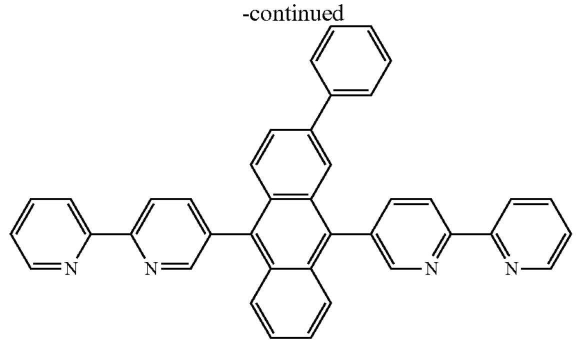

ET1

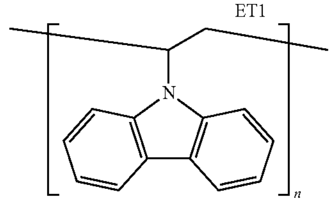

PCz

<PEDOt:PSS Solution>

A commercially-available PEDOT:PSS solution (Clevios™ P VP AI4083, a water dispersion of PEDOT:PSS, manufactured by Heraeus Holdings) is used.

<Preparation of OTPD Solution>

By dissolving OTPD (LT-N159, manufactured by Luminescence Technology Corp.) and IK-2 (a photocationic polymerization initiator, manufactured by San-Apro Ltd.) in toluene, an OTPD solution of OTPD concentration of 0.7 wt % and IK-2 concentration of 0.007 wt % is prepared.

<Preparation of PCz Solution>

By dissolving PCz (polyvinylcarbazole) in dichlorobenzene, PCz solution of 0.7 wt % was prepared.

Example S-1

A PEDOT:PSS solution is spin-coated on a glass substrate on which ITO is deposited to a thickness of 150 nm, and the glass substrate is baked on a hot plate at 200° C. for 1 hour to form a PEDOT:PSS film having a film thickness of 40 nm (hole injection layer). OTPD solutions are then spin-coated and dried on 80° C. hot plates for 10 minutes. A 30 nm thick OTPD film insoluble in the solution is formed by exposing to light in an exposure 100 mJ/$cm^2$ and baking on a hot plate at 100° C. for 1 hour (hole transport layer). Then, the light-emitting layer forming composition of Example F-1 is spin-coated and baked on a hot plate at 120° C. for 1 hour to form a light-emitting layer having a film thickness of 20 nm.

The prepared multilayer film is fixed on a substrate holder of a commercially available vapor deposition apparatus (manufactured by Showa Vacuum Co., Ltd.). A molybdenum vapor deposition boat containing ET1, a molybdenum vapor deposition boat containing LiF, and a tungsten vapor deposition boat containing aluminum are mounted in the apparatus. After the vacuum chamber is depressurized to $5\times10^{-4}$ Pa, vapor deposition is performed to obtain a film thickness of 30 nm by heating the deposition boat containing ET1 to form an electron transport layer. The deposition rate when forming the electron transport layer is 1 nm/sec. Thereafter, vapor deposition is performed to obtain a film thickness of 1 nm by heating the deposition boat containing LiF at a deposition rate of 0.01 to 0.1 nm/sec. Next, vapor deposition is performed to obtain a film thickness of 100 nm by heating the deposition boat containing aluminum to form a cathode. In this manner, an organic EL element is obtained.

INDUSTRIAL APPLICABILITY

The polycyclic aromatic compound of the present invention is useful as a material for an organic device, especially as a material for a light-emitting layer for forming a light-emitting layer in an organic electroluminescent element.

REFERENCE SIGNS LIST

- 100 Organic Electroluminescent Element
- 101 Substrate
- 102 Anode
- 103 Hole Injection Layer
- 104 Hole Transport Layer
- 105 Light-Emitting Layer
- 106 Electron Transport Layer
- 107 Electron Injection Layer
- 108 Cathode
- 110 Substrate
- 120 Electrode
- 130 Coating film
- 140 Coating film
- 150 Light Emitting Layer
- 200 Bank
- 300 Ink jet head
- 310 Droplet of ink

The invention claimed is:

1. A polycyclic aromatic compound consisting of a substructure represented by Formula (1A) and at least two substructures represented by Formula (1B):

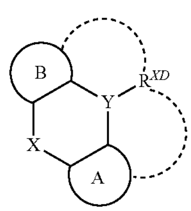

(1A)

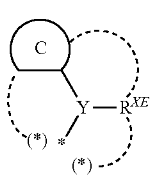

(1B)

in Formula (1A) and Formula (1B),

A ring and B ring are each independently an aryl ring which may be substituted or a heteroaryl ring which may be substituted, $R^{XD}$ is an aryl which may be substituted, a heteroaryl which may be substituted, an alkyl which may be substituted, or a cycloalkyl which may be substituted, and may be bonded to A ring via a dashed-line which is —X— or single bond, $R^{XD}$ may be bonded to B ring via a dashed-line which is —X—, —X'—, or single bond, each of C rings is independently an aryl ring which may be substituted or a heteroaryl ring which may be substituted, and may be bonded to a ring to which the substructure represented by Formula (1B) is bonded or X at a position of (*) via a dashed line which is —X— or single bond, $R^{XE}$ is an aryl which may be substituted, a heteroaryl which may be substituted, an alkyl which may be substituted, or a cycloalkyl which may be substituted, and may be bonded to a ring to which the substructure represented by Formula (1B) is bonded or X at a position of (*) via a dashed line which is —X— or single bond, $R^{XE}$ may be bonded to C ring via a dashed-line which is —X—, —X'—, or single bond, the substructure represented by Formula (1B) is bonded to a ring constituting atom of the aryl or heteroaryl ring in one selected from the group consisting of A ring, B ring and $R^{XD}$, and C ring and $R^{XE}$ in another substructure represented by Formula (1B) at position *, each of Y is independently B, P, P═O, or P═S, each of X is independently >C(—R)$_2$, >N—R, >O, >Si(—R)$_2$, >S, or >Se, X' is an arylene, a heteroarylene, or a binary linking group consisting of a combination of an arylene or a heteroarylene and one or more selected from the group consisting of >C(—R)$_2$, >N—R, >O, >Si(—R)$_2$, and >S, R in >N—R in X and X' is hydrogen, an aryl which may be substituted, a heteroaryl which may be substituted, an alkyl which may be substituted, a cycloalkyl which may be substituted or a bonding hand to (*), R in >C(—R)$_2$ and >Si(—R)$_2$ in X and X' are hydrogen, an aryl which may be substituted, an alkyl which may be substituted, or a cycloalkyl which may be substituted, two R's in each >C(—R)$_2$ and >Si(—R)$_2$ may be bonded to each other to form a ring, and at least one of R in >N—R, >C(—R)$_2$ and >Si(—R)$_2$ may be bonded to at least one of A ring, B ring, C ring, $R^{XD}$, or $R^{XE}$, via a linking group or single bond, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

2. The polycyclic aromatic compound according to claim 1, wherein $R^{XD}$ is an aryl which may be substituted or a heteroaryl which may be substituted, and bonded to A ring via the dashed line which is —X—, and $R^{XE}$ is an aryl which may be substituted or a heteroaryl which may be substituted.

3. The polycyclic aromatic compound according to claim 2, comprising at least one nitrogen-containing heteroaryl ring which may be substituted as A ring, B ring, C ring, $R^{XD}$, or $R^{XE}$.

4. The polycyclic aromatic compound according to claim 2, comprising two substructures represented by Formula (1B), wherein one of the substructures represented by Formula (1B) is bonded to a ring constituting atom of the aryl or heteroaryl ring in B ring at the position of *, bonded to a ring constituting atom of the aryl or the heteroaryl ring in B ring such that B ring and C ring are bonded to each other via —X— at the position of (*), and bonded to a ring constituting atom of the aryl or heteroaryl ring in B ring such that B ring and $R^{XE}$ are bonded to each other via —X— at the position of (*), the other of the substructures represented by Formula (1B) is bonded to a ring constituting atom of the aryl or heteroaryl ring in $R^{XD}$ at the position of*, bonded to a ring constituting atom of the aryl or heteroaryl ring in $R^{XD}$ such that $R^{XD}$ and C ring are bonded to each other via —X— at the position of (*), and bonded to a ring constituting atom of the aryl or heteroaryl ring in $R^{XD}$ such that $R^{XD}$ and $R^{XE}$ are bonded to each other via —X— at the position of (*).

5. A polycyclic aromatic compound according to claim 4, which is represented by the following formula:

(III-10)

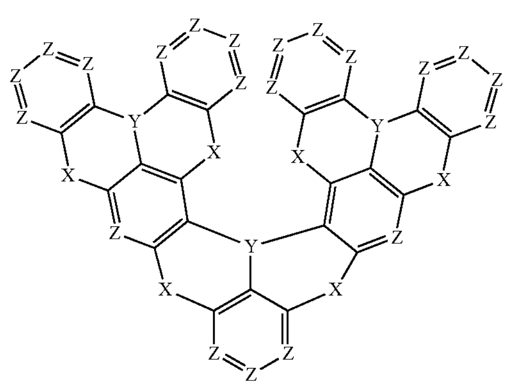

wherein each of Y is independently B, P, P═O, or P═S, each of X is independently >C(—R)$_2$, >N—R, >O, >Si(—R)$_2$, >S or >Se, R in >N—R is an aryl which may be substituted, a heteroaryl which may be substituted, an alkyl which may be substituted, or a cycloalkyl which may be substituted, R in >C(—R)$_2$ and >Si(—R)$_2$ is hydrogen, an aryl which may be substituted, an alkyl which may be substituted, or a cycloalkyl which may be substituted, and may be bonded to each other via a linking group, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—$R^Z$)═ or —N═ and any two adjacent Z's may be replaced with —C(—$R^Z$)$_2$—, —Si(—$R^Z$)$_2$—, —N(—$R^Z$)—, —O—, —S—, or —Se—, each of $R^Z$ is independently hydrogen or a substituent, and any adjacent groups among $R^Z$ may be bonded to each other to form an aryl ring or a heteroaryl ring together with the ring to which the adjacent groups $R^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —$CH_2$— in the cycloalkane may be replaced with —O—, and at least one hydrogen in the polycyclic aromatic compound may be replaced with deuterium, cyano, or halogen.

6. The polycyclic aromatic compound according to claim 5, which is represented by any one of the following formulas:

(v-19-1)

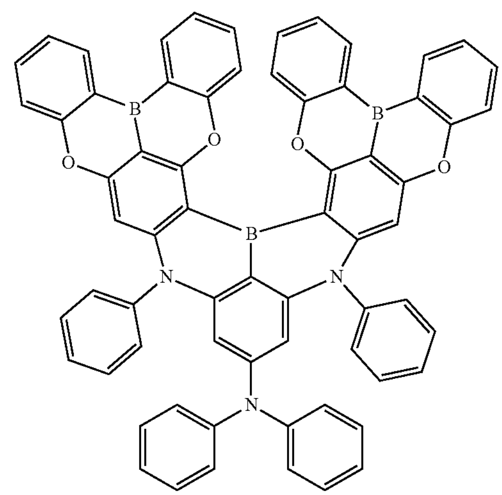

(v-18-1)

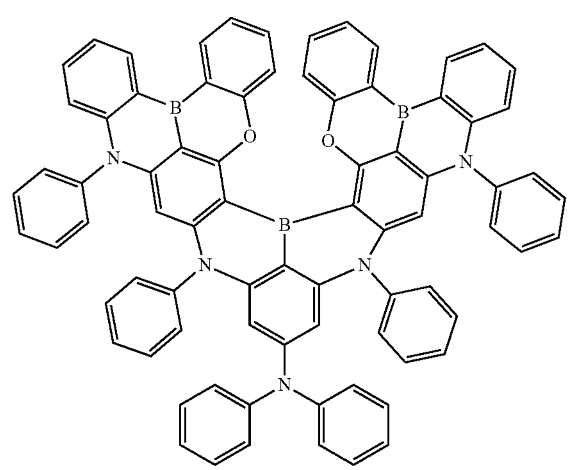

-continued
(v-19N1-1)
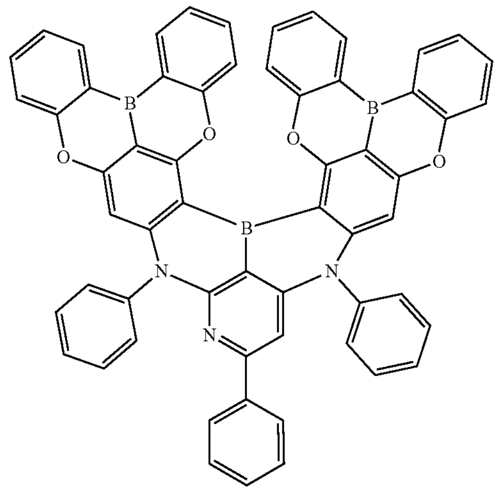
(v-19-27)
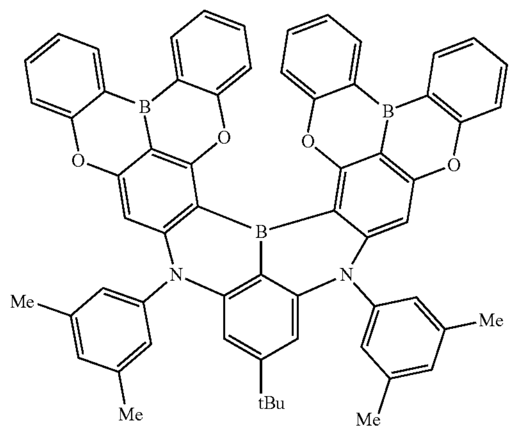
(v-19-28)
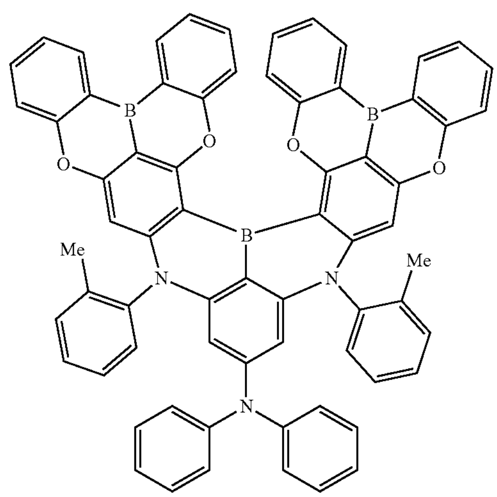
-continued
(v-138-2)
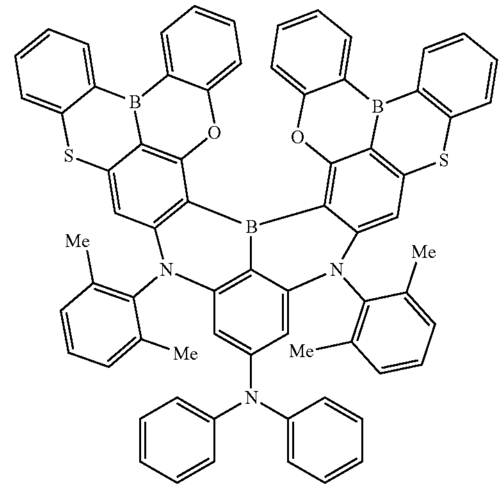
(v-136-2)
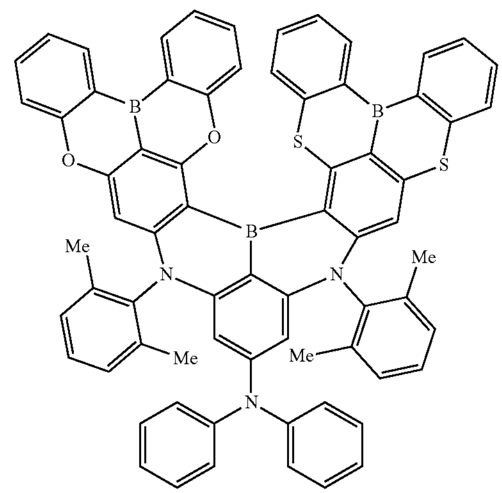
(v-171-2)
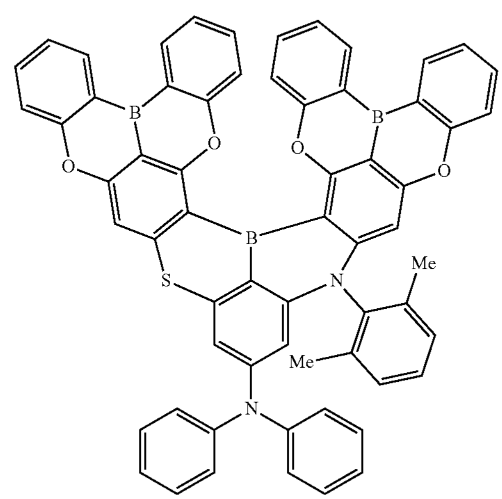

-continued (v-131-3)

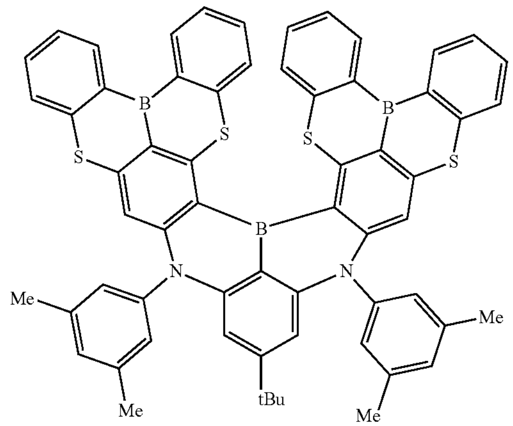

wherein Me is methyl and tBu is t-butyl.

7. The polycyclic aromatic compound according to claim 2, comprising two substructures represented by Formula (1B), wherein in either substructure represented by Formula (1B), $R^{XE}$ is bonded to C ring via the dashed-line which is —X— or single bond, one of the substructures represented by Formula (1B) is bonded to a ring constituting atom of the aryl or heteroaryl ring in B ring at the position of *, and bonded to a ring constituting atom of the aryl or heteroaryl ring in B ring such that B ring and C ring are bonded to each other via —X— at the position of (*), and the other of the substructures represented by Formula (1B) is bonded to a ring constituting atom of the aryl or heteroaryl ring in RAD at the position of *, and bonded to a ring constituting atom of the aryl or heteroaryl ring in $R^{XD}$ such that $R^{XD}$ and C ring are bonded to each other via —X— at the position of (*).

8. A polycyclic aromatic compound according to claim 7, which is represented by the following formula:

(III-11)

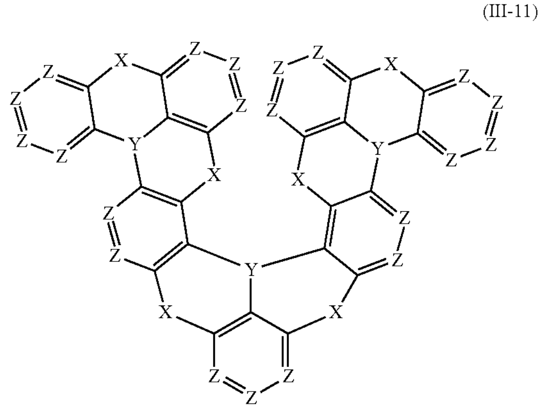

wherein each of Y is independently B, P, P═O, or P═S, each of X is independently >C(—R)$_2$, >N—R, >O, >Si(—R)$_2$, >S, or >Se, R in >N—R is an aryl which may be substituted, a heteroaryl which may be substituted, an alkyl which may be substituted, or a cycloalkyl which may be substituted, R in >C(—R)$_2$ and >Si(—R)$_2$ is hydrogen, an aryl which may be substituted, an alkyl which may be substituted, or a cycloalkyl which may be substituted, and may be bonded to each other via a linking group, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—$R^Z$)═ or —N═ and any two adjacent Z's may be replaced with —C(—$R^Z$)$_2$—, —Si(—$R^Z$)$_2$—, —N(—$R^Z$)—, —O—, —S, -or —Se—, each of $R^Z$ is independently hydrogen or a substituent, and any adjacent groups among $R^Z$ may be bonded to each other to form an aryl ring or a heteroaryl ring together with the ring to which the adjacent groups $R^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —$CH_2$— in the cycloalkane may be replaced with —O—, and at least one hydrogen in the polycyclic aromatic compound may be replaced with deuterium, cyano, or halogen.

9. A polycyclic aromatic compound according to claim 8, which is represented by the following formula:

(v-21-2)

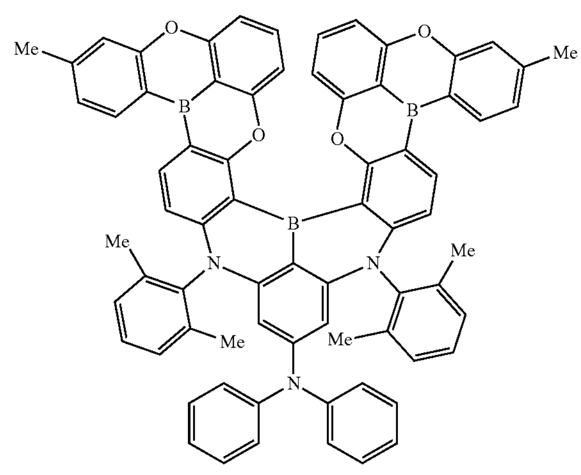

wherein Me is methyl.

10. A polycyclic aromatic compound according to claim 7, which is represented by the following formula:

(III-9)

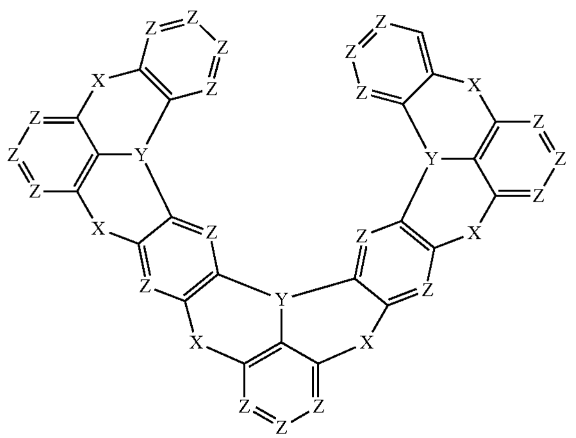

wherein each of Y is independently B, P, P═O, or P═S, each of X is independently >C(—R)$_2$, >N—R, >O, >Si(—R)$_2$, >S, or >Se, R in >N—R is an aryl which may be substituted, a heteroaryl which may be substituted, an alkyl which may be substituted, or a cycloalkyl which may be substituted, R in >C(—R)$_2$ and >Si(—R)$_2$ is hydrogen, an aryl which may be substituted, an alkyl which may be substituted, or a cycloalkyl which may be substituted, and may be bonded to each other via a linking group, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—R$^2$)═ or —N═ and any two adjacent Z's may be replaced with —C(—R$^Z$)$_2$—, —Si(—R$^Z$)$_2$—, —N(—R$^Z$)—, —O—, —S— or —Se—, provided that at least one Z is —N═, each of R$^Z$ is independently hydrogen or a substituent, and any adjacent groups among R$^Z$ may be bonded to each other to form an aryl ring or a heteroaryl ring together with the ring to which the adjacent groups R$^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

11. The polycyclic aromatic compound according to claim 2, comprising two substructures represented by Formula (1B), wherein one of the substructures represented by one of Formula (1B), in which R$^{XE}$ is bonded to the C ring via the dashed line which is —X— or single bond, is bonded to a ring constituting atom of the aryl or heteroaryl ring in B ring at the position of *, and bonded to a ring constituting atom of the aryl or heteroaryl ring in B ring such that B ring and C ring are bonded to each other via —X— at the position of (*), and the other of the substructures represented by Formula (1B) is bonded to a ring constituting atom of the aryl or heteroaryl ring in R$^{XD}$ at the position of *, bonded to a ring constituting atom of the aryl or heteroaryl ring in R$^{XD}$ such that R$^{XD}$ and C ring are bonded to each other via —X— at the position of (*), and bonded to a ring constituting atom of the aryl or heteroaryl ring in R$^{XD}$ such that R$^{XD}$ and R$^{XE}$ are bonded to each other via —X— at the position of (*).

12. A polycyclic aromatic compound according to claim 11, which is represented by the following formula:

(III-12)

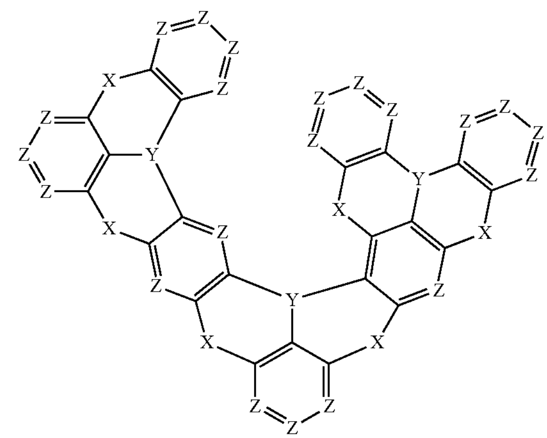

wherein each of Y is independently B, P, P═O, or P═S, each of X is independently >C(—R)$_2$, >N—R, >O, >Si(—R)$_2$, >S, or >Se, provided that at least one X is >O or >S, and R in >N—R is an aryl which may be substituted, a heteroaryl which may be substituted, an alkyl which may be substituted, or a cycloalkyl which may be substituted, and R in >C(—R)$_2$ and >Si(—R)$_2$ is hydrogen, an aryl which may be substituted, an alkyl which may be substituted, or a cycloalkyl which may be substituted, and two R's in each >C(—R)$_2$ and >Si(—R)$_2$ may be bonded to each other to form a ring, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—R$^Z$)═ or —N═ and any two adjacent Z's may be replaced with —C(—R$^Z$)$_2$—, —Si(—R$^Z$)$_2$—, —N(—R$^Z$)—, —O—, —S—, or —Se—, each of R$^Z$ is independently hydrogen or a substituent, and any adjacent groups among R$^Z$ may be bonded to each other to form an aryl ring or a heteroaryl ring together with the ring to which the adjacent groups R$^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

13. The polycyclic aromatic compound according to claim 12, which is represented by any one of the following formulas:

(v-118-1)
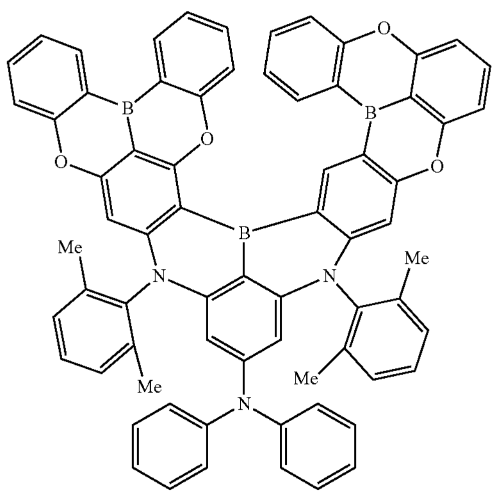
(v-164-1)
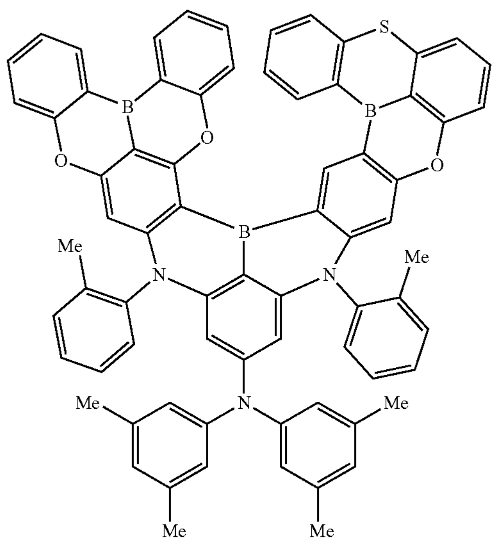
(v-118-2)
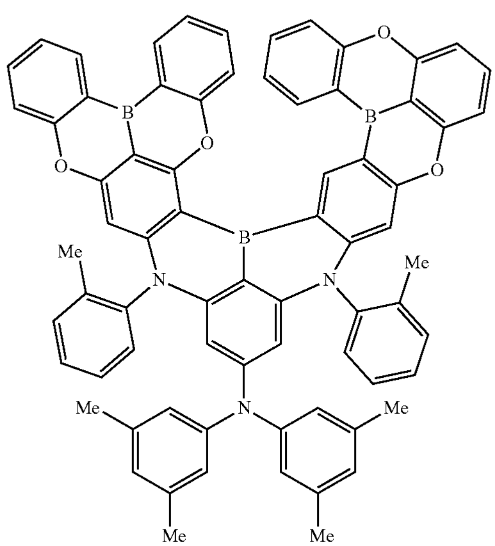
wherein Me is methyl.

14. The polycyclic aromatic compound according to claim 1, which is represented by any one of the following formulas.

(vi-14)

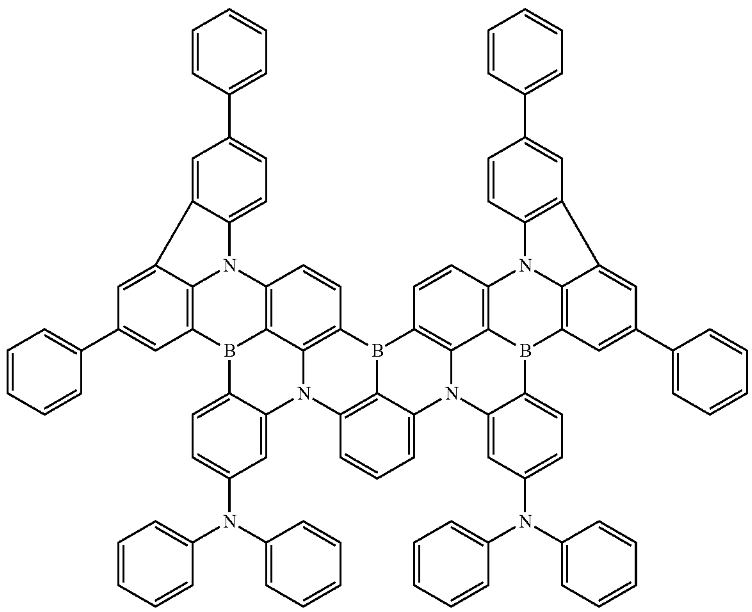

(vi-3)

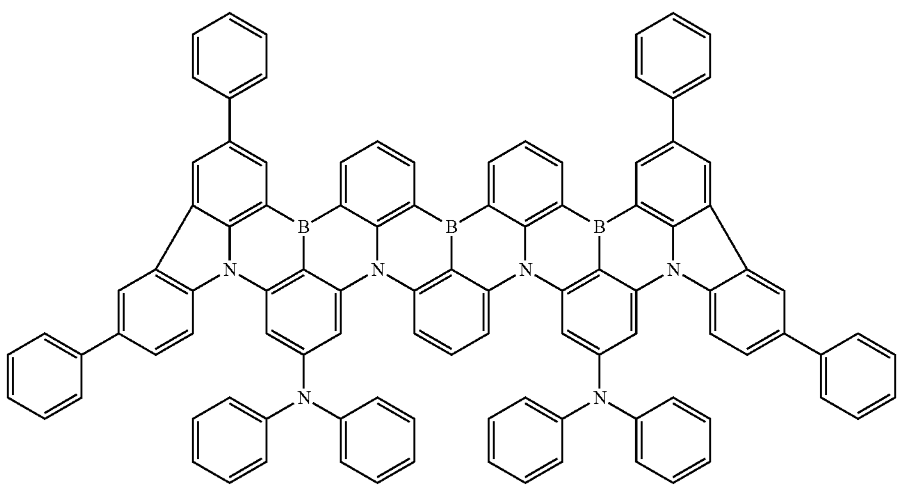

15. The polycyclic aromatic compound according to claim 2, comprising two substructures represented by Formula (1B), wherein in either substructure represented by Formula (1B), $R^{XE}$ is bonded to C ring via the dashed line which is —X— or single bond, and either substructure represented by Formula (1B) is bonded to a ring constituting atom of the aryl or heteroaryl ring in A ring at the position of *, wherein both of X connecting A ring and B ring and X connecting A ring and $R^{XD}$ are nitrogen atoms bonded to C ring via single bond.

16. A polycyclic aromatic compound according to claim 15, which is represented by the following formula:

(III-3)

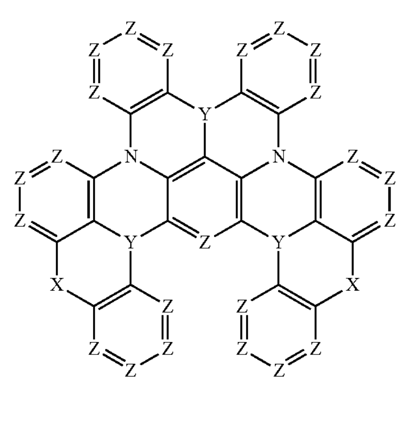

wherein each of Y is independently B, P, P═O, or P═S, each of X is independently >C(—R)$_2$, >N—R, >O, >Si(—R)$_2$, >S, or >Se, R in >N—R is an aryl which may be substituted, a heteroaryl which may be substituted, an alkyl which may be substituted, or a cycloalkyl which may be substituted; and R of >C(—R)$_2$ and >Si(—R)$_2$ is hydrogen, an aryl which may be substituted, an alkyl which may be substituted, or a cycloalkyl which may be substituted; and two R's in each >C(—R)$_2$ and >Si(—R)$_2$ may be bonded to each other to form a ring, and at least one R of >N—R, >C(—R)$_2$, and >Si(—R)$_2$ may be bonded via a linking group or single bond to Z adjacent to any of carbon atoms to which X containing the R is directly bonded, each of Z is independently —C(—R$^Z$)═ or —N═ and any two adjacent Z's may be replaced with —C(—R$^Z$)$_2$—, —Si(—R$^Z$)$_2$—, —N(—R$^Z$)—, —O—, —S—, or —Se—, each of R$^Z$ is independently hydrogen or a substituent, and any adjacent groups among R$^Z$ may be bonded to each other to form an aryl ring or a heteroaryl ring together with the ring to which the adjacent groups R$^Z$ are bonded, and the ring formed may be substituted, at least one selected from the group consisting of aryl rings and heteroaryl rings in the polycyclic aromatic compound may be fused with at least one cycloalkane, at least one hydrogen in the cycloalkane may be substituted, and at least one —CH$_2$— in the cycloalkane may be replaced with —O—, and at least one hydrogen in the polycyclic aromatic compound may be replaced with deuterium, cyano, or halogen.

17. The polycyclic aromatic compound according to claim 16, which is represented by any one of the following formulas:

(vi-25)

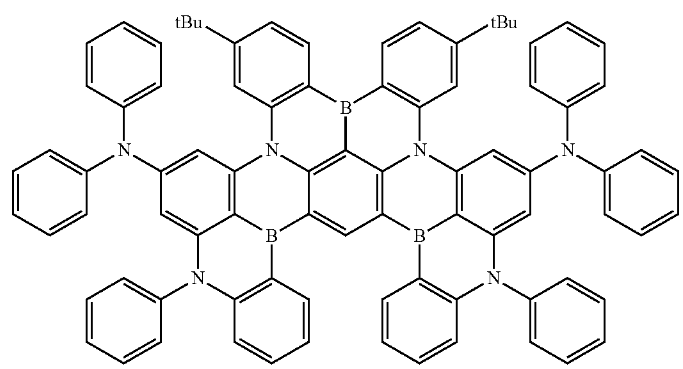

(vi-70)

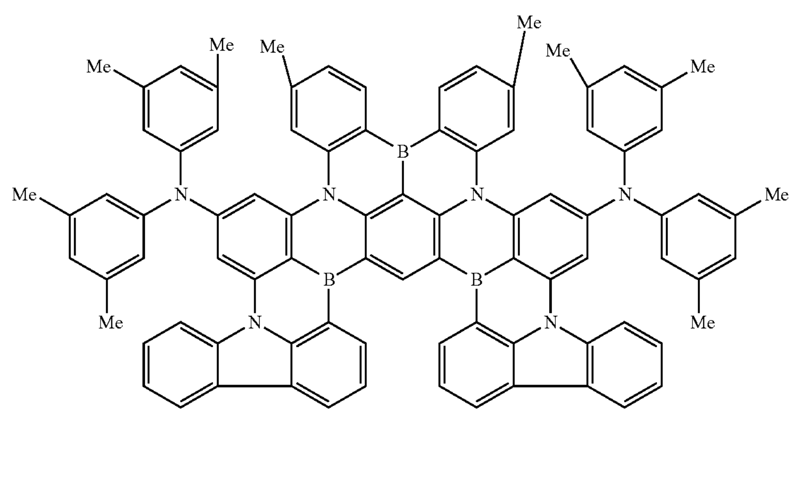

-continued (vi-82)

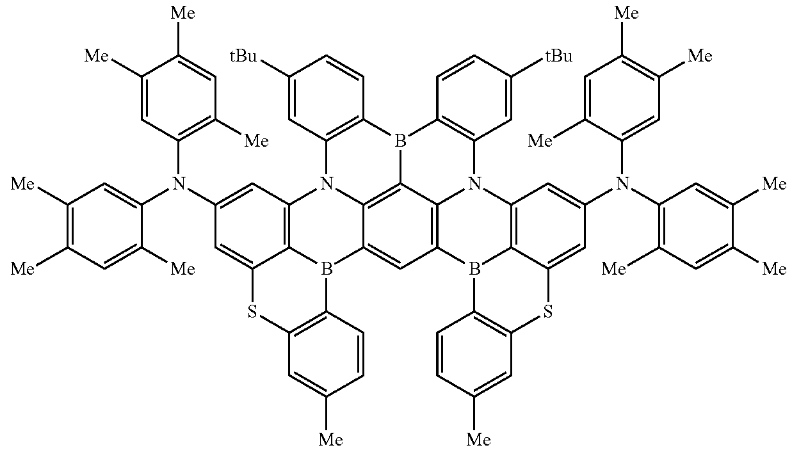

wherein tBu is t-butyl.

18. A reactive compound in which a reactive substituent is substituted to the polycyclic aromatic compound according to claim 1.

19. A polymer compound obtained by polymerizing the reactive compound described in claim 18 as a monomer, or a crosslinked polymer obtained by further crosslinking the polymer compound.

20. A pendant-type polymer compound in which the reactive compound according to claim 18 is substituted to a main chain type polymer, or a pendant-type crosslinked polymer in which the pendant-type polymer compound is further crosslinked.

21. A material for an organic device, which comprises the polycyclic aromatic compound according to claim 1.

22. A material for an organic device, which comprises the reactive compound according to claim 18.

23. A material for an organic device, which comprises the polymer compound or the crosslinked polymer according to claim 19.

24. A material for an organic device, which comprises the pendant-type polymer compound or the pendant-type crosslinked polymer according to claim 20.

25. The material for an organic device according to claim 21, wherein the material for an organic device is a material for an organic electroluminescent element, a material for an organic field effect transistor, or a material for an organic thin film solar cell.

26. The material for an organic device according to claim 25, wherein the material for an organic electroluminescent element is a material for a light-emitting layer.

27. A composition comprising the polycyclic aromatic compound according to claim 1 and an organic solvent.

28. A composition comprising the reactive compound according to claim 18 and an organic solvent.

29. A composition comprising a main chain type polymer, the reactive compound according to claim 18, and an organic solvent.

30. A composition comprising the polymer compound or the crosslinked polymer according to claim 19 and an organic solvent.

31. A composition comprising the pendant-type polymer compound or the pendant-type crosslinked polymer according to claim 20 and an organic solvent.

32. An organic electroluminescent element, which comprises a pair of electrodes comprising an anode and a cathode, and an organic layer disposed between the pair of electrodes and comprising the polycyclic aromatic compound according to claim 1.

33. The organic electroluminescent element according to claim 32, wherein the organic layer is a light-emitting layer.

34. The organic electroluminescent element according to claim 33, wherein the light-emitting layer comprises a host and, as a dopant, the polycyclic aromatic compound, the reactive compound, the polymer compound, the crosslinked polymer, the pendant-type polymer compound, or the pendant-type crosslinked polymer.

35. The organic electroluminescent element according to claim 34, wherein the host is an anthracene-based compound, a fluorene-based compound, or a dibenzochrysene-based compound.

36. The organic electroluminescent element according to claim 33, further comprising at least one layer of an electron transport layer and an electron injection layer disposed between the cathode and the light emitting layer, wherein at least one of the electron transport layer and the electron injection layer comprises at least one selected from the group consisting of borane derivatives, pyridine derivatives, fluoranthene derivatives, BO-based derivatives, anthracene derivatives, benzofluorene derivatives, phosphine oxide derivatives, pyrimidine derivatives, aryl nitrile derivatives, triazine derivatives, benzimidazole derivatives, phenanthroline derivatives, and quinolinol-based metal complexes.

37. The organic electroluminescent element according to claim 36, wherein the at least one layer of the electron transport layer and the electron injection layer further comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

38. The organic electroluminescent element according to claim 33, wherein at least one of a hole injection layer, a hole transport layer, the light emitting layer, an electron transport layer, and an electron injection layer comprises a polymer compound obtained by polymerizing a low molecular weight compound capable of forming each layer as a monomer, or a crosslinked polymer obtained by further crosslinking the polymer compound, or a pendant-type polymer compound obtained by reacting the low molecular weight compound capable of forming each layer with a main chain type polymer, or a pendant-type crosslinked polymer obtained by further crosslinking the pendant-type polymer compound.

39. A display device or a lighting device provided with an organic electroluminescent element according to claim 32.

40. A wavelength conversion material comprising the polycyclic aromatic compound according to claim 1.

* * * * *